(12) United States Patent
Anderson et al.

(10) Patent No.: US 11,378,755 B2
(45) Date of Patent: Jul. 5, 2022

(54) MANAGED FIBER CONNECTIVITY SYSTEMS

(71) Applicant: CommScope Technologies LLC, Hickory, NC (US)

(72) Inventors: John Anderson, Eden Prairie, MN (US); Steven J. Brandt, Savage, MN (US); Joseph C. Coffey, Burnsville, MN (US); Kamlesh G. Patel, Chanhassen, MN (US); Cyle D. Petersen, Belle Plaine, MN (US); Michael D. Schroeder, Webster, MN (US); John Stasny, Lake Elmo, MN (US)

(73) Assignee: CommScope Technologies LLC, Hickory, NC (US)

( * ) Notice: Subject to any disclaimer, the term of this patent is extended or adjusted under 35 U.S.C. 154(b) by 0 days.

(21) Appl. No.: 17/233,665

(22) Filed: Apr. 19, 2021

(65) Prior Publication Data
US 2021/0349267 A1 Nov. 11, 2021

Related U.S. Application Data

(63) Continuation of application No. 16/674,062, filed on Nov. 5, 2019, now Pat. No. 10,983,285, which is a (Continued)

(51) Int. Cl.
*G02B 6/38* (2006.01)
*G02B 6/40* (2006.01)
*H05K 1/02* (2006.01)

(52) U.S. Cl.
CPC ......... *G02B 6/3825* (2013.01); *G02B 6/3807* (2013.01); *G02B 6/3879* (2013.01);
(Continued)

(58) Field of Classification Search
None
See application file for complete search history.

(56) References Cited

U.S. PATENT DOCUMENTS

| | | | |
|---|---|---|---|
| 3,243,761 | A | 3/1966 | Piorunneck |
| RE26,692 | E | 10/1969 | Ruehlemann |

(Continued)

FOREIGN PATENT DOCUMENTS

| | | |
|---|---|---|
| CA | 2499803 | 4/2004 |
| CN | 101968558 A | 2/2011 |

(Continued)

OTHER PUBLICATIONS

*Avaya's Enhanced SYSTIMAX® iPatch System Enables IT Managers to Optimise Network Efficiency and Cut Downtime*, Press Release, May 9, 2003, obtained from http://www.avaya.com/usa/about-avaya/newsroom/news-releases/2003/pr-030509 on Jan. 7, 2009.

(Continued)

*Primary Examiner* — Rhonda S Peace
(74) *Attorney, Agent, or Firm* — Merchant & Gould P.C.

(57) ABSTRACT

A communications connection system includes an adapter module defining at least first and second ports and at least one media reading interface mounted at one of the ports. The first adapter module is configured to receive a fiber optic connector at each port. Some type of connectors may be formed as duplex connector arrangements. Some types of adapters may include ports without media reading interfaces. Some types of media reading interfaces include contact members having three contact sections.

20 Claims, 228 Drawing Sheets

Related U.S. Application Data continuation of application No. 16/148,497, filed on Oct. 1, 2018, now Pat. No. 10,473,864, which is a continuation of application No. 15/493,968, filed on Apr. 21, 2017, now Pat. No. 10,088,636, which is a continuation of application No. 14/220,190, filed on Mar. 20, 2014, now Pat. No. 9,632,255, which is a continuation of application No. 13/025,841, filed on Feb. 11, 2011, now Pat. No. 8,960,593.

(60) Provisional application No. 61/437,504, filed on Jan. 28, 2011, provisional application No. 61/413,828, filed on Nov. 15, 2010, provisional application No. 61/303,961, filed on Feb. 12, 2010.

(52) U.S. Cl.
CPC ......... *G02B 6/3893* (2013.01); *G02B 6/3895* (2013.01); *G02B 6/3897* (2013.01); *G02B 6/403* (2013.01); *H05K 1/0274* (2013.01)

(56) References Cited

U.S. PATENT DOCUMENTS

| | | | |
|---|---|---|---|
| 3,954,320 | A | 5/1976 | Hardesty |
| 4,127,317 | A | 11/1978 | Tyree |
| 4,737,120 | A | 4/1988 | Grabbe et al. |
| 4,953,194 | A | 8/1990 | Hansen et al. |
| 4,968,929 | A | 11/1990 | Hauck et al. |
| 5,041,005 | A | 8/1991 | McHugh |
| 5,052,940 | A | 10/1991 | Bengal |
| 5,064,381 | A | 11/1991 | Lin |
| 5,107,532 | A | 4/1992 | Hansen et al. |
| 5,161,988 | A | 11/1992 | Krupka |
| 5,166,970 | A | 11/1992 | Ward |
| 5,199,895 | A | 4/1993 | Chang |
| 5,222,164 | A | 6/1993 | Bass, Sr. et al. |
| 5,265,187 | A | 11/1993 | Morin et al. |
| 5,305,405 | A | 4/1994 | Emmons et al. |
| 5,353,367 | A | 10/1994 | Czosnowski et al. |
| 5,393,249 | A | 2/1995 | Morgenstern et al. |
| 5,394,503 | A | 2/1995 | Dietz, Jr. et al. |
| 5,413,494 | A | 5/1995 | Dewey et al. |
| 5,418,334 | A | 5/1995 | Williams |
| 5,419,717 | A | 5/1995 | Abendschein et al. |
| 5,448,675 | A | 9/1995 | Leone et al. |
| 5,467,062 | A | 11/1995 | Burroughs et al. |
| 5,470,251 | A | 11/1995 | Sano |
| 5,473,715 | A | 12/1995 | Schofield et al. |
| 5,483,467 | A | 1/1996 | Krupka et al. |
| 5,579,425 | A | 11/1996 | Lampert et al. |
| 5,674,085 | A | 10/1997 | Davis et al. |
| 5,685,741 | A | 11/1997 | Dewey et al. |
| 5,712,942 | A | 1/1998 | Jennings et al. |
| 5,800,192 | A * | 9/1998 | David ............... H01R 13/6594 439/489 |
| 5,821,510 | A | 10/1998 | Cohen et al. |
| 5,854,824 | A | 12/1998 | Bengal et al. |
| 5,871,368 | A | 2/1999 | Erdner et al. |
| 5,910,776 | A | 6/1999 | Black |
| 5,980,323 | A | 11/1999 | Bricaud et al. |
| 6,002,331 | A | 12/1999 | Laor |
| 6,095,837 | A | 8/2000 | David et al. |
| 6,095,851 | A | 8/2000 | Laity et al. |
| 6,116,101 | A * | 9/2000 | Rader ............... G02B 6/3825 324/699 |
| 6,116,961 | A | 9/2000 | Henneberger et al. |
| 6,193,420 | B1 | 2/2001 | Sikorski, Jr. |
| 6,222,908 | B1 | 4/2001 | Bartolutti et al. |
| 6,222,975 | B1 | 4/2001 | Gilbert et al. |
| 6,227,911 | B1 | 5/2001 | Boutros et al. |
| 6,234,830 | B1 | 5/2001 | Ensz et al. |
| 6,238,235 | B1 | 5/2001 | Shavit et al. |
| 6,280,231 | B1 | 8/2001 | Nicholls |
| 6,285,293 | B1 | 9/2001 | German et al. |
| 6,300,877 | B1 | 10/2001 | Schannach et al. |
| 6,330,148 | B1 | 12/2001 | Won et al. |
| 6,330,307 | B1 | 12/2001 | Bloch et al. |
| 6,350,148 | B1 | 2/2002 | Bartolutti et al. |
| 6,364,694 | B1 | 4/2002 | Lien |
| 6,375,362 | B1 | 4/2002 | Heiles et al. |
| 6,409,392 | B1 | 6/2002 | Lampert et al. |
| 6,421,322 | B1 | 7/2002 | Koziy et al. |
| 6,422,895 | B1 | 7/2002 | Lien |
| 6,424,710 | B1 | 7/2002 | Bartolutti et al. |
| 6,437,894 | B1 | 8/2002 | Gilbert et al. |
| 6,456,768 | B1 | 9/2002 | Boncek et al. |
| D466,479 | S | 12/2002 | Pein et al. |
| 6,499,861 | B1 | 12/2002 | German et al. |
| 6,511,231 | B2 | 1/2003 | Lampert et al. |
| 6,522,737 | B1 | 2/2003 | Bartolutti et al. |
| 6,554,484 | B2 * | 4/2003 | Lampert ............... G02B 6/4296 439/489 |
| 6,574,586 | B1 | 6/2003 | David et al. |
| 6,612,856 | B1 | 9/2003 | McCormack |
| 6,626,697 | B1 | 9/2003 | Martin et al. |
| 6,636,152 | B2 | 10/2003 | Schannach et al. |
| 6,652,155 | B2 | 11/2003 | Lampert |
| 6,684,179 | B1 | 1/2004 | David |
| 6,725,177 | B2 | 4/2004 | David et al. |
| 6,743,044 | B2 | 6/2004 | Musolf et al. |
| 6,793,408 | B2 | 9/2004 | Levy et al. |
| 6,802,735 | B2 | 10/2004 | Pepe et al. |
| 6,808,116 | B1 | 10/2004 | Eslambolchi et al. |
| 6,811,446 | B1 | 11/2004 | Chang |
| 6,814,624 | B2 | 11/2004 | Clark et al. |
| 6,850,685 | B2 | 2/2005 | Tinucci et al. |
| 6,898,368 | B2 | 5/2005 | Colombo et al. |
| 6,905,363 | B2 | 6/2005 | Musolf et al. |
| 6,932,517 | B2 | 8/2005 | Swayze et al. |
| D510,068 | S | 9/2005 | Haggay et al. |
| 6,939,168 | B2 | 9/2005 | Oleynick et al. |
| 6,961,675 | B2 | 11/2005 | David |
| 6,971,895 | B2 | 12/2005 | Sago et al. |
| 6,976,867 | B2 | 12/2005 | Navarro et al. |
| 7,077,710 | B2 | 7/2006 | Haggay et al. |
| 7,080,945 | B2 | 7/2006 | Colombo et al. |
| 7,081,808 | B2 | 7/2006 | Colombo et al. |
| 7,088,880 | B1 | 8/2006 | Gershman |
| 7,112,090 | B2 | 9/2006 | Caveney et al. |
| 7,121,873 | B2 * | 10/2006 | Wu ............... H01R 13/7035 439/489 |
| 7,123,810 | B2 | 10/2006 | Parrish |
| 7,153,142 | B2 | 12/2006 | Shifris et al. |
| 7,165,728 | B2 | 1/2007 | Durrant et al. |
| 7,193,422 | B2 | 3/2007 | Velleca et al. |
| 7,207,819 | B2 | 4/2007 | Chen |
| 7,210,858 | B2 | 5/2007 | Sago et al. |
| 7,226,217 | B1 | 6/2007 | Benton et al. |
| 7,234,944 | B2 | 6/2007 | Nordin et al. |
| 7,241,157 | B2 | 7/2007 | Zhuang et al. |
| 7,297,018 | B2 | 11/2007 | Caveney et al. |
| 7,300,214 | B2 | 11/2007 | Doo et al. |
| 7,312,715 | B2 | 12/2007 | Shahs et al. |
| D559,186 | S | 1/2008 | Kelmer |
| 7,315,224 | B2 | 1/2008 | Gurovich et al. |
| 7,352,289 | B1 | 4/2008 | Harris |
| 7,356,208 | B2 | 4/2008 | Becker |
| 7,370,106 | B2 | 5/2008 | Caveney |
| 7,374,101 | B2 * | 5/2008 | Kaneko ............... H01R 9/2475 235/492 |
| 7,384,300 | B1 | 6/2008 | Salgado et al. |
| 7,396,245 | B2 | 7/2008 | Huang et al. |
| 7,458,517 | B2 * | 12/2008 | Durrant ............... G02B 6/3895 340/687 |
| 7,479,032 | B2 | 1/2009 | Hoath et al. |
| 7,490,996 | B2 | 2/2009 | Sommer |
| 7,497,709 | B1 | 3/2009 | Zhang |
| 7,519,000 | B2 | 4/2009 | Caveney et al. |
| 7,534,137 | B2 | 5/2009 | Caveney et al. |
| 7,552,872 | B2 | 6/2009 | Tokita et al. |
| 7,563,116 | B2 | 7/2009 | Wang |
| 7,570,861 | B2 | 8/2009 | Smrha et al. |

(56) References Cited

U.S. PATENT DOCUMENTS

| | | |
|---|---|---|
| 7,575,454 B1 | 8/2009 | Aoki et al. |
| 7,588,470 B2 | 9/2009 | Li et al. |
| 7,591,667 B2 | 9/2009 | Gatnau Navarro et al. |
| 7,607,926 B2 | 10/2009 | Wang |
| 7,635,280 B1 | 12/2009 | Crumlin et al. |
| 7,648,377 B2 | 1/2010 | Naito et al. |
| 7,682,174 B2 | 3/2010 | Chen |
| 7,722,370 B2 | 5/2010 | Chin |
| 7,727,026 B2 | 6/2010 | Qin et al. |
| 7,772,975 B2 | 8/2010 | Downie et al. |
| 7,785,154 B2 | 8/2010 | Peng |
| 7,798,832 B2 | 9/2010 | Qin et al. |
| 7,811,119 B2 | 10/2010 | Caveney et al. |
| 7,814,240 B2 | 10/2010 | Salgado et al. |
| 7,867,017 B1 | 1/2011 | Chen |
| 7,869,426 B2 | 1/2011 | Hough et al. |
| 7,872,738 B2 | 1/2011 | Abbott |
| 7,880,475 B2 | 2/2011 | Crumlin et al. |
| 7,914,324 B2 * | 3/2011 | Pepe ............... H01R 13/641 439/540.1 |
| 7,934,022 B2 | 4/2011 | Velleca et al. |
| 8,157,582 B2 | 4/2012 | Frey et al. |
| 8,172,468 B2 | 5/2012 | Jones et al. |
| 8,282,425 B2 | 10/2012 | Bopp et al. |
| 8,287,316 B2 | 10/2012 | Pepe et al. |
| 8,477,031 B2 | 7/2013 | McNally et al. |
| 8,596,882 B2 | 12/2013 | Smrha et al. |
| 8,622,624 B2 * | 1/2014 | Bergann ............... G02B 6/32 385/33 |
| 8,690,593 B2 | 4/2014 | Anderson et al. |
| 8,696,369 B2 | 4/2014 | Mattson et al. |
| 8,715,012 B2 | 5/2014 | Taylor |
| 8,757,895 B2 | 6/2014 | Petersen |
| 8,870,468 B2 | 10/2014 | Childers et al. |
| 8,923,013 B2 | 12/2014 | Anderson et al. |
| 8,934,252 B2 | 1/2015 | Anderson et al. |
| 8,934,253 B2 | 1/2015 | Anderson et al. |
| 8,992,260 B2 | 3/2015 | Coffey et al. |
| 9,020,319 B2 | 4/2015 | Anderson et al. |
| 9,054,440 B2 | 6/2015 | Taylor et al. |
| 9,063,298 B2 | 6/2015 | Coffey et al. |
| 9,075,203 B2 | 7/2015 | Holmberg |
| 9,140,859 B2 | 9/2015 | Anderson et al. |
| 9,176,294 B2 | 11/2015 | Smrha et al. |
| 9,198,320 B2 | 11/2015 | Anderson et al. |
| 9,213,363 B2 | 12/2015 | Anderson et al. |
| 9,223,105 B2 | 12/2015 | Anderson et al. |
| 9,244,229 B2 | 1/2016 | Petersen |
| 9,265,172 B2 | 2/2016 | Anderson et al. |
| 9,285,552 B2 | 3/2016 | Marcouiller et al. |
| 9,401,552 B2 | 7/2016 | Coffey et al. |
| 9,417,399 B2 | 8/2016 | Anderson et al. |
| 9,470,742 B2 | 10/2016 | Coffey et al. |
| 9,632,255 B2 | 4/2017 | Anderson et al. |
| 9,735,523 B2 | 8/2017 | Taylor et al. |
| 10,088,636 B2 | 10/2018 | Brandt et al. |
| 10,473,864 B2 | 11/2019 | Anderson et al. |
| 10,983,285 B2 | 4/2021 | Anderson et al. |
| 2002/0008613 A1 | 1/2002 | Nathan et al. |
| 2002/0081076 A1 | 6/2002 | Lampert et al. |
| 2003/0031423 A1 | 2/2003 | Zimmel |
| 2003/0060081 A1 | 3/2003 | Yasuda |
| 2003/0236018 A1 | 12/2003 | Mimoto et al. |
| 2004/0052471 A1 | 3/2004 | Colombo et al. |
| 2004/0052498 A1 | 3/2004 | Colombo et al. |
| 2004/0117515 A1 | 6/2004 | Sago et al. |
| 2004/0240807 A1 | 12/2004 | Frohlich et al. |
| 2005/0111796 A1 | 5/2005 | Matasek et al. |
| 2005/0150962 A1 | 7/2005 | Colombo et al. |
| 2005/0215119 A1 | 9/2005 | Kaneko |
| 2005/0249477 A1 | 11/2005 | Parrish |
| 2006/0160395 A1 | 7/2006 | Macauley et al. |
| 2006/0193591 A1 | 8/2006 | Rapp et al. |
| 2006/0228086 A1 | 10/2006 | Holmberg et al. |
| 2007/0116411 A1 | 5/2007 | Benton et al. |
| 2007/0237470 A1 | 10/2007 | Aronson et al. |
| 2007/0254529 A1 | 11/2007 | Pepe et al. |
| 2008/0090450 A1 | 4/2008 | Harano et al. |
| 2008/0090454 A1 | 4/2008 | Hoath et al. |
| 2008/0100456 A1 | 5/2008 | Downie et al. |
| 2008/0100467 A1 | 5/2008 | Downie et al. |
| 2008/0175532 A1 | 7/2008 | Ruckstuhl et al. |
| 2008/0175550 A1 | 7/2008 | Coburn et al. |
| 2009/0034911 A1 | 2/2009 | Murano |
| 2009/0097846 A1 | 4/2009 | Kozischek et al. |
| 2009/0148106 A1 | 6/2009 | Moore et al. |
| 2009/0166404 A1 | 7/2009 | German et al. |
| 2009/0215310 A1 | 8/2009 | Hoath et al. |
| 2009/0232455 A1 | 9/2009 | Nhep |
| 2010/0048064 A1 | 2/2010 | Peng |
| 2010/0079248 A1 | 4/2010 | Greveling et al. |
| 2010/0098425 A1 | 4/2010 | Kewitsch |
| 2010/0211664 A1 | 8/2010 | Raza et al. |
| 2010/0211665 A1 | 8/2010 | Raza et al. |
| 2010/0211697 A1 | 8/2010 | Raza et al. |
| 2010/0215049 A1 | 8/2010 | Raza et al. |
| 2010/0303421 A1 | 12/2010 | He et al. |
| 2011/0043371 A1 | 2/2011 | German et al. |
| 2011/0115494 A1 | 5/2011 | Taylor et al. |
| 2011/0116748 A1 | 5/2011 | Smrha et al. |
| 2011/0221601 A1 | 9/2011 | Aguren |
| 2011/0222819 A1 | 9/2011 | Anderson et al. |
| 2011/0235979 A1 | 9/2011 | Anderson et al. |
| 2011/0255829 A1 | 10/2011 | Anderson et al. |
| 2011/0262077 A1 | 10/2011 | Anderson et al. |
| 2012/0003877 A1 | 1/2012 | Bareel et al. |
| 2012/0021636 A1 | 1/2012 | Debendictis et al. |
| 2012/0208401 A1 | 8/2012 | Petersen |
| 2014/0038462 A1 | 2/2014 | Coffey et al. |
| 2014/0219656 A1 | 8/2014 | Lawson et al. |
| 2014/0286610 A1 | 9/2014 | Anderson et al. |
| 2015/0270662 A1 | 9/2015 | Taylor et al. |
| 2016/0054528 A1 | 2/2016 | Smrha et al. |
| 2016/0131858 A1 | 5/2016 | Anderson et al. |
| 2016/0154423 A1 | 6/2016 | Anderson et al. |
| 2016/0192527 A1 | 6/2016 | Anderson et al. |
| 2016/0212876 A1 | 7/2016 | Anderson et al. |

FOREIGN PATENT DOCUMENTS

| | | |
|---|---|---|
| DE | 102 44 304 | 3/2004 |
| DE | 10 2004 033 940 A1 | 2/2006 |
| EP | 1 199 586 A2 | 4/2002 |
| EP | 1 237 024 A1 | 9/2002 |
| EP | 1 467 232 A1 | 10/2004 |
| EP | 1 662 287 A1 | 5/2006 |
| JP | 2-33110 | 2/1990 |
| JP | 4-72488 | 6/1992 |
| JP | 4-174406 | 6/1992 |
| JP | 10-64638 | 3/1998 |
| JP | 2004-29162 | 1/2004 |
| WO | WO 00/65696 | 11/2000 |
| WO | WO 02/23235 A2 | 3/2002 |
| WO | WO 02/39551 A1 | 5/2002 |
| WO | WO 02/47215 A1 | 6/2002 |
| WO | WO 2007/061490 A2 | 5/2007 |
| WO | WO 2010/001400 A1 | 1/2010 |
| WO | WO 2010/081186 A1 | 7/2010 |
| WO | WO 2010/121639 A1 | 10/2010 |

OTHER PUBLICATIONS

*Avaya's Enhanced SYSTIMAX® iPatch System Enables IT Managers to Optimise Network Efficiency and Cut Downtime*, Press Release, May 20, 2003, obtained from http://www.avaya.com/usa/about-avaya/newsroom/news-releases/2003/pr-030520 on Jan. 7, 2009.

FOCIS 10—Fiber Optic Connector Intermateability Standard—Type LC, TIA/EIA-604-10A, 38 pages (Mar. 2002).

*Intelligent patching systems carving put a 'large' niche*, Cabling Installation & Maintenance, vol. 12, Issue 7, Jul. 2004 (5 pages).

*intelliMAC: The intelligent wy to make Moves, Adds or Changes!* NORDX/CDT © 2003 (6 pages).

(56) References Cited

OTHER PUBLICATIONS

International Search Report and Written Opinion dated May 23, 2011 in related Application No. PCT/US2011/024650 (17 pages).
International Search Report and Written Opinion dated Sep. 12, 2011 in related Application No. PCT/US2011/024652 (28 pages).
International Search Report and Written Opinion dated Sep. 19, 2011 in related Application No. PCT/US2011/024649 (27 pages).
International Search Report and Written Opinion dated Sep. 22, 2011 in related Application No. PCT/US2011/024653 (25 pages).
International Search Report and Written Opinion for PCT/US2013/053441 dated Dec. 16, 2013.
iTRACS Physical Layer Manager FAQ, obtained on Jun. 11, 2008 from http://www.itracs.com/products/physical-layer-manager-faqs.html (6 pages).
Meredith L., "Managers missing point of intelligent patching," *Daa Center News*, Jun. 21, 2005, obtained Dec. 2, 2008 from http://searchdatacenter.techtarget.com/news/article/0,289142,sid80_gci1099991,00.html.
Ohtsuki, F. et al., "Design of Optical Connectors with ID Modules," *Electronics and Communications in Japan*, Part 1, vol. 77, No. 2, pp. 94-105 (Feb. 1994).
Partial International Search Report and Invitation to Pay Additional Fees dated May 19, 2011 in related Application No. PCT/US2011/024653 (6 pages).
Partial International Search and Invitation to Pay Additional Fees dated Jun. 8, 2011 in related Application No. PCT/US2011/024649 (8 pages).
Partial International Search and Invitation to Pay Additional Fees dated Jun. 16, 2011 in related Application No. PCT/US2011/024652 (9 pages).
*SYSTIMAX® iPatch System Wins Platinum Network of the Year Award*, Press Release, Jan. 30, 2003, obtained from http://www.avaya.com/usa/about-avaya/newsroom/news-releases/2003/pr-030130a on Jan. 7, 2009.
TrueNet; TFP Series Rack Mount Fiber Panels, Spec Sheet; May 2008; 8 pages.

\* cited by examiner

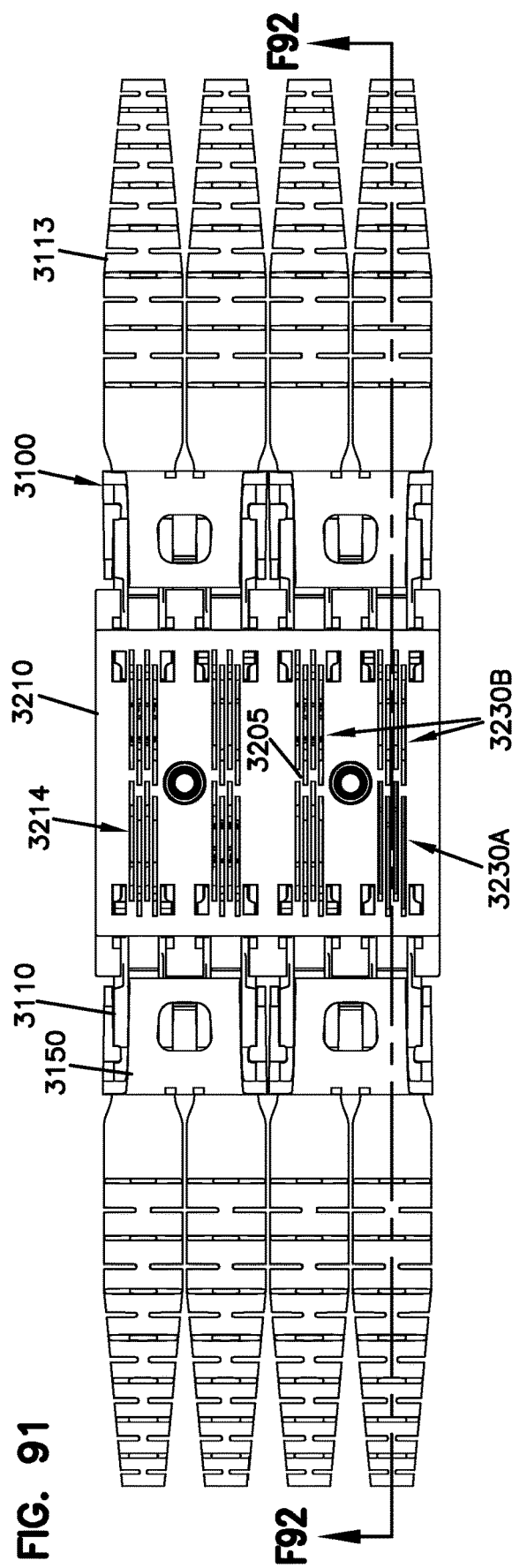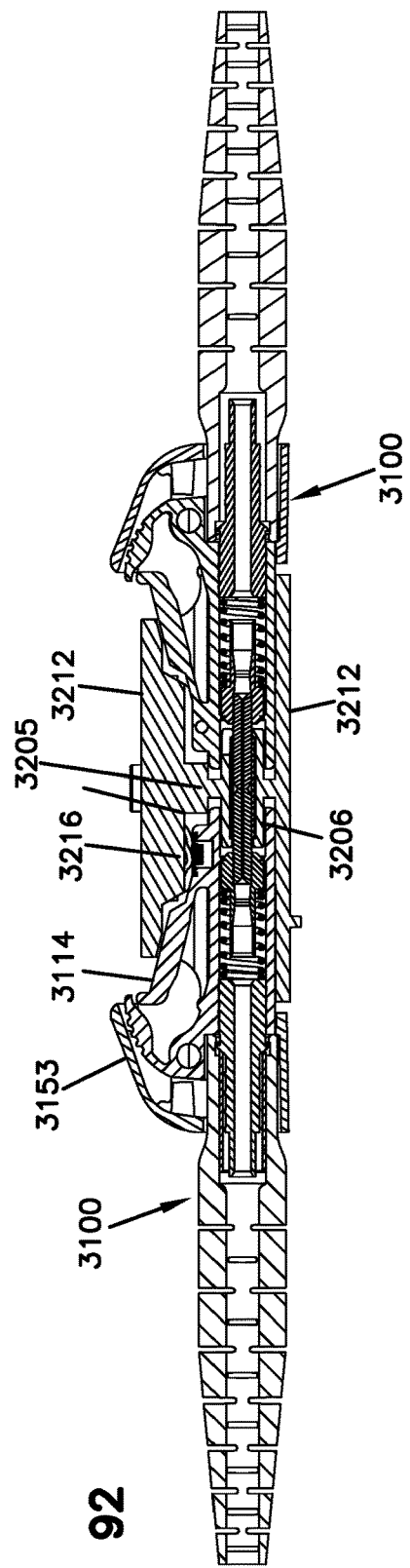

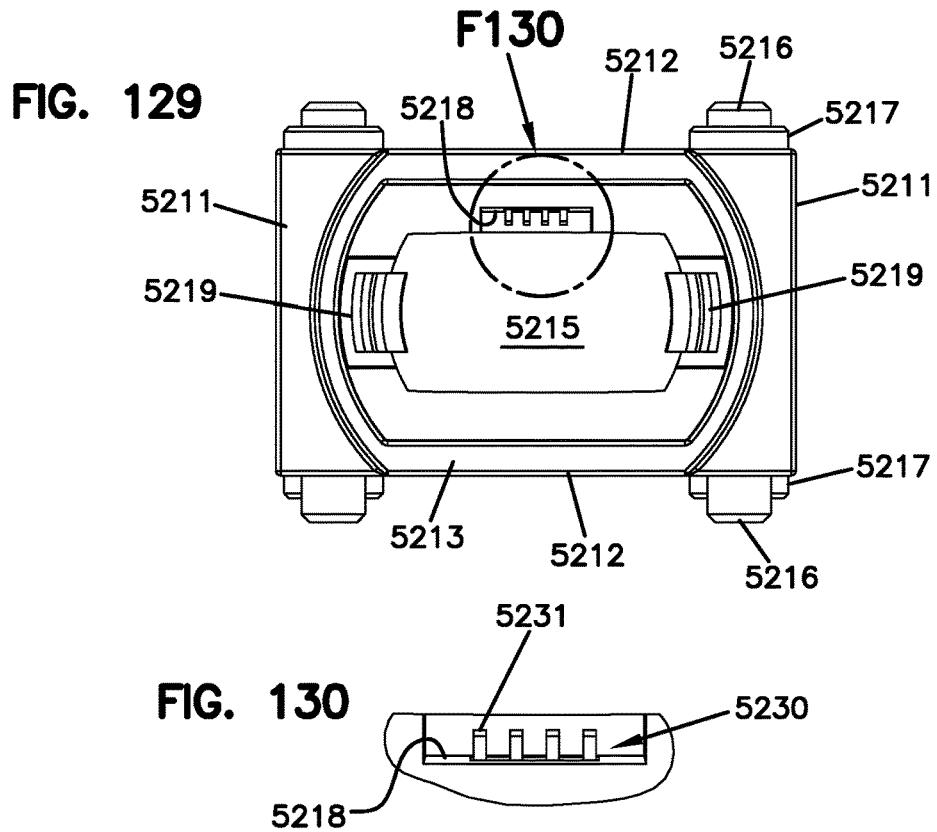
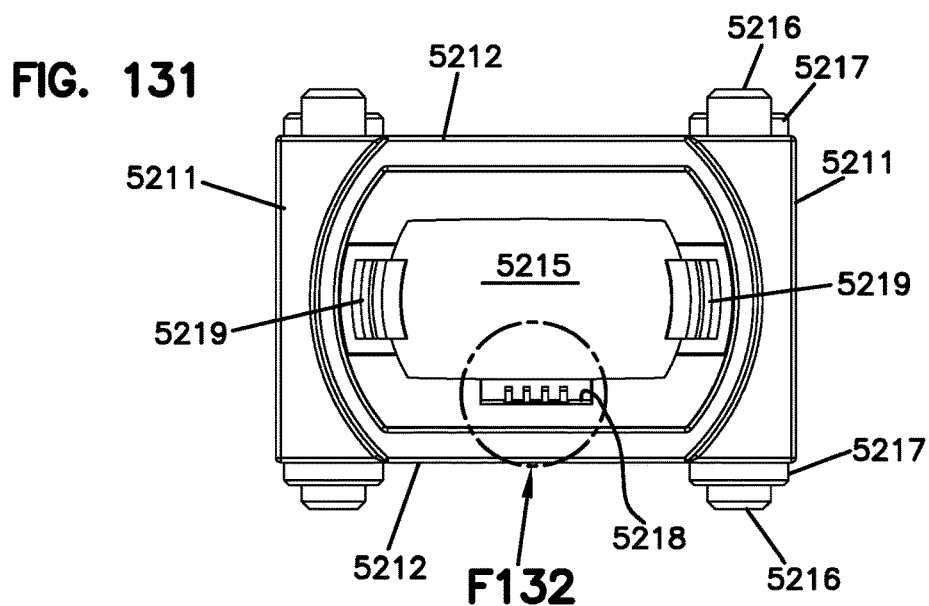
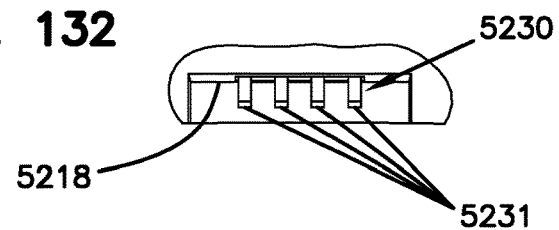

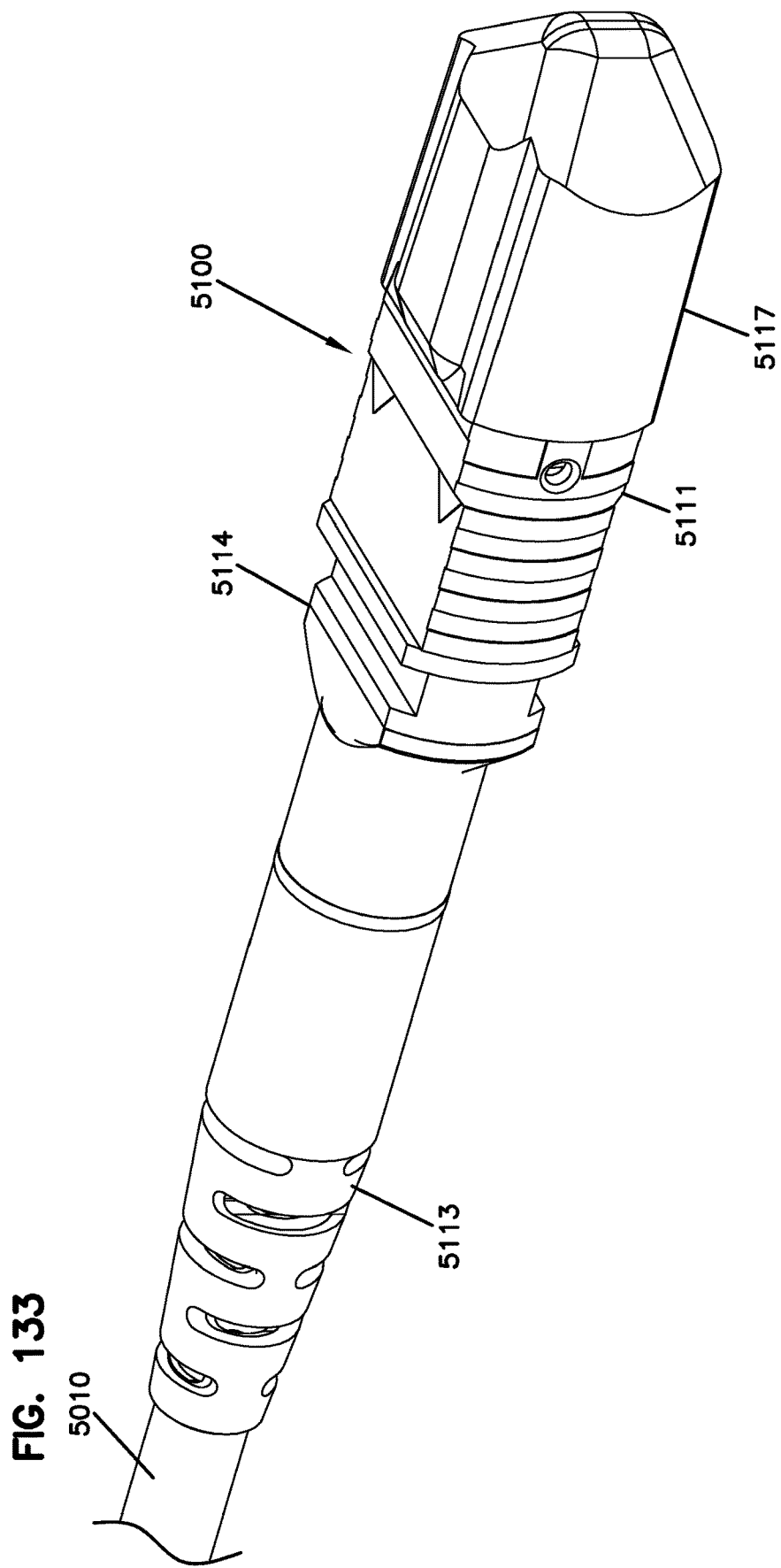

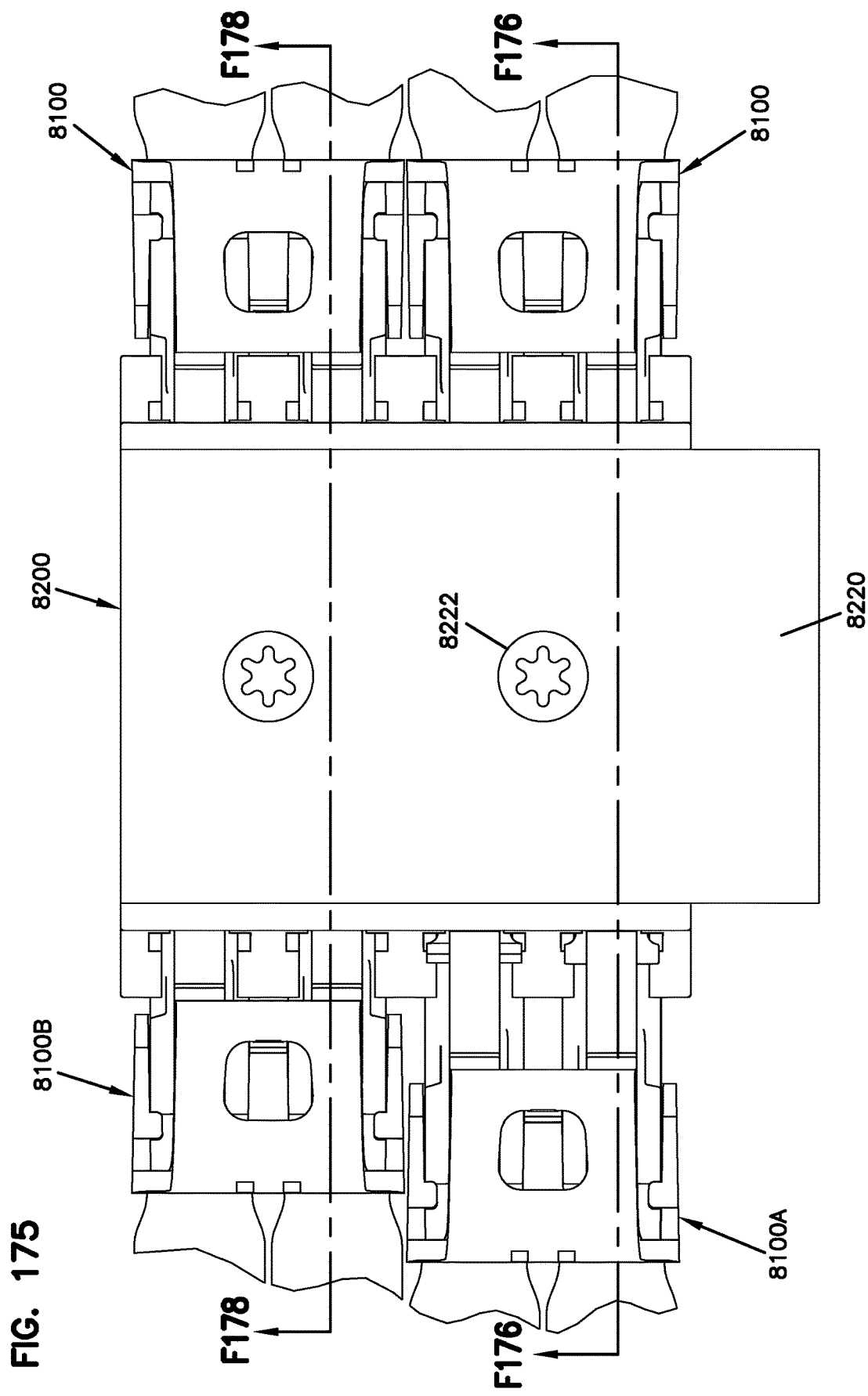

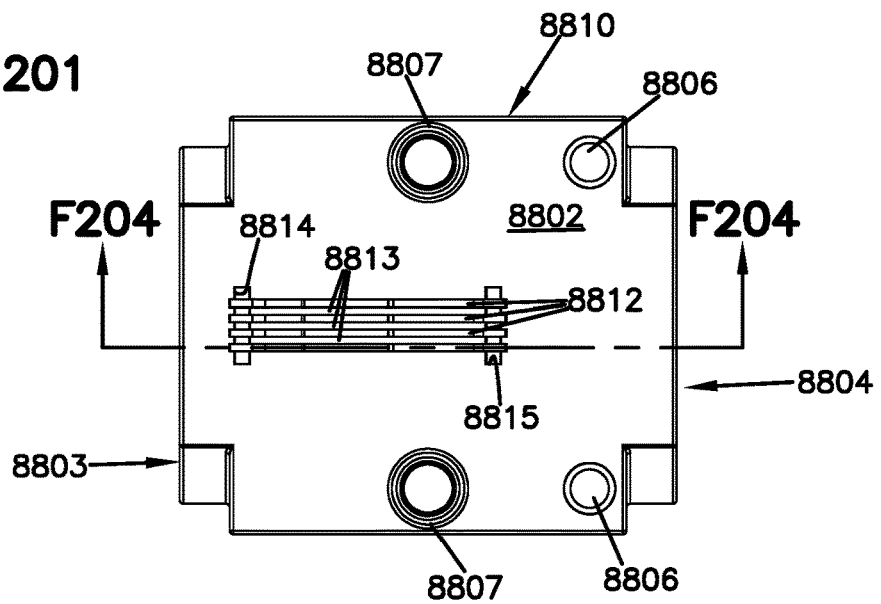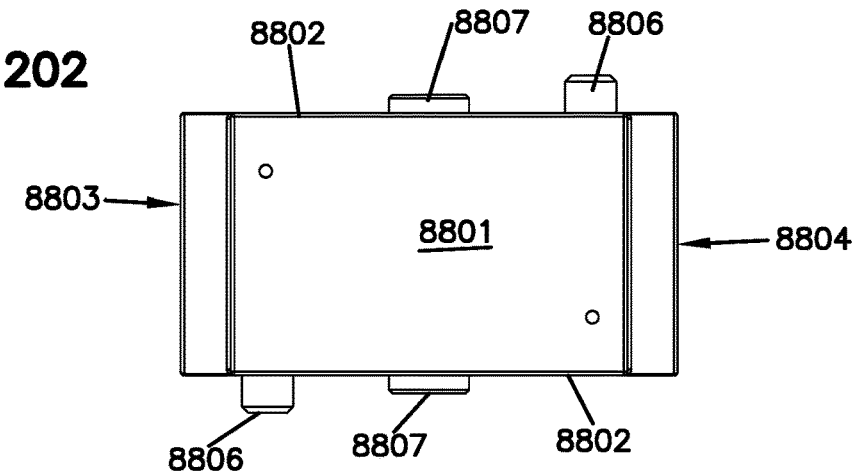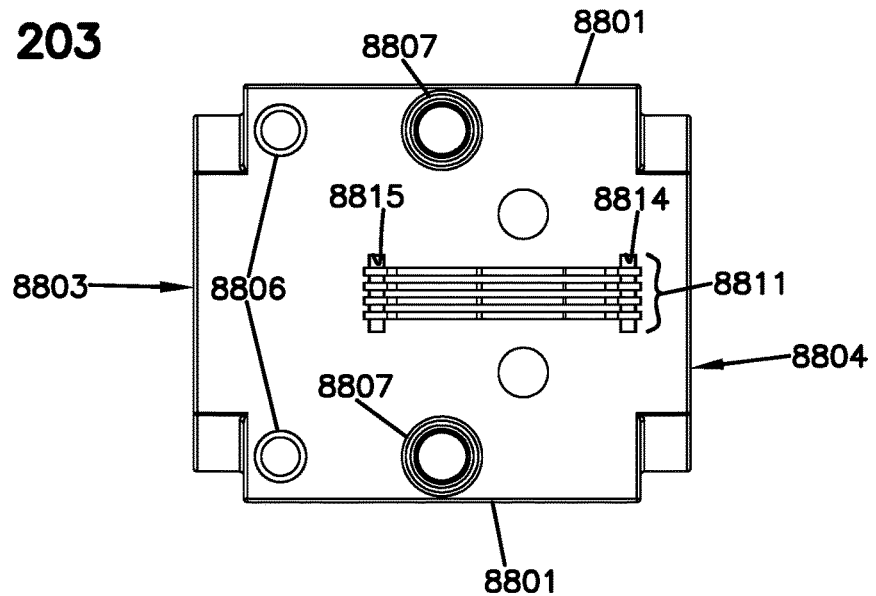

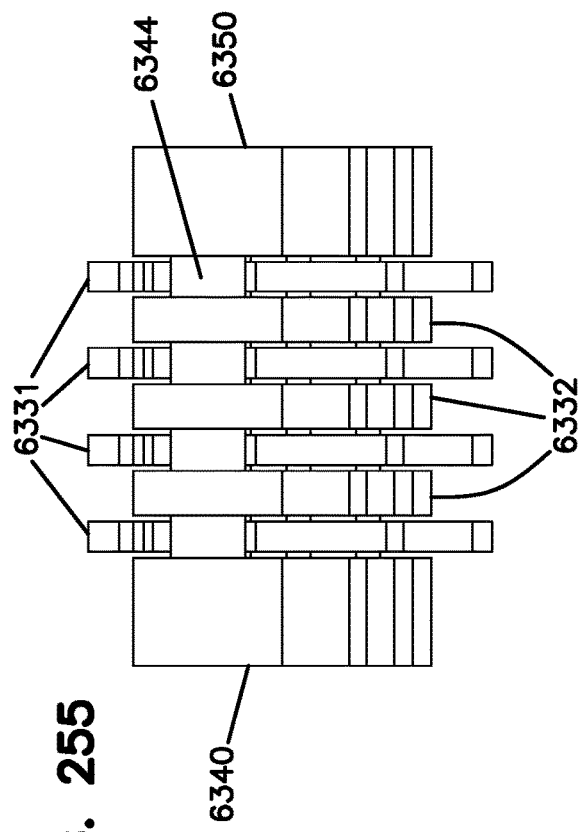
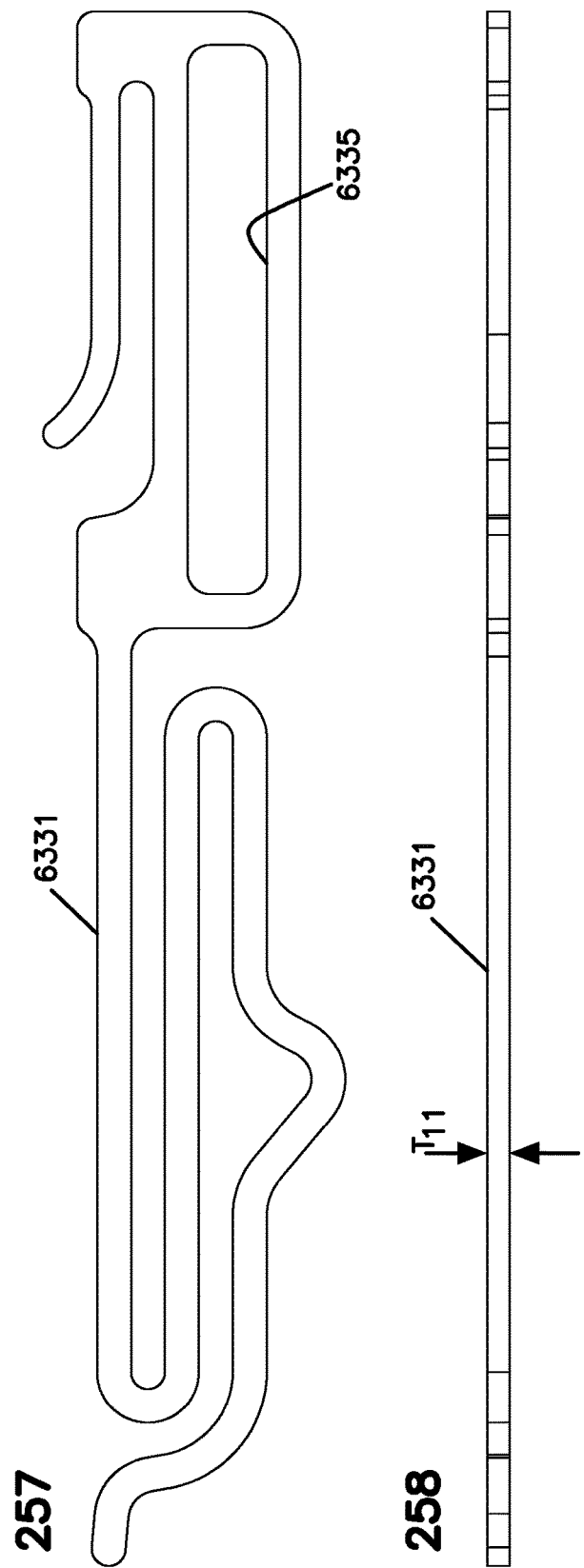
FIG. 255
FIG. 257
FIG. 258

MANAGED FIBER CONNECTIVITY SYSTEMS

CROSS-REFERENCE TO RELATED APPLICATIONS

This application is a continuation of application Ser. No. 16/674,062, filed Nov. 5, 2019, now U.S. Pat. No. 10,983,285, which is a continuation of application Ser. No. 16/148,497, filed Oct. 1, 2018, now U.S. Pat. No. 10,473,864, which is a continuation of application Ser. No. 15/493,968, filed Apr. 21, 2017, now U.S. Pat. No. 10,088,636, which is a continuation of application Ser. No. 14/220,190, filed Mar. 20, 2014, now U.S. Pat. No. 9,632,255, which is a continuation of application Ser. No. 13/025,841, filed Feb. 11, 2011, now U.S. Pat. No. 8,690,593, which claims the benefit of provisional application Ser. No. 61/303,961, filed Feb. 12, 2010, U.S. Provisional Application No. 61/413,828, filed Nov. 15, 2010, and U.S. Provisional Application No. 61/437,504, filed Jan. 28, 2011, which applications are incorporated herein by reference in their entirety.

BACKGROUND

In communications infrastructure installations, a variety of communications devices can be used for switching, cross-connecting, and interconnecting communications signal transmission paths in a communications network. Some such communications devices are installed in one or more equipment racks to permit organized, high-density installations to be achieved in limited space available for equipment.

Communications devices can be organized into communications networks, which typically include numerous logical communication links between various items of equipment. Often a single logical communication link is implemented using several pieces of physical communication media. For example, a logical communication link between a computer and an inter-networking device such as a hub or router can be implemented as follows. A first cable connects the computer to a jack mounted in a wall. A second cable connects the wall-mounted jack to a port of a patch panel, and a third cable connects the inter-networking device to another port of a patch panel. A "patch cord" cross connects the two together. In other words, a single logical communication link is often implemented using several segments of physical communication media.

Network management systems (NMS) are typically aware of logical communication links that exist in a communications network, but typically do not have information about the specific physical layer media (e.g., the communications devices, cables, couplers, etc.) that are used to implement the logical communication links. Indeed, NMS systems typically do not have the ability to display or otherwise provide information about how logical communication links are implemented at the physical layer level.

SUMMARY

The present disclosure relates to communications connector assemblies and connector arrangements that provide physical layer management capabilities. In accordance with certain aspects, the disclosure relates to fiber optic connector assemblies and connector arrangements.

One aspect of the present disclosure relates to a communications panel systems and methods including one or more connector arrangements and connector assemblies implemented as LC-type fiber optic connections.

Another aspect of the present disclosure relates to a communications panel systems and methods including one or more connector arrangements and connector assemblies implemented as MPO-type fiber optic connections.

BRIEF DESCRIPTION OF THE DRAWINGS

The accompanying drawings, which are incorporated in and constitute a part of the description, illustrate several aspects of the present disclosure. A brief description of the drawings is as follows:

FIGS. 51-79 illustrate a fourth example implementation of a connector system that can be utilized on a connector assembly having PLI functionality as well as PLM functionality in accordance with aspects of the present disclosure;

FIGS. 80-102 illustrate a fifth example implementation of a connector system that can be utilized on a connector assembly having PLI functionality as well as PLM functionality in accordance with aspects of the present disclosure;

FIGS. 124-155 illustrate a seventh example implementation of a connector system that can be utilized on a connector assembly having PLI functionality as well as PLM functionality in accordance with aspects of the present disclosure;

FIGS. 169-181 illustrate a ninth example implementation of a connector system that can be utilized on a connector assembly having PLI functionality as well as PLM functionality in accordance with aspects of the present disclosure;

FIGS. 200-217 illustrate an eleventh example implementation of a connector system that can be utilized on a connector assembly having PLI functionality as well as PLM functionality in accordance with aspects of the present disclosure;

FIGS. 250-261 illustrate a fifteenth example implementation of a connector system that can be utilized on a connector assembly having PLI functionality as well as PLM functionality in accordance with aspects of the present disclosure;

DETAILED DESCRIPTION

Reference will now be made in detail to exemplary aspects of the present disclosure that are illustrated in the accompanying drawings. Wherever possible, the same reference numbers will be used throughout the drawings to refer to the same or like parts.

Figure 1:
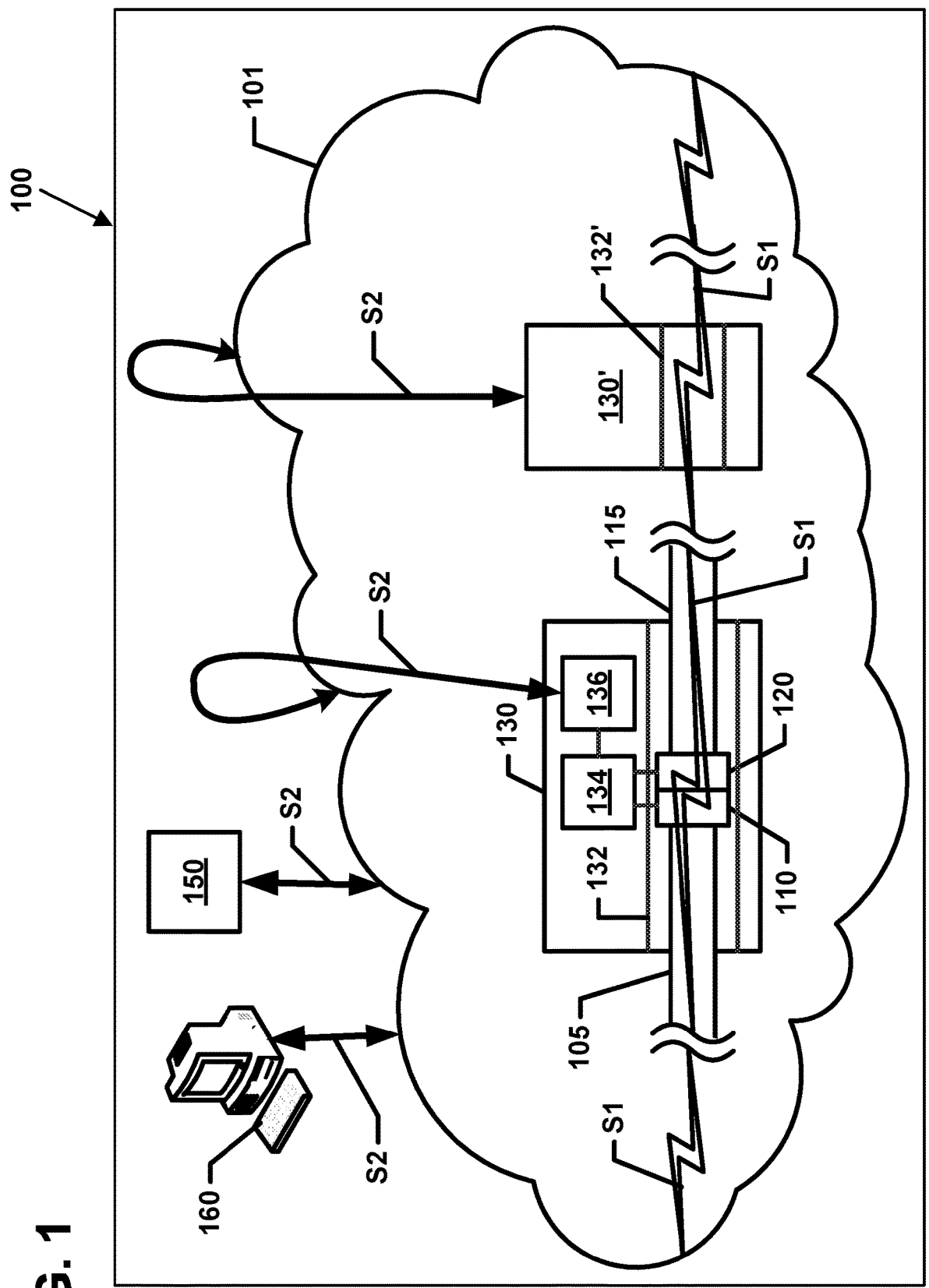
FIG. 1 is a block diagram of a portion of an example communications and data management system in accordance with aspects of the present disclosure.

FIG. 1 is a diagram of a portion of an example communications and data management system 100. The example system 100 shown in FIG. 1 includes a part of a communications network 101 along which communications signals 51 pass. In one example implementation, the network 101 can include an Internet Protocol network. In other implementations, however, the communications network 101 may include other types of networks.

The communications network 101 includes interconnected network components (e.g., connector assemblies, inter-networking devices, internet working devices, servers, outlets, and end user equipment (e.g., computers)). In one example implementation, communications signals 51 pass from a computer, to a wall outlet, to a port of communication panel, to a first port of an inter-networking device, out another port of the inter-networking device, to a port of the same or another communications panel, to a rack mounted server. In other implementations, the communications signals 51 may follow other paths within the communications network 101.

The portion of the communications network 101 shown in FIG. 1 includes first and second connector assemblies 130, 130' at which communications signals 51 pass from one portion of the communications network 101 to another portion of the communications network 101. Non-limiting examples of connector assemblies 130, 130' include, for example, rack-mounted connector assemblies (e.g., patch panels, distribution units, and media converters for fiber and copper physical communication media), wall-mounted connector assemblies (e.g., boxes, jacks, outlets, and media converters for fiber and copper physical communication media), and inter-networking devices (e.g., switches, routers, hubs, repeaters, gateways, and access points).

In the example shown, the first connector assembly 130 defines at least one port 132 configured to communicatively couple at least a first media segment (e.g., cable) 105 to at least a second media segment (e.g., cable) 115 to enable the communication signals S1 to pass between the media segments 105, 115. The at least one port 132 of the first connector assembly 130 may be directly connected to a port 132' of the second connector assembly 130'. As the term is used herein, the port 132 is directly connected to the port 132' when the communications signals S1 pass between the two ports 132, 132' without passing through an intermediate port. For example, plugging a first terminated end of a patch cable into the port 132 and a second terminated end of the patch cable into the port 132' directly connects the ports 132, 132'.

The port 132 of the first connector assembly 130 also may be indirectly connected to the port 132' of the second connector assembly 130'. As the term is used herein, the port 132 is indirectly connected to the port 132' when the communications signals S1 pass through an intermediate port when traveling between the ports 132, 132'. For example, in one implementation, the communications signals S1 may be routed over one media segment from the port 132 at the first connector assembly 130, to a port of a third connector assembly at which the media segment is coupled, to another media segment that is routed from the port of the third connector assembly to the port 132' of the second connector assembly 130'.

Non-limiting examples of media segments include optical cables, electrical cables, and hybrid cables. The media segments may be terminated with electrical plugs, electrical jacks, fiber optic connectors, fiber optic adapters, media converters, or other termination components. In the example shown, each media segment 105, 115 is terminated at a plug or connector 110, 120, respectively, which is configured to communicatively connect the media segments 105, 115. For example, in one implementation, the port 132 of the connector assembly 130 can be configured to align ferrules of two fiber optic connectors 110, 120. In another implementation, the port 132 of the connector assembly 130 can be configured to electrically connect an electrical plug with an electrical socket (e.g., a jack). In yet another implementation, the port 132 can include a media converter configured to connect an optical fiber to an electrical conductor.

In accordance with some aspects, the connector assembly 130 does not actively manage (e.g., is passive with respect to) the communications signals S1 passing through port 132. For example, in some implementations, the connector assembly 130 does not modify the communications signal S1 carried over the media segments 105, 115. Further, in some implementations, the connector assembly 130 does not read, store, or analyze the communications signal S1 carried over the media segments 105, 115.

In accordance with aspects of the disclosure, the communications and data management system 100 also provides physical layer information (PLI) functionality as well as physical layer management (PLM) functionality. As the term is used herein, "PLI functionality" refers to the ability of a physical component or system to identify or otherwise associate physical layer information with some or all of the physical components used to implement the physical layer of the system. As the term is used herein, "PLM functionality" refers to the ability of a component or system to manipulate or to enable others to manipulate the physical components used to implement the physical layer of the system (e.g., to track what is connected to each component, to trace connections that are made using the components, or to provide visual indications to a user at a selected component).

As the term is used herein, "physical layer information" refers to information about the identity, attributes, and/or status of the physical components used to implement the physical layer of the communications system 101. In accordance with some aspects, physical layer information of the communications system 101 can include media information, device information, and location information.

As the term is used herein, "media information" refers to physical layer information pertaining to cables, plugs, connectors, and other such physical media. In accordance with some aspects, the media information is stored on or in the physical media, themselves. In accordance with other aspects, the media information can be stored at one or more data repositories for the communications system, either alternatively or in addition to the media, themselves.

Non-limiting examples of media information include a part number, a serial number, a plug or other connector type, a conductor or fiber type, a cable or fiber length, cable polarity, a cable or fiber pass-through capacity, a date of manufacture, a manufacturing lot number, information about one or more visual attributes of physical communication media (e.g., information about the color or shape of the physical communication media or an image of the physical communication media), and an insertion count (i.e., a record of the number of times the media segment has been connected to another media segment or network component). Media information also can include testing or media quality or performance information. The testing or media quality or performance information, for example, can be the results of testing that is performed when a particular segment of media is manufactured.

As the term is used herein, "device information" refers to physical layer information pertaining to the communications panels, inter-networking devices, media converters, computers, servers, wall outlets, and other physical communications devices to which the media segments attach. In accordance with some aspects, the device information is stored on or in the devices, themselves. In accordance with other aspects, the device information can be stored at one or more data repositories for the communications system, either alternatively or in addition to the devices, themselves. In accordance with still other aspects, the device information can be stored in the media segments attached thereto. Non-limiting examples of device information include a device identifier, a device type, port priority data (that associates a priority level with each port), and port updates (described in more detail herein).

As the term is used herein, "location information" refers to physical layer information pertaining to a physical layout of a building or buildings in which the network 101 is deployed. Location information also can include information indicating where each communications device, media segment, network component, or other component is physically located within the building. In accordance with some aspects, the location information of each system component is stored on or in the respective component. In accordance with other aspects, the location information can be stored at one or more data repositories for the communications system, either alternatively or in addition to the system components, themselves.

In accordance with some aspects, one or more of the components of the communications network 101 are configured to store physical layer information pertaining to the component as will be disclosed in more detail herein. In FIG. 1, the connectors 110, 120, the media segments 105, 115, and/or the connector assemblies 130, 130' may store physical layer information. For example, in FIG. 1, each connector 110, 120 may store information pertaining to itself (e.g., type of connector, data of manufacture, etc.) and/or to the respective media segment 105, 115 (e.g., type of media, test results, etc.).

In another example implementation, the media segments 105, 115 or connectors 110, 120 may store media information that includes a count of the number of times that the media segment (or connector) has been inserted into port 132. In such an example, the count stored in or on the media segment is updated each time the segment (or plug or connector) is inserted into port 132. This insertion count value can be used, for example, for warranty purposes (e.g., to determine if the connector has been inserted more than the number of times specified in the warranty) or for security purposes (e.g., to detect unauthorized insertions of the physical communication media).

One or more of the components of the communications network 101 can read the physical layer information from one or more media segments retained thereat. In certain implementations, one or more network components includes a media reading interface that is configured to read physical layer information stored on or in the media segments or connectors attached thereto. For example, in one implementation, the connector assembly 130 includes a media reading interface 134 that can read media information stored on the media cables 105, 115 retained within the port 132. In another implementation, the media reading interface 134 can read media information stored on the connectors or plugs 110, 120 terminating the cables 105, 115, respectively.

In accordance with some aspects of the disclosure, the physical layer information read by a network component may be processed or stored at the component. For example, in certain implementations, the first connector assembly 130 shown in FIG. 1 is configured to read physical layer information stored on the connectors 110, 120 and/or on the media segments 105, 115 using media reading interface 134. Accordingly, in FIG. 1, the first connector assembly 130 may store not only physical layer information about itself (e.g., the total number of available ports at that assembly 130, the number of ports currently in use, etc.), but also physical layer information about the connectors 110, 120 inserted at the ports and/or about the media segments 105, 115 attached to the connectors 110, 120.

The physical layer information obtained by the media reading interface may be communicated (see PLI signals S2) over the network 101 for processing and/or storage. In accordance with some aspects, the communications network 101 includes a data network (e.g., see network 218 of FIG. 2) along which the physical layer information is communicated. At least some of the media segments and other components of the data network may be separate from those of the communications network 101 to which such physical layer information pertains. For example, in some implementations, the first connector assembly 130 may include a plurality of "normal" ports (e.g., fiber optic adapter ports) at which connectorized media segments (e.g., optical fibers) are coupled together to create a path for communications signals S1. The first connector assembly 130 also may include one or more PLI ports 136 at which the physical layer information (see PLI signals S2) are passed to components of the data network (e.g., to one or more aggregation points 150 and/or to one or more computer systems 160).

In other implementations, however, the physical layer information may be communicated over the communications network 101 just like any other signal, while at the same time not affecting the communication signals S1 that pass through the connector assembly 130 on the normal ports 132. Indeed, in some implementations, the physical layer information may be communicated as one or more of the communication signals S1 that pass through the normal ports 132 of the connector assemblies 130, 130'. For example, in one implementation, a media segment may be routed between the PLI port 136 and one of the "normal" ports 132. In another implementation, the media segment may be routed between the PLI port 136 and a "normal" port of another connector assembly. In such implementations, the physical layer information may be passed along the communications network 101 to other components of the communications network 101 (e.g., to another connector assembly, to one or more aggregation points 150 and/or to one or more computer systems 160). By using the network 101 to communicate physical layer information pertaining to it, an entirely separate data network need not be provided and maintained in order to communicate such physical layer information.

For example, in the implementation shown in FIG. 1, each connector assembly 130 includes at least one PLI port 136 that is separate from the "normal" ports 132 of the connector assembly 130. Physical layer information is communicated between the connector assembly 130 and the communications network 101 through the PLI port 136. Components of the communications network 101 may be connected to one or more aggregation devices 150 and/or to one or more computing systems 160. In the example shown in FIG. 1, the connector assembly 130 is connected to a representative aggregation device 150, a representative computing system 160, and to other components of the network 101 (see looped arrows) via the PLI port 136.

In some implementations, some types of physical layer information pertaining to media segments can be obtained by the connector assembly 130 from a user at the connector assembly 130 via a user interface (e.g., a keypad, a scanner, a touch screen, buttons, etc.). For example, physical layer information pertaining to media that is not configured to store such information can be entered manually into the connector assembly 130 by the user. In certain implementations, the connector assembly 130 can provide the physical layer information obtained from the user to other devices or systems that are coupled to the communications network 101 and/or a separate data network.

In other implementations, some or all physical layer information can be obtained by the connector assembly 130 from other devices or systems that are coupled to the communications network 101 and/or a separate data network. For example, physical layer information pertaining to media that is not configured to store such information can be entered manually into another device or system (e.g., at the connector assembly 130, at the computer 160, or at the aggregation point 150) that is coupled to the network 101 and/or a separate data network.

In some implementations, some types of non-physical layer information (e.g., network information) also can be obtained by one network component (e.g., a connector assembly 130, an aggregation point 150, or a computer 160) from other devices or systems that are coupled to the communications network 101 and/or a separate data network. For example, the connector assembly 130 may pull non-physical layer information from one or more components of the network 101. In other implementations, the non-physical layer information can be obtained by the connector assembly 130 from a user at the connector assembly 130.

In some implementations, the connector assembly 130 is configured to modify (e.g., add, delete, and/or change) the physical layer information stored in or on the segment of physical communication media 105, 115 (i.e., or the associated connectors 110, 120). For example, in some implementations, the media information stored in or on the segment of physical communication media 105, 115 can be updated to include the results of testing that is performed when a segment of physical media is installed or otherwise checked. In other implementations, such testing information is supplied to the aggregation point 150 for storage and/or processing. The modification of the physical layer information does not affect the communications signals S1 passing through the connector assembly 130.

Figure 2:
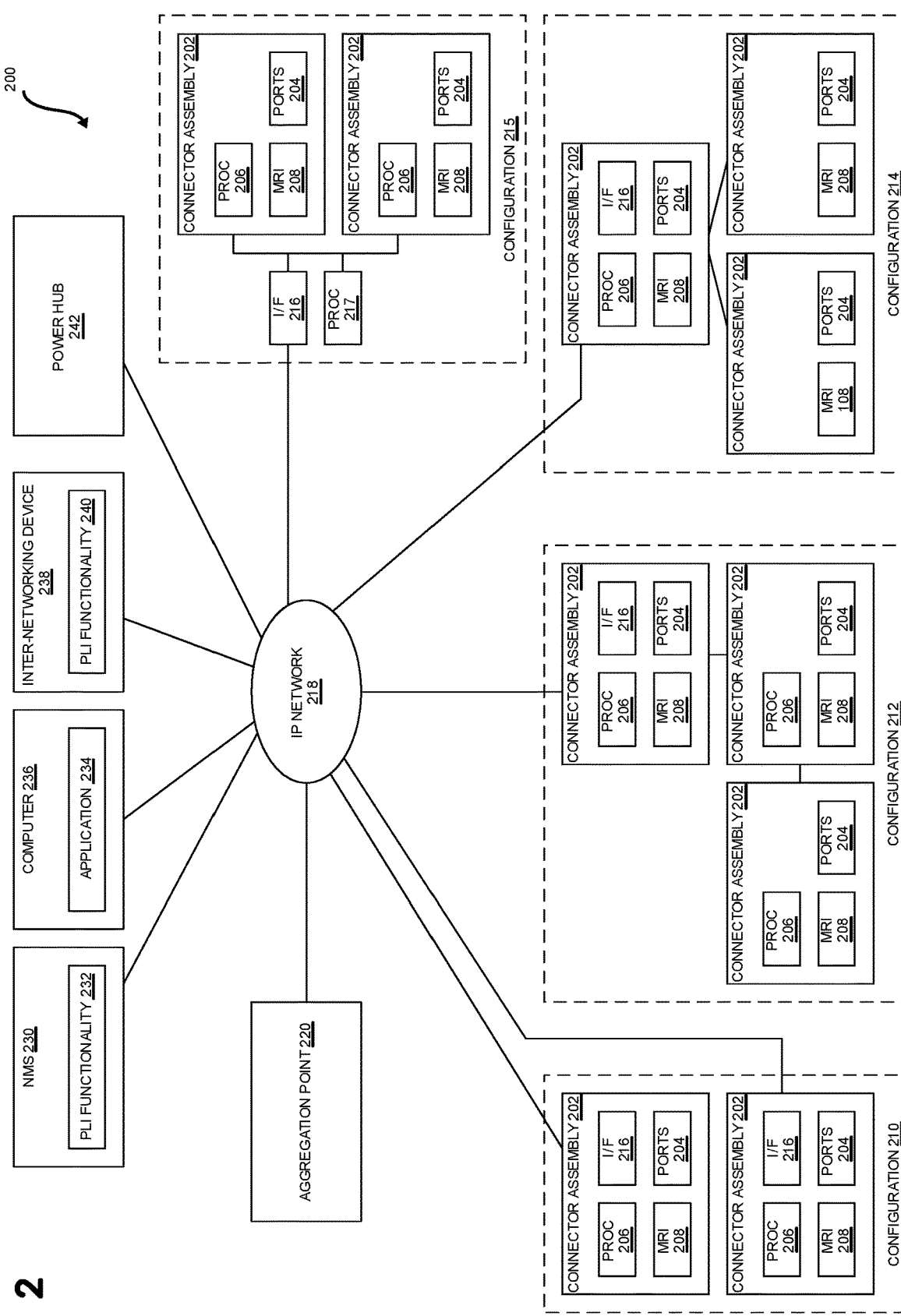
FIG. 2 is a block diagram of one embodiment of a communications management system that includes PLI functionality as well as PLM functionality in accordance with aspects of the present disclosure.

FIG. 2 is a block diagram of one example implementation of a communications management system 200 that includes PLI functionality as well as PLM functionality. The management system 200 comprises a plurality of connector assemblies 202. The management system 200 includes one or more connector assemblies 202 connected to an IP network 218. The connector assemblies 202 shown in FIG. 2 illustrate various example implementations of the connector assemblies 130, 30' of FIG. 1.

Each connector assembly 202 includes one or more ports 204, each of which is used to connect two or more segments of physical communication media to one another (e.g., to implement a portion of a logical communication link for communication signals S1 of FIG. 1). At least some of the connector assemblies 202 are designed for use with segments of physical communication media that have physical layer information stored in or on them. The physical layer information is stored in or on the segment of physical communication media in a manner that enables the stored information, when the segment is attached to a port 204, to be read by a programmable processor 206 associated with the connector assembly 202.

Each programmable processor 206 is configured to execute software or firmware that causes the programmable processor 206 to carry out various functions described below. Each programmable processor 206 also includes suitable memory (not shown) that is coupled to the programmable processor 206 for storing program instructions and data. In general, the programmable processor 206 determines if a physical communication media segment is attached to a port 204 with which that processor 206 is associated and, if one is, to read the identifier and attribute information stored in or on the attached physical communication media segment (if the segment includes such information stored therein or thereon) using the associated media reading interface 208.

In some implementations, each of the ports 204 of the connector assemblies 202 comprises a respective media reading interface 208 via which the respective programmable processor 206 is able to determine if a physical communication media segment is attached to that port 204 and, if one is, to read the physical layer information stored in or on the attached segment (if such media information is stored therein or thereon). In other implementations, a single media reading interface 208 may correspond to two or more ports 204. The programmable processor 206 associated with each connector assembly 202 is communicatively coupled to each of the media reading interfaces 208 using a suitable bus or other interconnect (not shown).

In FIG. 2, four example types of connector assembly configurations 210, 212, 214, and 215 are shown. In the first connector assembly configuration 210 shown in FIG. 2, each connector assembly 202 includes its own respective programmable processor 206 and its own respective network interface 216 that is used to communicatively couple that connector assembly 202 to an Internet Protocol (IP) network 218. In some implementations, the ports 204 of the connector assemblies 202 also connect to the IP network 218. In other implementations, however, only the network interfaces 216 couple to the IP network 218.

In the second type of connector assembly configuration 212, a group of connector assemblies 202 are physically located near each other (e.g., in a rack, rack system, or equipment closet). Each of the connector assemblies 202 in the group includes its own respective programmable processor 206. However, in the second connector assembly configuration 212, some of the connector assemblies 202 (referred to here as "interfaced connector assemblies") include their own respective network interfaces 216 while some of the connector assemblies 202 (referred to here as "non-interfaced connector assemblies") do not. The non-interfaced connector assemblies 202 are communicatively coupled to one or more of the interfaced connector assemblies 202 in the group via local connections. In this way, the non-interfaced connector assemblies 202 are communicatively coupled to the IP network 218 via the network interface 216 included in one or more of the interfaced connector assemblies 202 in the group. In the second type of connector assembly configuration 212, the total number of network interfaces 216 used to couple the connector assemblies 202 to the IP network 218 can be reduced. Moreover, in the particular implementation shown in FIG. 2, the non-interfaced connector assemblies 202 are connected to the interfaced connector assembly 202 using a daisy chain topology (though other topologies can be used in other implementations and embodiments).

In the third type of connector assembly configuration 214, a group of connector assemblies 202 are physically located near each other (e.g., within a rack, rack system, or equipment closet). Some of the connector assemblies 202 in the group (also referred to here as "master" connector assemblies 202) include both their own programmable processors 206 and network interfaces 216, while some of the connector assemblies 202 (also referred to here as "slave" connector assemblies 202) do not include their own programmable processors 206 or network interfaces 216. Each of the slave connector assemblies 202 is communicatively coupled to one or more of the master connector assemblies 202 in the group via one or more local connections. The programmable processor 206 in each of the master connector assemblies 202 is able to carry out the PLM functions for both the master connector assembly 202 of which it is a part and any slave connector assemblies 202 to which the master connector assembly 202 is connected via the local connections. As a result, the cost associated with the slave connector assemblies 202 can be reduced. In the particular implementation shown in FIG. 2, the slave connector assemblies 202 are connected to a master connector assembly 202 in a star topology (though other topologies can be used in other implementations and embodiments).

In the fourth type of connector assembly configuration 215, a group of connector assemblies (e.g., distribution modules) 202 are housed within a common chassis or other enclosure. Each of the connector assemblies 202 in the configuration 215 includes their own programmable processors 206. In the context of this configuration 215, the programmable processors 206 in the connector assemblies 202 are "slave" processors 206. Each of the slave programmable processors 206 in the group is communicatively coupled to a common "master" programmable processor 217 (e.g., over a backplane included in the chassis or enclosure). The master programmable processor 217 is coupled to a network interface 216 that is used to communicatively couple the master programmable processor 217 to the IP network 218.

In the fourth configuration 215, each slave programmable processor 206 is configured to manage the media reading interfaces 208 to determine if physical communication media segments are attached to the port 204 and to read the physical layer information stored in or on the attached physical communication media segments (if the attached segments have such information stored therein or thereon). The physical layer information is communicated from the slave programmable processor 206 in each of the connector assemblies 202 in the chassis to the master processor 217. The master processor 217 is configured to handle the processing associated with communicating the physical layer information read from by the slave processors 206 to devices that are coupled to the IP network 218.

In accordance with some aspects, the communications management system 200 includes functionality that enables the physical layer information captured by the connector assemblies 202 to be used by application-layer functionality outside of the traditional physical-layer management application domain. That is, the physical layer information is not retained in a PLM "island" used only for PLM purposes but is instead made available to other applications. For example, in the particular implementation shown in FIG. 2, the management system 200 includes an aggregation point 220 that is communicatively coupled to the connector assemblies 202 via the IP network 218.

The aggregation point 220 includes functionality that obtains physical layer information from the connector assemblies 202 (and other devices) and stores the physical layer information in a data store. The aggregation point 220 can be used to receive physical layer information from various types of connector assemblies 202 that have functionality for automatically reading information stored in or on the segment of physical communication media. Also, the aggregation point 220 and aggregation functionality 224 can be used to receive physical layer information from other types of devices that have functionality for automatically reading information stored in or on the segment of physical communication media. Examples of such devices include end-user devices—such as computers, peripherals (e.g., printers, copiers, storage devices, and scanners), and IP telephones—that include functionality for automatically reading information stored in or on the segment of physical communication media.

The aggregation point 220 also can be used to obtain other types of physical layer information. For example, in this implementation, the aggregation point 220 also obtains information about physical communication media segments that is not otherwise automatically communicated to an aggregation point 220. This information can be provided to the aggregation point 220, for example, by manually entering such information into a file (e.g., a spreadsheet) and then uploading the file to the aggregation point 220 (e.g., using a web browser) in connection with the initial installation of each of the various items. Such information can also, for example, be directly entered using a user interface provided by the aggregation point 220 (e.g., using a web browser).

The aggregation point 220 also includes functionality that provides an interface for external devices or entities to access the physical layer information maintained by the aggregation point 220. This access can include retrieving information from the aggregation point 220 as well as supplying information to the aggregation point 220. In this implementation, the aggregation point 220 is implemented as "middleware" that is able to provide such external devices and entities with transparent and convenient access to the PLI maintained by the access point 220. Because the aggregation point 220 aggregates PLI from the relevant devices on the IP network 218 and provides external devices and entities with access to such PLI, the external devices and entities do not need to individually interact with all of the devices in the IP network 218 that provide PLI, nor do such devices need to have the capacity to respond to requests from such external devices and entities.

For example, as shown in FIG. 2, a network management system (NMS) 230 includes PLI functionality 232 that is configured to retrieve physical layer information from the aggregation point 220 and provide it to the other parts of the NMS 230 for use thereby. The NMS 230 uses the retrieved physical layer information to perform one or more network management functions. In certain implementations, the NMS 230 communicates with the aggregation point 220 over the IP network 218. In other implementations, the NMS 230 may be directly connected to the aggregation point 220.

As shown in FIG. 2, an application 234 executing on a computer 236 also can use the API implemented by the aggregation point 220 to access the PLI information maintained by the aggregation point 220 (e.g., to retrieve such information from the aggregation point 220 and/or to supply such information to the aggregation point 220). The computer 236 is coupled to the IP network 218 and accesses the aggregation point 220 over the IP network 218.

In the example shown in FIG. 2, one or more inter-networking devices 238 used to implement the IP network 218 include physical layer information (PLI) functionality 240. The PLI functionality 240 of the inter-networking device 238 is configured to retrieve physical layer information from the aggregation point 220 and use the retrieved physical layer information to perform one or more inter-networking functions. Examples of inter-networking functions include Layer 1, Layer 2, and Layer 3 (of the OSI model) inter-networking functions such as the routing, switching, repeating, bridging, and grooming of communication traffic that is received at the inter-networking device.

The aggregation point 220 can be implemented on a standalone network node (e.g., a standalone computer running appropriate software) or can be integrated along with other network functionality (e.g., integrated with an element management system or network management system or other network server or network element). Moreover, the functionality of the aggregation point 220 can be distribute across many nodes and devices in the network and/or implemented, for example, in a hierarchical manner (e.g., with many levels of aggregation points). The IP network 218 can include one or more local area networks and/or wide area networks (e.g., the Internet). As a result, the aggregation point 220, NMS 230, and computer 236 need not be located at the same site as each other or at the same site as the connector assemblies 202 or the inter-networking devices 238.

Also, power can be supplied to the connector assemblies 202 using conventional "Power over Ethernet" techniques specified in the IEEE 802.3af standard, which is hereby incorporated herein by reference. In such an implementation, a power hub 242 or other power supplying device (located near or incorporated into an inter-networking device that is coupled to each connector assembly 202) injects DC power onto one or more power cables (e.g., a power wire included in a copper twisted-pair cable) used to connect each connector assembly 202 to the IP network 218.

Figure 3:
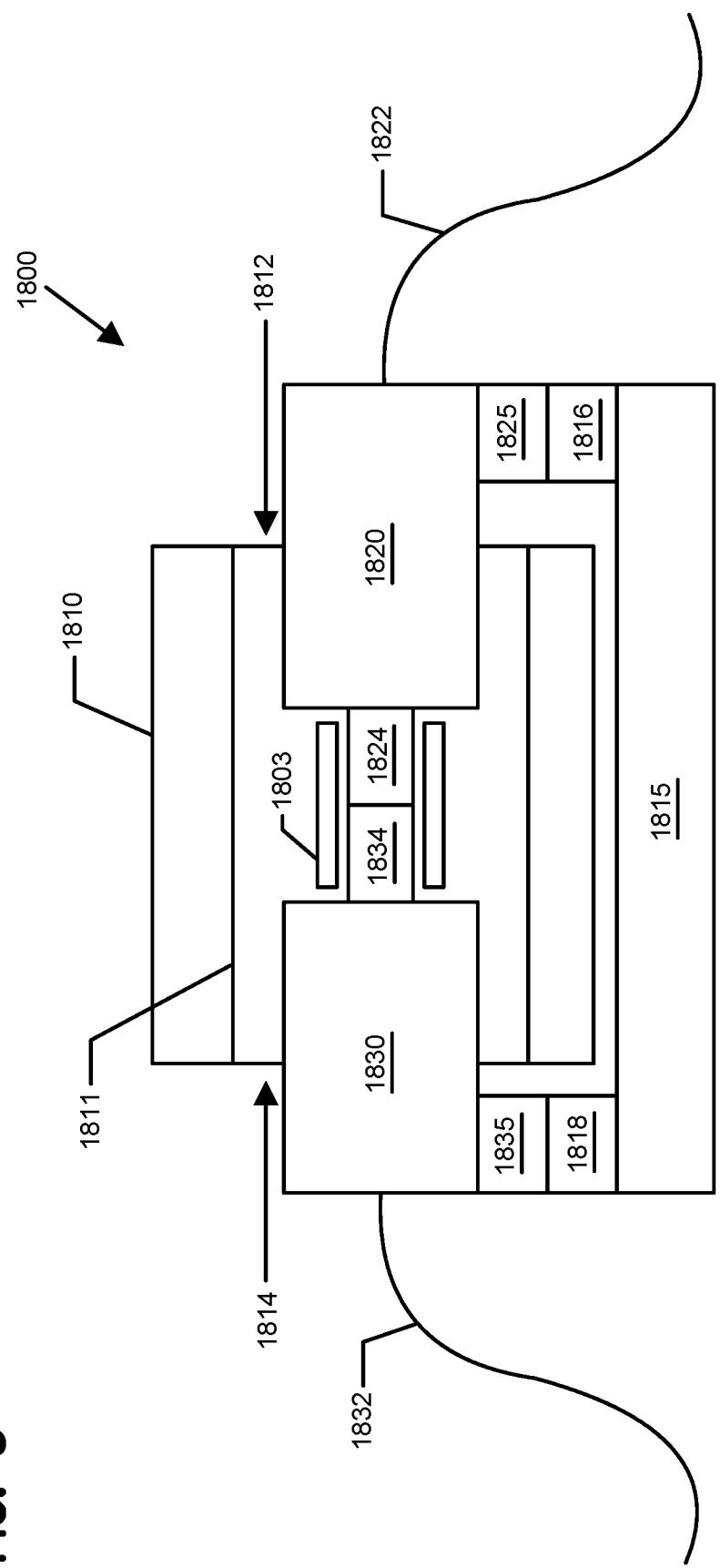
FIG. 3 is a block diagram of one high-level example of a coupler assembly and media reading interface that are suitable for use in the management system of FIG. 2 in accordance with aspects of the present disclosure.

FIG. 3 is a schematic diagram of one example connection system 1800 including a connector assembly 1810 configured to collect physical layer information from at least one segment of physical communications media. The example connector assembly 1810 of FIG. 3 is configured to connect segments of optical physical communications media in a physical layer management system. The connector assembly 1810 includes a fiber optic adapter defining at least one connection opening 1811 having a first port end 1812 and a second port end 1814. A sleeve (e.g., a split sleeve) 1803 is arranged within the connection opening 1811 of the adapter 1810 between the first and second port ends 1812, 1814. Each port end 1812, 1814 is configured to receive a connector arrangement as will be described in more detail herein.

A first example segment of optical physical communication media includes a first optical fiber 1822 terminated by a first connector arrangement 1820. A second example segment of optical physical communication media includes a second optical fiber 1832 terminated by a second connector arrangement 1830. The first connector arrangement 1820 is plugged into the first port end 1812 and the second connector arrangement 1830 is plugged into the second port end 1814. Each fiber connector arrangement 1820, 1830 includes a ferrule 1824, 1834 through which optical signals from the optical fiber 1822, 1832, respectively, pass.

The ferrules 1824, 1834 of the connector arrangements 1820, 1830 are aligned by the sleeve 1803 when the connector arrangements 1820, 1830 are inserted into the connection opening 1811 of the adapter 1810. Aligning the ferrules 1824, 1834 provides optical coupling between the optical fibers 1822, 1832. In some implementations, each segment of optical physical communication media (e.g., each optical fiber 1822, 1832) carries communication signals (e.g., communications signals S1 of FIG. 1). The aligned ferrules 1824, 1834 of the connector arrangements 1820, 1830 create an optical path along which the communication signals (e.g., signals S1 of FIG. 1) may be carried.

In some implementations, the first connector arrangement 1820 may include a storage device 1825 that is configured to store physical layer information (e.g., an identifier and/or attribute information) pertaining to the segment of physical communications media (e.g., the first connector arrangement 1820 and/or the fiber optic cable 1822 terminated thereby). In some implementations, the connector arrangement 1830 also includes a storage device 1835 that is configured to store information (e.g., an identifier and/or attribute information) pertaining to the second connector arrangement 1830 and/or the second optic cable 1832 terminated thereby.

In one implementation, each of the storage devices 1825, 1835 is implemented using an EEPROM (e.g., a PCB surface-mount EEPROM). In other implementations, the storage devices 1825, 1835 are implemented using other non-volatile memory device. Each storage device 1825, 1835 is arranged and configured so that it does not interfere or interact with the communications signals communicated over the media segments 1822, 1832.

In accordance with some aspects, the adapter 1810 is coupled to at least a first media reading interface 1816. In certain implementations, the adapter 1810 also is coupled to at least a second media interface 1818. In some implementations, the adapter 1810 is coupled to multiple media reading interfaces. In certain implementations, the adapter 1810 includes a media reading interface for each port end defined by the adapter 1810. In other implementations, the adapter 1810 includes a media reading interface for each connection opening 1811 defined by the adapter 1810. In still other implementations, the adapter 1810 includes a media reading interface for each connector arrangement that the adapter 1810 is configured to receive. In still other implementations, the adapter 1810 includes a media reading interface for only a portion of the connector arrangement that the adapter 1810 is configured to receive.

In some implementations, at least the first media reading interface 1816 is mounted to a printed circuit board 1815. In the example shown, the first media reading interface 1816 of the printed circuit board 1815 is associated with the first port end 1812 of the adapter 1810. In some implementations, the printed circuit board 1815 also can include the second media reading interface 1818. In one such implementation, the second media reading interface 1818 is associated with the second port end 1814 of the adapter 1810.

The printed circuit board 1815 of the connector assembly 1810 can be communicatively connected to one or more programmable processors (e.g., processors 216 of FIG. 2) and/or to one or more network interfaces (e.g., network interfaces 216 of FIG. 2). The network interface may be configured to send the physical layer information (e.g., see signals S2 of FIG. 1) to a physical layer management network (e.g., see communications network 101 of FIG. 1 or IP network 218 of FIG. 2). In one implementation, one or more such processors and interfaces can be arranged as components on the printed circuit board 1815. In another implementation, one or more such processor and interfaces can be arranged on separate circuit boards that are coupled together. For example, the printed circuit board 1815 can couple to other circuit boards via a card edge type connection, a connector-to-connector type connection, a cable connection, etc.

When the first connector arrangement 1820 is received in the first port end 1812 of the adapter 1810, the first media reading interface 1816 is configured to enable reading (e.g., by the processor) of the information stored in the storage device 1825. The information read from the first connector arrangement 1820 can be transferred through the printed circuit board 1815 to a physical layer management network, e.g., network 101 of FIG. 1, network 218 of FIG. 2, etc. When the second connector arrangement 1830 is received in the second port end 1814 of the adapter 1810, the second media reading interface 1818 is configured to enable reading (e.g., by the processor) of the information stored in the storage device 1835. The information read from the second connector arrangement 1830 can be transferred through the printed circuit board 1815 or another circuit board to the physical layer management network.

In some such implementations, the storage devices 1825, 1835 and the media reading interfaces 1816, 1818 each comprise three (3) leads—a power lead, a ground lead, and a data lead. The three leads of the storage devices 1825, 1835 come into electrical contact with three (3) corresponding leads of the media reading interfaces 1816, 1818 when the corresponding media segment is inserted in the corresponding port. In certain example implementations, a two-line interface is used with a simple charge pump. In still other implementations, additional leads can be provided (e.g., for potential future applications). Accordingly, the storage devices 1825, 1835 and the media reading interfaces 1816, 1818 may each include four (4) leads, five (5) leads, six (6) leads, etc.

FIGS. 4-12 illustrate a first example implementation of a connector system 1000 that can be utilized on a connector assembly (e.g., a communications panel) having PLI functionality as well as PLM functionality. One example connector assembly on which the connector system 1000 can be implemented is a bladed chassis.

Figure 8:
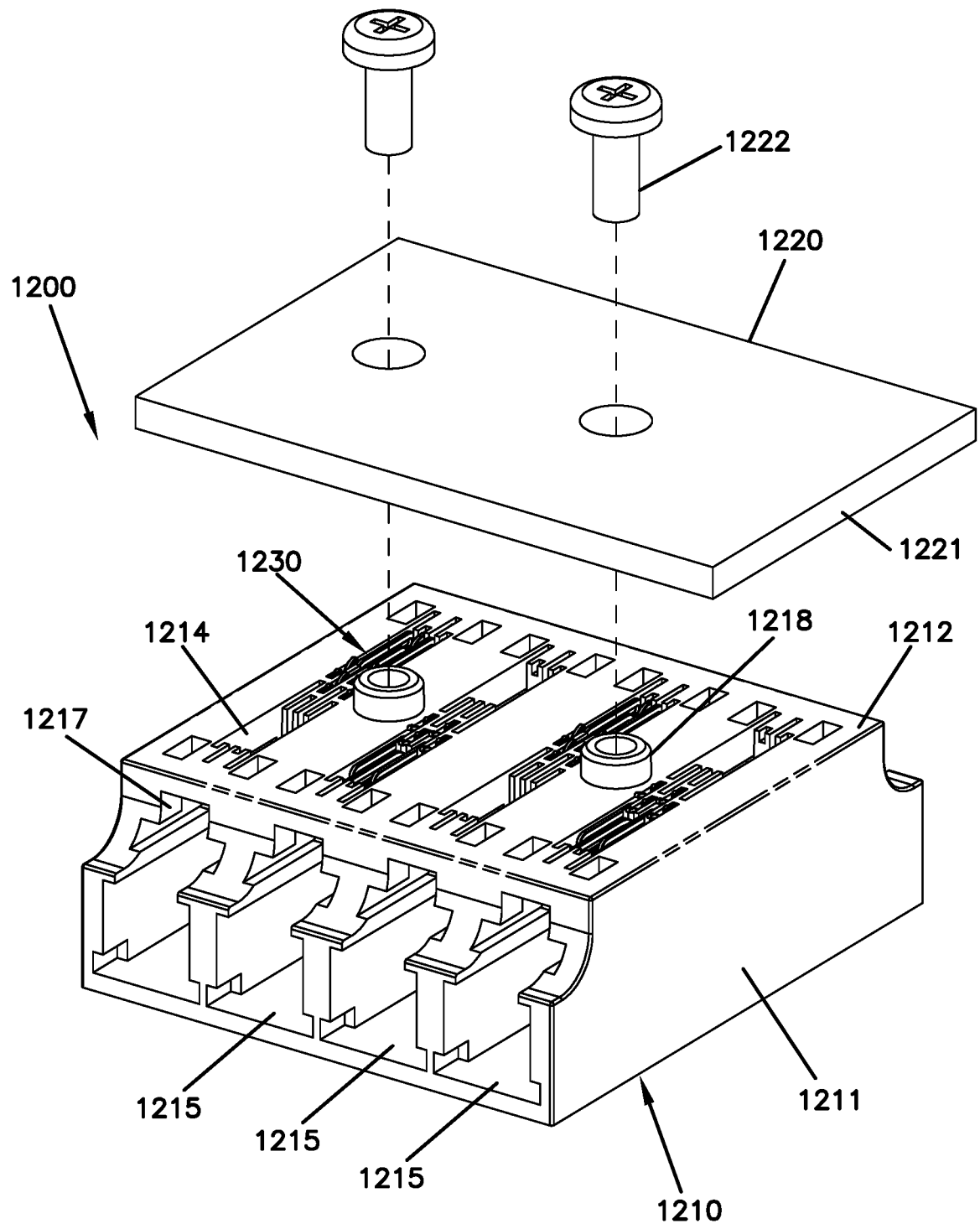

The connector system 1000 includes at least one example communications coupler assembly 1200 that can be mounted to a connector assembly, such as a communications panel. One or more example connector arrangements 1100, which terminate segments 1010 of communications media, are configured to communicatively couple to other segments of physical communications media at the coupler assembly 1200 (FIG. 8). Accordingly, communications data signals carried by a media segment terminated by a first connector arrangement 1100 can be propagated to another media segment (e.g., terminated by a second connector arrangement 1100) through the communications coupler 1200.

In accordance with some aspects, each connector arrangement 1100 is configured to terminate a single segment of physical communications media. For example, each connector arrangement 1100 can include a single connector 1110 that terminates a single optical fiber or a single electrical conductor. In one example implementation, each connector arrangement 1100 includes a single LC-type fiber optic connector 1110 that terminates a single optical fiber.

Figure 4:
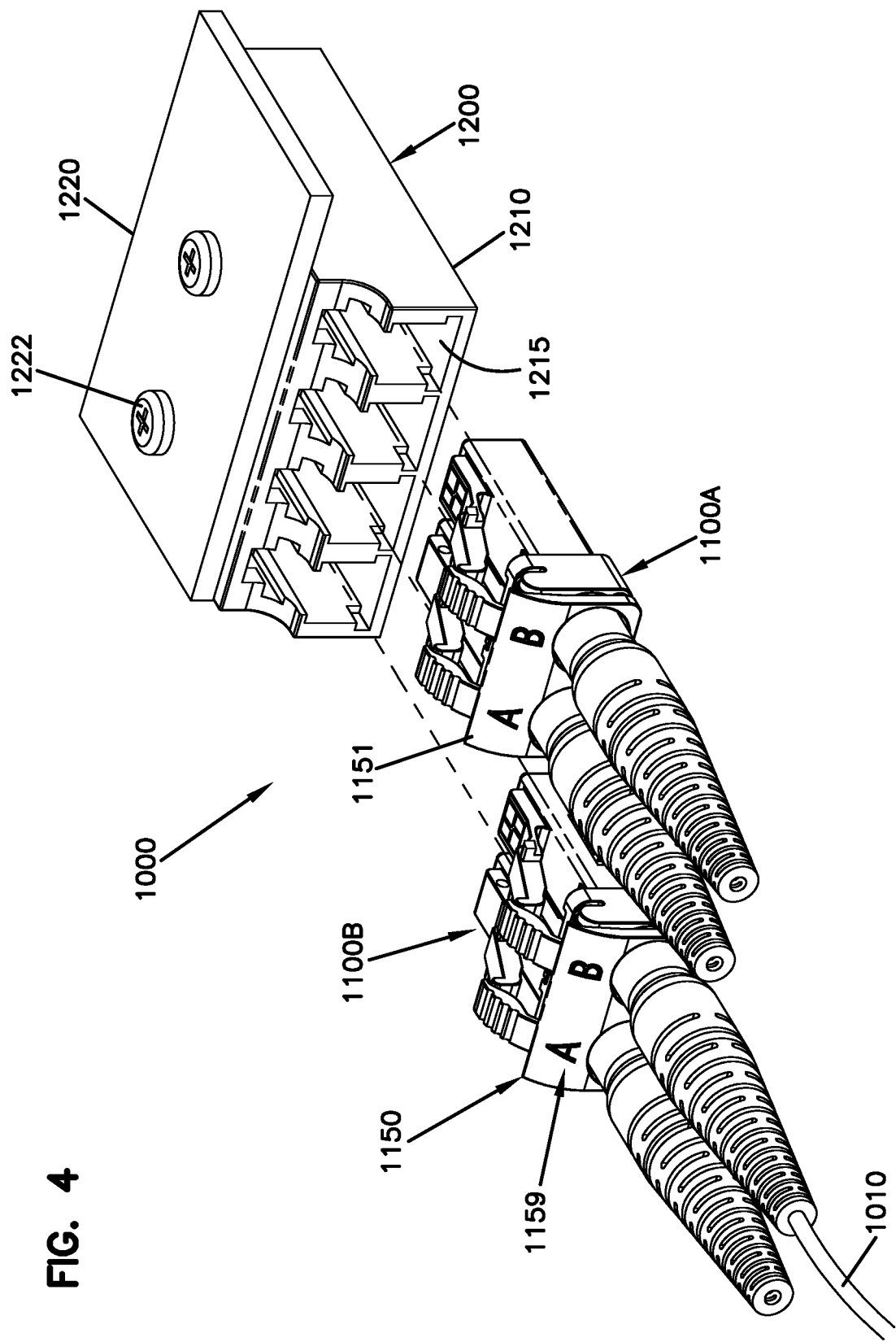
FIGS. 4-12 illustrate a first example implementation of a connector system that can be utilized on a connector assembly (e.g., a communications panel) having PLI functionality as well as PLM functionality in accordance with aspects of the present disclosure.

In accordance with other aspects, each connector arrangement 1100 includes two or more connectors 1110, each of which terminates a single segment of physical communications media. For example, FIG. 4 shows two connector arrangements 1100A, 1100B, each of which defines a duplex fiber optic connector arrangement. Each duplex connector arrangement 1100A, 1100B shown includes two connectors 1110, each of which terminates an optical fiber 1010. In other implementations, the connectors 1110 can be an SC-type, an ST-type, an FC-type, an LX.5-type, etc.

Figure 31:
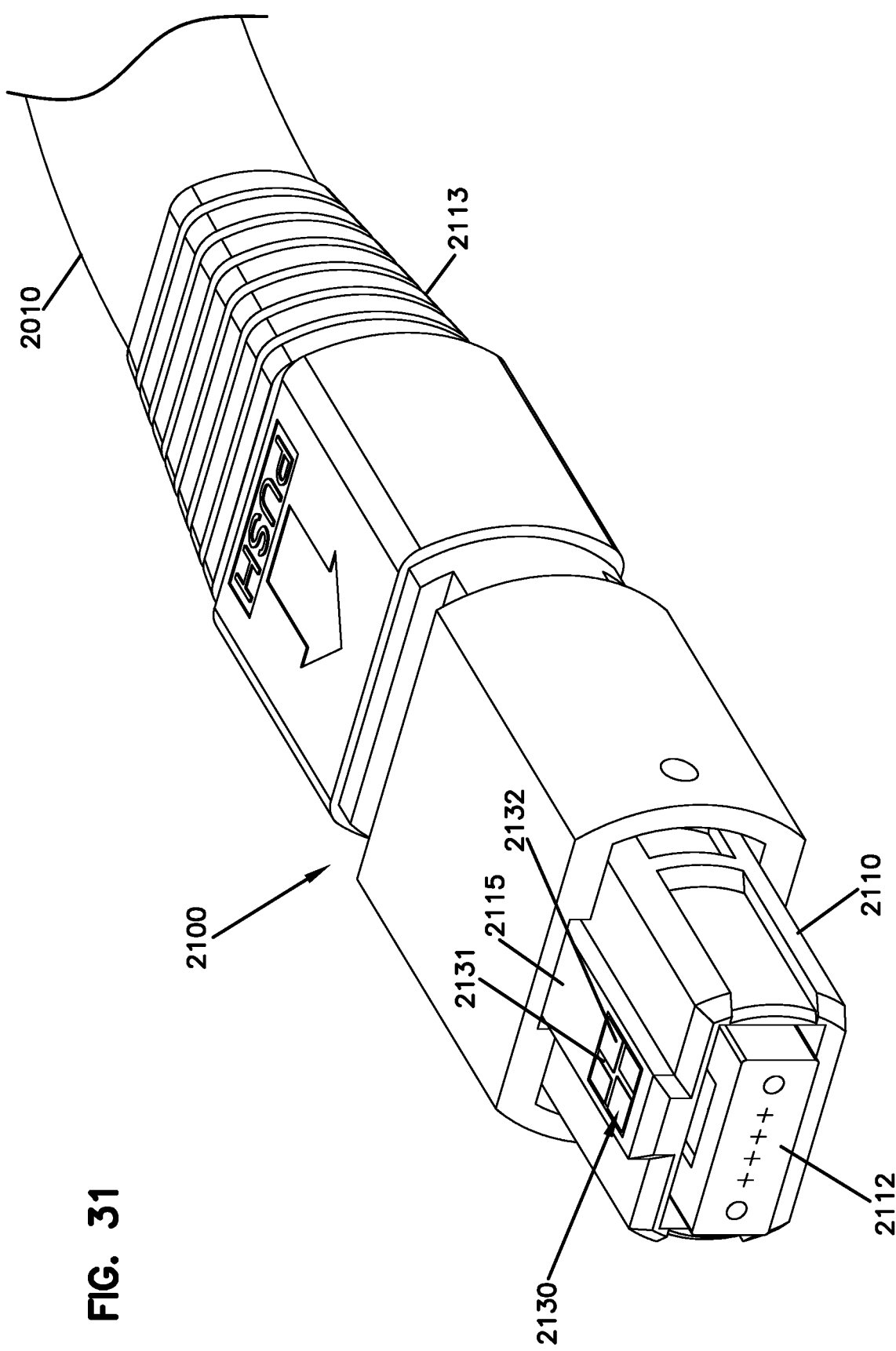
Figure 32:
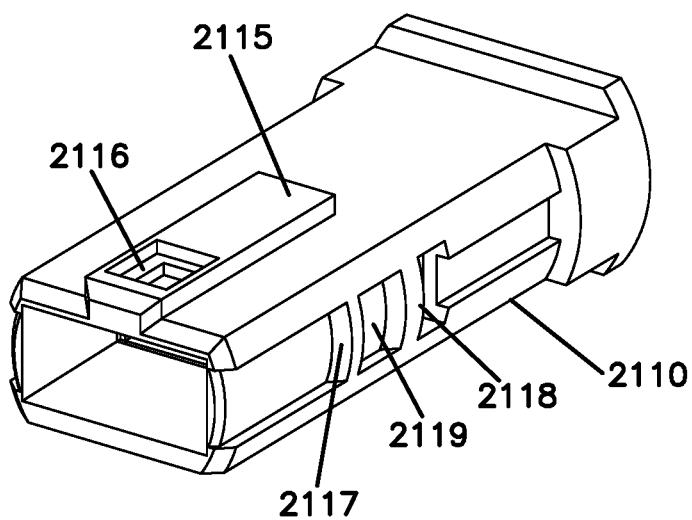
Figure 33:
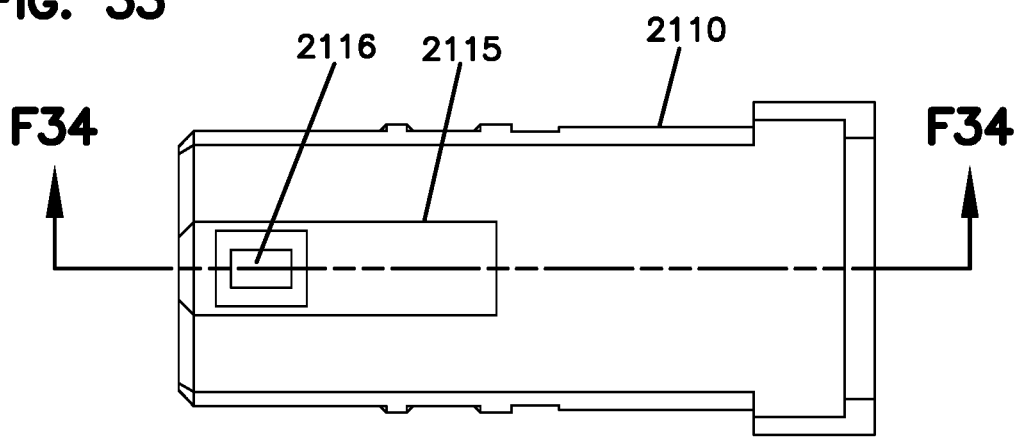
Figure 34:
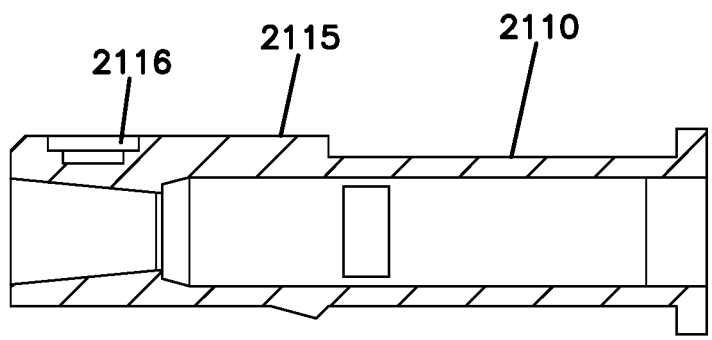
Figure 59:
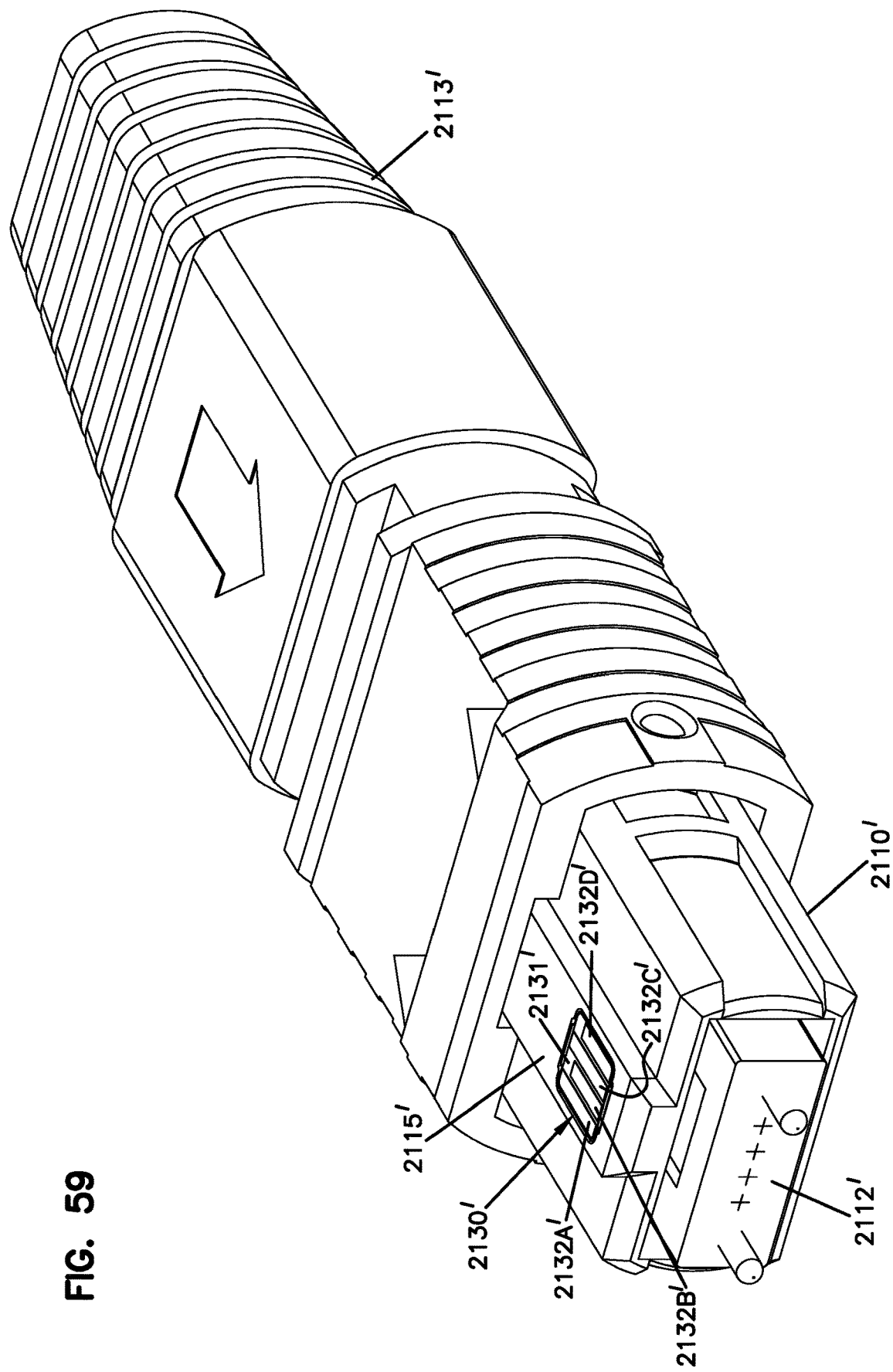
Figure 60:
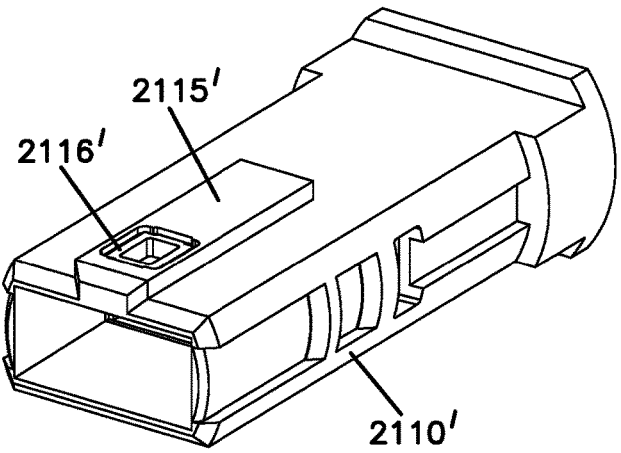
Figure 61:
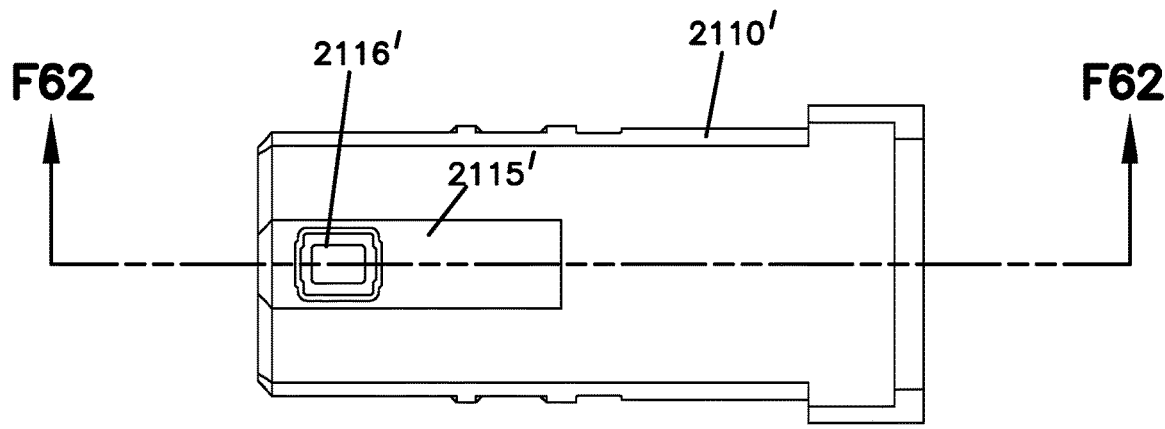
Figure 62:
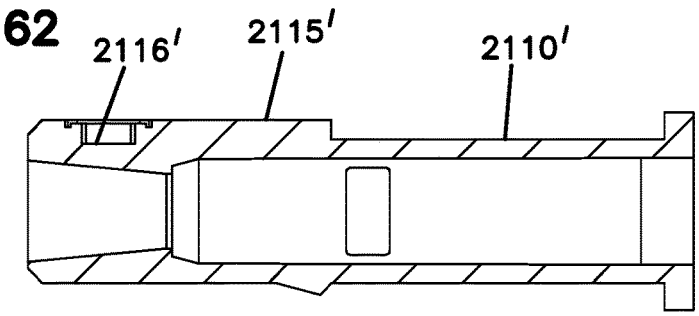
Figure 63:
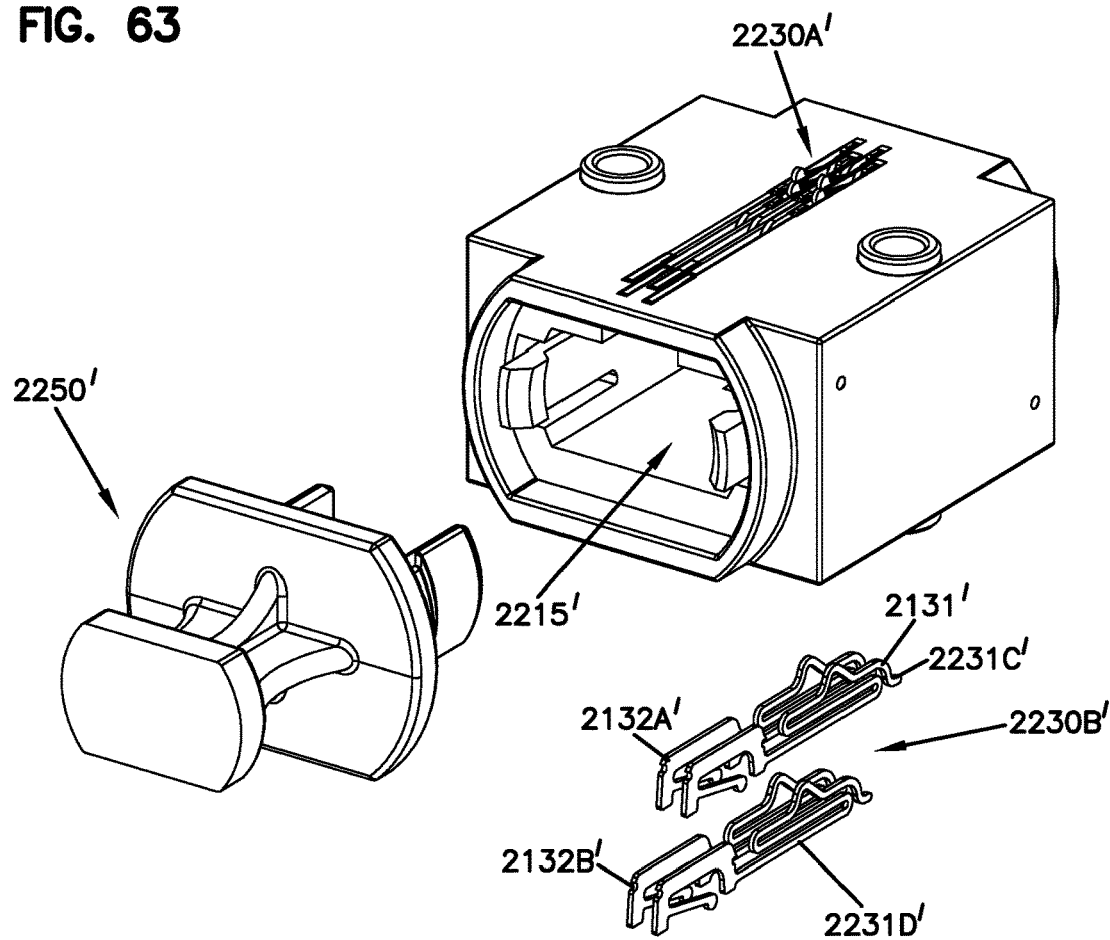

In accordance with still other aspects, each connector arrangement 1100 can include one or more connectors, each of which terminates a plurality of physical media segments (e.g., see connector arrangement 2100, 2100', and 5100 of FIGS. 31, 59, and 133). In one example implementation, each connector arrangement includes a single MPO-type fiber optic connector that terminates multiple optical fibers. In still other systems, other types of connector arrangements (e.g., electrical connector arrangements) can be secured to the communications coupler 1200 or to a different type of coupler assembly.

In accordance with some aspects, each communications coupler 1200 is configured to form a single link between segments of physical communications media 1010. For example, each communications coupler 1200 can define a single passage extending between first and second ports at which first and second connector arrangements are coupled. In accordance with other aspects, however, each communications coupler 1200 is configured to form two or more links between segments of physical communications media. For example, in the example shown in FIG. 4, the communications coupler 1200 defines four passages 1215, each extending between a first port and a second port.

In some implementations, each passage 1215 of the communications coupler 1200 is configured to form a single link between first and second connector arrangements 1100. In other example implementations, two or more passages 1215 can form a single link between connector arrangements 1100 (e.g., two passages can form a single link between two duplex connector arrangements). In still other example implementations, each communications coupler 1200 can form a one-to-many link. For example, the communications coupler 1200 shown in FIG. 4 can connect a duplex connector arrangement to two single connector arrangements.

Figure 5:
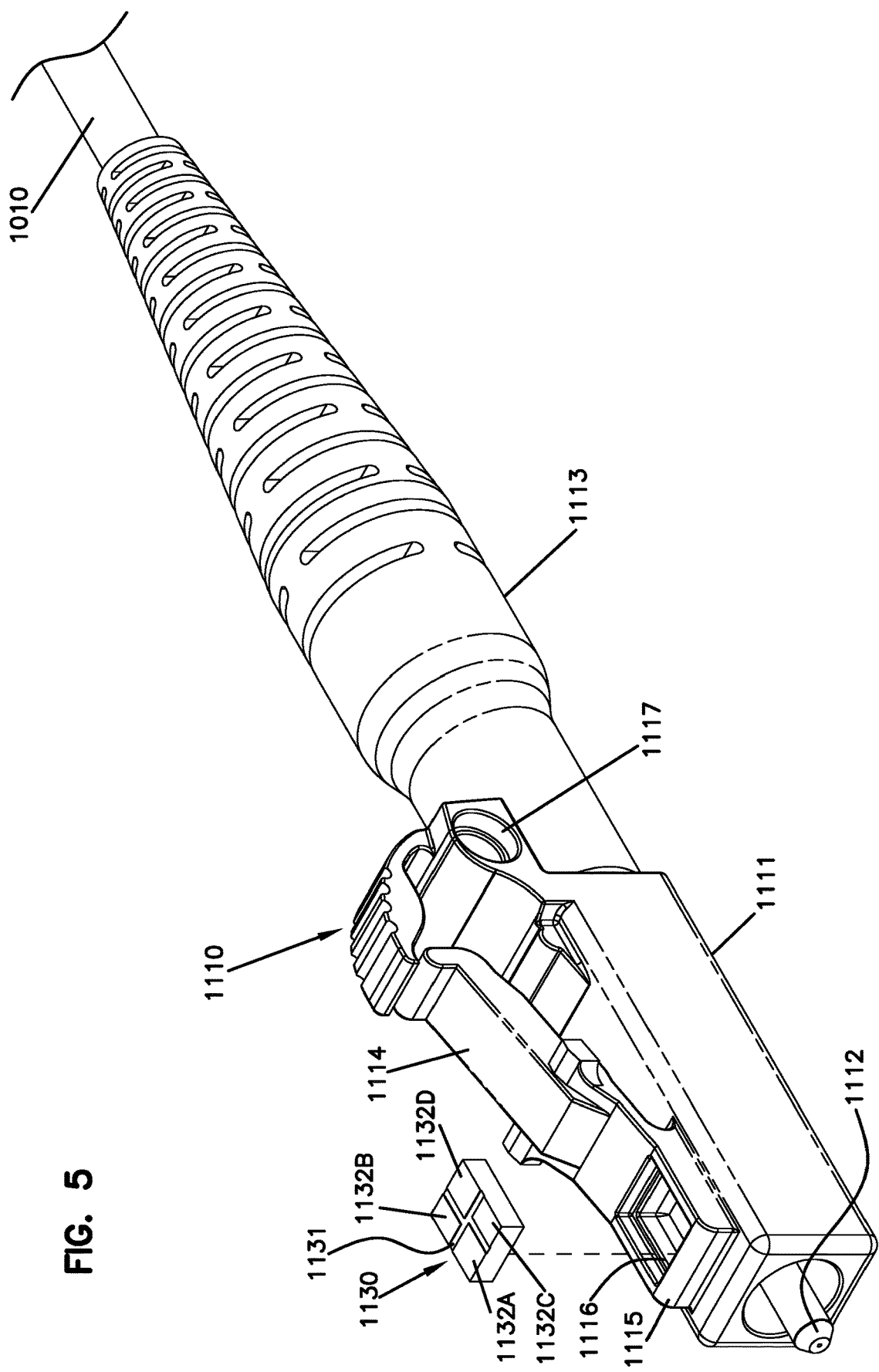
Figure 6:
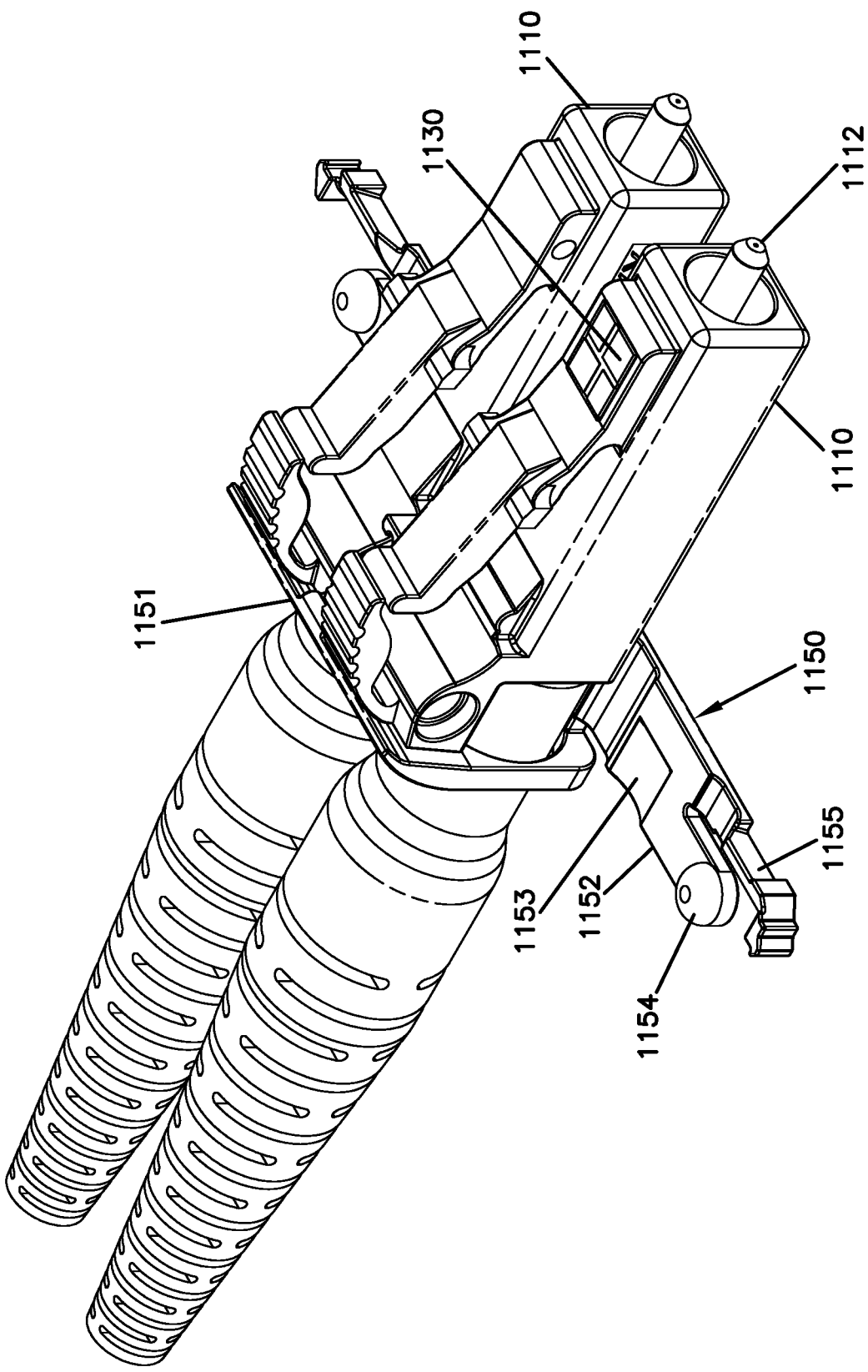
Figure 7:
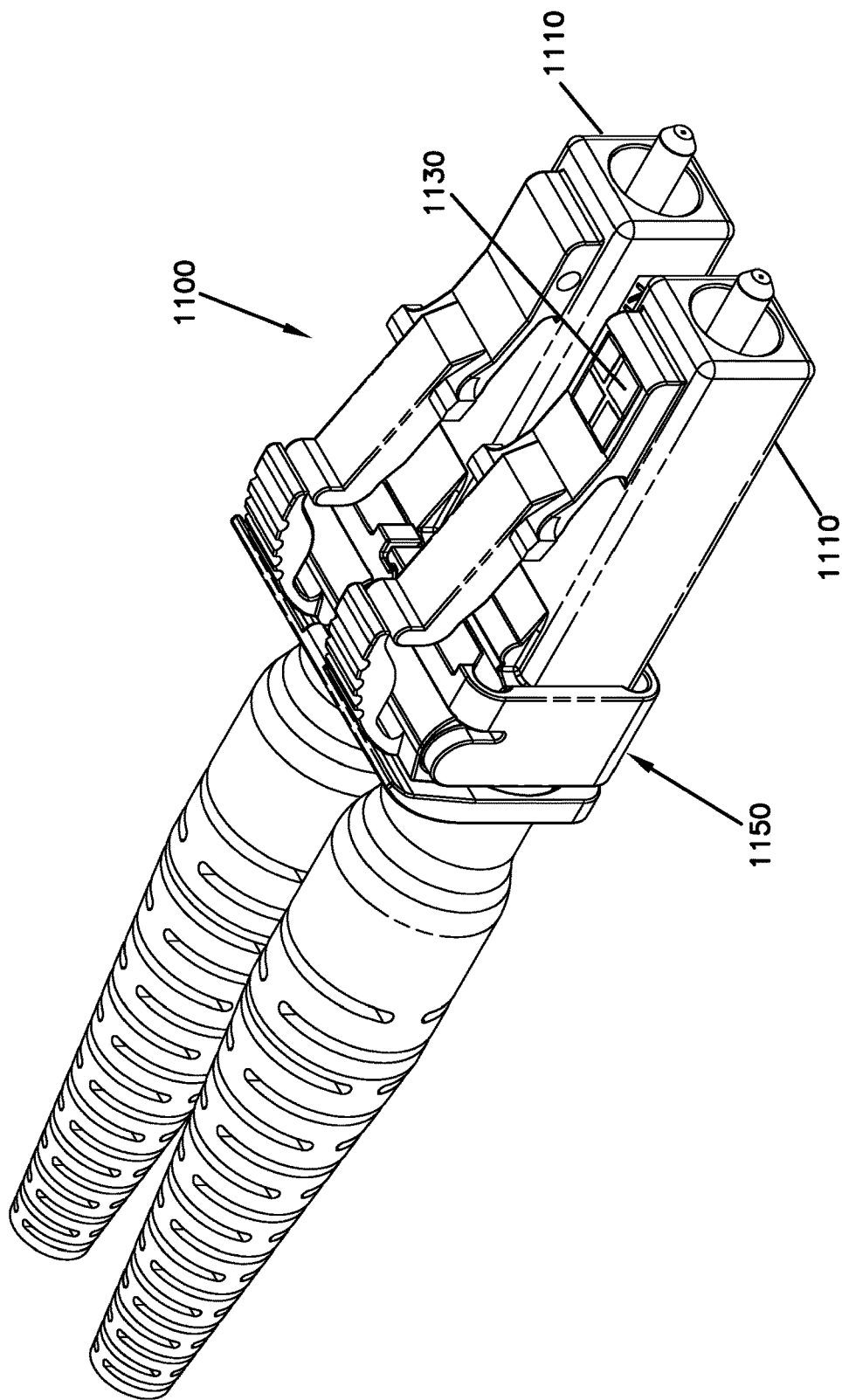

One example implementation of a connector arrangement 1100 is shown in FIGS. 5-7. The connector arrangement 1100 includes one or more fiber optic connectors 1110, each of which terminates one or more optical fibers 1010. In the example shown in FIG. 4, each connector arrangement 1100A, 1100B defines a duplex fiber optic connector arrangement. Each duplex fiber optic connector arrangement 1100A, 1100B includes two fiber optic connectors 1110 held together using a clip 1150. In another example implementation, a connector arrangement 1100 can define a single fiber optic connector (e.g., see FIG. 5).

As shown in FIG. 5, each fiber optic connector 1110 includes a connector body 1111 protecting a ferrule 1112 that retains an optical fiber 1010. The connector body 1111 is secured to a boot 1113 for providing bend protection to the optical fiber 1010. In the example shown, the connector 1110 is an LC-type fiber optic connector. The connector body 1111 includes a fastening member (e.g., latching arm) 1114 that facilitates retaining the fiber optic connector 1110 at a port of a passage 1215 defined in the communications coupler 1200. The connector body 1111 also defines a through hole (or opposing depressions) 1117.

Each connector arrangement 1100 is configured to store physical layer information. For example, the physical layer information can be stored on or in the body 1111 of one or more of the fiber optic connectors 1110 of the connector arrangement 1100. In the example shown in FIG. 5, each connector body 1111 includes a key 1115 that is configured to align with a keyway defined in the coupler assembly 1200. The key 1115 of certain types of connectors 1110 may be configured to accommodate a storage device 1130 on which the physical layer information is stored. For example, in certain implementations, the key 1115 defines a cavity 1116 in which the storage device 1130 can be positioned. In some implementations, a cover can be positioned over the storage device 1130 to enclose the storage device 1130 within the connector 1111. In other implementations, the storage device 1130 is left exposed.

One example storage device 1130 includes a printed circuit board 1131 on which memory circuitry can be arranged. Electrical contacts 1132 also are arranged on the printed circuit board 1131 for interaction with a media reading interface of the communications coupler 1200 (described in more detail herein). In one example implementation, the storage device 1130 includes an EEPROM circuit arranged on the printed circuit board 1131. In other implementations, however, the storage device 1130 can include any suitable type of non-volatile memory. In the example shown in FIG. 5, the memory circuitry is arranged on the non-visible side of the printed circuit board 1131.

As shown in FIGS. 6 and 7, two or more fiber optic connectors 1110 can be secured together to form the connector arrangement 1100. In the example shown, two fiber optic connectors 1110 are secured together using a clip 1150. In some implementations, only one of the fiber optic connectors 1110 carries a storage device 1130. In other implementations, however, a storage device 1130 can be mounted to both fiber optic connectors 1110. In certain implementations, the clip 1150 is configured to be non-removable (e.g., permanent or semi-permanent). For example, the clip 1150 may non-removeably attach together two connectors 1110 when only one of the connectors 1110 carries a storage device 1130.

One example clip 1150 is shown in FIGS. 6 and 7. The clip 1150 includes a base 1151 that extends across the connectors 1110 to be fastened together. In certain implementations, indicia 1159 can be printed on the base 1151 to identify the fiber optic connectors 1110 (see FIG. 4). The clip 1150 also includes arms 1152 that are configured to wrap around and latch (e.g., see latch members 1155) to secure the fiber optic connectors 1110 together (FIGS. 6 and 7). In the example shown, each arm defines contours 1153 for accommodating the shape of each fiber optic connector 1110 (FIG. 6). The arms 1152 also include portions 1154 that engage and secure to the cavities/depressions 1117 on outer sides of the fiber optic connectors (FIG. 6).

In some implementations, the clip 1150 is non-removeably secured to the connectors 1110. For example, the arms 1152 may be glued, welded, latched, snap-fit, friction fit, or otherwise secured to the connectors 1110. In other implementations, other portions of the clip 1150 may be glued, welded, latched, snap-fit, friction fit, or otherwise secured to the connectors 1110. In one implementation, the clip 1150 may be molded around the connectors 1110. In another implementation, the clip 1150 may be molded with the connectors 1110 as a unitary piece. In still other implementations, the clip 1150 may otherwise secure the connectors 1110 together.

FIGS. 8-12 show a portion of one example implementation of a communications coupler assembly 1200 implemented as a fiber optic adapter. The example communications coupler assembly 1200 includes an adapter housing 1210 defining one or more passages 1215 configured to align and interface two or more fiber optic connectors. In other example implementations, however, one or more passages 1215 can be configured to communicatively couple together a fiber optic connector 1110 with a media converter (not shown) to convert the optical data signals into electrical data signals, wireless data signals, or other such data signals. In other implementations, however, the communications coupler assembly 1200 can include an electrical termination block that is configured to receive punch-down wires, electrical plugs (e.g., for electrical jacks), or other types of electrical connectors.

As shown in FIG. 8, a printed circuit board 1220 is configured to secure (e.g., via fasteners 1222) to the adapter housing 1210. In some implementations, the example adapter housing 1210 includes two annular walls 1218 in which the fasteners 1222 can be inserted to hold the printed circuit board 1220 to the adapter housing 1210. Non-limiting examples of suitable fasteners 1222 include screws, snaps, and rivets. For ease in understanding, only a portion of the printed circuit board 1220 is shown in FIG. 8. It is to be understood that the printed circuit board 1220 electrically connects to a data processor and/or to a network interface (e.g., the processor 217 and network interface 216 of FIG. 2). It is further to be understood that multiple communications coupler assemblies 1200 can be connected to the printed circuit board 1220 within a connector assembly (e.g., a communications panel).

Figure 9:
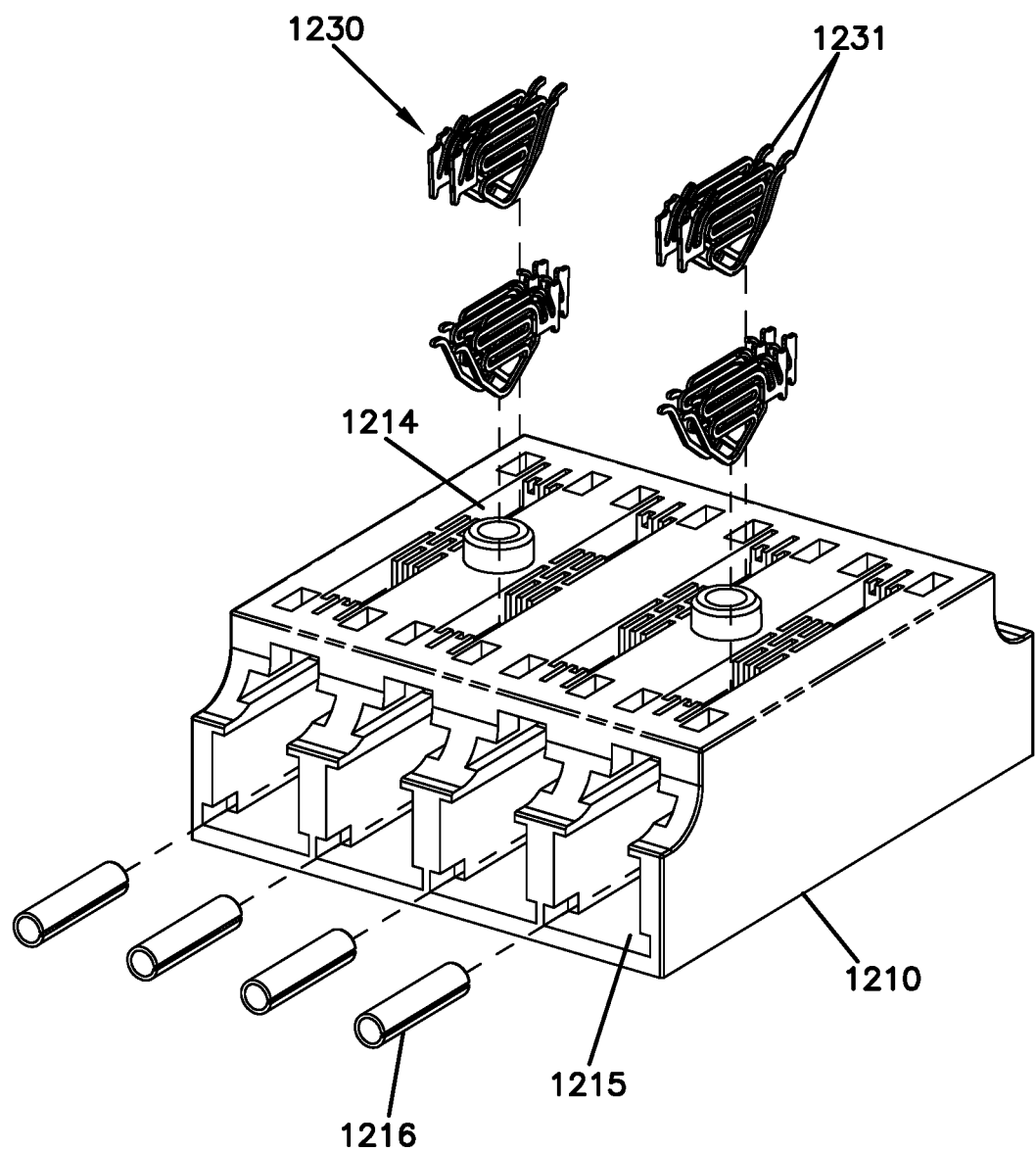

The example adapter housing 1210 shown in FIG. 8 is formed from opposing sides 1211 interconnected by first and second ends 1212. The sides 1211 and ends 1212 each extend between an open front and an open rear. The adapter housing 1210 defines one or more passages 1215 extending between the front and rear ports. Each port of each passage is configured to receive a connector arrangement or portion thereof (e.g., one fiber optic connector of duplex connector arrangement 1100A, 1100B of FIG. 4). One or more sleeves (e.g., split sleeves) 1216 are positioned within the passages 1215 to receive and align the ferrules 1112 of fiber optic connectors 1110 (FIG. 9).

In the example shown in FIG. 8, the body 1210 of the fiber optic adapter 1200 defines four passages 1215. In other implementations, the body 1210 can define greater or fewer passages 1215. For example, in some example implementations, the body 1210 of the fiber optic adapter 1200 can define a single passage 1215 that is configured to optically couple together two fiber optic connectors 1110 (e.g., two LC-type connectors, two MPO-type connectors, etc.). In other example implementations, the fiber optic adapter 1200 can define two, eight, or twelve passages 1215 that are each configured to optically couple together two fiber optic connectors 1110. The adapter housing 1210 also defines latch engagement channel 1217 at each port to facilitate retention of the latch arms 1114 of the fiber optic connectors 1110. Each latch engagement channel 1217 is configured to accommodate the key 1115 of the connector 1110 received at the port.

The fiber optic adapter 1210 includes one or more media reading interfaces 1230, each configured to acquire the physical layer information from the storage device 1130 of a fiber optic connector 1110 plugged into the fiber optic adapter 1210. For example, in one implementation, the adapter 1210 can include a media reading interface 1230 associated with each passage 1215. In another implementation, the adapter 1210 can include a media reading interface 1230 associated with each port of each passage 1215. In still other implementations, the adapter 1210 can include a media reading interface 1230 associated with each set of passages 1215 that accommodate a connector arrangement 1100.

In some implementations, the adapter 1210 includes a single media reading interface 1230 for each connector arrangement 1100 received thereat. For example, the quadruplex adapter 1210 shown in FIG. 9 includes two media reading interfaces 1230 located at the front of the adapter 1210 and two media reading interfaces 1230 located at the rear of the adapter 1210. Each media reading interfaces 1230 is configured to interface with the storage device 1130 of one connector 1110 of a duplex fiber optic connector arrangement 1100 received thereat. The adapter port receiving the connector 1110 of the duplex connector arrangement 1100 that does not have a storage device 1130 does not have a media reading interface 1230.

In some such implementations, the media reading interfaces 1230 are positioned in alternating ports on each side of the adapter 1210. For example, in FIG. 9, a first media reading interface 1230 is positioned at the front, right-most port of the adapter 1210, a second media reading interface 1230 is positioned at the rear, right-middle port of the adapter 1210, a third media reading interface 1230 is positioned at the front, left-middle port of the adapter 1210, and a fourth media reading interface 1230 is positioned at the rear, left-most port of the adapter 1210. In accordance with some implementations, two duplex adapters 1100 having a storage device mounted only at the right connector 1110 (see FIG. 4) may be received at front of the adapter 1210 and another two duplex adapters 1100 may be received at the rear of the adapter 1210.

In other implementations, the ports on one side of the adapter 1210 may include sufficient media reading interfaces 1230 configured to accommodate duplex fiber optic arrangements 1100 and the ports on the other side of the adapter 1210 may include sufficient media reading interfaces 1230 to accommodate monoplex (i.e., simplex) connector arrangements 1100. In still other implementations, the ports on both sides of the adapter 1210 may have sufficient media reading interfaces 1230 to accommodate monoplex connector arrangements 1100. In other implementations, the adapter housing 120 can include any desired combination of front and rear media reading interfaces 1230.

In general, each media reading interface 1230 is formed from one or more contact members 1231 (FIG. 9). In certain implementations, the coupler housing 1210 defines slots 1214 configured to receive one or more contact members 1231. In the example shown in FIGS. 11 and 12, the slots 1214 accommodating each media reading interface 1230 form one continuous opening. In some implementations, the slots 1214 are configured so that portions of the contact members 1231 extend into the passages 1215 to engage the electrical contacts 1132 of the storage member 1130 positioned in the ports (see FIG. 10). Other portions of the contact members 1231 are configured to engage contacts and tracings on the printed circuit board 1220 associated with the adapter 1200 (see FIG. 12). In the example shown in FIGS. 4 and 8, the contacts and tracings on the printed circuit board 1220 that interact with the contact members 1231 are positioned on the non-visible side of the board 1220.

In accordance with some aspects, the contact members 1231 of a media reading interface 1230 are configured to form a complete circuit with the printed circuit board 1220 only when a segment of physical communications media (e.g., a fiber optic connector 1110) is inserted within the respective passage 1215. For example, a portion of each contact member 1231 can be configured to contact the printed circuit board 1220 only after being pushed external of the housing 1210 by the media segment. Accordingly, the contact members 1231 can function as presence detection sensors or switches. In other example implementations, portions of the contact members 1231 can be configured to complete a circuit until pushed away from a shorting rod by a media segment. In accordance with other aspects, some implementations of the contact members 1231 can be configured to form a complete circuit with the printed circuit board 1220 regardless of whether a media segment is received in the passage 1215.

Figure 10:
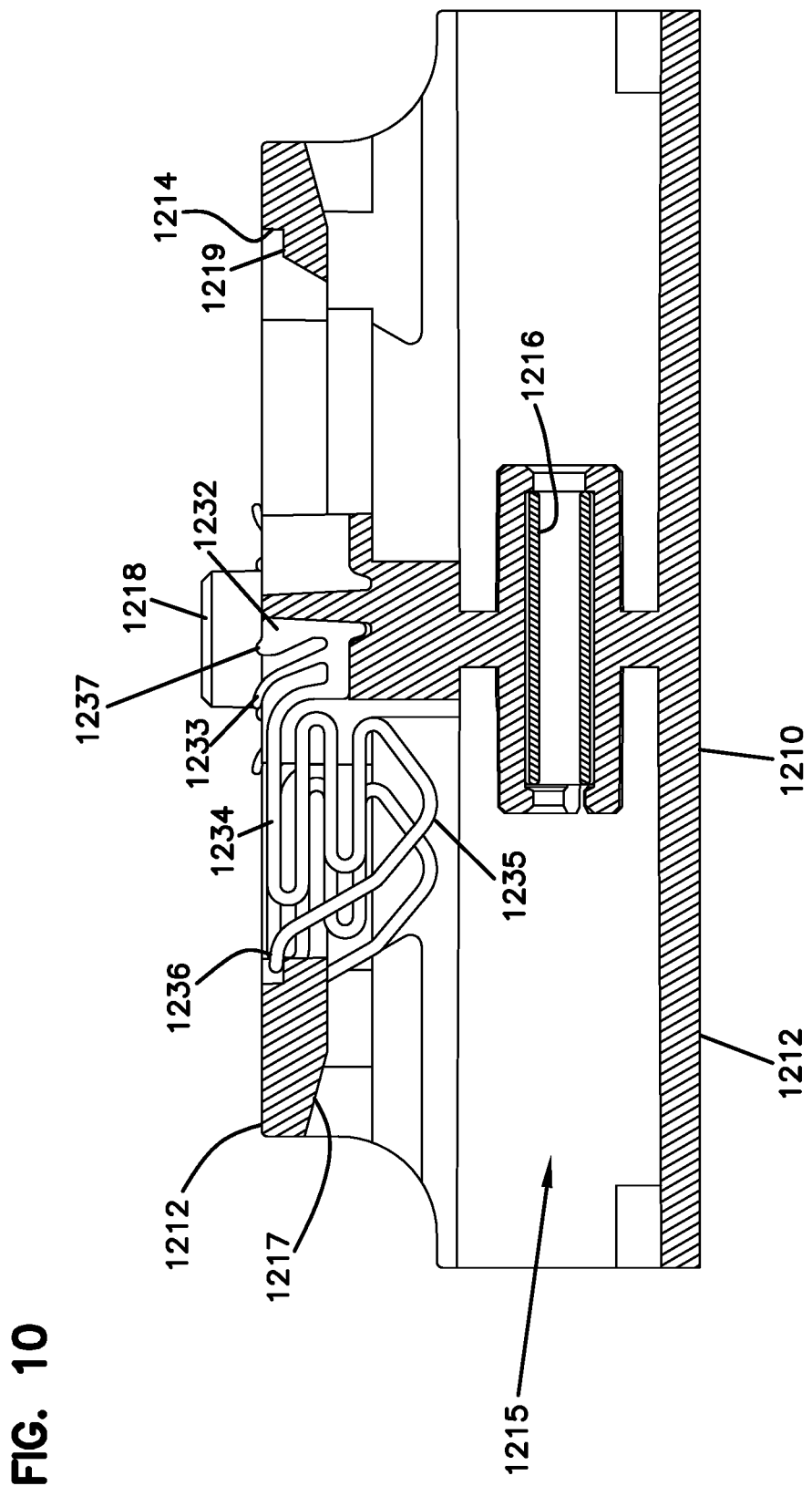
Figure 11:
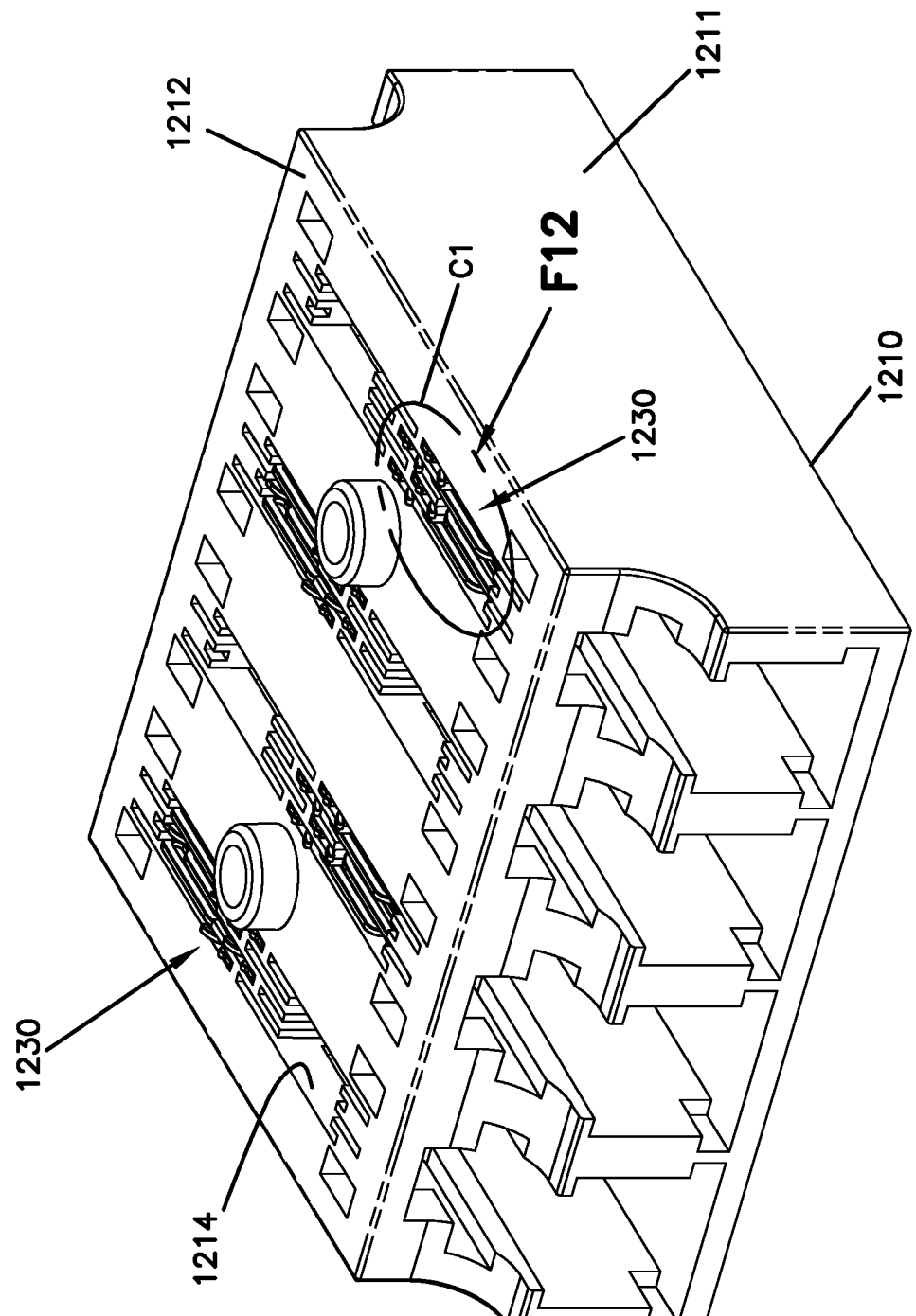

One example type of contact member 1231 is shown in FIG. 10. In some implementations, the contact member 1231 defines a planar body. In some implementations, the contact member 1231 is formed monolithically (e.g., from a continuous sheet of metal or other material). For example, in some implementations, the contact member 1231 may be manufactured by cutting a planar sheet of metal or other material. In other implementations, the contact member 1231 may be manufactured by etching a planar sheet of metal or other material. In other implementations, the contact member 1231 may be manufactured by laser trimming a planar sheet of metal or other material. In still other implementations, the contact member 1231 may be manufactured by stamping a planar sheet of metal or other material.

Each contact member 1231 defines at least three moveable contact locations 1233, 1235, and 1236. The flexibility of the contact surfaces 1233, 1235, and 1236 provides tolerance for differences in spacing between the contact member 1231 and the respective printed circuit board 1220 when the coupler assembly 1200 is manufactured. Certain types of contact members 1231 also include at least one stationary contact 1237.

In some implementations, the contact members 1231 of a single media reading interface 1230 are staggered to facilitate access to the contact pads 1132 on the connector storage device 1130. For example, as shown in FIGS. 8-12, alternating contact members 1231 can be staggered between at least first and second locations within the slots 1214 (see configuration C1, shown in detail in FIG. 12). Likewise, in some implementations, the contact pads 1132 on each storage device 1130 can be arranged in staggered positions (e.g., see pads 1132A-1132D in FIG. 5). In other implementations, the contact members 1231 of a media reading interface 1230 can be laterally aligned (i.e., side-by-side) or arranged in other configurations to facilitate a one-to-one connection between the contact members 1231 and the contact pads 1132. In still other implementations, the contact pads 1132 on each storage device 1130 can vary in size and/or shape to facilitate a one-to-one connection between the contact members 1231 and the contact pads 1132.

Figure 12:
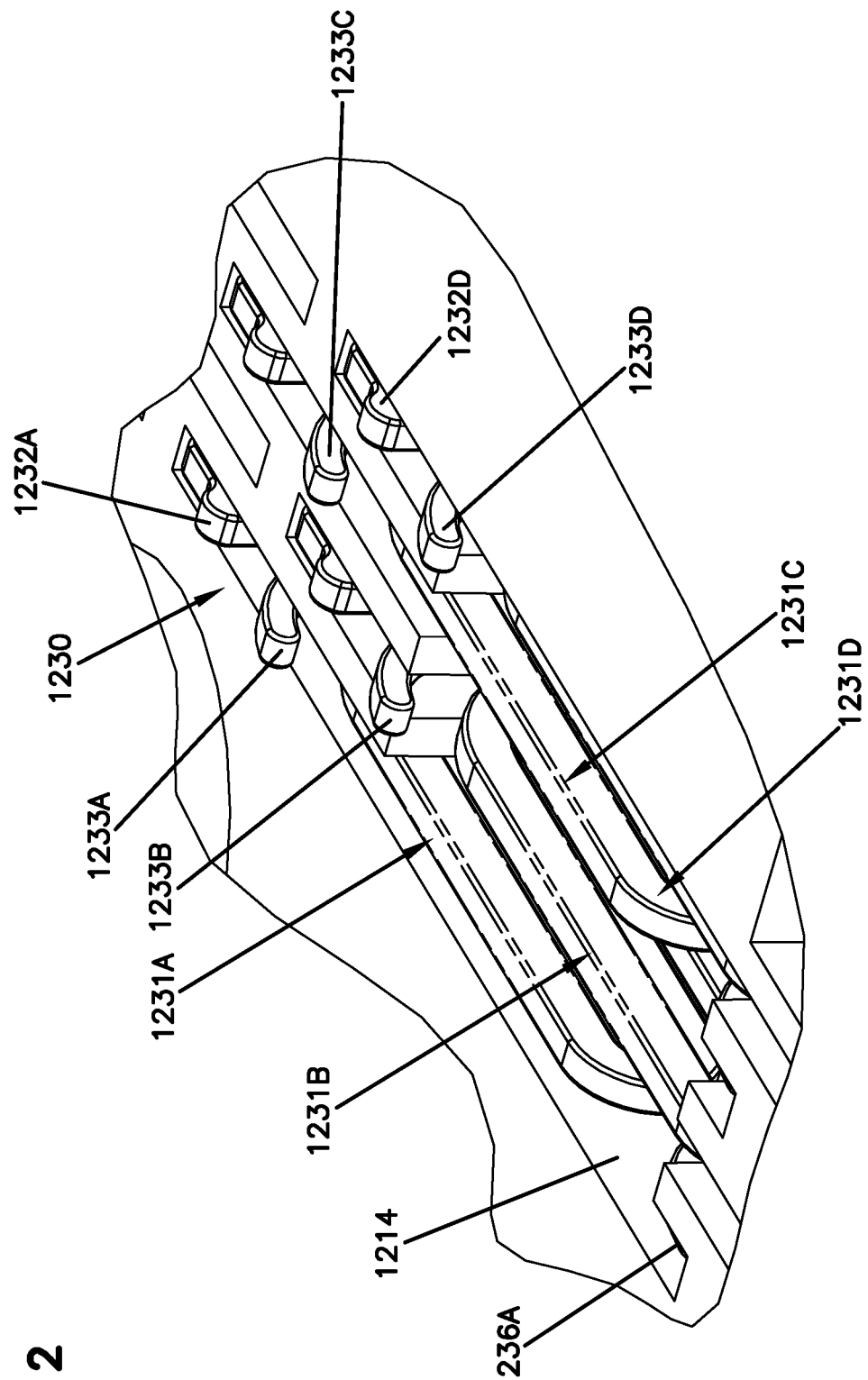

In the example shown in FIG. 12, each media reading interface 1230 of the fiber optic adapter 1200 includes four contact members 1231 and each storage device 1130 of the fiber optic connector 1110 includes four contact pads 1132. A first contact member 1231A and a third contact member 1231C of the media reading interface 1230 are mounted at first positions with the slot 1214. A second contact member 1231B and a fourth contact member 1231D of the media reading interface 1230 are mounted at second positions within the slot 1214 (e.g., compare the positions of the two contact members 1231 shown in FIG. 10). The contact pads 1132 on the storage device 1130 shown in FIG. 5 include wider pads 1132A, 1132D and narrower pads 1132B, 1132C to accommodate the staggered positions of the contact members 1231.

In the example shown in FIG. 10, two contact members 1231 are visibly positioned within a slot 1214 defined in a fiber optic adapter 1210, shown in cross-section. Two additional contact members 1231 also are positioned in the slot 1214, but cannot be seen since the additional contact members 1231 laterally align with the visible contact members 1231. In other implementations, however, greater or fewer contact members 1231 may be positioned within the housing.

The example contact member 1231 shown includes a base 1232 that is configured to be positioned within a slot 1214 defined by an adapter 1210. The base 1232 of certain types of contact members 1231 is configured to secure (e.g., snap-fit, latch, pressure-fit, etc.) to the adapter 1210. The base 1232 also can include a retention section that secures the member 1231 in the adapter body 1210. A stationary contact location 1237 may extend from the base 1232, through the slot 1214, toward the printed circuit board 1220 to touch a contact pad or a grounding line on the printed circuit board 1220. A first arm extends from the base 1232 to define the first contact location 1233. A second arm extends from the base 1232 to define a resilient section 1234, the second contact location 1235, and the third contact location 1236. The first and second arms extend generally away from the passage 1215 and toward an exterior of the adapter housing 1210 at the first and third contact locations 1233, 1236.

At least the first moveable contact location 1233 is aligned and configured to extend outwardly of the adapter housing 1210 through the slots 1214 to touch a first contact pad on the corresponding circuit board 1220 when the printed circuit board 1220 is mounted to the adapter housing 1210 (e.g., see FIGS. 10 and 12). The ability of the first arm to flex relative to the stationary contact 1237 provides tolerance for placement of the contact member 1231 relative to the circuit board 1220. In certain implementations, the first moveable contact location 1233 touches the same contact pad as the stationary contact location 1237. In one implementation, the stationary contact location 1237 and the first moveable contact location 1233 provide grounding of the contact member 1231.

The second arm extends from the base 1232 to define the resilient section 1234, the second moveable contact location 1235, and the third moveable contact location 1236. In one implementation, the second contact location 1235 defines a trough located on the second arm between the resilient section 1234 and the third contact location 1236. The resilient section 1234 is configured to bias the second contact location 1235 towards the channel passage 1215 (see FIG. 10). In some implementations, the second contact location 1235 extends sufficiently into the passage 1215 to enable engagement between the second contact location 1235 and the connector body 1111 (e.g., key 1115) of the connector 1110.

The third contact location 1236 is configured to be positioned initially within the passage 1215. For example, the resilient section 1234 biases the third contact section 1236 away from an exterior of the housing 1210 when a fiber optic connector 1110 is not inserted into the passage 1215. The resilient section 1234 is configured to bias the third contact location 1236 through the slot 1214 to an exterior of the housing 1210 when a connector arrangement 1100 or other media segment pushes against the second contact location 1235. In the example shown, the resilient section 1234 is implemented as a looped/bent section of the second arm. In other implementations, the second arm can otherwise include springs, reduced width sections, or portions formed from more resilient materials. In other implementations, other types of contact members can be utilized.

In accordance with some aspects, insertion of the connector body 1111 into the passage 1215 causes the third contact location 1236 to contact the printed circuit board 1220. For example, in some implementations, the key 1115 of the connector body 1111 contacts the second contact location 1235 on the contact member 1231 when the connector 1110 is inserted into the passage 1215. When the key 1115 engages the second contact location 1235, the key 1115 pushes against the second contact location 1235 to move the third contact location 1236 against the bias of the resilient section 1234 toward the exterior of the adapter housing 1210 sufficient to contact the contact pads and tracings on the printed circuit board 1220.

As discussed above, a processor (e.g., processor 217 of FIG. 2) or other such equipment also can be electrically coupled to the printed circuit board 1220. Accordingly, the processor can communicate with the memory circuitry on the storage device 1130 via the contact members 1231 and the printed circuit board 1220. In accordance with some aspects, the processor is configured to obtain physical layer information from the storage device 1130. In accordance with other aspects, the processor is configured to write (e.g., new or revised) physical layer information to the storage device 1130. In accordance with other aspects, the processor is configured to delete physical layer information to the storage device 1130. In one example implementation, at least a first contact member 1231 transfers power, at least a second contact member 1231 transfers data, and at least a third contact member 1231 provide grounding. However, any suitable number of contact members 1231 can be utilized within each media reading interface 1230.

When the connector body 1111 is inserted sufficiently far into the port, the second contact location 1235 is aligned and in contact with a contact pad 1132 on the storage device 1130 of the fiber optic connector 1110. Accordingly, the processor (e.g., processor 217 of FIG. 2) coupled to the printed circuit board 1220 is communicatively coupled to the storage device 1130 of the fiber optic connector 1110 through the contact member 1231. In some implementations, the second contact location 1235 is aligned with the contact pad 1132 when the connector 1110 is fully inserted into the passage 1215. In other implementations, the second contact location 1235 is sufficiently aligned with the contact pad 1132 to enable communication between the printed circuit board 1220 and the storage device 1130 even before the connector 1110 is fully inserted into the passage 1215.

In accordance with some aspects, the contact members 1231 are configured to selectively form a complete circuit with one or more of the printed circuit boards 1220. For example, each printed circuit board 1220 may include two contact pads for each contact member. In certain implementations, a first portion of each contact member 1231 touches a first of the contact pads and a second portion of each contact member 1231 selectively touches a second of the contact pads. The processor (e.g., processor 217 of FIG. 2) coupled to the circuit board 1220 may determine when the circuit is complete. Accordingly, the contact members 1231 can function as presence detection sensors for determining whether a media segment has been inserted into the passages 1215.

In certain implementations, the first moveable contact 1233 of each contact member is configured to contact one of the contact pads of the circuit board 1220. In one implementation, the first moveable contact location 1233 is configured to permanently touch the contact pad as long as the circuit board 1220 and contact member 1231 are assembled on the adapter 1210. The third contact location 1236 of certain types of contact members 1231 is configured to touch a second contact pad of the printed circuit board 1220 only when a segment of physical communications media (e.g., an MPO connector 1110) is inserted within an adapter passage 1215 and pushes the second contact location 1235, which pushes the third contact location 1236 through the slot 1214 and against the circuit board 1220. In accordance with other aspects, certain types of contact members 1231 may be configured to form a complete circuit with the printed circuit board 1220 regardless of whether a media segment is received in the passage 1215.

FIGS. 13-22 illustrate a second example implementation of a connector system 1000' that can be utilized on a connector assembly having PLI functionality as well as PLM functionality. The connector system 1000' includes at least one example communications coupler assembly 1200' that can be mounted to a connector assembly, such as a communications panel. One or more example connector arrangements 1100', which terminate segments 1010 of communications media, are configured to communicatively couple to other segments of physical communications media at the coupler assembly 1200' (e.g., see FIG. 13). Accordingly, communications data signals carried by a media segment terminated by a first connector arrangement 1100' can be propagated to another media segment (e.g., terminated by a second connector arrangement 1100') through the communications coupler assembly 1200'.

FIGS. 13 and 17-22 show a portion of an example implementation of a communications coupler assembly 1200' implemented as a fiber optic adapter. The same reference numbers are used herein to designate like elements on both adapters 1200 and 1200'. The example adapter 1200' includes an adapter housing 1210' to which a printed circuit board 1220 is secured (e.g., via fasteners 1222). In the example shown, the adapter 1200' is a quadruplex fiber optic adapter. In other implementations, however, the adapter 1200' can define greater or fewer ports.

FIGS. 13-16 show another example implementation of a connector arrangement 1100' suitable for insertion into passages 1215' of an adapter housing 1210'. The same reference numbers are used herein to designate like elements on both connector arrangements 1100 and 1100'. The connector arrangement 1100' includes one or more fiber optic connectors 1110', each of which terminates one or more optical fibers 1010'.

In accordance with some aspects, each connector arrangement 1100' is configured to terminate a single segment of physical communications media. For example, each connector arrangement 1100' can include a single connector 1110' that terminates a single optical fiber or a single electrical conductor. In one example implementation, each connector arrangement 1100' includes a single LC-type fiber optic connector 1110' that terminates a single optical fiber. In accordance with other aspects, each connector arrangement 1100' includes two or more connectors 1110', each of which terminates a single segment of physical communications media. For example, a duplex connector arrangement 1100' may include two connectors 1110', each of which terminates an optical fiber 1010'. In other implementations, the connectors 1110' can be an SC-type, an ST-type, an FC-type, an LX.5-type, etc.

In accordance with still other aspects, each connector arrangement 1100' can include one or more connectors, each of which terminates a plurality of physical media segments (e.g., see connector arrangement 2100, 2100', and 5100 of FIGS. 31, 59, and 133). In one example implementation, each connector arrangement includes a single MPO-type fiber optic connector that terminates multiple optical fibers. In still other systems, other types of connector arrangements (e.g., electrical connector arrangements) can be secured to the communications coupler assembly 1200' or to a different type of connector assembly.

Figure 13:
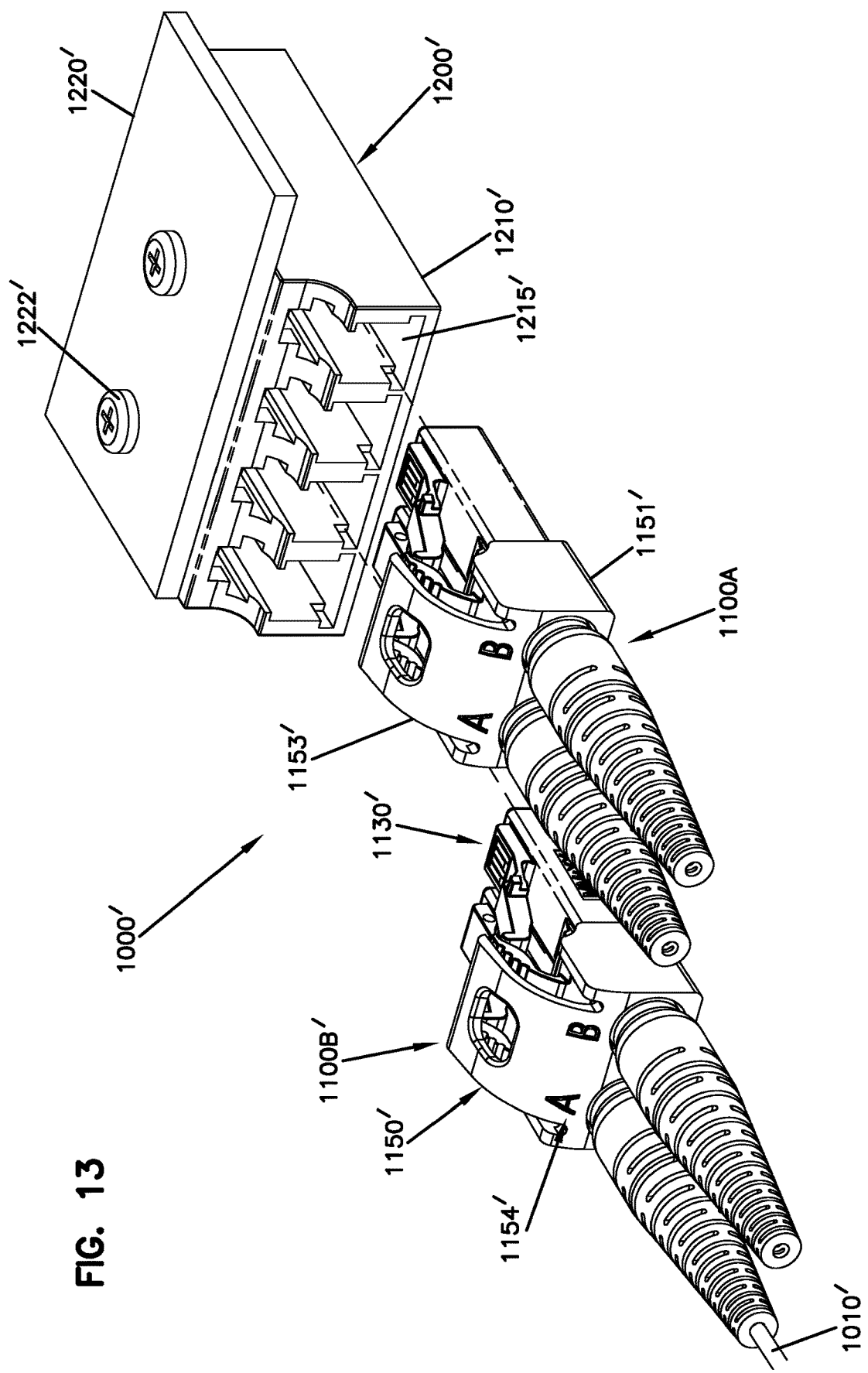
FIGS. 13-22 illustrate a second example implementation of a connector system that can be utilized on a connector assembly having PLI functionality as well as PLM functionality in accordance with aspects of the present disclosure.
Figure 14:
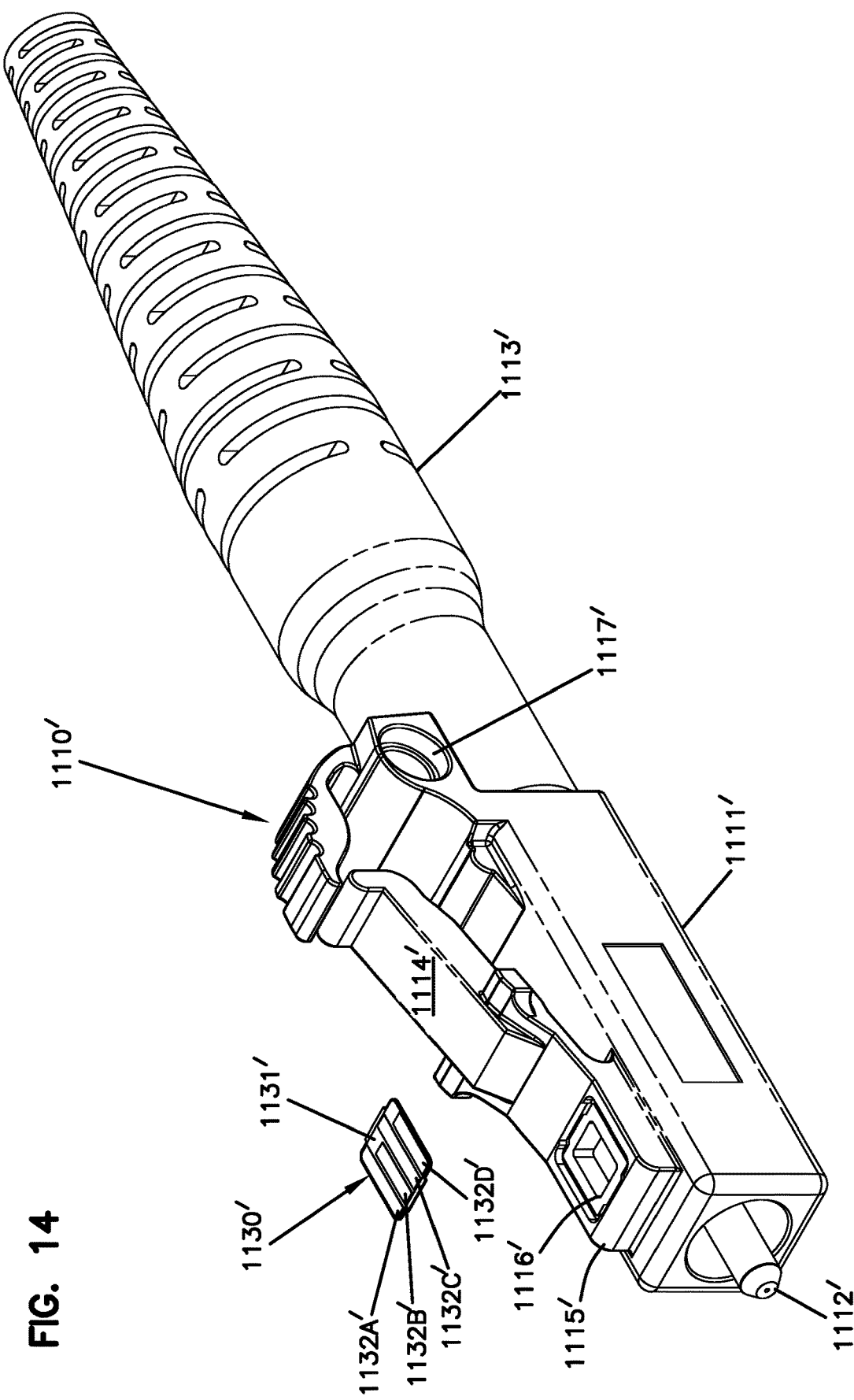

In the example shown in FIG. 13, the connector arrangement 1100' defines a duplex fiber optic connector arrangement including two LC-type fiber optic connectors 1110' held together using a clip 1150'. As shown in FIG. 14, each fiber optic connector 1110' includes a connector body 1111' enclosing a ferrule 1112' that retains an optical fiber 1010'. Each connector body 1111' is secured to a boot 1113' for providing bend protection to the optical fiber 1010'. The connector body 1111' includes a fastening member (e.g., clip arm) 1114' that facilitates retaining the fiber optic connector 1110' within a passage 1215' in the adapter housing 1210'. The body 1111' also defines a through hole (or opposing depressions) 1117' to facilitate maintaining the body 1111' within the clip 1150' (e.g., see FIG. 15).

Each connector arrangement 1100' is configured to store physical layer information. For example, the physical layer information can be stored on or in the body 1111' of one or more of the fiber optic connectors 1110'. In the example shown, physical layer information is stored on only one fiber optic connector 1110' of the connector arrangement 1100'. In other implementations, however, physical layer information can be stored on each fiber optic connector 1110'.

One example storage device 1130' includes a printed circuit board 1131' on which memory circuitry can be arranged. In one example implementation, the storage device 1130' includes an EEPROM circuit arranged on the printed circuit board 1131'. In other embodiments, however, the storage device 1130' can include any suitable type of memory. In the example shown in FIGS. 14-16, the memory circuitry is arranged on the non-visible side of the printed circuit board 1131'.

Electrical contacts 1132' are arranged on the visible side of the printed circuit board 1131' in FIG. 13-16. The electrical contacts 1132' of each storage device 1130' are configured to engage with contacts of a media reading interface of the adapter 1200', which will be discussed in more detail herein. In the example shown in FIG. 14, the contacts 1132' define planar surfaces extending in a front-to-rear direction. In one implementation, the contacts 1132' are configured to promote even wear amongst the contacts 1132'. In some implementations, the contacts 1132' alternate between long and short planar surfaces. For example, contacts 1132A' and 1132C' are longer than contacts 1132B' and 1132D'.

In the example in FIG. 14, the connector bodies 1111' each include a key 1115' configured to fit with latch engagement channels 1217' of the adapter body 1210. The key 1115' of one or more connectors 1110' is configured to accommodate a storage device 1130' on which the physical layer information can be stored. For example, the key 1115' of at least one of the connectors 1110' defines a cavity 1116' in which the storage device 1130' can be mounted. In some implementations, a cover can be positioned over the storage device 1130' to enclose the storage device 1130' within the respective connector 1111'. In other implementations, the storage device 1130' is left exposed.

Figure 15:
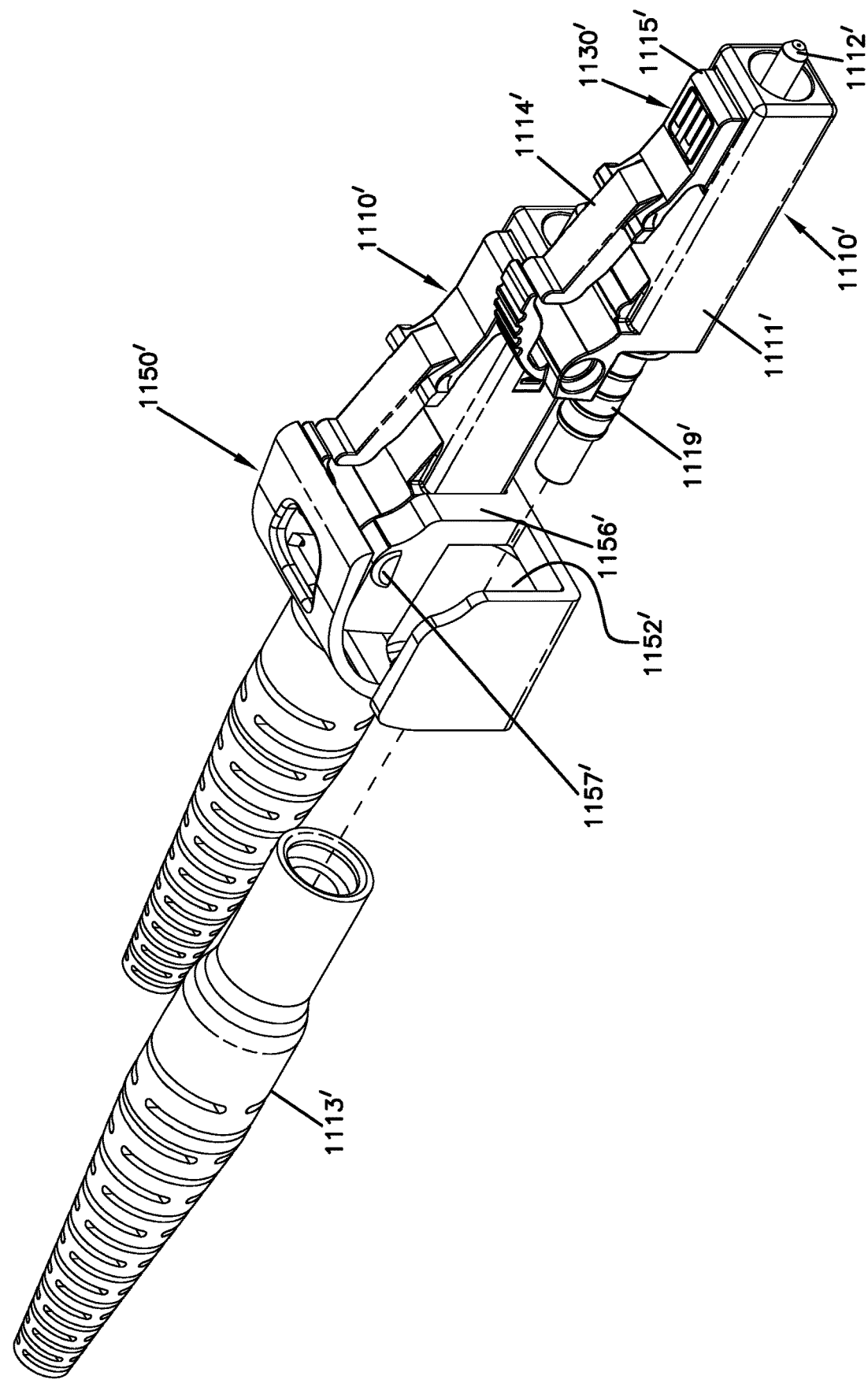
Figure 16:
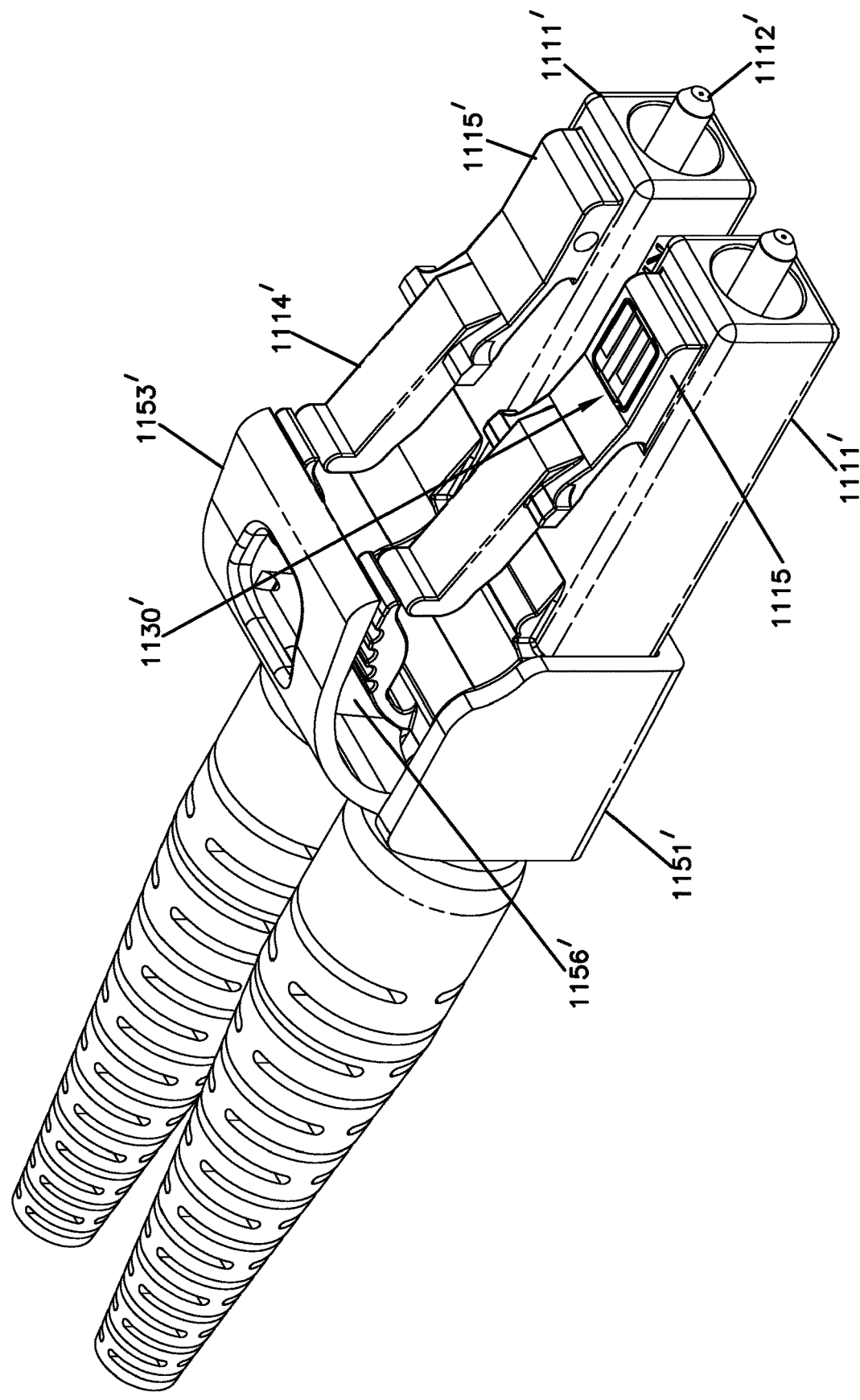

In the example shown in FIGS. 15 and 16, two fiber optic connectors 1110' are secured together using a clip 1150'. The example clip 1150' includes a body 1151' that at least partially encloses the connectors 1110' to be secured. The clip 1150' defines openings or channels 1152' through which portions 1119 of the fiber optic connector bodies 1111' can extend (see FIG. 15). A flange 1153' curves upwardly and forwardly to extend over the fastening members 1114' of the connectors 1110' (see FIG. 16). In certain implementations, indicia 1154' can be printed on the clip 1150' to identify the fiber optic connectors 1110'. In the example shown, the indicia 1154' are printed on or adjacent the flange 1153' at the rear side of the clip 1150' (see FIG. 13).

In the example shown, the clip 1150' has a monolithic body 1151' defining two channels 1152' separated by an interior wall 1156'. Lugs 1157' are positioned on the inner surfaces of the exterior walls of the body 1151' and on both sides of the interior wall 1156'. The lugs 1157' are configured to engage cavities/depressions 1117' defined in the fiber optic connector bodies 1111' to secure the connector bodies 1111' within the clip body 1151'.

Figure 17:
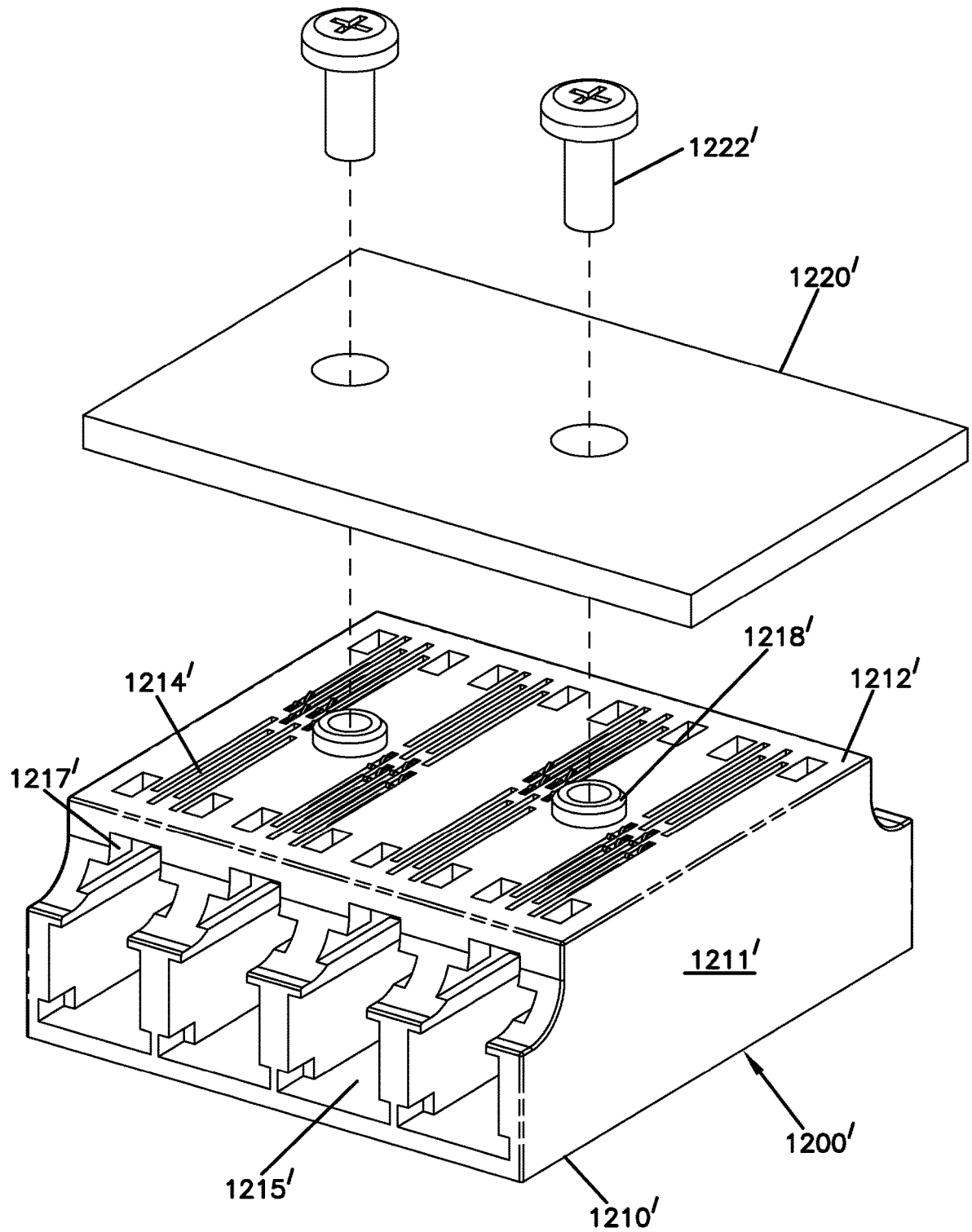

FIGS. 17-22 show a portion of one example implementation of a fiber optic adapter 1200'. The example adapter 1200' includes an adapter housing 1210' to which a printed circuit board 1220' is secured (e.g., via fasteners 1222'). In some implementations, the example adapter housing 1210' includes two annular walls 1218' in which the fasteners 1222' can be inserted to hold the printed circuit board 1220' to the adapter housing 1210'. Non-limiting examples of suitable fasteners 1222' include screws, snaps, and rivets. For ease in understanding, only a portion of the printed circuit board 1220' is shown in FIGS. 13 and 17. It is to be understood that the printed circuit board 1220' electrically connects to a data processor and/or to a network interface (e.g., processor 217 and network interface 216 of FIG. 2). It is further to be understood that multiple adapters 1200' can be connected to the printed circuit board 1220' within a communications panel.

The example adapter housing 1210' shown in FIG. 17 is formed from opposing sides 1211' interconnected by first and second ends 1212'. The sides 1211' and ends 1212' each extend between an open front and an open rear. The coupler housing 1210' defines one or more passages 1215' extending between the front and rear ends. Each end of each passage 1215' is configured to receive a connector arrangement or portion thereof (e.g., one fiber optic connector 1110' of duplex connector arrangement 1100' of FIG. 16).

In the example shown in FIG. 17, the adapter body 1210' defines four passages 1215'. In other implementations, the adapter body 1210' can define greater or fewer passages 1215'. Sleeves (e.g., split sleeves) 1216' are positioned within the passages 1215' to receive and align the ferrules 1112' of fiber optic connectors 1110' (see FIG. 22). The adapter housing 1210' also defines latch engagement channels 1217' at the front and rear of each passage 1215' to facilitate retention of the latch arms 1114' of the fiber optic connectors 1110'.

The fiber optic adapter 1210' includes one or more media reading interfaces 1230', each configured to acquire the physical layer information from the storage device 1130' of a fiber optic connector 1110' plugged into the fiber optic adapter 1210'. For example, in one implementation, the adapter 1210' can include a media reading interface 1230' associated with each passage 1215'. In another implementation, the adapter 1210' can include a media reading interface 1230' associated with each connection end of each passage 1215'. In still other implementations, the adapter 1210' can include a media reading interface 1230' associated with each set of ports that accommodates a connector arrangement 1100'.

Figure 18:
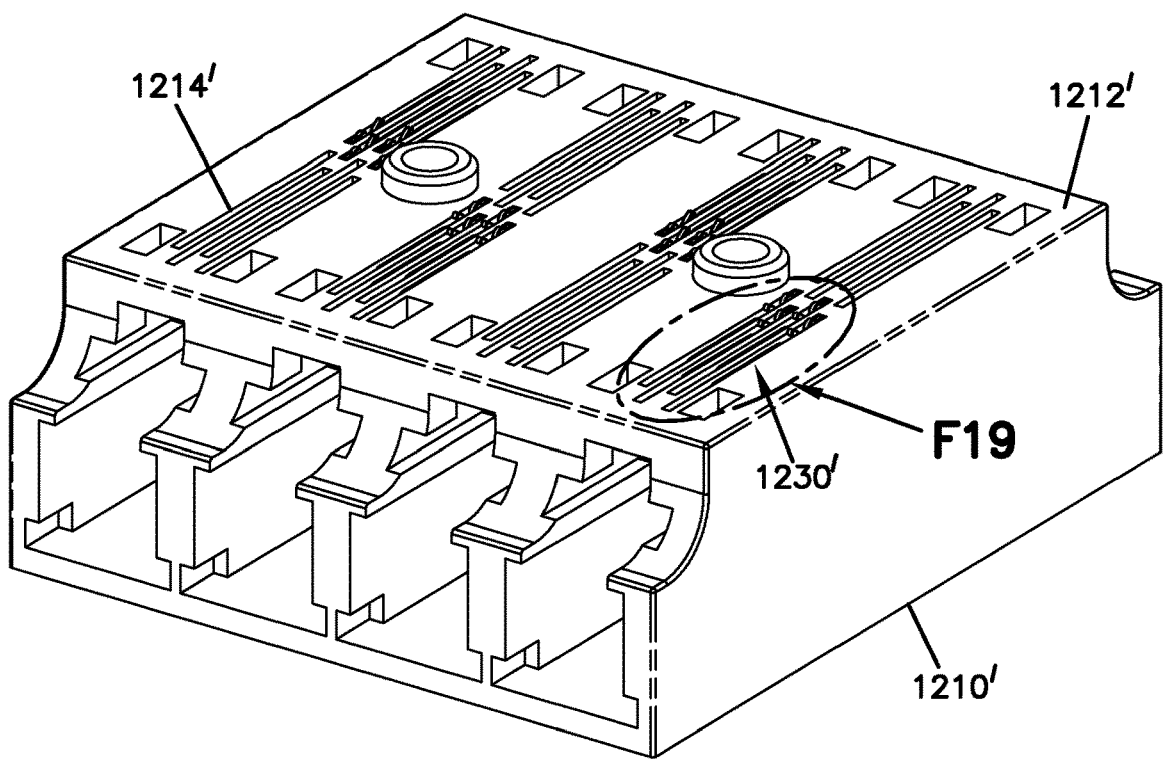

For example, the quadruplex adapter 1210' shown in FIG. 18 includes two media reading interfaces 1230' at the front to interface with two duplex fiber optic connector arrangements 1100' to be received thereat and two media reading interfaces 1230' at the rear to interface with two duplex fiber optic connector arrangements 1100' to be received thereat. In another implementation, the adapter housing 1210' can include two media reading interfaces 1230' at one side to interface with two duplex fiber optic connector arrangements 1100' and four media reading interfaces 1230' at the other side to interface with four fiber optic connectors 1110'. In other implementations, the adapter housing 1210' can include any desired combination of front and rear media reading interfaces 1230'.

Figure 20:
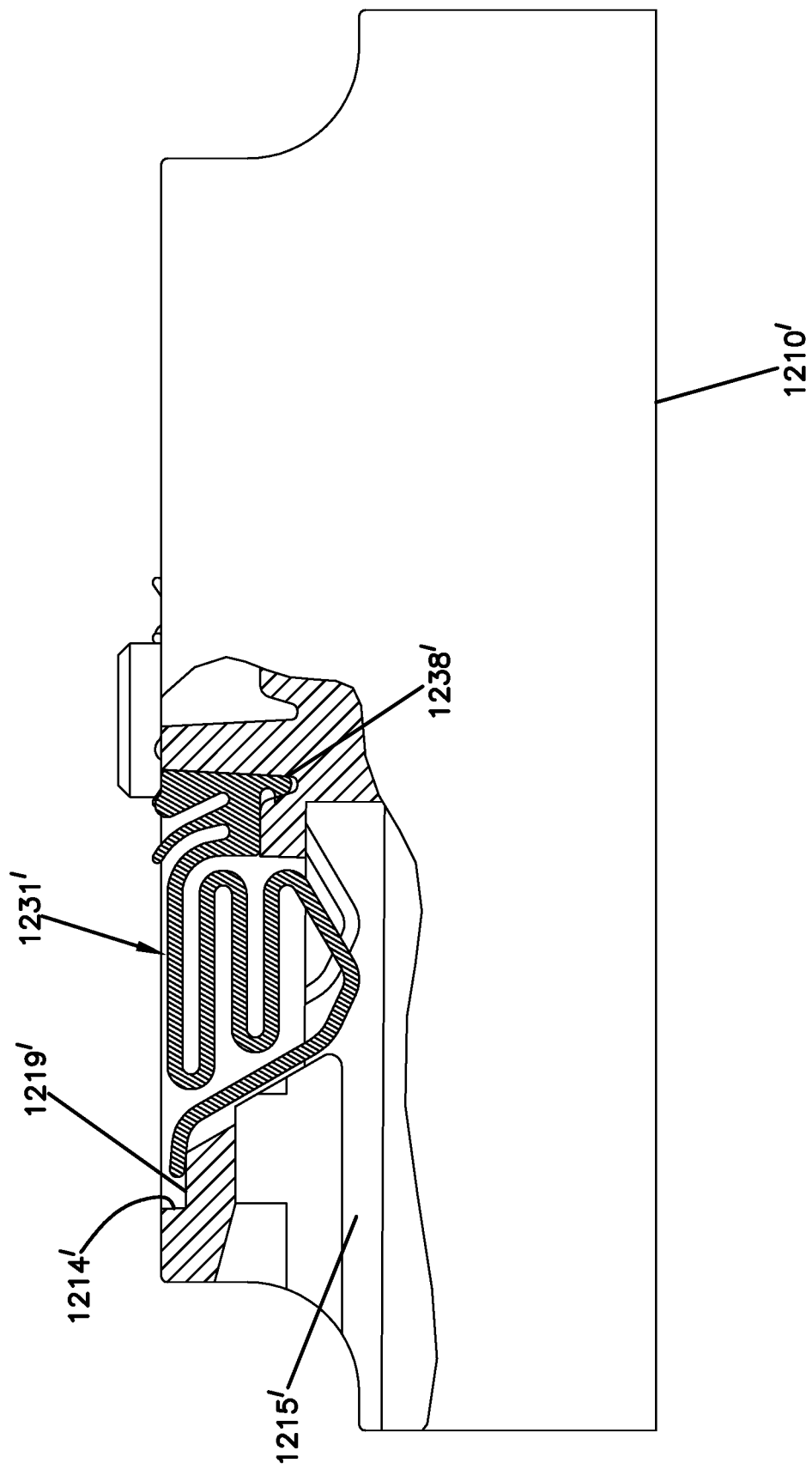
Figure 21:
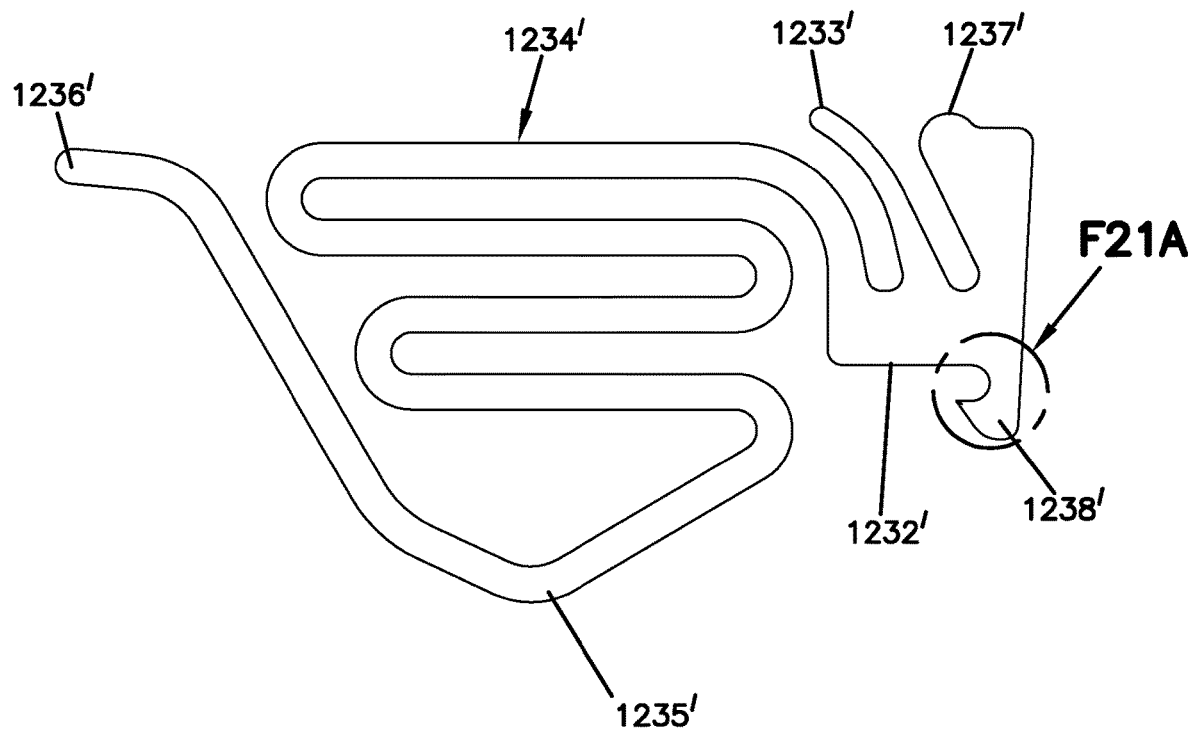

In general, each media reading interface 1230' is formed from one or more contact members 1231' (FIG. 21). In certain implementations, the adapter housing 1210' defines slots 1214' configured to receive one or more contact members 1231'. In the example shown in FIGS. 18 and 19, the slots 1214' accommodating each media reading interface 1230' define four separate openings. In some implementations, the slots 1214' are configured so that portions of the contact members 1231' extend into the passages 1215' to engage the electrical contacts 1132' of the storage member 1130' positioned in the passages 1215' (see FIG. 20). Other portions of the contact members 1231' are configured to engage contacts and tracings on the printed circuit board 1220' associated with the adapter 1200'. In the example shown in FIG. 17, the contacts and tracings on the printed circuit board 1220' that interact with the contact members 1231' are positioned on the non-visible side of the board 1220'.

One example type of contact member 1231' is shown in FIG. 21. In one implementation, the contact member 1231' defines a planar body. In one implementation, the contact member 1231' is formed monolithically (e.g., from a continuous sheet of metal or other material). For example, in some implementations, the contact member 1231' may be manufactured by cutting a planar sheet of metal or other material. In other implementations, the contact member 1231' may be manufactured by etching a planar sheet of metal or other material. In other implementations, the contact member 1231' may be manufactured by laser trimming a planar sheet of metal or other material. In still other implementations, the contact member 1231' may be manufactured by stamping a planar sheet of metal or other material.

Each contact member 1231' defines at least three moveable contact locations 1233', 1235', and 1236'. The flexibility of the contact surfaces 1233', 1235', and 1236' provides tolerance for differences in spacing between the contact member 1231' and the respective printed circuit board 1220' when the coupler assembly 1200' is manufactured. Certain types of contact members 1231' also include at least one stationary contact 1237'.

Figure 22:
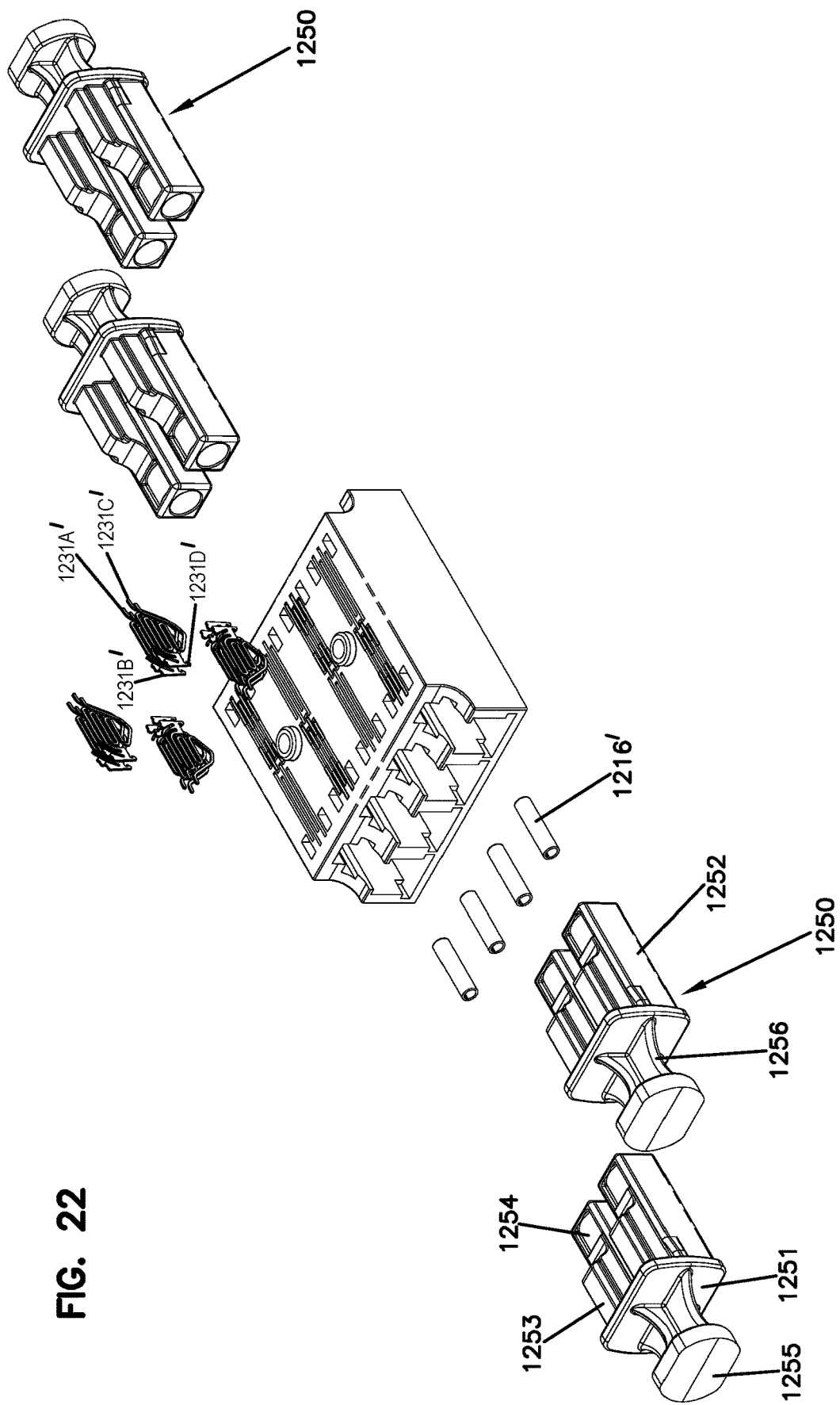

In some implementations, the contact members 1231' of a single media reading interface 1230' are positioned in a staggered configuration to facilitate access to the contact pads 1132' on the connector storage device 1130' of a connector arrangement 1100'. For example, as shown in FIG. 22, alternating contact members 1231 can be staggered between at least front and rear locations within the slots 1214'.

Figure 19:
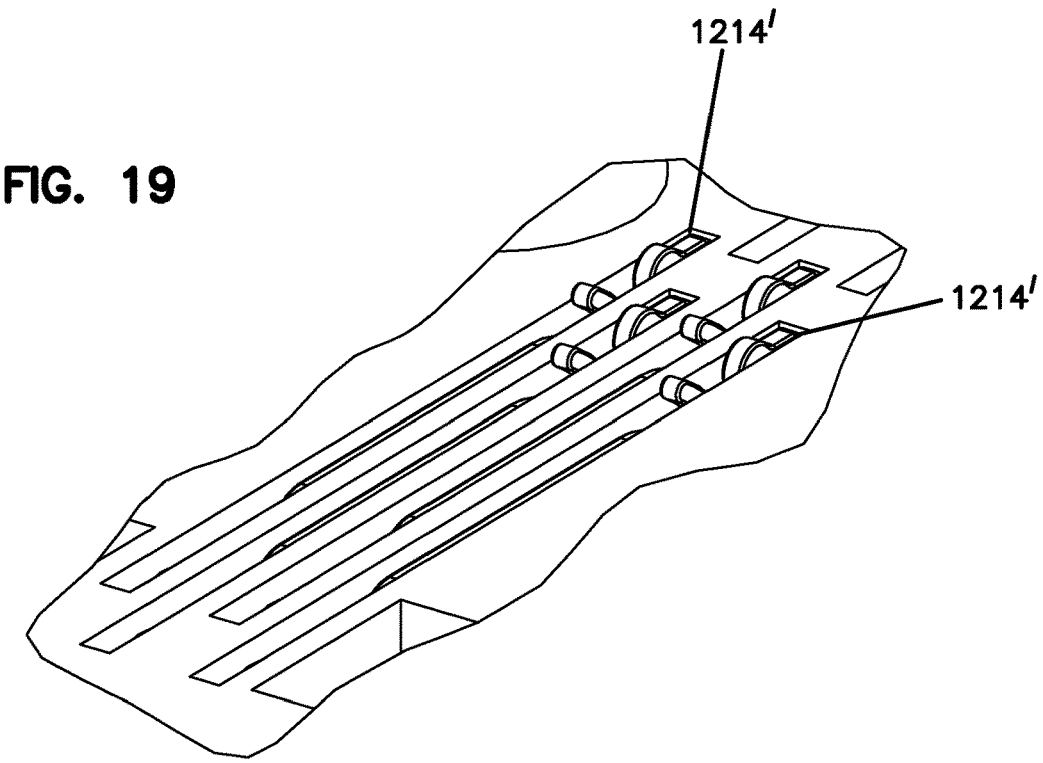

In some implementations, the contact members 1231' of a single media reading interface 1230' are staggered to facilitate access to the contact pads 1132' on the connector storage device 1130'. For example, as shown in FIGS. 18 and 19, alternating contact members 1231' can be staggered between at least first and second locations within the slots 1214' (see configuration C2, shown in detail in FIG. 19). Likewise, in some implementations, the contact pads 1132' on each storage device 1130' can be arranged in staggered positions. In other implementations, the contact pads 1132' on each storage device 1130' can vary in size and/or shape to facilitate a one-to-one connection between the contact members 1231' and the contact pads 1132' (e.g., see pads 1132 in FIG. 14).

In the example shown in FIG. 18, each media reading interface 1230' of the fiber optic adapter 1200' includes four contact members 1231'. A first contact member 1231A' and a third contact member 1231C' of the media reading interface 1230' are mounted at first positions with the slot 1214' (see FIG. 22). A second contact member 1231B' and a fourth contact member 1231D' of the media reading interface 1230' are mounted at second positions within the slot 1214'. In the example shown in FIG. 14, first and third contact pads 1132A', 1132C' of the storage device 1130' extend a first distance over the board 1131' and second and fourth contact pads 1132B', 1132D' extend a second distance over the board 1131'.

In the example shown in FIG. 20, at least portions of two contact members 1231' are visibly positioned within a slot 1214' defined in a fiber optic adapter 1210', shown in cross-section. Two additional contact members 1231' also are positioned in the slot 1214' (see FIG. 19), but cannot be seen since the additional contact members 1231' laterally align with the visible contact members 1231'. In other implementations, however, greater or fewer contact members 1231' may be positioned within the housing 1210'.

Figure 21A:
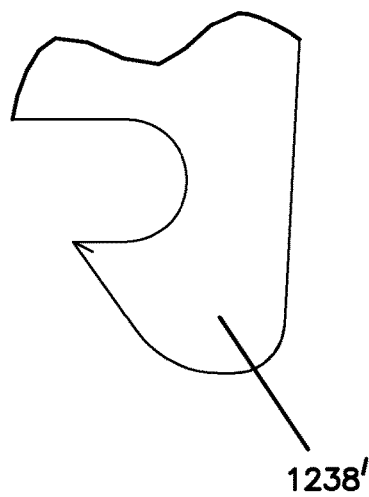

The example contact member 1231' shown includes a base 1232' that is configured to be positioned within a slot 1214' defined by an adapter 1210'. The base 1232' of certain types of contact members 1231' is configured to secure (e.g., snap-fit, latch, pressure-fit, etc.) to the adapter 1210'. The base 1232' also can include a retention section 1238' that secures the member 1231' in the adapter body 1210' (e.g., see FIG. 20). An exploded view of the retention section 1238' is shown in FIG. 21A.

A stationary contact location 1237' may extend from the base 1232', through the slot 1214', toward the printed circuit board 1220 to touch a contact pad or a grounding line on the printed circuit board 1220. A first arm extends from the base 1232' to define the first contact location 1233'. A second arm extends from the base 1232' to define a resilient section 1234', the second contact location 1235', and the third contact location 1236'. The first and second arms extend generally away from the passage 1215' and toward an exterior of the adapter housing 1210' at the first and third contact locations 1233', 1236' (see FIG. 20).

At least the first moveable contact location 1233' is aligned and configured to extend outwardly of the adapter housing 1210' through the slots 1214' to touch a first contact pad on the corresponding circuit board 1220' when the printed circuit board 1220' is mounted to the adapter housing 1210'. The ability of the first arm to flex relative to the stationary contact 1237' provides tolerance for placement of the contact member 1231' relative to the circuit board 1220'. In certain implementations, the first moveable contact location 1233' touches the same contact pad as the stationary contact location 1237'. In one implementation, the stationary contact location 1237' and the first moveable contact location 1233' provide grounding of the contact member 1231'.

The second arm extends from the base 1232' to define the resilient section 1234', the second moveable contact location 1235', and the third moveable contact location 1236'. In one implementation, the second contact location 1235' defines a trough located on the second arm between the resilient section 1234' and the third contact location 1236'. The resilient section 1234' is configured to bias the second contact location 1235' towards the channel passage 1215' (see FIG. 20). In some implementations, the second contact location 1235' extends sufficiently into the passage 1215' to enable engagement between the second contact location 1235' and the connector body 1111' (e.g., key 1115') of the connector 1110'.

The third contact location 1236' is configured to be positioned initially within the slot 1214'. For example, the resilient section 1234' biases the third contact section 1236' away from an exterior of the housing 1210' when a fiber optic connector 1110' is not inserted into the passage 1215'. The resilient section 1234' is configured to bias the third contact location 1236' through the slot 1214' to an exterior of the housing 1210' when a connector arrangement 1100' or other media segment pushes against the second contact location 1235'. In the example shown, the resilient section 1234' is implemented as a looped/bent section of the second arm. In other implementations, the second arm can otherwise include springs, reduced width sections, or portions formed from more resilient materials. In other implementations, other types of contact members can be utilized.

In accordance with some aspects, insertion of the connector body 1111' into the passage 1215' causes the third contact location 1236' to contact the printed circuit board 1220'. For example, in some implementations, the key 1115' of the connector body 1111' contacts the second contact location 1235' on the contact member 1231' when the connector 1110' is inserted into the passage 1215'. When the key 1115' engages the second contact location 1235', the key 1115' pushes against the second contact location 1235' to move the third contact location 1236' against the bias of the resilient section 1234' toward the exterior of the adapter housing 1210' sufficient to contact the contact pads and tracings on the printed circuit board 1220'.

As discussed above, a processor (e.g., processor 217 of FIG. 2) or other such equipment also can be electrically coupled to the printed circuit board 1220'. Accordingly, the processor can communicate with the memory circuitry on the storage device 1130' via the contact members 1231' and the printed circuit board 1220'. In accordance with some aspects, the processor is configured to obtain physical layer information from the storage device 1130'. In accordance with other aspects, the processor is configured to write (e.g., new or revised) physical layer information to the storage device 1130'. In accordance with other aspects, the processor is configured to delete physical layer information to the storage device 1130'. In one example implementation, at least a first contact member 1231' transfers power, at least a second contact member 1231' transfers data, and at least a third contact member 1231' provide grounding. However, any suitable number of contact members 1231' can be utilized within each media reading interface 1230'.

In accordance with some aspects, the contact members 1231' of a media reading interface 1230' are configured to form a complete circuit with the printed circuit board 1220' only when a portion (e.g., the key 1115') of a fiber optic connector 1110' is inserted within the respective passage 1215'. For example, the second contact locations 1235' of each contact member 1231' can be configured to raise the third contact location 1236' external of the housing 1210' through the slot 1214' when the second contact location 1235' is lifted by the key 1115'.

Accordingly, the contact members 1231' can function as presence detection sensors or switches. For example, a completion of a circuit between the printed circuit board 1220' and a media reading interface 1230' can indicate that fiber optic connector 1110' is received within the passage 1215'. In other example implementations, the contact members 1231' can be configured to complete the circuit until one or more portions are pushed away from a shorting rod by a media segment. In accordance with other aspects, some implementations of the contact members 1231' can be configured to form a complete circuit with the printed circuit board 1220' regardless of whether a media segment is received in the passage 1215'.

If the connector 1110' inserted into the passage 1215' carries a storage device 1130, then insertion of the connector 1110' sufficiently far into the passage 1215' aligns one or more contact pads 1132' on a storage device 1130' with contact members 1231' of the media reading interface 1230'. Accordingly, the processor (e.g., a main processor) coupled to the printed circuit board 1220' is communicatively coupled to the storage device 1130' of the fiber optic connector 1110' through the contact member 1231'. In some implementations, the second contact location 1235' of each contact member 1231' is aligned with one of the contact pads 1132' of a storage device 1130' when the connector 1110' is fully inserted into the passage 1215'. In other implementations, the second contact locations 1235' are sufficiently aligned with the contact pads 1132' to enable communication between the printed circuit board 1220' and the storage device 1130' even before the connector 1110' is fully inserted into the passage 1215'.

As shown in FIG. 22, dust caps 1250 can be mounted within the adapter passages 1215, 1215' when connectors 1110, 1110' are not received thereat. The dust caps 1250 can inhibit dust, dirt, or other contaminants from entering the passages 1215, 1215' when the passages 1215, 1215' are not being utilized.

One example dust cap 1250 is shown in FIG. 22. In the example shown, the dust cap 1250 includes a cover 1251 configured to fit over a mouth of a passage 1215, 1215'. A handle including a grip 1255 and a stem 1256 extend outwardly from a first side of the cover 1251. The handle facilitates insertion and withdrawal of the dust cap 1250 from the passage 1215, 1215'. Insertion members 1252 extend outwardly from a second side of the cover 1251. Each insertion member 1252 is configured to fit within a passage 1215, 1215' of the adapter housing 1210, 1210' to hold the dust cap 1250 at the port.

In the example shown, each dust cap 1250 is a duplex dust cap that includes two insertion members 1252. In other implementations, however, each dust cap 1250 can include greater or fewer insertion members 1252. In the example shown, each insertion member 1252 is shaped similarly to a fiber optic connector that is configured to be retained at a port of each passage 1215, 1215'. For example, each insertion member 1252 can include a retaining member 1253 that is configured to interface with the latch engagement structures 1217, 1217' of the adapter housing 1210, 1210'.

Figure 50:
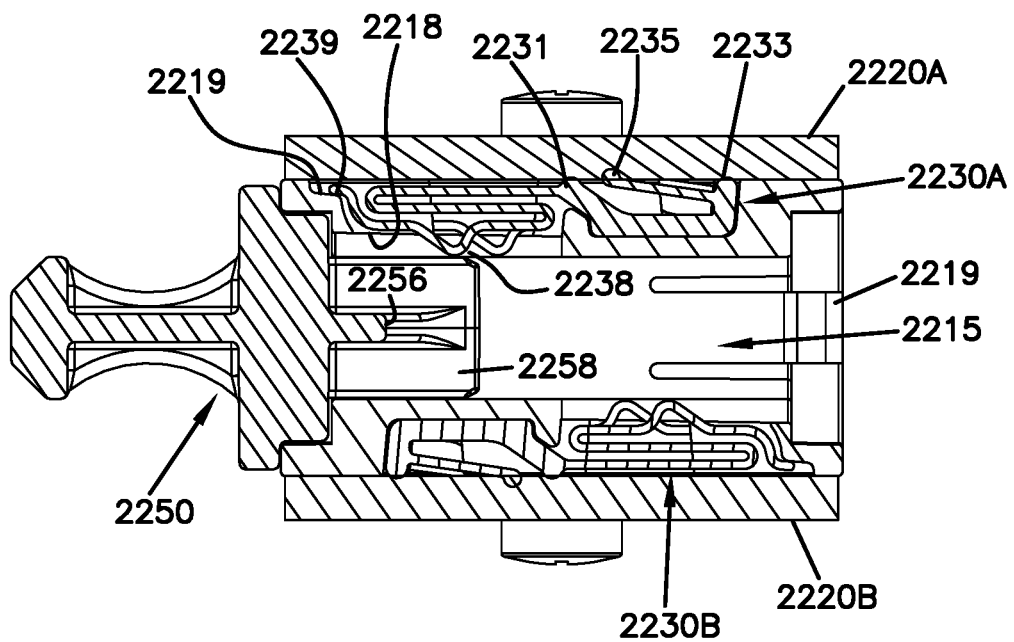
Figure 68:
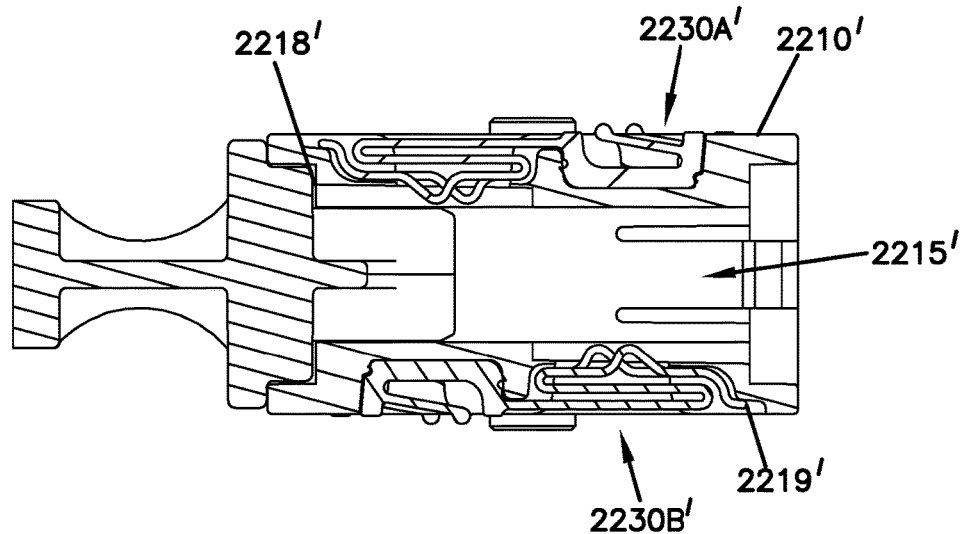
Figure 155:
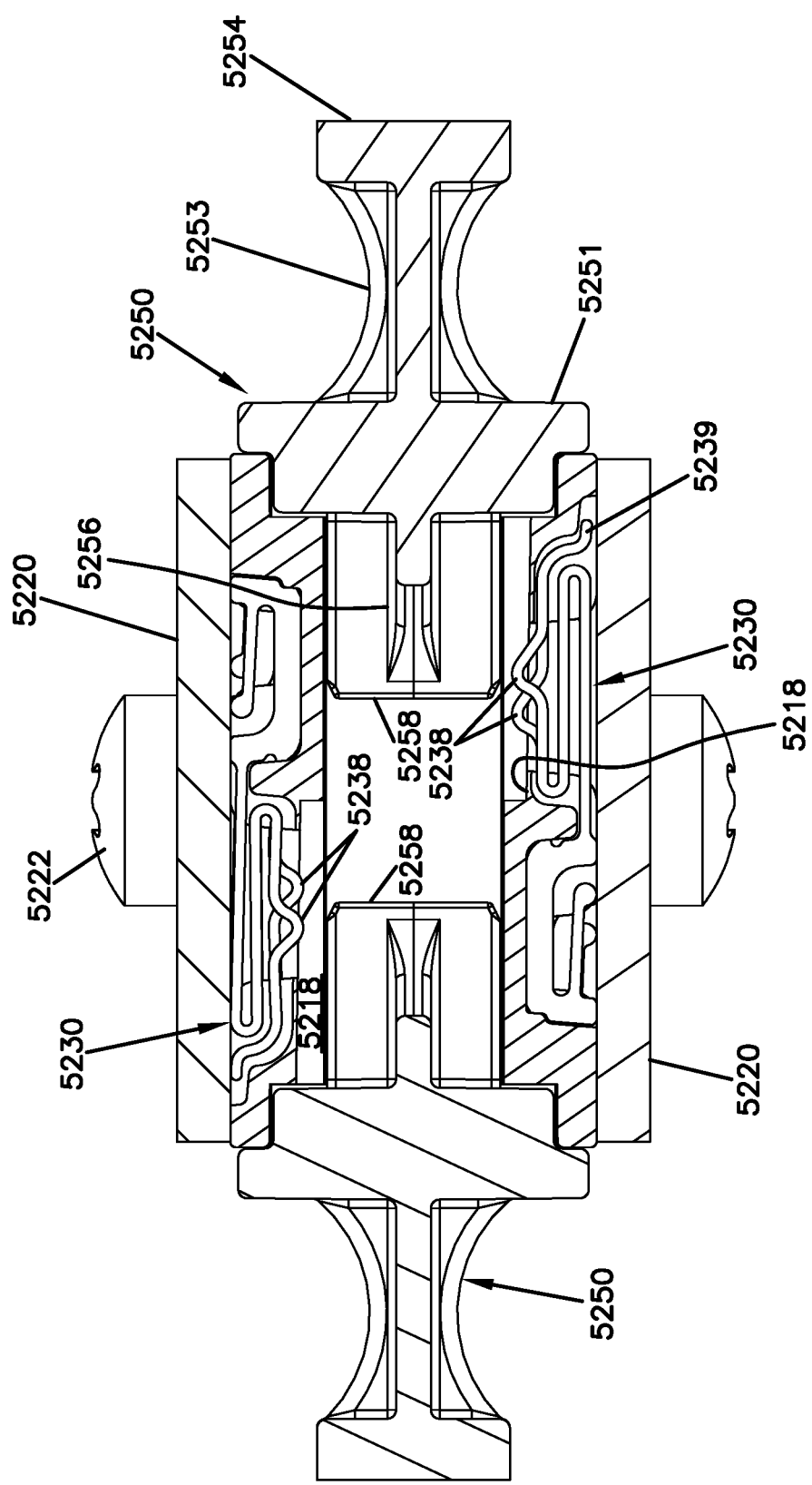

In some implementations, the dust caps 1250 are shaped and configured to avoid triggering the presence detection sensor/switch formed by the media reading interfaces (e.g., see FIGS. 50, 68, and 155). Accordingly, insertion of a dust cap 1250 into a passage 1215, 1215' does not trigger the presence switch associated with the passage 1215, 1215'. For example, the dust caps 1250 can be shaped and configured to inhibit engaging the second contact location 1235 of the contact members 1231 associated with the respective passage 1215. In the example shown, the front ends of the insertion members 1252 do not include raised portions (e.g., raised portions 1115, 1115' of fiber optic connectors 1110, 1110').

In other implementations, the dust caps 1250 may include storage devices containing physical layer information. In such implementations, the dust caps 1250 may be shaped and configured to trigger the presence switch through interaction with the contact members 1231, 1231' and to be read through the media reading interfaces 1230, 1230' of the passage 1215, 1215'.

FIGS. 23-50 illustrate a third example implementation of a connector system 2000 that can be utilized on a connector assembly having PLI functionality as well as PLM functionality. The example connector system 2000 includes at least one communications coupler assembly 2200 positioned between two printed circuit boards 2220. One or more example connector arrangements 2100 (FIG. 31), which terminate segments 2010 (FIG. 31) of communications media, are configured to communicatively couple to other segments of physical communications media at the one or more communications coupler assemblies 2200. Accordingly, communications data signals carried by the media segments 2010 terminated by the connector arrangements 2100 can be transmitted to other media segments.

Figure 23:
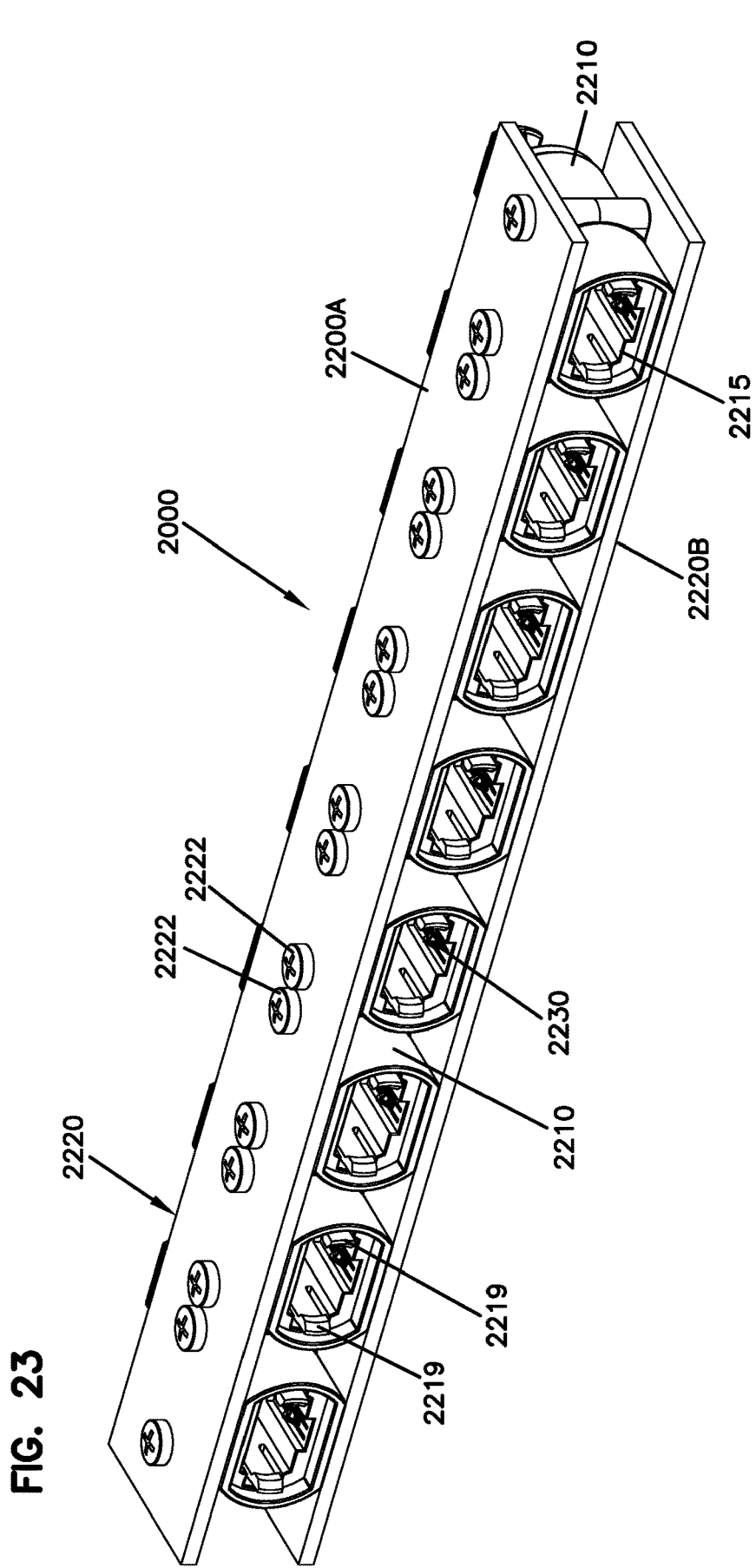
FIGS. 23-50 illustrate a third example implementation of a connector system that can be utilized on a connector assembly having PLI functionality as well as PLM functionality in accordance with aspects of the present disclosure.
Figure 24:
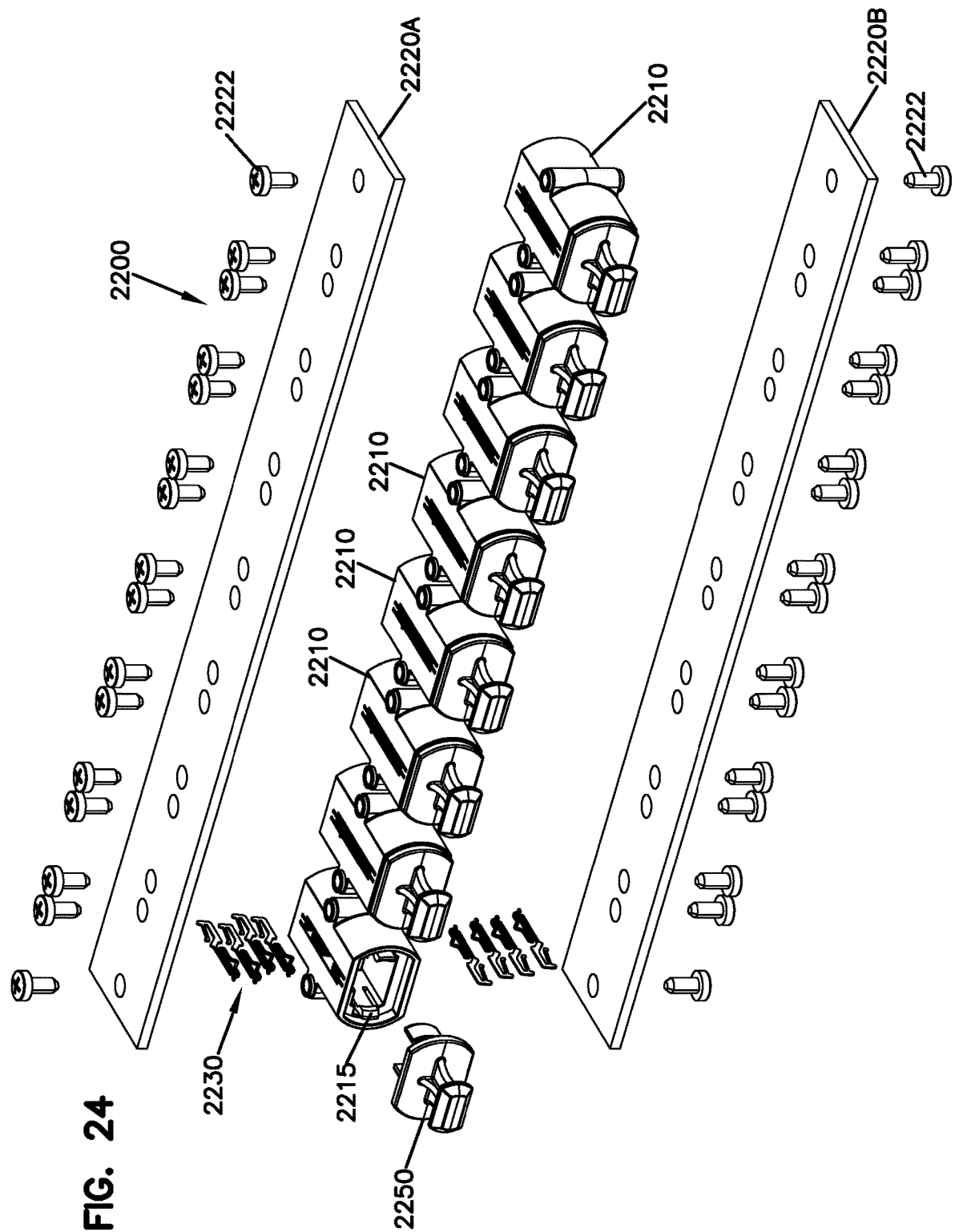
Figure 25:
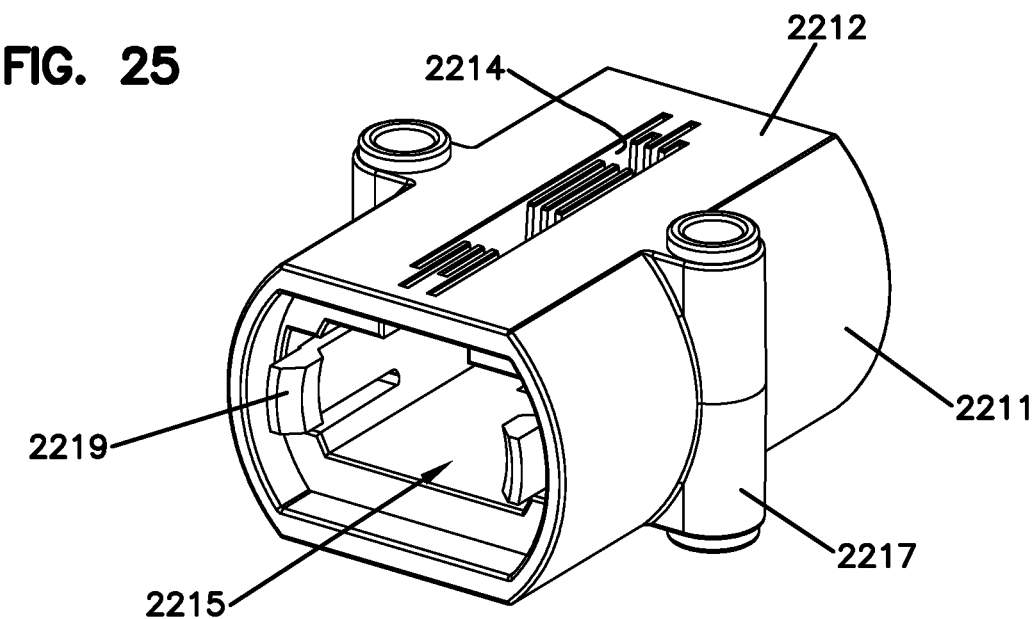
Figure 26:
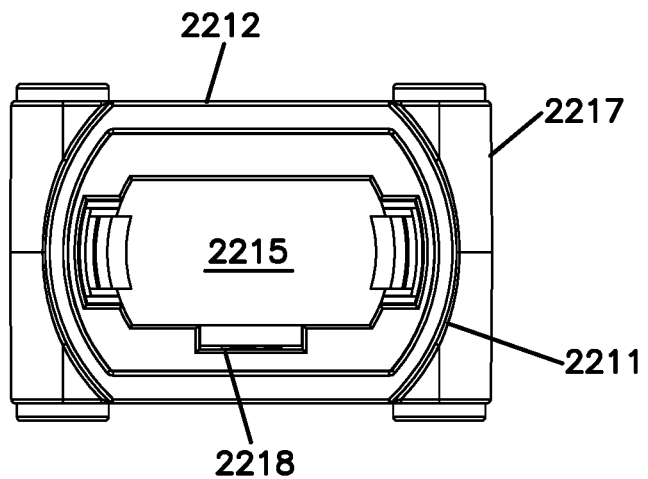
Figure 27:
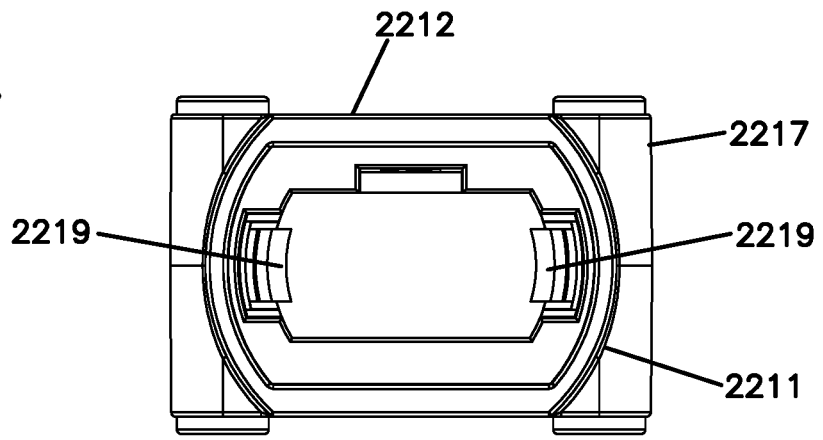
Figure 28:
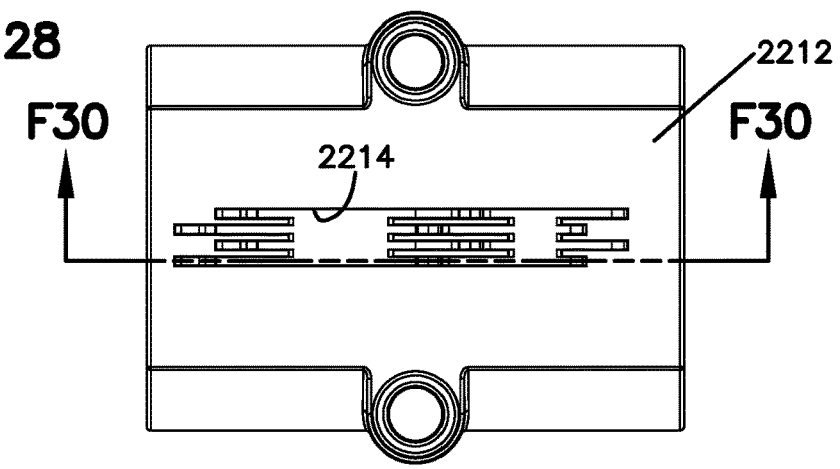
Figure 29:
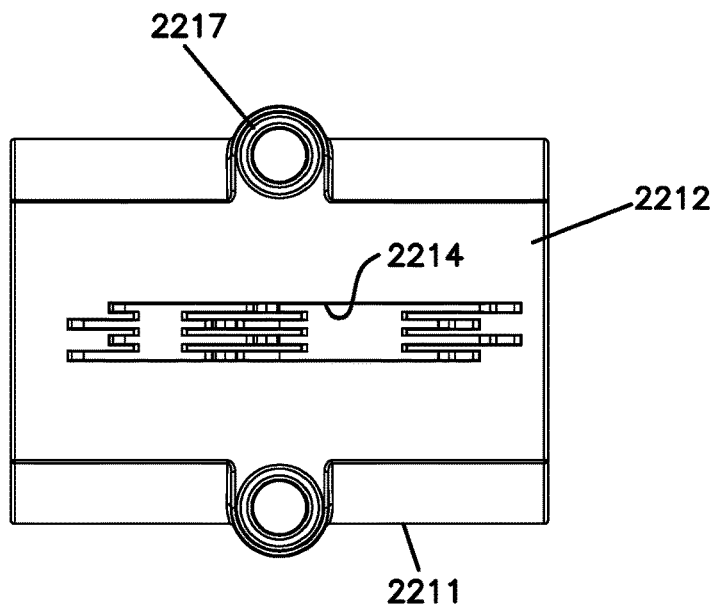
Figure 30:
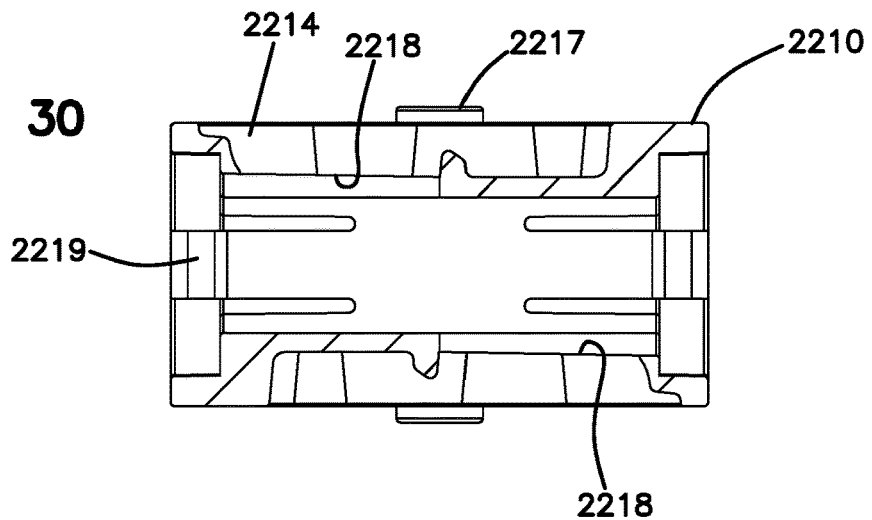

In the example shown in FIGS. 23 and 24, eight coupler housings 2210 are sandwiched between a first printed circuit board 2220A and a second printed circuit board 2220B (e.g., via fasteners 2222). In some implementations, the first printed circuit board 2220A can be electrically coupled to the second printed circuit board 2220B via a fixed connector (e.g., a card edge connector). In other implementations, the first printed circuit board 2220A can be electrically coupled to the second printed circuit board 2220B via a flexible or ribbon cable arrangement. In still other implementations, the printed circuit boards 2220A, 2220B are interconnected using other suitable circuit board connection techniques.

In the example shown, each coupler housing 2210 defines a single passage 2215 extending between opposite open ends. In other example implementations, however, each coupler housing 2210 can include a greater number (e.g., two, three, four, six, eight, twelve, etc.) of passages 2215. Each open end of each passage 2215 is configured to receive a segment of communications media (e.g., a connectorized end of an optical fiber). In other implementations, the connector system 2000 can include greater or fewer coupler housings 2210.

For ease in understanding, only portions of the example printed circuit boards 2220 of the connector system 2000 are shown in FIGS. 23 and 24. It is to be understood that the printed circuit boards 2220 electrically connect to a data processor and/or to a network interface (e.g., processor 217 and network interface 216 of FIG. 2) as part of a coupler assembly. As noted above, non-limiting examples of such connector assemblies include bladed chassis and drawer chassis. Furthermore, additional coupler housings 2210 can be connected to different portions of the printed circuit boards 2220 or at other locations within an example connector assembly.

One example coupler housing 2210 is shown in FIGS. 25-30. The example coupler housing 2210 is formed from opposing sides 2211 interconnected by first and second ends 2212. The sides 2211 and ends 2212 each extend between an open front and an open rear to define passages 2215. In the example shown in FIG. 25, the sides 2211 are curved to bow outwardly. The coupler housing 2210 also includes mounting stations 2217 at which fasteners 2222 can be received to secure the coupler housing 2210 to one or more printed circuit boards 2220. Non-limiting examples of suitable fasteners 2222 include screws, snaps, and rivets. For example, the mounting stations 2217 can aid in securing the coupler housing 2210 to an upper circuit board 2220A and a lower circuit board 2220B. In other implementations, the mounting stations 2217 can include latches, panel guides, or other panel mounting arrangements.

In the example shown, each coupler housing 2210 is implemented as a fiber optic adapter configured to receive Multi-Fiber Push-On (MPO) connectors. Each passage 2215 of the MPO adapters 2210 is configured to align and connect two MPO connector arrangements 2100 (FIG. 31). In other implementations, each passage 2215 can be configured to connect other types of physical media segments. For example, one or more passages 2215 of the MPO adapters 2200 can be configured to communicatively couple together an MPO connector arrangement 2100 with a media converter (not shown) to convert the optical data signals into electrical data signals, wireless data signals, or other type of data signals.

In some implementations, flexible latching tabs 2219 are located at the entrances of the passages 2215 to aid in retaining connector arrangements within the passages 2215. In the example shown, each latching tab 2219 defines a ramped surface and latching surface. The coupler housings 2210 also define channels 2218 extending partly along the length of the passages 2215 (e.g., see FIGS. 26 and 30) to accommodate portions of the fiber connector arrangements 2100. In some implementations, the adapter 2210 may define a channel 2218 extending inwardly from each open end of the passage 2215. In one example implementation, a first channel 2218 extends along a top of the housing 2210 from a first end of each passage 2215 and a second channel 2218 extends along a bottom of the housing 2210 from a second end of each passage 2215.

Each MPO housing 2210 includes at least one media reading interface 2230 (e.g., see FIG. 24) configured to acquire the physical layer information from a storage device 2130 of a fiber connector arrangement 2100 (see FIGS. 31-34). In the example shown in FIG. 24, each MPO adapter 2210 includes at least one media reading interface 2230 that is configured to communicate with the storage device 2130 on an MPO connector 2110 plugged into the MPO adapter 2210. For example, in one implementation, the adapter 2210 can include a media reading interface 2230 associated with each passage 2215. In another implementation, the adapter 2210 can include a media reading interface 2230 associated with each connection end of a passage 2215.

FIGS. 31-34 show one example implementation of a connector arrangement implemented as an MPO connector 2100 that is configured to terminate multiple optical fibers. As shown in FIG. 31, each MPO connector 2100 includes a connector body 2110 enclosing a ferrule 2112 that retains multiple optical fibers (e.g., 2, 3, 4, 8, 12, or 16 fibers). The connector body 2110 is secured to a boot 2113 to provide bend protection to the optical fibers.

The connector arrangement 2100 is configured to store physical layer information (e.g., media information). For example, the physical layer information can be stored in a memory device 2130 mounted on or in the connector body 2110. In the example shown in FIG. 31, the connector body 2110 includes a storage section 2115 configured to accommodate a storage device 2130 on which the physical information is stored. The storage section 2115 includes a raised (i.e., or stepped up) portion of the connector body 2110 located adjacent the ferrule 2112. The raised portion 2115 defines a cavity 2116 in which the storage device 2130 can be positioned. In some implementations, the cavity 2116 is two-tiered (e.g., see FIGS. 32 and 34), thereby providing a shoulder on which the storage device 2130 can rest and space to accommodate circuitry located on a bottom of the storage device 2130. In other implementations, the storage device 2130 can be otherwise mounted to the connector 2110.

One example storage device 2130 includes a printed circuit board 2131 to which memory circuitry can be arranged. In one example embodiment, the storage device 2130 includes an EEPROM circuit arranged on the printed circuit board 2131. In other embodiments, however, the storage device 2130 can include any suitable type of memory. In the example shown in FIG. 31, the memory circuitry is arranged on the non-visible side of the printed circuit board 2131. Electrical contacts 2132 (FIG. 31) also are arranged on the printed circuit board 2131 for interaction with a media reading interface 2230 of the connector assembly 2200.

FIGS. 35-41 show the media reading interface 2230 of the MPO adapter 2200 in accordance with some implementations. In the example shown, the MPO adapter housing 2210 includes a first media reading interface 2230A and a second media reading interface 2230B. In some implementations, the first media reading interface 2230A is associated with a first connection end of the passage 2215 and the second media reading interface 2230B is associated with a second connection end of the passage 2215.

Figure 40:
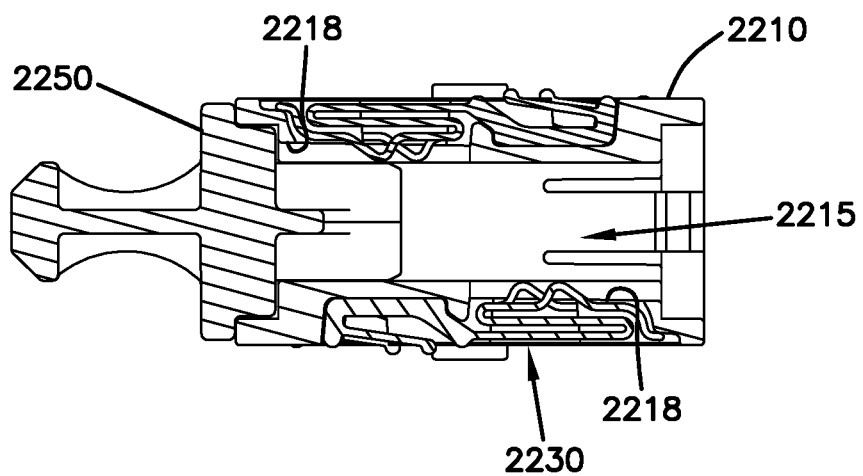
Figure 41:
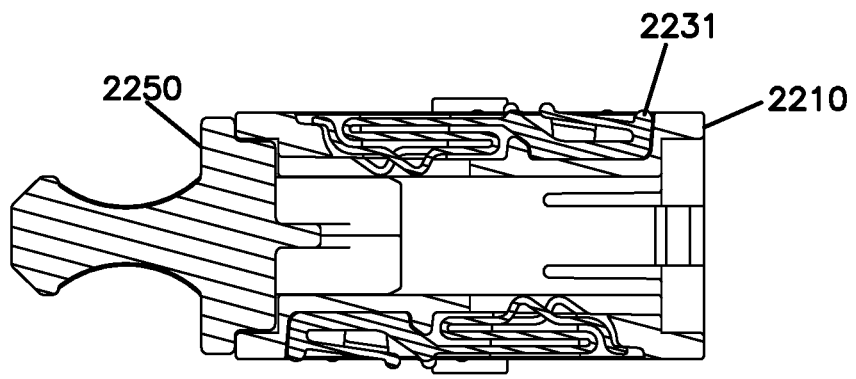
Figure 42:
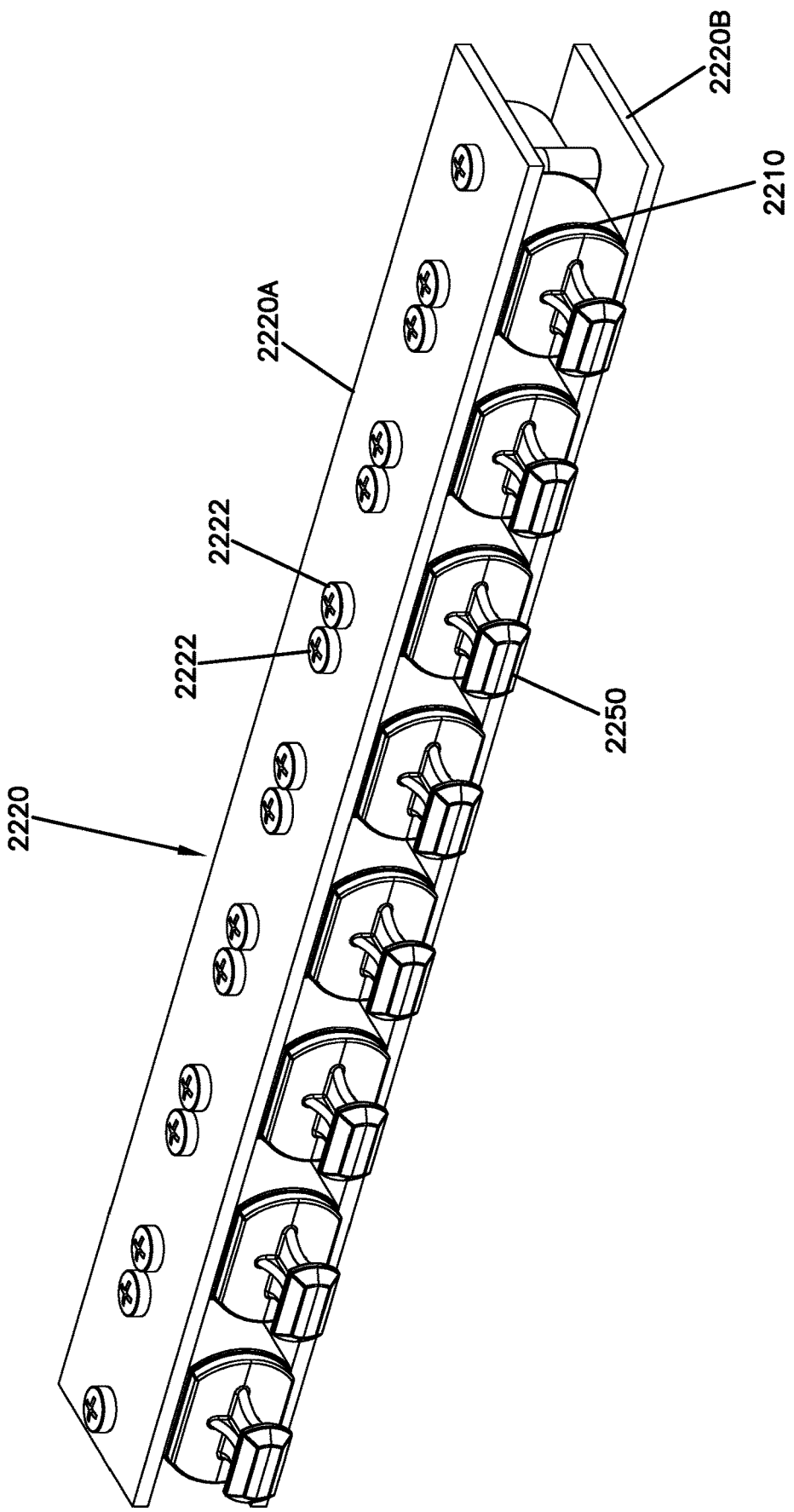
Figure 43:
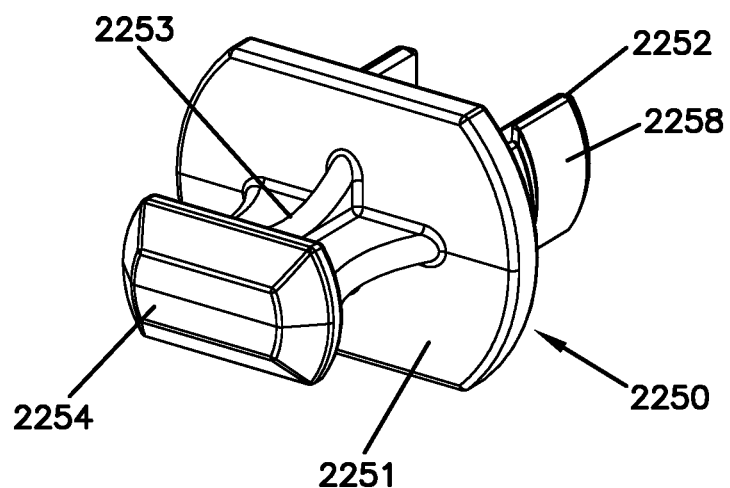
Figure 44:
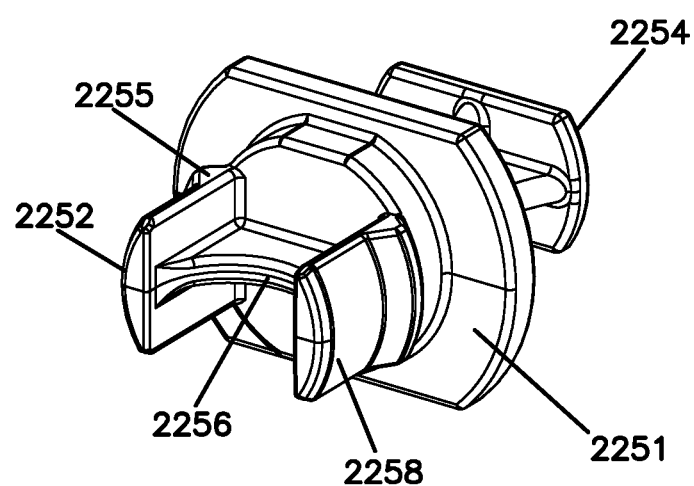
Figure 47:
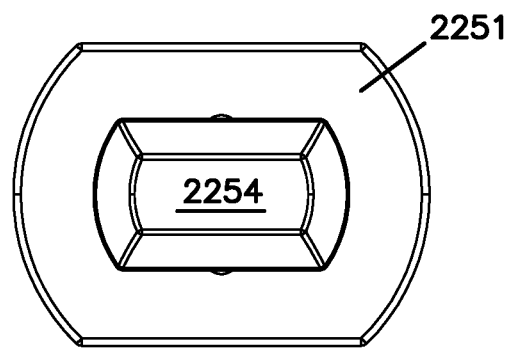
Figure 45:
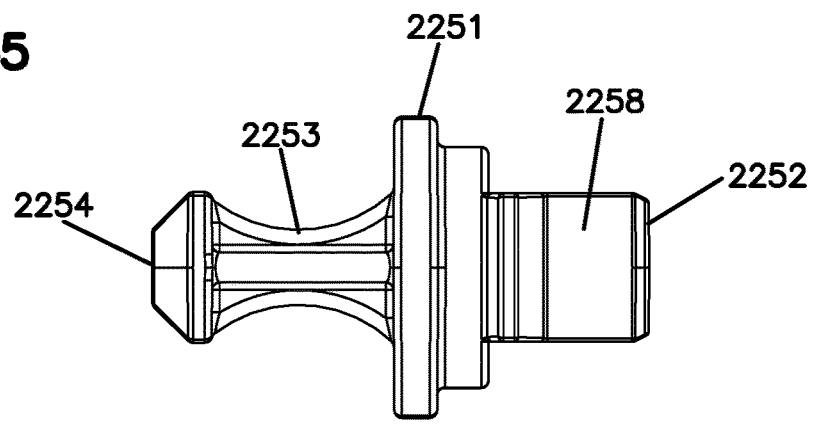
Figure 46:
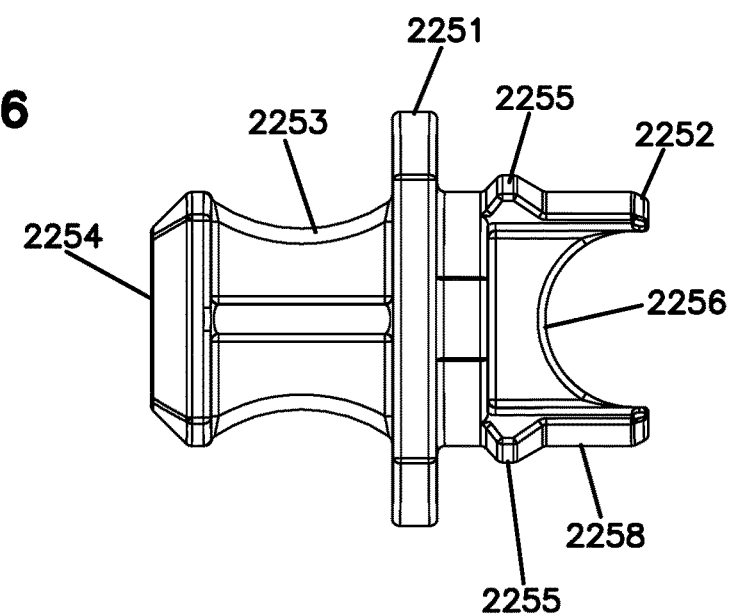
Figure 48:
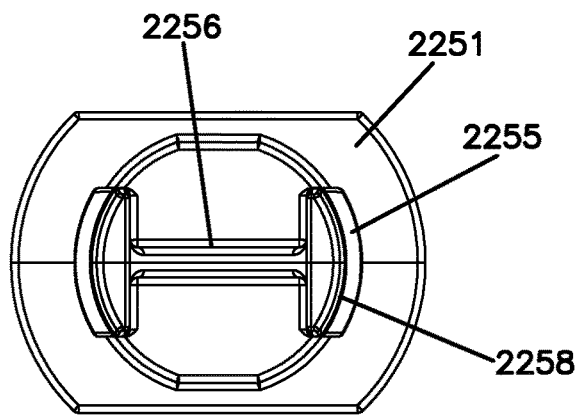
Figure 49:
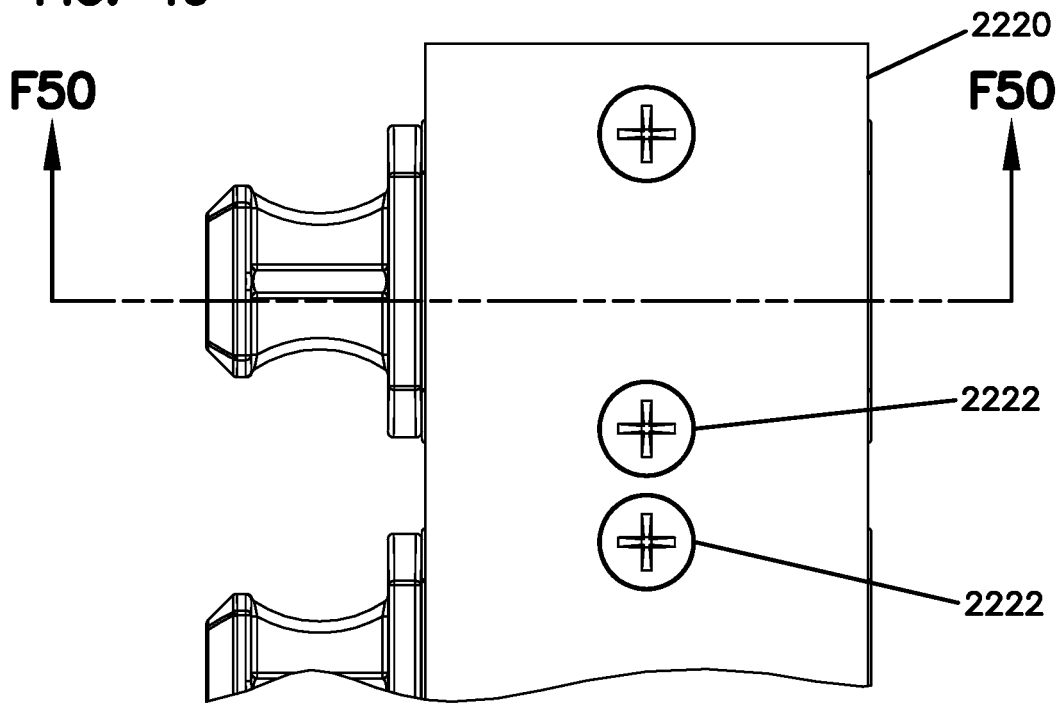

In the example shown, the second media reading interface 2230B is flipped (i.e., located on an opposite side of the housing 2210) relative to the first media reading interface 2230A (e.g., see FIGS. 40-41). In some such implementations, the channel 2218 extending inwardly from the first connection end of the passage 2215 also is flipped with respect to the channel 2218 extending inwardly from the second end of the passage 2215 (e.g., see FIG. 40). In some implementations, one or both ends 2212 of the adapter housing 2210 defines slots 2214 (e.g., see FIGS. 28 and 29) that lead to the channels 2218 (see FIGS. 40 and 41). The channels 2218 are each configured to receive a media reading interface 2230 through the respective slots 2214.

In the example shown in FIGS. 28, 29, 40, and 41, flipping the orientation of the connectors 2110 between the front and rear ports enables each of the major surfaces 2212 of the adapter 2210 to be configured to receive only one media reading interface 2130 for each passage 2215. For example, the media reading interfaces 2130 for the front ports of the passages 2215 are accommodated by a first of the major surfaces 2212 and the media reading interfaces 2130 for the rear ports of the passages 2215 are accommodated by a second of the major surfaces 2212. Such a configuration enables each slot 2214 to extend more than half-way between the front and rear of the adapter 2210.

In other implementations, each major surface 2212 of the adapter 2210 may accommodate the media reading interfaces 2130 for some of the front ports and some of the rear ports. For example, in one implementation, each major surface 2212 accommodates the media reading interfaces for alternating ones of the front and rear ports. In particular, a first slot in the first major surface 2212 may accommodate a media reading interface 2130 for a front port of a first passage 2215 and a first slot 2214 in the second major surface 2212 may accommodate a media reading interface 2130 for a rear port of the first passage 2215. A second slot 2214 in the first major surface 2212 may accommodate a media reading interface 2130 for a rear port of a second passage 2215 and a second slot 2214 in the second major surface 2212 may accommodate a media reading interface 2130 for a front port of the second passage 2215. Such configurations also enable each slot 2214 to extend more than half-way between the front and rear of the adapter 2210.

Lengthening the slots 2214 enables longer contact members 2231 to be received within each slot 2214. For example, each contact member 2231 may extend at least half-way across the adapter 2210 between the front and rear of the adapter 2210. In certain implementations, each contact member 2231 may extend across a majority of the distance between the front and rear of the adapter 2210. Lengthening the contact members 2231 increases the beam length of each contact member 2231. The beam length affects the ability of the contact member 2231 to deflect toward and away from the circuit boards 2220.

In general, each media reading interface 2230 is formed from one or more contact members 2231. Portions of the contact members 2231 extend into the passage 2215 of the MPO adapter 2210 through the respective channel 2218 (e.g., see FIGS. 40-41) to engage the electrical contacts 2132 of the storage member 2130 of any MPO connector positioned in the passage 2215. Other portions of the contact members 2231 are configured to protrude outwardly from the channel 2218 through the slots 2214 to engage contacts and tracings on a printed circuit board 2220 associated with the connector assembly 2200 (e.g., see FIG. 42).

Figure 35:
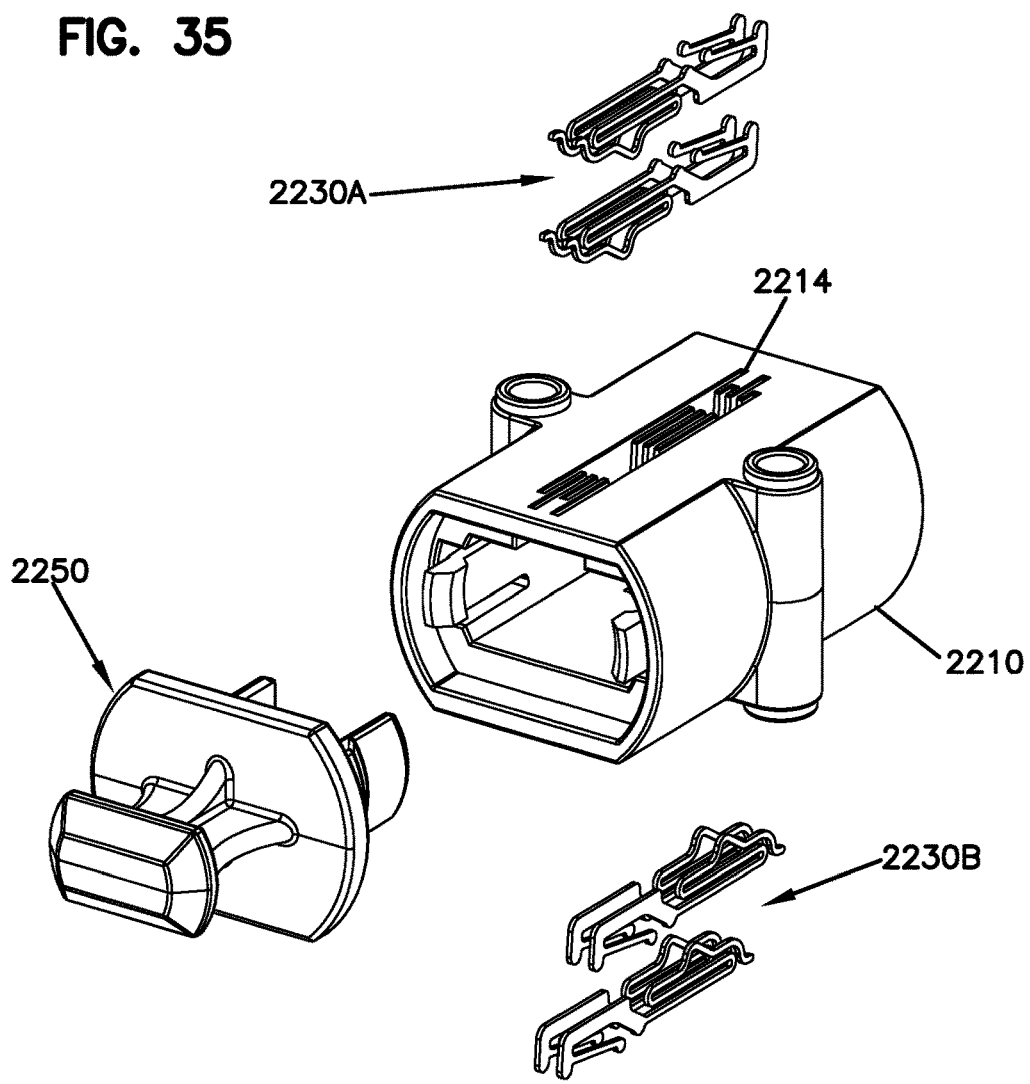
Figure 35A:
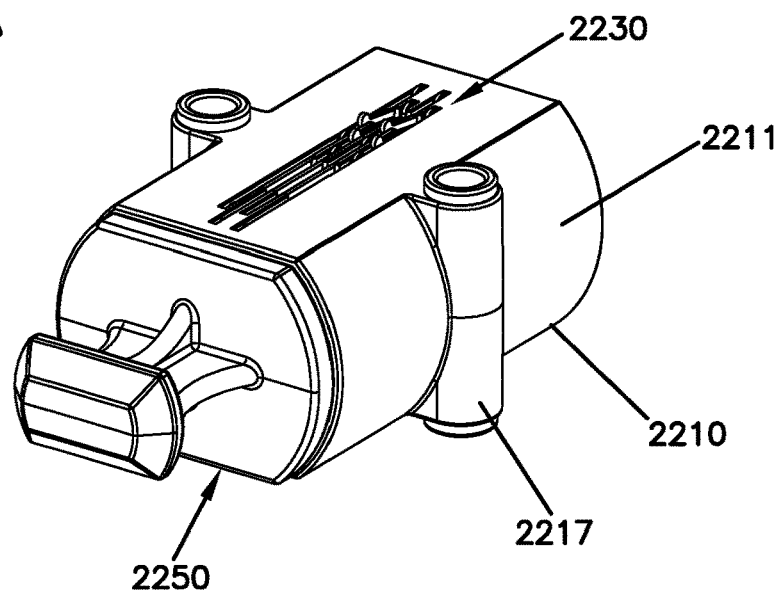

In some implementations, the contact members 2231 of a single media reading interface 2230 are positioned in a staggered configuration to facilitate access to the contact pads 2132 on the connector storage device 2130 of a connector arrangement 2100. For example, as shown in FIGS. 35 and 35A, alternating contact members 2231 can be staggered between at least front and rear locations within the channels 2218. Likewise, in some implementations, the contact pads 2132 on each storage device 2130 can be arranged in staggered positions (e.g., see pads 2132 in FIG. 31). In other implementations, the contact pads 2132 on each storage device 1130 can vary in size and/or shape to facilitate a one-to-one connection between the contact members 2231 and the contact pads 2132.

Figure 36:
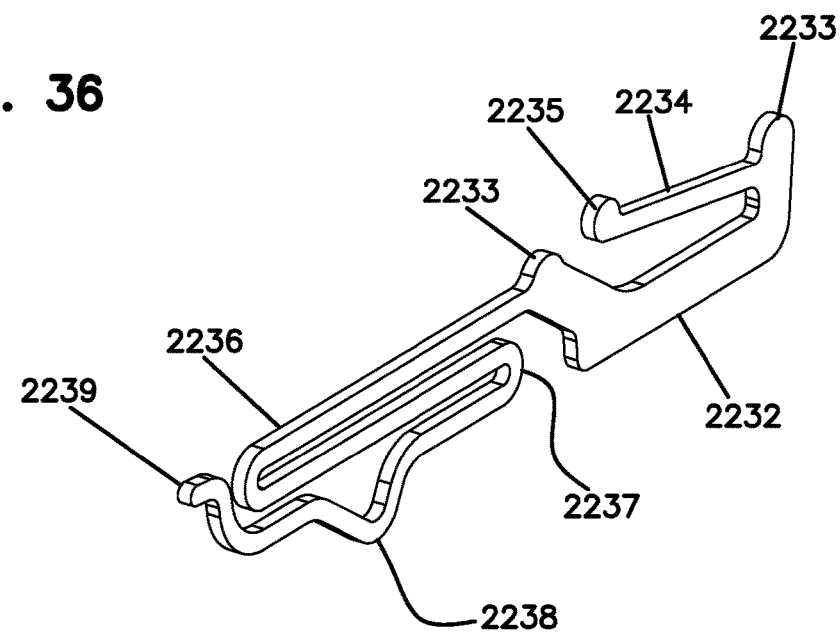
Figure 37:
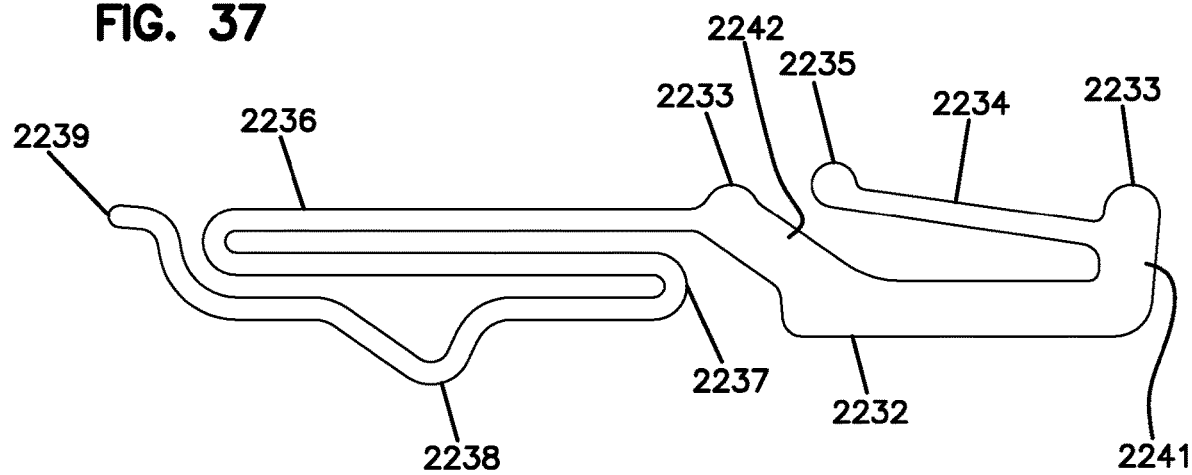
Figure 38:
Figure 39:
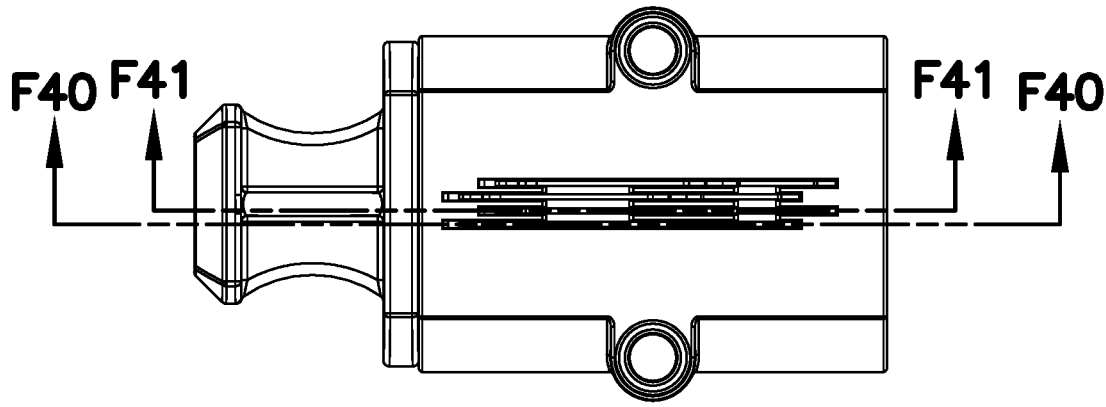

One example type of contact member 2231 is shown in FIGS. 36-38. In one implementation, the contact member 2231 defines a planar body. In one implementation, the contact member 2231 is formed monolithically (e.g., from a continuous sheet of metal or other material). For example, in some implementations, the contact member 2231 may be manufactured by cutting a planar sheet of metal or other material. In other implementations, the contact member 2231 may be manufactured by etching a planar sheet of metal or other material. In other implementations, the contact member 2231 may be manufactured by laser trimming a planar sheet of metal or other material. In still other implementations, the contact member 2231 may be manufactured by stamping a planar sheet of metal or other material.

Each contact member 2231 defines at least three moveable contact locations 2235, 2238, and 2239. The flexibility of the contact surfaces 2235, 2238, and 2239 provides tolerance for differences in spacing between the contact member 2231 and the respective printed circuit board 2220 when the coupler assembly 2200 is manufactured. Certain types of contact members 2231 also include at least one stationary contact 2233.

In the example shown in FIGS. 40 and 41, at least portions of two contact members 2231 are visibly positioned within a slot 2214 defined in a fiber optic adapter 2210, shown in cross-section. Two additional contact members 2231 also are positioned in the slot 2214, but cannot be seen since the additional contact members 2231 laterally align with the visible contact members 2231. In other implementations, however, greater or fewer contact members 2231 may be positioned within the housing.

The example contact member 2231 shown includes a base 2232 that is configured to be positioned within a slot 2214 defined by an adapter 2210. The base 2232 of certain types of contact members 2231 is configured to secure (e.g., snap-fit, latch, pressure-fit, etc.) to the adapter 2210. The base 1232 also can include a retention section that secures the member 1231 in the adapter body 1210. First and second legs 2241, 2242 extend from the base 2232.

A first arm 2234 extends from the first leg 2241 and defines a first moveable contact location 2235 between the two legs 2241, 2242 (e.g., at a distal end of the arm 2234). At least the first moveable contact location 2235 is aligned and configured to extend outwardly of the adapter housing 2210 through the slots 2214 to touch a first contact pad on the corresponding circuit board 2220 (e.g., see FIG. 50). The ability of the first arm to flex relative to the legs 2241, 2242 provides tolerance for placement of the contact member 2231 relative to the circuit board 2220. In certain implementations, each of the legs 2241, 2242 defines a stationary contact location 2233 that also touches the first contact pad on the circuit board 2220. In one implementation, the stationary contacts 2233 and first moveable contact 2235 provide grounding of the contact member 2231.

A second arm 2236 extends from the second leg 2242 to define a resilient section 2237, a second moveable contact location 2238, and a third moveable contact location 2239. In one implementation, the second contact location 2238 defines a trough located on the second arm 2236 between the resilient section 2237 and the third contact location 2239. The resilient section 2237 is configured to bias the second contact location 2238 towards the channel 2218 (e.g., see FIGS. 40 and 41). In the example shown, the resilient section 2237 is implemented as a looped/bent section of the second arm 2236. In other implementations, the second arm 2236 can otherwise include springs, reduced width sections, or portions formed from more resilient materials.

The third contact location 2239 is configured to be positioned initially within the slot 2214. The resilient section 2237 is configured to bias the third contact location 2239 through the slot 2214 to an exterior of the housing 2210 when a connector arrangement 2100 or other media segment pushes against the second contact location 2238. For example, inserting an MPO connector 2110 into a connection end of a passage 2215 of an MPO adapter 2210 would cause the storage section 2115 of the connector 2110 to slide through the channel 2218 and to engage the second contact location 2238 of each contact member 2231 associated with that connection end of the passage 2215. The storage section 2115 would push outwardly on the second contact location 2238, which would push the third contact location 2239 through the slots 2214 and toward the printed circuit board 2220 mounted to the adapter 2210 adjacent the slots 2214 (see FIG. 50).

As discussed above, a processor (e.g., processor 217 of FIG. 2) or other such equipment also can be electrically coupled to the printed circuit board 2220. Accordingly, the processor can communicate with the memory circuitry on the storage device 2130 via the contact members 2231 and the printed circuit board 2220. In accordance with some aspects, the processor is configured to obtain physical layer information from the storage device 2130. In accordance with other aspects, the processor is configured to write (e.g., new or revised) physical layer information to the storage device 2130. In accordance with other aspects, the processor is configured to delete physical layer information to the storage device 2130. In one example implementation, at least a first contact member 2231 transfers power, at least a second contact member 2231 transfers data, and at least a third contact member 2231 provide grounding. However, any suitable number of contact members 2231 can be utilized within each media reading interface 2230.

In accordance with some aspects, the contact members 2231 are configured to selectively form a complete circuit with one or more of the printed circuit boards 2220. For example, each printed circuit board 2220 may include two contact pads for each contact member. In certain implementations, a first portion of each contact member 2231 touches a first of the contact pads and a second portion of each contact member 2231 selectively touches a second of the contact pads. The processor coupled to the circuit board 2220 may determine when the circuit is complete. Accordingly, the contact members 2231 can function as presence detection sensors for determining whether a media segment has been inserted into the passages 2215.

In certain implementations, the first moveable contact 2235 of each contact member is configured to contact one of the contact pads of the circuit board 2220. In one implementation, the first moveable contact location 2235 is configured to permanently touch the contact pad as long as the circuit board 2220 and contact member 2231 are assembled on the adapter 2210. The third contact location 2239 of certain types of contact members 2231 is configured to touch a second contact pad of the printed circuit board 2220 only when a segment of physical communications media (e.g., an MPO connector 2110) is inserted within an adapter passage 2215 and pushes the second contact location 2238 out of the channel 2218, which pushes the third contact location 2239 through the slot 2214 and against the circuit board 2220. In accordance with other aspects, the contact members 2231 are configured to form a complete circuit with the printed circuit board 2220 regardless of whether a media segment is received in the passage 2215.

Referring to FIGS. 42-50, dust caps 2250 can be used to protect passages 2215 of the adapter housings 2210 when fiber optic connectors 2110 or other physical media segments are not received within the passages 2215. For example, a dust cap 2250 can be configured to fit within a front entrance or a rear entrance of each adapter passage 2215. The dust caps 2250 are configured to inhibit the ingress of dust, dirt, or other contaminants into the passage 2215. In accordance with some implementations, the dust caps 2250 are configured not to trigger the presence sensor/switch of the adapter 2210.

FIGS. 43-48 show one example implementation of an adapter dust cap 2250. The example dust cap 2250 includes a cover 2251 configured to fit over a mouth of the passage 2215. A handle including a stem 2253 and grip 2254 extend outwardly from a first side of the cover 2251. The handle facilitates insertion and withdrawal of the dust cap 2250 from the passage 2215.

A retaining section 2252 extends outwardly from a second side of the cover 2251. The retaining section 2252 defines a concave contour 2256 extending between two fingers 2258. One or both fingers 2258 include lugs 2255 that are configured to interact with the flexible tabs 2219 of the adapter housing 2210 to retain the dust cap 2250 within the passage 2215. In the example shown, each lug 2255 defines a ramped surface.

In some implementations, the retaining section 2252 is configured to fit within the passage 2215 without pressing against the second contact location 2238 of each contact member 2231 of the first media reading interface 2230 (see FIG. 50). In the example shown, the retaining section 2252 defines a sufficiently concave contour to accommodate the second contact location 2238 of each contact member 2231. Insertion of the dust cap 2250 within the passage 2215 does not cause the third contact location 2239 to press against the first printed circuit board 2220A. Accordingly, insertion of the dust cap 2250 does not trigger the presence detection sensor/switch.

FIG. 50 shows a cross-sectional view of an MPO adapter housing 2210 sandwiched between a first printed circuit board 2220A and a second printed circuit board 2220B. The MPO adapter housing 2210 defines a passage 2215, a channel 2218 extending inwardly from each connection end of the passage 2215, and slots 2214 extending through opposing ends 2212 of the housing 2210. A first media reading interface 2230A is positioned in the first channel 2218 and interacts with the first printed circuit board 2220A.

A second media reading interface 2230B is positioned in the second channel 2218 and interacts with the second printed circuit board 2220B.

FIGS. 51-79 illustrate a fourth example implementation of a connector system 2000' that can be utilized on a connector assembly having PLI functionality as well as PLM functionality. The example connector system 2000' includes at least one communications coupler assembly 2200' positioned between two printed circuit boards 2220'. The same reference numbers are used herein to designate like elements on both communications coupler assemblies 2200 and 2200'.

One or more example connector arrangements 2100' (FIG. 59), which terminate segments 1010 of communications media, are configured to communicatively couple to other segments of physical communications media at the one or more communications coupler assemblies 2200'. The same reference numbers are used herein to designate like elements on both connector arrangements 2100 and 2100'. Accordingly, communications data signals carried by the media segments 1010 terminated by the connector arrangements 2100' can be transmitted to other media segments.

Figure 51:
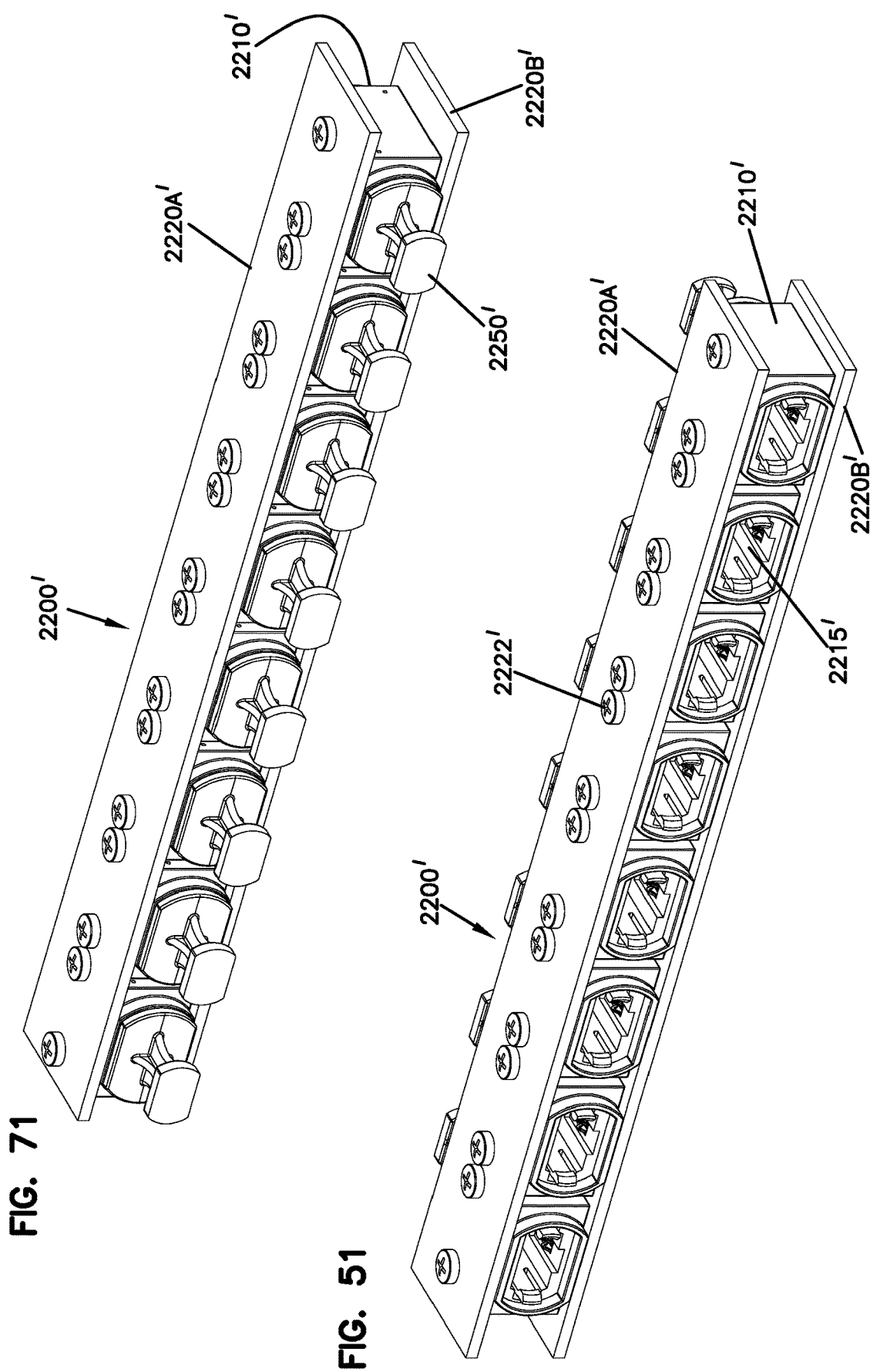
Figure 52:
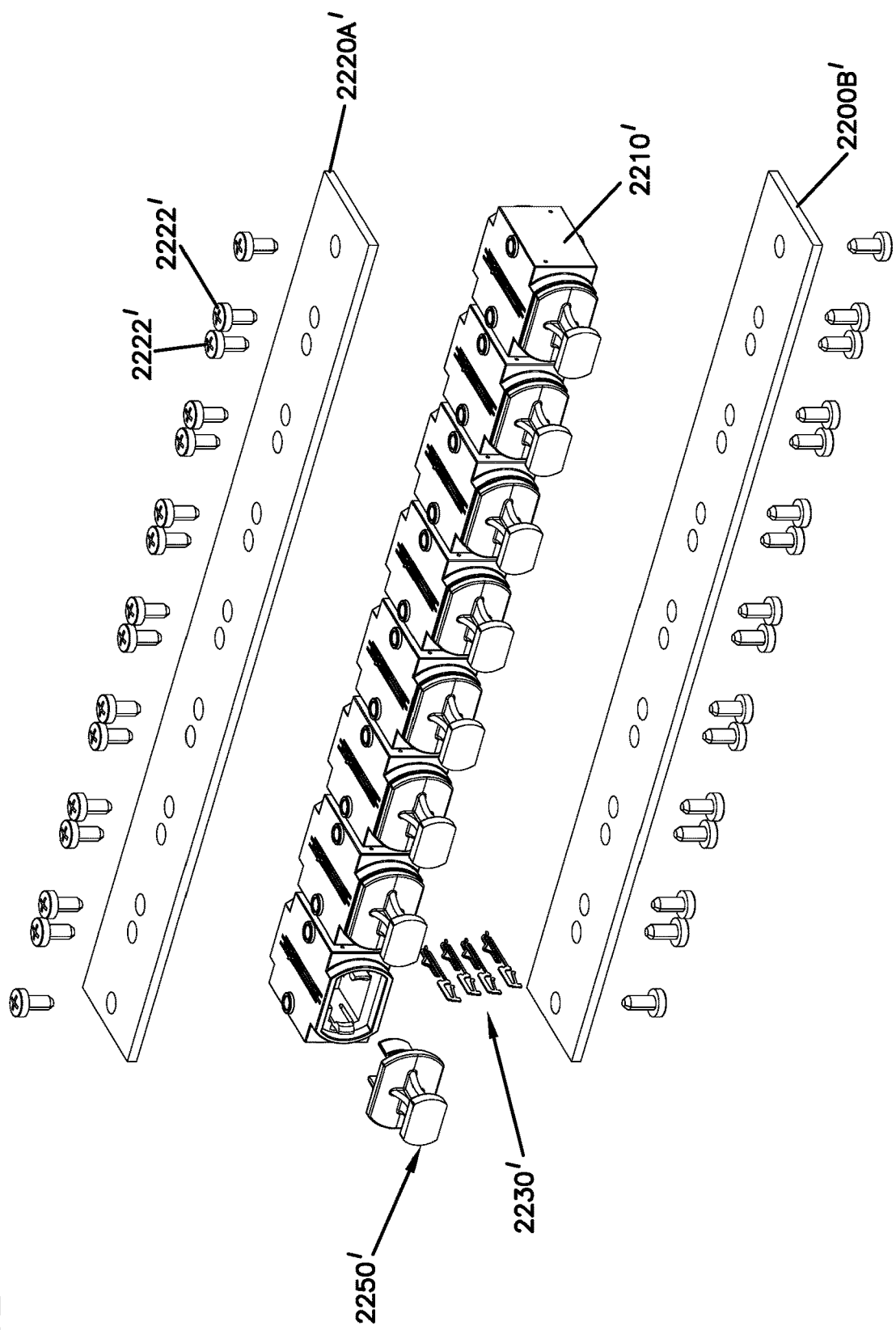
Figure 53:
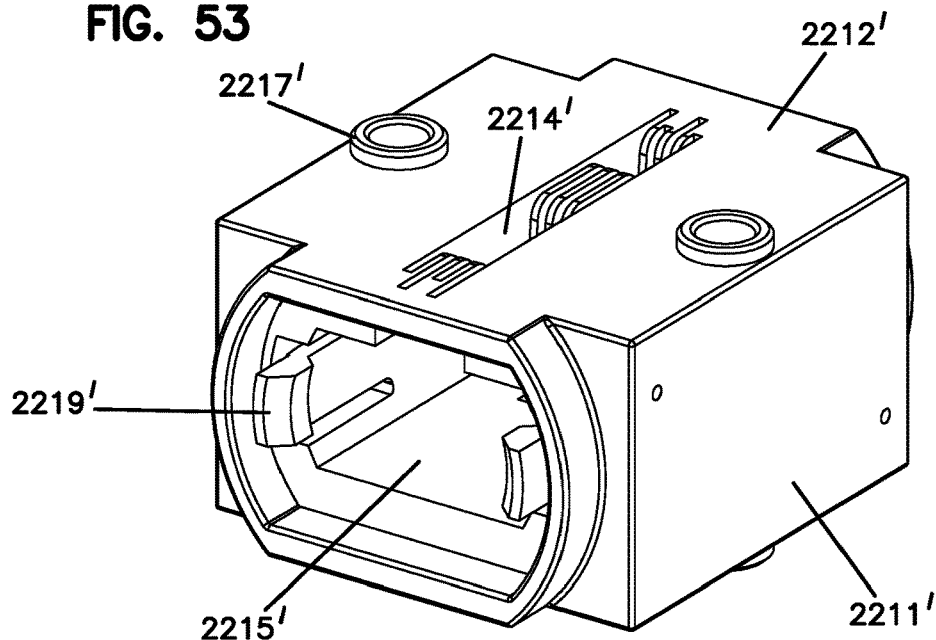
Figure 54:
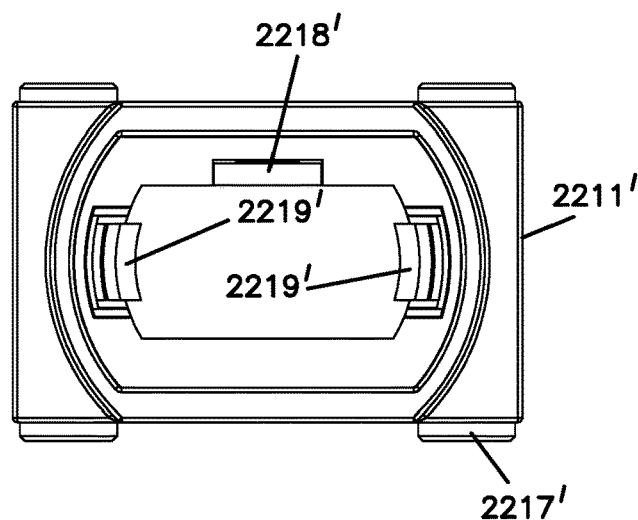
Figure 55:
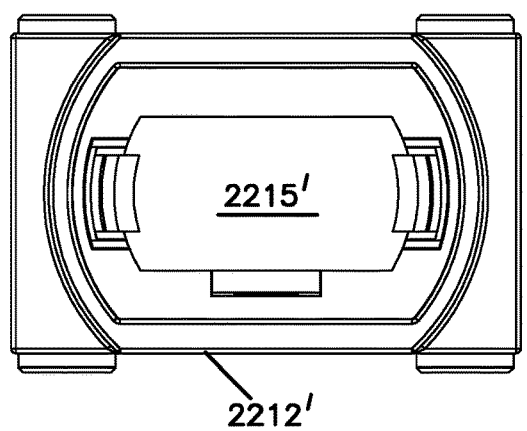
Figure 56:
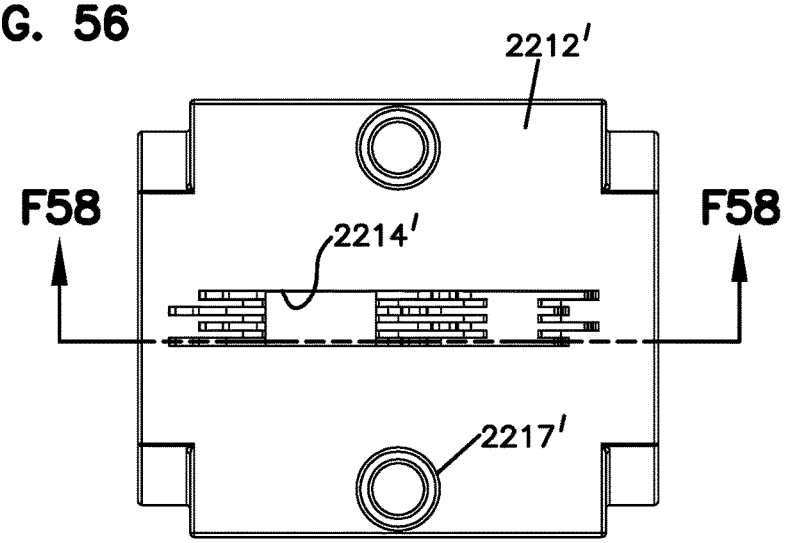
Figure 57:
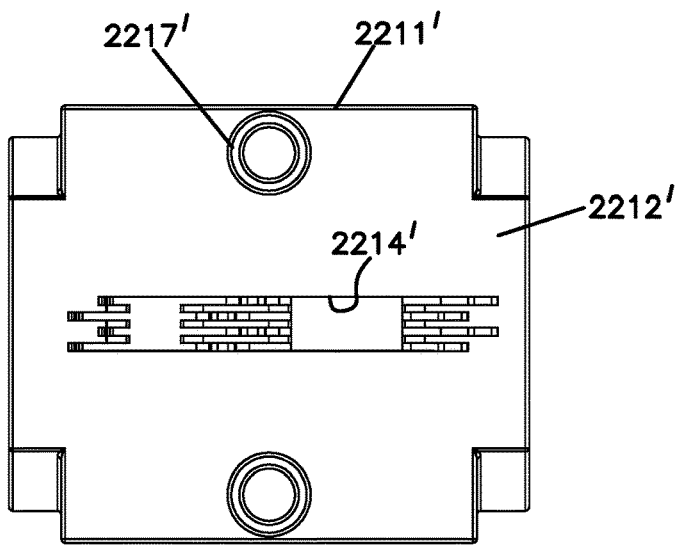
Figure 58:
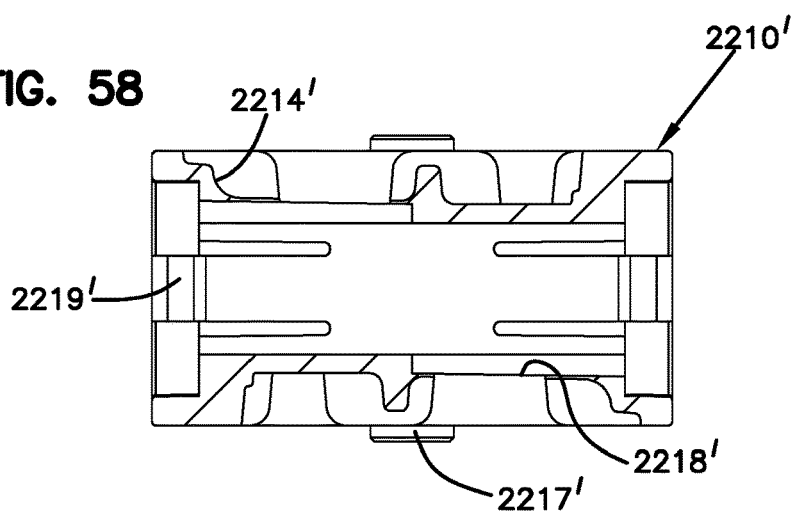

In the example shown in FIGS. 51 and 52, eight coupler housings 2210' are sandwiched between a first printed circuit board 2220A' and a second printed circuit board 2220B' (e.g., via fasteners 2222'). In some implementations, the first printed circuit board 2220A' can be electrically coupled to the second printed circuit board 2220B' via a fixed connector (e.g., a card edge connector). In other implementations, the first printed circuit board 2220A' can be electrically coupled to the second printed circuit board 2220B' via a flexible or ribbon cable arrangement. In still other implementations, the printed circuit boards 2220A', 2220B' are interconnected using other suitable circuit board connection techniques.

In the example shown, each coupler housing 2210' defines a single passage 2215' extending between opposite open ends. In other example implementations, however, each coupler housing 2210' can include a greater number (e.g., two, three, four, six, eight, twelve, etc.) of passages 2215'. Each open end of each passage 2215' is configured to receive a segment of communications media (e.g., a connectorized end of an optical fiber) 1010. In other implementations, the example connector system 2000' can include greater or fewer coupler housings 2210'.

For ease in understanding, only portions of the example printed circuit boards 2220' of the connector system 2000' are shown in FIGS. 51 and 52. It is to be understood that the printed circuit boards 2220' electrically connect to a data processor and/or to a network interface (e.g., processor 217 and network interface 216 of FIG. 2) as part of a connector assembly. As noted above, non-limiting examples of such connector assemblies include bladed chassis and drawer chassis. Furthermore, additional coupler housings 2210' can be connected to different portions of the printed circuit boards 2220' or at other locations within an example connector assembly.

One example coupler housing 2210' is shown in FIGS. 53-58. In the example shown, each coupler housing 2210' is implemented as a fiber optic adapter configured to receive Multi-Fiber Push-On (MPO) connectors. Each passage 2215' of the MPO adapters 2210' is configured to align and connect two MPO connector arrangements 2100' (FIG. 59). In other implementations, each passage 2215' can be configured to connect other types of physical media segments. For example, one or more passages 2215' of the MPO adapters 2200' can be configured to communicatively couple together an MPO connector arrangement 2100' with a media converter (not shown) to convert the optical data signals into electrical data signals, wireless data signals, or other type of data signals.

The example coupler housing 2210' is formed from opposing sides 2211' interconnected by first and second ends 2212'. The sides 2211' and ends 2212' each extend between an open front and an open rear to define passages 2215'. In the example shown in FIG. 53, the sides 2211' are generally flat. The coupler housing 2210' also defines mounting stations 2217' at which fasteners 2222' can be received to secure the coupler housing 2210' to one or more printed circuit boards 2220'. For example, the mounting stations 2217' can aid in securing the coupler housing 2210' to the upper circuit board 2220A' and the lower circuit board 2220B' shown in FIG. 51. In the example shown, the mounting stations 2217' define one or more openings in the first and second ends 2212' in which the fasteners 2222' can be inserted. Non-limiting examples of suitable fasteners 2222' include screws, snaps, and rivets. In other implementations, the mounting stations 2217 can include latches, panel guides, or other panel mounting arrangements.

In some implementations, flexible latching tabs 2219' are located at the entrances of the passages 2215' to aid in retaining connector arrangements within the passages 2215'. In the example shown, each latching tab 2219' defines a ramped surface and latching surface. The coupler housings 2210' also define channels 2218' extending partly along the length of the passages 2215' (e.g., see FIGS. 55 and 58) to accommodate portions of the fiber connector arrangements 2100'. In some implementations, the adapter 2210' may define a channel 2218' extending inwardly from each open end of the passage 2215'. In one example implementation, a first channel 2218' extends along a top of the housing 2210' from a first end of each passage 2215' and a second channel 2218' extends along a bottom of the housing 2210' from a second end of each passage 2215'.

Each adapter housing 2210' includes at least one media reading interface 2230' (e.g., see FIG. 52) configured to acquire the physical layer information from a storage device 2130' of a fiber connector arrangement 2100' (see FIGS. 59-62). In the example shown in FIG. 52, each MPO adapter 2210' includes at least one media reading interface 2230' that is configured to communicate with the storage device 2130' on an MPO connector 2110' plugged into the MPO adapter 2210'. For example, in one implementation, the adapter 2210' can include a media reading interface 2230' associated with each passage 2215'. In another implementation, the adapter 2210' can include a media reading interface 2230' associated with each connection end of a passage 2215'.

FIGS. 59-62 show one example implementation of a connector arrangement implemented as an MPO connector 2100' that is configured to terminate multiple optical fibers. As shown in FIG. 59, each MPO connector 2100' includes a connector body 2110' enclosing a ferrule 2112' that retains multiple optical fibers (e.g., 2, 3, 4, 8, 12, or 16 fibers). The connector body 2110' is secured to a boot 2113' to provide bend protection to the optical fibers.

The connector arrangement 2100' is configured to store physical layer information (e.g., media information). For example, the physical layer information can be stored in a memory device 2130' mounted on or in the connector body 2110'. In the example shown in FIG. 59, the connector body 2110' includes a key 2115' configured to accommodate the storage device 2130' on which the physical layer information is stored. The key 2115' includes a raised (i.e., or stepped up) portion of the connector body 2110' located adjacent the ferrule 2112'. The raised portion 2115' defines a cavity 2116' in which the storage device 2130' can be positioned. In some implementations, the cavity 2116' is two-tiered (e.g., see FIGS. 60 and 62), thereby providing a shoulder on which the storage device 2130' can rest and space to accommodate circuitry located on a bottom of the storage device 2130'. In other implementations, the storage device 2130' can be otherwise mounted to the connector 2110'.

One example storage device 2130' includes a printed circuit board 2131' to which memory circuitry can be arranged. In one example embodiment, the storage device 2130' includes an EEPROM circuit arranged on the printed circuit board 2131'. In other embodiments, however, the storage device 2130' can include any suitable type of memory. In the example shown in FIG. 59, the memory circuitry is arranged on the non-visible side of the printed circuit board 2131'. Electrical contacts 2132' (FIG. 59) also are arranged on the printed circuit board 2131' for interaction with a media reading interface 2230' of the connector assembly 2200'.

In the example shown in FIG. 59, the contacts 2132' define planar surfaces extending in a front-to-rear direction. In one implementation, the contacts 2132' are configured to promote even wear amongst the contacts 2132'. In some implementations, the contacts 2132' alternate between long and short planar surfaces. For example, contacts 2132A' and 2132C' are longer than contacts 2132B' and 2132D' (see FIG. 59).

FIGS. 63-70 show the media reading interface 2230' of the MPO adapter 2200' in accordance with some implementations. In the example shown, the MPO adapter housing 2210' includes a first media reading interface 2230A' and a second media reading interface 2230B'. In some implementations, the first media reading interface 2230A' is associated with a first connection end of the passage 2215' and the second media reading interface 2230B' is associated with a second connection end of the passage 2215' (see FIGS. 68-69).

Figure 69:
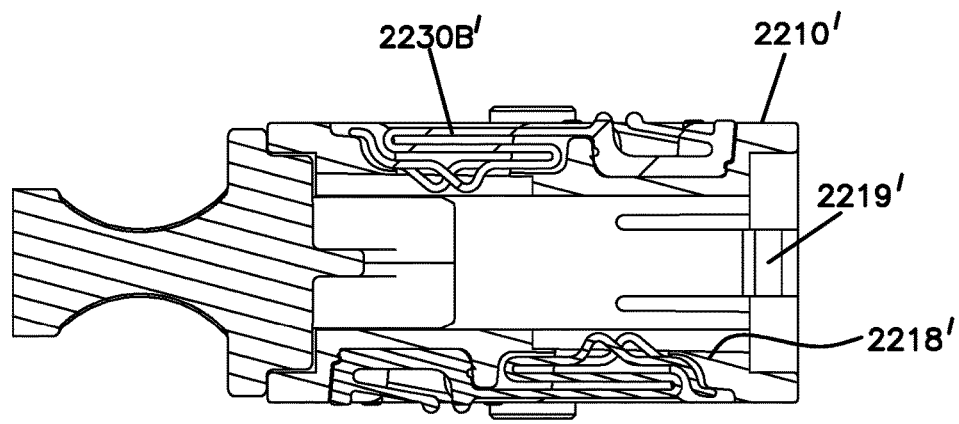
Figure 72:
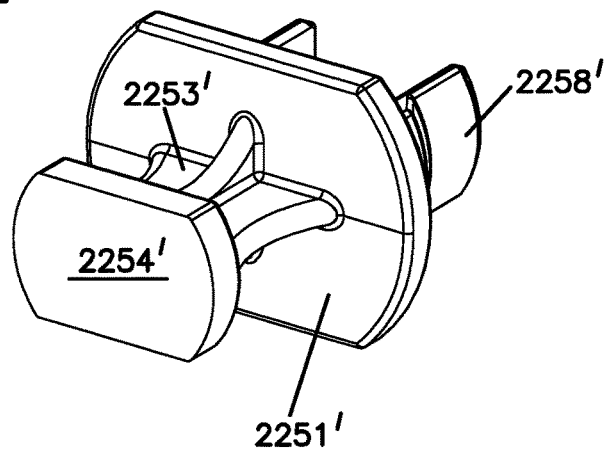
Figure 73:
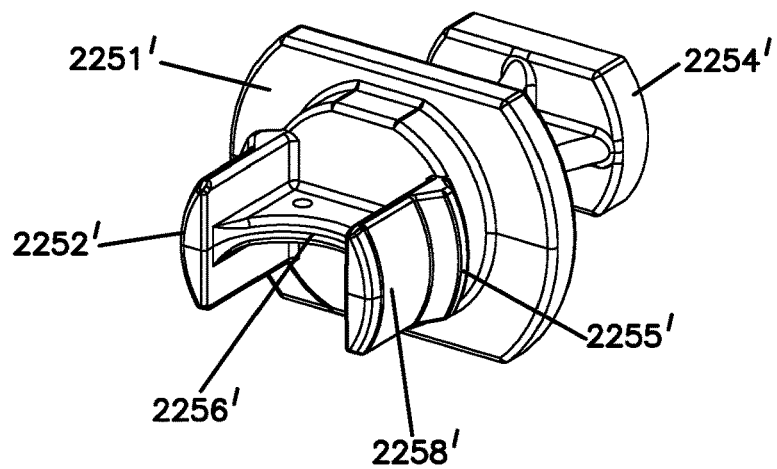
Figure 75:
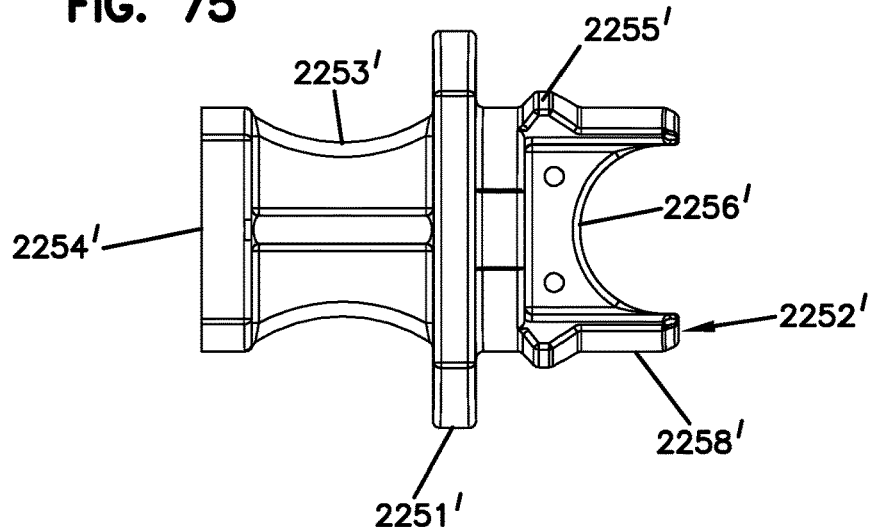
Figure 74:
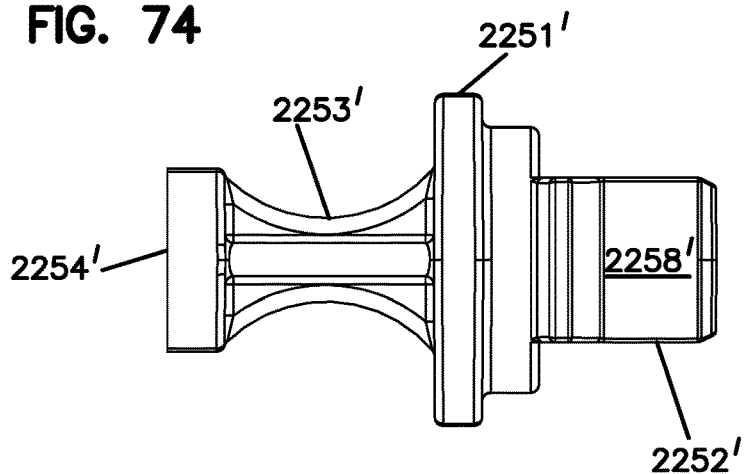
Figure 76:
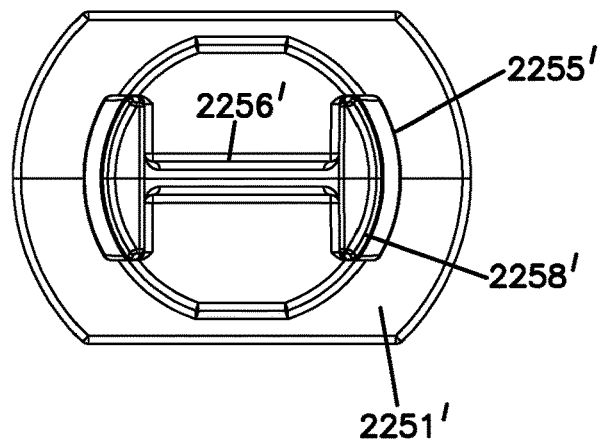
Figure 77:
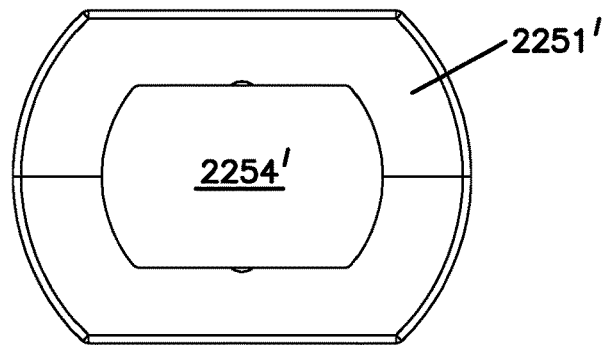
Figure 78:
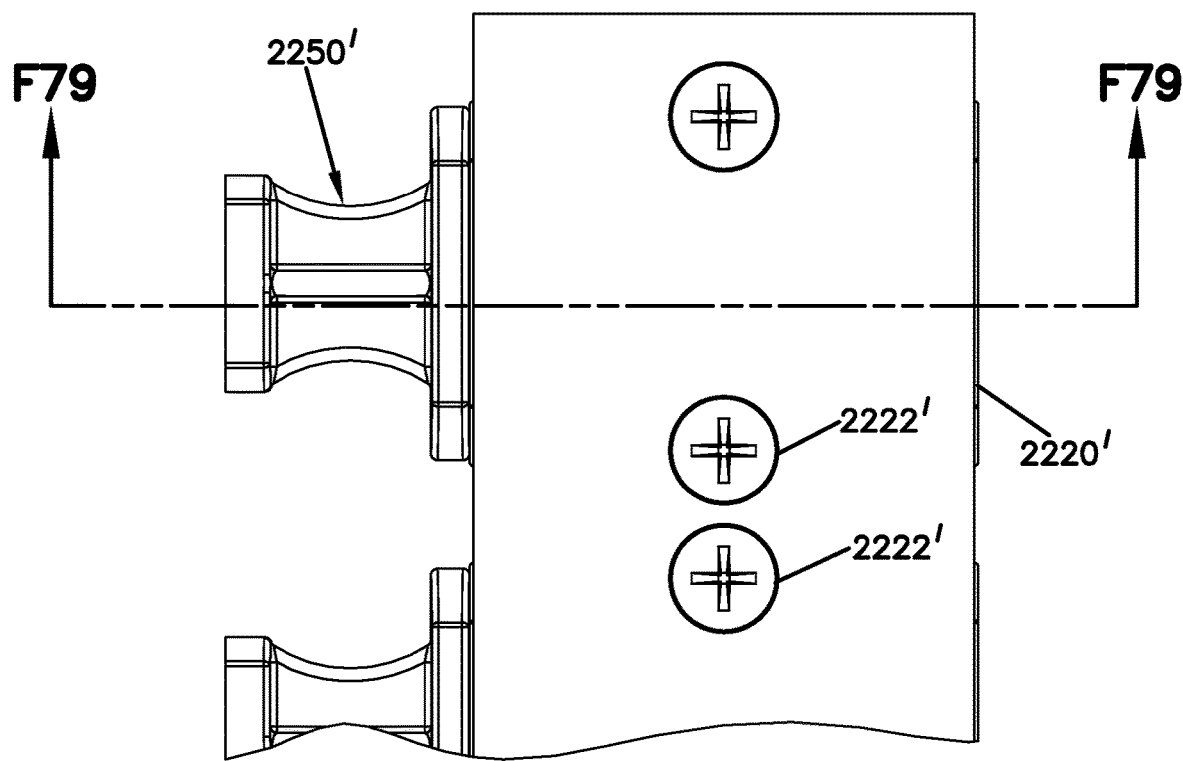

In the example shown, the second media reading interface 2230B' is flipped (i.e., located on an opposite side of the housing 2210') relative to the first media reading interface 2230A' (e.g., see FIGS. 68-69). In some such implementations, the channel 2218' extending inwardly from the first connection end of the passage 2215' also is flipped with respect to the channel 2218' extending inwardly from the second end of the passage 2215' (e.g., see FIG. 68). In some implementations, one or both ends 2212 of the adapter housing 2210' defines slots 2214' (e.g., see FIGS. 53 and 58) that lead to the channels 2218' (see FIGS. 68 and 69). The channels 2218' are each configured to receive a media reading interface 2230' through the respective slots 2214'.

In the example shown in FIGS. 56, 57, 68, and 69, flipping the orientation of the connectors 2110' between the front and rear ports enables each of the major surfaces 2212' of the adapter 2210' to be configured to receive only one media reading interface 2130' for each passage 2215'. For example, the media reading interfaces 2130' for the front ports of the passages 2215' are accommodated by a first of the major surfaces 2212' and the media reading interfaces 2130' for the rear ports of the passages 2215' are accommodated by a second of the major surfaces 2212'. Such a configuration enables each slot 2214' to extend at least half-way between the front and rear of the adapter 2210'.

In other implementations, each major surface 2212' of the adapter 2210' may accommodate the media reading interfaces 2130' for some of the front ports and some of the rear ports. For example, in one implementation, each major surface 2212' accommodates the media reading interfaces for alternating ones of the front and rear ports. In particular, a first slot in the first major surface 2212' may accommodate a media reading interface 2130' for a front port of a first passage 2215' and a first slot 2214' in the second major surface 2212' may accommodate a media reading interface 2130' for a rear port of the first passage 2215'. A second slot 2214' in the first major surface 2212' may accommodate a media reading interface 2130' for a rear port of a second passage 2215' and a second slot 2214' in the second major surface 2212' may accommodate a media reading interface 2130' for a front port of the second passage 2215'. Such configurations also enable each slot 2214' to extend more than half-way between the front and rear of the adapter 2210'.

Lengthening the slots 2214' enables longer contact members 2231' to be received within each slot 2214'. For example, each contact member 2231 may extend at least half-way across the adapter 2210' between the front and rear of the adapter 2210'. In certain implementations, each contact member 2231' may extend across a majority of the distance between the front and rear of the adapter 2210'. Lengthening the contact members 2231' increases the beam length of each contact member 2231'. The beam length affects the ability of the contact member 2231' to deflect toward and away from the circuit boards 2220'.

In general, each media reading interface 2230' is formed from one or more contact members 2231'. Portions of the contact members 2231' extend into the passage 2215' of the MPO adapter 2210' through the respective channel 2218' (e.g., see FIGS. 68-69) to engage the electrical contacts 2132 of the storage member 2130' of any MPO connector positioned in the passage 2215'. Other portions of the contact members 2231' are configured to protrude outwardly from the channel 2218' through the slots 2214' to engage contacts and tracings on a printed circuit board 2220' associated with the connector assembly 2200' (e.g., see FIG. 79).

Figure 70:
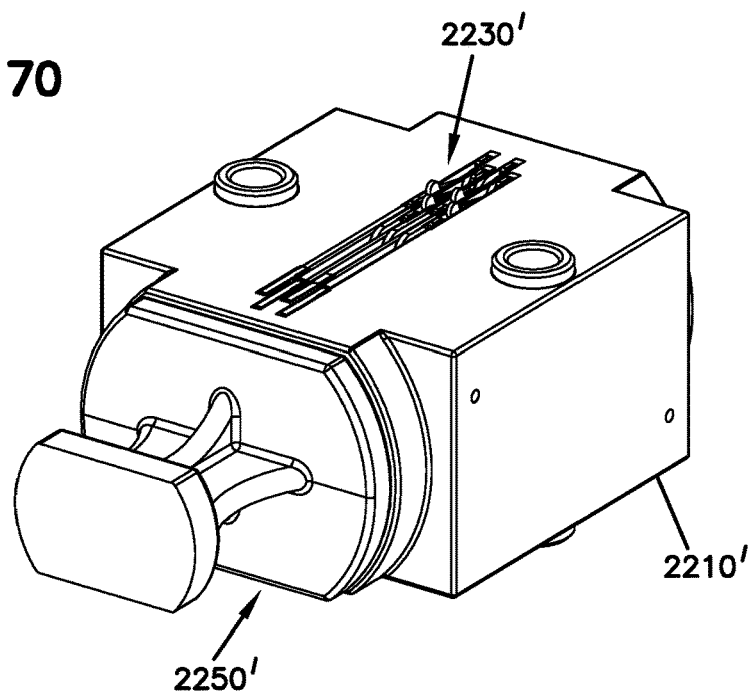

In some implementations, the contact members 2231' of a single media reading interface 2230' are positioned in a staggered configuration to facilitate access to the contact pads 2132' on the connector storage device 2130' of a connector arrangement 2100'. For example, as shown in FIG. 70, alternating contact members 2231' can be staggered between at least front and rear locations within the channels 2218'. Likewise, in some implementations, the contact pads 2132' on each storage device 2130' can be arranged in staggered positions. In other implementations, the contact pads 2132' on each storage device 2130' can vary in size and/or shape (e.g., see pads 2132' of FIG. 59) to facilitate a one-to-one connection between the contact members 2231' and the contact pads 2132'.

Figure 64:
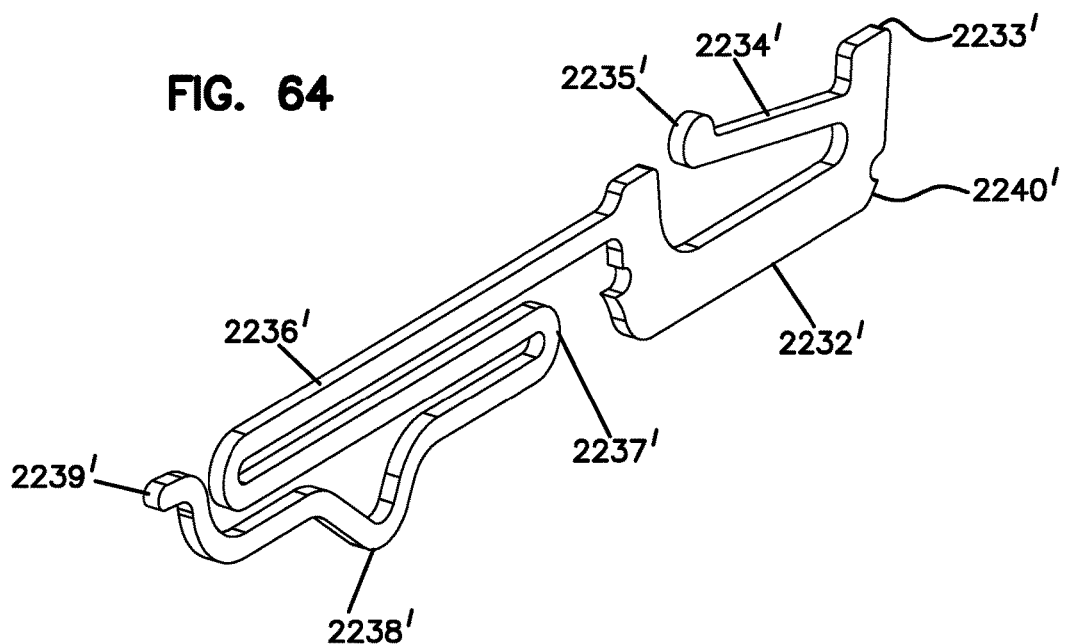
Figure 65:
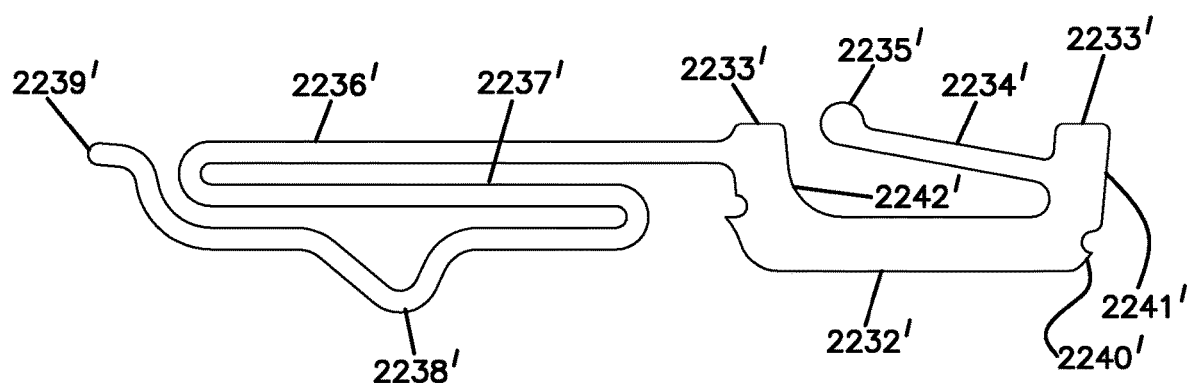
Figure 66:
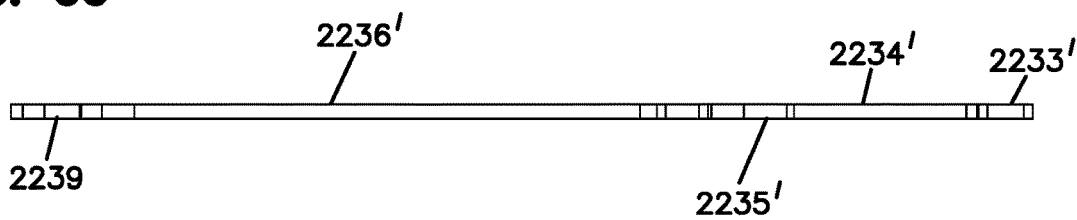
Figure 67:
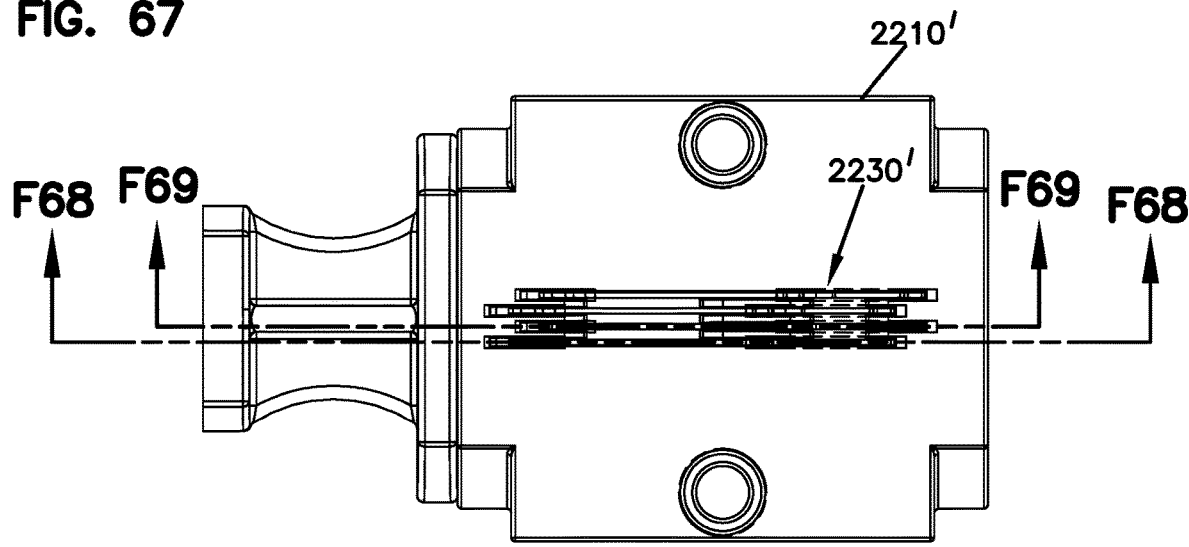

One example type of contact member 2231' is shown in FIGS. 64-66. In one implementation, the contact member 2231' defines a planar body. In one implementation, the contact member 2231' is formed monolithically. Each contact member 2231' defines at least three moveable contact locations 2235', 2238', and 2239'. The flexibility of the contact surfaces 2235', 2238', and 2239' provides tolerance for differences in spacing between the contact member 2231' and the respective printed circuit board 2220' when the coupler assembly 2200' is manufactured. Certain types of contact members 2231' also include at least one stationary contact 2233'.

In the example shown in FIGS. 68-69, two contact members 2231' are visibly positioned within a slot 2214' defined in a fiber optic adapter 2210', shown in cross-section. Two additional contact members 2231' also are positioned in the slot 2214', but cannot be seen since the additional contact members 2231' laterally align with the visible contact members 2231'. In other implementations, however, greater or fewer contact members 2231' may be positioned within the housing.

The example contact member 2231' shown includes a base 2232' that is configured to be positioned within a slot 2214' defined by an adapter 2210'. The base 2232' of certain types of contact members 2231' is configured to secure (e.g., snap-fit, latch, pressure-fit, etc.) to the adapter 1210. First and second legs 2241', 2242' extend from the base 2232'. A first arm 2234' extends from the first leg 2241' and defines a first moveable contact location 2235' between the two legs 2241', 2242' (e.g., at a distal end of the arm 2234').

Figure 79:
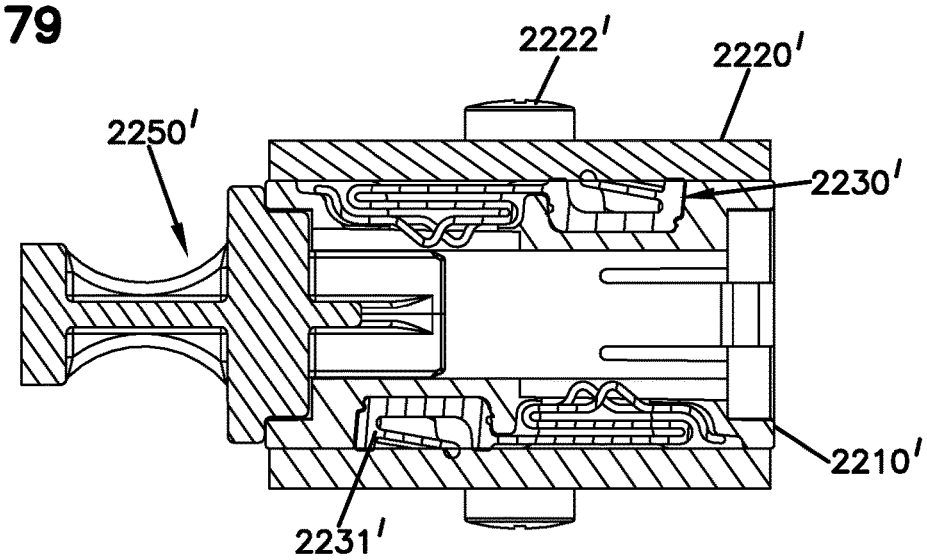

At least the first moveable contact location 2235' is aligned and configured to extend outwardly of the adapter housing 2210' through the slots 2214' to touch a first contact pad on the corresponding circuit board 2220' (e.g., see FIG. 79). The ability of the first arm to flex relative to the legs 2241', 2242' provides tolerance for placement of the contact member 2231' relative to the circuit board 2220'. In certain implementations, each of the legs 2241', 2242' defines a stationary contact location 2233' that also touches the first contact pad on the circuit board 2220'. In one implementation, the stationary contacts 2233' and first moveable contact 2235' provide grounding of the contact member 2231'.

A second arm 2236' extends from the second leg 2242' to define a resilient section 2237', a second moveable contact location 2238', and a third moveable contact location 2239'. In one implementation, the second contact location 2238' defines a trough located on the second leg 2234' between the resilient section 2237' and the third contact location 2239'. The resilient section 2237' is configured to bias the second contact location 2238' towards the channel 2218' (e.g., see FIGS. 68 and 69). In the example shown, the resilient section 2237' is implemented as a looped/bent section of the second arm 2236'. In other implementations, the second arm 2236' can otherwise include springs, reduced width sections, or portions formed from more resilient materials.

The third contact location 2239' is configured to be positioned initially within the slot 2214'. The resilient section 2237' is configured to bias the third contact location 2239' through the slot 2214' to an exterior of the housing 2210' when a connector arrangement 2100' or other media segment pushes against the second contact location 2238'. For example, inserting an MPO connector 2110' into a connection end of a passage 2215' of an MPO adapter 2210' would cause the storage section 2115' of the connector 2110' to slide through the channel 2218' and to engage the second contact location 2238' of each contact member 2231' associated with that connection end of the passage 2215'. The storage section 2115' would push outwardly on the second contact location 2238', which would push the third contact location 2239' through the slots 2214' and toward the printed circuit board 2220' mounted to the adapter 2210' adjacent the slots 2214 (see FIG. 79).

As discussed above, a processor (e.g., processor 217 of FIG. 2) or other such equipment also can be electrically coupled to the printed circuit board 2220'. Accordingly, the processor can communicate with the memory circuitry on the storage device 2130' via the contact members 2231' and the printed circuit board 2220. In accordance with some aspects, the processor is configured to obtain physical layer information from the storage device 2130'. In accordance with other aspects, the processor is configured to write (e.g., new or revised) physical layer information to the storage device 2130'. In accordance with other aspects, the processor is configured to delete physical layer information to the storage device 2130'. In one example implementation, at least a first contact member 2231' transfers power, at least a second contact member 2231' transfers data, and at least a third contact member 2231' provide grounding. However, any suitable number of contact members 2231' can be utilized within each media reading interface 2230'.

In accordance with some aspects, the contact members 2231' are configured to selectively form a complete circuit with one or more of the printed circuit boards 2220'. For example, each printed circuit board 2220' may include two contact pads for each contact member. In certain implementations, a first portion of each contact member 2231' touches a first of the contact pads and a second portion of each contact member 2231' selectively touches a second of the contact pads. The processor coupled to the circuit board 2220' may determine when the circuit is complete. Accordingly, the contact members 2231' can function as presence detection sensors for determining whether a media segment has been inserted into the passages 2215'.

In certain implementations, the first moveable contact 2235' of each contact member is configured to contact one of the contact pads of the circuit board 2220'. In one implementation, the first moveable contact location 2235' is configured to permanently touch the contact pad as long as the circuit board 2220' and contact member 2231' are assembled on the adapter 2210'. The third contact location 2239' of certain types of contact members 2231' is configured to touch a second contact pad of the printed circuit board 2220' only when a segment of physical communications media (e.g., an MPO connector 2110') is inserted within an adapter passage 2215' and pushes the second contact location 2238' out of the channel 2218, which pushes the third contact location 2239' through the slot 2214' and against the circuit board 2220'. In accordance with other aspects, the contact members 2231' are configured to form a complete circuit with the printed circuit board 2220' regardless of whether a media segment is received in the passage 2215'.

Referring to FIGS. 71-79, dust caps 2250' can be used to protect passages 2215' of the adapter housings 2210' when fiber optic connectors 2110' or other physical media segments are not received within the passages 2215'. For example, a dust cap 2250' can be configured to fit within a front entrance or a rear entrance of each adapter passage 2215'. The dust caps 2250' are configured to inhibit the ingress of dust, dirt, or other contaminants into the passage 2215'. In accordance with some implementations, the dust caps 2250' are configured not to trigger the presence sensor/switch of the adapter 2210'.

FIGS. 72-77 show one example implementation of an adapter dust cap 2250'. The example dust cap 2250' includes a cover 2251' configured to fit over a mouth of the passage 2215'. A handle including a stem 2253' and grip 2254' extend outwardly from a first side of the cover 2251'. The handle facilitates insertion and withdrawal of the dust cap 2250' from the passage 2215'. In the example shown, an outer side of the grip 2254' is generally flat. In other embodiments, the grip 2254' can be contoured, textured, or otherwise non-planar.

A retaining section 2252' extends outwardly from a second side of the cover 2251'. The retaining section 2252' defines a concave contour 2256' extending between two fingers 2258'. One or both fingers 2258' include lugs 2255' that are configured to interact with the flexible tabs 2219' of the adapter housing 2210' to retain the dust cap 2250' within the passage 2215'. In the example shown, each lug 2255' defines a ramped surface.

In some implementations, the retaining section 2252' is configured to fit within the passage 2215' without pressing against the second contact location 2238' of each contact member 2231' of the first media reading interface 2230' (see FIG. 79). In the example shown, the retaining section 2252' defines a sufficiently concave contour to accommodate the second contact location 2238' of each contact member 2231'. Insertion of the dust cap 2250' within the passage 2215' does not cause the third contact location 2239' to press against the first printed circuit board 2220A'. Accordingly, insertion of the dust cap 2250' does not trigger the presence detection sensor/switch.

FIG. 79 shows a cross-sectional view of an MPO adapter housing 2210' sandwiched between a first printed circuit board 2220A' and a second printed circuit board 2220B'. The MPO adapter housing 2210' defines a passage 2215', a channel 2218' extending inwardly from each connection end of the passage 2215', and slots 2214' extending through opposing ends 2212' of the housing 2210'. A first media reading interface 2230A' is positioned in the first channel 2218' and interacts with the first printed circuit board 2220A'. A second media reading interface 2230B' is positioned in the second channel 2218' and interacts with the second printed circuit board 2220B'.

FIGS. 80-102 illustrate a fifth example implementation of a connector system 3000 that can be utilized on a connector assembly (e.g., a communications panel) having PLI functionality as well as PLM functionality. One example connector assembly on which the connector system 3000 can be implemented is a bladed chassis. The connector system 3000 includes at least one example communications coupler assembly 3200 and at least two connector arrangements 3100.

The communications coupler assembly 3200 is configured to be mounted to a connector assembly, such as a communications blade or a communications panel. One or more connector arrangements 3100, which terminate segments 3010 of communications media, are configured to communicatively couple to other segments of physical communications media at the coupler assembly 3200 (e.g., see FIGS. 91-92).

Accordingly, communications data signals carried by a media segment 3010 terminated by a first connector arrangement 3100 can be propagated to another media segment 3010 (e.g., terminated by a second connector arrangement 3100) through the communications coupler assembly 3200.

In accordance with some aspects, each connector arrangement 3100 is configured to terminate a single segment of physical communications media. For example, each connector arrangement 3100 can include a single connector 3110 that terminates a single optical fiber or a single electrical conductor. In one example implementation, each connector arrangement 3100 includes a single LC-type fiber optic connector 3110 that terminates a single optical fiber. In accordance with other aspects, each connector arrangement 3100 includes two or more connectors 3110, each of which terminates a single segment of physical communications media. For example, each connector arrangement 3100 may defines a duplex fiber optic connector arrangement including two connectors 3110, each of which terminates an optical fiber 3010. In other implementations, the connectors 3110 can be an SC-type, an ST-type, an FC-type, an LX.5-type, etc.

In accordance with still other aspects, each connector arrangement 3100 can include one or more connectors, each of which terminates a plurality of physical media segments (e.g., see connector arrangement 2100, 2100', and 5100 of FIGS. 31, 59, and 133). In one example implementation, each connector arrangement includes a single MPO-type fiber optic connector that terminates multiple optical fibers. In still other systems, other types of connector arrangements (e.g., electrical connector arrangements) can be secured to the communications coupler assembly 3200 or to a different type of connector assembly.

In accordance with some aspects, each communications coupler assembly 3200 is configured to form a single link between segments of physical communications media 3010. For example, each communications coupler assembly 3200 can define a single passage at which a first connector arrangement is coupled to a second connector arrangement. In accordance with other aspects, however, each communications coupler assembly 3200 is configured to form two or more links between segments of physical communications media. For example, in the example shown in FIG. 80, the communications coupler assembly 3200 defines four passages 3215.

In some implementations, each passage 3215 of the communications coupler assembly 3200 is configured to form a single link between first and second connector arrangements 3100. In other example implementations, two or more passages 3215 can form a single link between connector arrangements 3100 (e.g., two ports can form a link between duplex connector arrangements). In still other example implementations, each communications coupler assembly 3200 can form a one-to-many link. For example, the communications coupler assembly 3200 can connect a duplex connector arrangement to two single connector arrangements.

Example implementations of connector arrangements 3100 are shown in FIGS. 81-88. Each of the connector arrangements 3100 includes one or more fiber optic connectors 3110, each of which terminates one or more optical fibers 3010. In the example shown in FIGS. 80-82, each connector arrangement 3100 defines a duplex fiber optic connector arrangement including two fiber optic connectors 3110 held together using a clip 3150. In another example implementation, a connector arrangement 3100 can define a single fiber optic connector 3110.

Figure 82:
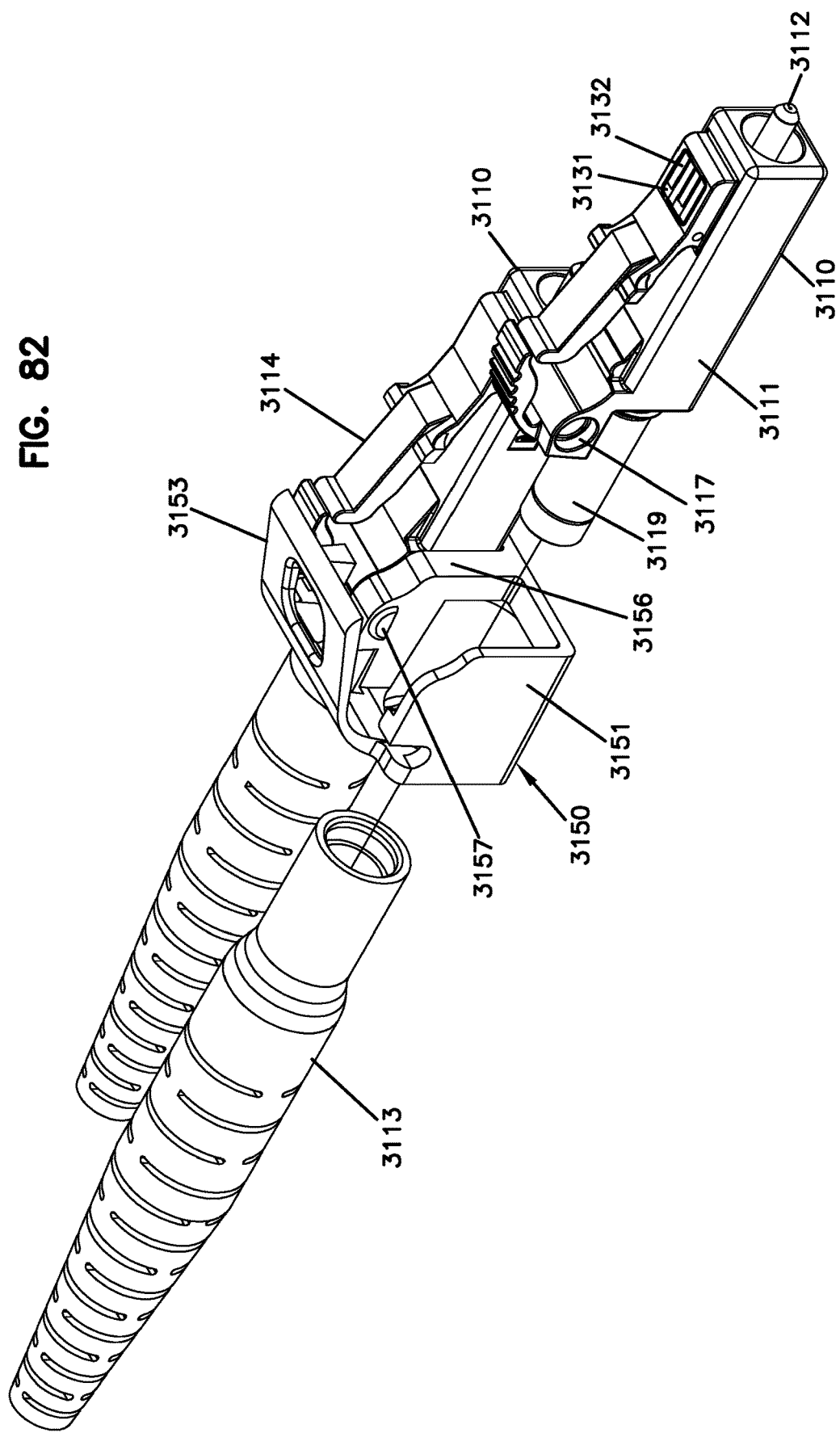

As shown in FIG. 82, each fiber optic connector 3110 includes a connector body 3111 protecting a ferrule 3112 that retains an optical fiber 3010. The connector body 3111 is secured to a boot 3113 for providing bend protection to the optical fiber 3010. In the example shown, the connector 3110 is an LC-type fiber optic connector. The connector body 3111 includes a fastening member (e.g., clip arm) 3114 that facilitates retaining the fiber optic connector 3110 within a passage 3215 in the communications coupler assembly 3200. The connector body 3111 also defines a through hole (or opposing depressions) 3117 to facilitate maintaining the body 3111 within the clip 3150 (e.g., see FIG. 82).

Figure 80:
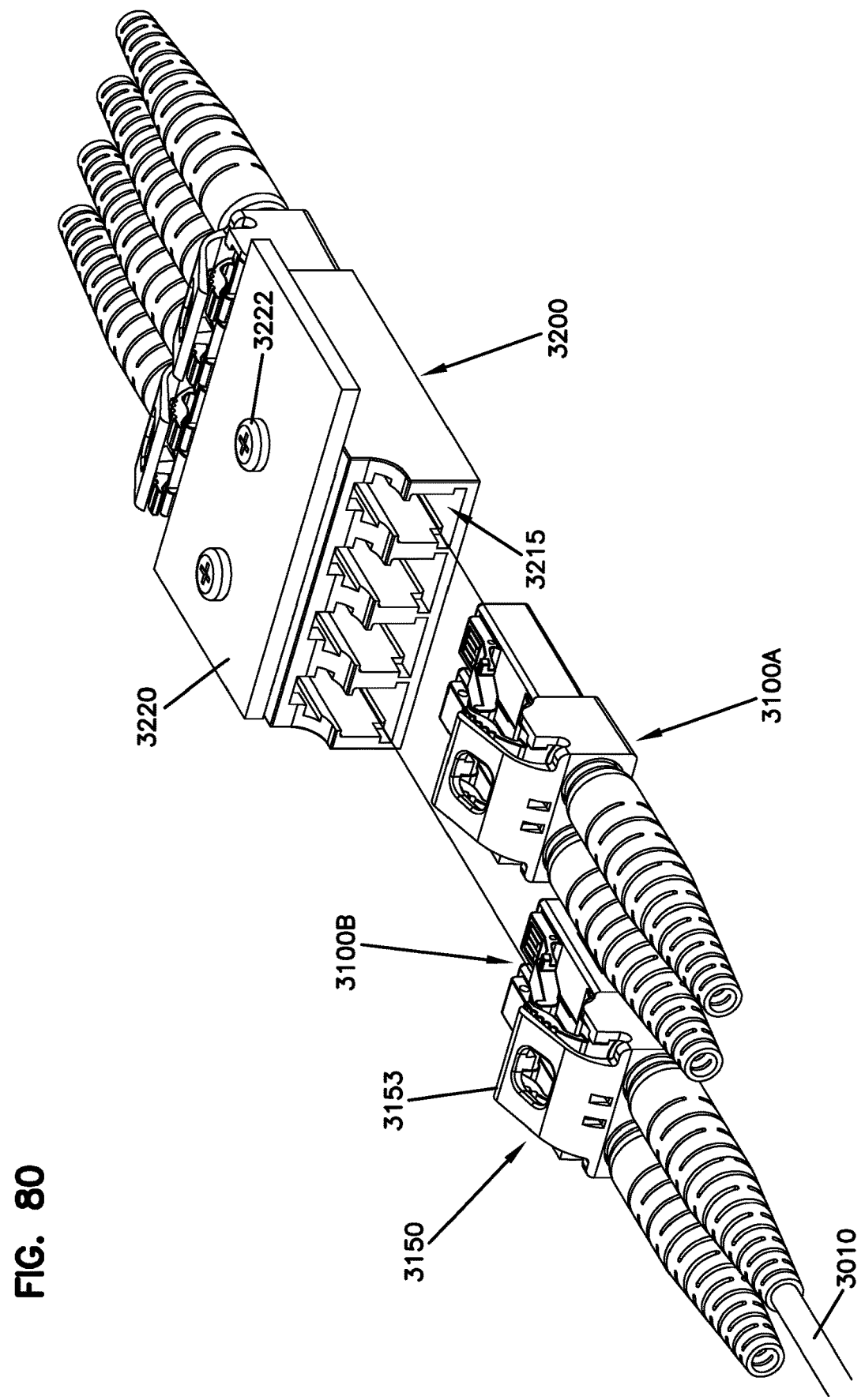
Figure 81:
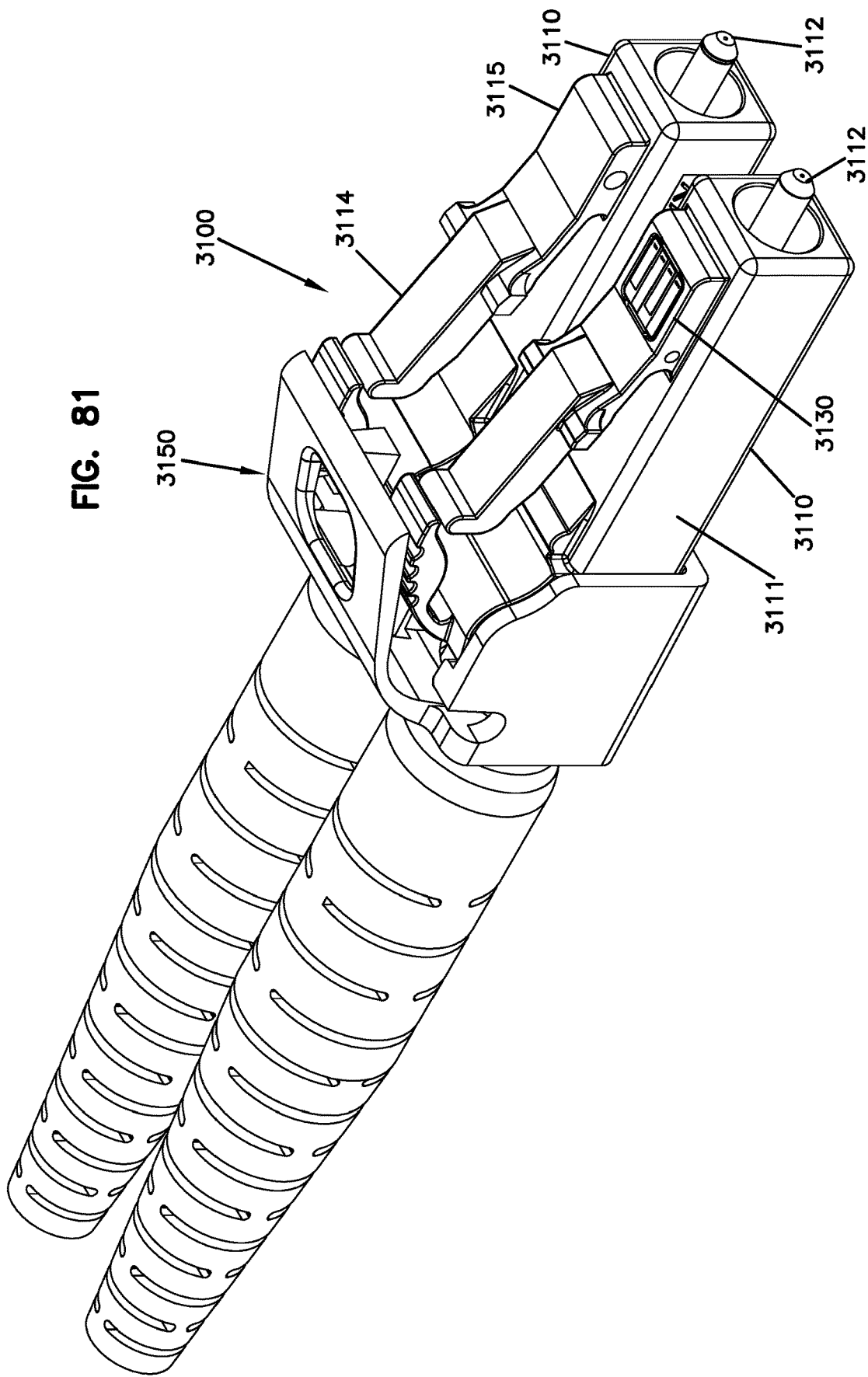

One example clip 3150 is shown in FIGS. 80 and 82. The clip 3150 includes a body 3151 that defines openings or channels 3152 through which portions 3119 of the fiber optic connector bodies 3111 can extend (see FIG. 82). In the example shown, the clip 3150 has a monolithic body 3151 defining two channels 3152 separated by an interior wall 3156. Lugs 3157 are positioned on the inner surfaces of the exterior walls of the body 3151 and on both sides of the interior wall 3156. The lugs 3157 are configured to engage cavities/depressions 3117 defined in the fiber optic connector bodies 3111 to secure the connector bodies 3111 within the clip body 3151. A flange 3153 curves upwardly and forwardly to extend over the fastening members 3114 of the connectors 3110 (see FIG. 81). The flange 3153 is sufficiently flexible to enable the application of pressure on the clip arms 3114 of the connectors 3110 by pressing on a distal end of the flange 3153.

Each connector arrangement 3100 is configured to store physical layer information. For example, a storage device 3130 may be installed on or in the body 3111 of one or more of the fiber optic connectors 3110 of each connector arrangement 3100. In the example shown, the storage device 3130 is installed on only one fiber optic connector 3110 of a duplex connector arrangement 3100. In other implementations, however, a storage device 3130 may be installed on each fiber optic connector 3110 of a connector arrangement 3100.

One example storage device 3130 includes a printed circuit board 3131 on which memory circuitry can be arranged (see FIG. 82). Electrical contacts 3132 also are arranged on the printed circuit board 3131 for interaction with a media reading interface of the communications coupler assembly 3200 (described in more detail herein). In one example implementation, the storage device 3130 includes an EEPROM circuit 3133 arranged on the printed circuit board 3131. In the example shown in FIG. 82, an EEPROM circuit 3133 is arranged on the non-visible side of the circuit board 3131. In other implementations, however, the storage device 3130 can include any suitable type of non-volatile memory.

Figure 83:
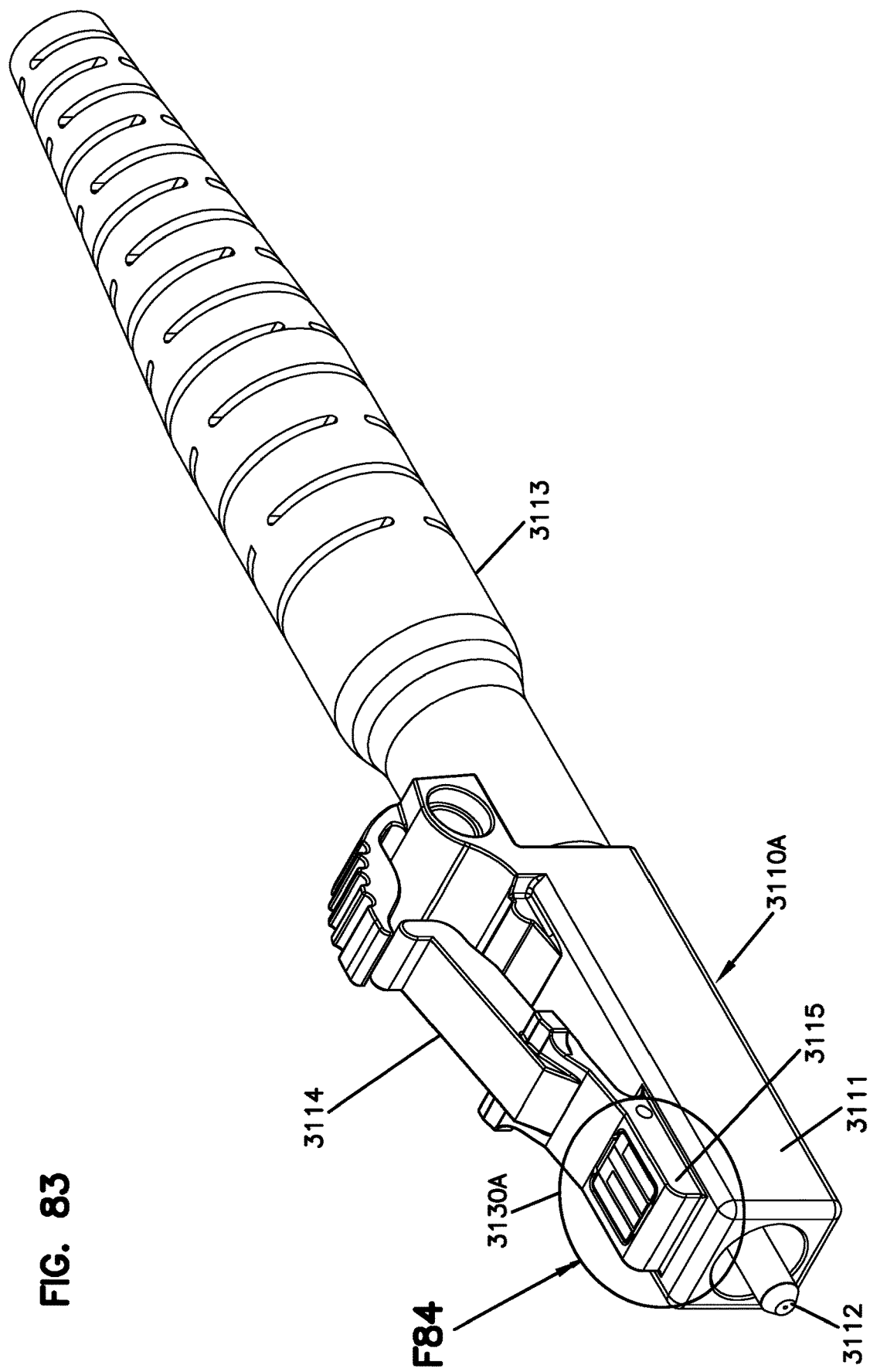
Figure 84:
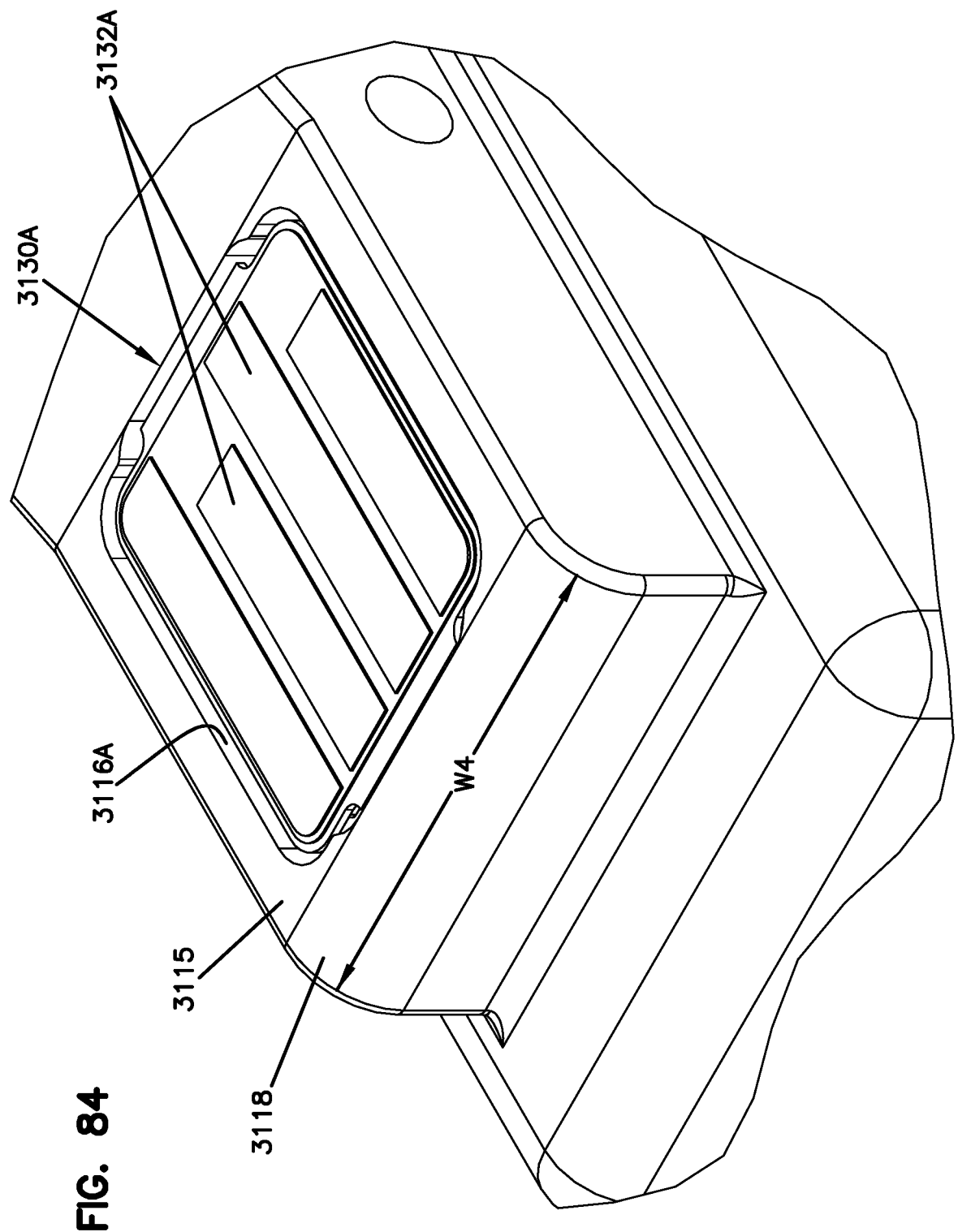

FIGS. 83-88 show three different implementations of an example storage device 3130 installed on an example connector 3110. FIGS. 83 and 84 show a first example connector 3110A that includes a key 3115 having a width W4. The key 3115 has a front surface 3118 against which contacts within the communications coupler assembly 3200 deflect during insertion of the connector 3110 as will be described in more detail herein. In the example shown, the deflection surface 3118 defines a bullnose. In other implementations, the deflection surface 3118 may define any suitable shape. The key 3115 also defines a recessed section or cavity 3116A in which a storage device 3130A can be positioned. In the example shown in FIG. 84, the cavity 3116A is defined in the key 3115 and not the deflecting surface 3118. In some implementations, a cover can be positioned over the storage device 3130A to enclose the storage device 3130A within the connector 3111. In other implementations, the storage device 3130A is left exposed.

The storage device 3130A shown in FIG. 84 includes generally planar contacts 3132A positioned on a generally planar circuit board 3131A. In the example shown, the contacts 3132A have two different lengths. In other implementations, however, the contacts 3132A may all be the same length or may each be a different length. The memory 3133 of the storage device 3130A, which is located on the non-visible side of the board in FIG. 84, is accessed by engaging the tops of the contacts 3132A with an electrically conductive contact member (e.g., contact member 3231 of FIG. 96). In certain implementations, the contact member 3231 initially contacts the deflecting surface 3118 and subsequently slides or wipes across the contacts 3132A.

Figure 85:
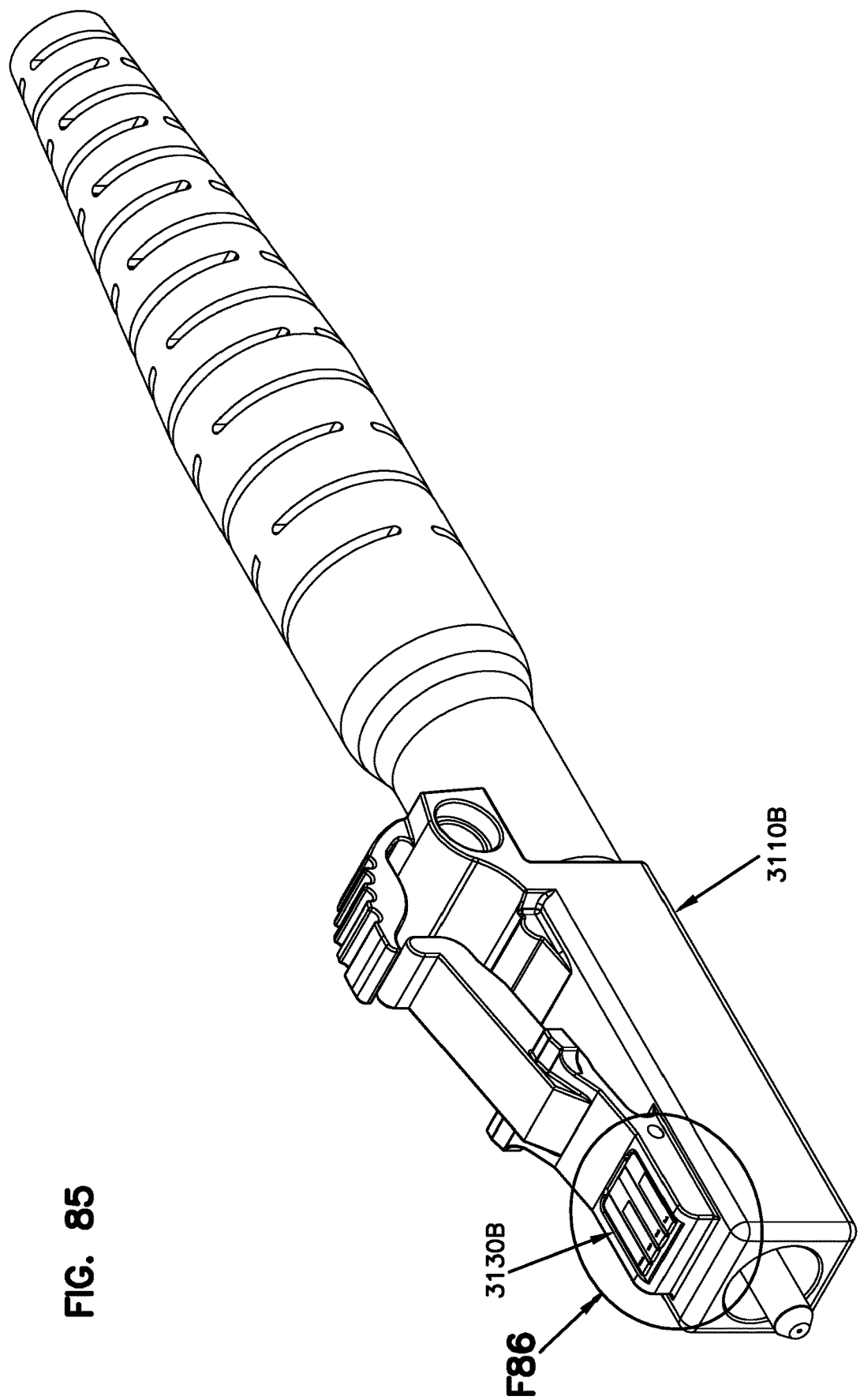
Figure 86:
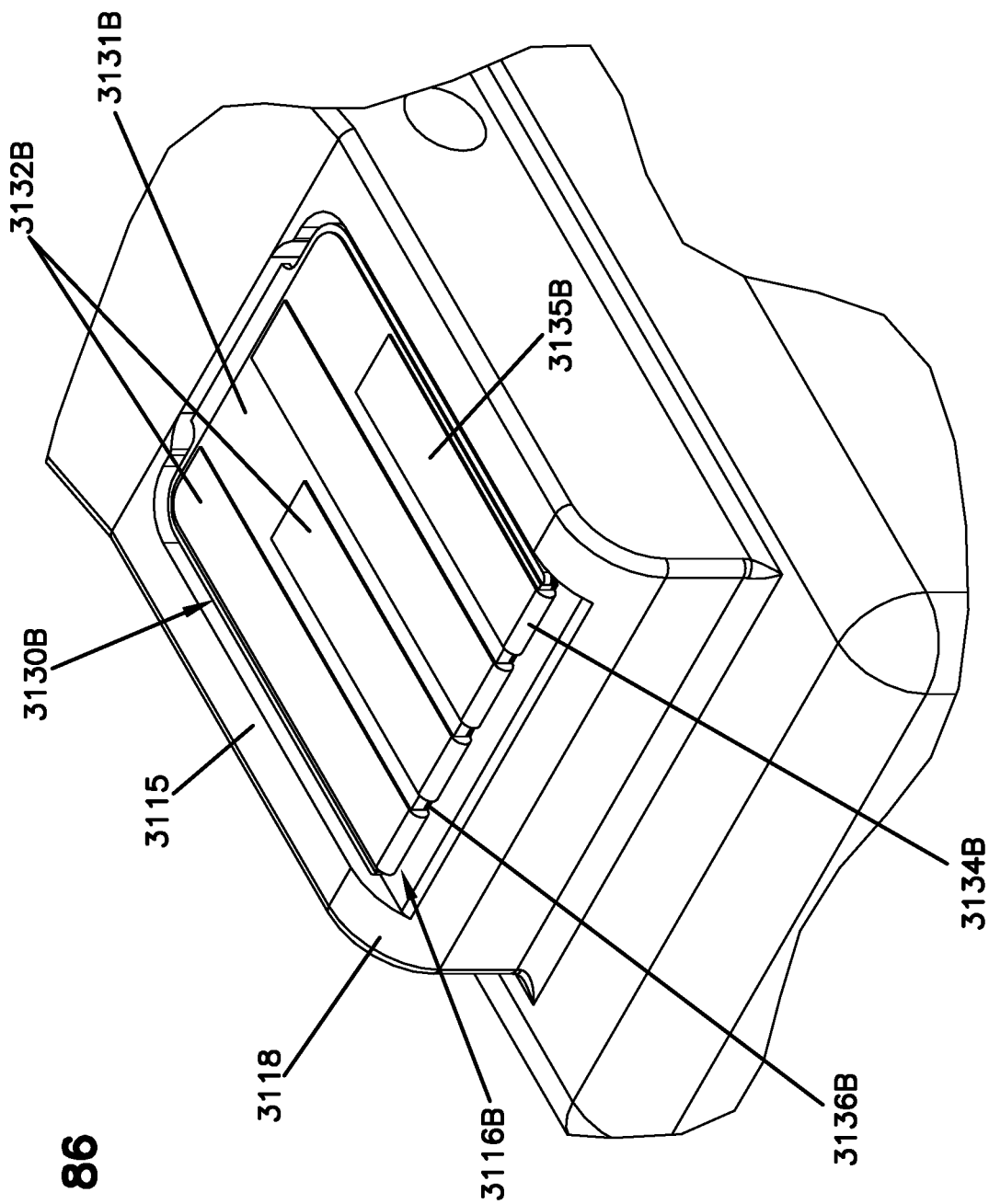

FIGS. 85 and 86 show a second example connector 3110B that includes a key 3115 having a deflection surface 3118. The key 3115 defines a recessed section or cavity 3116B in which a storage device 3130B can be positioned. In the example shown, the cavity 3116B cuts into the deflecting surface 3118 of the key 3115. In some implementations, a cover can be positioned over the storage device 3130B to enclose the storage device 3130B within the connector 3111. In other implementations, the storage device 3130B is left exposed.

The storage device 3130B shown in FIG. 86 includes contacts 3132B having elongated sections 3135B that extend over a generally planar circuit board 3131B and folded sections 3134B that curve, fold, or bend over a front end 3136B of the board 3131B. In the example shown, the elongated sections 3135 of the contacts 3132B have two different lengths. In other implementations, however, the elongated sections 3135 of the contacts 3132B may all be the same length or may each be a different length. The memory 3133 of the storage device 3130B, which is located on the non-visible side of the board in FIG. 86, is accessed by sliding or wiping the contact member 3231 (FIG. 96) across the folded sections 3134 of the contacts 3132B.

Figure 87:
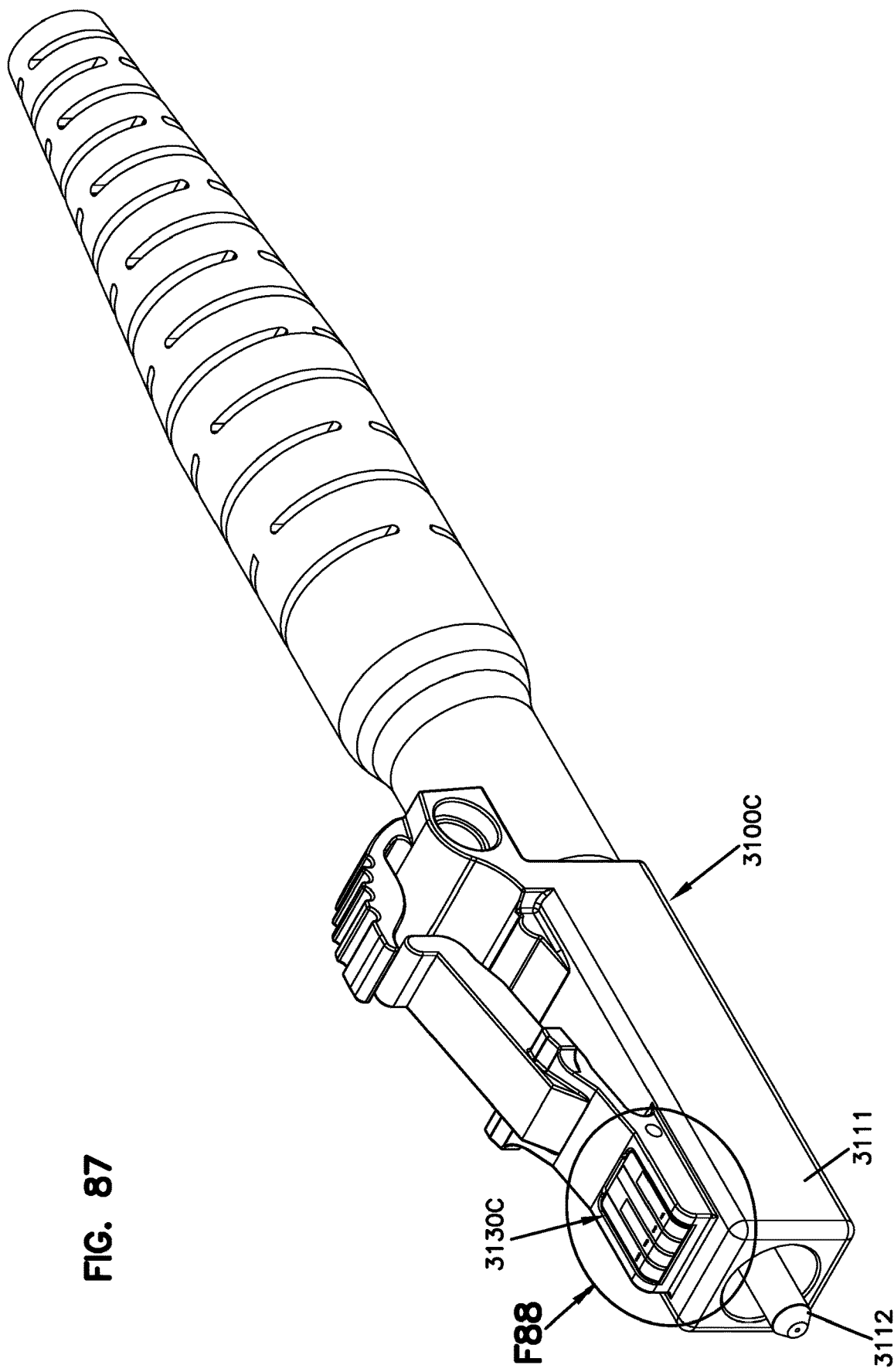
Figure 88:
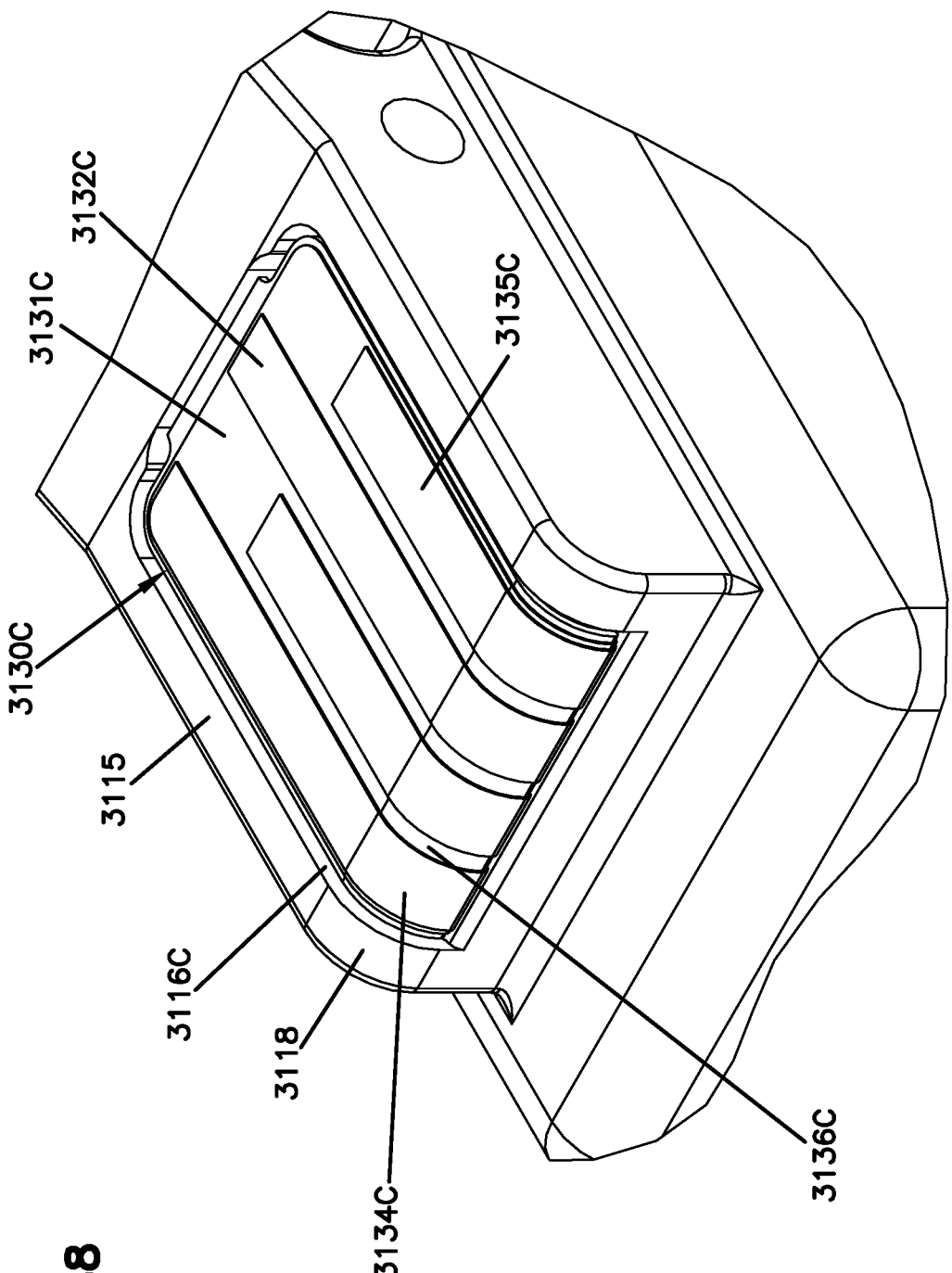

FIGS. 87 and 88 show a third example connector 3110C that includes a key 3115 having a deflection wall 3118. The key 3115 defines a recessed section or cavity 3116C in which a storage device 3130C can be positioned. In the example shown, the cavity 3116C cuts into the deflection wall 3118 of the key 3115. In some implementations, a cover can be positioned over the storage device 3130C to enclose the storage device 3130C within the connector 3111. In other implementations, the storage device 3130C is left exposed.

The storage device 3130C shown in FIG. 88 includes contacts 3132C having first sections 3135C that extend over a generally planar circuit board 3131C and contoured sections 3134C that curve, fold, or bend over a contoured section 3136 at the front of the board 3131C. In the example shown, the first sections 3135C of the contacts 3132C have two different lengths. In other implementations, however, the first sections 3135C of the contacts 3132C may all be the same length or may each be a different length. The memory of the storage device 3130C, which is located on the non-visible side of the board in FIG. 88, is accessed by sliding or wiping the contact member 3231 (FIG. 96) across the contoured section 3134C of the contacts 3132C.

FIGS. 89-94 show one example implementation of a communications coupler assembly 3200 implemented as a fiber optic adapter. The example communications coupler assembly 3200 includes an adapter housing 3210 defining one or more passages 3215 configured to align and interface two or more fiber optic connectors 3110 (e.g., see FIG. 80). In other example implementations, however, one or more passages 3215 can be configured to communicatively couple together a fiber optic connector 3110 with a media converter (not shown) to convert the optical data signals into electrical data signals, wireless data signals, or other such data signals. In other implementations, however, the communications coupler assembly 3200 can include an electrical termination block that is configured to receive punch-down wires, electrical plugs (e.g., for electrical jacks), or other types of electrical connectors.

The example adapter housing 3210 shown in FIGS. 89-95 is formed from opposing sides 3211 interconnected by first and second ends 3212. The sides 3211 and ends 3212 each extend between a front and a rear. The adapter housing 3210 defines one or more passages 3215 extending between the front and rear ends. Each end of each passage 3215 is configured to receive a connector arrangement or portion thereof (e.g., one fiber optic connector 3110 of duplex connector arrangement 3100 of FIG. 80). In the example shown, the adapter housing 3210 defines four passages 3215. In other implementations, however, the adapter housing 3210 may define one, two, three, six, eight, ten, twelve, sixteen, or even more ports. Sleeves (e.g., split sleeves) 3206 are positioned within the passages 3215 to receive and align the ferrules 3112 of fiber optic connectors 3110 (see FIG. 93).

In the example shown, the body 3210 of the fiber optic adapter 3200 defines four passages 3215. In other implementations, the body 3210 can define greater or fewer passages 3215. For example, in some example implementations, the body 3210 of the fiber optic adapter 3200 can define a single passage 3215 that is configured to optically couple together two fiber optic connectors 3110. In other example implementations, the fiber optic adapter 3200 can define two, eight, or twelve passages 3215 that are each configured to optically couple together two fiber optic connectors 3110. In certain implementations, the adapter housing 3210 also defines latch engagement channels 3217 at each port to facilitate retention of the latch arms 3114 of the fiber optic connectors 3110. Each latch engagement channel 3217 is sized and shaped to receive the key 3115 of the connector 3110.

The fiber optic adapter 3210 includes one or more media reading interfaces 3230, each configured to acquire the physical layer information from the storage device 3130 of a fiber optic connector 3110 plugged into the fiber optic adapter 3210. For example, in one implementation, the adapter 3210 can include a media reading interface 3230 associated with each passage 3215. In another implementation, the adapter 3210 can include a media reading interface 3230 associated with each connection end of each passage 3215. In still other implementations, the adapter 3210 can include a media reading interface 3230 associated with each set of passages 3215 that accommodate a connector arrangement 3100.

For example, the quadruplex adapter 3210 shown in FIG. 91 includes a media reading interface 3230A at the front connection end of two passages 3215 to interface with two duplex fiber optic connector arrangements 3100 received thereat and two media reading interfaces 3230B at the rear connection end of two passages 3215 to interface with two duplex fiber optic connector arrangements 3100 received thereat. In another implementation, one side of the adapter housing 3210 can include two media reading interfaces 3230 to interface with two duplex fiber optic connector arrangements 1100 and another side of the adapter housing 3210 can include four media reading interfaces to interface with four fiber optic connectors 3110. In other implementations, the adapter housing 3210 can include any desired combination of front and rear media reading interfaces 3230.

Figure 96:
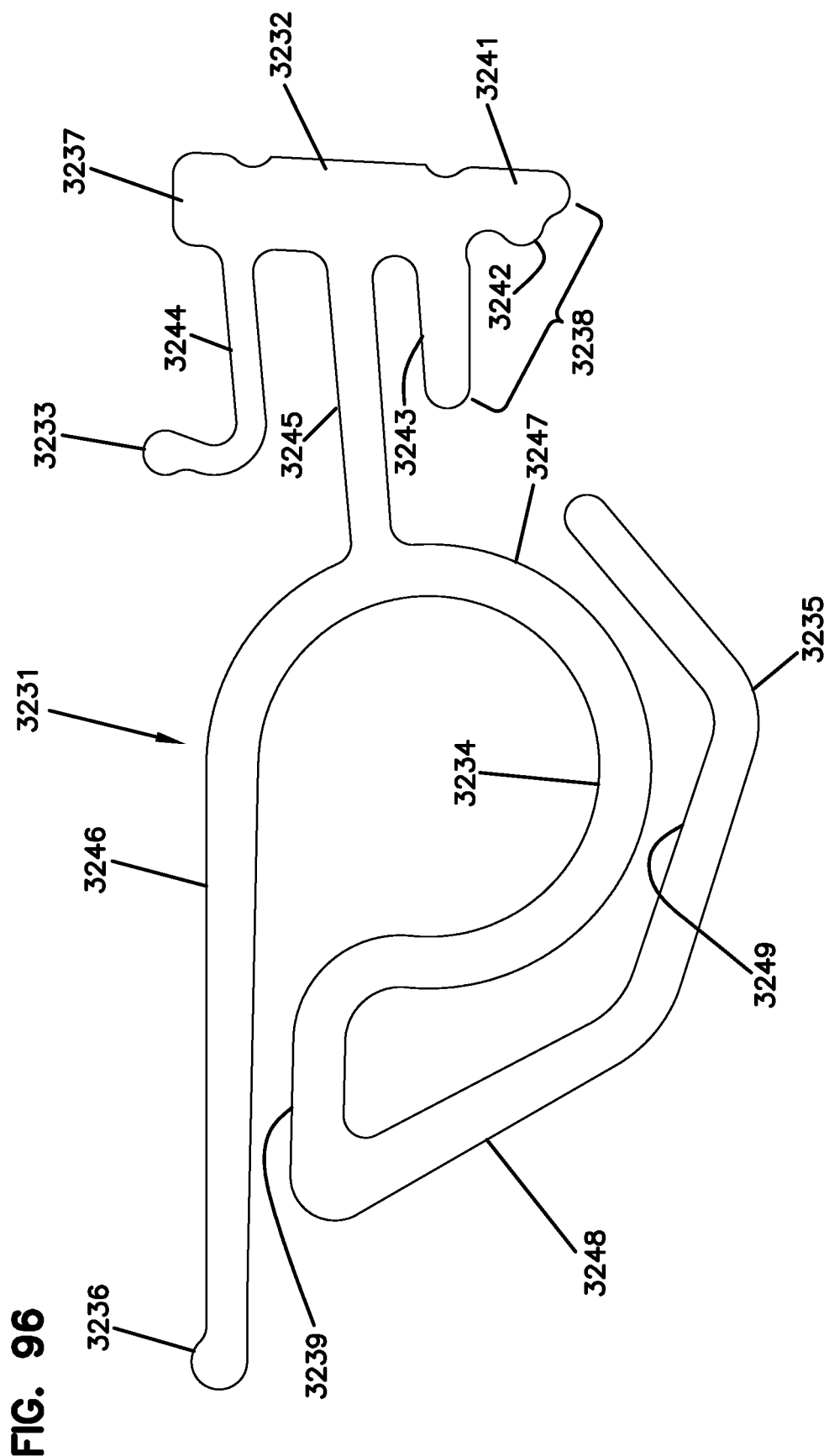
Figure 97:
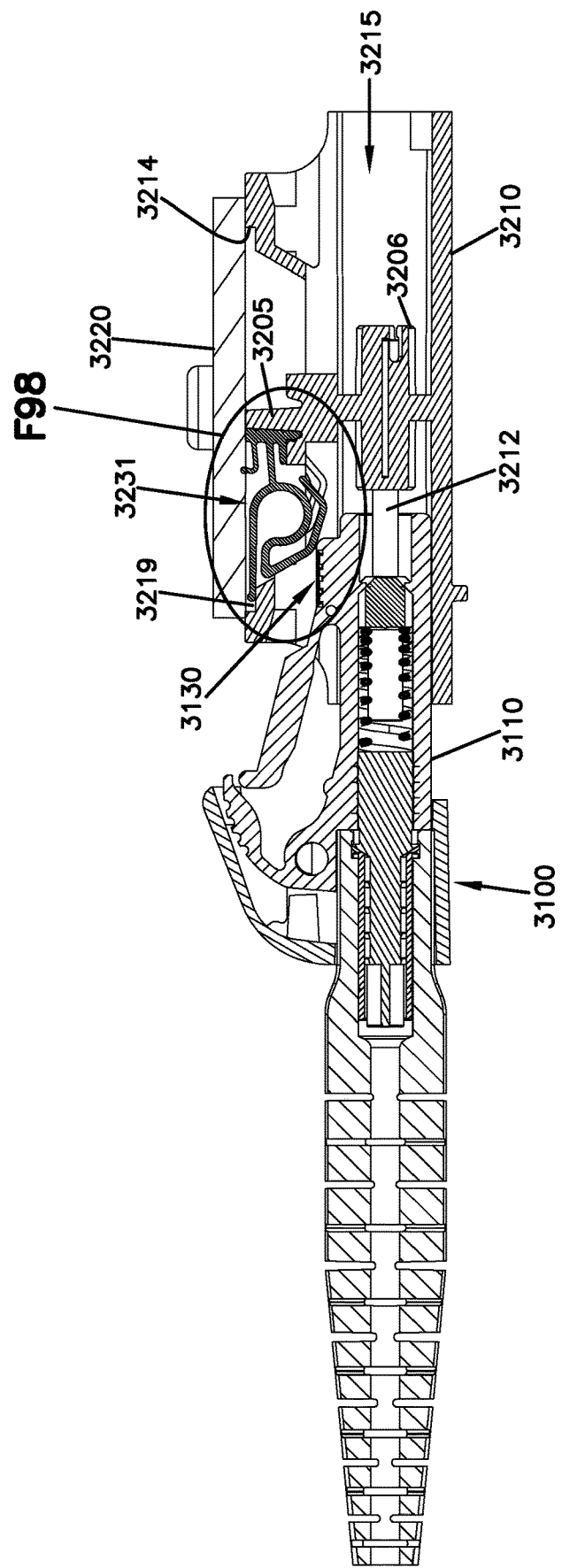

In general, each media reading interface 3230 is formed from one or more contact members 3231 (see FIG. 96). In certain implementations, a top surface of the coupler housing 3210 defines slots 3214 configured to receive one or more contact members 3231. When a connector 3110 with a storage device 3130 is inserted into one of the passages 3215, the contact pads 3132 of the storage device 3130 are configured to align with the slots 3214 defined in the adapter housing 3210. Accordingly, the contact members 3231 held within the slots 3214 align with the contact pads 3132.

At least a portion of each slot 3214 extends through the top surface to the passage 3215. In the example shown in FIG. 93, the top surface has a thickness (material height) H. In some implementations, the thickness H of the top surface is at least about 0.5 mm (about 0.02 inches). Indeed, in some implementations, the thickness H of the top surface is at least about 0.76 mm (about 0.3 inches). In certain implementations, the thickness H of the top surface is about to 0.5 mm to about 2 mm (about 0.02 to about 0.08 inches). Indeed, in certain implementations, the thickness H of the top surface is about 1 mm to about 1.5 mm (0.04 inches to about 0.06 inches). In one example implementation, the thickness H of the top surface is about 1 mm (0.04 inches). In certain implementations, the thickness H of the top surface is at least 1.27 mm (0.05 inches).

In some implementations, the media reading interface 3230 includes multiple contact members 3231. For example, in certain implementations, the media reading interface 3230 includes at least a first contact member 3231 that transfers power, at least a second contact member 3231 that transfers data, and at least a third contact member 3231 that provides grounding. In one implementation, the media reading interface 3230 includes a fourth contact member. In other implementations, the media reading interface 3230 include greater or fewer contact members 3231.

Figure 93:
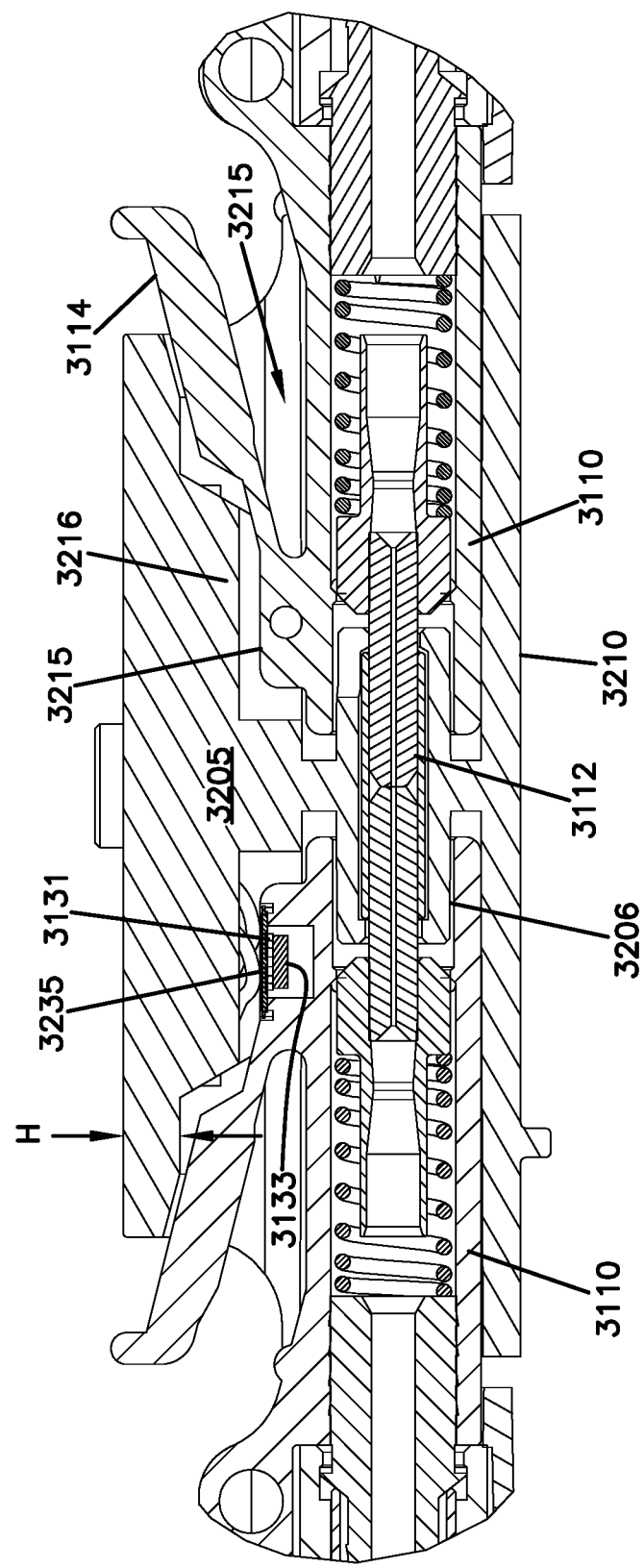
Figure 94:
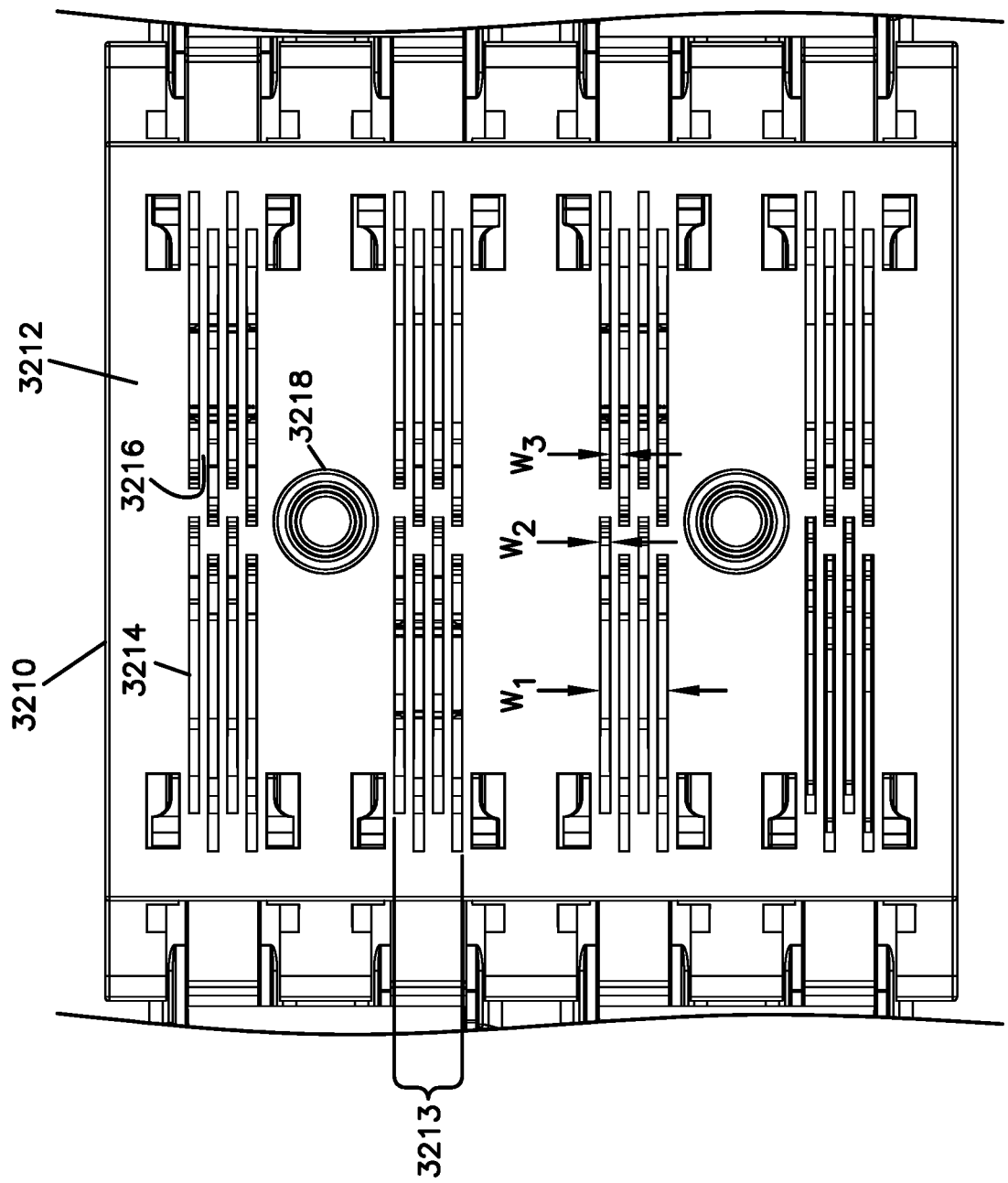

In some implementations, each contact member 3231 is retained within a separate slot 3214. For example, in the implementation shown in FIGS. 89-95, each media reading interface 3230 includes four contact members 3231 that are held in a set 3213 of four slots 3214 that align with four contact pads 3132 (see FIG. 84) on a connector storage device 3130. The slots 3214 in each set 3213 are separated by intermediate walls 3216 (FIGS. 92 and 94). In other implementations, each contact member 3231 in a single media reading interface 3230 may be retained in a single slot.

In some implementations, the adapter housing 3210 has more sets 3213 of slots 3214 than media reading interfaces 3230. For example, in some implementations, each adapter housing 3210 defines a set 3213 of slots 3214 at each connection end of each passage 3215. In other implementations, however, the adapter housing 3210 may have the same number of slot sets 3213 and media reading interfaces 3231. For example, in certain implementations, each adapter housing 3210 may defines a set 3213 of slots 3214 at only one connection end of each passage 3215. In other implementations, the adapter housing 3210 may define a set 3213 of slots 3214 at each connection end of alternate passages 3215.

In some implementations, the contact members 3231 of a single media reading interface 3230 are positioned in a staggered configuration. Such a staggered configuration may facilitate alignment of the contact members 3231 with staggered contact pads 3132 (see FIG. 84) of a connector storage device 3130 positioned in the respective passage 3215. In some implementations, the slots 3214 accommodating the staggered contact members 3231 also are staggered. For example, as shown in FIGS. 91-92, alternating slots 3214 can be staggered in a front to rear direction. In other implementations, however, the slots 3214 accommodating the staggered contacts 3231 may each have a common length that is longer than a length of the staggered arrangement of contact members 3231. In still other implementations, the front and rear ends of the contact members 3231 of a single media reading interface 3230 are transversely aligned within similarly transversely aligned slots 3214.

In the example shown in FIG. 91, the slots 3214 defined at front connection ends of the adapter passages 3215 axially align with slots 3214 defined at the rear connection ends. In other implementations, however, the slots 3214 at the front connection ends may be staggered from the slots 3214 at the rear connection ends. As shown in FIGS. 92 and 93, at least one support wall 3205 separates the forward slots 3214 from the rearward slots 3214. Each support wall 3205 extends from the slotted surface of the adapter housing 3210 to at least the split sleeve 3206.

In some implementations, a single support wall 3205 extends along a center of the adapter housing 3210 transverse to the insertion axis $A_1$ (FIG. 89) of the passages 3215. For example, a single support wall 3205 may extend through an adapter housing 3210 that defines transversely aligned slots 3214. In other implementations, one or more support walls 3205 may extend between slots 3214 arranged in a staggered configuration. In the example shown, adjacent support walls 3205 are offset from each other along an insertion axis of the passages 3215 to accommodate the staggered slots 3214 arrangements. In certain implementations, the support walls 3205 may connect to or be continuous with the intermediate walls 3216.

As shown in FIG. 94, each set 3213 of slots 3214 accommodating one media reading interface 3230 has a width W1 and each slot 3214 has a width W2. Intermediate walls 3216, which separate the slots 3214 of each set 3213, each have a width W3. In general, the width W1 of each set 3213 of slots 3214 is smaller than the width W4 of the key 3115 of the connector 3110 positioned in the respective adapter passage 3215. In some implementations, the width W1 of each set 3213 of slots 3214 is less than 3.35 mm (0.13 inches). Indeed, in some implementations, the width W1 of each set 3213 of slots 3214 is less than about 3.1 mm (0.12 inches). In certain implementations, the width W1 of each set 3213 of slots 3214 is no more than about 2.5 mm (0.10 inches). In one example implementation, the width W1 of each set 3213 of slots 3214 is no more than about 2.2 mm (0.09 inches). In one example implementation, the width W1 of each set 3213 of slots 3214 is about 2 mm (0.08 inches). In one example implementation, the width W1 of each set 3213 of slots 3214 is about 2.1 mm (0.081 inches).

In certain implementations, the width W3 of the intermediate walls 3216 is smaller than the width W2 of the slots 3214. In some implementations, the width W2 of each slot 3214 is within the range of about 0.25 mm (0.010 inches) to about 0.64 mm (0.025 inches). Indeed, in some implementations, the width W2 of each slot 3214 is within the range of about 0.25 mm (0.010 inches) to about 0.48 mm (0.019 inches). In one implementation, the width W2 of each slot is about 0.3 mm (0.012 inches). In one implementation, the width W2 of each slot is about 0.28 mm (0.011 inches). In one implementation, the width W2 of each slot is about 0.33 mm (0.013 inches).

In some implementations, the width W3 of each intermediate wall 3216 is within the range of about 0.13 mm (0.005) inches to about 0.38 mm (0.015 inches). In one implementation, the width W3 of each intermediate wall 3216 is about 0.15 mm (0.006 inches). In one implementation, the width W3 of each intermediate wall 3216 is about 0.28 mm (0.011 inches). In one implementation, the width W3 of each intermediate wall 3216 is about 0.28 mm (0.011 inches). In one implementation, the width W3 of each intermediate wall 3216 is about 0.33 mm (0.013 inches). In one implementation, the width W3 of each intermediate wall 3216 is about 0.25 mm (0.010 inches).

Figure 95:
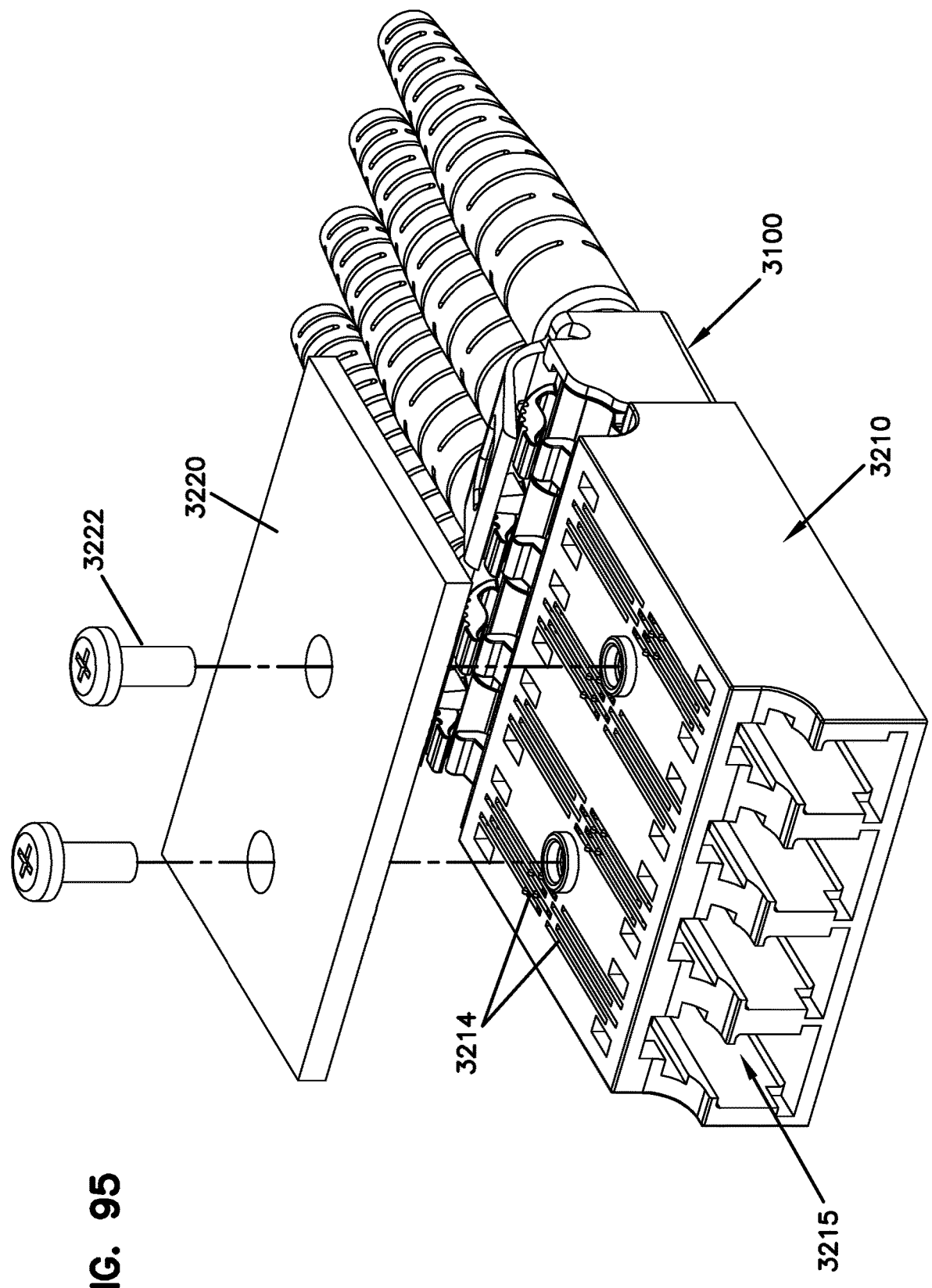

As shown in FIG. 95, a printed circuit board 3220 is configured to secure (e.g., via fasteners 3222) to the adapter housing 3210. In some implementations, the example adapter housing 3210 includes two annular walls 3218 in which the fasteners 3222 can be inserted to hold the printed circuit board 3220 to the adapter housing 3210. Non-limiting examples of suitable fasteners 3222 include screws, snaps, and rivets. For ease in understanding, only a portion of the printed circuit board 3220 is shown in FIG. 95. It is to be understood that the printed circuit board 3220 electrically connects to a data processor and/or to a network interface (e.g., the processor 217 and network interface 216 of FIG. 2). It is further to be understood that multiple communications coupler housings 3210 can be connected to the printed circuit board 3220 within a connector assembly (e.g., a communications panel).

The contact members 3231 extend between the slotted surface of the adapter housing 3210 and the passages 3215. Portions of each contact member 3231 engage contacts and tracings on the printed circuit board 3220 mounted to the slotted surface of the adapter housing 3210. Other portions of the contact members 3231 engage the electrical contacts 3132 of the storage members 3130 attached to any connector arrangements 3100 positioned in the passages 3215 (see FIG. 101). A processor coupled to the circuit board 3220 can access the memory 3133 of each connector arrangement 3100 through corresponding ones of the contact members 3231.

In accordance with some aspects, the media reading interfaces 3230 of the adapter are configured to detect when a connector arrangement is inserted into one or more passages 3215. Accordingly, the contact members 3231 can function as presence detection sensors or trigger switches. In some implementations, the contact members 3231 of a media reading interface 3230 are configured to form a complete circuit with the circuit board 3220 only when a connector 3110 is inserted within a respective passage 3215. For example, at least a portion of each contact member 3231 may be configured to contact the circuit board 3220 only after being pushed toward the circuit board 3220 by a connector 3210. In other example implementations, portions of the contact members 3231 can be configured to complete a circuit until pushed away from the circuit board 3220 or a shorting rod by a connector 3110. In accordance with other aspects, however, some implementations of the contact members 3231 may be configured to form a complete circuit with the circuit board 3220 regardless of whether a connector 3110 is received in a passage 3215.

Figure 89:
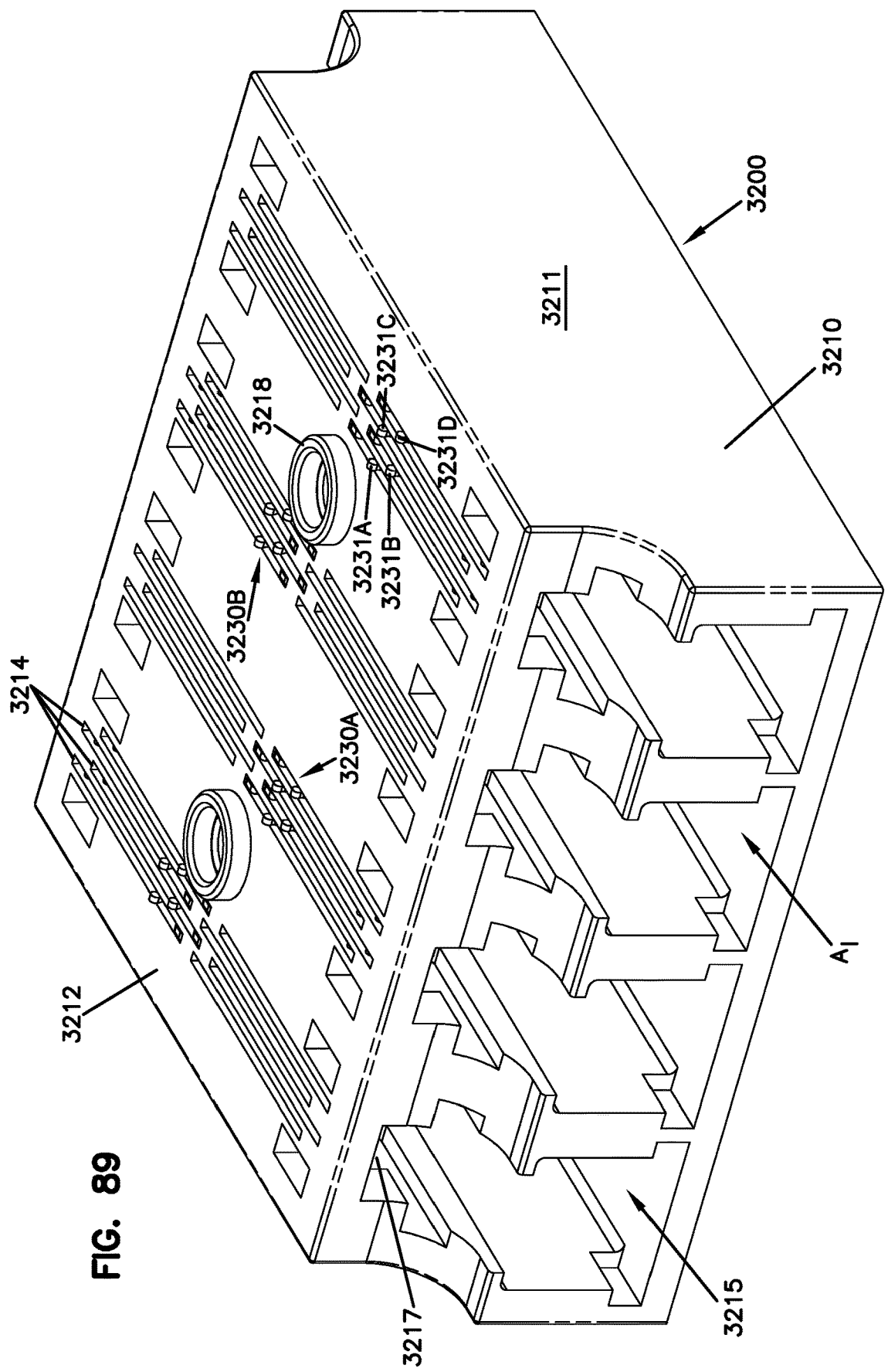
Figure 90:
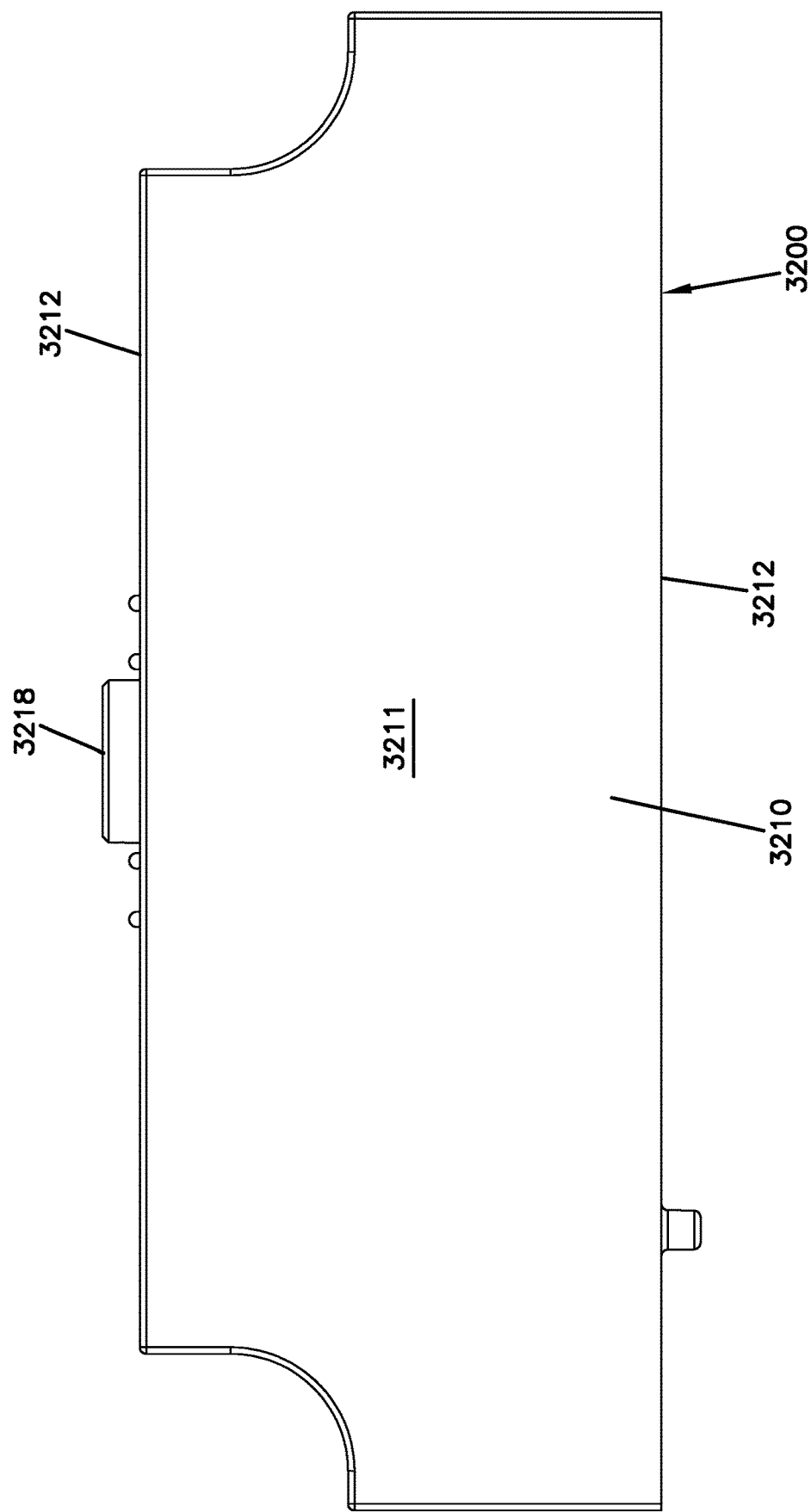

In the example shown in FIG. 89, each media reading interface 3230 of the fiber optic adapter 3200 includes four contact members 3231 and each storage device 3130 of the fiber optic connector 3110 includes four contact pads 3132 (FIGS. 80-88). In certain implementations, a first contact member 3231A and a third contact member 3231C of the media reading interface 3230 are mounted at first positions with the slot 3214. A second contact member 3231B and a fourth contact member 3231D of the media reading interface 3230 are mounted at second positions within the slot 3214 (e.g., compare the positions of the two contact members 3231A-3231D shown in FIG. 89). Likewise, the contact pads 3132 on the storage devices 3130A, 3130B, 3130C shown in FIGS. 80-88 include longer pads and narrower pads that are accommodated by the staggered positions of the contact members 1231. In other implementations, however, the contact members 3231 may be laterally aligned and/or the contact pads 3132 may be a common length.

In the example shown in FIGS. 97-100, at least portions of two contact members 3231 are visibly positioned within a slot 3214 defined in a fiber optic adapter 3210, shown in cross-section. Two additional contact members 3231 also are positioned in the slot 3214, but cannot be seen since the additional contact members 3231 laterally align with the visible contact members 3231. In other implementations, however, greater or fewer contact members 3231 may be positioned within the housing.

One example type of contact member 3231 is shown in FIG. 96. Each contact member 3231 defines at least three moveable (e.g., flexible) contact locations 3233, 3235, and 3236. The flexibility of the contact surfaces 3233, 3235, and 3236 provides tolerance for differences in spacing between the contact member 3231 and the respective printed circuit board 3220 when the coupler assembly 3200 is manufactured. Certain types of contact members 3231 also include at least one stationary contact 3237.

The first contact surface 3233 is configured to extend through the slot 3214 and engage the circuit board 3220. The third contact surface 3236 is configured to selectively extend through the slot 3214 and engage the circuit board 3220. For example, the third contact surface 3236 may be configured to engage the circuit board 3220 when a connector 3110 is inserted into a passage 3215 corresponding with the contact member 3231. The second contact surface 3235 is configured to extend into the passage 3215 and engage the connector 3110 positioned in the passage 3215. If a storage device 3130 is installed on the connector 3110, then the second contact surface 3235 is configured to engage the contact pads 3132 of the storage device 3130.

The example contact member 3231 includes a resilient section 3234 that biases the third contact surface 3236 upwardly through the slot 3214 (e.g., toward the circuit board 3220). A force applied to the second arm 3247 transfers to the first arm 3246 through the resilient section 3234. In some implementations, the resilient section 3234 defines at least a partial arc. For example, in the implementation shown in FIG. 96, the resilient section defines a half-circular section. In other implementations, the resilient section 3234 defines a series of curves and/or bends. In some implementations, the resilient section 3234 also defines a biasing surface 3239 that is configured to press against the first arm 3246 to bias the third contact surface 3236 upwardly.

The example contact member 3231 is configured to seat in one of the slots 3214 of the adapter housing 3210. For example, the contact member 3231 includes a base 3232 that is configured to abut the support wall 3205 of the adapter housing 3210 (e.g., see FIG. 98). In one implementation, the side of the base 3232 that abuts the support wall 3205 is flat. In another implementation, the side of the base 3232 that abuts the support wall 3205 defines one or more notches. One end 3237 of the base is configured to extend through the slot 3214 and contact the circuit board 3220 to provide grounding for the contact member 3231.

Another end of the base 3232 defines an attachment section 3238 that engages a portion of the support wall 3205 to secure the contact member 3231 within the slot 3214. In some implementations, the attachment section 3238 of the contact member 3231 includes a first leg 3241 and a second leg 3243 extending from the base 3232 (FIG. 96). In one implementation, the first leg 3241 defines a bump 3242. In one implementation, the attachment section 3238 is configured to snap-fit into the support wall 3205. In other implementations, the attachment section 3238 may otherwise mount to the support wall 3205.

The example contact member 3231 also includes a third leg 3244 that extends outwardly from the base 3232 generally parallel with the second leg 3243. A distal end of the third leg 3244 bends or curves upwardly toward the circuit board 3220. In the example shown, the third leg 3244 is generally J-shaped. In other implementations, the third leg 3244 may be L-shaped, C-shaped, V-shaped, etc. The first contact surface 3233 is defined at the distal end of the third leg 3244. In the example shown, the distal end of the third leg 3244 defines an arched or ball-shaped first contact surface 3233.

The contact member 3231 also includes a fourth leg 3245 that extends outwardly from the base 3232 between the second and third legs 3243, 3244. In the example shown, the fourth leg 3245 extends generally parallel to the second and third legs 3243, 3244. The fourth leg 3245 separates into first arm 3246, which defines the third contact surface 3236, and a second arm 3247, which defines the second contact surface 3235. The first arm 3246 extends upwardly from the fourth leg 3245 towards the circuit board 3220. For example, in some implementations, the first arm 3246 arcs upwardly into a planar extension that terminates at the third contact surface 3236. In the example shown, the third contact surface 3236 defines an arched or ball-shaped distal end of the first arm 3246.

The second arm 3247 initially extends away from the base 3232 and subsequently extends back towards the base 3232 to increase the beam length of the contact 3231. For example, in some implementations, the second arm 3247 extends downwardly into the resilient section 3234 and upwardly into the biasing surface 3239. From the biasing surface 3239, the second arm 3247 curves (i.e., arcs, angles, etc.) downwardly and back toward the base 3232 along an extension 3248 and forms a trough 3249 beneath the resilient section 3234. The trough 3249 defines the second contact surface 3235. In certain implementations, the inner sides of the trough 3249 are configured to abut against the resilient section 3234 when a connector 3110 is positioned in the passage 3215 to aid in pushing the biasing surface 3239 against the first arm 3246.

In certain implementation, the contact member 3231 defines a planar body. In certain implementations, the contact member 3231 is formed monolithically (e.g., from a continuous sheet of metal). For example, in some implementations, the contact member 3231 may be manufactured by cutting a planar sheet of metal or other material. In other implementations, the contact member 3231 may be manufactured by etching a planar sheet of metal or other material. In other implementations, the contact member 3231 may be manufactured by laser trimming a planar sheet of metal or other material. In still other implementations, the contact member 3231 may be manufactured by stamping a planar sheet of metal or other material.

FIGS. 97-100 illustrate the example contact member 3231 positioned in a slot 3214 of an adapter 3210 before and after insertion of a connector 3110 in a passage 3215 of the adapter 3210. In the example shown, the first leg 3241 of the attachment section 3238 extends generally vertically and the second leg 3243 extends generally horizontally (e.g., see FIGS. 98 and 100). In some implementations, the support wall 3205 of the adapter housing 3210 defines a recess or channel 3208 and an extension 3207. When the attachment section 3238 is mounted to the support wall 3205, the first leg 3241 of the attachment section 3238 fits in the recess 3208 and the second leg 3242 seats on the extension 3207. When first contact surface 3233 extends through the slot 3214 and contacts the circuit board 3220.

In some implementations, a support portion 3209 of the adapter housing 3210 projects partially into the passages 3215 opposite the support wall 3205. The support portion 3209 defines a ledge 3219 recessed within each slot 3214. The distal end of the first arm 3246 seats on the ledge 3219 spaced from the circuit board 3220 when a connector 3110 is not positioned within a respective passage 3215 (see FIG. 98). Inserting a connector 3110 into the passage 3215 biases the distal end of the first arm 3246 upwardly from the ledge 3219 toward the circuit board 3220 (see FIG. 100). In certain implementations, biasing the distal end of the first arm 3246 upwardly causes the third contact surface 3236 to engage (e.g., touch or slide against) the circuit board 3220.

The trough 3249 of the second arm 3247 extends into the passage 3215 associated with the slot 3214. Inserting the connector 3110 into the passage 3215 causes the deflection surface 3118 of the key 3115 on the connector 3110 to press against an outer surface of the trough 3249 (see FIG. 98). The deflection surface 3118 presses the trough 3249 upwardly and toward the support wall 3205. An inner surface of the trough 3249 abuts against and applies an upwardly directed pressure to the resilient section 3234 of the contact member 3231. The upward pressure on the trough 3249 also applies an upward pressure on the biasing surface 3239. The resilient section 3234 and the biasing surface 3239 bias the distal end of the first arm 3246 of the contact member 3231 through the slot 3214 to slide or wipe across the circuit board 3220 (see FIG. 100). Accordingly, the presence of the connector 3110 in the passage 3215 may be detected when the deflection surface 3118 of the connector key 3115 engages the contact member 3231.

In some implementations, the connector 3110 does not include a storage device 3130. For example, the connector 3110 may be part of a duplex connector arrangement 3100 in which the other connector 3110 holds the storage device 3130. In other implementations, however, the connector 3110 may include a storage device 3130. In such implementations, the second contact surface 3235 of the contact member 3231 slides or wipes across the surface of the contacts 3132 of the storage device 3130 during insertion (see FIG. 101).

In some implementations, the storage device 3130 is stored in a cavity defined only in a top of the key 3115. In such implementations, the second contact surface 3235 of the connector 3130 is defined by the bottom of the trough 3249, which slides across the contacts 3132 of the storage device 3130 after the trough 3249 is deflected by the deflection surface 3118 of the key 3115. Accordingly, the presence of the connector 3110 within the passage 3215 may be detected before the memory 3133 of the storage device 3130 can be accessed.

In other implementations, the storage device 3130 is accessible through a recess in the deflection surface 3118. In such implementations, the second contact surface 3235 of the connector 3130 is defined by the leading edge of the trough 3249, which touches the storage device contacts 3132 as the trough 3249 is being deflected by the deflection surface 3118. Accordingly, the presence of the connector 3110 within the passage 3215 may be detected at approximately the same time that the memory 3133 of the storage device 3130 can be accessed.

Figure 98:
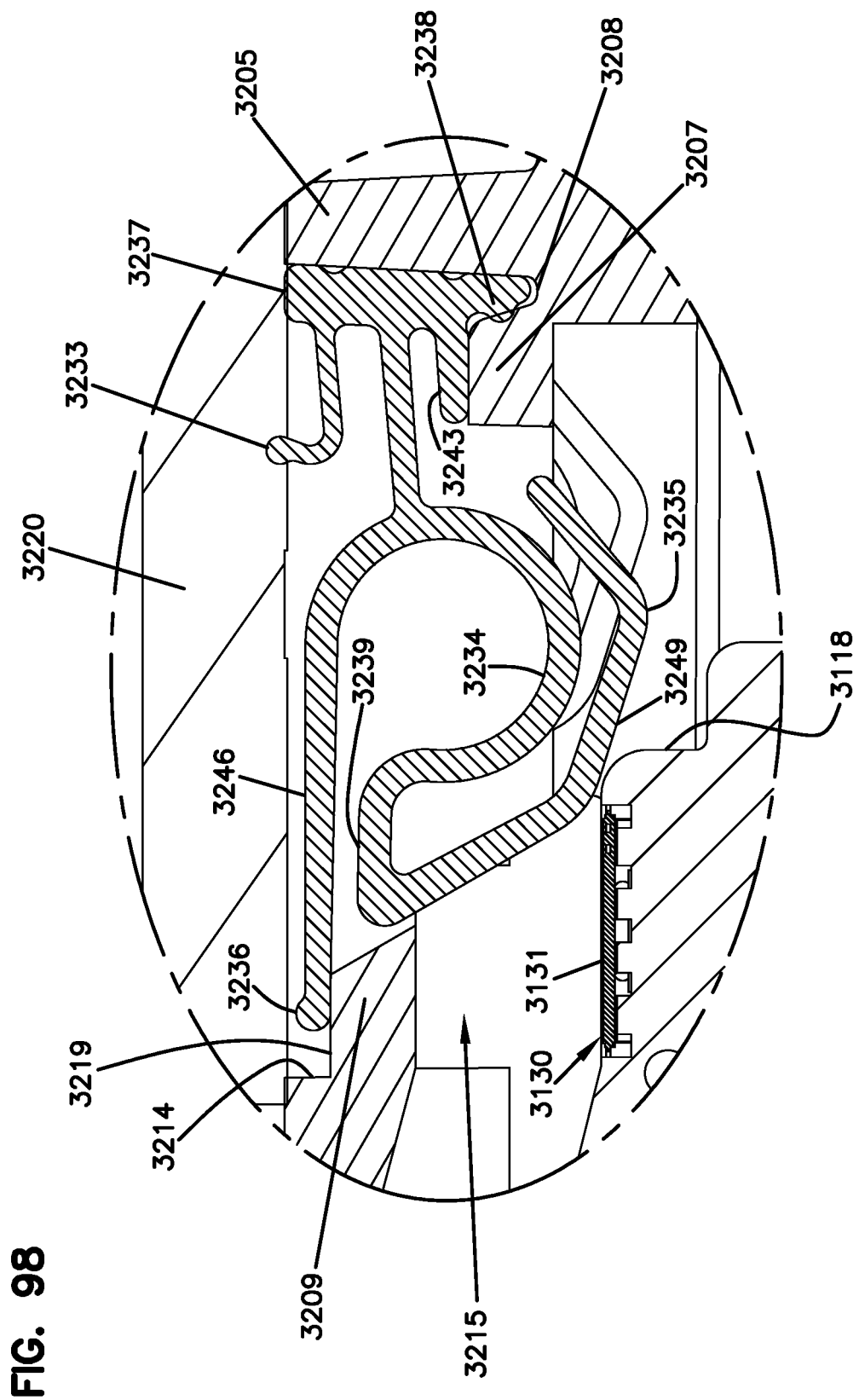
Figure 99:
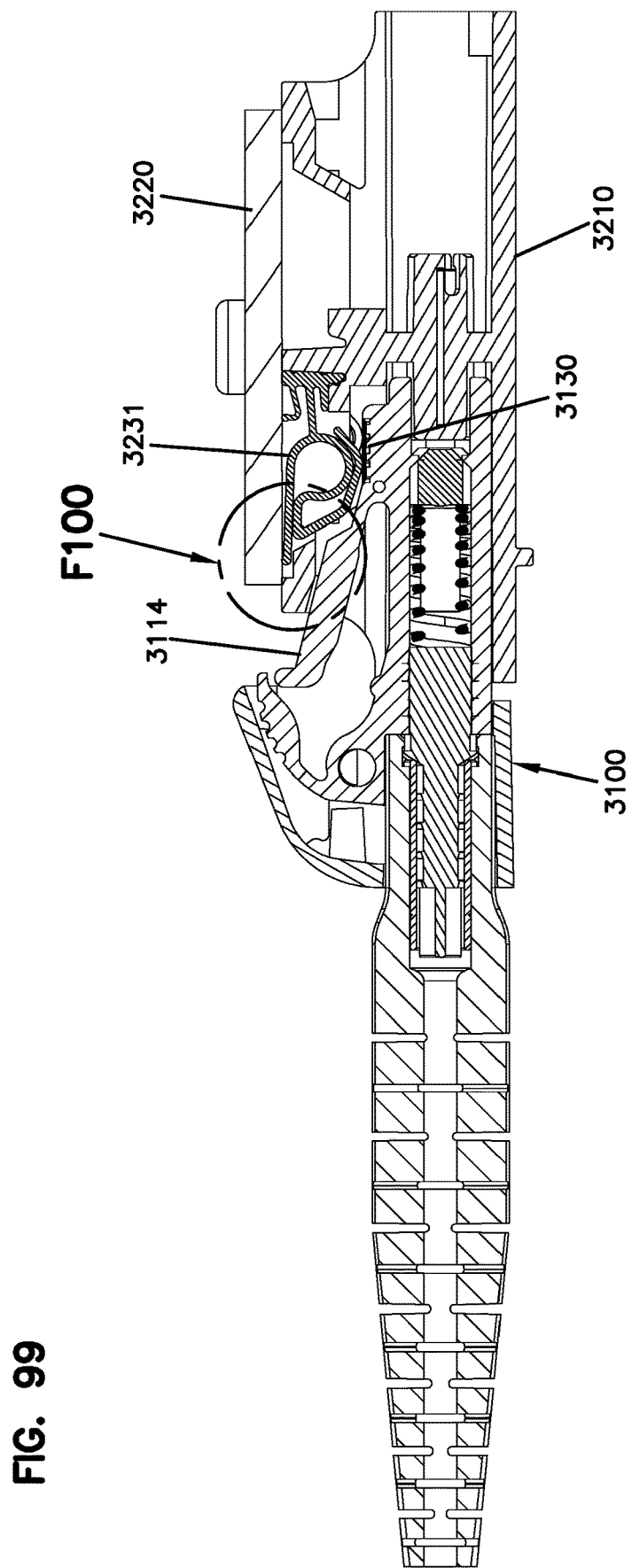
Figure 100:
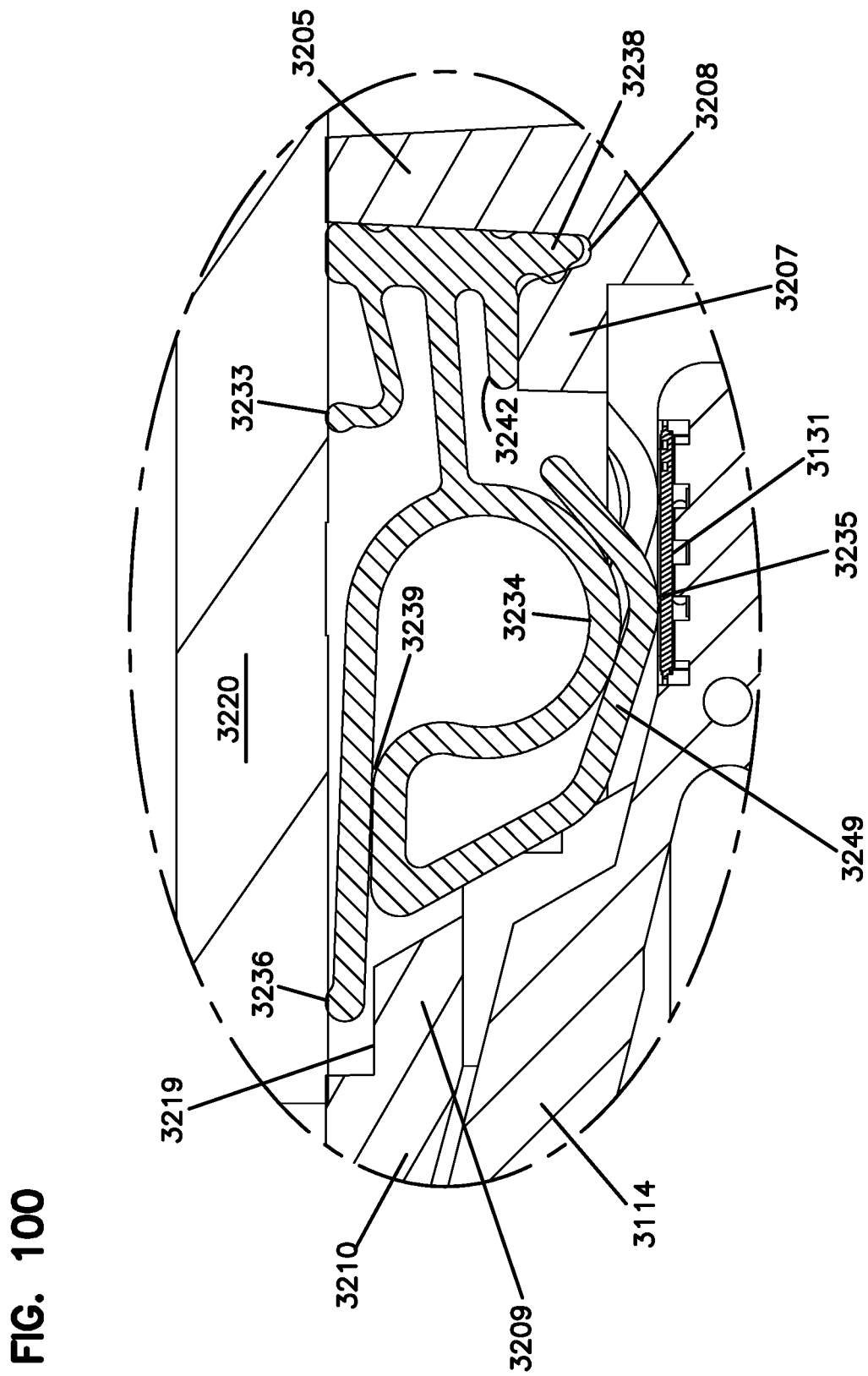
Figure 101:
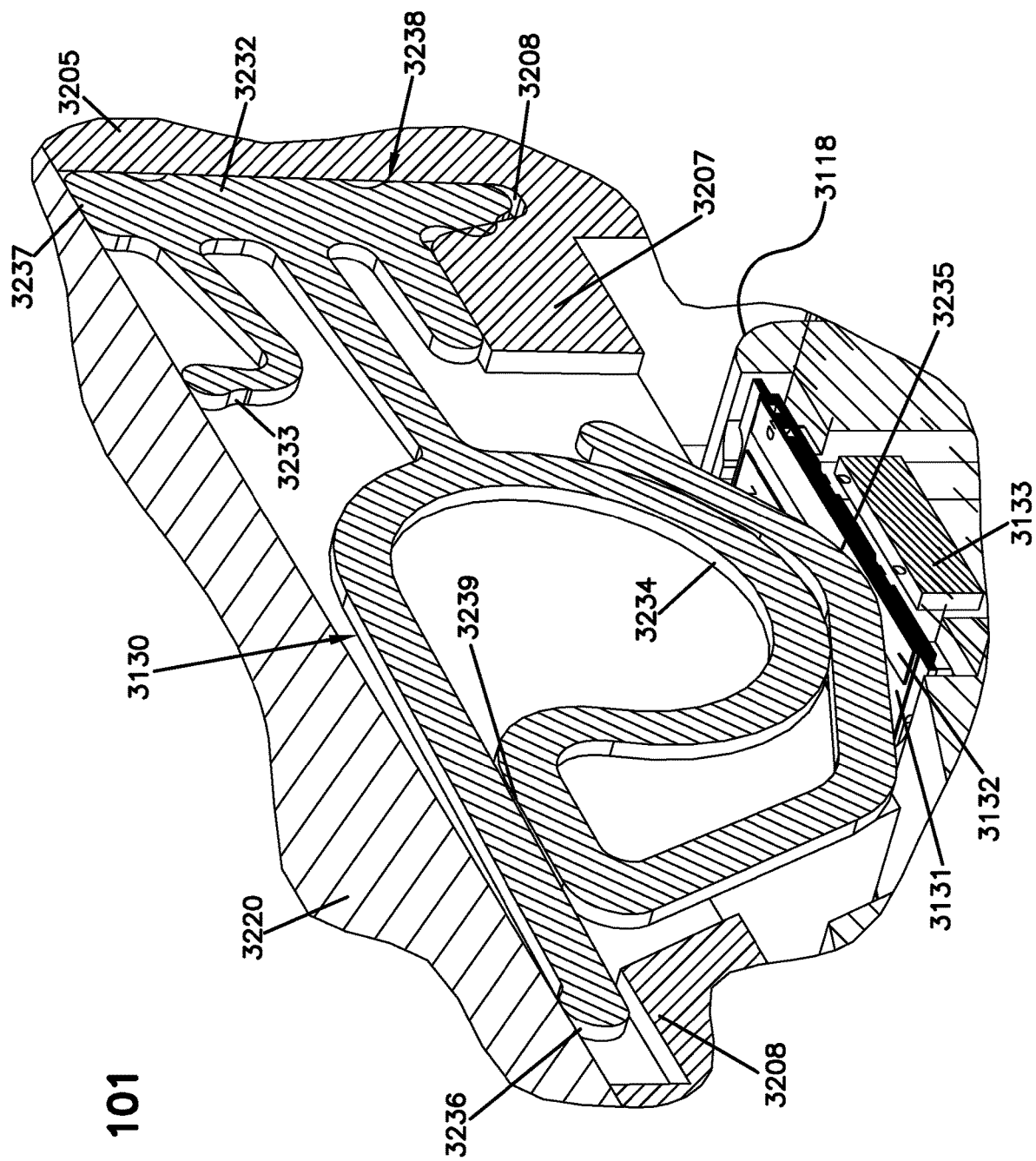

Removing the connector 3110 from the passage 3215 releases the trough 3249 from the upwardly biased position (see FIG. 100), thereby allowing the trough 3249 to move back to its unbiased position (see FIG. 98). When in the unbiased position, the trough 3249 no longer applies upward pressure to the resilient section 3234 and the biasing surface 3239. Accordingly, the resilient section 3234 and biasing surface 3239 allow the distal end of the first arm 3246 to drop into the slot 3214 and rest against the ledge 3219 (see FIG. 98). Dropping the first arm 3246 disengages the third contact surface 3236 from the circuit board 3220, thereby interrupting the circuit created by the contact member 3231. Interrupting the circuit enables a processor connected to the circuit board 3220 to determine that the connector 3110 has been removed from the passage 3215.

As discussed above, a processor (e.g., processor 217 of FIG. 2) or other such equipment also can be electrically coupled to the printed circuit board 3220. Accordingly, the processor can communicate with the memory circuitry 3133 on the storage device 3130 via the contact members 3231 and the printed circuit board 3220. In accordance with some aspects, the processor is configured to obtain physical layer information from the storage device 3130. In accordance with other aspects, the processor is configured to write (e.g., new or revised) physical layer information to the storage device 3130. In accordance with other aspects, the processor is configured to delete physical layer information to the storage device 3130. In still other implementations, the processor detects the presence or absence of a connector 3110 in each passage 3215.

Figure 102:
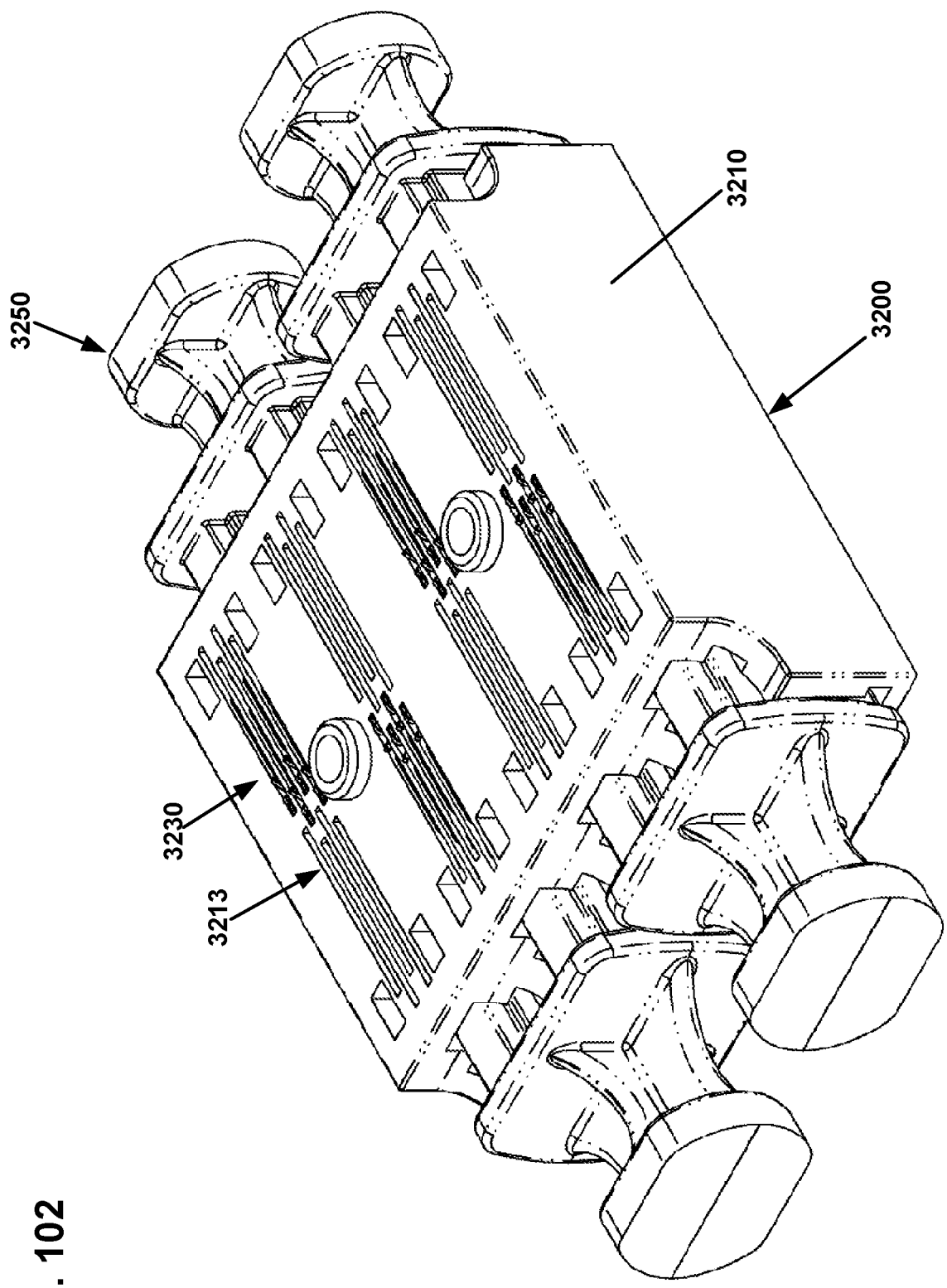

As shown in FIG. 102, dust caps 3250 can be mounted within the adapter passages 3215 in which connectors 3110 are not received. The dust caps 3250 can inhibit dust, dirt, or other contaminants from entering the passages 3215 when the passages 3215 are not being utilized.

FIGS. 103-133 illustrate another example implementation of a connector system 4000 that can be utilized on a connector assembly (e.g., a communications panel) having PLI functionality as well as PLM functionality. One example connector assembly on which the connector system 4000 can be implemented is a bladed chassis. The connector system 4000 includes at least one example communications coupler assembly 4200 and at least two connector arrangements 4100.

The communications coupler assembly 4200 is configured to be mounted to a connector assembly, such as a communications blade or a communications panel. One or more connector arrangements 4100, which terminate segments 4010 of communications media, are configured to communicatively couple to other segments of physical communications media at the coupler assembly 4200 (e.g., see FIGS. 116-117). Accordingly, communications data signals carried by a media segment 4010 terminated by a first connector arrangement 4100 can be propagated to another media segment 4010 (e.g., terminated by a second connector arrangement 4100) through the communications coupler assembly 4200.

Figure 104:
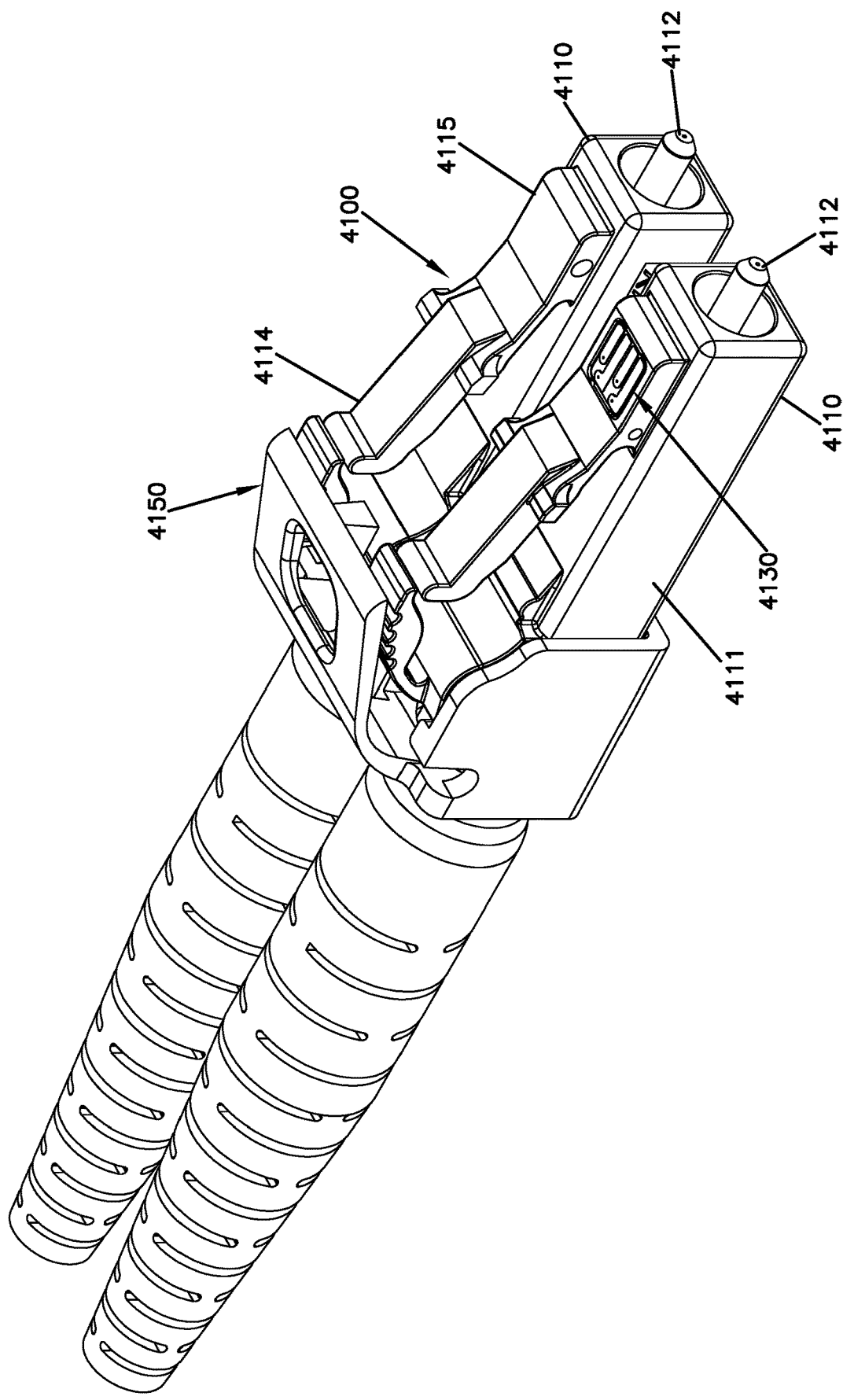

In accordance with some aspects, each connector arrangement 4100 is configured to terminate a single segment of physical communications media. For example, each connector arrangement 4100 can include a single connector 4110 that terminates a single optical fiber or a single electrical conductor (FIG. 104). In one example implementation, each connector arrangement 4100 includes a single LC-type fiber optic connector 4110 that terminates a single optical fiber. In accordance with other aspects, each connector arrangement 4100 includes two or more connectors 4110, each of which terminates a single segment of physical communications media. For example, each connector arrangement 4100 may define a duplex fiber optic connector arrangement including two connectors 4110, each of which terminates an optical fiber 4010 (FIG. 104). In other implementations, the connector 4110 can be an SC-type, an ST-type, an FC-type, an LX.5-type, etc.

In accordance with still other aspects, each connector arrangement 4100 can include one or more connectors, each of which terminates a plurality of physical media segments (e.g., see connector arrangement 2100, 2100', and 5100 of FIGS. 31, 59, and 133). In one example implementation, each connector arrangement includes a single MPO-type fiber optic connector that terminates multiple optical fibers. In still other systems, other types of connector arrangements (e.g., electrical connector arrangements) can be secured to the communications coupler assembly 4200 or to a different type of coupler assembly.

In accordance with some aspects, each communications coupler assembly 4200 is configured to form a single link between segments of physical communications media 4010. For example, each communications coupler assembly 4200 can define a single passage at which a first connector arrangement is coupled to a second connector arrangement. In accordance with other aspects, however, each communications coupler assembly 4200 is configured to form two or more links between segments of physical communications media. For example, in the example shown in FIG. 103, the communications coupler assembly 4200 defines four passages 4215.

In some implementations, each passage 4215 of the communications coupler assembly 4200 is configured to form a single link between first and second connector arrangements 4100. In other example implementations, two or more passages 4215 can form a single link between connector arrangements 4100 (e.g., two sets of ports can form a single link between two duplex connector arrangements). In still other example implementations, each communications coupler assembly 4200 can form a one-to-many link. For example, the communications coupler assembly 4200 can connect a duplex connector arrangement to two simplex connector arrangements.

Figure 103:
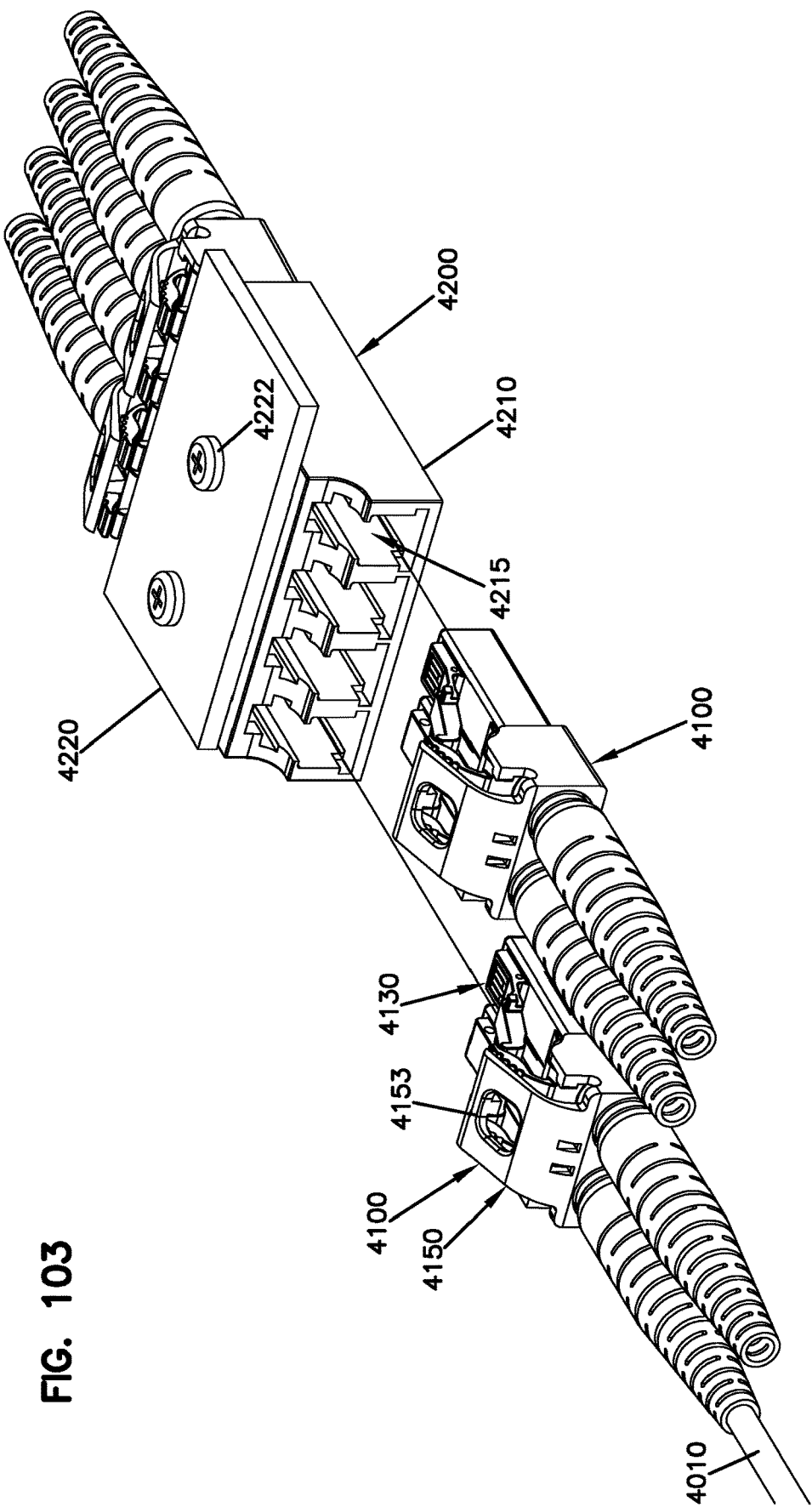
FIGS. 103-122 and 123A-123D illustrate a sixth example implementation of a connector system that can be utilized on a connector assembly having PLI functionality as well as PLM functionality in accordance with aspects of the present disclosure.

Example implementations of connector arrangements 4100 are shown in FIGS. 104-111. Each of the connector arrangements 4100 includes one or more fiber optic connectors 4110, each of which terminates one or more optical fibers 4010 (FIG. 103). In the example shown in FIGS. 103-105, each connector arrangement 4100 defines a duplex fiber optic connector arrangement including two fiber optic connectors 4110 held together using a clip 4150. In another example implementation, a connector arrangement 4100 can define a simplex fiber optic connector 4110.

Figure 105:
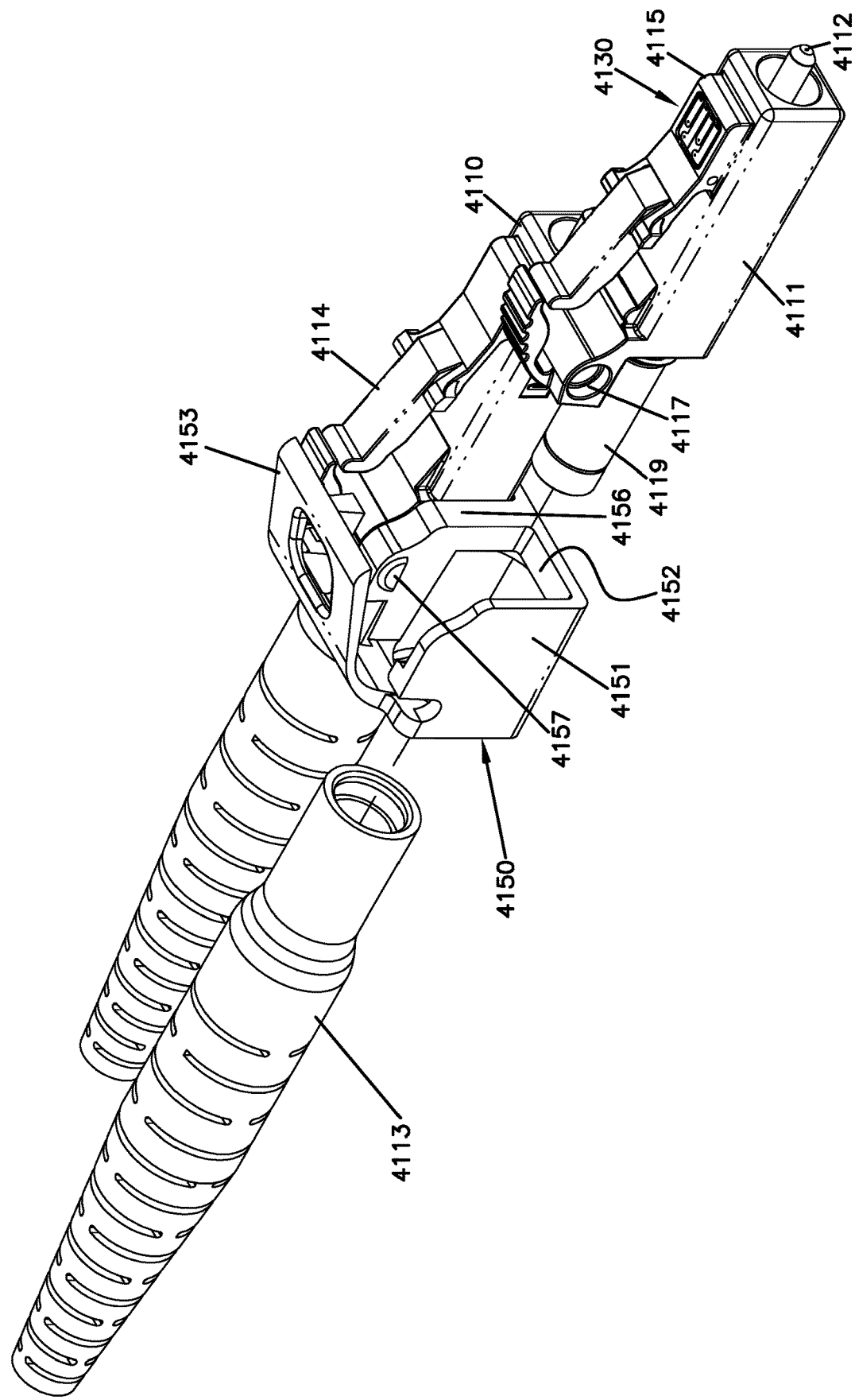

As shown in FIG. 105, each fiber optic connector 4110 includes a connector body 4111 protecting a ferrule 4112 that retains an optical fiber 4010. The connector body 4111 is secured to a boot 4113 for providing bend protection to the optical fiber 4010. In the example shown, the connector 4110 is an LC-type fiber optic connector. The connector body 4111 includes a fastening member (e.g., clip arm) 4114 that facilitates retaining the fiber optic connector 4110 within a passage 4215 in the communications coupler assembly 4200. The connector body 4111 also defines a through hole (or opposing depressions) 4117 to facilitate maintaining the body 4111 within the clip 4150 (e.g., see FIG. 105).

One example clip 4150 is shown in FIGS. 103 and 105. The clip 4150 includes a body 4151 that defines openings or channels 4152 through which portions 4119 of the fiber optic connector bodies 4111 can extend (see FIG. 105). In the example shown, the clip 4150 has a monolithic body 4151 defining two channels 4152 separated by an interior wall 4156. Lugs 4157 are positioned on the inner surfaces of the exterior walls of the body 4151 and on both sides of the interior wall 4156. The lugs 4157 are configured to engage cavities/depressions 4117 defined in the fiber optic connector bodies 4111 to secure the connector bodies 4111 within the clip body 4151. A flange 4153 curves upwardly and forwardly to extend over the fastening members 4114 of the connectors 4110 (see FIG. 104). The flange 4153 is sufficiently flexible to enable the application of pressure on the clip arms 4114 of the connectors 4110 by pressing on a distal end of the flange 4153.

Each connector arrangement 4100 is configured to store physical layer information. For example, a storage device 4130 may be installed on or in the body 4111 of one or more of the fiber optic connectors 4110 of each connector arrangement 4100. In the example shown, the storage device 4130 is installed on only one fiber optic connector 4110 of a duplex connector arrangement 4100 (FIG. 104). In other implementations, however, a storage device 4130 may be installed on each fiber optic connector 4110 of a connector arrangement 4100.

One example storage device 4130 includes a printed circuit board 4131 (FIG. 120A) on which memory circuitry can be arranged. Electrical contacts 4132 also may be arranged on the printed circuit board 4131 for interaction with a media reading interface of the communications coupler assembly 4200 (described in more detail herein). In one example implementation, the storage device 4130 includes an EEPROM circuit 4133 arranged on the printed circuit board 4131. In the example shown in FIG. 105, an EEPROM circuit 4133 (FIG. 122) is arranged on the non-visible side of the circuit board 4131. In other implementations, however, the storage device 4130 can include any suitable type of non-volatile memory.

Figure 106:
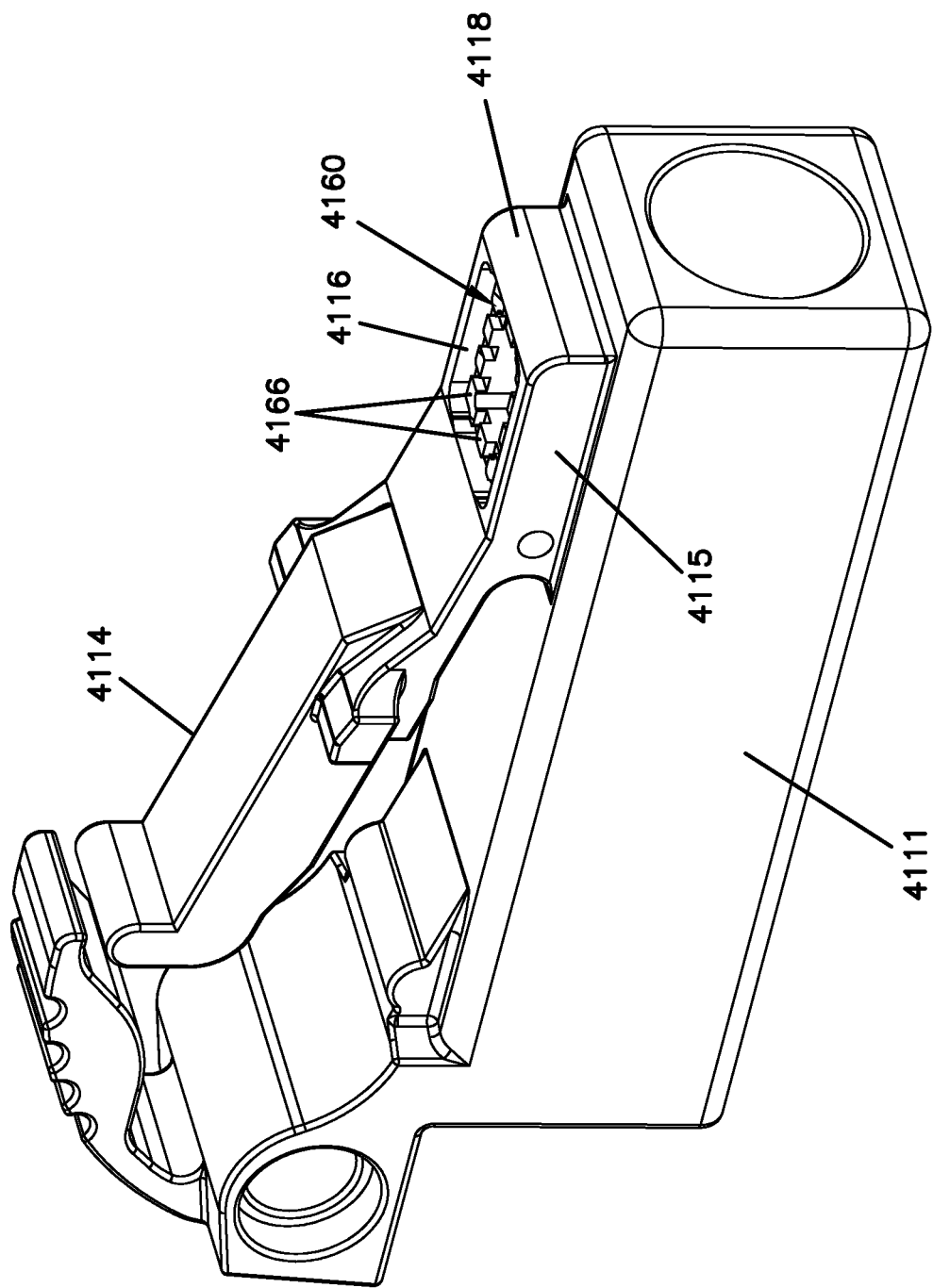
Figure 107:
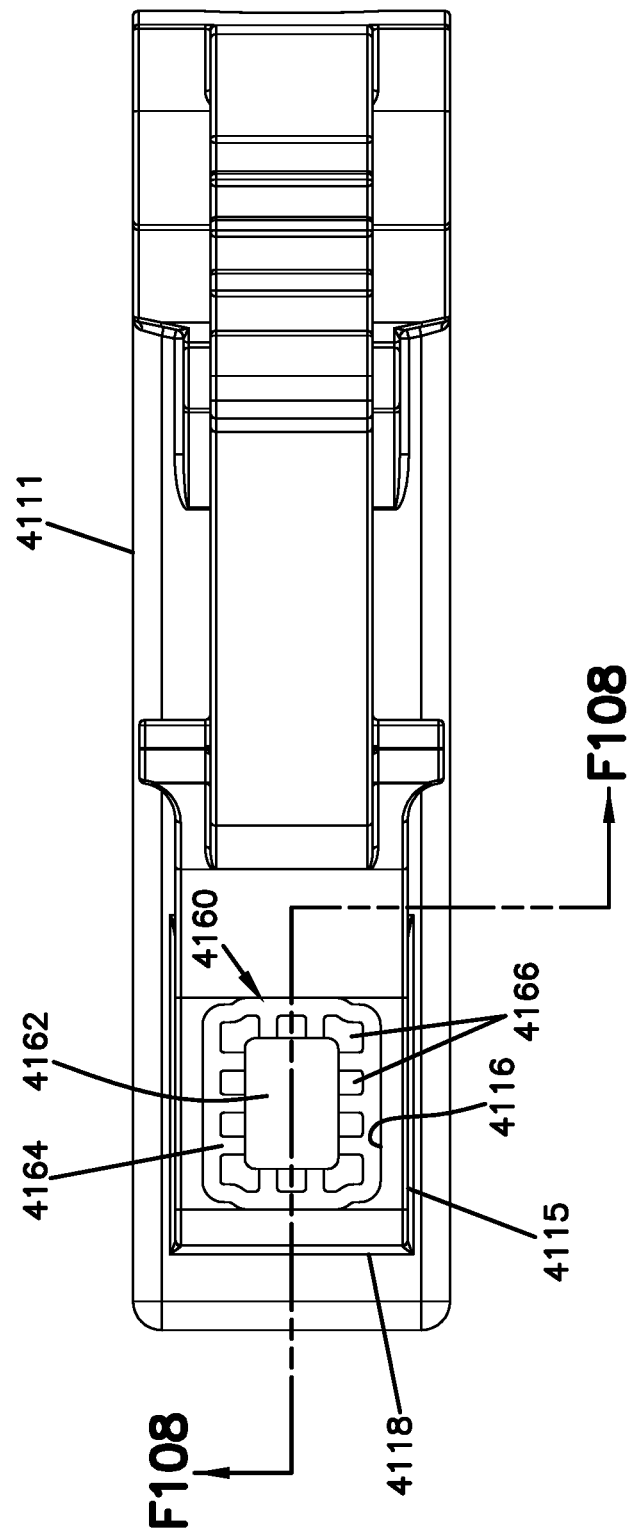
Figure 108:
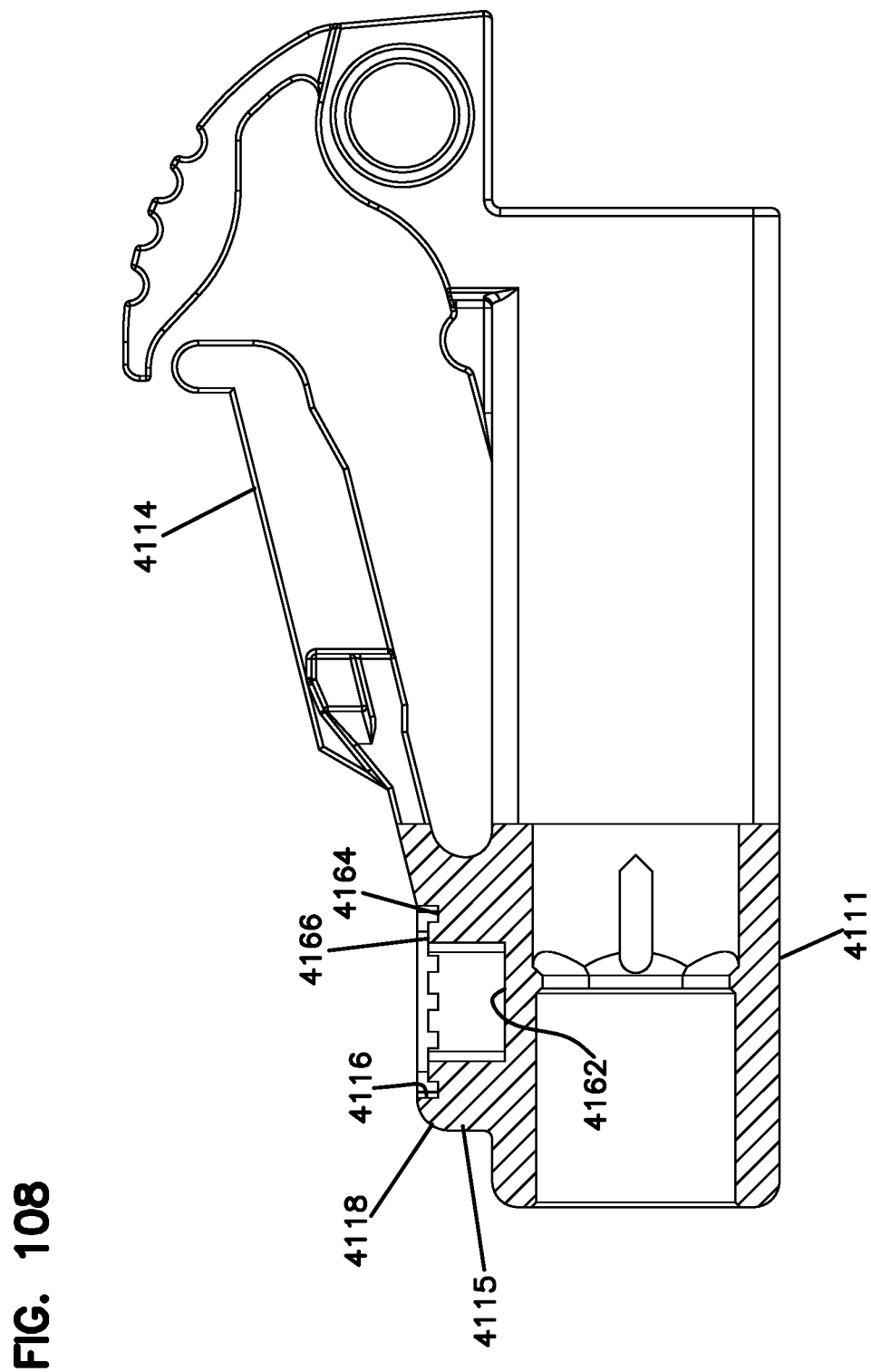

As shown in FIGS. 106-108, the body 4111 of one example fiber optic connector 4110 may define a recessed section or cavity 4116 in which the storage device 4130 may be positioned. In some implementations, the cavity 4116 is provided in the key 4115 of the connector 4110. In other implementations, the cavity 4116 may be provided elsewhere in the connector 4110. In some implementations, the cavity 4116 has a stepped configuration 4160 to facilitate positioning of the storage device 4130.

In the example shown, the cavity 4116 includes a well 4162 surrounded by a ledge 4164. The ledge 4164 is configured to support the storage device 4130. For example, the ledge 4164 may support the printed circuit board 4131 of an example storage device 4130. The well 4162 is sufficiently deep to accommodate an EEPROM circuit 4133 coupled to one side of the printed circuit board 4131. The ledge 4164 is recessed sufficiently within the connector body 4111 to enable electrical contacts 4132 provided on the opposite side of the printed circuit board 4131 to be generally flush with the key 4115 of the connector body 4111 (see FIG. 120).

In certain implementations, the ledge 4164 has a ridged or otherwise contoured surface to facilitate mounting the storage device within the cavity 4116. For example, in some implementations, contoured sections 4166 of the ledge 4164 may increase the surface area over which an adhesive may be applied to secure the storage device 4130 within the cavity 4116. In the example shown, the contoured sections 4166 include rectangular-shaped protrusions and/or depressions. In other implementations, however, the ledge 4164 may have bumps, ridges, or some other texture to increase the surface area over which adhesive is applied.

Figure 109:
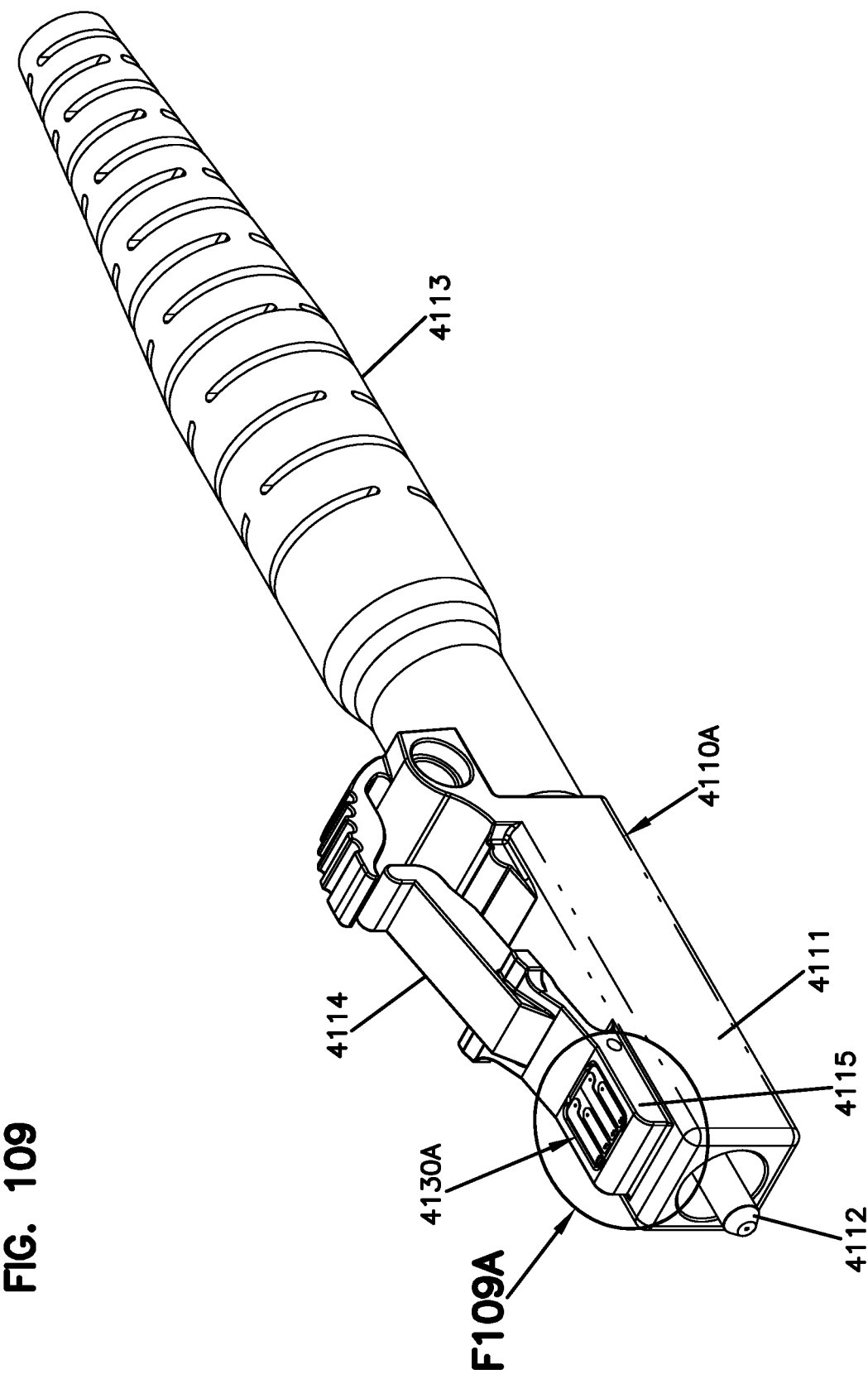
Figure 109A:
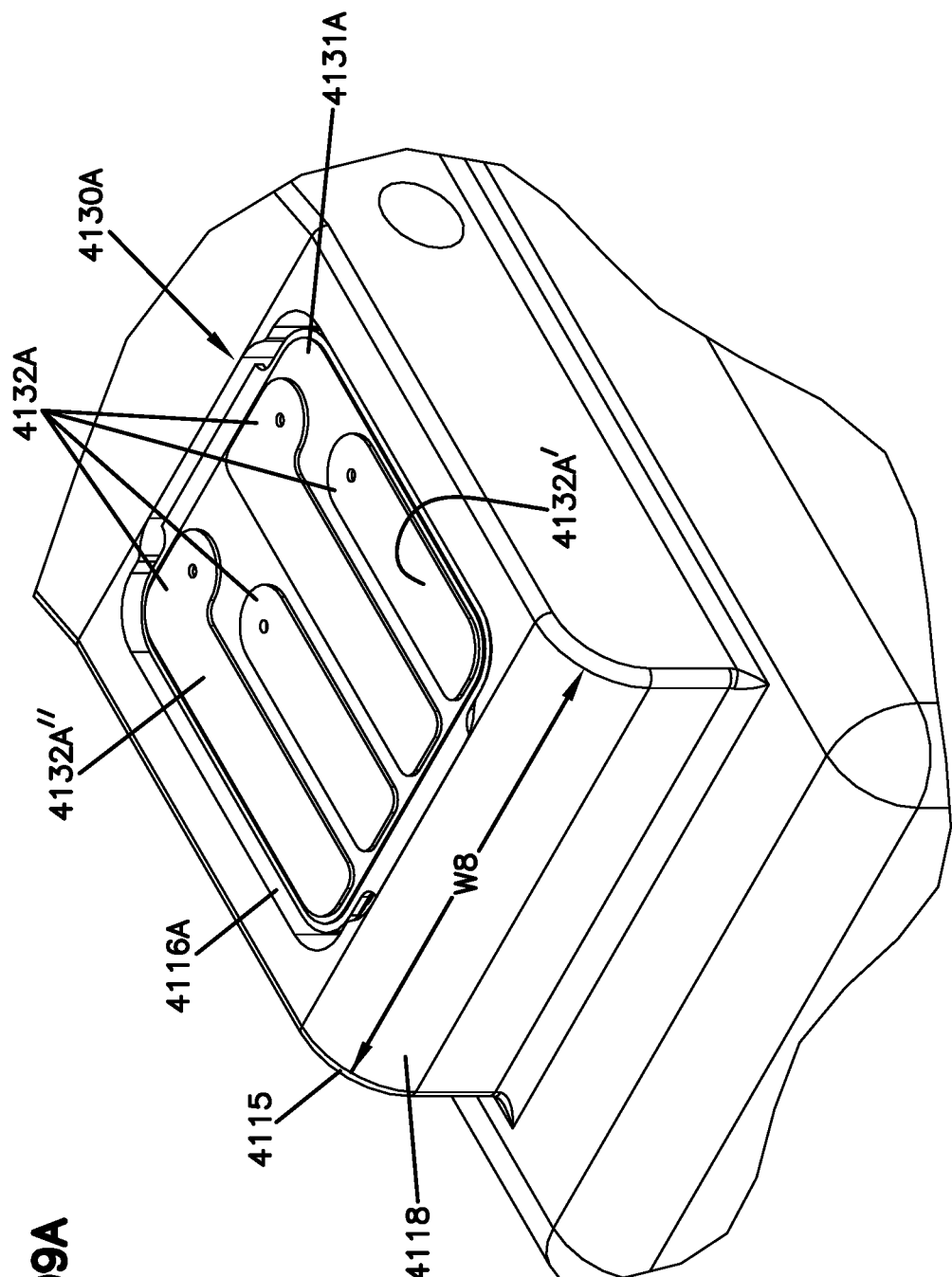
Figure 110:
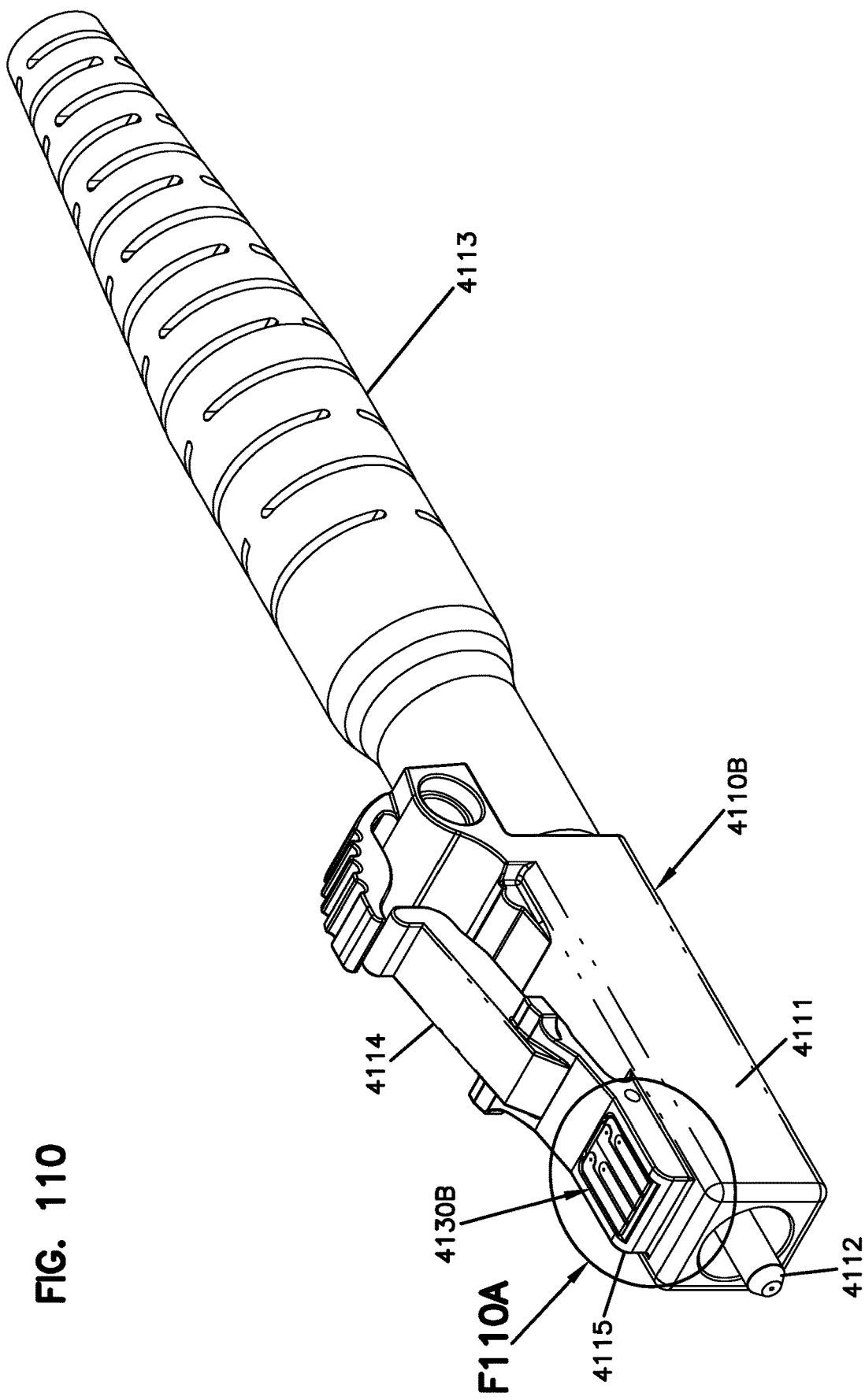
Figure 111:
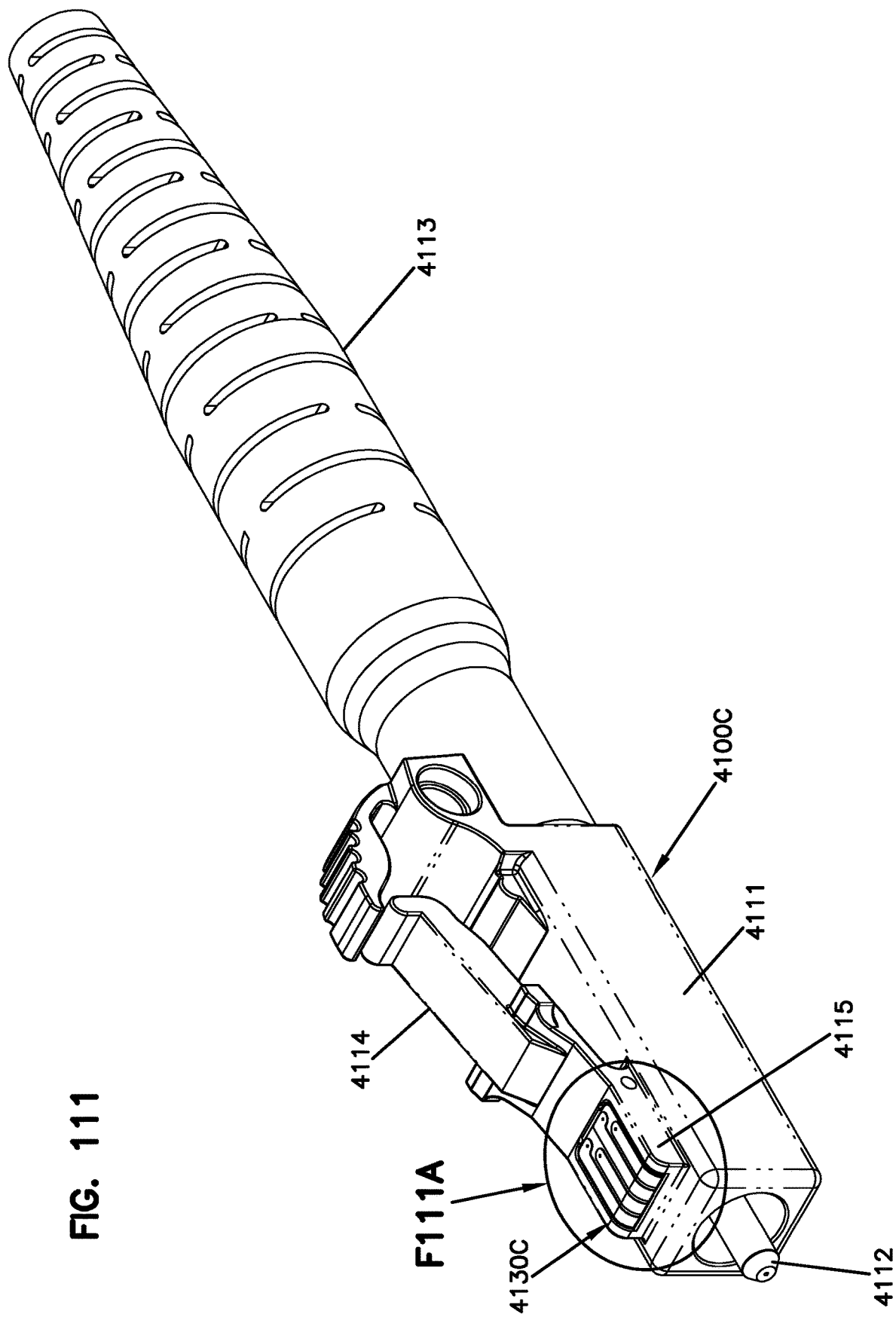

FIGS. 109-111 show three example implementations of a storage device 4130 installed on an example connector 4110. FIGS. 109 and 109A show a first example connector 4110A that includes a key 4115 having a width W8. The key 4115 has a front surface 4118 against which contacts 4231 (see FIGS. 119-122) of the communications coupler assembly 4200 deflect during insertion of the connector 4110 as will be described in more detail herein. In the example shown, the deflection surface 4118 defines a bullnose. In other implementations, the deflection surface 4118 may define any suitable shape.

The key 4115 also defines a recessed section or cavity 4116A in which a storage device 4130A can be positioned (e.g., see FIG. 108). In the example shown in FIG. 109A, the cavity 4116A is defined in a top of the key 4115 and not on or in the deflecting surface 4118. In some implementations, a cover can be positioned over the storage device 4130A to enclose the storage device 4130A within the recessed section 4116A of the connector 4111. In other implementations, the storage device 4130A is left uncovered and exposed.

The storage device 4130A shown in FIG. 109A includes generally planar contacts 4132A positioned on a generally planar circuit board 4131A. Memory 4133 (FIGS. 116-117) of the storage device 4130A, which is located on the non-visible side of the board in FIG. 109A, is accessed by engaging the tops of the contacts 4132A with one or more electrically conductive contact members (e.g., contact member 4231 of FIG. 119). In certain implementations, the contact member 4231 initially contacts the deflecting surface 4118 and subsequently slides or wipes across the contacts 4132A (see FIGS. 119-122).

In some implementations, the contacts 4132A have different lengths. In certain implementations, the contacts 4132A have different shapes. For example, in some implementation, the contacts 4132A include one or more contact members 4132A' that have generally rounded ends at one or both ends of the contact members 4132A'. In certain implementations, the contacts 4132A also include one or more contact members 4132A" that are generally L-shaped. In the example shown, the L-shaped contacts 4132A" are longer than the rounded end contacts 4132A'. In other implementations, however, the contacts 4132A may have the same length or may each have different lengths.

Figure 110A:
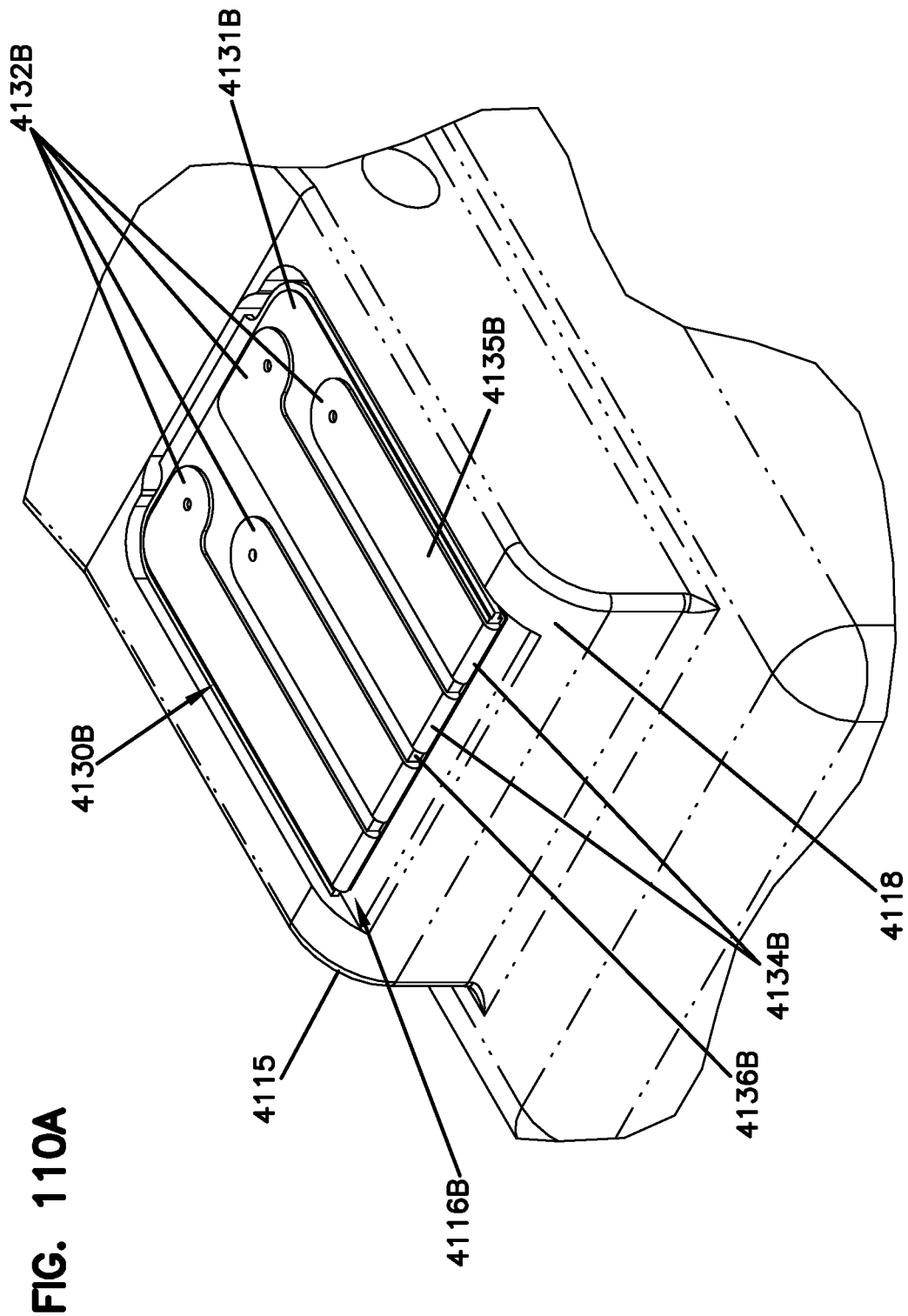

FIGS. 110 and 110A show a second example connector 4110B that includes a key 4115 having a deflection surface 4118. The key 4115 defines a recessed section or cavity 4116B in which a storage device 4130B can be positioned. In the example shown, the cavity 4116B cuts into the deflecting surface 4118 of the key 4115. In some implementations, a cover can be positioned over the storage device 4130B to enclose the storage device 4130B within the connector 4111. In other implementations, the storage device 4130B is left uncovered and exposed.

The storage device 4130B shown in FIG. 110A includes contacts 4132B having first sections 4135B that extend over a generally planar circuit board 4131B and folded sections 4134B that curve, fold, or bend over a front end 4136B of the board 4131B. In the example shown, the first sections 4135B of the contacts 4132B have two different lengths. In other implementations, however, the first sections 4135B of the contacts 4132B may all be the same length or may each be a different length. In certain implementations, at least some of the first sections 4135B may be L-shaped and at least some of the first sections 4135B may have a rounded edge. The memory 4133 of the storage device 4130B, which is located on the non-visible side of the board in FIG. 110A, is accessed by sliding or wiping the contact member 4231 (FIG. 119) of the coupler assembly 4200 across the folded sections 4134B of the contacts 4132B and/or the planar sections 4135B of the contacts 4132B.

Figure 111A:
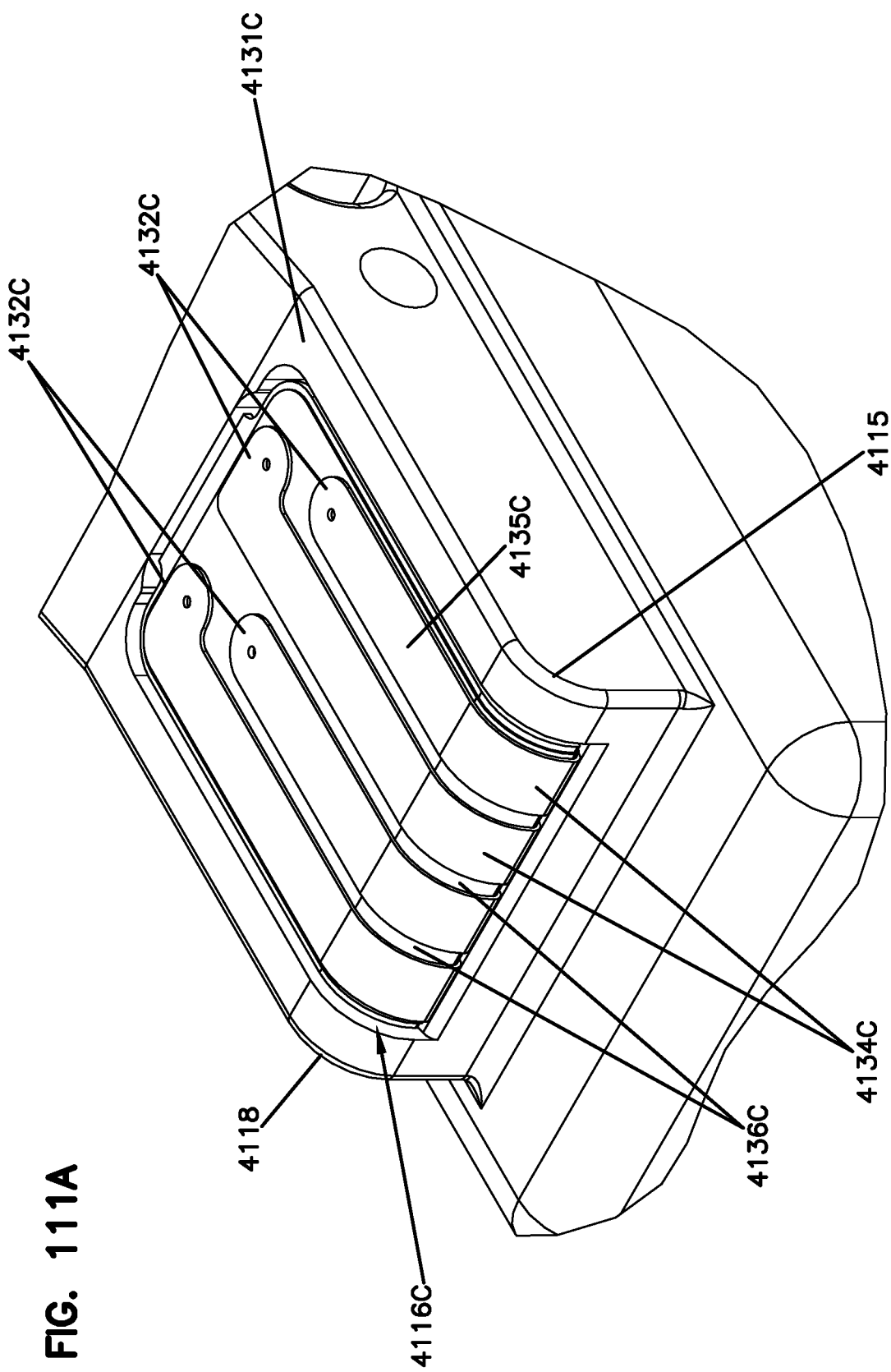
Figure 112:
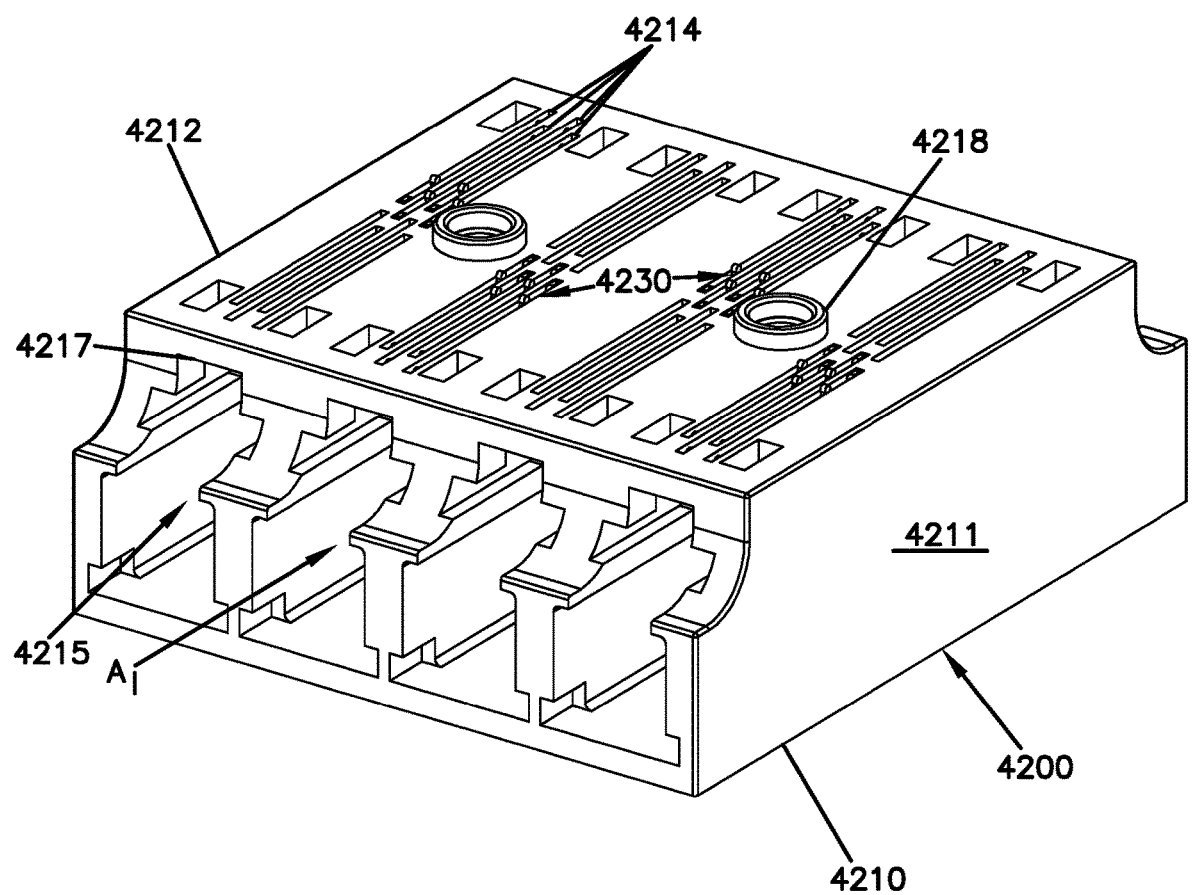
Figure 113:
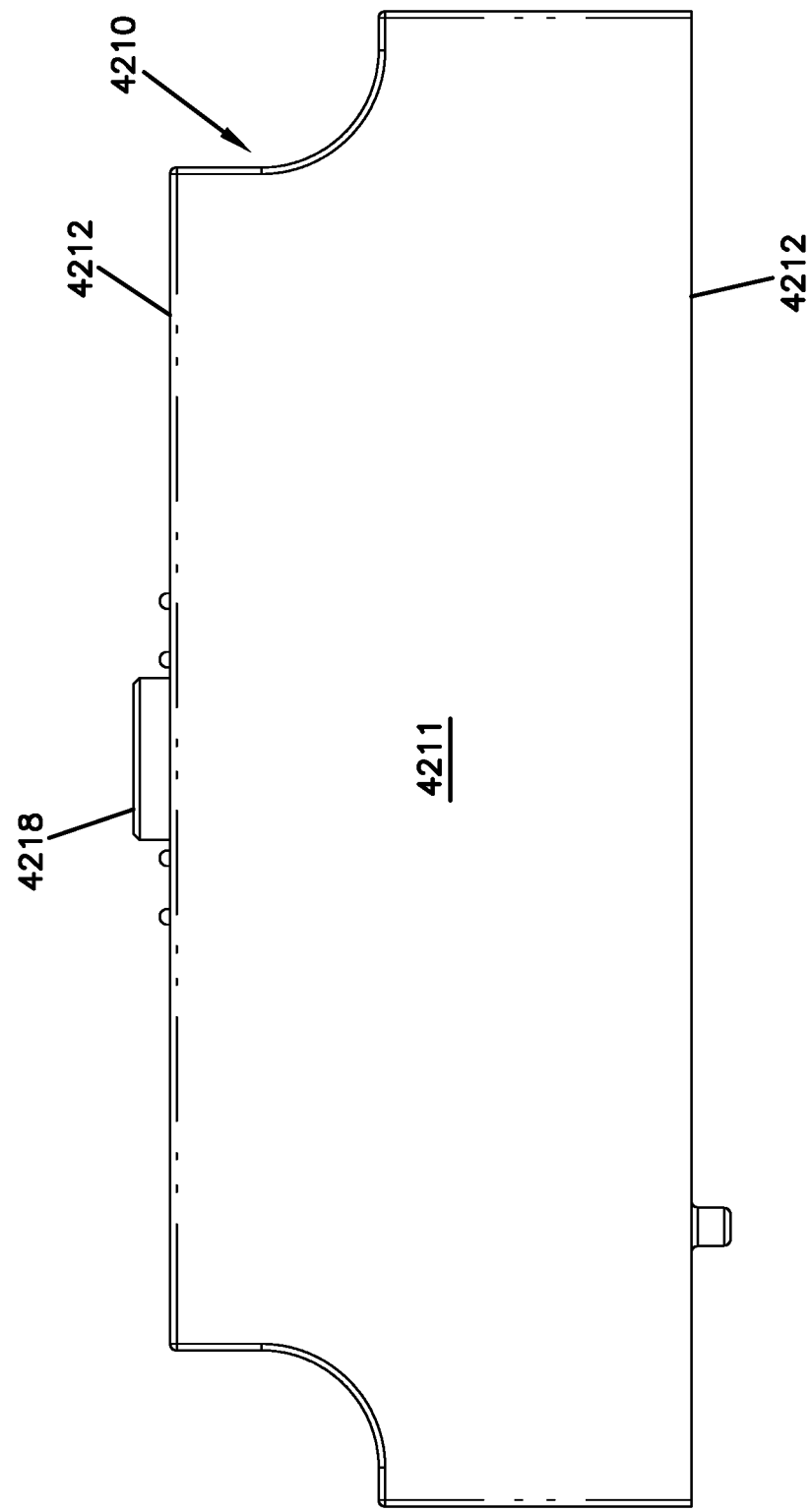

FIGS. 111 and 111A show a third example connector 4110C that includes a key 4115 having a deflection wall 4118. The key 4115 defines a recessed section or cavity 4116C in which a storage device 4130C can be positioned. In the example shown, the cavity 4116C cuts into the deflection wall 4118 of the key 4115. In some implementations, a cover can be positioned over the storage device 4130C to enclose the storage device 4130C within the connector 4111. In other implementations, the storage device 4130C is left uncovered and exposed.

The storage device 4130C shown in FIG. 111A includes contacts 4132C having first sections 4135C that extend over a generally planar circuit board 4131C and contoured sections 4134C that curve, fold, or bend over a contoured section 4136C at the front of the board 4131C. In the example shown, the first sections 4135C of the contacts 4132C have two different lengths. In other implementations, however, the first sections 4135C of the contacts 4132C may all be the same length or may each be a different length. In certain implementations, one or more of the first sections 4135C may be L-shaped and one or more of the first sections 4135C may have a rounded edge. The memory 4133 of the storage device 4130C, which is located on the non-visible side of the board in FIG. 111A, is accessed by sliding or wiping the contact member 4231 (FIG. 119) of the coupler assembly 4200 across the contoured section 4134C of the contacts 4132C.

FIGS. 112-117 show one example implementation of a communications coupler assembly 4200 implemented as a fiber optic adapter. The example communications coupler assembly 4200 includes an adapter housing 4210 defining one or more passages 4215 configured to align and interface two or more fiber optic connectors 4110 (e.g., see FIG. 103). In other example implementations, however, one or more passages 4215 can be configured to communicatively couple together a fiber optic connector 4110 with a media converter (not shown) to convert the optical data signals into electrical data signals, wireless data signals, or other such data signals. In other implementations, however, the communications coupler assembly 4200 can include an electrical termination block that is configured to receive punch-down wires, electrical plugs (e.g., for electrical jacks), or other types of electrical connectors.

The example adapter housing 4210 shown in FIGS. 112-117 is formed from opposing sides 4211 interconnected by first and second ends 4212. The sides 4211 and ends 4212 each extend between a front and a rear. The adapter housing 4210 defines one or more passages 4215 extending between the front and rear ends. Each end of each passage 4215 is configured to receive a connector arrangement or portion thereof (e.g., one fiber optic connector 4110 of duplex connector arrangement 4100 of FIG. 103). In the example shown, the adapter housing 4210 defines four passages 4215. In other implementations, however, the adapter housing 4210 may define one, two, three, six, eight, ten, twelve, sixteen, or even more ports. Sleeves (e.g., split sleeves) 4206 are positioned within the passages 4215 to receive and align the ferrules 4112 of fiber optic connectors 4110 (see FIG. 117).

In the example shown, the body 4210 of the fiber optic adapter 4200 defines four passages 4215. In other implementations, the body 4210 can define greater or fewer passages 4215. For example, in some example implementations, the body 4210 of the fiber optic adapter 4200 can define a single passage 4215 that is configured to optically couple together two fiber optic connectors 4110. In other example implementations, the fiber optic adapter 4200 can define two, eight, or twelve passages 4215 that are each configured to optically couple together two fiber optic connectors 4110. In certain implementations, the adapter housing 4210 also defines latch engagement channel 4217 (FIG. 112) at each port to facilitate retention of the latch arms 4114 of the fiber optic connectors 4110. Each latch engagement channel 4217 is sized and shaped to receive the key 4115 of the connector 4110.

The fiber optic adapter 4210 includes one or more media reading interfaces 4230, each configured to acquire the physical layer information from the storage device 4130 of a fiber optic connector 4110 plugged into the fiber optic adapter 4210. For example, in one implementation, the adapter 4210 can include a media reading interface 4230 associated with each passage 4215. In another implementation, the adapter 4210 can include a media reading interface 4230 associated with each connection end of each passage 4215. In still other implementations, the adapter 4210 can include a media reading interface 4230 associated with each of a set of passages 4215 that accommodate a connector arrangement 4100.

Figure 114:
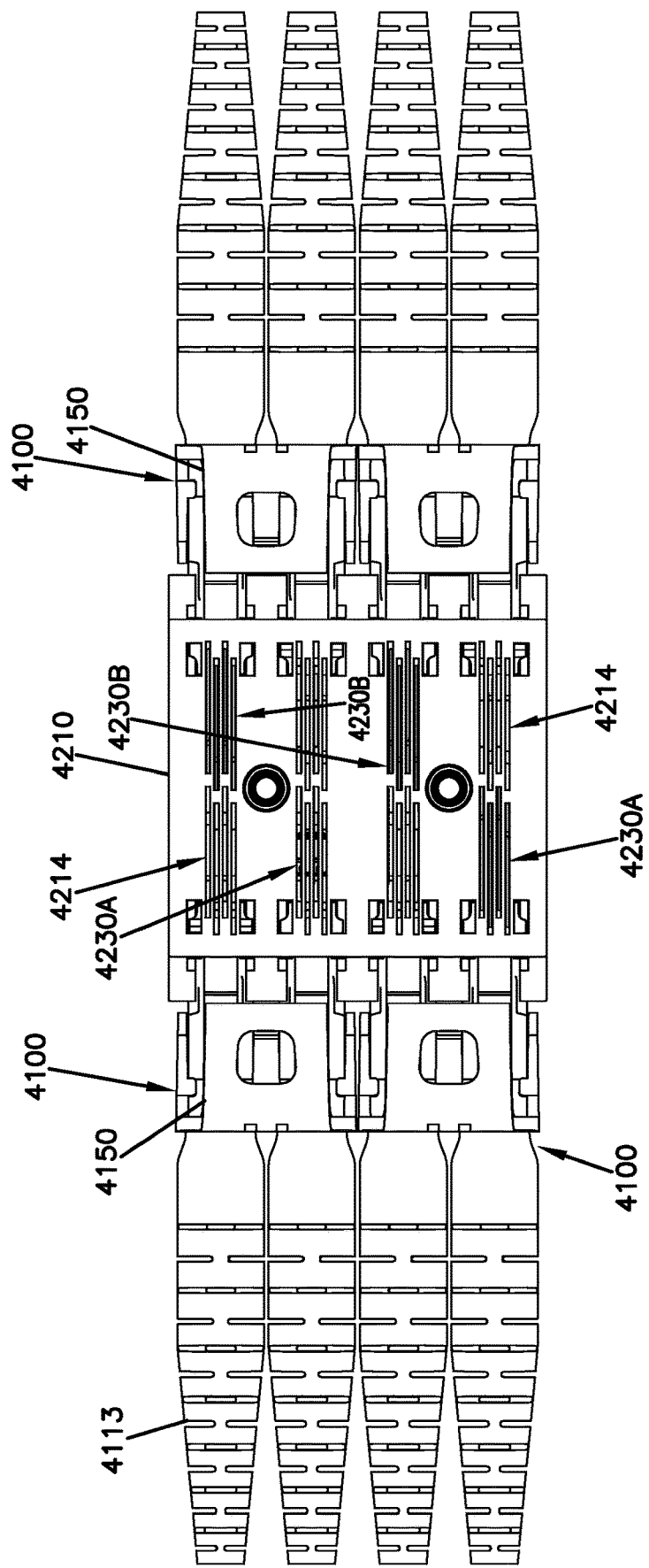

For example, the quadruplex adapter 4210 shown in FIG. 114 includes a media reading interface 4230A at the front connection end of two passages 4215 to interface with two duplex fiber optic connector arrangements 4100 received thereat and two media reading interfaces 4230B at the rear connection end of two passages 4215 to interface with two duplex fiber optic connector arrangements 4100 received thereat. In another implementation, one side of the adapter housing 4210 can include two media reading interfaces 4230 to interface with two duplex fiber optic connector arrangements 4100 and another side of the adapter housing 4210 can include four media reading interfaces to interface with four separate fiber optic connectors 4110. In other implementations, the adapter housing 4210 can include any desired combination of front and rear media reading interfaces 4230.

Figure 119:
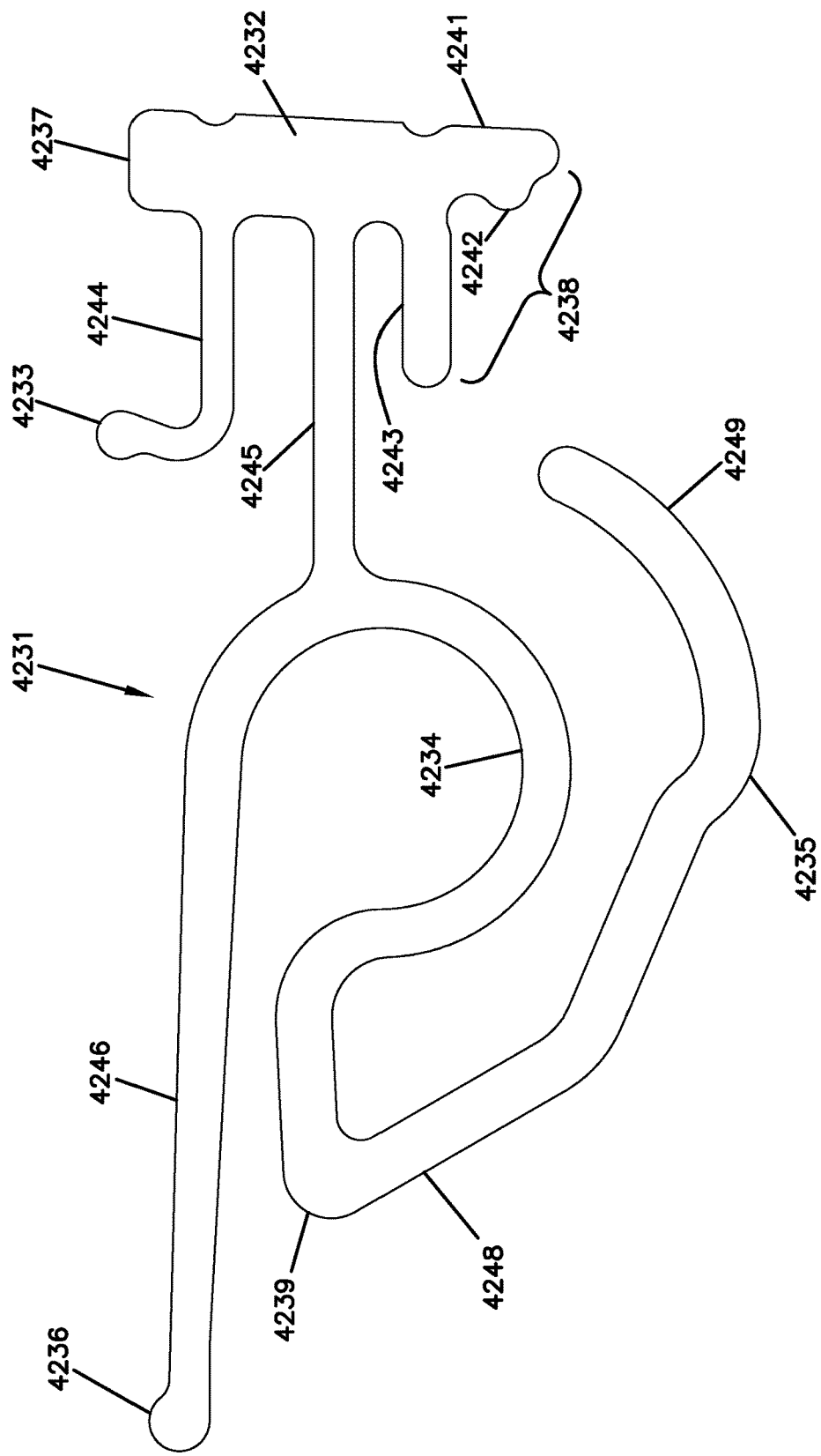

In general, each media reading interface 4230 is formed from one or more contact members 4231 (see FIG. 119). In certain implementations, a top surface of the coupler housing 4210 defines slots 4214 configured to receive one or more contact members 4231. When a connector 4110 with a storage device 4130 is inserted into one of the passages 4215 of the coupler housing 4210, the contact pads 4132 of the storage device 4130 are configured to align with the slots 4214 defined in the adapter housing 4210. Accordingly, the contact members 4231 held within the slots 4214 align with the contact pads 4132.

At least a portion of each slot 4214 extends through the top surface to the passage 4215. In some implementations, the material height of the top surface is at least 0.76 mm (0.03 inches). Indeed, in some implementations, the material height of the top surface is at least 1.02 mm (0.04 inches). In certain implementations, the material height of the top surface is at least 1.27 mm (0.05 inches).

In some implementations, the media reading interface 4230 includes multiple contact members 4231. For example, in certain implementations, the media reading interface 4230 includes at least a first contact member 4231 that transfers power, at least a second contact member 4231 that transfers data, and at least a third contact member 4231 that provides grounding. In one implementation, the media reading interface 4230 includes a fourth contact member. In other implementations, the media reading interface 4230 include greater or fewer contact members 4231.

Figure 115:
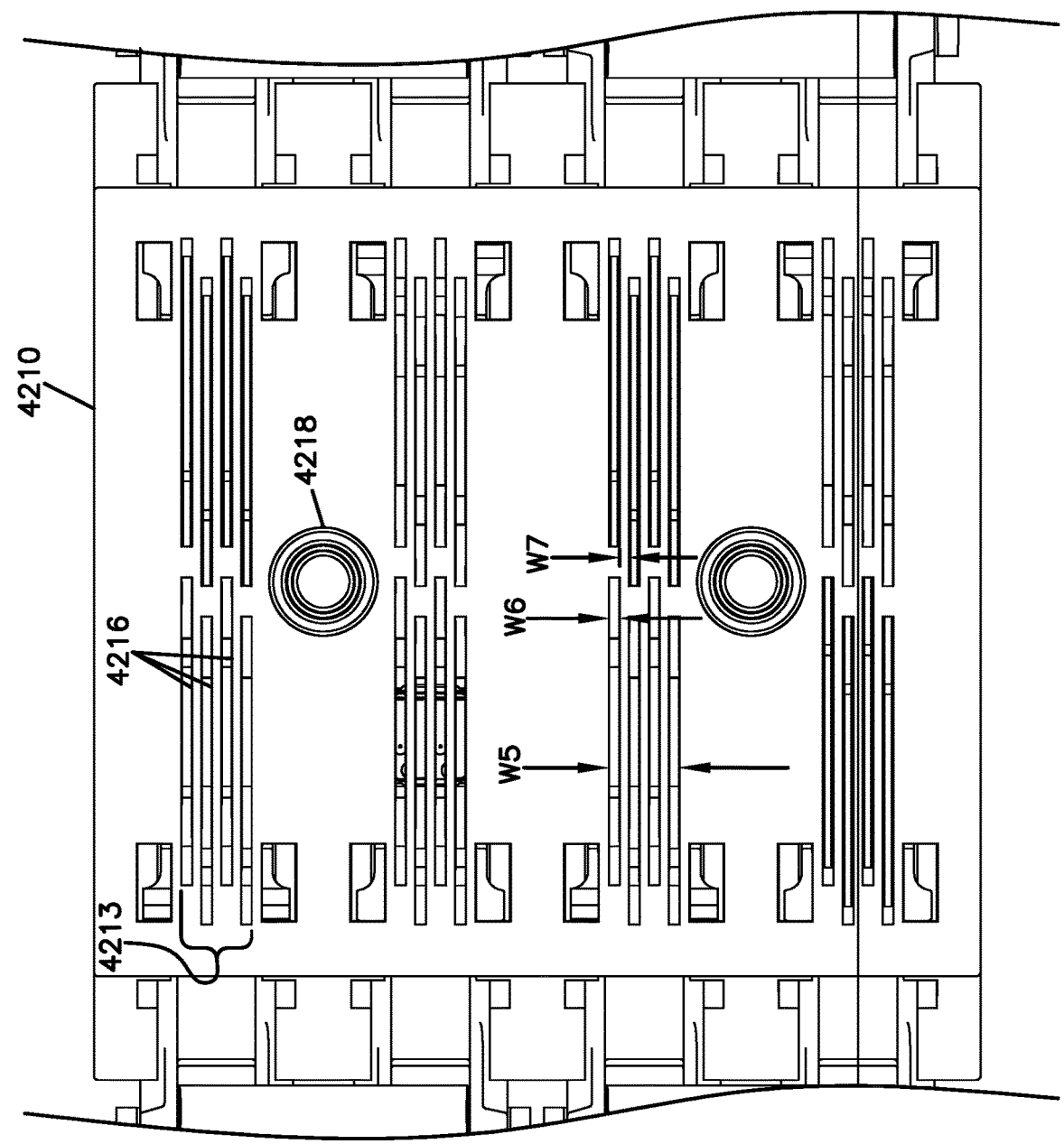
Figure 116:
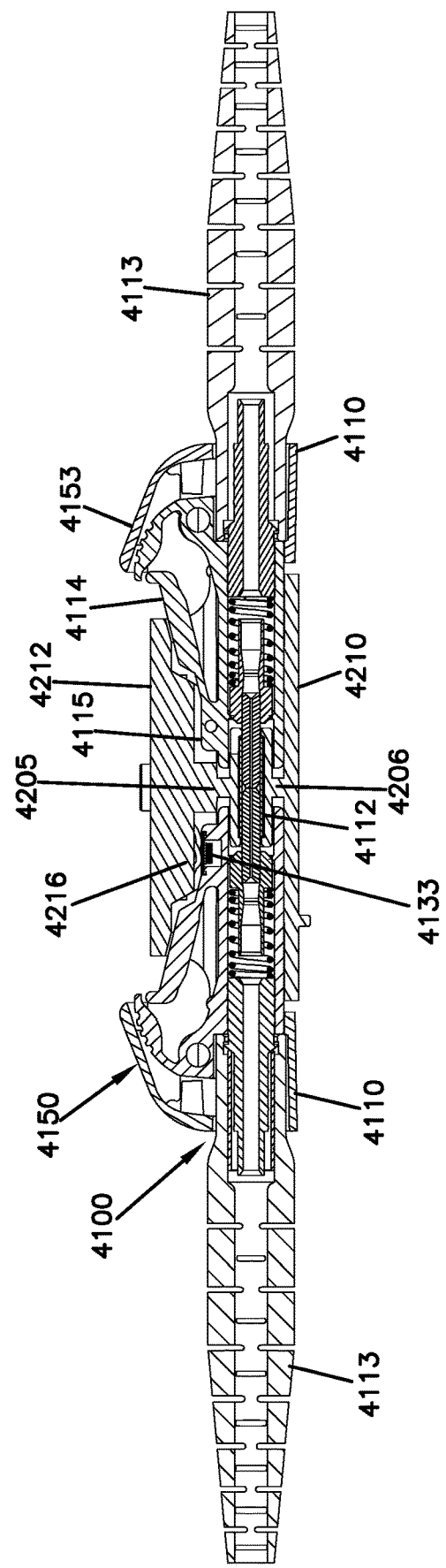
Figure 117:
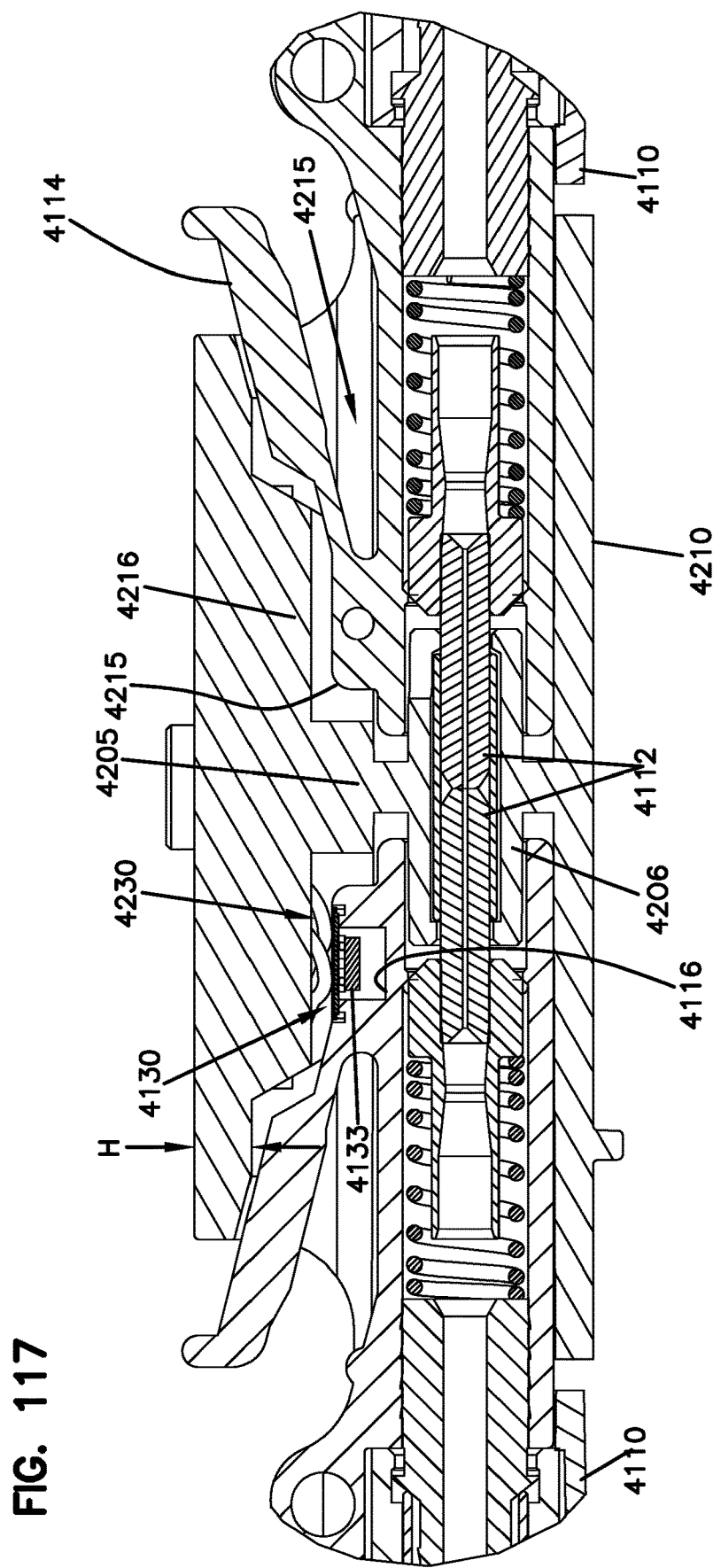

In some implementations, each contact member 4231 is retained within a separate slot 4214. For example, in the implementation shown in FIGS. 112-118, each media reading interface 4230 includes four contact members 4231 that are held in a set 4213 (FIG. 115) of four slots 4214 that align with four contact pads 4132 on a connector storage device 4130. The slots 4214 in each set 4213 are separated by intermediate walls 4216 (FIGS. 115 and 117). In other implementations, all of the contact members 4231 in a single media reading interface 4230 may be retained in a single slot 3214.

In some implementations, the adapter housing 4210 has more sets 4213 of slots 4214 than media reading interfaces 4230. For example, in some implementations, each adapter housing 4210 defines a set 4213 of slots 4214 at each connection end of each passage 4215. In other implementations, however, the adapter housing 4210 may have the same number of slot sets 4213 and media reading interfaces 4231. For example, in certain implementations, each adapter housing 4210 may defines a set 4213 of slots 4214 at only one connection end of each passage 4215. In other implementations, the adapter housing 4210 may define a set 4213 of slots 4214 at each connection end of alternate passages 4215.

In some implementations, the contact members 4231 of a single media reading interface 4230 are positioned in a staggered configuration. In some implementations, the slots 4214 accommodating the staggered contact members 4231 also are staggered. For example, as shown in FIGS. 114-115, alternating slots 4214 can be staggered in a front to rear direction. In other implementations, however, the slots 4214 accommodating the staggered contacts 4231 may each have a common length that is longer than a length of the staggered arrangement of contact members 4231. In still other implementations, the front and rear ends of the contact members 4231 of a single media reading interface 4230 are transversely aligned within similarly transversely aligned slots 4214.

In the example shown in FIGS. 114-115, the slots 4214 defined at front connection ends of the adapter passages 4215 axially align with slots 4214 defined at the rear connection ends. In other implementations, however, the slots 4214 at the front connection ends may be staggered from the slots 4214 at the rear connection ends. As shown in FIGS. 116 and 117, at least one support wall 4205 separates the forward slots 4214 from the rearward slots 4214. Each support wall 4205 extends from the slotted top surface 4212 of the adapter housing 4210 to at least the split sleeve 4206.

In some implementations, a single support wall 4205 extends along a center of the adapter housing 4210 transverse to the insertion axis $A_1$ (FIG. 112) of the passages 4215. For example, a single support wall 4205 may extend through an adapter housing 4210 that defines transversely aligned slots 4214. In other implementations, one or more support walls 4205 may extend between slots 4214 arranged in a staggered configuration. In the example shown, adjacent support walls 4205 are offset from each other along an insertion axis of the passages 4215 to accommodate the staggered slots 4214 arrangements. In certain implementations, the support walls 4205 may connect to or be continuous with the intermediate walls 4216.

As shown in FIG. 115, each set 4213 of slots 4214 accommodating one media reading interface 4230 has a width W5 and each slot 4214 has a width W6. Intermediate walls 4216, which separate the slots 4214 of each set 4213, each have a width W7. In general, the width W5 of each set 4213 of slots 4214 is smaller than the width W8 (FIG. 107) of the key 4115 of the connector 4110 positioned in the respective adapter passage 4215. In some implementations, the width W5 of each set 4213 of slots 4214 is less than 3.35 mm (0.13 inches). Indeed, in some implementations, the width W5 of each set 4213 of slots 4214 is less than about 3.1 mm (0.12 inches). In certain implementations, the width W5 of each set 4213 of slots 4214 is no more than about 2.5 mm (0.10 inches). In one example implementation, the width W5 of each set 4213 of slots 4214 is no more than 2.2 mm (0.09 inches). In one example implementation, the width W5 of each set 4213 of slots 4214 is about 2 mm (0.08 inches). In one example implementation, the width W5 of each set 4213 of slots 4214 is about 2.1 mm (0.081 inches).

In certain implementations, the width W7 of the intermediate walls 4216 is smaller than the width W6 of the slots 4214. In some implementations, the width W6 of each slot 4214 is within the range of about 0.25 mm (0.010 inches) to about 0.64 mm (0.025 inches). Indeed, in some implementations, the width W6 of each slot 4214 is within the range of about 0.25 mm (0.010 inches) to about 0.48 mm (0.019 inches). In one implementation, the width W6 of each slot 4214 is about 0.43-0.44 mm (0.017 inches). In one implementation, the width W6 of each slot 4214 is about 0.41-0.42 mm (0.016 inches). In one implementation, the width W6 of each slot 4214 is about 0.45-0.46 mm (0.018 inches). In one implementation, the width W6 of each slot 4214 is about 0.3 mm (0.012 inches). In one implementation, the width W6 of each slot 4214 is about 0.28 mm (0.011 inches). In one implementation, the width W6 of each slot 4214 is about 0.33 mm (0.013 inches).

In some implementations, the width W7 of each intermediate wall 4216 is within the range of about 0.13 mm (0.005) inches to about 0.38 mm (0.015 inches). In one implementation, the width W7 of each intermediate wall 4216 is about 0.15 mm (0.006 inches). In one implementation, the width W7 of each intermediate wall 4216 is about 0.28 mm (0.011 inches). In one implementation, the width W7 of each intermediate wall 4216 is about 0.28 mm (0.011 inches). In one implementation, the width W7 of each intermediate wall 4216 is about 0.33 mm (0.013 inches). In one implementation, the width W7 of each intermediate wall 4216 is about 0.25 mm (0.010 inches). In certain implementations, the width W7 of each intermediate wall 4216 is within the range of about 0.13 mm (0.005) inches to about 0.18 mm (0.007 inches). In one implementation, the width W7 of each intermediate wall 4216 is about 0.15 mm (0.006 inches).

Figure 118:
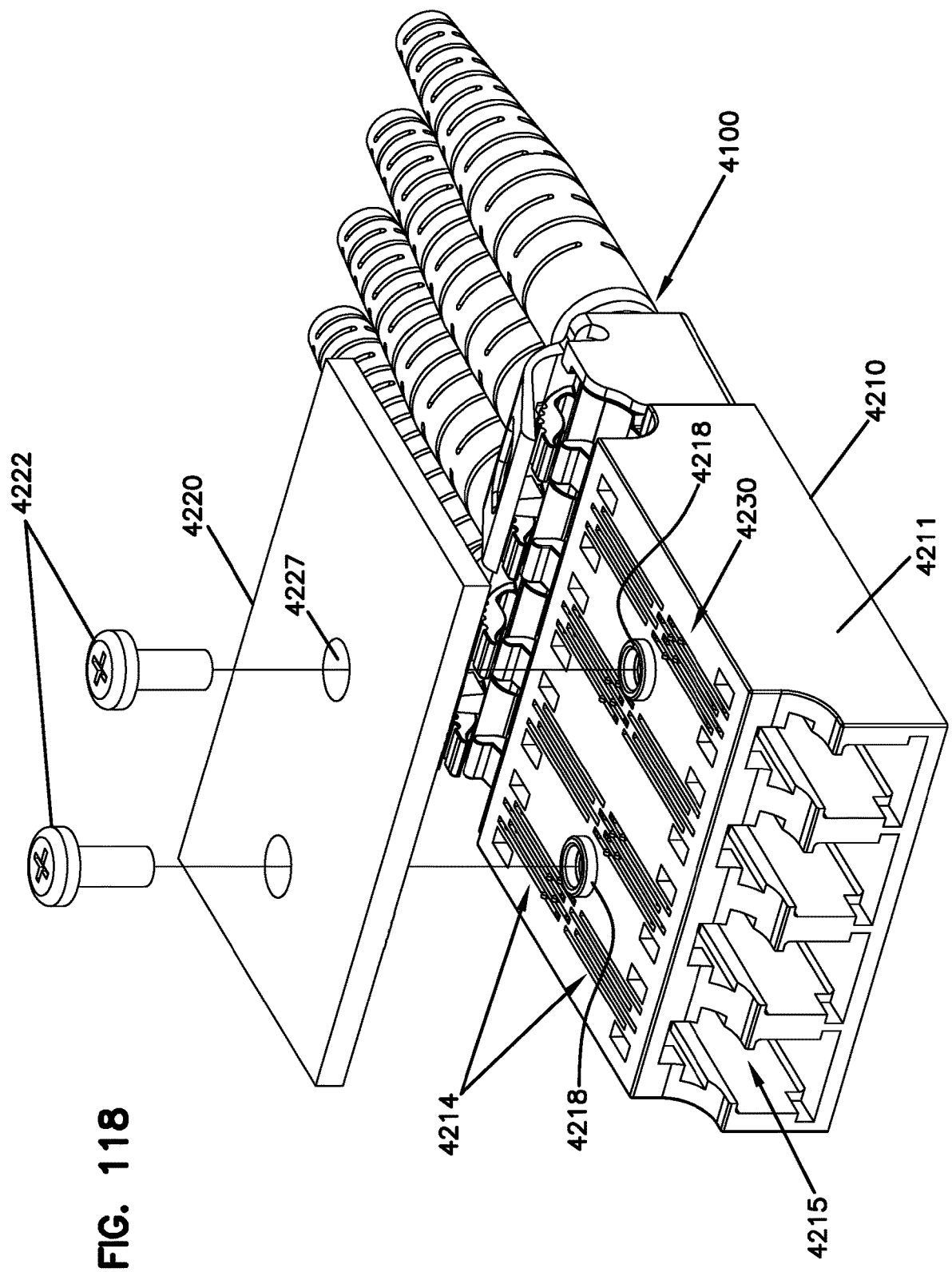

As shown in FIG. 118, a printed circuit board 4220 is configured to secure (e.g., via fasteners 4222) to the adapter housing 4210. In some implementations, the example adapter housing 4210 includes two annular walls 4218 in which the fasteners 4222 can be inserted to hold the printed circuit board 4220 to the adapter housing 4210. Non-limiting examples of suitable fasteners 4222 include screws, snaps, and rivets. For ease in understanding, only a portion of the printed circuit board 4220 is shown in FIG. 118. It is to be understood that the printed circuit board 4220 electrically connects to a data processor and/or to a network interface (e.g., the processor 217 and network interface 216 of FIG. 2). It is further to be understood that multiple communications coupler housings 4210 can be connected to the printed circuit board 4220 within a connector assembly (e.g., a communications panel).

The contact members 4231 extend between the slotted surface of the adapter housing 4210 and the passages 4215. Portions of each contact member 4231 engage contacts and tracings on the printed circuit board 4220 mounted to the slotted surface of the adapter housing 4210. Other portions of the contact members 4231 engage the electrical contacts 4132 of the storage members 4130 attached to any connector arrangements 4100 positioned in the passages 4215 (see FIGS. 123A-123D). A processor coupled to the circuit board 4220 can access the memory 4133 of each connector arrangement 4100 through corresponding ones of the contact members 4231, 4131.

In some implementations, each media reading interface 4230 of the fiber optic adapter 4200 includes four contact members 4231 (see FIG. 112) and each storage device 4130 of the fiber optic connector 4110 includes four contact pads 4132 (see FIGS. 104-111). In the example shown in FIGS. 120-123, two contact members 4231 are visibly positioned within a slot 4214 defined in a fiber optic adapter 4210, shown in cross-section. Two additional contact members 4231 also are positioned in the slot 4214, but cannot be seen since the additional contact members 4231 laterally align with the visible contact members 4231. In other implementations, however, greater or fewer contact members 4231 may be positioned within the housing.

In accordance with some aspects, the media reading interfaces 4230 of the adapter are configured to detect when a connector arrangement is inserted into one or more passages 4215. The contact members 4231 can function as presence detection sensors or trigger switches. In some implementations, the contact members 4231 of a media reading interface 4230 are configured to form a complete circuit with the circuit board 4220 only when a connector 4110 is inserted within a respective passage 4215. For example, at least a portion of each contact member 4231 may be configured to contact the circuit board 4220 only after being pushed toward the circuit board 4220 by a connector 4210. In other example implementations, portions of the contact members 4231 can be configured to complete a circuit until pushed away from the circuit board 4220 or a shorting rod by a connector 4110. In accordance with other aspects, however, some implementations of the contact members 4231 may be configured to form a complete circuit with the circuit board 4220 regardless of whether a connector 4110 is received in a passage 4215.

One example type of contact member 4231 is shown in FIG. 119. Each contact member 4231 includes at least three moveable (e.g., flexible) contact sections 4233, 4235, and 4236 defining contact surfaces. The flexibility of the contact sections 4233, 4235, and 4236 provides tolerance for differences in spacing between the contact member 4231 and the respective printed circuit board 4220 when the coupler assembly 4200 is manufactured. Certain types of contact members 4231 also include at least one stationary contact 4237 having a contact surface of the contact member 4231.

The first moveable contact section 4233 is configured to extend through the slot 4214 and engage the circuit board 4220. The first stationary contact 4237 also is configured to extend through the slot 4214 to engage the circuit board 4220. The ability of the first contact section 4233 to flex relative to the stationary contact 4237 provides tolerance for placement of the contact member 4231 relative to the circuit board 4220. The second moveable contact section 4235 is configured to extend into the passage 4215 and engage the connector 4110 positioned in the passage 4215. If a storage device 4130 is installed on the connector 4110, then the second contact surface 4235 is configured to engage the contact pads 4132 of the storage device 4130.

The third moveable contact surface 4236 is configured to selectively extend through the slot 4214 and engage the circuit board 4220. For example, the third contact surface 4236 may be configured to engage the circuit board 4220 when a connector 4110 is inserted into a passage 4215 corresponding with the contact member 4231. The example contact member 4231 also includes a resilient section 4234 that biases the third contact surface 4236 upwardly through the slot 4214 (e.g., toward the circuit board 4220). In some implementations, the resilient section 4234 defines at least a partial arc. For example, in the implementation shown in FIG. 119, the resilient section 4234 defines a partial circle. In other implementations, the resilient section 4234 may define a series of curves, folds, and/or bends.

The example contact member 4231 is configured to seat in one of the slots 4214 of the adapter housing 4210. For example, the contact member 4231 includes a base 4232 that is configured to abut the support wall 4205 of the adapter housing 4210 (see FIGS. 120-123). In one implementation, the side of the base 4232 that abuts the support wall 4205 is flat. In another implementation, the side of the base 4232 that abuts the support wall 4205 defines one or more notches. One end 4237 of the base 4232 defines a stationary contact 4237 that is configured to extend through the slot 4214 and contact the circuit board 4220.

Another end of the base 4232 defines an attachment section 4238 that engages a portion of the support wall 4205 to secure the contact member 4231 within the slot 4214. In some implementations, the attachment section 4238 of the contact member 4231 includes a first leg 4241 and a second leg 4243 extending from the base 4232 (FIG. 96). In one implementation, the first leg 4241 defines a bump 4242. In one implementation, the attachment section 4238 is configured to snap-fit into the support wall 4205. In other implementations, the attachment section 4238 may otherwise mount to the support wall 4205.

The example contact member 4231 also includes a third leg 4244 that extends outwardly from the base 4232 generally parallel with the second leg 4243. A distal end of the third leg 4244 bends or curves upwardly toward the circuit board 4220. In the example shown, the third leg 4244 is generally J-shaped. In other implementations, the third leg 4244 may be L-shaped, C-shaped, V-shaped, etc. The first contact surface 4233 is defined at the distal end of the third leg 4244. In the example shown, the distal end of the third leg 4244 defines an arched or ball-shaped first contact surface 4233. In one implementation, the first contact section 4233 and/or the stationary contact 4237 may provide grounding for the contact member 4231 through the circuit board 4220.

The contact member 4231 also includes a fourth leg 4245 that extends outwardly from the base 4232. In the example shown, the fourth leg 4245 extends outwardly between the second and third legs 4243, 4244 and generally parallel to the second and third legs 4243, 4244. The fourth leg 4245 separates into first arm 4246, which defines the third contact surface 4236, and a second arm 4247, which defines the second contact surface 4235. The first arm 4246 extends upwardly from the fourth leg 4245 towards the circuit board 4220. For example, in some implementations, the first arm 4246 arcs upwardly into a planar extension that terminates at the third contact surface 4236. In the example shown, the third contact surface 4236 defines an arched or ball-shaped distal end of the first arm 4246.

The second arm 4247 initially extends away from the fourth leg 4245 and subsequently extends back towards the base 4232 to increase the beam length of the contact 4231. For example, in some implementations, the second arm 4247 extends downwardly to define the resilient section 4234 and upwardly into a bend section 4239. From the bend section 4239, the second arm 4247 changes direction (i.e., curves, bends, folds, arcs, angles, etc.) downwardly and back toward the base 4232 along an elongated section 4248, which may be straight or contoured. In the example shown, the elongated section 4248 defines a bend about part-way through.

A tail 4249 extends from the elongated section 4248 toward the base 4230. In the example shown, the tail 4249 curves downwardly to define the second contact surface 4235 before curving upwardly towards the base 4232. As shown in FIGS. 120-123, at least a portion of the elongated section 4248 and the tail 4249 extend completely through the slots 4214 and into the socket 4215. At least a distal end of the tail 4249 of each contact member 4231 extends out of the socket 4215 and back into the respective slot 4214. Accordingly, the tail 4249 is inhibited from touching the adjacent contact members 4231.

At least the tail 4249 of the contact member 4231 is configured to deflect or flex when the front surface 4118 of the key 4115 of a connector 4110 pushes against a portion of the second arm 4247 of the contact member 4231 when a connector 4110 is inserted into the socket 4215. In the example shown, the tail 4249 and the elongated portion 4248 flex when deflected by the key 4115. For example, the elongated portion 4248 and tail 4249 flex when the deflecting surface 4118 pushes against an outer surface of the elongated section 4248. In some implementations, the tail 4249 defines the second contact surface 4235. In other implementations, an outer surface of the elongated section 4248 defines the second contact surface 4235. In still other implementations, the elongated section 4248 and the tail 4249 cooperate to define the second contact section 4235.

The resilient section 4234 is configured to transfer the force applied to a second arm 4247 of the contact member 4231 to the first arm 4246. For example, in some implementations, the resilient section 4234 is configured to lift the first arm 4246 to swipe the third contact surface 4236 against the printed circuit board 4220 (see FIGS. 122, 122A, and 123). In certain implementations, the inner side of the elongated section 4248 is configured to abut against the resilient section 4234 when a connector 4110 is positioned in the passage 4215 to aid in transferring the force to the first arm 4246.

In some implementations, the body of the contact member 4231 extends between a first and second end. In the example shown in FIG. 119, the base 4232 is located at the first end and the third contact section 4236 is located at the second end. The contact member 4231 also extends between a top and a bottom. In some implementations, the contact surfaces of the first and third contact sections 4233, 4236 face the top of the contact member 4231 and the contact surface of the second contact section 4235 faces the bottom of the contact member 4231. In the example shown, the first and third contact sections 4233, 4236 extend at least partially towards the top of the contact member 4231 and the second contact section 4235 extends towards the bottom of the contact member 4231. As used herein, the terms "top" and "bottom" are not meant to imply a proper orientation of the contact member 4231 or that the top of the contact member 4231 must be located above the bottom of the contact member 4231. Rather, the terms are used for ease in understanding and are assigned relative to the viewing plane of FIG. 119.

Figure 123A:
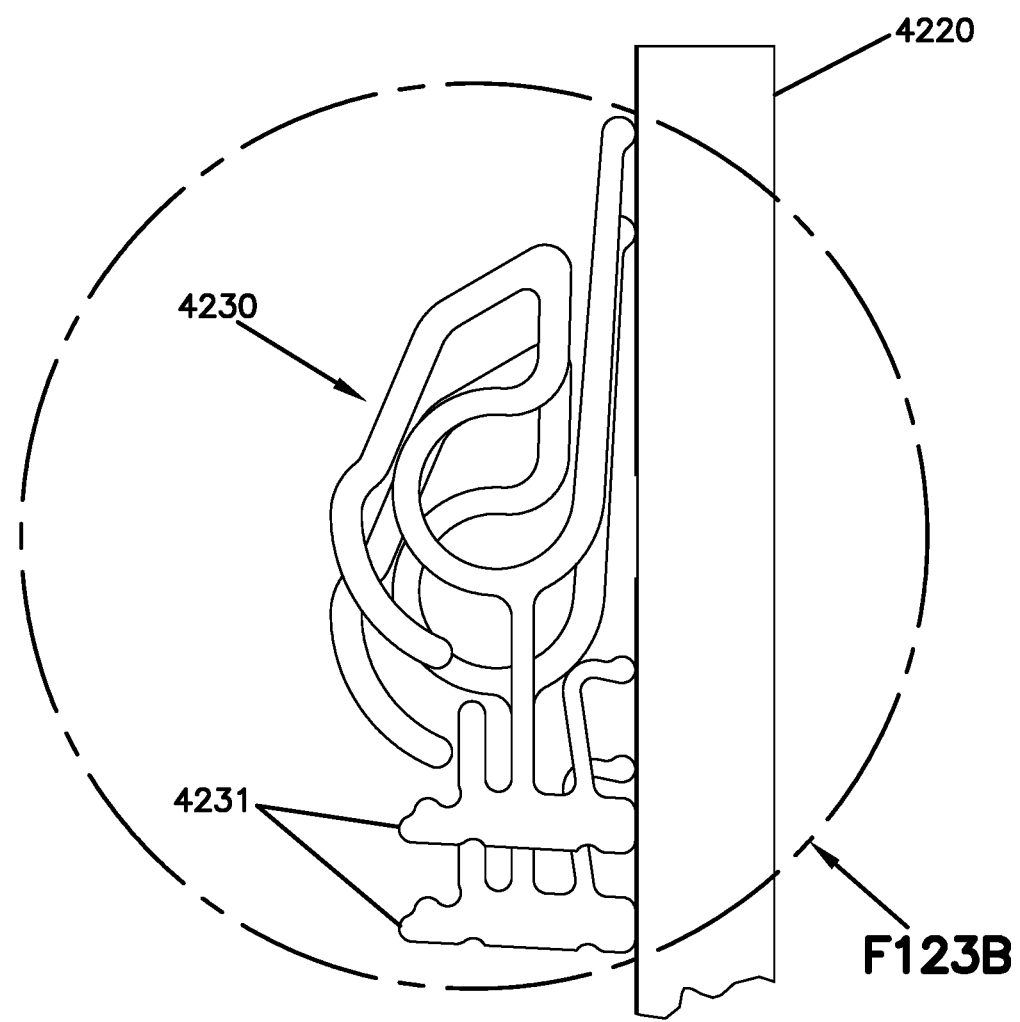
Figure 123B:
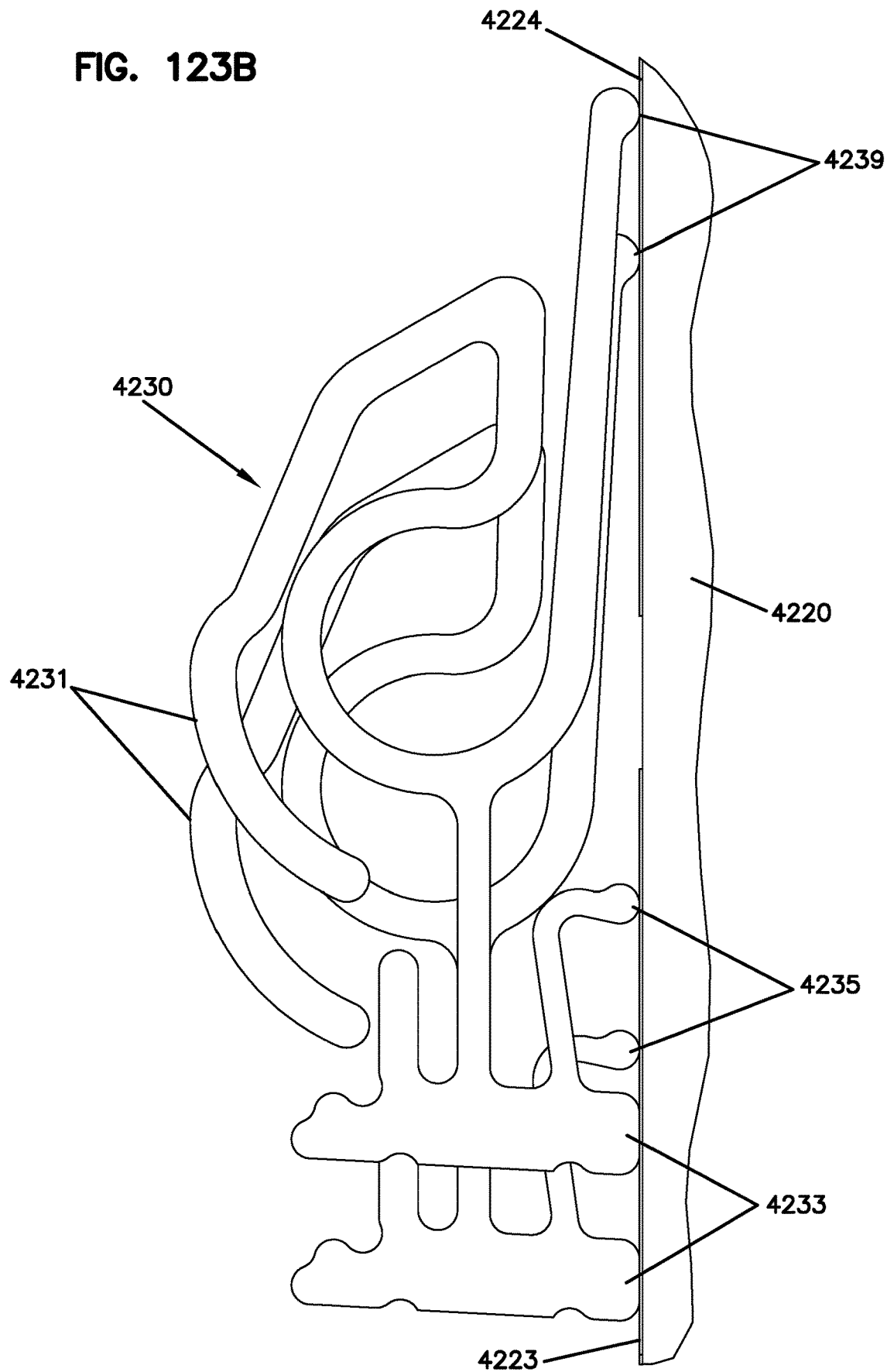
Figure 123C:
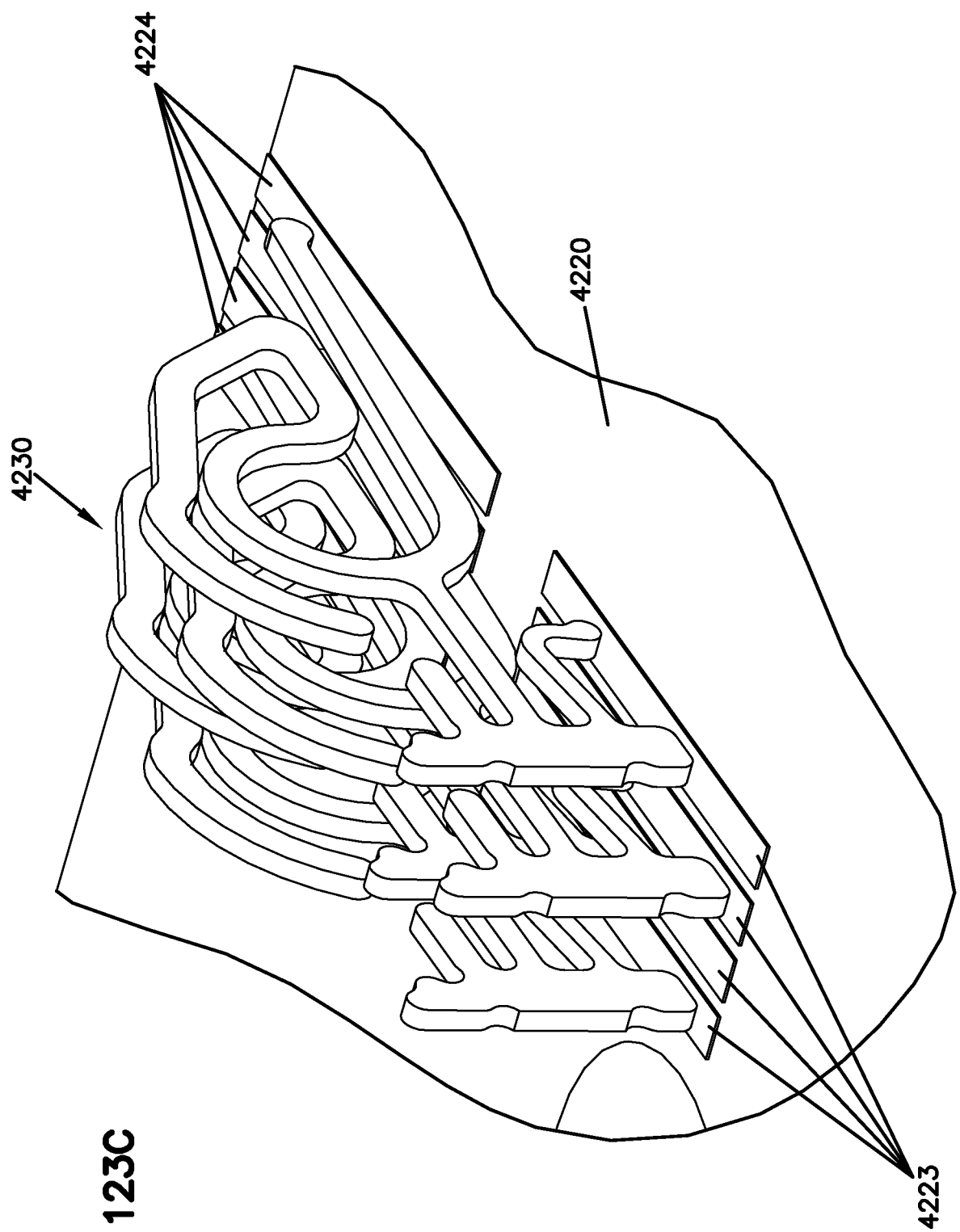
Figure 123D:
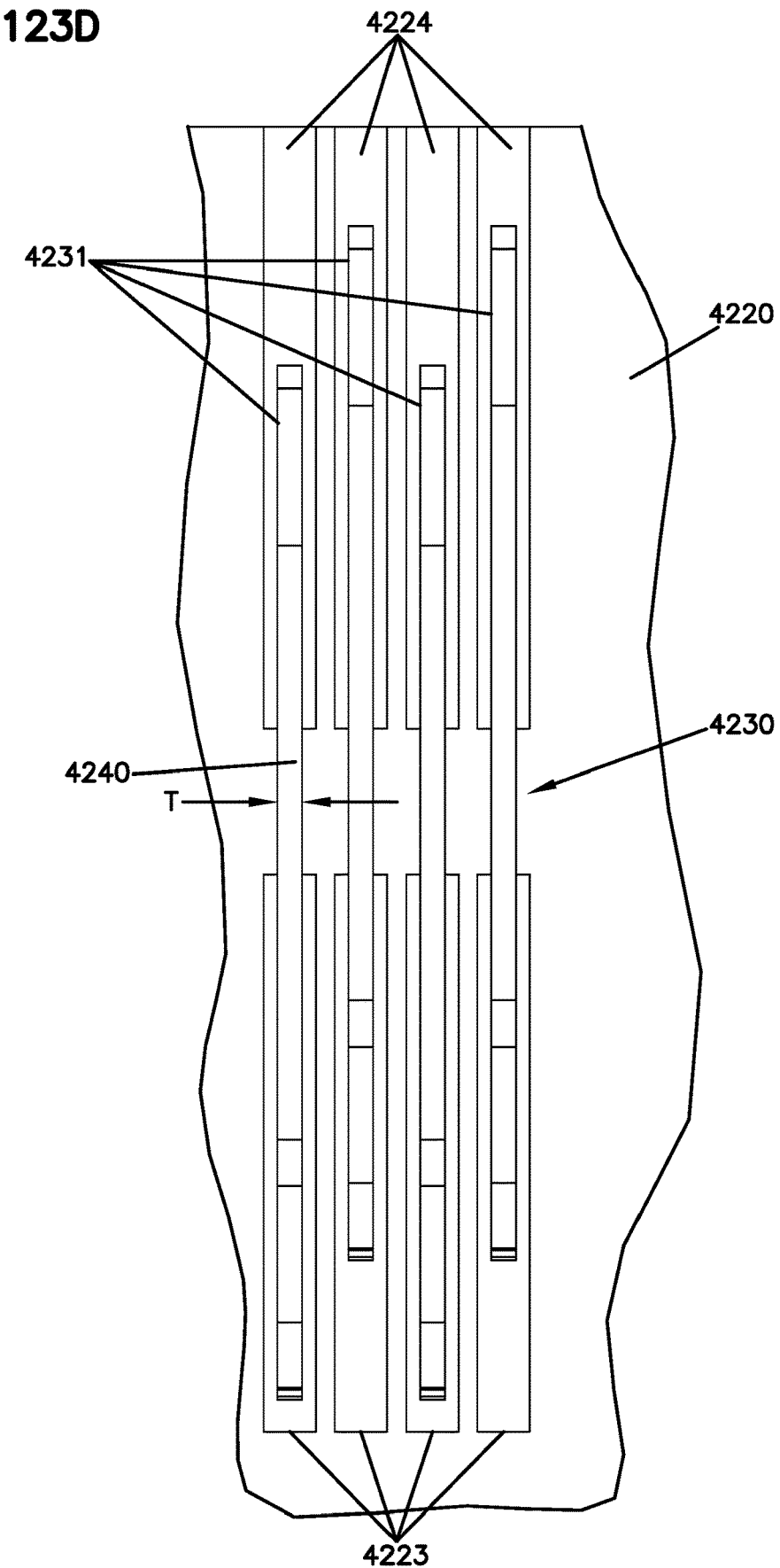

The contact member 4231 defines a body having a circumferential edge 4240 (FIG. 123D) extending between planar major sides (FIG. 119). In certain implementations, the edge 4240 defines the contact surface of each contact section 4233, 4235, 4236, 4237 (see FIG. 122). In some implementations, the edge 4240 has a substantially continuous thickness T (FIG. 123D). In various implementations, the thickness T ranges from about 0.05 inches to about 0.005 inches. In certain implementations, the thickness T is less than about 0.02 inches. In some implementation, the thickness T is less than about 0.012 inches. In another implementation, the thickness T is about 0.01 inches. In another implementation, the thickness T is about 0.009 inches. In another implementation, the thickness T is about 0.008 inches. In another implementation, the thickness T is about 0.007 inches. In another implementation, the thickness T is about 0.006 inches. In other implementations, the thickness T may vary across the body of the contact member 4231.

Portions of the planar surfaces of the contact member 4231 may increase and/or decrease in width. For example, in the example shown in FIG. 119, the base 4232 is wider than each of the arms 4243, 4244, 4245. The bend section 4239 is wider than the resilient section 4234. In certain implementations, each of the contact surfaces of the contact sections 4233, 4235, 4236 are rounded or otherwise contoured. For example, in FIG. 119, the first and third contact sections 4233, 4236 define bulbous tips and the second contact section 4235 defines an arced section extending from a linear section of the contact member 4231 (see FIG. 119).

In one implementation, the contact member 4231 is formed monolithically (e.g., from a continuous sheet of metal or other material). For example, in some implementations, the contact member 4231 may be manufactured by cutting a planar sheet of metal or other material. In other implementations, the contact member 4231 may be manufactured by etching a planar sheet of metal or other material. In other implementations, the contact member 4231 may be manufactured by laser trimming a planar sheet of metal or other material. In still other implementations, the contact member 4231 may be manufactured by stamping a planar sheet of metal or other material.

FIGS. 120-123 illustrate one example contact member 4231 positioned in a slot 4214 of an adapter 4210 before and after insertion of a connector 4110 in a passage 4215 of the adapter 4210. In the example shown, the first leg 4241 of the attachment section 4238 extends generally vertically and the second leg 4243 extends generally horizontally (e.g., see FIGS. 120A, 121A, and 122). In some implementations, the support wall 4205 of the adapter housing 4210 defines a recess or channel 4208 and an extension 4207 (FIG. 120A). When the attachment section 4238 is mounted to the support wall 4205, the first leg 4241 of the attachment section 4238 fits in the recess 4208 and the second leg 4242 seats on the extension 4207. The first contact surface 4233 extends through the slot 4214 and contacts the circuit board 3220.

In some implementations, a support portion 4209 (FIGS. 120A, 121A, and 122) of the adapter housing 4210 projects partially into the passages 4215 opposite the support wall 4205. The support portion 4209 defines a ledge 4219 recessed within each slot 4214. The distal end of the first arm 4246 seats on the ledge 4219 spaced from the circuit board 4220 when a connector 4110 is not positioned within a respective passage 4215 (see FIGS. 120, 120A). Inserting a connector 4110 into the passage 4215 biases the distal end of the first arm 4246 upwardly from the ledge 4219 toward the circuit board 4220 (see FIGS. 121, 121A, 122). In certain implementations, biasing the distal end of the first arm 4246 upwardly causes the third contact surface 4236 to engage (e.g., touch or slide against) the circuit board 4220.

The tail 4249 of the contact member 4231 extends into the passage 4215 associated with the slot 4214. Inserting the connector 4110 into the passage 4215 causes the deflection surface 4118 of the key 4115 of a connector 4110 to press against the outer surface of the elongated section 4248 (see FIGS. 120 and 120A). The deflection surface 4118 deflects the elongated section 4248 and the tail 4249 upwardly and toward the support wall 4205. In certain implementations, the inner surface of the elongated portion 4248 abuts against and applies an upwardly directed pressure to the resilient section 4234 of the contact member 3231. The resilient section 4234 biases the distal end of the first arm 4246 of the contact member 4231 through the slot 4214 to slide or wipe across the circuit board 4220 (see FIGS. 121, 122, and 123).

Accordingly, the presence of the connector 4110 in the passage 4215 may be detected when the deflection surface 4118 of the connector key 4115 engages the contact member 4231.

In some implementations, the connector 4110 does not include a storage device 4130. For example, the connector 4110 may be part of a duplex connector arrangement 4100 in which the other connector 4110 holds the storage device 4130. In other implementations, the connector 4110 may be an existing connector that does not store physical layer information. In other implementations, however, the connector 4110 may include a storage device 4130. In such implementations, the second contact surface 4235 of the contact member 4231 slides or wipes across the surface of the contacts 4132 of the storage device 4130 during insertion of the connector (see FIGS. 121, 121A, 122).

In some implementations, the storage device 4130 is stored in a cavity defined only in a top of the key 4115 (e.g., see FIG. 107). In such implementations, the second contact surface 4235 of the connector 4130 is defined by a leading edge or bottom-most portion of the tail 4249, which slides across the contacts 4132 of the storage device 4130 after the tail 4249 is raised by the deflection surface 4118 of the key 4115. Accordingly, the presence of the connector 4110 within the passage 4215 may be detected before the memory 4133 of the storage device 4130 can be accessed.

In other implementations, the storage device 4130 is accessible through a recess in the deflection surface 4118 (e.g., see FIGS. 109 and 111). In such implementations, the second contact surface 4235 of the connector 4130 is defined by the outer edge of the elongated section 4248, which touches the storage device contacts 4132 as the elongated section 4248 is being deflected by the deflection surface 4118. Accordingly, the presence of the connector 4110 within the passage 4215 may be detected at approximately the same time that the memory 4133 of the storage device 4130 can be accessed.

As discussed above, a processor (e.g., processor 217 of FIG. 2) or other such equipment also can be electrically coupled to the printed circuit board 4220. Accordingly, the processor can communicate with the memory circuitry 4133 on the storage device 4130 via the contact members 4231 and the printed circuit board 4220. In accordance with some aspects, the processor is configured to obtain physical layer information from the storage device 4130. In accordance with other aspects, the processor is configured to write (e.g., new or revised) physical layer information to the storage device 4130. In accordance with other aspects, the processor is configured to delete physical layer information to the storage device 4130. In still other implementations, the processor detects the presence or absence of a connector 4110 in each passage 4215.

Figure 120:
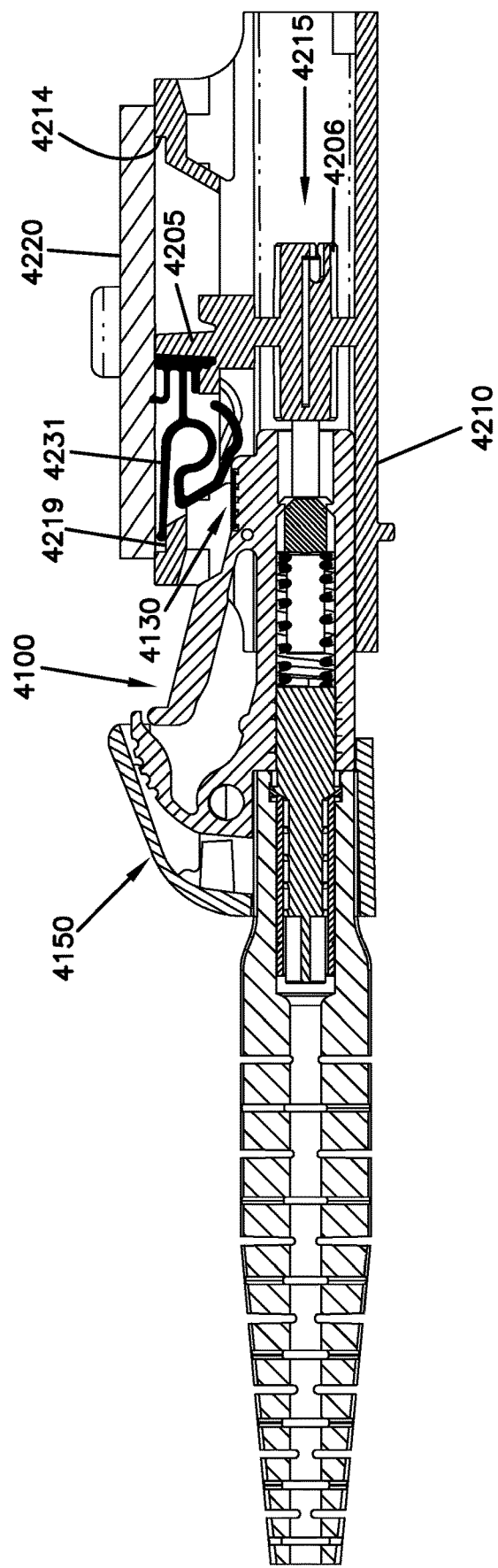
Figure 121:
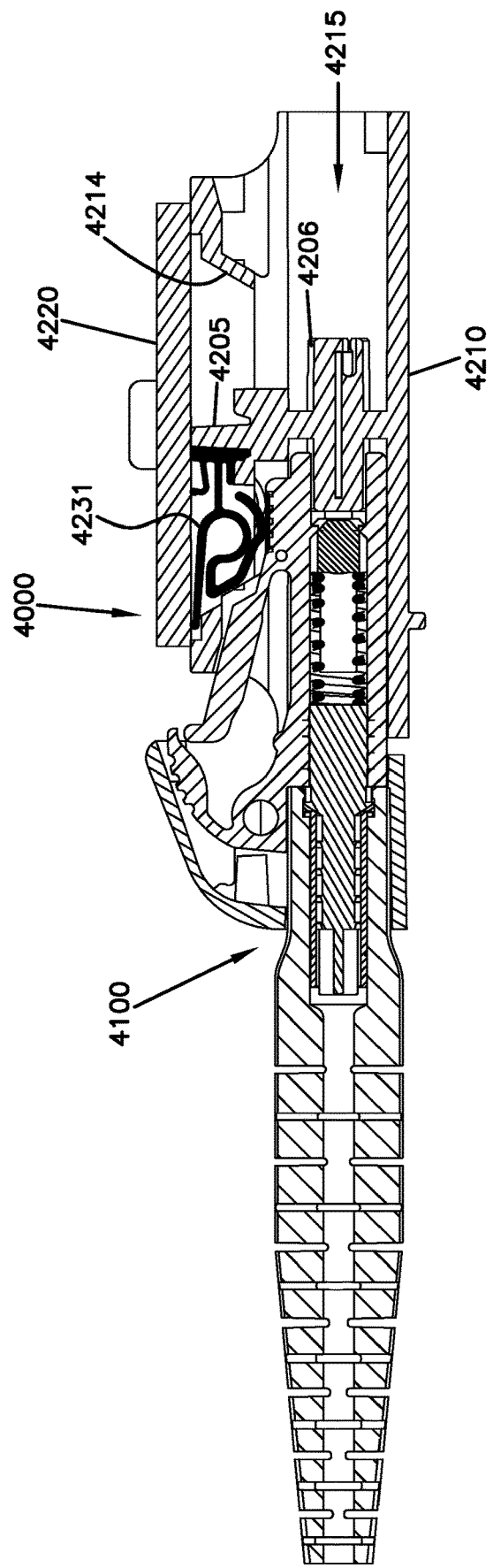
Figure 121A:
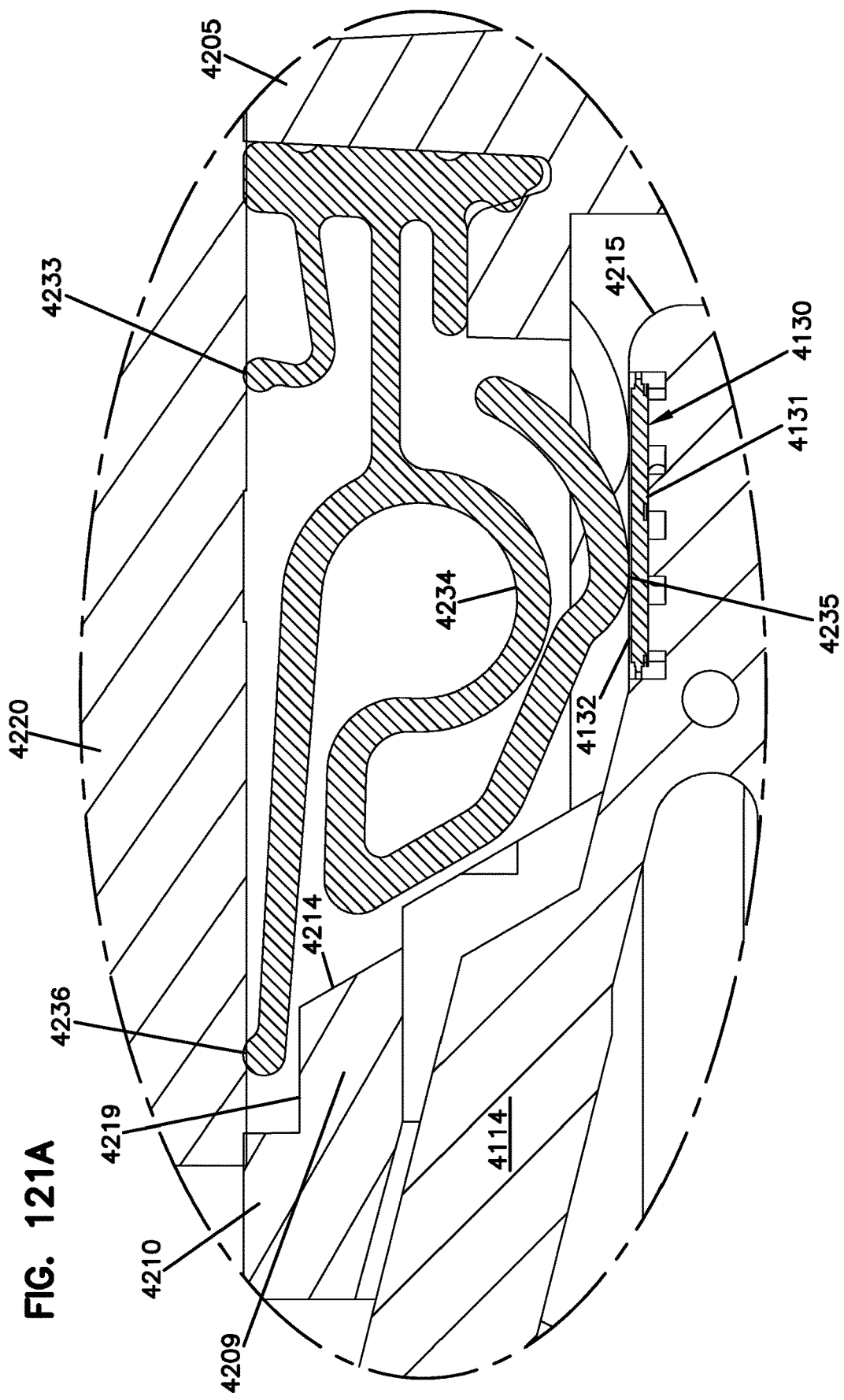
Figure 122:
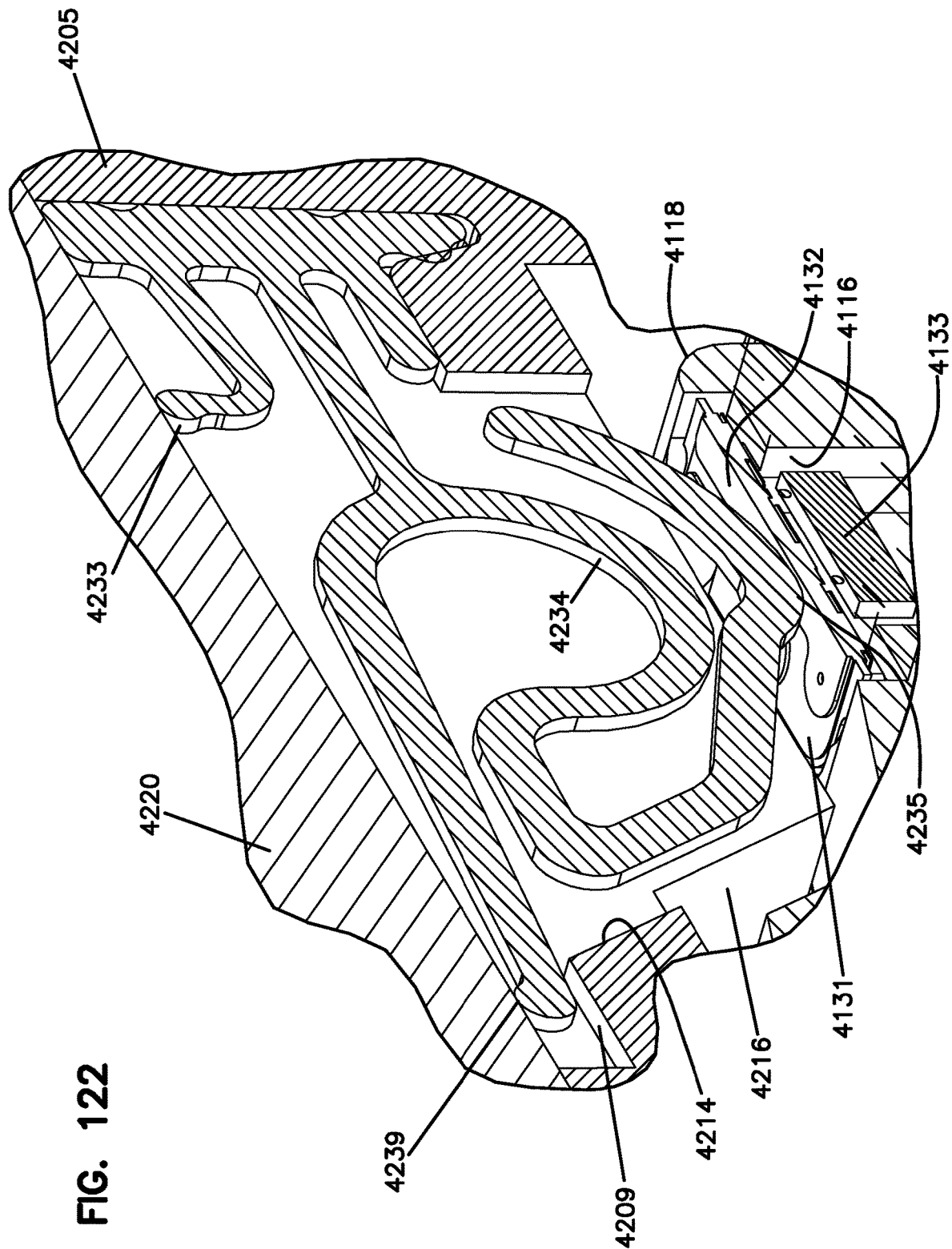

Removing the connector 4110 from the passage 4215 releases the second arm 4247 from the upwardly biased position (see FIG. 121), thereby allowing the elongated portion 4248 and tail 4249 to move back to the unbiased position (see FIG. 120). When in the unbiased position, an upward pressure is no longer applied to the resilient section 4234. Accordingly, the resilient section 4234 allows the distal end of the first arm 4246 to drop into the slot 4214 and rest against the ledge 4219 (see FIG. 120). Dropping the first arm 4246 disengages the third contact surface 4236 from the circuit board 4220, thereby interrupting the circuit created by the contact member 4231. Interrupting the circuit enables a processor connected to the circuit board 4220 to determine that the connector 4110 has been removed from the passage 4215.

FIGS. 123A-123D shows one example implementation of the circuit board 4220 described above. The same or similar circuit boards 4220 are suitable for use in any of the coupler assemblies described herein. In some implementations, the circuit board 4220 defines fastener receiving openings 4227 through which fasteners 4222 may be inserted to secure the circuit board 4220 (see FIG. 118).

The example circuit board 4220 includes a plurality of first contact pads 4223 and a plurality of second contact pads 4224 spaced from the first contact pads 4223. In certain implementations, the first contact pads 4223 are laterally aligned with each other and the second contact pads 4224 are laterally aligned with each other. In other implementations, however, the first contact pads 4223 may be laterally offset or staggered from each other and/or the second contact pads 4224 may be laterally offset of staggered from each other. In certain implementations, each of the first contact pads 4223 is longitudinally aligned with one of the second contact pads 4224 to form a landing pair. In other implementations, however, the first and second contact pads 4223, 4224 may be longitudinally offset from each other.

A media reading interface (e.g., media reading interface 4230) may be seated on the printed circuit board 4220. In the example shown, the first moveable contact surface 4233 of each contact member 4231 of the media reading interface 4230 touches one of the first contact pads 4223. In certain implementations, the stationary contacts 4237 also touch the first contact pads 4223. The third moveable contact surface 4239 of each contact member 4231 is configured to selectively touch the second contact pad 4224 that forms a landing pair with the second contact pad 4223.

FIGS. 124-152 illustrate a fifth example implementation of a connector system 5000 that can be utilized on a connector assembly having PLI functionality as well as PLM functionality. The example connector system 5000 includes at least one communications coupler assembly 5200 positioned between two printed circuit boards 5220. One or more example connector arrangements 5100 (FIGS. 133-134), which terminate segments 5010 of communications media, are configured to communicatively couple to other segments of physical communications media at the coupler assemblies 5200. Accordingly, communications data signals carried by the media segments 5010 terminated by the connector arrangements 5100 can be transmitted to other media segments.

The coupler assembly 5200 includes one or more coupler housings 5210. At least one coupler housing 5210 is sandwiched between a first circuit board 5220A and a second circuit board 5220B (e.g., via fasteners 5222A, 5222B). In some implementations, multiple (e.g., two, three, four, eight, twelve, sixteen, twenty, etc.) coupler housings 5210 may be sandwiched between two circuit boards (e.g., see FIGS. 23 and 24 above). In some implementations, the first circuit board 5220A can be electrically coupled to the second circuit board 5220B via a fixed connector (e.g., a card edge connector). In other implementations, the first circuit board 5220A can be electrically coupled to the second circuit board 5220B via a flexible or ribbon cable arrangement. In still other implementations, the circuit boards 5220A, 5220B are interconnected using other suitable circuit board connection techniques.

Figure 124:
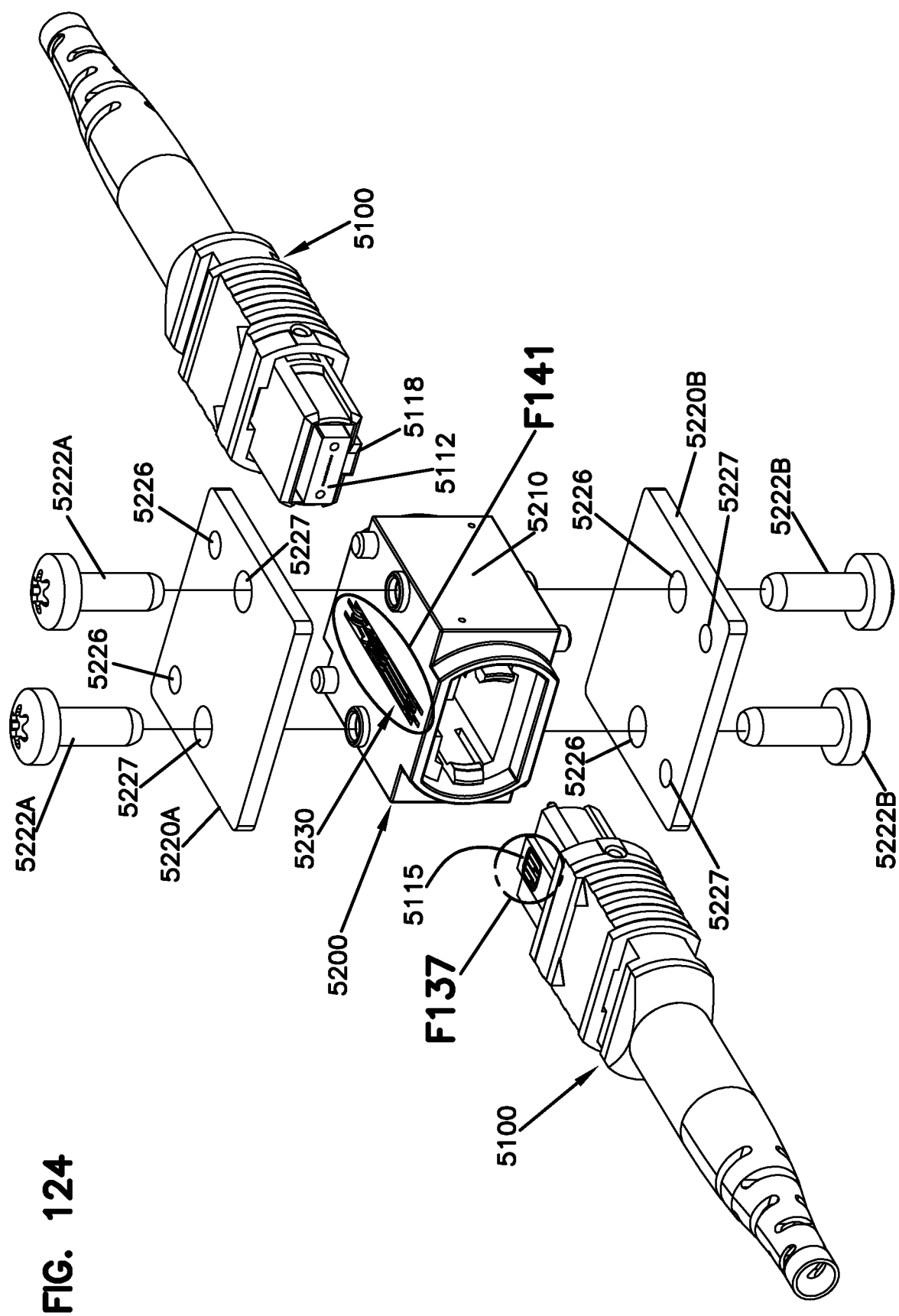
Figure 125:
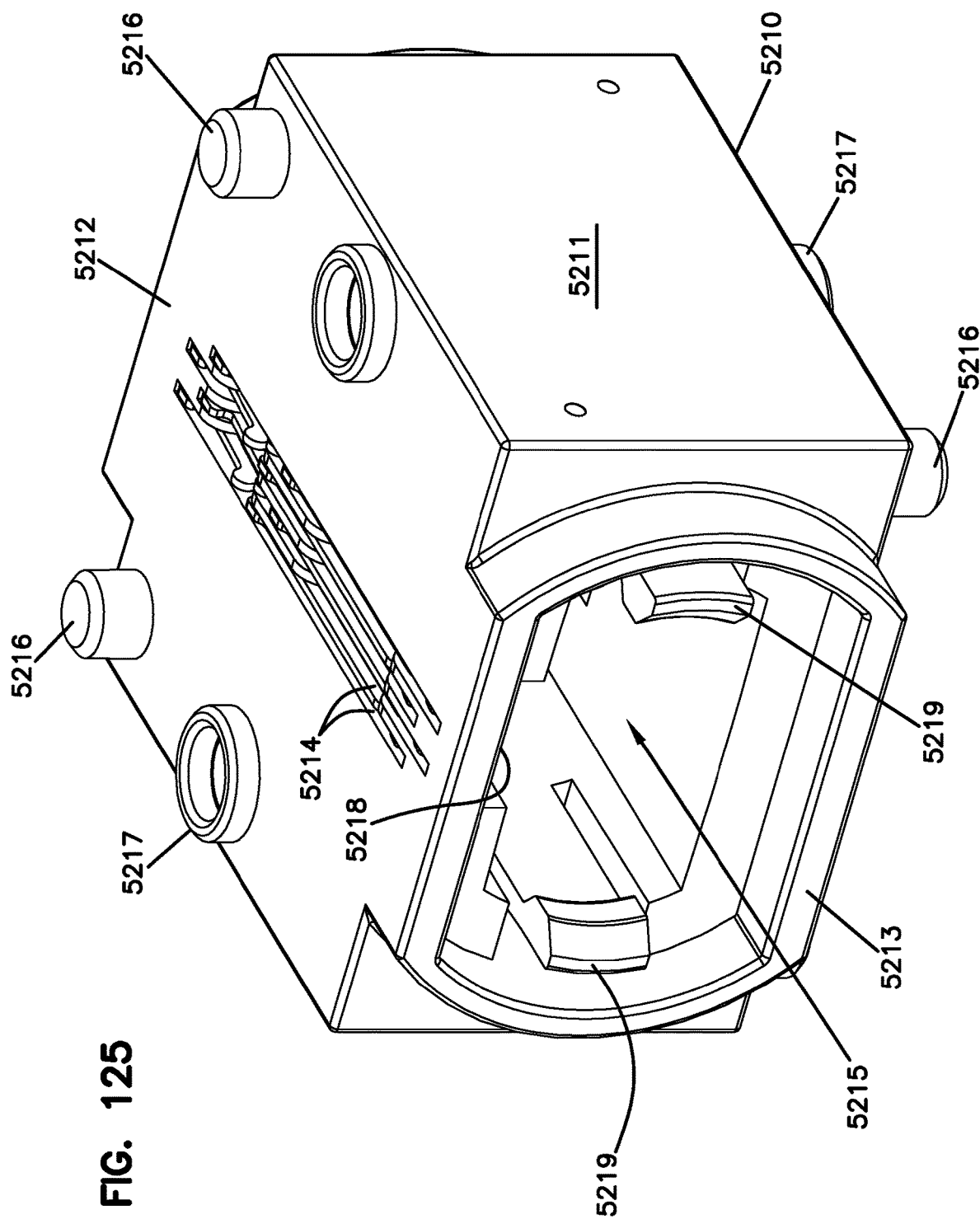
Figure 126:
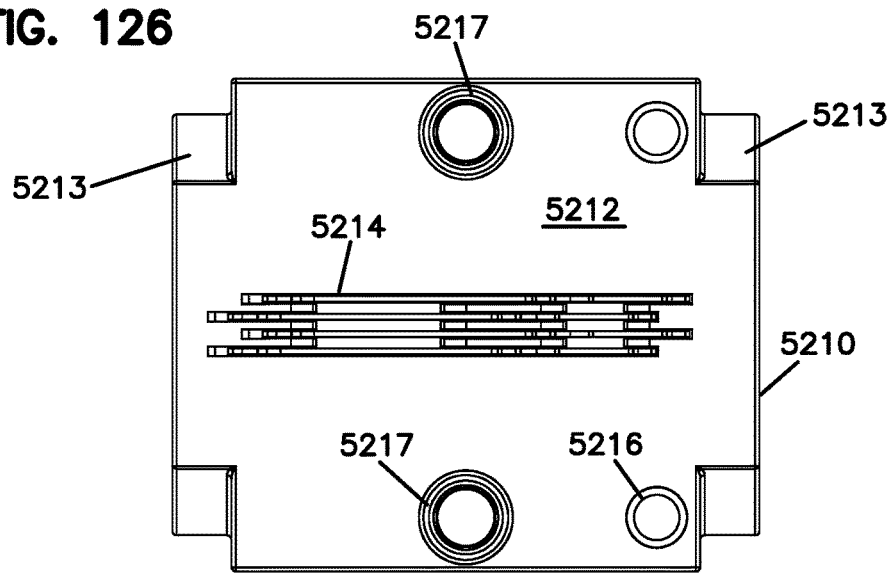
Figure 127:
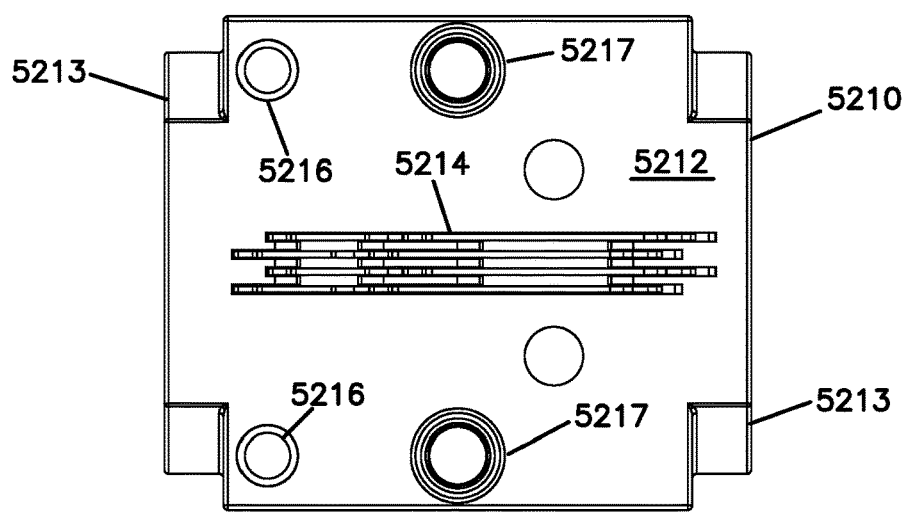
Figure 128:
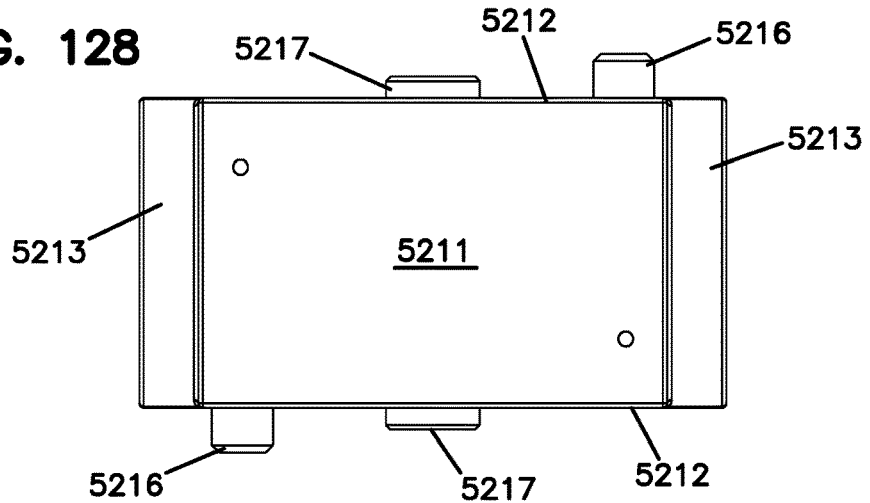

For ease in understanding, only portions of the example printed circuit boards 5220A, 5220B of the connector system 5000 are shown in FIG. 124. It is to be understood that the printed circuit boards 5220A, 5220B electrically connect to a data processor and/or to a network interface (e.g., processor 217 and network interface 216 of FIG. 2) as part of a connector assembly 5200. As noted above, non-limiting examples of such connector assemblies 5200 include bladed chassis and drawer chassis. Furthermore, additional coupler housings 5210 can be connected to different portions of the printed circuit boards 5220A, 5220B or at other locations within an example connector assembly.

One example coupler housing 5210 is shown in FIGS. 125-132. The example coupler housing 5210 defines a single passage 5215 extending between opposite open ends (e.g., a front and rear of the coupler housing 5210). In other example implementations, however, each coupler housing 5210 can include a greater number (e.g., two, three, four, six, eight, twelve, etc.) of passages 5215. Each open end of each passage 5215 is configured to receive a segment of communications media (e.g., a connectorized end of an optical fiber 5010). In some implementations, flexible latching tabs 5219 are located at the entrances of the passages 5215 to aid in retaining connector arrangements 5100 within the passages 5215. In the example shown, each latching tab 5219 defines a ramped surface and latching surface.

In the example shown, each coupler housing 5210 is implemented as a fiber optic adapter configured to receive Multi-fiber Push-On (MPO) connectors. Each passage 5215 of the MPO adapters 5210 is configured to align and connect two MPO connector arrangements 5100 (see FIGS. 145-147). In other implementations, each passage 5215 can be configured to connect other types of physical media segments. For example, one or more passages 5215 of the MPO adapters 5200 can be configured to communicatively couple together an MPO connector arrangement 5100 with a media converter (not shown) to convert the optical data signals into electrical data signals, wireless data signals, or other type of data signals.

In the example shown in FIGS. 125-132, each adapter 5210 is formed from opposing sides 5211 interconnected by first and second ends 5212. The sides 5211 and ends 5212 each extend between an open front and an open rear to define the passage 5215. In some implementations, the sides 5211 and ends 5212 define a generally rectangular box. In certain implementations, a port entrance 5213 extends from the front and rear of the adapter 5210. In certain implementation, the port entrance 5213 is oblong-shaped. In the example shown, the entrance 5213 is obround-shaped having planar top and bottom surfaces and rounded side surfaces.

Figure 149:
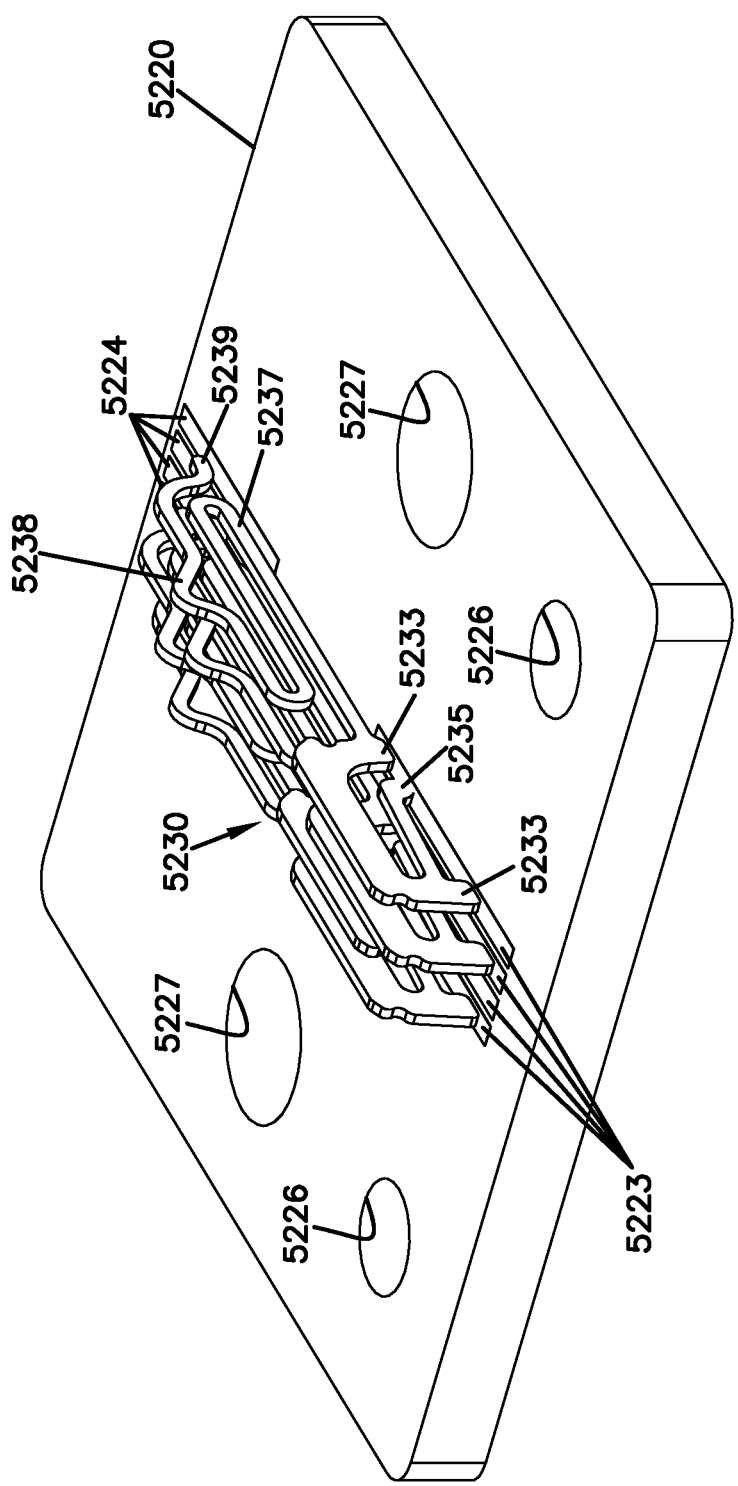
Figure 150:
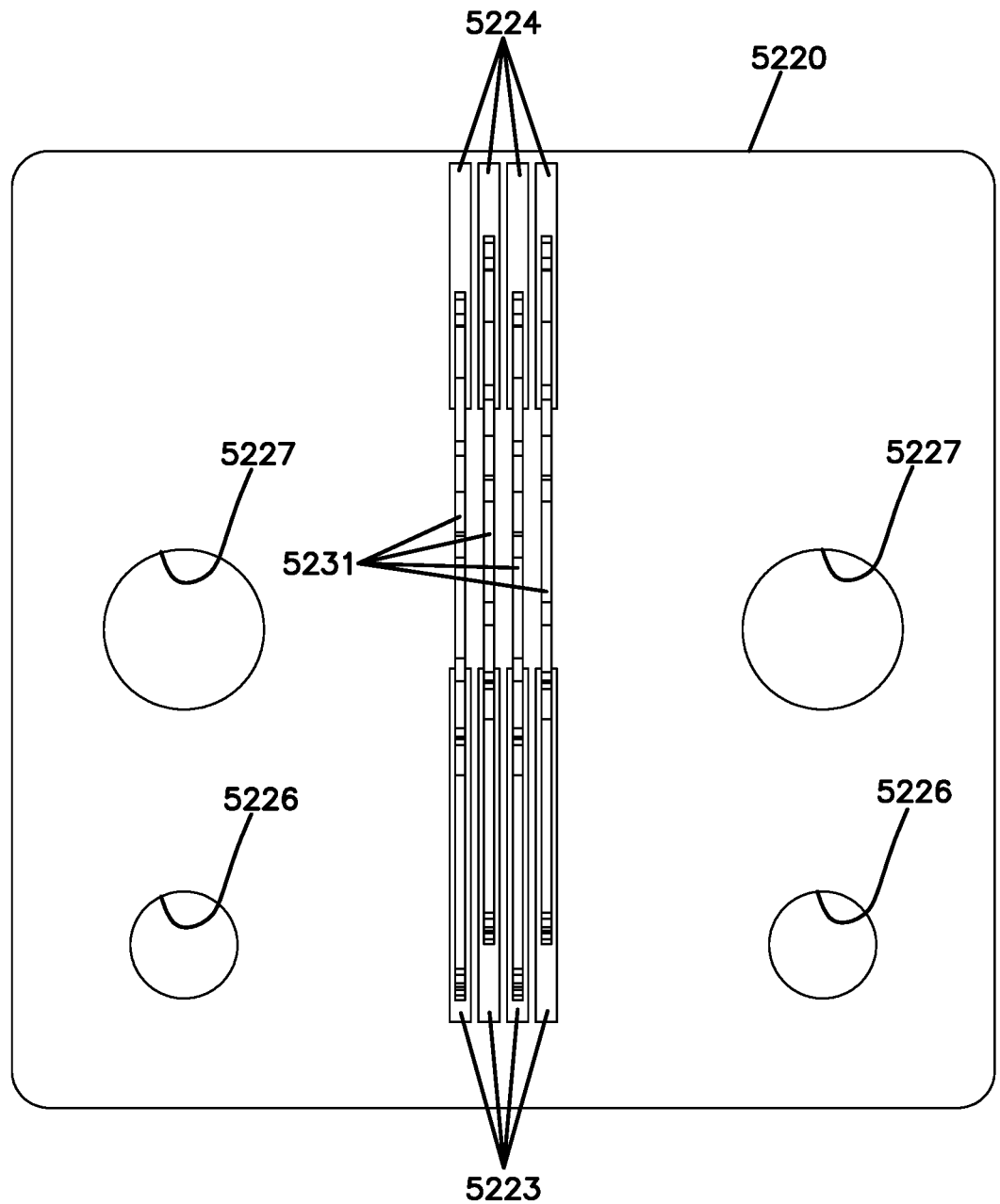

The adapter 5210 also includes mounting stations 5217 at which fasteners 5222 (FIG. 124) can be received to secure the adapter 5210 to one or more printed circuit boards 5220. In certain implementations, the fasteners 5222 pass through mounting openings 5227 defined by the printed circuit board 5220 (FIGS. 149-150). Non-limiting examples of suitable fasteners 5222 include screws, snaps, and rivets. For example, the mounting stations 5217 can aid in securing the adapter 5210 to the upper circuit board 5220A and the lower circuit board 5220B (see FIG. 124). In other implementations, the mounting stations 5217 can include latches, panel guides, or other panel mounting arrangements.

In some implementations, the adapter 5210 also includes alignment lugs 5216 that facilitate mounting the adapter 5210 to the circuit boards 5220 in the correct orientation. For example, the alignment lugs 5216 may align with openings 5226 (FIGS. 149-150) defined in the circuit boards 5220 (e.g., see FIG. 124). Accordingly, the alignment lugs 5216 inhibit mounting of the adapter 5210 backwards on one or both of the circuit boards 5220. In the example shown, two alignment lugs 5216 extend from a first end 5212 of the adapter 5210 at the front of the adapter 5210 and two alignment lugs 5216 extend from a second end 5212 of the adapter 5210 at the rear of the adapter 5210. In other implementations, however, greater or fewer alignment lugs 5216 may extend from the ends 5212 in the same or a different configuration to form a keying arrangement with the printed circuit board 5220.

The MPO adapter 5210 also defines channels 5218 extending partly along the length of the passages 5215 (e.g., see FIGS. 129, 131, and 146) to accommodate portions of the fiber connector arrangements 5100. In some implementations, the adapter 5210 may define a channel 5218 extending inwardly from each open end of the passage 5215. In one example implementation, a first channel 5218 extends along a top of the housing 5210 from a first end of each passage 5215 and a second channel 5218 extends along a bottom of the housing 5210 from a second end of each passage 5215.

Each adapter housing 5210 includes at least one media reading interface 5230 (e.g., see FIGS. 129, 131, and 146) configured to acquire the physical layer information from a storage device 5130 of a fiber connector arrangement 5100 (see FIGS. 134-139). In the example shown, each MPO adapter 5210 includes at least one media reading interface 5230 that is configured to communicate with the storage device 5130 on an MPO connector 5110 plugged into the MPO adapter 5210. For example, in one implementation, the adapter 5210 can include a media reading interface 5230 associated with each passage 5215. In another implementation, the adapter 5210 can include a media reading interface 5230 associated with each connection end of a passage 5215. As shown in FIGS. 130 and 132, each media reading interface 5230 includes one or more contact members 531 at least extending into the channels 5218 of the adapter 5210.

Figure 134:
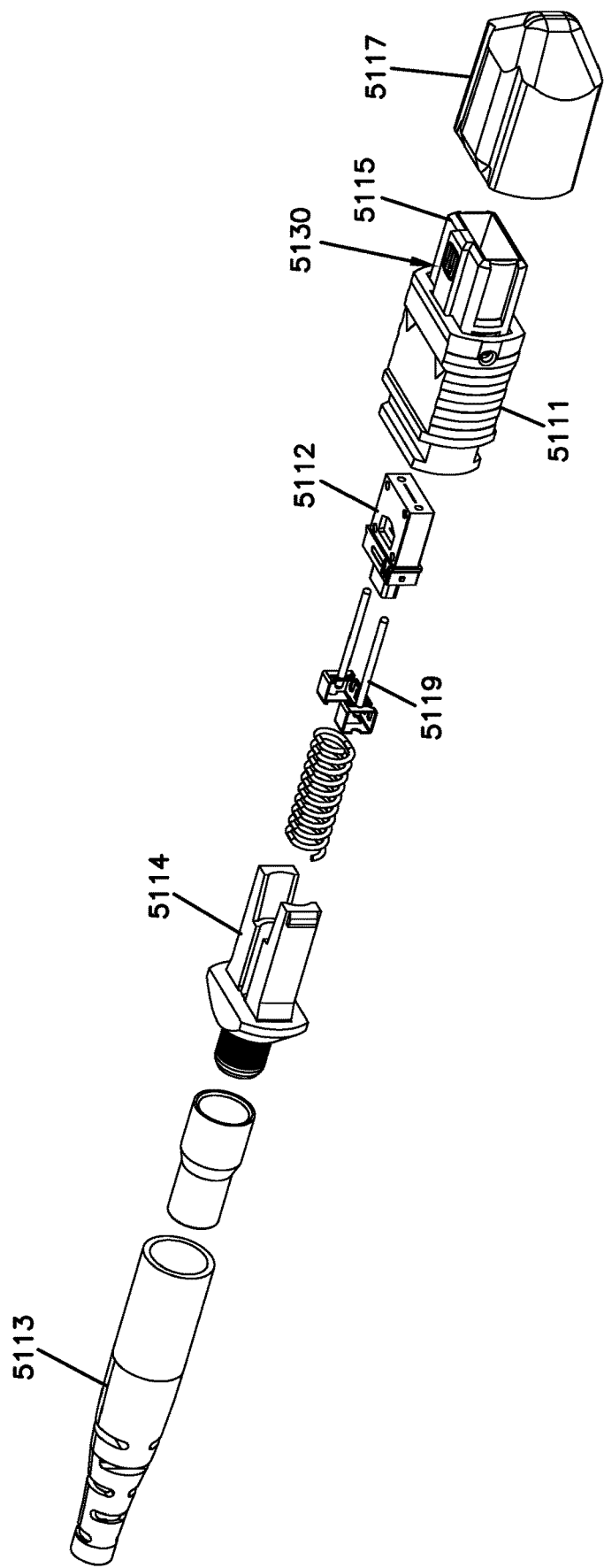

FIGS. 133-139 show one example implementation of a connector arrangement 5100 implemented as an MPO connector 5110 that is configured to terminate a multi-fiber optical cable 5010. As shown in FIG. 134, each MPO connector 5110 includes a front connector body 5111 and a rear connector body 5114 enclosing a ferrule 5112 (FIG. 134) that retains multiple optical fibers (e.g., 2, 3, 4, 8, 12, or 16 fibers). The front connector body 5111 includes a key 5115 that is configured to fit in a keying slot or channel (e.g., channel 5218) defined in the adapter 5210 to properly orient the connector 5100. The key 5115 includes a raised (i.e., or stepped up) portion of the front connector body 5111 located adjacent the ferrule 5112.

In certain implementations, the connector 5110 includes a pin arrangement 5119 that extends from a front of the ferrule 5112. In other implementations, the connector 5110 defines openings in the ferrule 5112 for receiving the pin arrangement 5119 of another connector 5100 to align the ferrules 5112 of the two connectors 5110 (e.g., see FIGS. 145-147). The rear connector body 5114 is secured to a boot 5113 to provide bend protection to the optical fibers. An example MPO dust cap 5118 is configured to mount to the front connector body 5111 to cover and protect the ferrule 5112.

Each connector arrangement 5100 is configured to store physical layer information (e.g., media information). For example, the physical layer information can be stored in a memory device 5130 mounted on or in the connector 5110. One example storage device 5130 includes a printed circuit board 5131 on which memory circuitry can be arranged (e.g., see FIGS. 137-139). Electrical contacts 5132 also may be arranged on the printed circuit board 5131 for interaction with a media reading interface of the communications coupler assembly 5200 (described in more detail herein). In one example implementation, the storage device 5130 includes an EEPROM circuit 5133 arranged on the printed circuit board 5131. In the example shown in FIG. 134, an EEPROM circuit 5133 is arranged on the non-visible side of the circuit board 5131. In other implementations, however, the storage device 5130 can include any suitable type of non-volatile memory.

Figure 135:
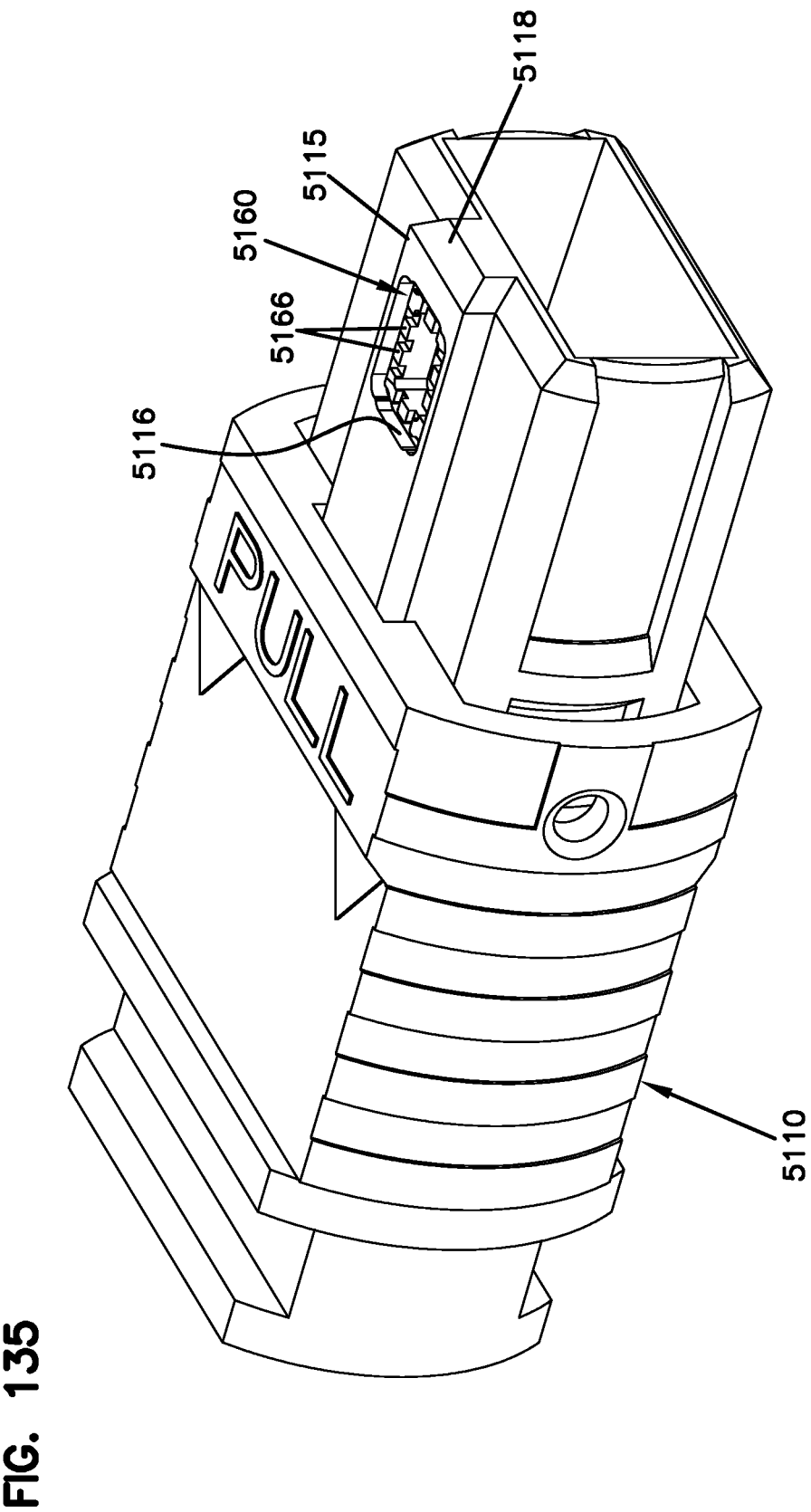
Figure 136:
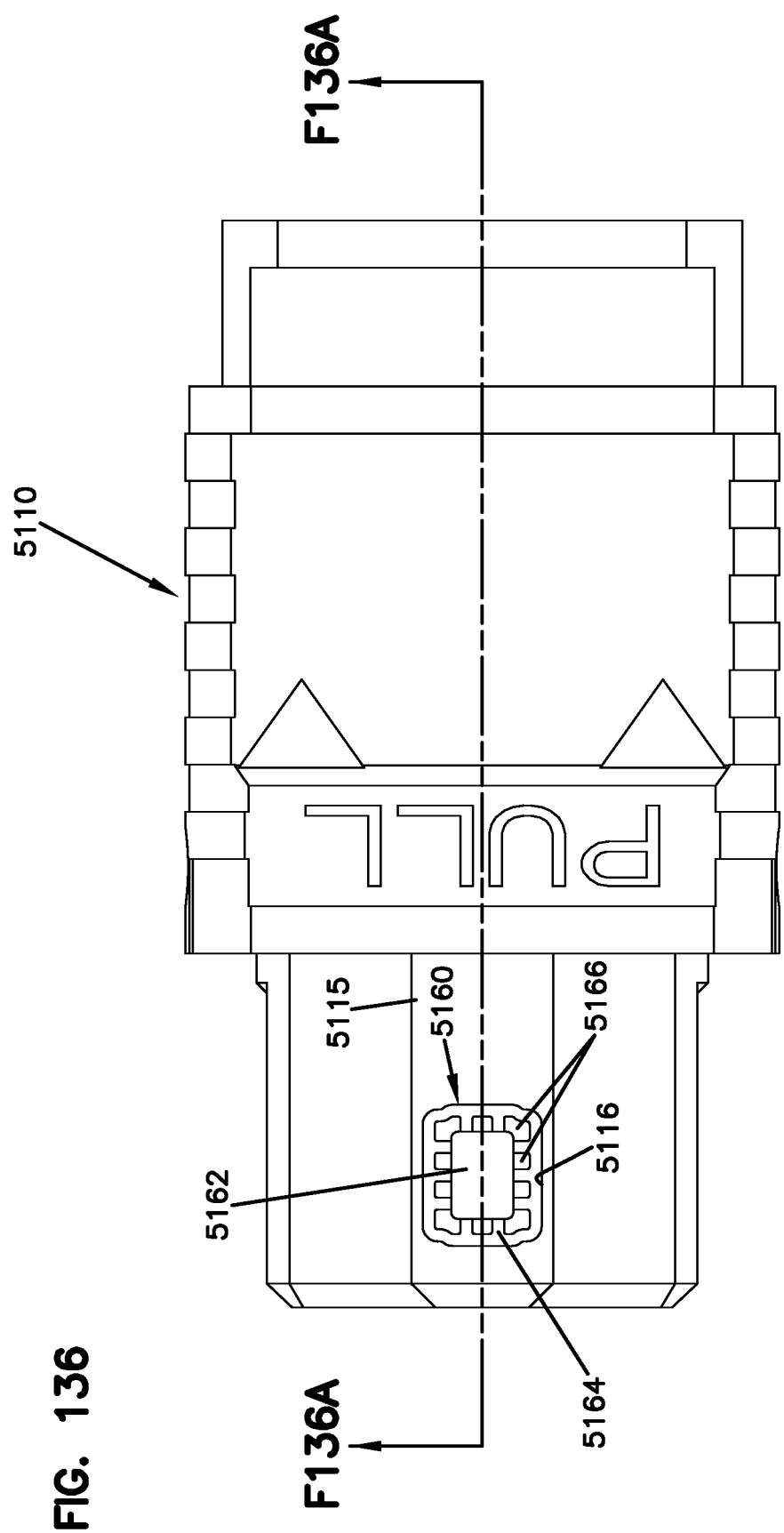

As shown in FIGS. 135-136, the front body 5111 of one example fiber optic connector 5110 may define a recessed section or cavity 5116 in which the storage device 5130 may be positioned. In some implementations, the cavity 5116 is provided in the key 5115 of the connector 5110. In other implementations, the cavity 5116 may be provided elsewhere in the connector 5110. In some implementations, the cavity 5116 has a stepped configuration 5160 to facilitate positioning of the storage device 5130.

Figure 136A:
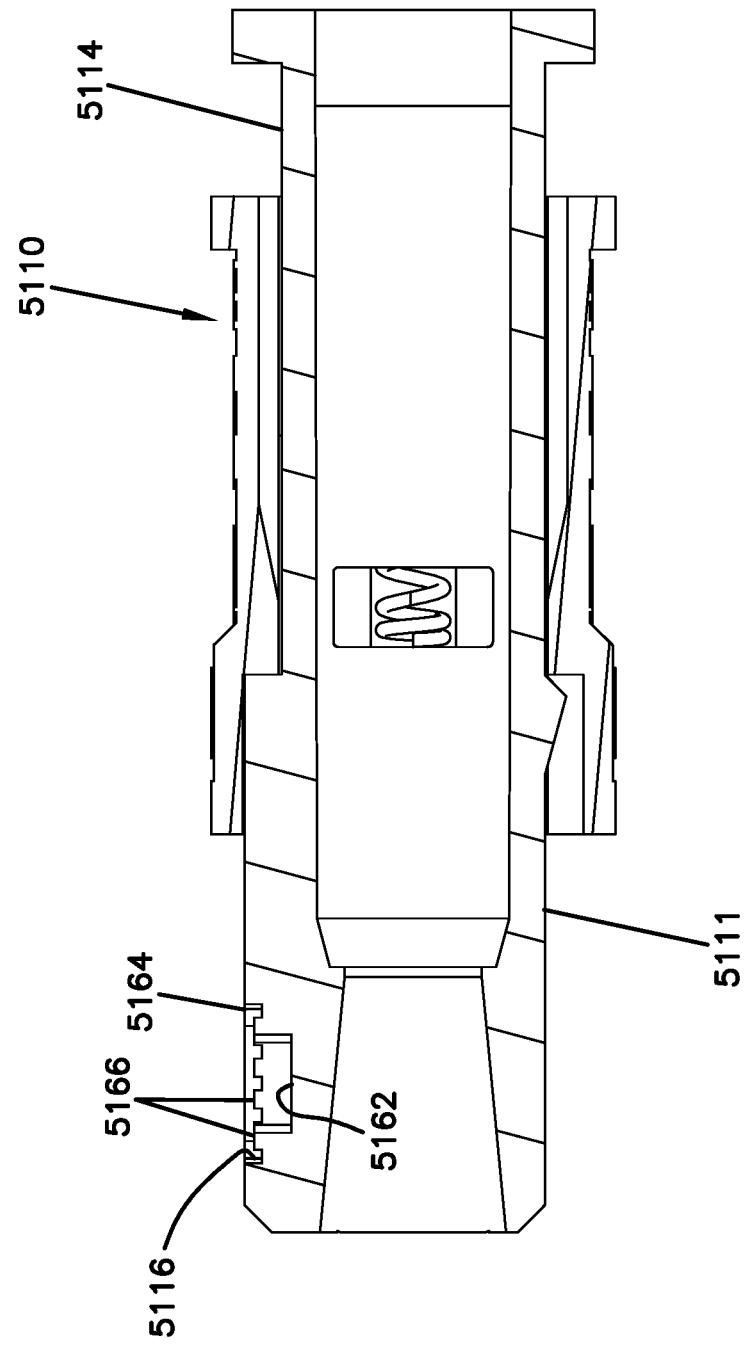

In the example shown, the cavity 5116 includes a well 5162 surrounded by a ledge 5164 (see FIG. 136A). The ledge 5164 is configured to support the storage device 5130. For example, the ledge 5164 may support the printed circuit board 5131 of an example storage device 5130. The well 5162 is sufficiently deep to accommodate an EEPROM circuit 5133 coupled to one side of the printed circuit board 5131. The ledge 5164 is recessed sufficiently within the connector body 5111 to enable electrical contacts 5132 provided on the opposite side of the printed circuit board 5131 to be generally flush with the key 5115 of the connector body 5111.

In certain implementations, the ledge 5164 has a ridged or otherwise contoured surface to facilitate mounting the storage device within the cavity 5116. For example, in some implementations, contoured sections 5166 of the ledge 5164 may increase the surface area over which an adhesive may be applied to secure the storage device 5130 within the cavity 5116. In the example shown, the contoured sections 5166 include rectangular-shaped protrusions and/or depressions. In other implementations, however, the ledge 5164 may have bumps, ridges, or some other texture to increase the surface area over which adhesive is applied.

Figure 137:
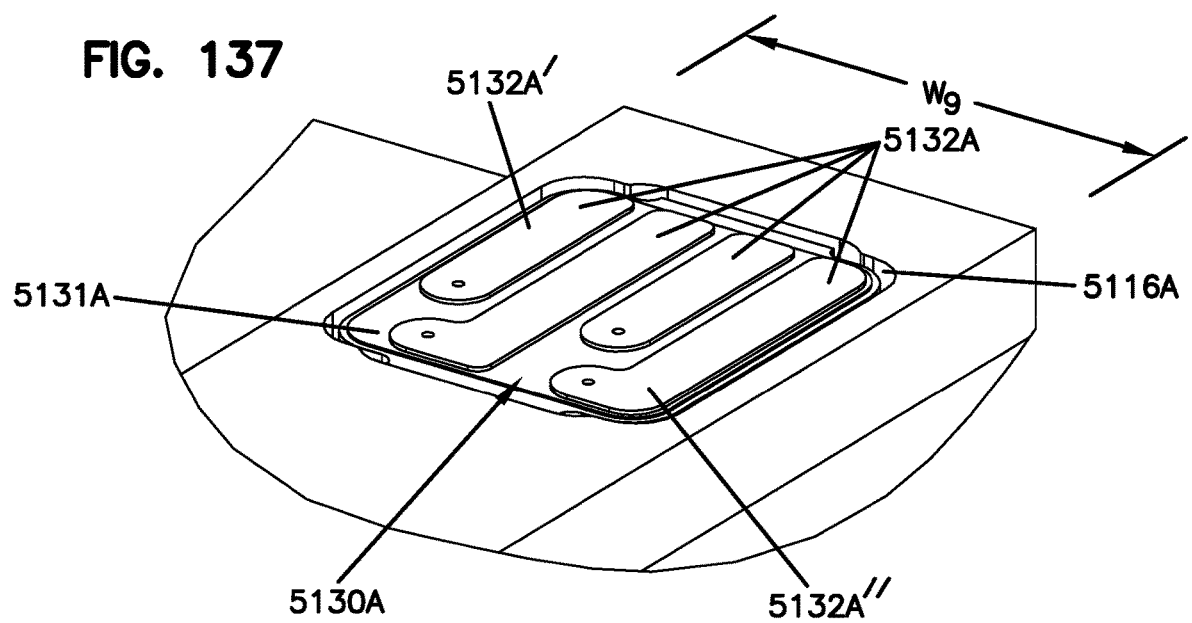

FIGS. 124 and 137-139 show three different implementations of example storage devices 5130 installed on example connectors 5110. FIGS. 124 and 137 show a first example connector 5110 that includes a key 5115 having a width W9 (FIG. 137). The key 5115 has a front surface 5118 against which contacts 5231 of the communications coupler assembly 5200 deflect during insertion of the connector 5110 as will be described in more detail herein. The key 5115 also defines a recessed section or cavity 5116A in which a storage device 5130A can be positioned. In the example shown in FIG. 137, the cavity 5116A is defined in a top of the key 5115 and not on or in the deflecting surface 5118. In some implementations, a cover can be positioned over the storage device 5130A to enclose the storage device 5130A within the recessed section 5116A of the key 5115. In other implementations, the storage device 5130A is left uncovered and exposed.

The storage device 5130A shown in FIG. 137 includes generally planar contacts 5132A positioned on a generally planar circuit board 5131A. Memory 5133 (FIGS. 145-147) of the storage device 5130A, which is located on the non-visible side of the board in FIG. 137, is accessed by engaging the tops of the contacts 5132A with an electrically conductive contact member (e.g., contact member 5231 of FIGS. 130 and 132). In certain implementations, the contact member 5231 initially contacts the deflecting surface 5118 and subsequently slides or wipes across the contacts 5132A (see FIGS. 145-147).

In some implementations, the contacts 5132A have different lengths. In certain implementations, the contacts 5132A have different shapes. For example, in some implementation, the contacts 5132A include one or more contact members 5132A' that have generally rounded ends opposite the deflecting end 5118 of the connector 5110. In certain implementations, the contacts 5132A also include one or more contact members 5132A" that are generally L-shaped. In the example shown, the L-shaped contacts 5132A" are longer than the rounded end contacts 5132A'. In other implementations, however, the contacts 5132A may have the same length or may each have different lengths.

Figure 138:
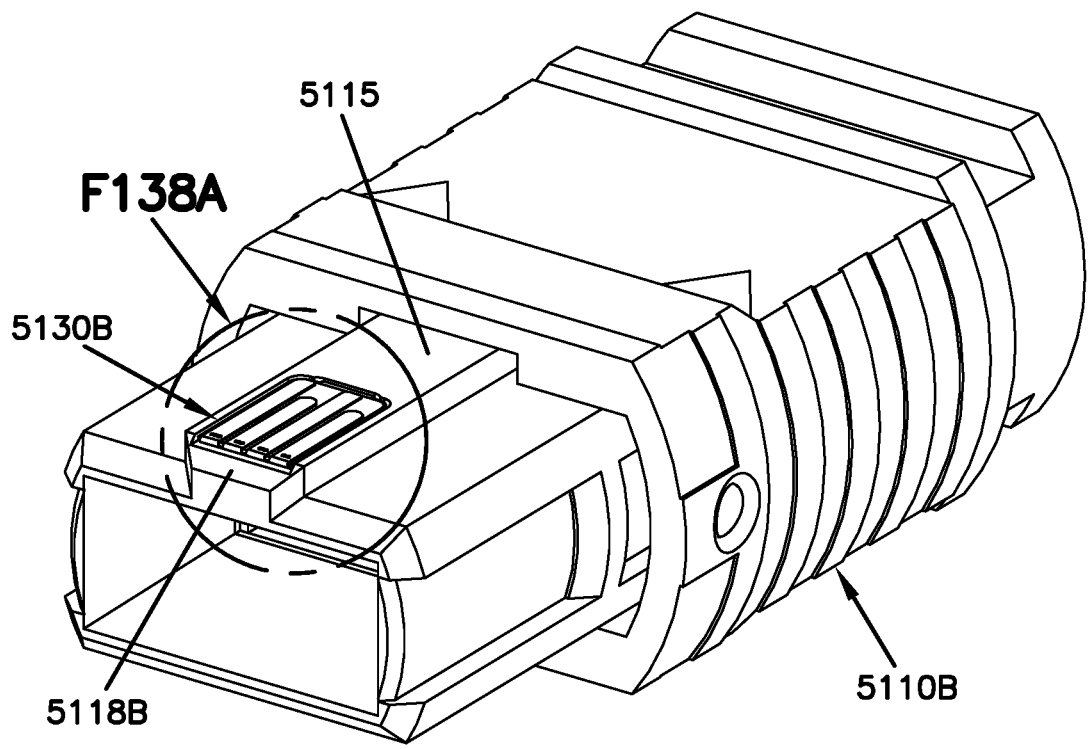
Figure 138A:
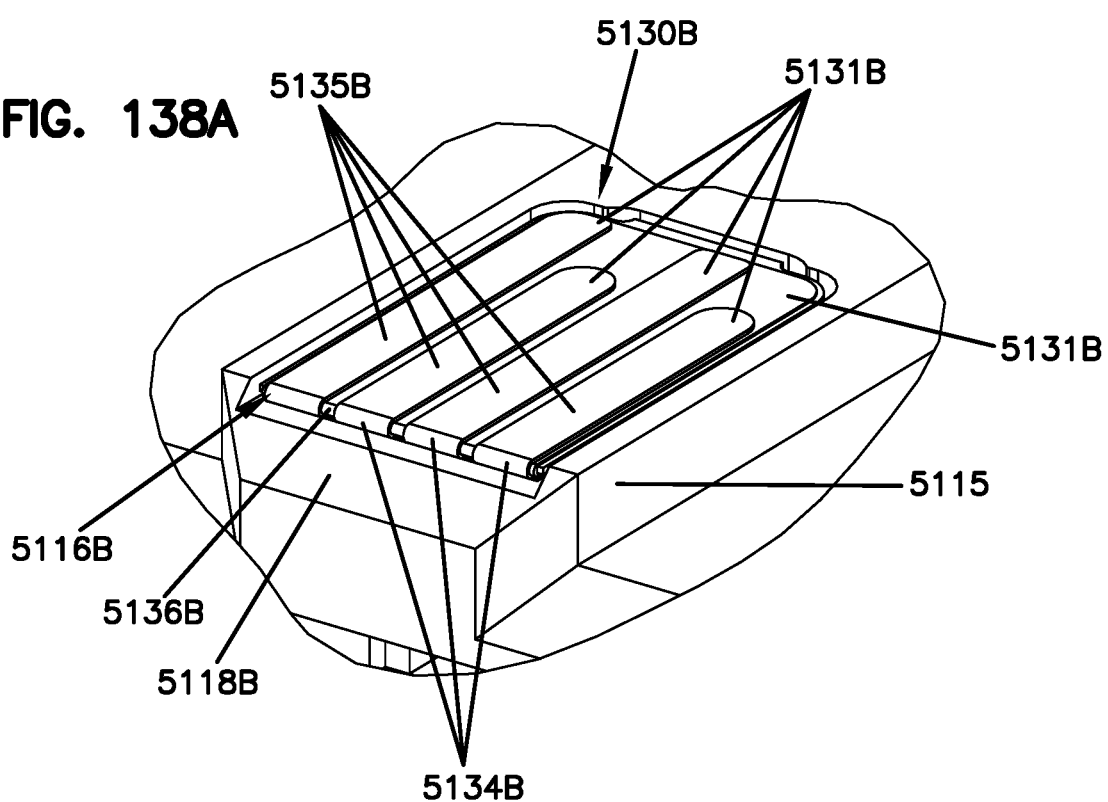

FIGS. 138 and 138A show a second example front connector body 5110B that includes a key 5115 having a deflection surface 5118B. The key 5115 defines a recessed section or cavity 5116B in which a storage device 5130B can be positioned. In the example shown, the cavity 5116B cuts into the deflecting surface 5118B of the key 5115. In some implementations, a cover can be positioned over the storage device 5130B to enclose the storage device 5130B within the key 5115. In other implementations, the storage device 5130B is left uncovered and exposed. In the example shown, the first sections 5135B of the contacts 5132B have two different lengths. In other implementations, however, the first sections 5135B of the contacts 5132B may all be the same length or may each be a different length. In certain implementations, the contacts 5132B may be the same shape of different shapes.

The storage device 5130B shown in FIG. 138A includes contacts 5132B having first sections 5135B that extend over a generally planar circuit board 5131B and folded sections 5134B that curve, fold, or bend over a front end 5136B of the board 5131B. In some implementations, the memory 5133 of the storage device 5130B, which is located on the non-visible side of the board in FIG. 138A, is accessed by sliding or wiping the contact member 5231 (FIGS. 130 and 132) of the coupler housing 5210 across the folded sections 5134B of the contacts 5132B. In other implementations, the memory 5133 of the storage device 5130B is accessed by sliding or wiping the contact member 5231 of the coupler housing 5210 across the first sections 5135B of the contacts 5132B.

Figure 139:
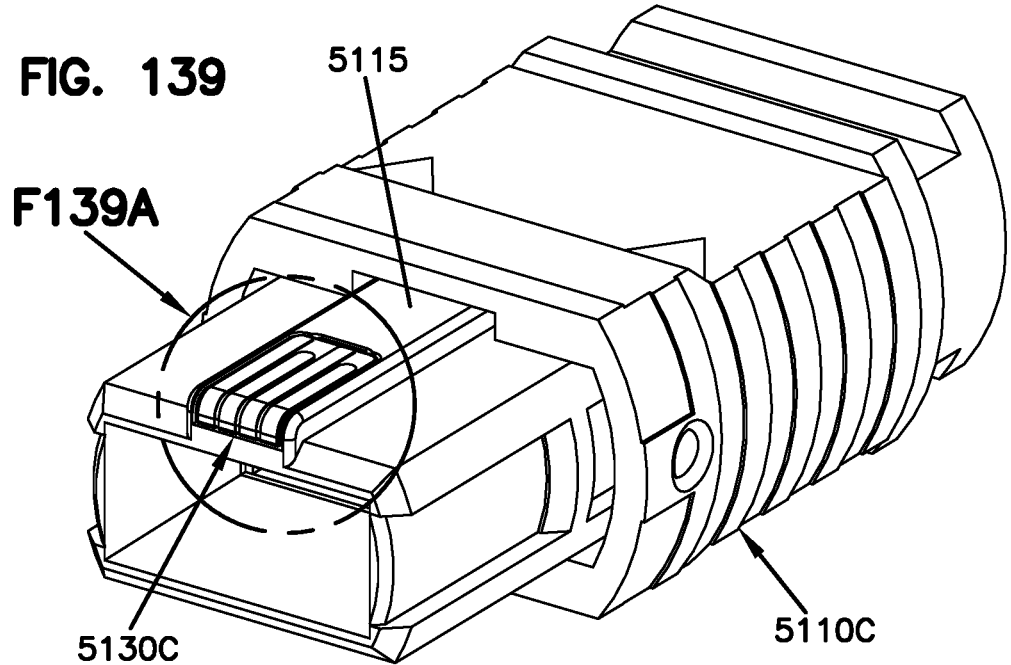
Figure 139A:
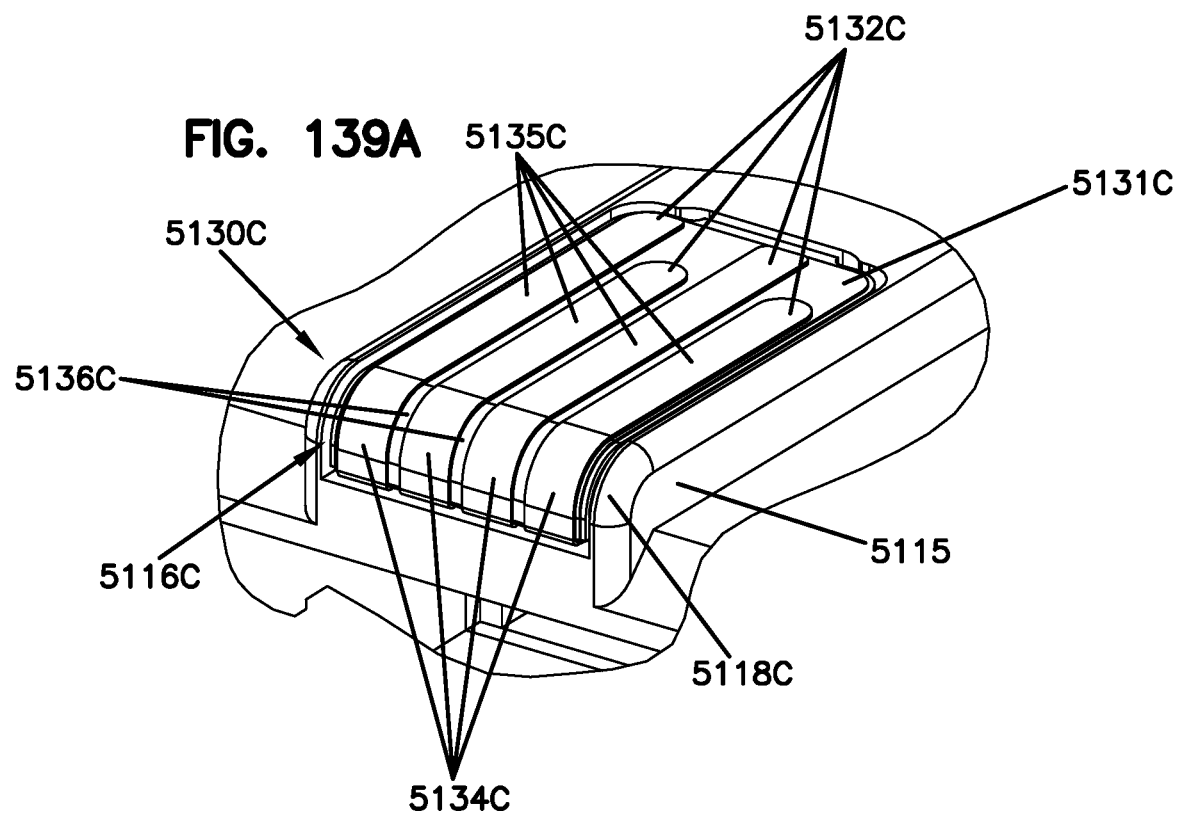

FIGS. 139 and 139A show a third example front connector body 5110C that includes a key 5115 having a deflection wall 5118. The key 5115 defines a recessed section or cavity 5116C in which a storage device 5130C can be positioned. In the example shown, the cavity 5116C cuts into the deflection wall 5118C of the key 5115. In some implementations, a cover can be positioned over the storage device 5130C to enclose the storage device 5130C within the key 5115. In other implementations, the storage device 5130C is left uncovered and exposed. In the example shown, the first sections 5135C of the contacts 5132C have two different lengths. In other implementations, however, the first sections 5135C of the contacts 5132C may all be the same length or may each be a different length. In certain implementations, the contacts 5132C may be different shapes or the same shape.

The storage device 5130C shown in FIG. 139A includes contacts 5132C having first sections 5135C that extend over a generally planar circuit board 5131C and contoured sections 5134C that curve, fold, or bend over a contoured section 5136C at the front of the board 5131C. In some implementations, the memory 5133 of the storage device 5130C, which is located on the non-visible side of the board in FIG. 139A, is accessed by sliding or wiping the contact member 5231 (FIGS. 130 and 132) of the coupler housing 5210 across the contoured section 5134C of the contacts 5132C. In other implementations, the memory 5133 of the storage device 5130C is accessed by sliding or wiping the contact member 5231 of the coupler housing 5210 across the first sections 5135C of the contacts 5132C.

In general, memory circuitry is arranged on a circuit board 5131 of the storage device 5130 and connected to the contacts 5132 via conductive tracings. In one example embodiment, the storage device 5130 includes an EEPROM circuit arranged on the printed circuit board 5131. In other embodiments, however, the storage device 5130 can include any suitable type of memory. In some implementations, the cavity 5116 is two-tiered, thereby providing a shoulder on which the storage device 5130 can rest and space to accommodate circuitry (e.g., memory 5133) located on a bottom of the storage device 5130. In other implementations, the storage device 5130 can be otherwise mounted to the connector 5110.

FIGS. 140-143 show an example media reading interface 5230 of the MPO adapter 5200. In general, each media reading interface 5230 is formed from one or more contact members 5231. One or both ends 5212 of the adapter housing 5210 defines one or more slots 5214 that lead to the channels 5218 (see FIG. 145). The contact members 5231 are positioned within the slots 5214 as will be described in more detail herein. In certain implementations, at least a portion of each contact member 5231 extends into the respective channel 5218 (e.g., see FIG. 145) to engage the electrical contacts 5132 of the storage member 5130 of any MPO connector 5100 positioned in the passage 5215. Other portions of the contact members 5231 are configured to protrude outwardly through the slots 5214 to engage contacts and tracings on a printed circuit board 5220 (e.g., see FIG. 145).

In some implementations, the MPO adapter housing 5210 includes a first media reading interface 5230A and a second media reading interface 5230B. For example, in some implementations, the first media reading interface 5230A is associated with a first connection end of the passage 5215 and the second media reading interface 5230B is associated with a second connection end of the passage 5215. In the example shown, the second media reading interface 5230B is flipped (i.e., located on an opposite side of the housing 5210) relative to the first media reading interface 5230A. In some such implementations, the channel 5218 extending inwardly from the first connection end of the passage 5215 also is flipped with respect to the channel 5218 extending inwardly from the second end of the passage 5215 (compare FIGS. 129 and 130). In other implementations, each adapter housing 5210 may include greater or fewer media reading interfaces 5230.

In the example shown in FIGS. 126, 127, 145, and 146, flipping the orientation of the connectors 5110 between the front and rear ports enables each of the major surfaces 5212 of the adapter 5210 to be configured to receive only one media reading interface 5130 for each passage 5215. For example, in some implementations, the media reading interfaces 5130 for the front ports of the passages 55215 are accommodated by a first of the major surfaces 5212 and the media reading interfaces 5130 for the rear ports of the passages 5215 are accommodated by a second of the major surfaces 5212. Such a configuration enables each slot 5214 to extend more than half-way between the front and rear of the adapter 5210.

In other implementations, each major surface 5212 of the adapter 5210 may accommodate the media reading interfaces 5130 for some of the front ports and some of the rear ports. For example, in one implementation, each major surface 5212 accommodates the media reading interfaces for alternating ones of the front and rear ports. In particular, a first slot in the first major surface 5212 may accommodate a media reading interface 5130 for a front port of a first passage 5215 and a first slot 5214 in the second major surface 5212 may accommodate a media reading interface 5130 for a rear port of the first passage 5215. A second slot 5214 in the first major surface 5212 may accommodate a media reading interface 5130 for a rear port of a second passage 5215 and a second slot 5214 in the second major surface 5212 may accommodate a media reading interface 5130 for a front port of the second passage 5215. Such configurations also enable each slot 5214 to extend more than half-way between the front and rear of the adapter 5210.

Lengthening the slots 5214 enables longer contact members 5231 to be received within each slot 5214. For example, each contact member 5231 may extend at least half-way across the adapter 5210 between the front and rear of the adapter 5210. In certain implementations, each contact member 5231 may extend across a majority of the distance between the front and rear of the adapter 5210. Lengthening the contact members 5231 increases the beam length of each contact member 5231. The beam length affects the ability of the contact member 5231 to deflect toward and away from the circuit boards 5220.

Figure 141:
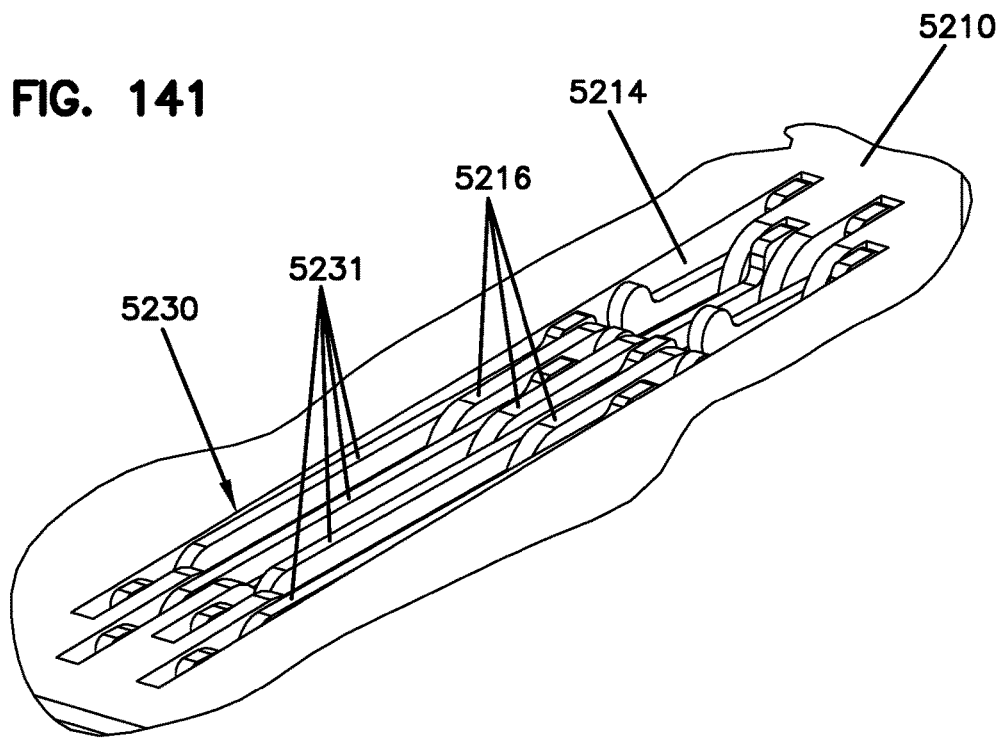
Figure 140:
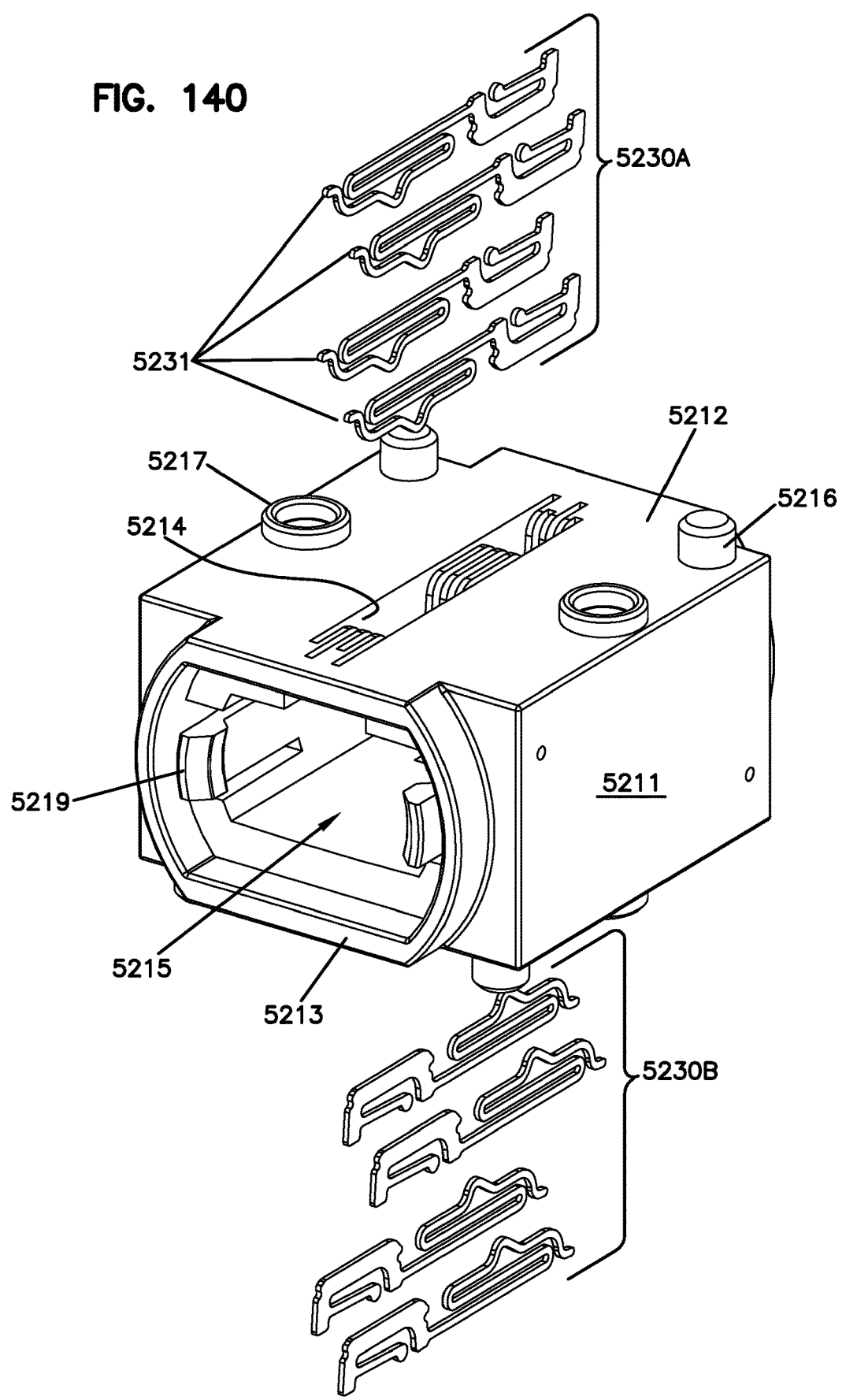

In some implementations, the contact members 5231 of a single media reading interface 5230 are positioned in a staggered configuration to facilitate access to the contacts 5132 on the connector storage device 5130 of a connector arrangement 5100. For example, alternating contact members 5231 can be staggered between at least front and rear locations within the channels 5218. FIG. 140 is a perspective view of an example coupler housing 5210 with first and second media reading interfaces 5230A, 5230B exploded out from the slots 5214 defined in the coupler housing 5210. FIG. 141 shows the contact members 5231 of an example media reading interface 5230 positioned within an example slot 5214 in a staggered configuration. In other implementations, the contact members 5231 may be laterally aligned.

In some implementations, each media reading interface 5230 includes about four contact members 5231 (see FIG. 140). In the example shown in FIGS. 145-148, at least portions of two contact members 5231 are visibly positioned within a slot 5214 defined in a fiber optic adapter 5210, shown in cross-section. Two additional contact members 5231 also are positioned in the slot 5214, but cannot be seen since the additional contact members 5231 laterally align with the visible contact members 5231. In other implementations, however, greater or fewer contact members 5231 may be positioned within the housing 5210.

Figure 142:
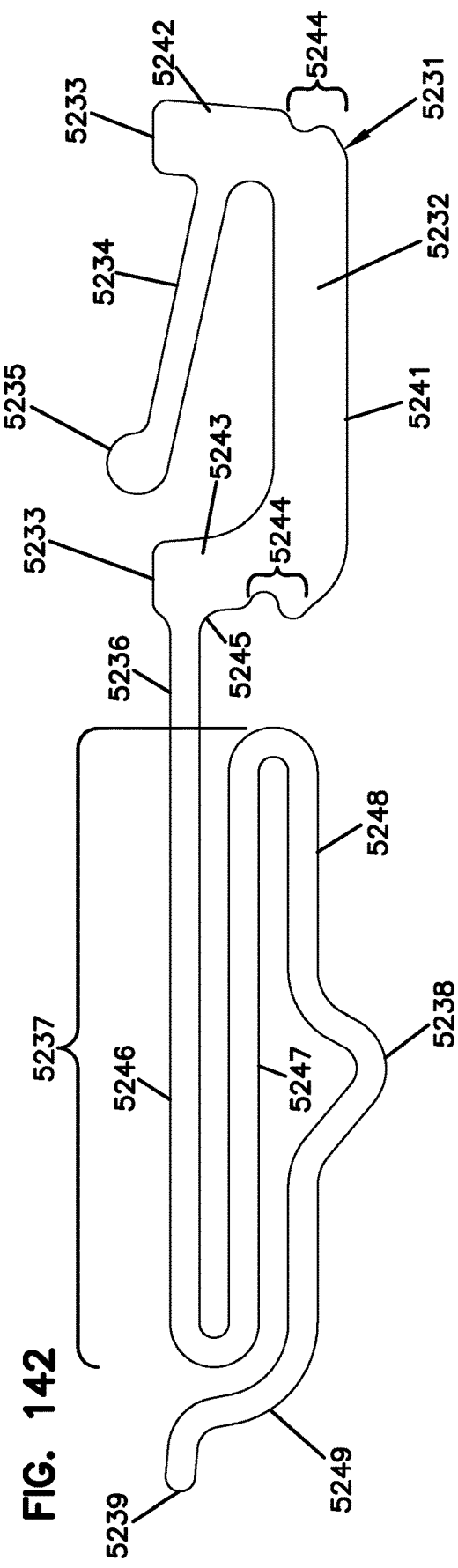
Figure 143:
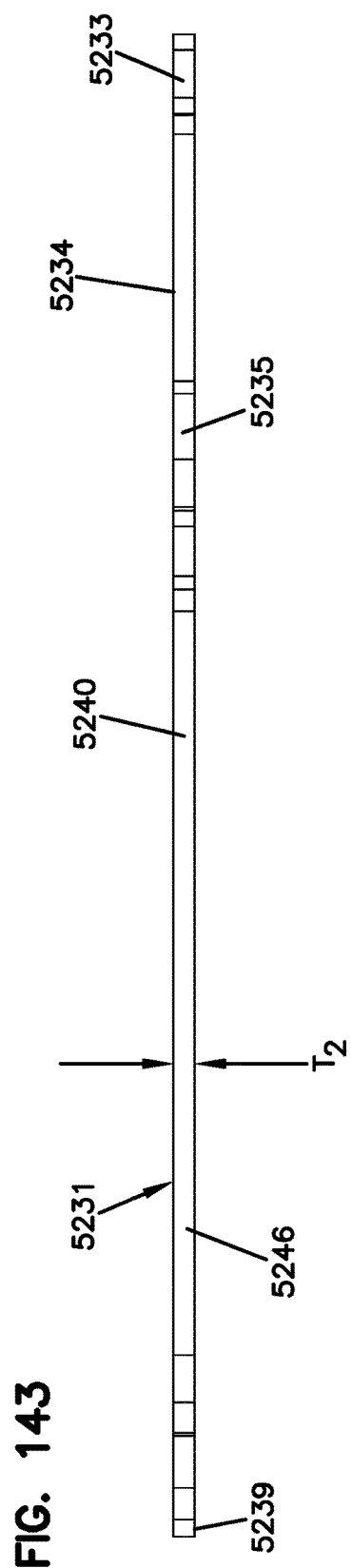
Figure 144:
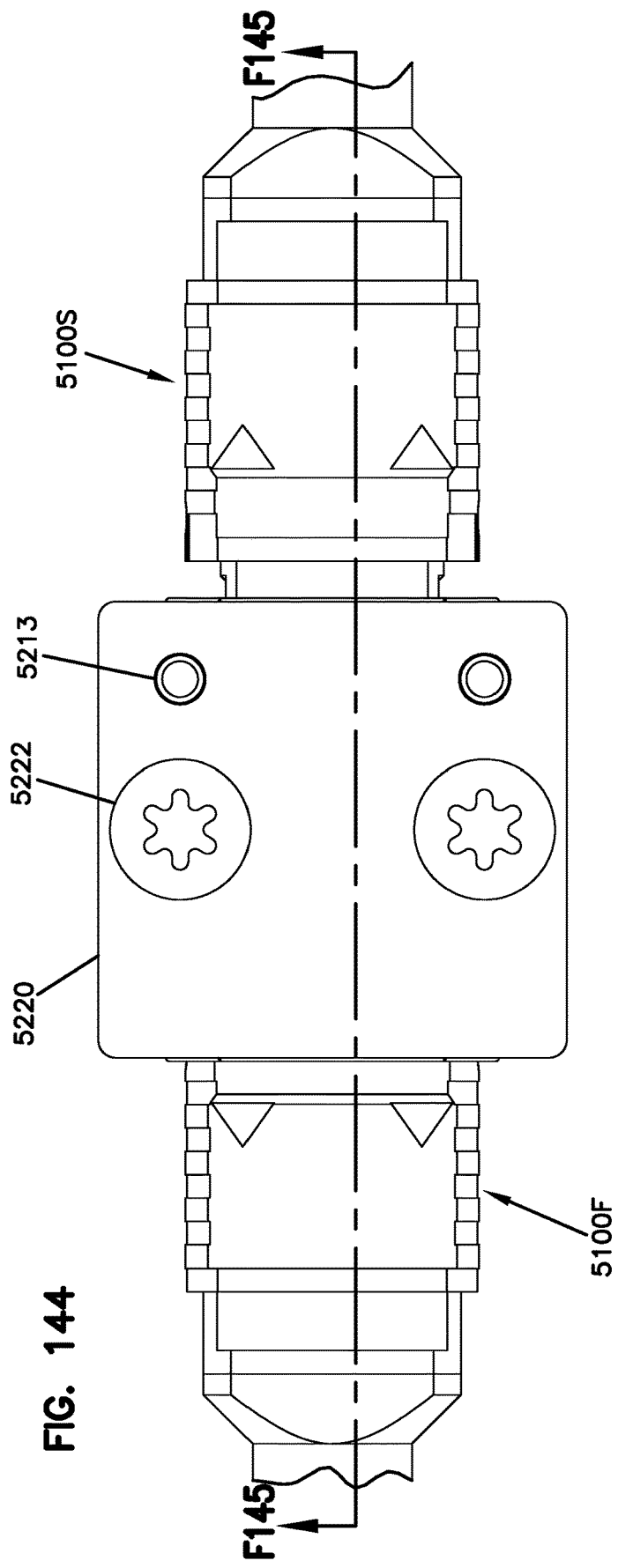

One example type of contact member 5231 suitable for use in forming a media reading interface 5230 is shown in FIGS. 142-143. Each contact member 4231 defines at least three moveable (e.g., flexible) contact locations 5235, 5238, and 5239. The flexibility of the contact surfaces 5235, 5238, and 5239 provides tolerance for differences in spacing between the contact member 5231 and the respective printed circuit board 5220 when the coupler assembly 5200 is manufactured. Certain types of contact members 5231 also include at least one stationary contact 5233.

The example contact member 5231 shown includes a base 5232 that is configured to be positioned within a slot 5214 defined by an adapter 5210. The base 5232 of certain types of contact members 5231 is configured to secure (e.g., snap-fit, latch, pressure-fit, etc.) to the adapter 5210. A first arm 5234 of the contact member 5231 defines the first moveable contact location 5235 (e.g., at a distal end of the first arm 5234). A second arm 5236 of the contact member 5231 defines a resilient section 5237, the second moveable contact location 5238, and the third moveable contact location 5239. The base 5232 of the contact member body 5240 defines a support surface 5241 extending between first and second legs 5242, 5243, respectively. The first arm 5234 extends from the first leg 5242 and the second arm 5236 extends from the second leg 5243. In the example shown, the first and second arms 5234, 5236 extend in generally the same direction from the first and second legs 5242, 5243.

Mounting sections 5244 are provided on the base 5232 between the support surface 5241 and the legs 5242, 5243. In the example shown, the mounting sections 5244 each include a recessed notch and a protruding bump to facilitate securing the base 5232 in a slot 5214 of the adapter 5210. In other implementations, however, other types of mounting configurations may be utilized. The second leg 5243 and the second arm 5236 define a second support surface 5245. In the example shown, the second support surface 5245 is rounded. In other implementations, the second support surface 5245 may define a right angle or an oblique angle.

Figure 145:
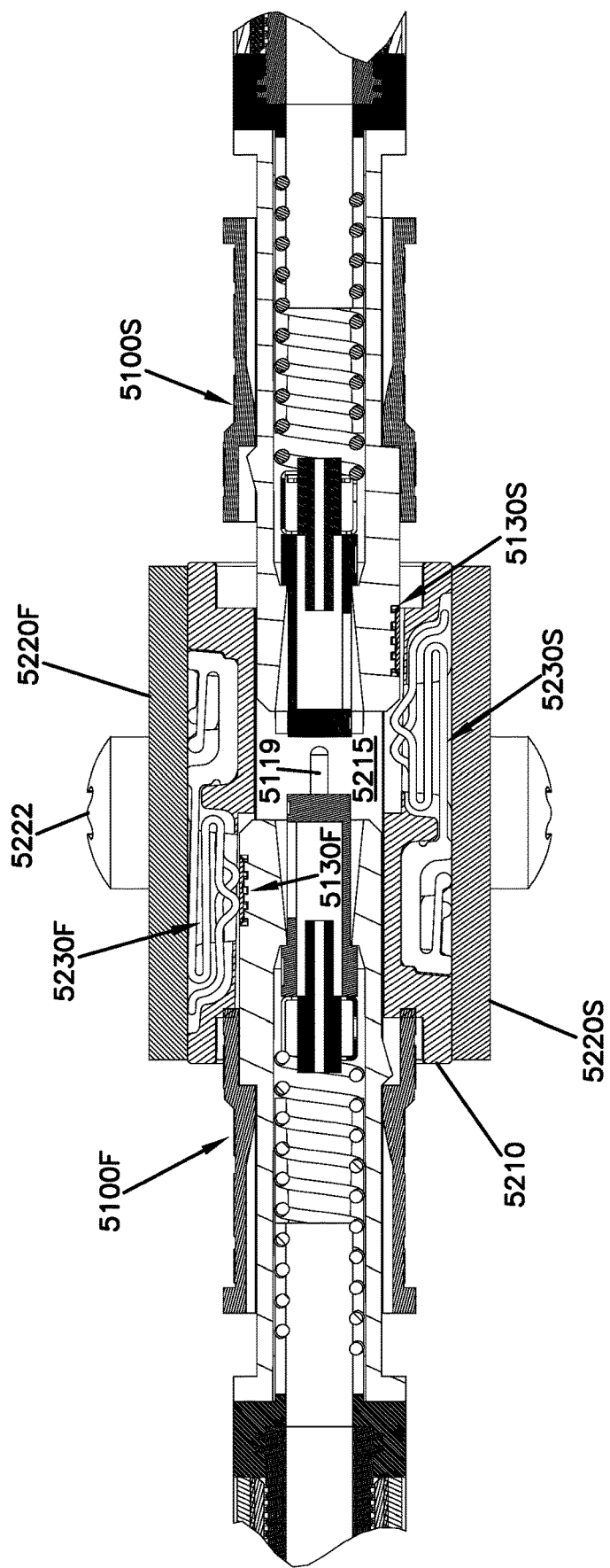
Figure 146:
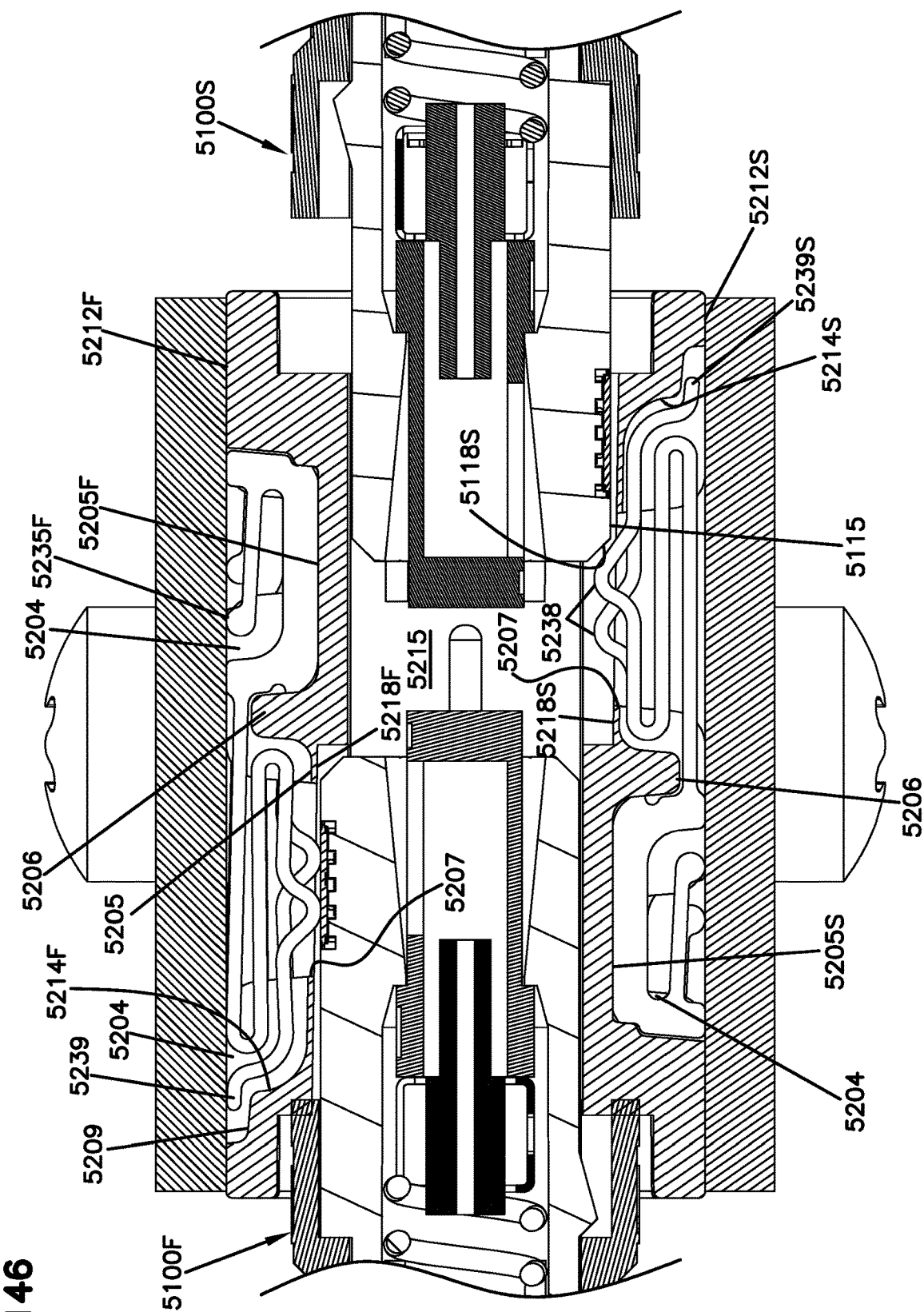
Figure 147:
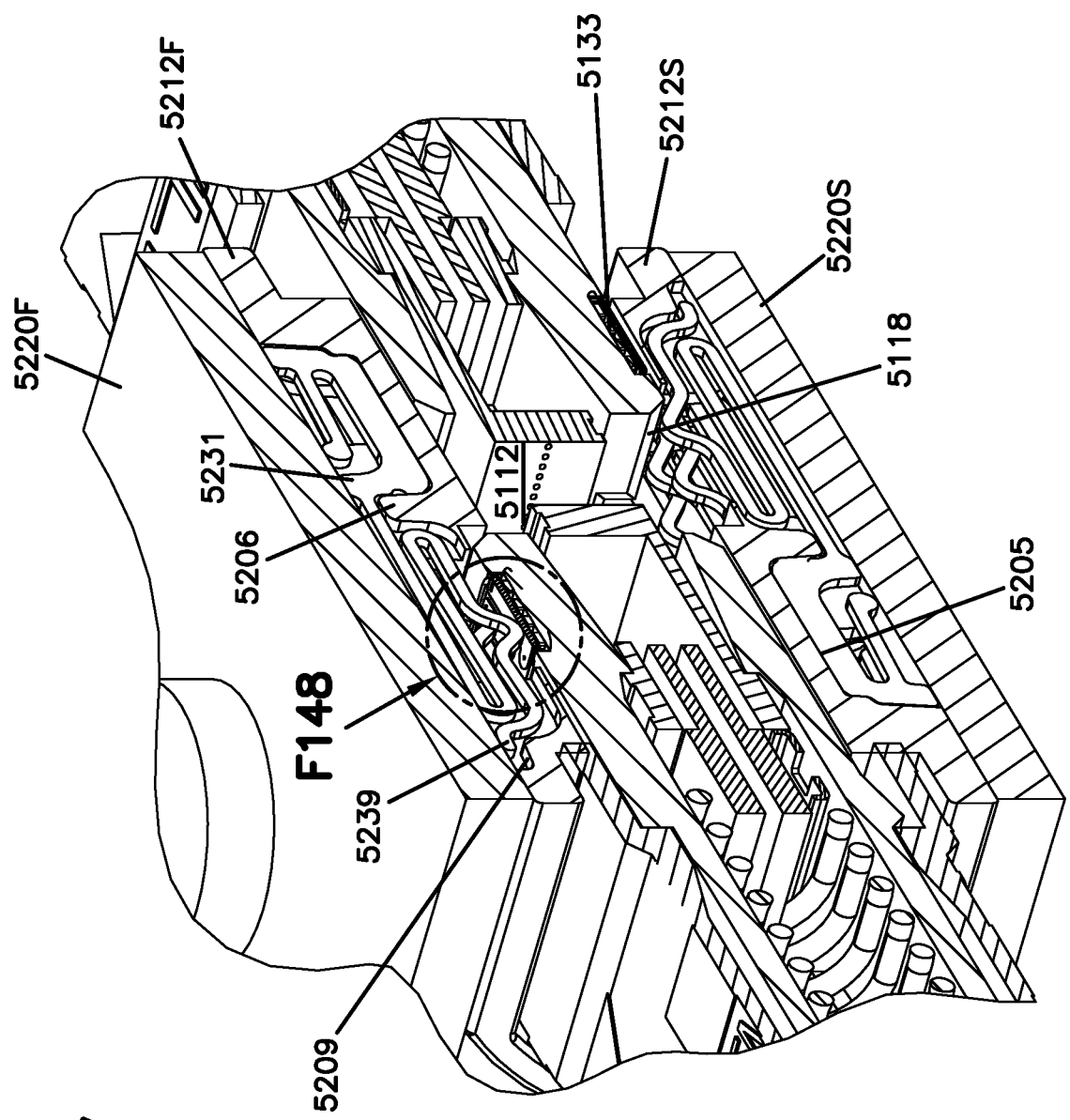

At least the first moveable contact location 5235 is aligned and configured to extend outwardly of the adapter housing 5210 through the slots 5214 to touch a first contact pad on the corresponding circuit board 5220 (e.g., see FIGS. 145-147). The ability of the first arm 5234 to flex relative to the legs 5242, 5243 provides tolerance for placement of the contact member 5231 relative to the circuit board 5220. In certain implementations, each of the legs 5242, 5243 defines a stationary contact location 5233 that also touches the first contact pad on the circuit board 5220. In one implementation, the stationary contacts 5233 and first moveable contact 5235 provide grounding of the contact member 5231.

In some implementations, the resilient section 5237 is implemented as a looped/bent section of the second leg 5236. In one implementation, the resilient section 5237 of the second arm 5236 is formed from one or more elongated sections connected by U-shaped bends. In other implementations, the second arm 5236 can otherwise include springs, reduced width sections, or portions formed from more resilient materials. In the example shown, the resilient section 5237 is formed from a first elongated section 5246 extending away from the second leg 5243, a second elongated section 5247 extending generally parallel to the first elongated section 5246 back towards the second leg 5243, and a third elongated section 5248 extending generally parallel to the first and second elongated sections 5246, 5247 and away from the second leg 5243.

The third elongated section 5248 includes a trough that defines the second contact location 5238. In certain implementations, the trough defining the second contact location 5238 is located at an intermediate portion of the third elongated section 5248. In one implementation, the trough defining the second contact location 5238 is located at about the center of the third elongated member 5248. A tail 5249 extends from the third elongated section 5248 to define the third contact location 5239. In some implementations, the tail 5249 is generally S-shaped. In other implementations, however, the tail 5249 may be C-shaped, J-shaped, U-shaped, L-shaped, or linear.

In some implementations, the body of the contact member 5231 extends between a first and second end. In the example shown in FIG. 142, the first leg 5242 is located at the first end and the third contact section 5239 is located at the second end. The contact member 5231 also extends between a top and a bottom. In some implementations, the contact surfaces of the first and third contact sections 5235, 5239 face and/or define the top of the contact member 5231 and the contact surface of the second contact section 5238 faces and/or defines the bottom of the contact member 5231. In the example shown, the first and third contact sections 5235, 5239 extend at least partially towards the top of the contact member 5231 and the second contact section 5238 extends towards the bottom of the contact member 5231. As used herein, the terms "top" and "bottom" are not meant to imply a proper orientation of the contact member 5231 or that the top of the contact member 5231 must be located above the bottom of the contact member 5231. Rather, the terms are used for ease in understanding and are assigned relative to the viewing plane of FIG. 142.

The contact member 5231 defines a body having a circumferential edge 5240 (FIG. 143) extending between planar major sides (FIG. 142). In certain implementations, the edge 5240 defines the contact surface of each contact section 5233, 5235, 5238, 5239 (see FIGS. 147-150). In some implementations, the edge 5240 has a substantially continuous thickness T2 (FIG. 143). In various implementations, the thickness T2 ranges from about 0.05 inches to about 0.005 inches. In certain implementations, the thickness T2 is less than about 0.02 inches. In some implementation, the thickness T2 is less than about 0.012 inches. In another implementation, the thickness T2 is about 0.01 inches. In another implementation, the thickness T2 is about 0.009 inches. In another implementation, the thickness T2 is about 0.008 inches. In another implementation, the thickness T2 is about 0.007 inches. In another implementation, the thickness T2 is about 0.006 inches. In other implementations, the thickness T2 may vary across the body of the contact member 5231.

Portions of the planar surfaces of the contact member 5231 may increase and/or decrease in width. For example, in the example shown in FIG. 142, the base 5232 and legs 5242, 5243 are wider than either of the arms 5234, 5236. In certain implementations, the contact surface of the first contact section 5235 may be rounded or otherwise contoured. For example, in FIG. 142, the first contact section 5235 defines a bulbous tip. The second contact section 5238 defines a trough in the third elongated member 5248. The mounting sections 5244 define detents and protrusions in the planar surface of the base 5232.

In some implementations, the contact member 5231 is formed monolithically (e.g., from a continuous sheet of metal or other material). For example, in some implementations, the contact member 5231 may be manufactured by cutting a planar sheet of metal or other material. In other implementations, the contact member 5231 may be manufactured by etching a planar sheet of metal or other material. In other implementations, the contact member 5231 may be manufactured by laser trimming a planar sheet of metal or other material. In still other implementations, the contact member 5231 may be manufactured by stamping a planar sheet of metal or other material.

FIG. 145 shows a cross-sectional view of an MPO adapter housing 5210 defining a passage 5215 extending between the front and rear of the adapter 5210. The adapter housing 5210 is sandwiched between the first example circuit board 5220F and the second example circuit board 5220S via fasteners 5222. A first connector 5100F is fully inserted into the adapter passage 5215 from the front end of the adapter 5210 and a second connector 5100S is partially inserted into the adapter passage 5215 from the rear end of the adapter 5210. In some implementations, each of the connectors 5100F, 5100S includes a storage device 5130F, 5130S, respectively. In other implementations, only one of the connectors 5100F, 5100S includes a storage device.

The adapter housing 5210 defines at least a first slot 5214F extending through a top end 5212F of the adapter 5210 and at least a second slot 5214S extending through a bottom end 5212S of the adapter 5210. In some implementations, each end 5212F, 5212S of the adapter housing 5210 defines one slot 5214 that is configured to hold one or more contact members 5231. In other implementations, each end 5212F, 5212S of the adapter housing 5210 defines multiple slots 5214F, 5214S, which are each configured to hold one or more contact members 5231. The slots 5214F, 5214S extend at least part-way across the passage 5215. In the example shown, each slot 5214F, 5214S extends across a majority of the length of the passage 5215. In other implementations, each slot 5214F, 5214S may extend a greater or lesser distance across the passage 5215.

As discussed above, each adapter 5210 includes a first channel 5218F extending inwardly from a front connection end of the passage 5215 and a second channel 5218S extending inwardly from a rear connection end of the passage 5215. Each channel 5218F, 5218S is configured to accommodate the key 5215 of the respective connector 5100F, 5100S. In some implementations, each channel 5218F, 5218S extends about half-way through the passage 5215. In other implementations, each channel 5218F, 5218S extends a greater or lesser distance through the passage 5215. Each channel 5218F, 5218S is associated with one of the slots 5214F, 5214S. In some implementations, each channel 5218F, 5218S extends fully across the respective slot 5214F, 5214S. In other implementations, each channel 5218F, 5218S extends only partially across the respective slot 5214F, 5214S.

In some implementations, at least a portion of each slot 5214F, 5214S extends partially through the top and bottom ends 5212F, 5212S of the adapter 5210. For example, one or more portions of the slots 5214F, 5214S can extend through the respective ends 5212F, 5212S to recessed surfaces 5205 (FIG. 146). In certain implementations, at least a portion of each slot 5214F, 5214S is shallower than the rest of the slot 5214F, 5214S. For example, the first and second ends 5212F, 5212S may define support walls 5206 (FIG. 146) extending from the recessed surfaces 5205 towards the exterior of the ends 5212F, 5212S. At least a portion of the top and bottom ends 5212F, 5212S of the adapter 5210 define openings 5207 (FIG. 146) that connect the slots 5214F, 5214S to the associated channels 5218F, 5218S. At least a portion of the top and bottom ends 5212F, 5212S defines a shoulder 5209 at one end of each slot 5214F, 5214S.

A first media reading interface 5230F is positioned in the first slot 5214F and a second media reading interface 5230S is positioned in the second slot 5214B. In some implementations, each media reading interface 5230F, 5230S includes one or more contact members 5231 (see FIG. 142). The first support surface 5241 of the base 5232 of each contact member 5231 is seated on the recessed surface 5205 of each slot 5214F, 5214S. The second support surface 5245 of each contact member 5231 abuts a support wall 5206 in each slot 5214F, 5214S. The second contact location 5238 of each contact member 5231 aligns with the openings 5207 that connect the slots 5214F, 5214S to the channels 5218F, 5218S. The third contact location 5239 of each contact members 5237 is accommodated by the shoulder 5209 at the end of each slot 5214F, 5214S.

In the example shown, the contact members 5231 are staggered within the slots 5214F, 5214S. In other implementations, the contact members 5231 may be laterally aligned within the slots 5214F, 5214S. In some implementations, the first and second ends 5212F, 5212S of the adapter 5210 define intermediate walls that extend between pairs of adjacent contact members 5231. The intermediate walls inhibit contact between adjacent contact members 5231. In certain implementations, the intermediate walls extend fully between the adjacent contact members 5231. In other implementations, intermediate wall sections 5204 extend between portions of the adjacent contact members 5231.

In the example shown in FIG. 146, each slot 5214F, 5214S includes one or more intermediate wall sections 5204 between each pair of adjacent contact members 5231. For example, in certain implementations, an intermediate wall section 5204 in each slot 5214F, 5214S extends across the first leg 5242 of one or both contact members 5231 in each pair of adjacent contact members 5231 to aid in securing the contact member 5231 in the respective slot 5214F, 5214S (e.g., see intermediate wall section 5204 in slot 5214S in FIG. 146).

In some implementations, an intermediate wall section 5204 in each slot 5214F, 5214S extends across the first contact location 5235 of one or both contact members 5231 in each pair of adjacent contact members 5231 (e.g., see intermediate wall section 5204 in slot 5214F in FIG. 146). For example, the intermediate wall section 5204 may inhibit lateral bending of the first arm 5234 of one or more contact members 5231 within the slot 5214F, 5214S. In some implementations, the intermediate wall section 5204 extends across the first contact locations 5235 of alternating contact members 5231. In other implementations, the intermediate wall section 5204 is sufficiently wide to extend across the first contact locations 5235 of adjacent staggered contact member 5231. In still other implementations, the intermediate wall section 5204 may extend across the first contact locations 5235 of adjacent non-staggered contact members 5231.

In some implementations, an intermediate wall section 5204 extends across at least a portion of the second arm 5236 of one or both contact members 5231 in each pair of adjacent contact members 5231. In certain implementations, the intermediate wall section 5204 extends between the U-shaped bends joining the second and third elongated sections 5247, 5248 of the resilient sections 5237 of one or more contact members 5231 in the slot 5214F, 5214S. In certain implementations, the intermediate wall section 5204 extends across the second leg 5243 of one or both contact members 5231 in each pair of adjacent contact members 5231. In certain implementations, the support walls 5206 extend laterally between the intermediate walls 5204 (e.g., see FIG. 146).

In some implementations, an intermediate wall section 5204 extends across the third contact location 5239 of one or both contact members 5231 in each pair of adjacent contact members 5231. For example, the intermediate wall section 5204 may inhibit lateral bending of the tail 5239 of one or more contact members 5231 within the slot 5214F, 5214S. In certain implementations, the intermediate wall section 5204 extends between the U-shaped bends joining the first and second elongated sections 5246, 5247 of the resilient sections 5237 of one or more contact members 5231 in the slot 5214F, 5214S.

As discussed above, a processor (e.g., processor 217 of FIG. 2) or other such equipment also can be electrically coupled to the printed circuit boards 5220F, 5220S. Accordingly, the processor can communicate with the memory circuitry on the storage devices 5130F, 5130S via the contact members 5231 and the printed circuit boards 5220F, 5220S. In accordance with some aspects, the processor is configured to obtain physical layer information from the storage devices 5130F, 5130S. In accordance with other aspects, the processor is configured to write (e.g., new or revised) physical layer information to the storage devices 5130F, 5130S. In accordance with other aspects, the processor is configured to delete physical layer information to the storage device 5130F, 5130S. In one example implementation of a media reading interface 5230F, 5230S, at least a first contact member 5231 transfers power, at least a second contact member 5231 transfers data, and at least a third contact member 5231 provide grounding. However, any suitable number of contact members 5231 can be utilized within each media reading interfaces 5230F, 5230S.

In accordance with some aspects, the contact members 5231 are configured to selectively form a complete circuit with one or more of the printed circuit boards 5220. For example, each printed circuit board 5220 may include two contact pads for each contact member. In certain implementations, a first portion of each contact member 5231 touches a first of the contact pads and a second portion of each contact member 5231 selectively touches a second of the contact pads. The processor coupled to the circuit board 5220 may determine when the circuit is complete. Accordingly, the contact members 5231 can function as presence detection sensors for determining whether a media segment has been inserted into the passages 5215.

In certain implementations, the first moveable contact 5235 of each contact member is configured to contact one of the contact pads of the circuit board 5220. In one implementation, the first moveable contact location 5235 is configured to permanently touch the contact pad as long as the circuit board 5220 and contact member 5231 are assembled on the adapter 5210. The third contact location 5239 of certain types of contact members 5231 is configured to touch a second contact pad of the printed circuit board 5220 only when a segment of physical communications media (e.g., an MPO connector 5110) is inserted within an adapter passage 5215 and pushes the second contact location 5238 out of the channel 2218, which pushes the third contact location 5239 through the slot 5214 and against the circuit board 5220. In accordance with other aspects, the contact members 5231 are configured to form a complete circuit with the printed circuit board 5220 regardless of whether a media segment is received in the passage 5215.

For example, as shown in FIGS. 145 and 147, the stationary contacts 5233 and the first moveable contact location 5235 of each contact member 5231 are configured to extend through the respective slot 5214F, 5214S to touch contacts or tracings on the respective printed circuit board 5220F, 5220S mounted to the adapter end 5212A, 5212S defining the slot 5214F, 5214S. In certain implementations, the stationary contact 5233 and the first contact location 5235 touch the respective printed circuit board 5220F, 5220S regardless of whether or not a connector arrangement 5100F, 5100S has been inserted into the passage 5215.

The resilient section 5237 (FIG. 142) of each contact member 5231 is configured to bias the second contact location 5238 out of the respective slot 5214F, 5214S towards the respective channel 5218F, 5218S. For example, when a connector arrangement (e.g., see second connector arrangement 5100S of FIG. 145) is being inserted into the passage 5215 of the MPO adapter 5210, the key 5115 of the second connector arrangement 5110S slides within the second channel 5218S of the adapter 5210. When the second connector arrangement 5100S is at least partially within the passage 5215, the deflecting end 5118B of the key 5115 engages the second contact location 5238 of each contact member 5231 of the second media reading interface 5230S. Continuing to insert the connector arrangement 5100S biases the second contact locations 5238 from the second channel 5218S towards the second slot 5214S.

Figure 148:
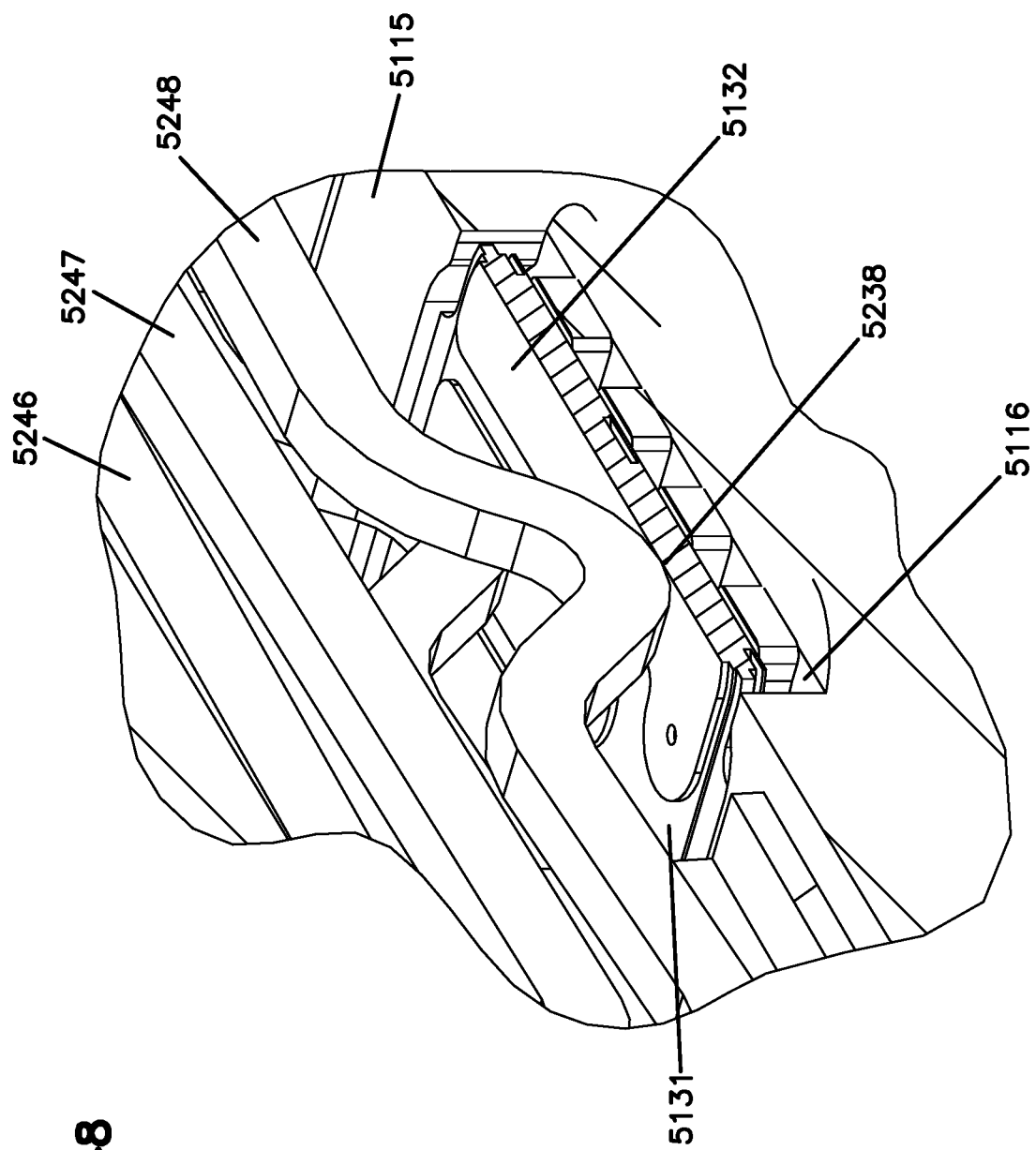

When a connector arrangement (e.g., see first connector arrangement 5100F of FIG. 145) has been fully inserted within the passage 5215 of the adapter 5210, the second contact locations 5238 of the contact members 5231 of the first media reading interface 5230F touch the contact members 5132 of the storage device 5130F of the first connector arrangement 5100F (e.g., see FIG. 148). In some implementations, the second contact locations 5238 touch the contacts 5132 of the storage device 5130F only when the first connector arrangement 5100F has been inserted completely within the passage 5215. In other implementations, the second contact locations 5238 touch the contacts 5132 of the storage device 5130F when the deflecting surface 5118 of the connector arrangement 5100 contacts the trough defined by the second arm 5236 of each contact member 5231.

The third contact location 5239 of each contact member 5231 is configured to be positioned initially within the shoulder section 5209 of the respective slot 5214F, 5214S of the adapter housing 5210. In some implementations, the distal end of the tail 5249 rests against the shoulder 5209 when a respective connector arrangement 5100F, 5100S is not within the passage 5215. In other implementations, the distal end of the tail 5249 is located between the shoulder 5209 and the respective printed circuit board 5220 when the respective connector arrangement 5100F, 5100S is not within the passage 5215.

The resilient section 5237 of each contact member 5231 is configured to bias the third contact location 5239 away from the shoulder 5209 and towards the respective circuit board 5220F, 5220S when the respective connector arrangement 5100F, 5100S or other media segment pushes against the second contact location 5238 (see FIGS. 146 and 148). For example, inserting an MPO connector (e.g., second connector arrangement 5110S) into the passage 5215 would cause the key 5115 of the second connector arrangement 5100S to push the second contact location 5238 toward the second circuit board 5220S, which would push the third contact location 5239 through the second slot 5214S and toward the second circuit board 5220S.

In accordance with some aspects, the contact members 5231 are configured to form a complete circuit with one or more of the printed circuit boards 5220F, 5220S only when a segment of physical communications media is inserted within the adapter passage 5215. For example, the third contact location 5239 of each contact member 5231 can be configured to contact the respective circuit board 5220F, 5220S only after being pushed through the respective slot 5214F, 5214S by the media segment. Accordingly, certain types of contact members 5231 function as presence detection sensors for determining whether a media segment has been inserted into the passages 5215.

In certain implementations, the resilient section 5237 of each contact member 5231 is configured to bias the third contact surface 5239 towards the circuit board 5220F, 5220S when the key of a connectorized media segment (e.g., MPO connectors 5100F, 5100S) is inserted into the passage 5215 regardless of whether a storage device 5130 is provided on or in the key 5115. In accordance with other aspects, the contact members 5231 are configured to form a complete circuit with the respective circuit board 5220F, 5220S regardless of whether a media segment is received in the passage 5215.

Figure 151:
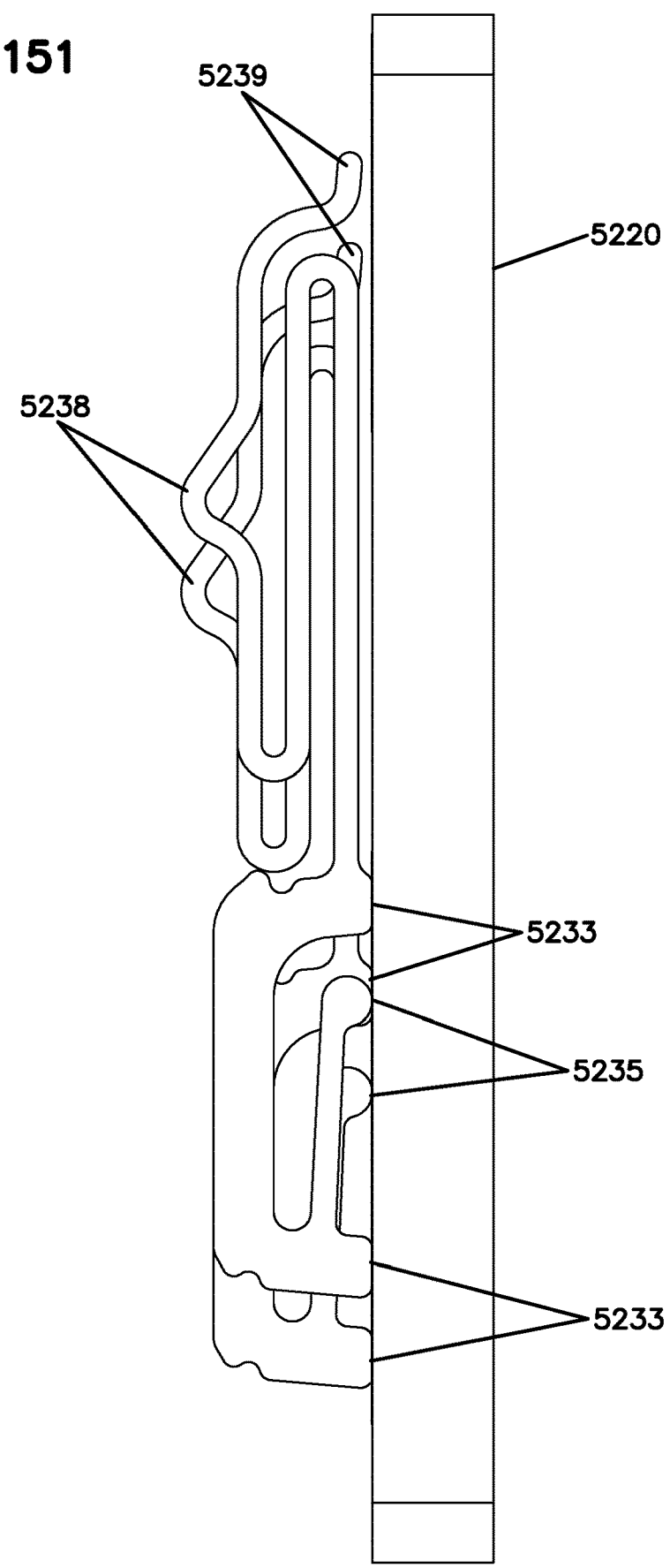

FIGS. 149-151 show one example implementation of the circuit board 5220 described above. The same or similar circuit boards 5220 are suitable for use in any of the coupler assemblies described herein. In some implementations, the circuit board 5220 defines fastener receiving openings 5227 through which fasteners 5222 may be inserted to secure the circuit board 5220. In certain implementations, the circuit board 5220 defines alignment openings 5226 in which alignment lugs 5216 are seated. The example circuit board 5220 includes a plurality of first contact pads 5223 and a plurality of second contact pads 5224 spaced from the first contact pads 5223. In certain implementations, the first contact pads 5223 are laterally aligned with each other and the second contact pads 5224 are laterally aligned with each other. In other implementations, however, the first contact pads 5223 may be laterally offset or staggered from each other and/or the second contact pads 5224 may be laterally offset of staggered from each other. In certain implementations, each of the first contact pads 5223 is longitudinally aligned with one of the second contact pads 5224 (see FIG. 150) to form a landing pair. In other implementations, however, the first and second contact pads 5223, 5224 may be longitudinally offset from each other.

A media reading interface (e.g., media reading interface 5230) may be seated on the printed circuit board 5220. In the example shown, the first moveable contact surface 5235 of each contact member 5231 of the media reading interface 5230 touches one of the first contact pads 5223. In certain implementations, the stationary contacts 5223 also touch the first contact pads 5223. The third moveable contact surface 5239 of each contact member 5231 is configured to selectively touch the second contact pad 5224 that forms a landing pair with the first contact pad 5223. In certain implementations, at least a portion of the resilient section 5237 also selectively touches the second contact pad 5224 (see FIG. 146) when the third contact surface 5239 touches the second contact pad 5224.

Referring to FIGS. 152-155, dust caps 5250 can be used to protect passages 5215 of the adapter housings 5210 when connector arrangements 5100 or other physical media segments are not received within the passages 5215. For example, a dust cap 5250 can be configured to fit within a front entrance or a rear entrance of each adapter passage 5215. The dust caps 5250 are configured to inhibit the ingress of dust, dirt, or other contaminants into the passage 5215. In accordance with some implementations, the dust caps 5250 are configured not to trigger the presence sensor/switch of the adapter 5210.

Figure 152:
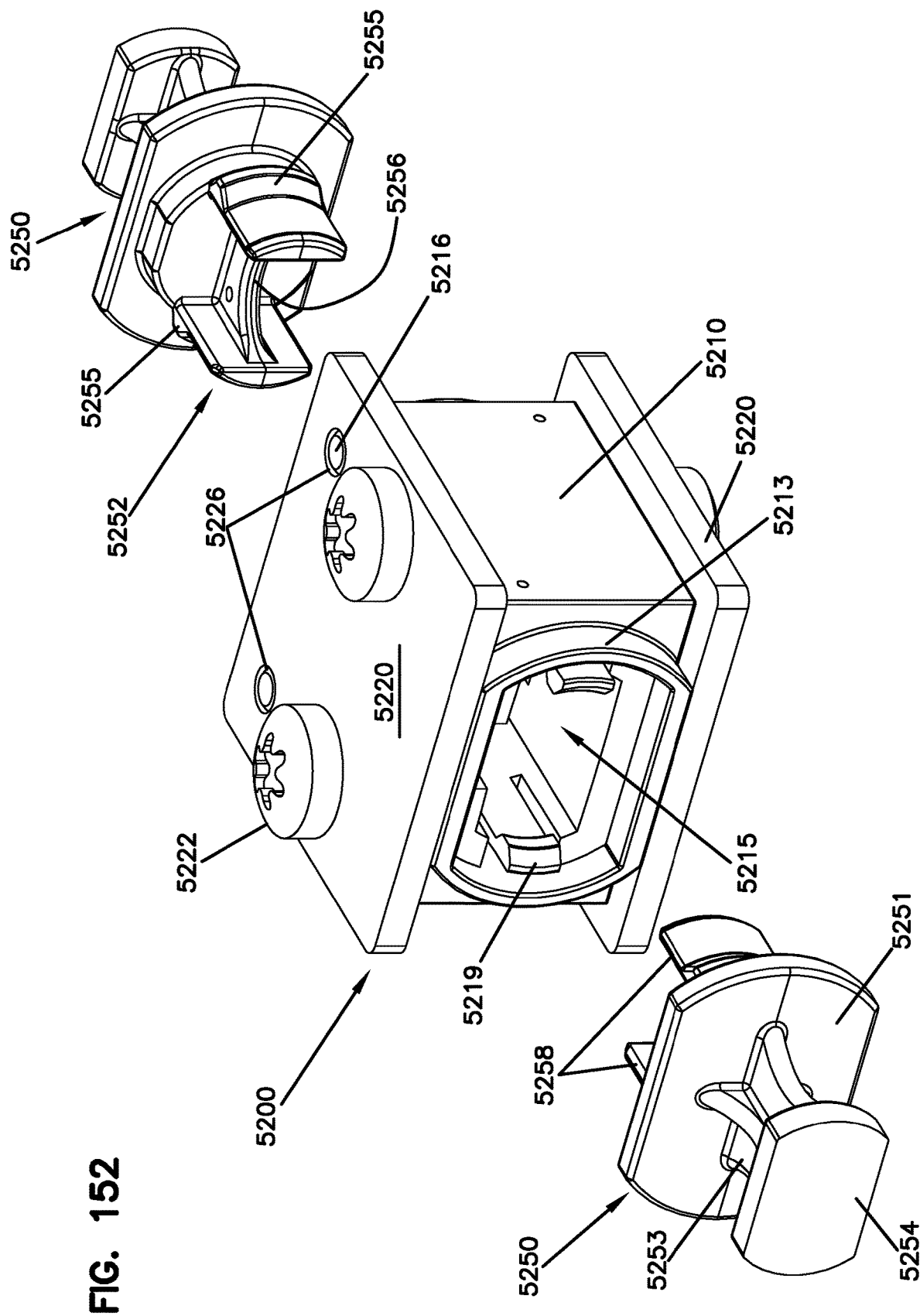
Figure 153:
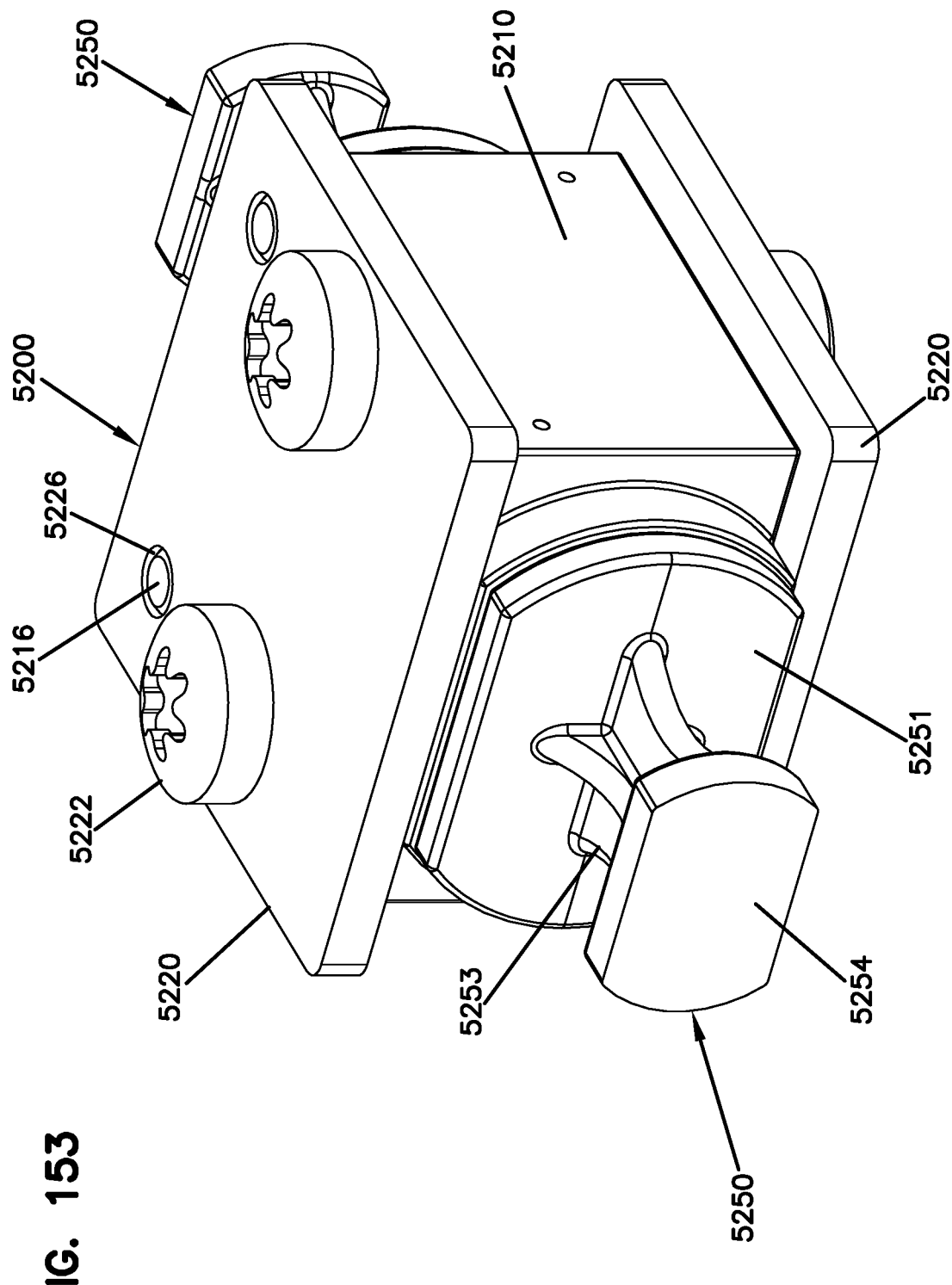
Figure 154:
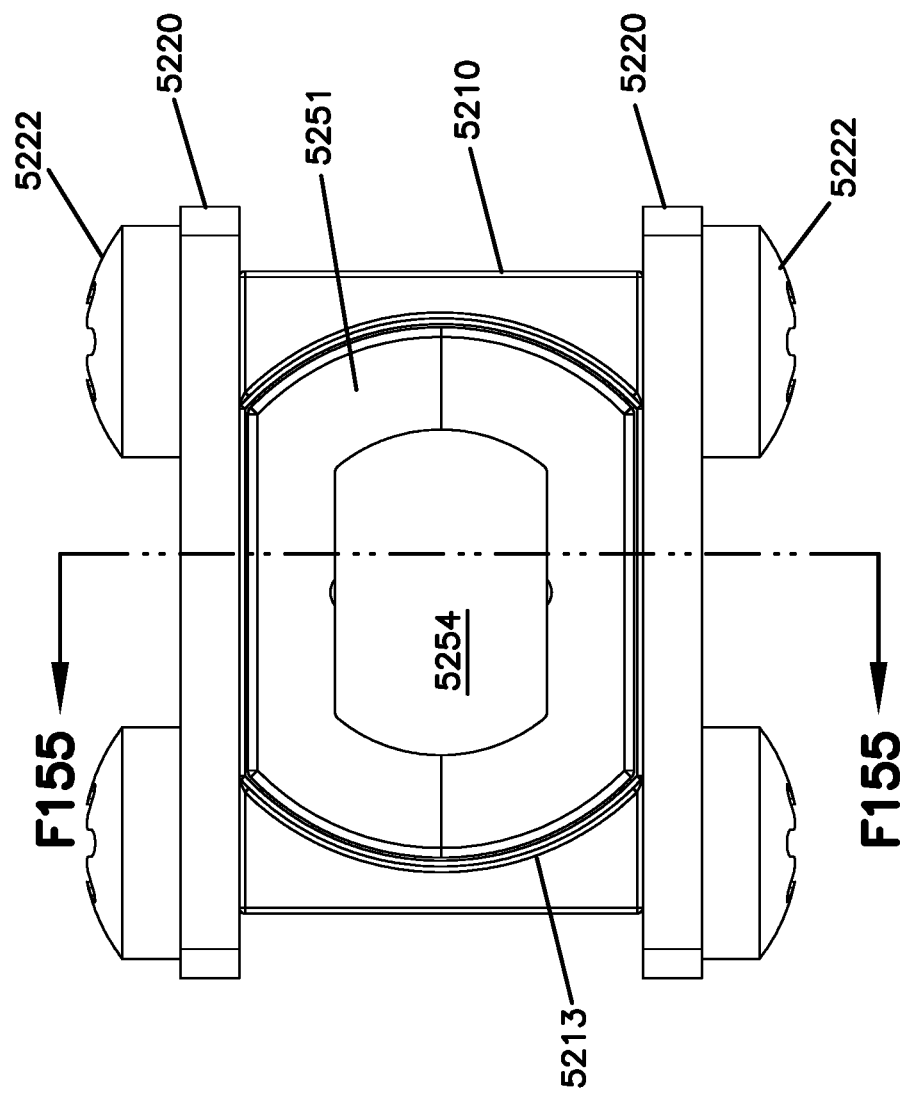

FIG. 152 shows one example implementation of an adapter dust cap 5250. The example dust cap 5250 includes a cover 5251 configured to fit over a mouth 5213 of the passage 5215. A handle including a stem 5253 and grip 5254 extend outwardly from a first side of the cover 5251. The handle facilitates insertion and withdrawal of the dust cap 5250 from the passage 5215. A retaining section 5252 extends outwardly from a second side of the cover 5251. The retaining section 5252 defines a concave contour 5256 extending between two fingers 5258. One or both fingers 5258 include lugs 5255 that are configured to interact with the flexible tabs 5219 of the adapter housing 5210 to retain the dust cap 5250 within the passage 5215. In the example shown, each lug 5255 defines a ramped surface.

In some implementations, the retaining section 5252 is configured to fit within the passage 5215 without pressing against the second contact location 5238 of each contact member 5231 of the media reading interfaces 5230 (see FIG. 155). In the example shown, the fingers 5258 of the retaining section 5252 are sufficiently short to remain within the passage 5215 of the adapter 5210 instead of extending into the channels 5218. Insertion of the dust cap 5250 within the passage 5215 does not cause the third contact location 5239 to press against the printed circuit board 5220. Accordingly, insertion of the dust cap 5250 does not trigger the presence detection sensor/switch.

Figure 156:
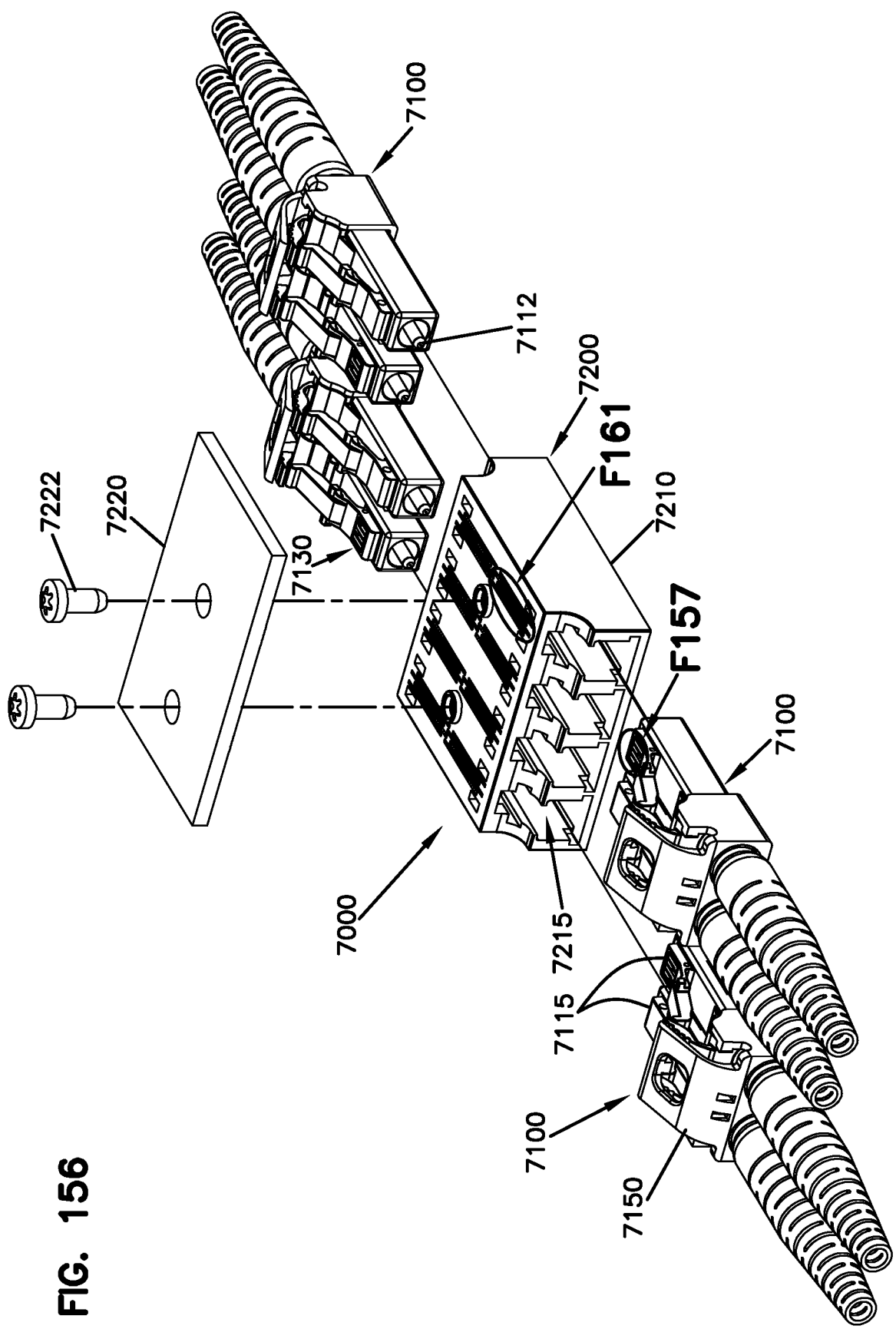
FIGS. 156-168 illustrate an eighth example implementation of a connector system that can be utilized on a connector assembly having PLI functionality as well as PLM functionality in accordance with aspects of the present disclosure.
Figure 275:
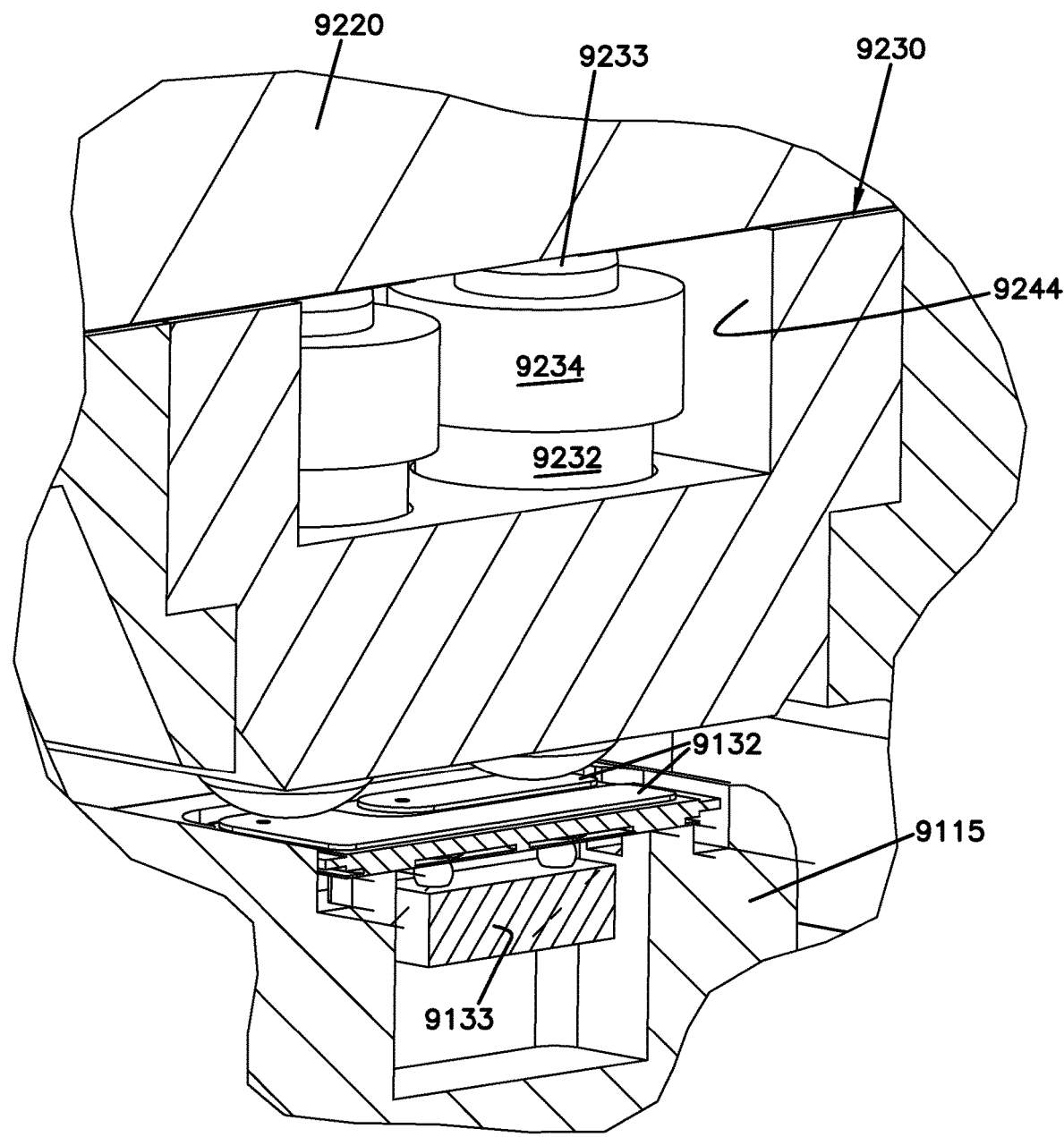
Figure 276:
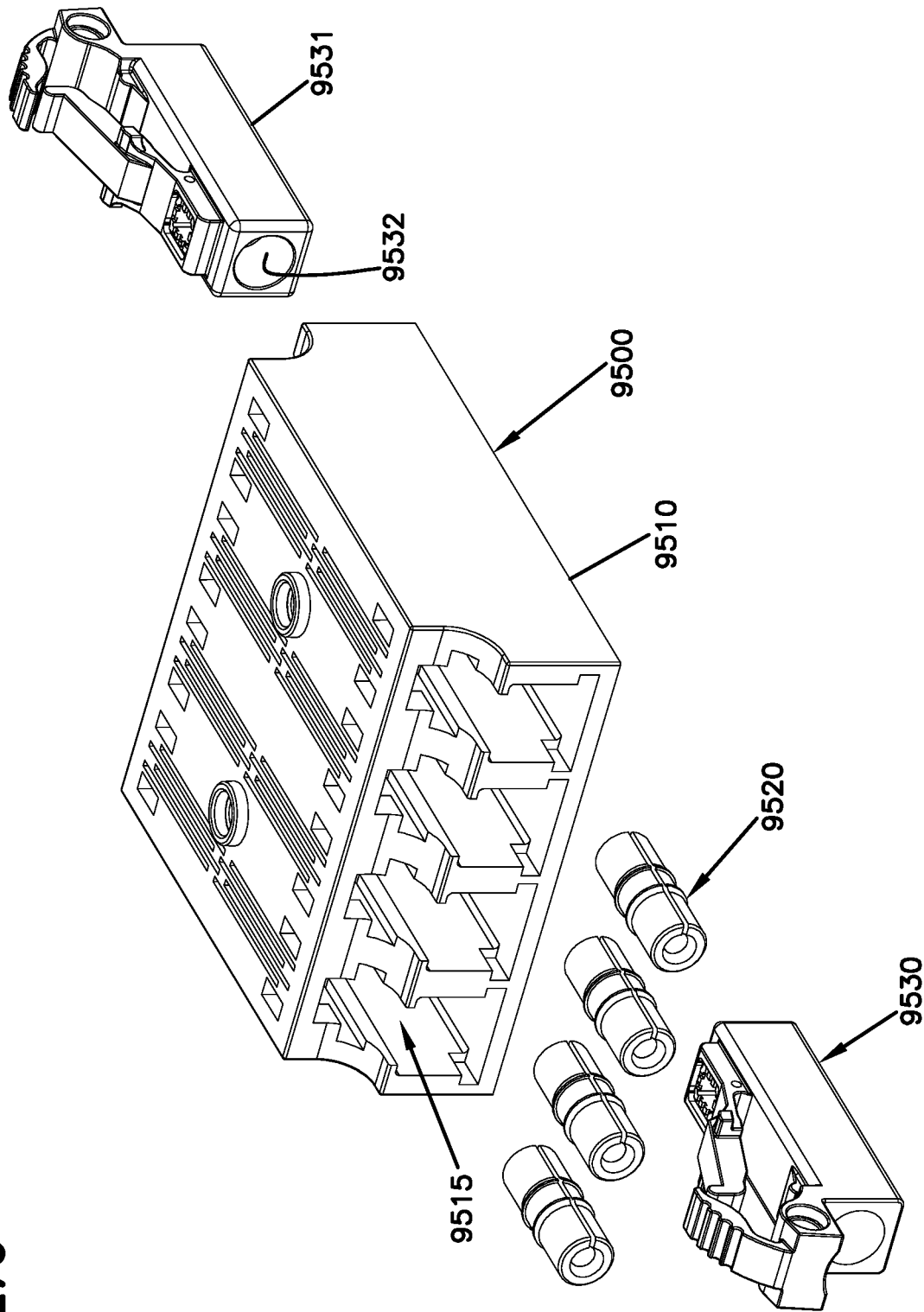
FIGS. 276-282 illustrate example coupler assemblies having alternative alignment features for aligning ferrules of connector arrangements received at the coupler assemblies.

FIGS. 156-275 show various implementations of alternative contact arrangements that are suitable for use as media reading interfaces for any of the optical adapters disclosed herein. For example, FIGS. 156-168 illustrate another example implementation of a connector system 7000 that can be utilized on a connector assembly (e.g., a communications panel) having PLI functionality as well as PLM functionality. The connector system 7000 includes at least one example communications coupler assembly 7200 and at least two connector arrangements 7100. In the example shown, the communications coupler assembly 7200 is configured to receive four connector arrangements 7100.

The communications coupler assembly 7200 is configured to be mounted to a connector assembly, such as a communications blade or a communications panel. One or more connector arrangements 7100, which terminate segments of communications media, are configured to communicatively couple to other segments of physical communications media at the coupler assembly 7200 (e.g., see FIG. 165). Accordingly, communications data signals carried by a media segment terminated by a first connector arrangement 7100 can be propagated to another media segment terminated by a second connector arrangement 7100 through the communications coupler assembly 7200.

In some implementations, each connector arrangement 7100 defines a duplex fiber optic connector arrangement including two connectors, each of which terminates an optical fiber. In the example shown, the connector arrangements 7100 are the same as connector arrangements 4100 of FIGS. 103-111. In other implementations, however, the connector arrangements 7100 may include an SC-type connector arrangement, an ST-type connector arrangement, an FC-type connector arrangement, an MPO-type connector arrangement, an LX.5-type connector arrangement, or any other type of connector arrangement.

In accordance with some aspects, each communications coupler assembly 7200 is configured to form a single link between segments of physical communications media. For example, each communications coupler assembly 7200 can define a single passage at which a first connector arrangement is coupled to a second connector arrangement. In accordance with other aspects, however, each communications coupler assembly 7200 is configured to form two or more links between segments of physical communications media. For example, in the example shown in FIG. 156, the communications coupler assembly 7200 defines four passages 7215.

In some implementations, each passage 7215 of the communications coupler assembly 7200 is configured to form a single link between first and second connector arrangements 7100. In other example implementations, two or more passages 7215 can form a single link between connector arrangements 7100 (e.g., two ports can form a link between duplex connector arrangements). In still other example implementations, each communications coupler assembly 7200 can form a one-to-many link. For example, the communications coupler assembly 7200 can connect a duplex connector arrangement to two single connector arrangements or to another duplex connector arrangement.

One example implementation of a connector arrangement 7100 is shown in FIG. 156. Each connector arrangements 7100 includes one or more fiber optic connectors, each of which terminates one or more optical fibers. In the example shown, each connector arrangement 7100 defines a duplex fiber optic connector arrangement including two fiber optic connectors held together using a clip 7150. In another example implementation, a connector arrangement 7100 can define a single fiber optic connector. As shown, each fiber optic connector includes a connector body protecting a ferrule 7112 that retains an optical fiber. The connector body is secured to a boot for providing bend protection to the optical fiber. In the example shown, the connector is an LC-type fiber optic connector. The connector body includes a fastening member (e.g., clip arm) that facilitates retaining the fiber optic connector within a passage 7215 in the communications coupler assembly 7200.

Each connector arrangement 7100 is configured to store physical layer information. For example, a storage device 7130 may be installed on or in the body of one or more of the fiber optic connectors of each connector arrangement 7100. In the example shown, the storage device 7130 is installed on only one fiber optic connector of a duplex connector arrangement 7100. In other implementations, however, a storage device 7130 may be installed on each fiber optic connector of a connector arrangement 7100. In the example shown, the storage device 7130 is located within a key 7115 of each connector arrangement 7100. In other implementations, the storage device 7130 may be located at another position on or in the connector arrangement 7100.

Figure 157:
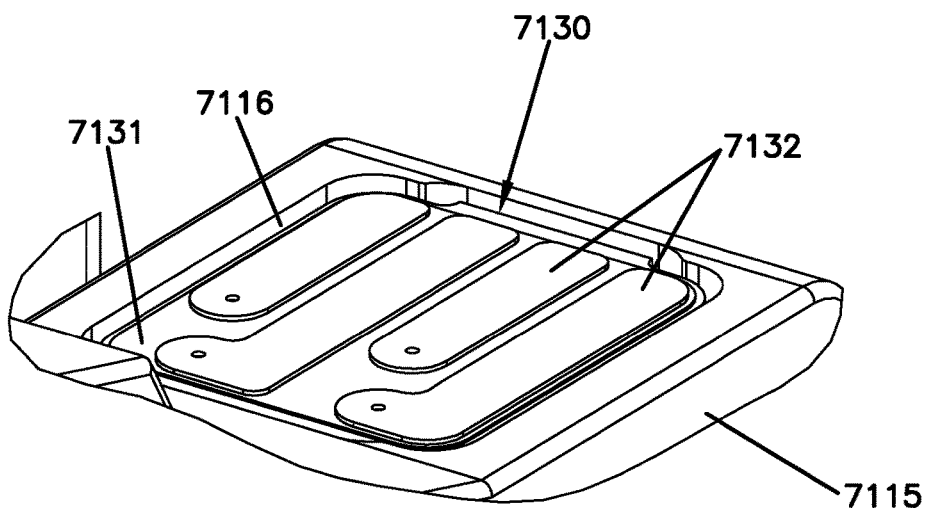

One example storage device 7130 includes a printed circuit board 7131 on which memory circuitry can be arranged (see FIG. 157). Electrical contacts 7132 also are arranged on the printed circuit board 7131 for interaction with a media reading interface of the communications coupler assembly 7200 (described in more detail herein). Any of the implementations of electrical contacts 7132 disclosed herein are suitable for use in the storage device 7130. In one example implementation, the storage device 7130 includes an EEPROM circuit 7133 (FIG. 164) arranged on the printed circuit board 7131. In the example shown in FIG. 156, an EEPROM circuit 7133 is arranged on the non-visible side of the circuit board 7131. In other implementations, however, the storage device 7130 can include any suitable type of non-volatile memory.

FIGS. 158-161 show one example implementation of a communications coupler assembly 7200 implemented as a fiber optic adapter. The example communications coupler assembly 7200 includes an adapter housing 7210 configured to align and interface two or more fiber optic connector arrangements 7100. In other example implementations, the adapter housing 7210 may be configured to communicatively couple together a fiber optic connector with a media converter (not shown) to convert the optical data signals into electrical data signals, wireless data signals, or other such data signals. In still other implementations, the communications coupler assembly 7200 can include an electrical termination block that is configured to receive punch-down wires, electrical plugs (e.g., for electrical jacks), or other types of electrical connectors.

Figure 158:
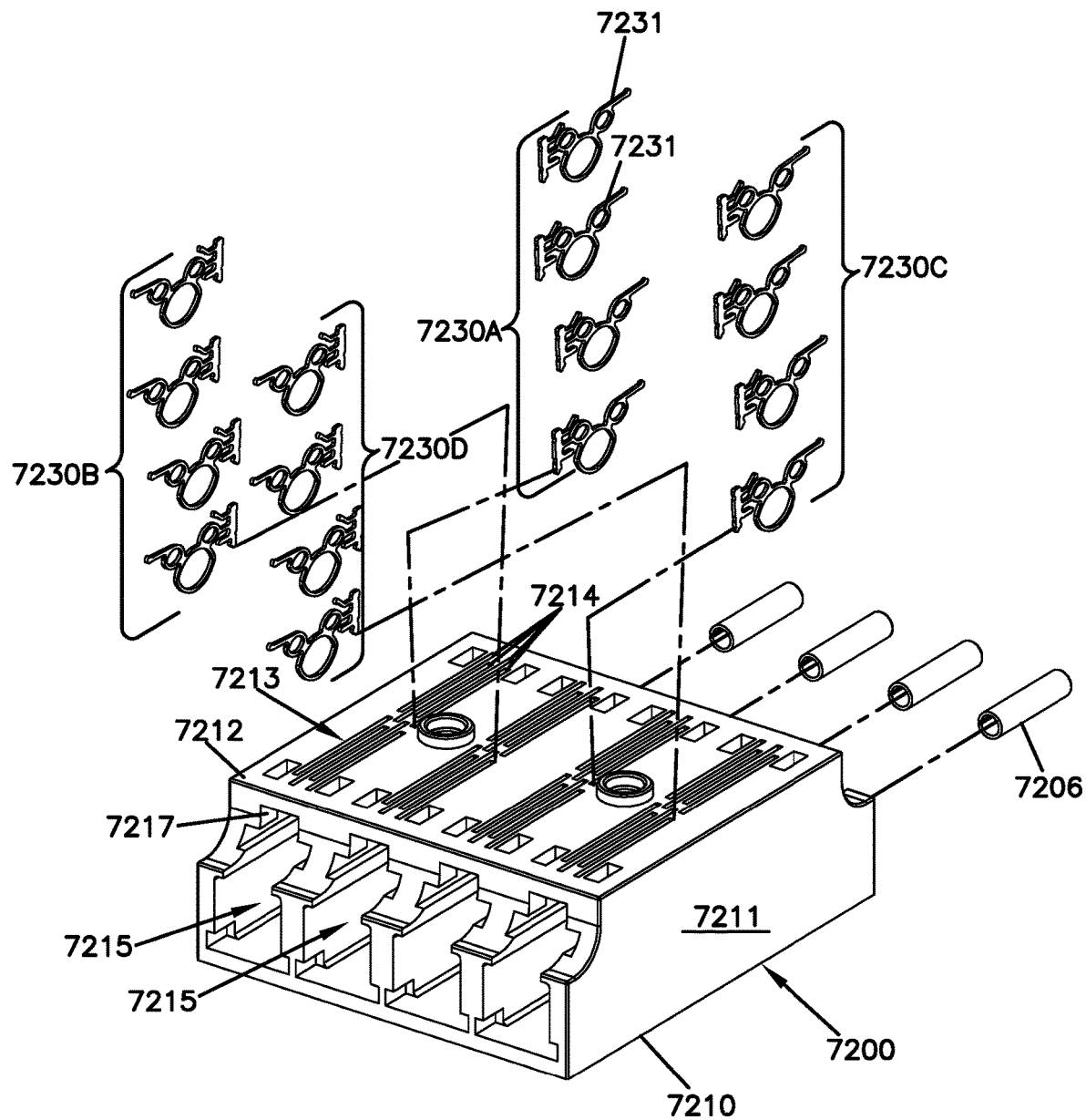

The example adapter housing 7210 is formed from opposing sides 7211 interconnected by first and second ends 7212 (FIG. 158). The sides 7211 and ends 7212 each extend between a front and a rear. The adapter housing 7210 defines one or more passages extending between the front and rear ends. Each end of each passage defines a port 7215 configured to receive a connector arrangement or portion thereof (e.g., one fiber optic connector of duplex connector arrangement 7100 of FIG. 156). A split sleeve 7206 is located in each passage to align ferrules 7215 of opposing connectors received at the ports 7215.

In the example shown, the adapter housing 7210 defines four passages and eight ports 7215. In other implementations, however, the adapter housing 7210 may define one, two, three, six, eight, ten, twelve, sixteen, or even more passages. Sleeves (e.g., split sleeves) 7206 are positioned within the passages to receive and align the ferrules 7112 of fiber optic connectors (see FIG. 165). In certain implementations, the adapter housing 7210 also defines latch engagement channel 7217 (FIG. 158) at each port 7215 to facilitate retention of the latch arms of the fiber optic connectors. Each latch engagement channel 7217 is sized and shaped to receive the key or keys 7115 of the connector arrangement 7100.

Figure 162:
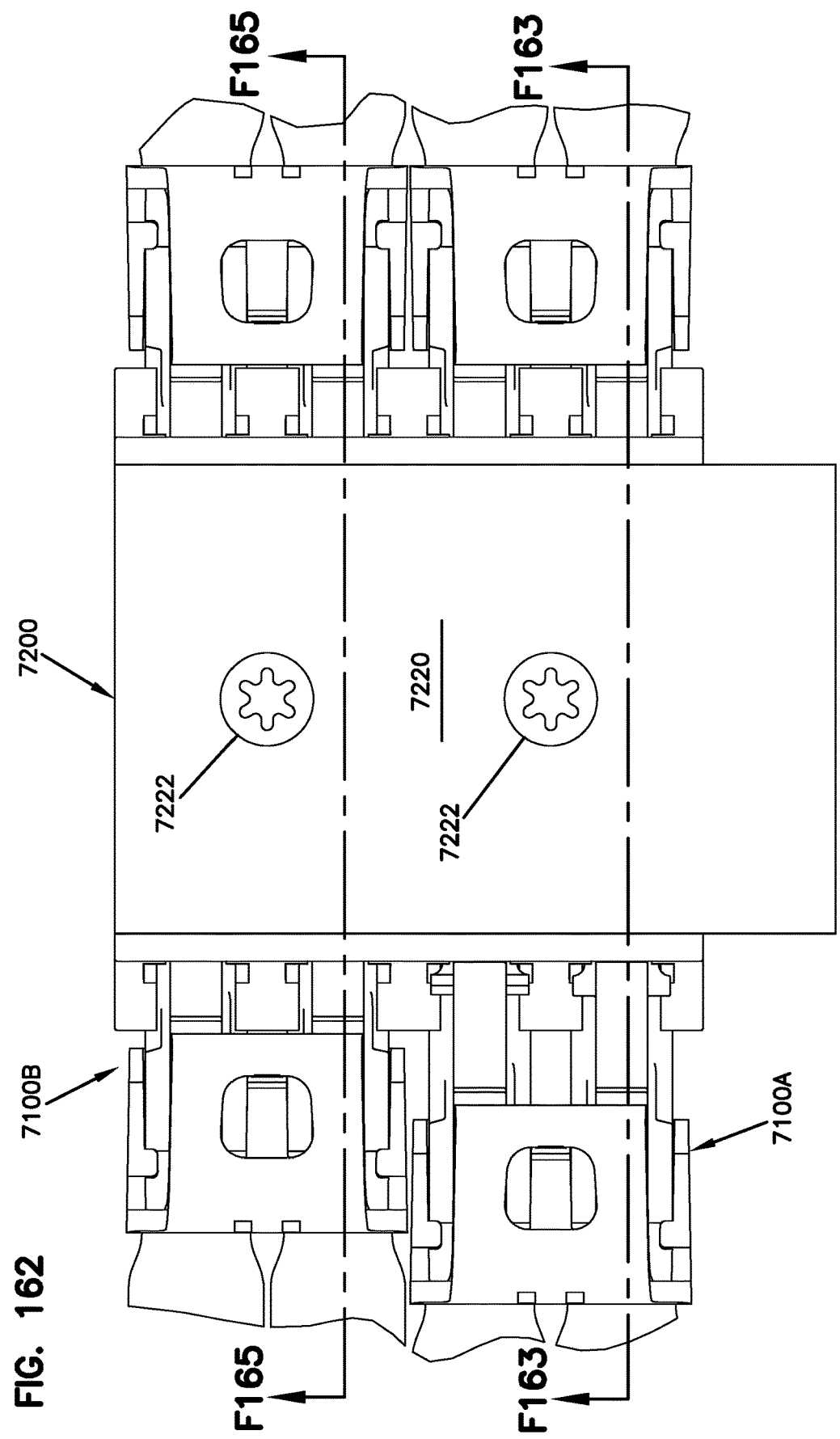

As shown in FIGS. 156 and 162, a printed circuit board 7220 is configured to secure (e.g., via fasteners 7222) to the adapter housing 7210. In some implementations, the example adapter housing 7210 includes two annular walls in which the fasteners 7222 can be inserted to hold the printed circuit board 7220 to the adapter housing 7210. Non-limiting examples of suitable fasteners 7222 include screws, snaps, and rivets. For ease in understanding, only a portion of the printed circuit board 7220 is shown in FIGS. 156 and 162. It is to be understood that the printed circuit board 7220 electrically connects to a data processor and/or to a network interface (e.g., the processor 217 and network interface 216 of FIG. 2). It is further to be understood that multiple communications coupler housings 7210 can be connected to the printed circuit board 7220 within a connector assembly (e.g., a communications panel).

The fiber optic adapter 4210 includes one or more media reading interfaces 7230, each configured to connect the printed circuit board 7220 to the storage devices 7130 of the fiber optic connector arrangements 7100 plugged into the fiber optic adapter 7210. The contact members 7231 extend between the slotted surface 7212 of the adapter housing 7210 and the passages extending through the adapter 7210. Portions of each contact member 7231 engage contacts and tracings on the printed circuit board 7220 mounted to the slotted surface 7212. Other portions of the contact members 7231 engage the electrical contacts 7132 of the storage members 7130 attached to any connector arrangements 7100 positioned in the passages (see FIGS. 167-168). A processor coupled to the circuit board 7220 can access the memory 7133 of each connector arrangement 7100 through a corresponding media reading interface 7230.

Figure 160:
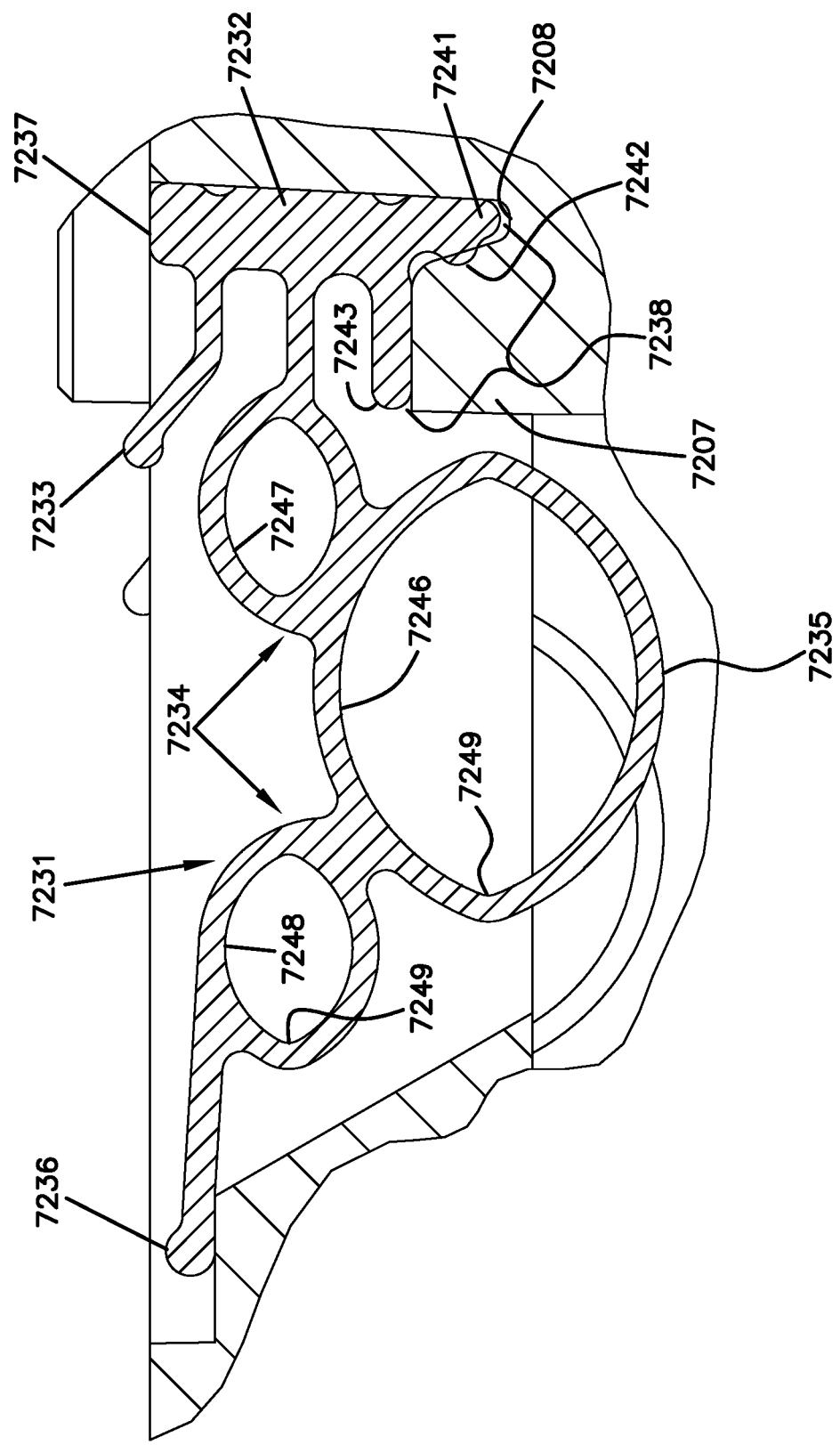

In general, each media reading interface 7230 is formed from one or more contact members 7231 (see FIG. 160). For example, in certain implementations, the media reading interface 7230 includes at least a first contact member 7231 that transfers power, at least a second contact member 7231 that transfers data, and at least a third contact member 7231 that provides grounding. In one implementation, the media reading interface 7230 includes a fourth contact member. In other implementations, however, the media reading interface 7230 include greater or fewer contact members 7231.

Figure 168:
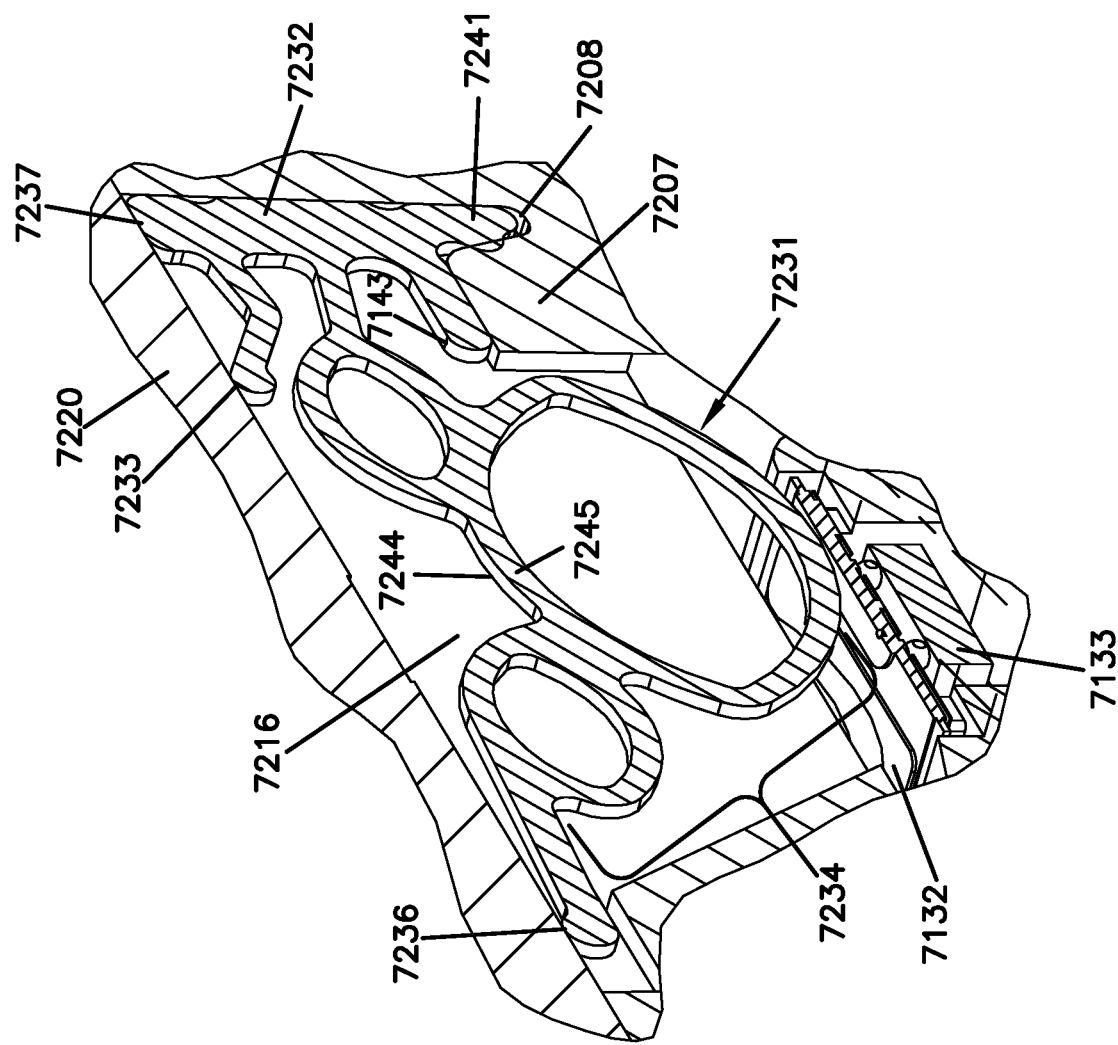

Each contact member 7231 includes a body defining a circumferential edge 7244 extending between planar major sides 7245 (FIG. 168). In certain implementations, the circumferential edge 7244 defines a contact surface of one or more contact sections as will be described herein. In some implementations, the edge 7244 has a substantially continuous thickness. In various implementations, the thickness ranges from about 0.05 inches to about 0.005 inches. In certain implementations, the thickness is less than about 0.02 inches. In some implementation, the thickness is less than about 0.012 inches. In another implementation, the thickness is about 0.01 inches. In another implementation, the thickness is about 0.009 inches. In another implementation, the thickness is about 0.008 inches. In another implementation, the thickness is about 0.007 inches. In another implementation, the thickness is about 0.006 inches. In other implementations, the thickness may vary across the body of the contact member 7231.

In certain implementations, a top surface of the coupler housing 7210 defines slots 7214 configured to receive the one or more contact members 7231. At least a portion of each slot 7214 extends through the top surface of the adapter 7210 to one of the passages. When a connector 7110 with a storage device 7130 is inserted into one of the ports 7215 of the coupler housing 7210, the contact pads 7132 of the storage device 7130 are configured to align with the slots 7214 defined in the adapter housing 7210. Accordingly, the contact members 7231 held within the slots 7214 align with the contact pads 7132 to connect the contact pads 7132 to contact pads on the printed circuit board 7220 mounted to the adapter 7210.

Figure 159:
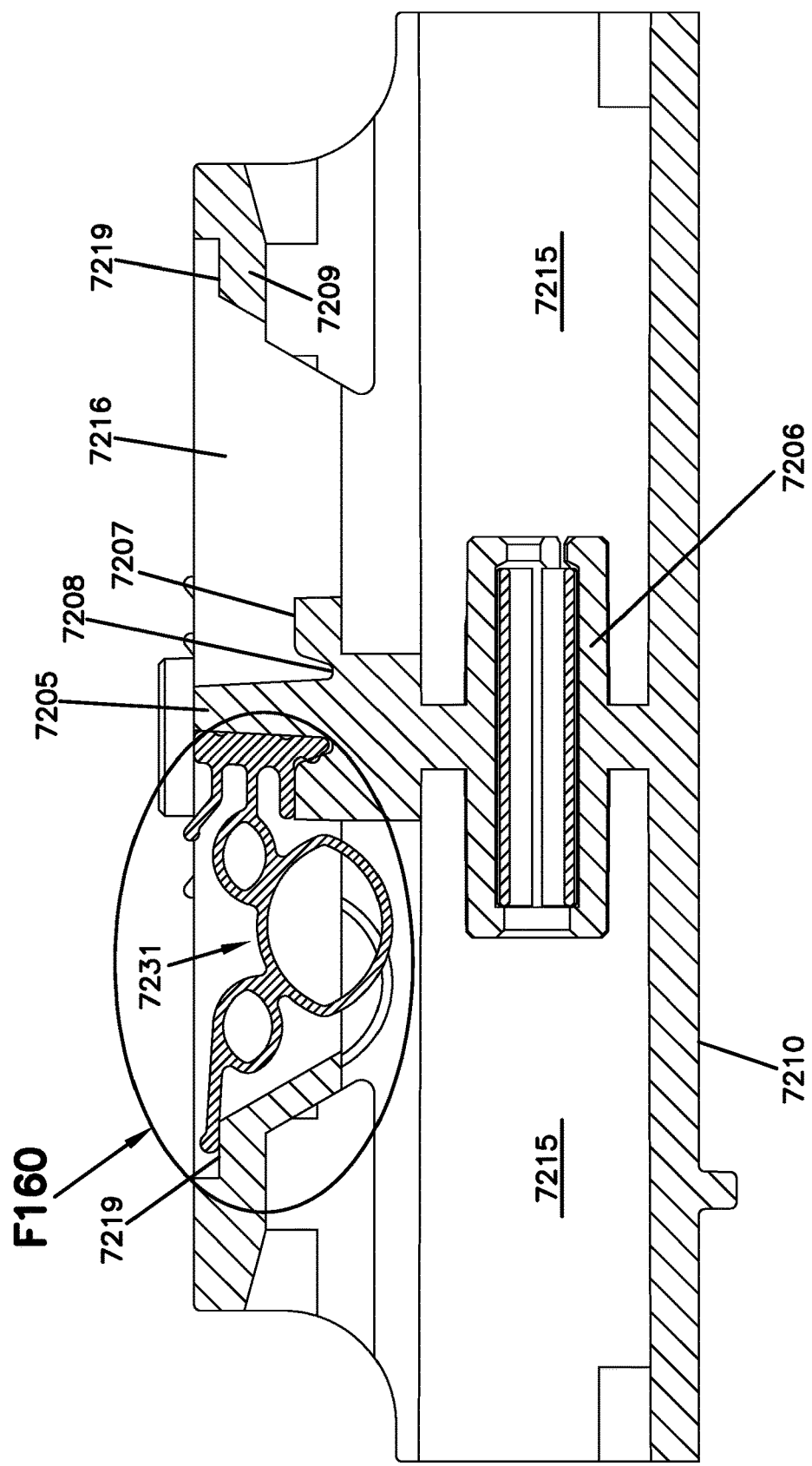

In some implementations, each contact member 7231 is retained within a separate slot 7214. For example, in the implementation shown in FIGS. 158-168, each media reading interface 7230 includes four contact members 7231 that are held in a set 7213 (FIG. 158) of four slots 7214 that align with four contact pads 7132 on a connector storage device 7130. The slots 7214 in each set 7213 are separated by intermediate walls 7216 (FIG. 159). In other implementations, all of the contact members 7231 in a single media reading interface 7230 may be retained in a single slot 7214 (e.g., see FIGS. 218-275 and the associated text).

Figure 161:
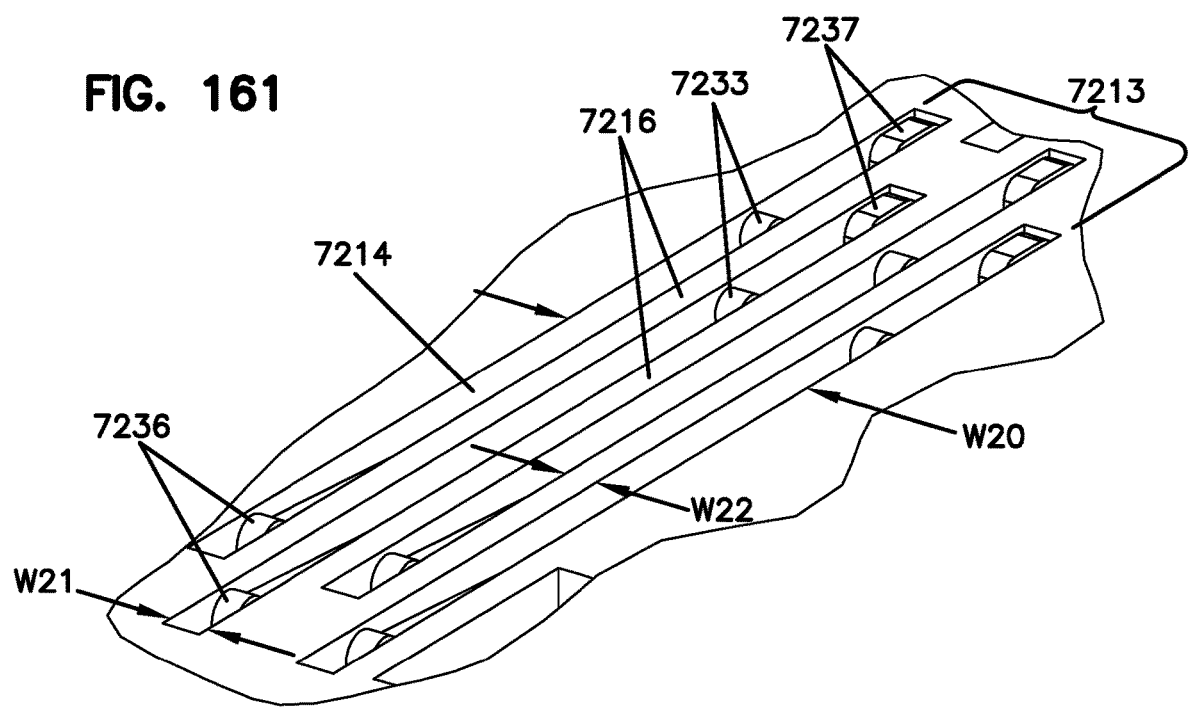

As shown in FIG. 161, each set 7213 of slots 7214 accommodating one media reading interface 7230 has a width W20 and each slot 7214 has a width W21. Intermediate walls 7216, which separate the slots 7214 of each set 7213, each have a width W22. In general, the width W20 of each set 7213 of slots 7214 is smaller than the width of the key 7115 of a connector positioned in the respective adapter port 7215. In some implementations, the width W20 of each set 7213 of slots 7214 is less than 3.35 mm (0.13 inches). Indeed, in some implementations, the width W20 of each set 7213 of slots 7214 is less than about 3.1 mm (0.12 inches). In certain implementations, the width W20 of each set 7213 of slots 7214 is no more than about 2.5 mm (0.10 inches). In one example implementation, the width W20 of each set 7213 of slots 7214 is no more than 2.2 mm (0.09 inches). In one example implementation, the width W20 of each set 7213 of slots 7214 is about 2 mm (0.08 inches). In one example implementation, the width W20 of each set 7213 of slots 7214 is about 2.1 mm (0.081 inches).

In certain implementations, the width W22 of the intermediate walls 7216 is smaller than the width W21 of the slots 7214. In some implementations, the width W21 of each slot 7214 is within the range of about 0.25 mm (0.010 inches) to about 0.64 mm (0.025 inches). Indeed, in some implementations, the width W21 of each slot 7214 is within the range of about 0.25 mm (0.010 inches) to about 0.48 mm (0.019 inches). In one implementation, the width W21 of each slot 7214 is about 0.43-0.44 mm (0.017 inches). In one implementation, the width W21 of each slot 7214 is about 0.41-0.42 mm (0.016 inches). In one implementation, the width W21 of each slot 7214 is about 0.45-0.46 mm (0.018 inches). In one implementation, the width W21 of each slot 7214 is about 0.3 mm (0.012 inches). In one implementation, the width W21 of each slot 7214 is about 0.28 mm (0.011 inches). In one implementation, the width W21 of each slot 7214 is about 0.33 mm (0.013 inches).

In some implementations, the width W22 of each intermediate wall 7216 is within the range of about 0.13 mm (0.005) inches to about 0.38 mm (0.015 inches). In one implementation, the width W21 of each intermediate wall 7216 is about 0.15 mm (0.006 inches). In one implementation, the width W22 of each intermediate wall 7216 is about 0.28 mm (0.011 inches). In one implementation, the width W22 of each intermediate wall 7216 is about 0.28 mm (0.011 inches). In one implementation, the width W22 of each intermediate wall 7216 is about 0.33 mm (0.013 inches). In one implementation, the width W22 of each intermediate wall 7216 is about 0.25 mm (0.010 inches). In certain implementations, the width W22 of each intermediate wall 7216 is within the range of about 0.13 mm (0.005) inches to about 0.18 mm (0.007 inches). In one implementation, the width W22 of each intermediate wall 7216 is about 0.15 mm (0.006 inches).

The adapter housing 7210 defines a sufficient number of slots 7214 to accommodate the contact members 7231 of the media reading interfaces 7230 installed at the adapter 7210. In some implementations, the adapter 7210 includes at least one set 7213 of forward slots 7214 and at least one set 7213 of rearward slots 7214. In the example shown in FIG. 158, the slots 7214 defined at front ports 7215 of the adapter passages axially align with slots 7214 defined at the rear ports 7215. In other implementations, however, the slots 7214 at the front ports 7215 may be staggered from the slots 7214 at the rear ports 7215.

In some implementations, the contact members 7231 of a single media reading interface 7230 are positioned in a staggered configuration with at least one of the contact members 7231 being axially forward or rearward of at least another of the contact members 7231 (see FIG. 161). In some implementations, the slots 7214 accommodating the staggered contact members 7231 also are staggered. For example, as shown in FIG. 158, alternating slots 7214 can be staggered in a front to rear direction. In other implementations, however, the slots 7214 accommodating the staggered contacts 7231 may each have a common length that is longer than a length of the staggered arrangement of contact members 7231. In still other implementations, the front and rear ends of the contact members 7231 of a single media reading interface 7230 are transversely aligned within similarly transversely aligned slots 7214.

As shown in FIG. 159, at least one support wall 7205 separates the forward slots 7214 from the rearward slots 7214. Each support wall 7205 extends from the slotted top surface 7212 of the adapter housing 7210 the passages. In some implementations, a single support wall 7205 extends along a center of the adapter housing 7210. In other implementations, one or more support walls 7205 may extend between slots 7214 arranged in a staggered configuration. In certain implementations, the support walls 7205 may connect to or be continuous with the intermediate walls 7216. In some implementations, the support wall 7205 of the adapter housing 7210 defines a recess or channel 7208 and an extension 7207 (FIG. 159). In some implementations, a support portion 7209 (FIG. 159) of the adapter housing 7210 projects partially into each passages opposite the support wall 7205. The support portion 7209 defines a ledge 7219 recessed within each slot 7214.

One example type of contact member 7231 is shown in FIGS. 159-160. Each contact member 7231 includes at least two contact sections defining contact surfaces. One of the contact sections contacts the printed circuit board 7220 and the other contact section contacts the storage device 7130 on a corresponding connector arrangement 7100. The example contact member 7231 is configured to seat in one of the slots 7214 of the adapter housing 7210. For example, the contact member 7231 includes a base 7232 that is configured to abut the support wall 7205 of the adapter housing 7210. In one implementation, the side of the base 7232 that abuts the support wall 7205 is flat. In another implementation, the side of the base 7232 that abuts the support wall 7205 defines one or more notches.

The base 7232 defines an attachment section 7238 that engages a portion of the support wall 7205 to secure the contact member 7231 within the slot 7214. In one implementation, the attachment section 7238 is configured to snap-fit into the support wall 7205. In other implementations, the attachment section 7238 may otherwise mount to the support wall 7205. In some implementations, the attachment section 7238 of the contact member 7231 includes a first leg 7241 and a second leg 7243 extending from the base 7232. When the attachment section 7238 is mounted to the support wall 7205, the first leg 7241 fits in the recess 7208 and the second leg 7243 seats on the extension 7207. In one implementation, the first leg 7241 defines a bump 7242 to further secure the first leg 7241 in the recess 7208.

In accordance with some aspects, the media reading interfaces 7230 are configured to detect when a connector arrangement 7100 is inserted into one of the adapter ports 7215. The media reading interfaces 7230 can function as presence detection sensors or trigger switches. In some implementations, the contact members 7231 of a media reading interface 7230 are configured to form a complete circuit between the circuit board 7220 and the connector storage devices 7130 only when a connector arrangement 7110 is received at the adapter 7210. For example, at least a portion of each contact member 7231 may be configured to contact the circuit board 7220 only after being pushed toward the circuit board 7220 by a portion of a connector arrangement 7100. In other example implementations, portions of the contact members 7231 can be configured to complete a circuit until pushed away from the circuit board 7220 or a shorting rod by a connector arrangement 7100. In accordance with other aspects, however, some implementations of the contact members 7231 may be configured to form a complete circuit with the circuit board 7220 regardless of whether a connector arrangement 7100 is received at the adapter 7210.

In the example shown in FIGS. 156-168, each contact member 7231 includes at least three moveable (e.g., flexible) contact sections 7233, 7235, and 7236 defining contact surfaces. The flexibility of the contact sections provides tolerance for differences in spacing between the contact member 7231 and the respective printed circuit board 7220 when the coupler assembly 7200 is manufactured. Certain types of contact members 7231 also include at least one stationary contact 7237 having a contact surface that contacts the circuit board 7220. In the example shown, the stationary contact 7237 is defined at an end 7237 of the base 7232. In one implementation, the first contact section 7233 and/or the stationary contact 7237 may provide grounding for the contact member 7231 through the circuit board 7220.

The first moveable contact section 7233 is configured to extend through the slot 7214 and engage the circuit board 7220. The first stationary contact 7237 also is configured to extend through the slot 7214 to engage the circuit board 4220. The ability of the first contact section 7233 to flex relative to the stationary contact 7237 provides tolerance for placement of the contact member 7231 relative to the circuit board 7220. The second moveable contact section 7235 is configured to extend into a respective one of the passages and to engage the connector arrangement 4100 positioned in the passage. If a storage device 7130 is installed on the connector arrangement 7100, then the second contact surface 7235 is configured to engage the contact pads 7132 of the storage device 7130.

The third moveable contact surface 7236 is configured to selectively extend through the slot 7214 and engage the circuit board 7220. For example, the third contact surface 7236 may be configured to engage the circuit board 7220 when a connector arrangement 7100 is received at a port 7215 corresponding with the respective media reading interface 7230. The example contact member 7231 also includes a resilient section 7234 that biases the third contact surface 7236 upwardly through the slot 7214 (e.g., toward the circuit board 7220). In some implementations, the resilient section 7234 defines at least a partial arc.

In the implementation shown in FIG. 160, the resilient section 7234 includes three springs 7246, 7247, and 7248. In the example shown, each spring 7246, 7247, 7248 is football-shaped. In other implementations, however, the springs 7246-7248 may have any suitable shape. In certain implementations, one or more of the springs 7246-7248 may be shaped differently than the other springs. The first spring 7246 is connected to the base 7232 and the first contact section 7233 of the contact member 7231 via the second spring 7247. The first spring 7246 is connected to the third contact section 7236 of the contact member 7231 via the third spring 7248. In some implementations, the second and third springs 7247, 7248 are smaller than the first spring 7246. In other implementations, the resilient section 7234 may include greater or fewer springs.

At least the first spring 7246 is configured to deflect or flex when the front surface 7118 of the key 7115 of a connector arrangement 7100 pushes against the second contact section 7235 when the connector arrangement 7100 is inserted into a port 7215. In the example shown, the first spring 7246 flexes when deflected by the key 7115. For example, the first spring 7246 flexes when the deflecting surface 7118 pushes against an outer surface of the first spring 7246. In some implementations, outer surface of the first spring 7246 defines the second contact surface 7235. The resilient section 7234 is configured to transfer the force applied to the second contact section 7235 to the third contact section 7236. For example, in some implementations, the resilient section 7234 is configured to lift the third contact section 7236 to swipe the contact surface of the third contact section 7236 against the printed circuit board 7220 (see FIG. 166).

Figure 163:
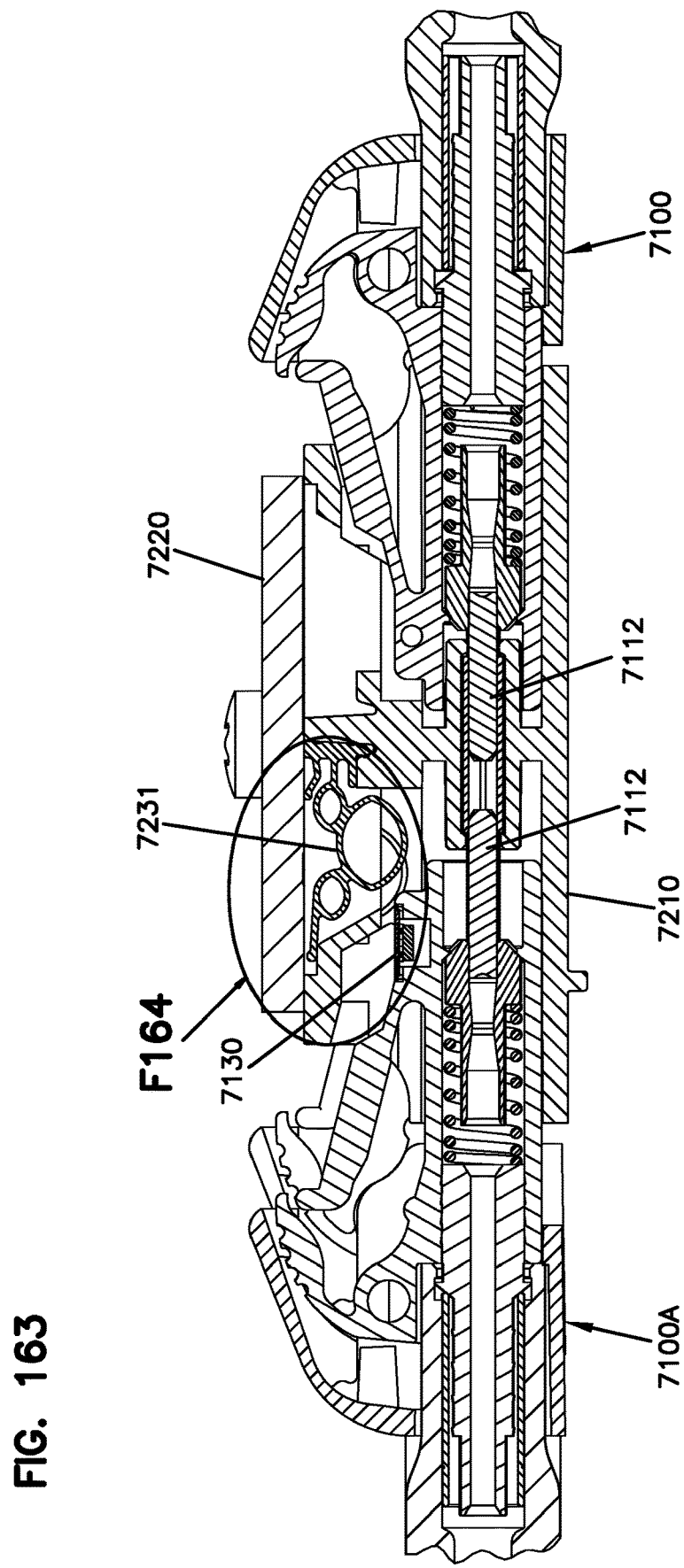
Figure 164:
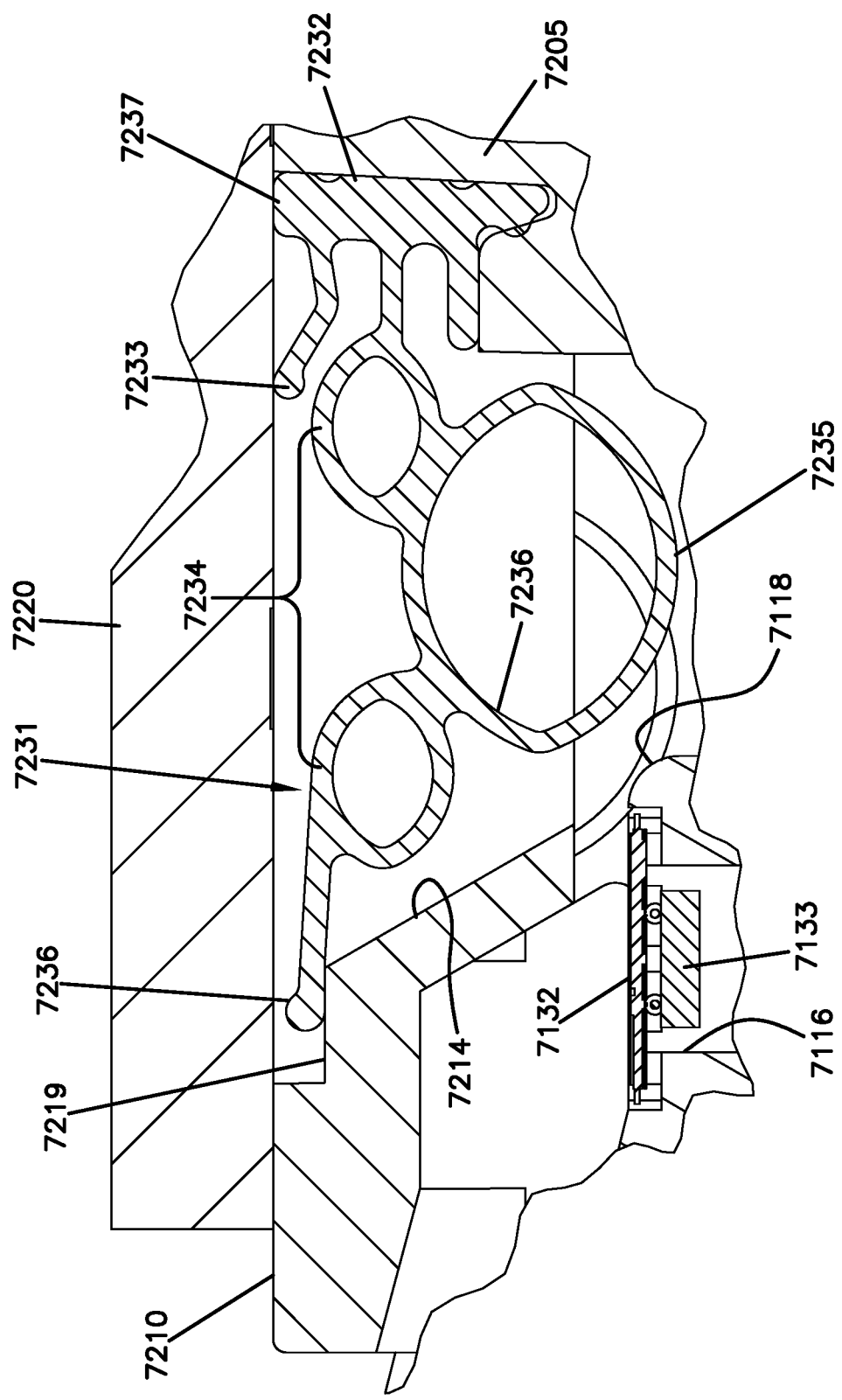
Figure 165:
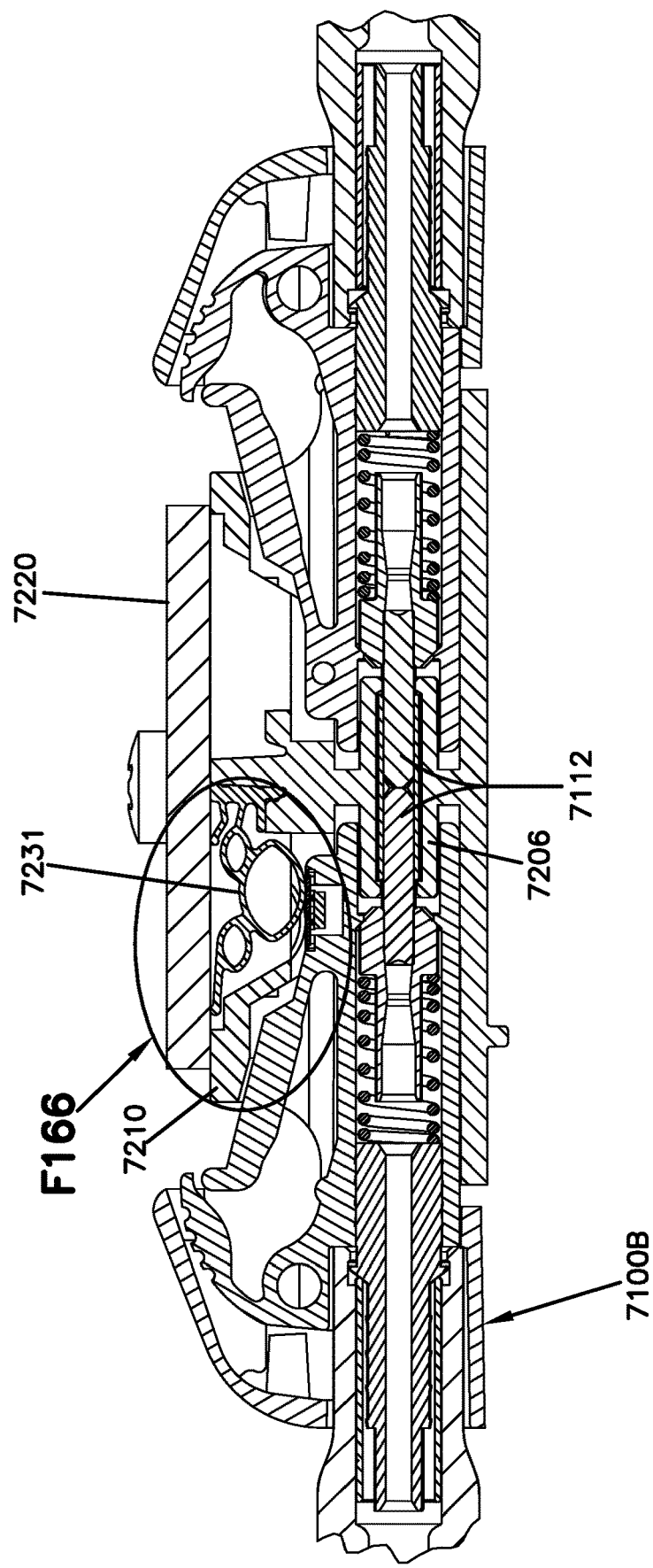
Figure 166:
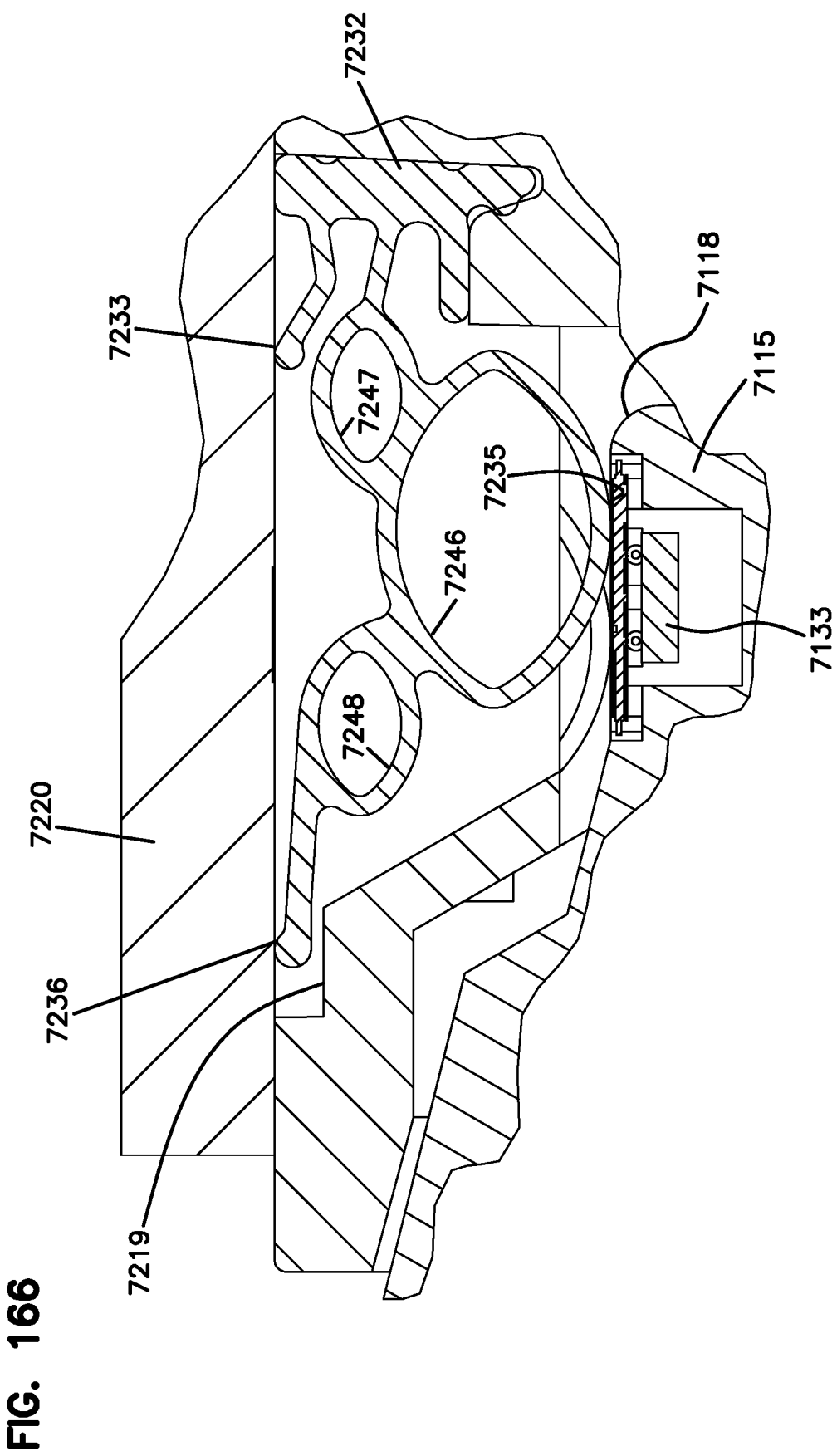
Figure 167:
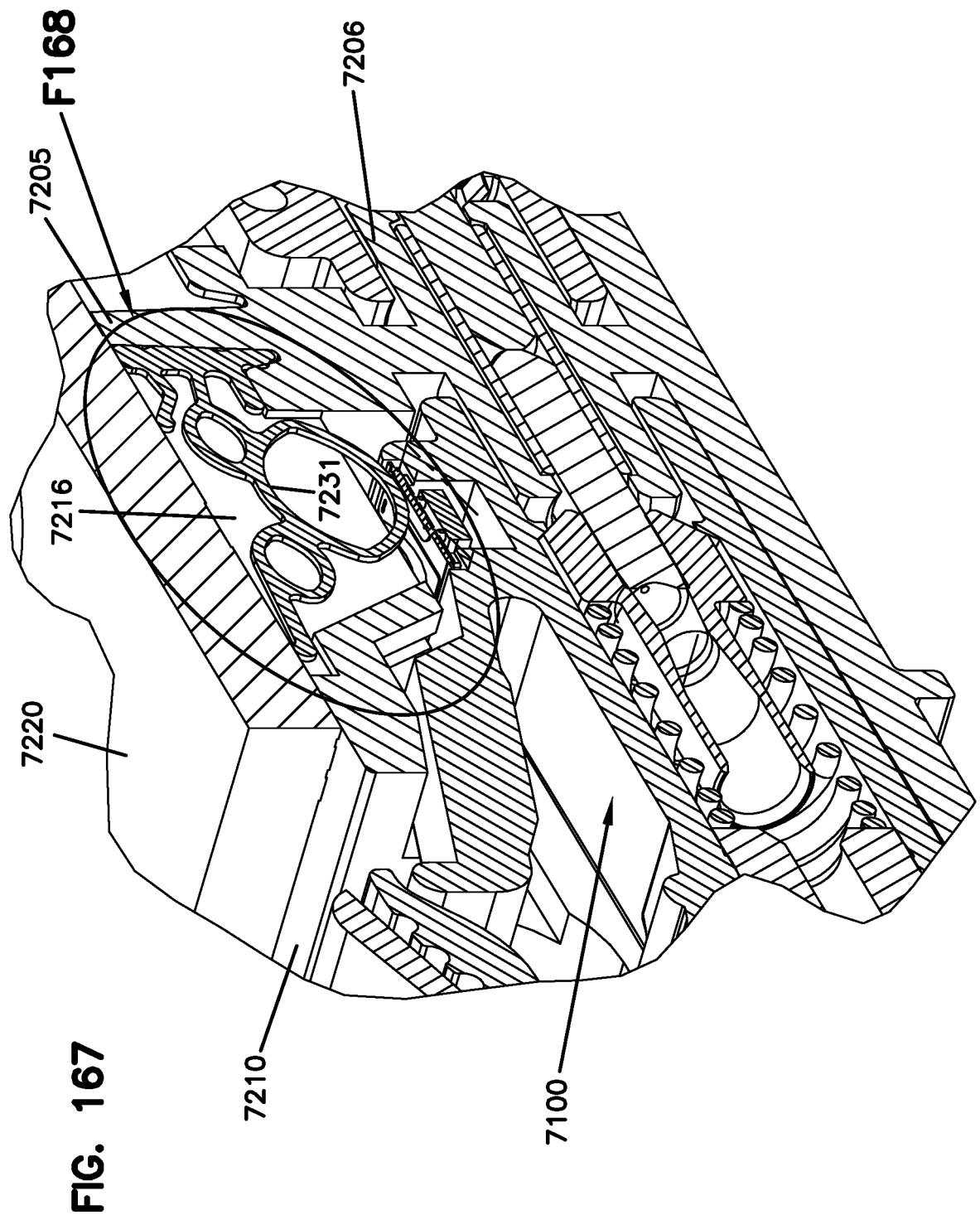

FIG. 162 is a top plan view of an adapter assembly 7200 having two connector arrangements 7100 received at the right side of an adapter 7210, a connector arrangement 7100A partially received at the left side of the adapter 7210, and another connector arrangement 7100B fully received at the left side of the adapter 7210. FIGS. 163 and 165 are cross-sectional views showing the partially received connector arrangement 7100A and the fully received connector arrangement 7100B. FIGS. 164 and 166 are enlarged views of portions of FIGS. 163 and 165, respectively.

As shown in FIGS. 163-164, the third contact section 7236 seats on the ledge 7219 of the adapter 7210 when a connector arrangement 7100 is not positioned within a respective port 7215. A contact surface of the third contact section 7236 is located spaced from the circuit board 7220 when the third contact section 7236 seats on the ledge 7219. As shown in FIGS. 165-166, inserting a connector arrangement 7100 into the port 7215 biases the third contact section 7236 upwardly from the ledge 7219 toward the circuit board 7220. In certain implementations, biasing the third contact section 7236 upwardly causes the contact surface of the third contact section 7236 to engage (e.g., touch or slide against) the circuit board 7220.

In some implementations, each contact member 7231 extends between a first end and a second end. For example, the base 7232 may define a first end of the contact member 7231 and the third contact section 7236 may define a second end of the contact member 7231. The contact member 7231 also extends between a top and a bottom. For example, the first and third contact sections 7233, 7236 may extend towards the top of the contact member 7231 and the second contact section 7235 may extend towards the bottom of the contact member 7231. As used herein, the terms "top" and "bottom" are not meant to imply a proper orientation of the contact member 7231 or that the top of the contact member 7231 must be located above the bottom of the connector 7231. Rather, the terms are used for ease in understanding and are assigned relative to the viewing plane of FIG. 159.

Portions of the planar surfaces 7245 of the contact member 7231 may increase and/or decrease in width. For example, in the example shown in FIG. 168, the base 7232 is wider than each of the contact sections 7233, 7235, and 7236. Portions of the resilient section 7234, such as where the springs 7246, 7247, 7248 meet, are wider than the contact sections 7233, 7235, 7236 or other portions of the springs 7246-7248. In certain implementations, each of the contact surfaces of the contact sections 7233, 7235, 7236 are rounded or otherwise contoured. For example, the first and third contact sections 7233, 7236 may define bulbous tips and the second contact section 7235 may define an arc (see FIG. 168).

In one implementation, the contact member 7231 is formed monolithically (e.g., from a continuous sheet of metal or other material). For example, in some implementations, the contact member 7231 may be manufactured by cutting a planar sheet of metal or other material. In other implementations, the contact member 7231 may be manufactured by etching a planar sheet of metal or other material. In other implementations, the contact member 7231 may be manufactured by laser trimming a planar sheet of metal or other material. In still other implementations, the contact member 7231 may be manufactured by stamping a planar sheet of metal or other material.

In some implementations, the adapter 7210 can include a media reading interface 7230 associated with each passage. For example, the quadruplex adapter 7210 shown in FIG. 158 includes a first media reading interface 7230A at the rear port 7215 of a first passage and a second media reading interface 7230B at the front port 7215 of a second passage to interface with two duplex fiber optic connector arrangements 7100 received thereat. The quadruplex adapter 7210 also includes a third media reading interface 7230C at the rear port 7215 of a third passage and a fourth media reading interface 7230D at the front port 7215 of a fourth passage to interface with another two duplex fiber optic connector arrangements 7100 received thereat.

In another implementation, the adapter 7210 can include a media reading interface 7230 associated with each port 7215. In still other implementations, a different number of media reading interfaces 7230 may be provided at the front and rear of the adapter 7210. For example, one side of the adapter housing 7210 can include two media reading interfaces 7230 to interface with two duplex fiber optic connector arrangements 7100 and another side of the adapter housing 7210 can include four media reading interfaces 7230 to interface with four separate fiber optic connectors. In other implementations, the adapter housing 7210 can include any desired combination of front and rear media reading interfaces 7230.

In some implementations, the adapter housing 7210 has more sets 7213 of slots 7214 than media reading interfaces 7230. In other implementations, however, the adapter housing 7210 may have the same number of slot sets 7213 and media reading interfaces 7230. In certain implementations, each adapter housing 7210 defines a set 7213 of slots 7214 at each port 7215 of each passage. In other implementations, each adapter housing 7210 may define a set 7213 of slots 7214 at only one port 7215 of each passage. In other implementations, the adapter housing 7210 may define a set 7213 of slots 7214 at each port 7215 of alternate passages.

FIGS. 169-181 illustrate another example implementation of a connector system 8000 that can be utilized on a connector assembly (e.g., a communications panel) having PLI functionality as well as PLM functionality. The connector system 8000 includes at least one example communications coupler assembly 8200 and at least two connector arrangements 8100. In the example shown, the communications coupler assembly 8200 is configured to receive four connector arrangements 8100.

The communications coupler assembly 8200 is configured to be mounted to a connector assembly, such as a communications blade or a communications panel. One or more connector arrangements 8100, which terminate segments of communications media, are configured to communicatively couple to other segments of physical communications media at the coupler assembly 8200 (e.g., see FIG. 178). Accordingly, communications data signals carried by a media segment terminated by a first connector arrangement 8100 can be propagated to another media segment terminated by a second connector arrangement 8100 through the communications coupler assembly 8200.

In some implementations, each connector arrangement 8100 defines a duplex fiber optic connector arrangement including two connectors, each of which terminates an optical fiber. In the example shown, the connector arrangements 8100 are the same as connector arrangements 4100 of FIGS. 103-111. In other implementations, however, the connector arrangements 8100 may include an SC-type connector arrangement, an ST-type connector arrangement, an FC-type connector arrangement, an MPO-type connector arrangement, an LX.5-type connector arrangement, or any other type of connector arrangement.

In accordance with some aspects, each communications coupler assembly 8200 is configured to form a single link between segments of physical communications media. For example, each communications coupler assembly 8200 can define a single passage at which a first connector arrangement is coupled to a second connector arrangement. In accordance with other aspects, however, each communications coupler assembly 8200 is configured to form two or more links between segments of physical communications media. For example, in the example shown in FIG. 169, the communications coupler assembly 8200 defines four passages.

In some implementations, each passage of the communications coupler assembly 8200 is configured to form a single link between first and second connector arrangements 8100. In particular, each passage has a forward port 8215 at which a first connector 8110 is received and a rearward port 8215 at which a second connector 8110 is received. A split sleeve 8206 is positioned within the passage between the forward and rearward ports 8215 to align the ferrules 8112 of the connectors 8110. In other example implementations, two or more passages can form a single link between connector arrangements 8100 (e.g., two ports 8215 can form a link between duplex connector arrangements). In still other example implementations, each communications coupler assembly 8200 can form a one-to-many link. For example, the communications coupler assembly 8200 can connect a duplex connector arrangement 8100 to two monoplex (i.e., simplex) connectors 8110.

Figure 169:
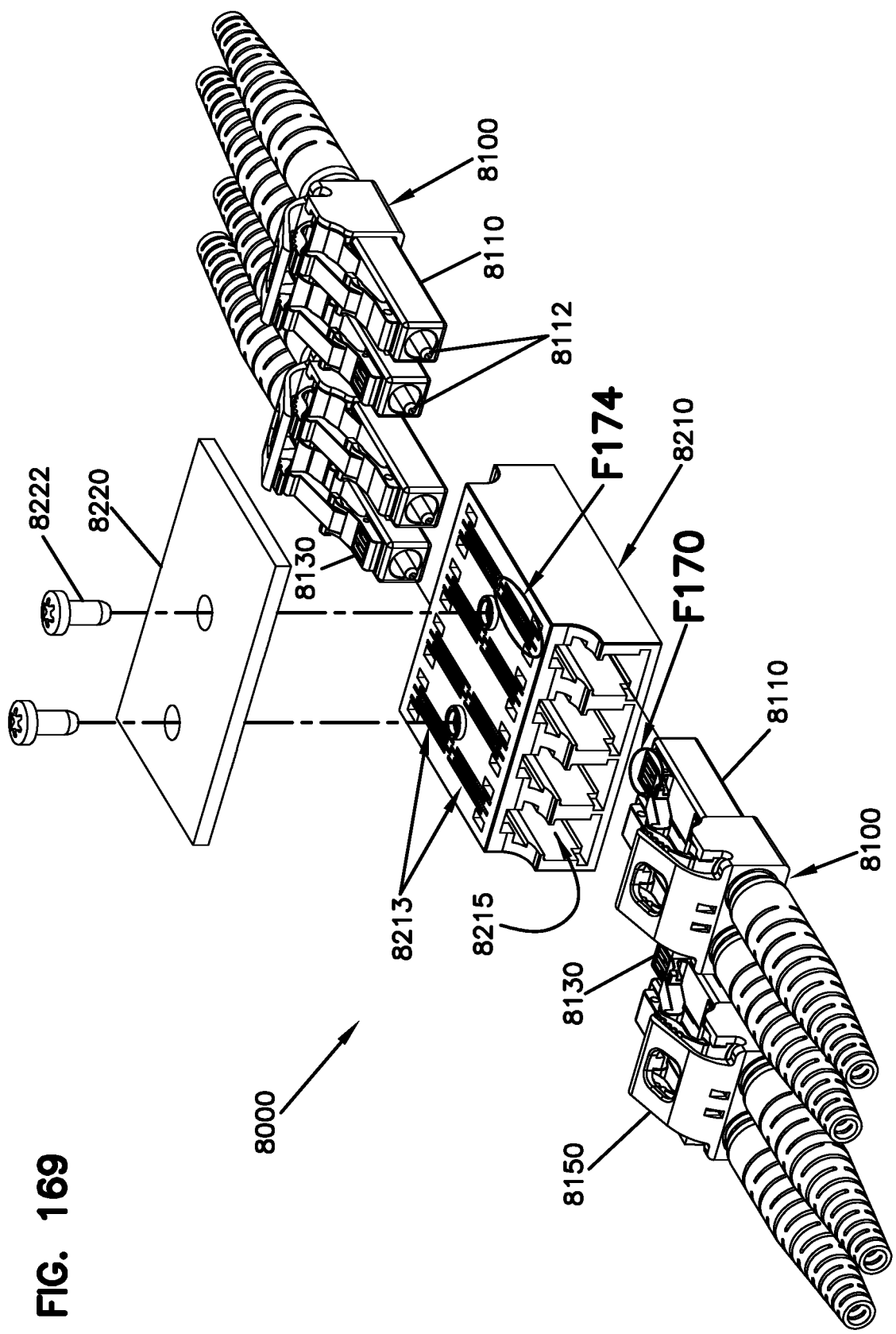

One example implementation of a connector arrangement 8100 is shown in FIG. 169. Each connector arrangements 8100 includes one or more fiber optic connectors 8110, each of which terminates one or more optical fibers. In the example shown, each connector arrangement 8100 defines a duplex fiber optic connector arrangement including two fiber optic connectors 8110 held together using a clip 8150. In another example implementation, a connector arrangement 8100 can define a single fiber optic connector 8110. As shown, each fiber optic connector 8110 includes a connector body protecting a ferrule 8112 that retains an optical fiber. The connector body is secured to a boot for providing bend protection to the optical fiber. In the example shown, the connector is an LC-type fiber optic connector. The connector body includes a fastening member (e.g., clip arm) that facilitates retaining the fiber optic connector within a port 8215 in the communications coupler assembly 8200.

Each connector arrangement 8100 is configured to store physical layer information. For example, a storage device 8130 may be installed on or in the body of one or more of the fiber optic connectors of each connector arrangement 8100. In the example shown, the storage device 8130 is installed on only one fiber optic connector 8110 of a duplex connector arrangement 8100. In other implementations, however, a storage device 8130 may be installed on each fiber optic connector 8110 of a connector arrangement 8100. In the example shown, the storage device 8130 is located within a key 8115 of each connector 8110. In other implementations, the storage device 8130 may be located at another position on or in the connector arrangement 8100.

Figure 170:
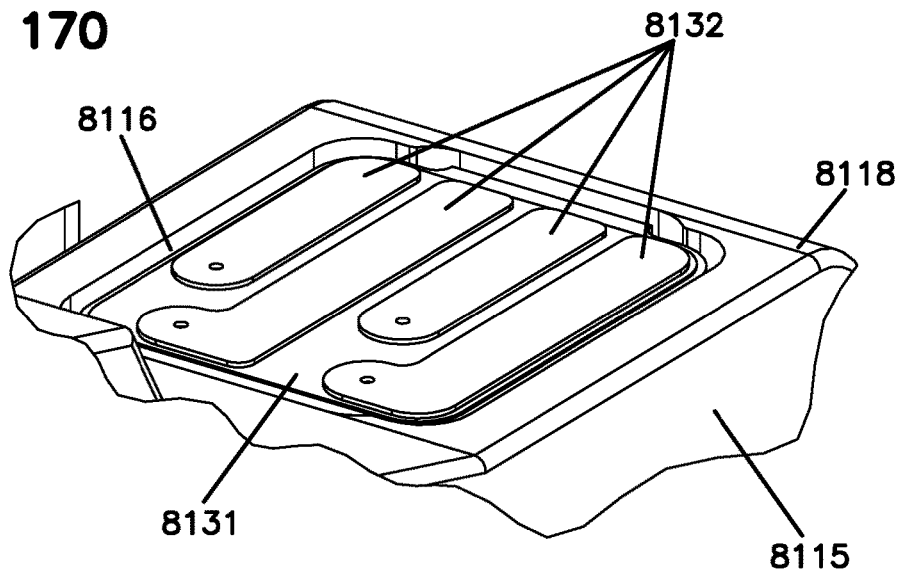

One example storage device 8130 includes a printed circuit board 8131 on which memory circuitry can be arranged (see FIG. 170). Electrical contacts 8132 also are arranged on the printed circuit board 8131 for interaction with a media reading interface of the communications coupler assembly 8200 (described in more detail herein). Any of the implementations of electrical contacts 8132 disclosed herein are suitable for use in the storage device 8130. In one example implementation, the storage device 8130 includes an EEPROM circuit 8133 (FIG. 181) arranged on the printed circuit board 8131. In the example shown in FIG. 169, an EEPROM circuit 8133 is arranged on the non-visible side of the circuit board 8131. In other implementations, however, the storage device 8130 can include any suitable type of non-volatile memory.

FIGS. 171-174 show one example implementation of a communications coupler assembly 8200 implemented as a fiber optic adapter. The example communications coupler assembly 8200 includes an adapter housing 8210 configured to align and interface two or more fiber optic connector arrangements 8100. In other example implementations, the adapter housing 8210 may be configured to communicatively couple together a fiber optic connector with a media converter (not shown) to convert the optical data signals into electrical data signals, wireless data signals, or other such data signals. In still other implementations, the communications coupler assembly 8200 can include an electrical termination block that is configured to receive punch-down wires, electrical plugs (e.g., for electrical jacks), or other types of electrical connectors.

Figure 171:
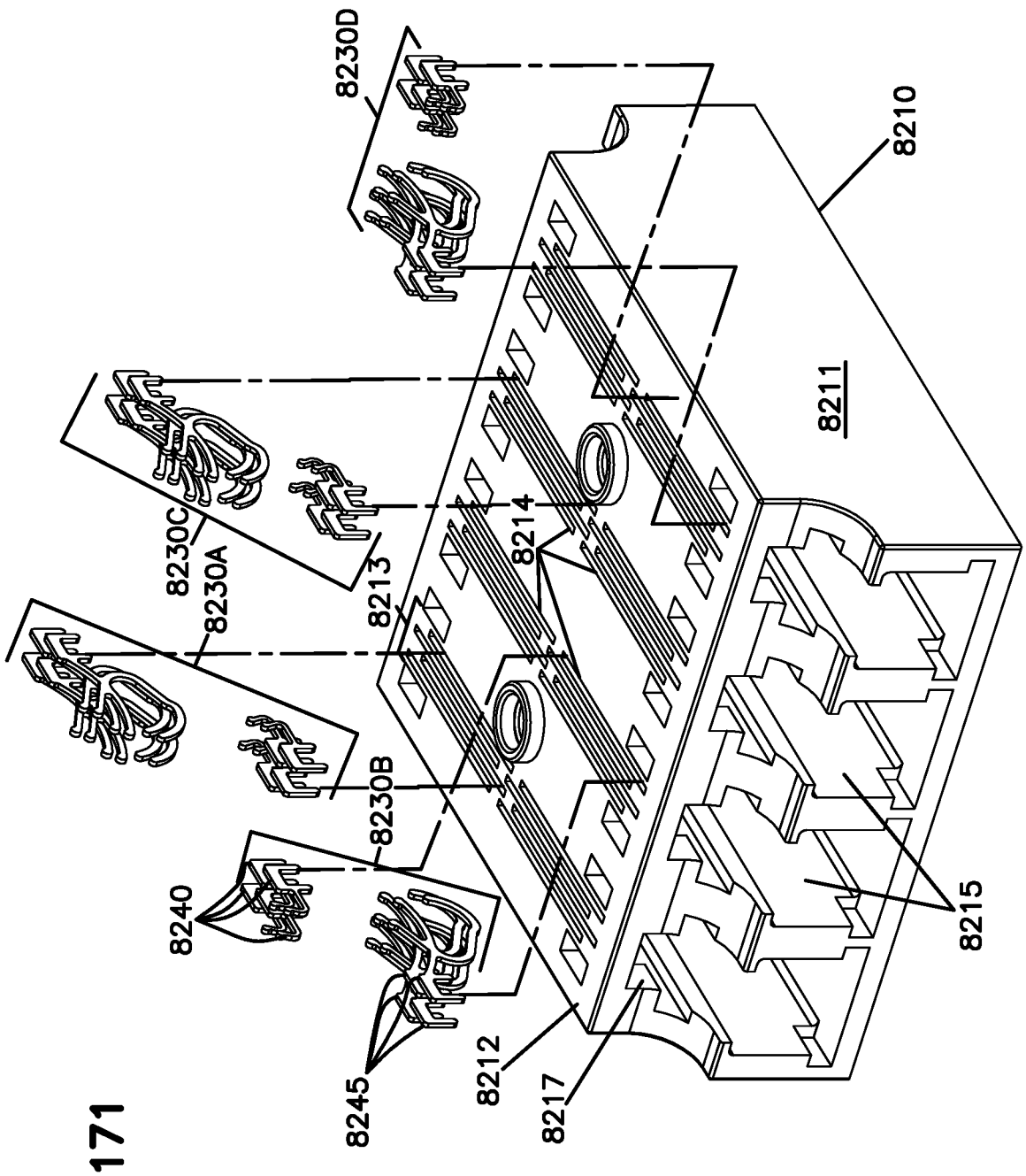

The example adapter housing 8210 is formed from opposing sides 8211 interconnected by first and second ends 8212 (FIG. 171). The sides 8211 and ends 8212 each extend between a front and a rear. The adapter housing 8210 defines one or more passages extending between the front and rear ends. Each end of each passage defines a port 8215 configured to receive a connector arrangement or portion thereof (e.g., one fiber optic connector of duplex connector arrangement 8100 of FIG. 169). In the example shown, the adapter housing 8210 defines four passages and eight ports 8215. In other implementations, however, the adapter housing 8210 may define one, two, three, six, eight, ten, twelve, sixteen, or even more passages.

In certain implementations, the adapter housing 8210 also defines latch engagement channel 8217 (FIG. 171) at each port 8215 to facilitate retention of the latch arms of the fiber optic connectors. Each latch engagement channel 8217 is sized and shaped to receive the key or keys 8115 of the connector arrangement 8100. Sleeves (e.g., split sleeves) 8206 are positioned within the passages to receive and align the ferrules 8112 of fiber optic connectors (see FIG. 172).

As shown in FIGS. 169 and 175, a printed circuit board 8220 is configured to be secured (e.g., via fasteners 8222) to the adapter housing 8210. In some implementations, the example adapter housing 8210 includes two annular walls in which the fasteners 8222 can be inserted to hold the printed circuit board 8220 to the adapter housing 8210. Non-limiting examples of suitable fasteners 8222 include screws, snaps, and rivets. For ease in understanding, only a portion of the printed circuit board 8220 is shown in FIGS. 169 and 175. It is to be understood that the printed circuit board 8220 electrically connects to a data processor and/or to a network interface (e.g., the processor 217 and network interface 216 of FIG. 2). It is further to be understood that multiple communications coupler housings 8210 can be connected to the printed circuit board 8220 within a connector assembly (e.g., a communications panel).

The fiber optic adapter 8210 includes one or more media reading interfaces 8230, each configured to connect the printed circuit board 8220 to the storage devices 8130 of the fiber optic connector arrangements 8100 plugged into the fiber optic adapter 8210. Each media reading interface 8230 includes one or more contact pairs 8231 that extend between the slotted surface 8212 of the adapter housing 8210 and the passages extending through the adapter 8210. Portions of each contact pair 8231 engage contacts and tracings on the printed circuit board 8220 mounted to the slotted surface 8212. Other portions of the contact pairs 8231 engage the electrical contacts 8132 of the storage members 8130 attached to any connector arrangements 8100 positioned in the passages (see FIGS. 180-181). A processor coupled to the circuit board 8220 can access the memory 8133 of each connector arrangement 8100 through a corresponding media reading interface 8230.

In accordance with some aspects, the media reading interfaces 8230 also are configured to detect when a connector arrangement 8100 is inserted into one of the adapter ports 8215. The media reading interfaces 8230 can function as presence detection sensors or trigger switches. In some implementations, the media reading interface 8230 is configured to form a complete circuit between the circuit board 8220 and the connector storage devices 8130 only when a respective connector arrangement 8110 is received at the adapter 8210. For example, at least a portion of each media reading interface 8230 may be configured to contact the circuit board 8220 only after being pushed toward the circuit board 8220 by a portion of a connector arrangement 8100. In other example implementations, portions of the media reading interface 8230 can be configured to complete a circuit until pushed away from the circuit board 8220 or a shorting rod by a connector arrangement 8100. In accordance with other aspects, however, some implementations of the media reading interface 8230 may be configured to form a complete circuit with the circuit board 8220 regardless of whether a connector arrangement 8100 is received at the adapter 8210.

Figure 172:
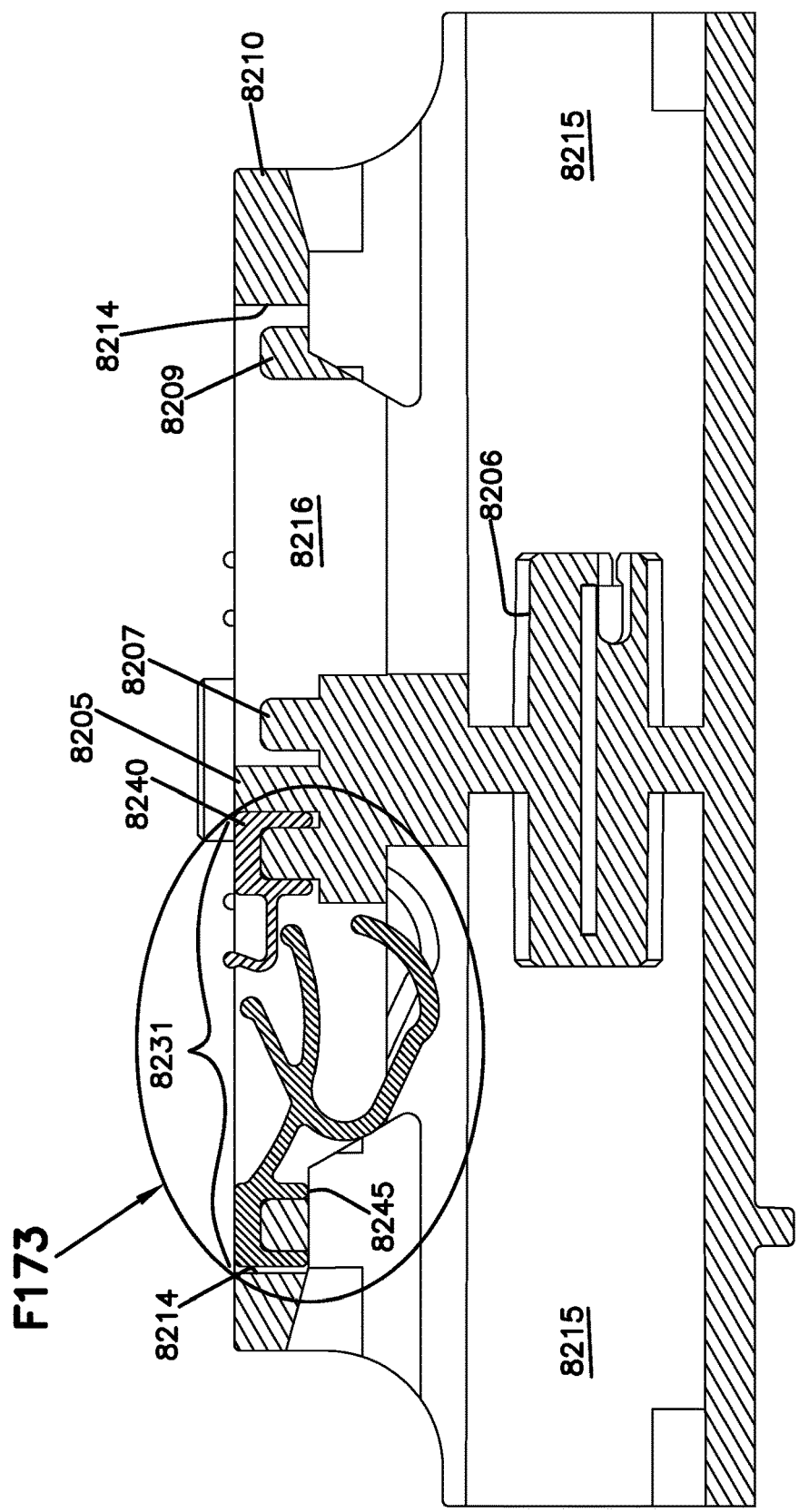
Figure 173:
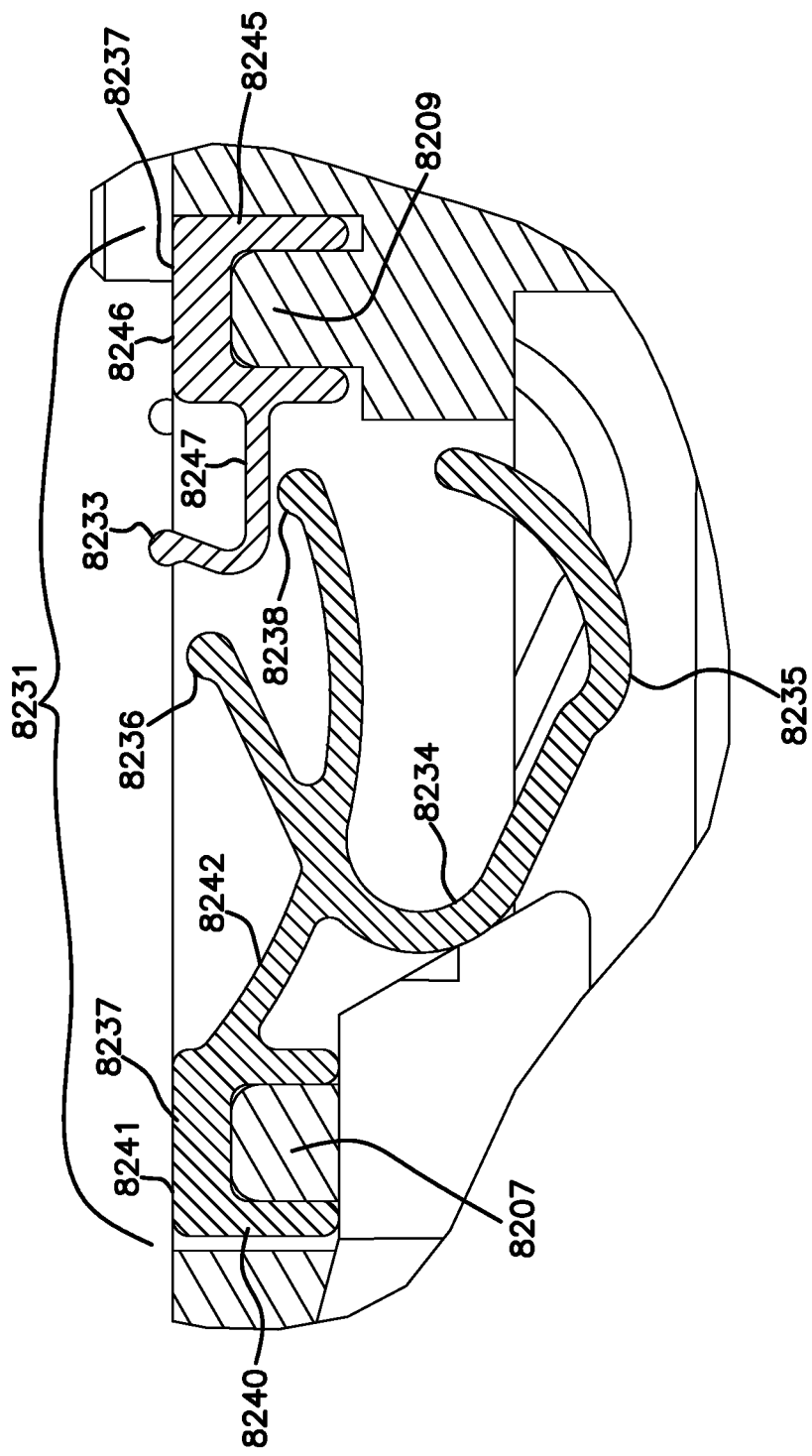

In general, each media reading interface 8230 is formed from one or more contact pairs 8231 (see FIG. 171-173). In certain implementations, the media reading interface 8230 includes at least a first contact pair 8231 that transfers power, at least a second contact pair 8231 that transfers data, and at least a third contact pair 8231 that provides grounding. In one implementation, the media reading interface 8230 includes a fourth contact pair. In other implementations, however, the media reading interface 8230 include greater or fewer contact pairs 8231.

Each contact pair 8231 includes a first contact member 8240 and a second contact member 8245 that is configured to selectively contact the first contact member 8240. Each contact member 8240, 8245 includes a body defining a circumferential edge 8243, 8248, respectively, extending between planar major sides 8244, 8249, respectively (see FIG. 181). In certain implementations, the circumferential edges 8243, 8248 define contact surfaces of two or more contact sections as will be described herein.

In some implementations, the edges 8243, 8248 of the contact members 8240, 8245 have substantially continuous thicknesses. In various implementations, the thickness of each edge 8243, 8248 ranges from about 0.05 inches to about 0.005 inches. In certain implementations, the thickness is less than about 0.02 inches. In some implementation, the thickness is less than about 0.012 inches. In another implementation, the thickness is about 0.01 inches. In another implementation, the thickness is about 0.009 inches. In another implementation, the thickness is about 0.008 inches. In another implementation, the thickness is about 0.007 inches. In another implementation, the thickness is about 0.006 inches. In other implementations, the thickness may vary across the bodies of the contact members 8240, 8245.

In certain implementations, a top surface of the coupler housing 8210 defines slots 8214 configured to receive the one or more contact pairs 8231. At least a portion of each slot 8214 extends through the top surface of the adapter 8210 to one of the passages. When a connector 8110 with a storage device 8130 is inserted into one of the ports 8215 of the coupler housing 8210, the contact pads 8132 of the storage device 8130 are configured to align with the slots 8214 defined in the adapter housing 8210. Accordingly, the contact members 8240, 8245 held within the slots 8214 align with the contact pads 8132 to connect the contact pads 8132 to contact pads on the printed circuit board 8220 mounted to the adapter 8210.

In some implementations, each contact pair 8231 is retained within a separate slot 8214. For example, in the implementation shown in FIGS. 171-181, each media reading interface 8230 includes four contact pairs 8231 that are held in a set 8213 (FIG. 171) of four slots 8214 that align with four contact pads 8132 on a connector storage device

8130. The slots 8214 in each set 8213 are separated by intermediate walls 8216 (FIG. 172). In other implementations, all of the contact pairs 8231 in a single media reading interface 8230 may be retained in a single slot 8214 (e.g., see FIGS. 218-275 and the associated text).

In general, the width of each set 8213 of slots 8214 is smaller than the width of the key 8115 of a connector 8110 positioned in the respective adapter port 8215. In some implementations, the width of each set 8213 of slots 8214 is less than 3.35 mm (0.13 inches). Indeed, in some implementations, the width of each set 8213 of slots 8214 is less than about 3.1 mm (0.12 inches). In certain implementations, the width of each set 8213 of slots 8214 is no more than about 2.5 mm (0.10 inches). In one example implementation, the width of each set 8213 of slots 8214 is no more than 2.2 mm (0.09 inches).

In certain implementations, the width of the intermediate walls 8216 is smaller than the width of the slots 8214. In some implementations, the width of each slot 8214 is within the range of about 0.25 mm (0.010 inches) to about 0.64 mm (0.025 inches). Indeed, in some implementations, the width of each slot 8214 is within the range of about 0.38 mm (0.015 inches) to about 0.48 mm (0.019 inches). In one implementation, the width of each slot 8214 is about 0.43-0.44 mm (0.017 inches). In one implementation, the width of each slot 8214 is about 0.41-0.42 mm (0.016 inches). In one implementation, the width of each slot 8214 is about 0.45-0.46 mm (0.018 inches). In some implementations, the width of each intermediate wall 8216 is within the range of about 0.13 mm (0.005) inches to about 0.18 mm (0.007 inches). In one implementation, the width of each intermediate wall 8216 is about 0.15 mm (0.006 inches).

The adapter housing 8210 defines a sufficient number of slots 8214 to accommodate the contact members 8231 of the media reading interfaces 8230 installed at the adapter 8210. In some implementations, the adapter 8210 includes at least one set 8213 of forward slots 8214 and at least one set 8213 of rearward slots 8214. In the example shown in FIG. 171, the slots 8214 defined at front ports 8215 of the adapter passages axially align with slots 8214 defined at the rear ports 8215. In other implementations, however, the slots 8214 at the front ports 8215 may be staggered from the slots 8214 at the rear ports 8215.

In some implementations, the adapter 8210 can include a media reading interface 8230 associated with each passage. For example, the quadruplex adapter 8210 shown in FIG. 171 includes a first media reading interface 8230A at the rear port 8215 of a first passage and a second media reading interface 8230B at the front port 8215 of a second passage to interface with two duplex fiber optic connector arrangements 8100 received thereat. The quadruplex adapter 8210 also includes a third media reading interface 8230C at the rear port 8215 of a third passage and a fourth media reading interface 8230D at the front port 8215 of a fourth passage to interface with another two duplex fiber optic connector arrangements 8100 received thereat.

In another implementation, the adapter 8210 can include a media reading interface 8230 associated with each port 8215. In still other implementations, a different number of media reading interfaces 8230 may be provided at the front and rear of the adapter 8210. For example, one side of the adapter housing 8210 can include two media reading interfaces 8230 to interface with two duplex fiber optic connector arrangements 8100 and another side of the adapter housing 8210 can include four media reading interfaces 8230 to interface with four separate fiber optic connectors. In other implementations, the adapter housing 8210 can include any desired combination of front and rear media reading interfaces 8230.

In some implementations, the adapter housing 8210 has more sets 8213 of slots 8214 than media reading interfaces 8230. In other implementations, however, the adapter housing 8210 may have the same number of slot sets 8213 and media reading interfaces 8230. In certain implementations, each adapter housing 8210 defines a set 8213 of slots 8214 at each port 8215 of each passage. In other implementations, each adapter housing 8210 may define a set 8213 of slots 8214 at only one port 8215 of each passage. In other implementations, the adapter housing 8210 may define a set 8213 of slots 8214 at each port 8215 of alternate passages.

Figure 174:
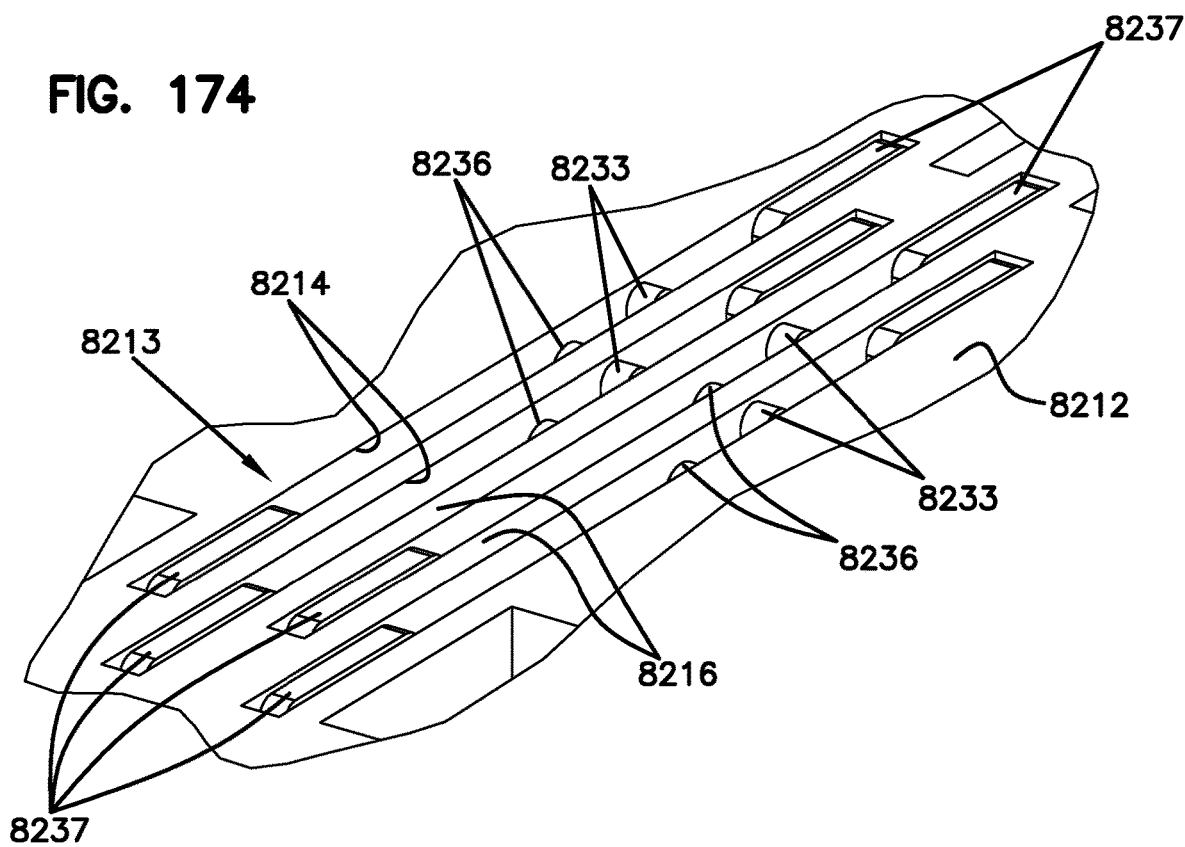

In some implementations, the contact pairs 8231 of a single media reading interface 8230 are positioned in a staggered configuration with at least one of the contact pairs 8231 being axially forward or rearward of at least another of the contact pairs 8231 (see FIG. 174). In some implementations, the slots 8214 accommodating the staggered contact members 8231 also are staggered. For example, as shown in FIG. 171, alternating slots 8214 can be staggered in a front to rear direction. In other implementations, however, the slots 8214 accommodating the staggered contacts 8231 may each have a common length that is longer than a length of the staggered arrangement of contact members 8231. In still other implementations, the front and rear ends of the contact members 8231 of a single media reading interface 8230 are transversely aligned within similarly transversely aligned slots 8214.

As shown in FIG. 172, at least one support wall 8205 separates the forward slots 8214 from the rearward slots 8214. Each support wall 8205 extends from the slotted top surface 8212 of the adapter housing 8210 the passages. In some implementations, a single support wall 8205 extends along a center of the adapter housing 8210. In other implementations, one or more support walls 8205 may extend between slots 8214 arranged in a staggered configuration. In certain implementations, the support walls 8205 may connect to or be continuous with the intermediate walls 8216. In some implementations, the support wall 8205 of the adapter housing 8210 defines a first mounting location 8207. In some implementations, a second mounting location 8209 extends partially into each slot 8214 opposite the support wall 8205.

One example type of contact pair 8231 is shown in FIGS. 172-173. Each contact pair 8231 includes a first contact member 8240 configured to be positioned at the first mounting location 8207 and a second contact member 8245 configured to be positioned at the second mounting location 8209. In some implementations, each contact member 8240, 8245 of the contact pair 8231 has a base portion 8241, 8246 that engages a lug at the respective mounting location 8207, 8209 of the support wall 8205 to secure the contact member 8240, 8245 within the slot 8214. In one implementation, the base portions 8241, 8246 are configured to snap-fit over the lugs at the mounting locations 8207, 8209. In other implementations, the base portions 8241, 8246 may otherwise mount to the support wall 8205. In the example shown, the base portions 8241, 8246 have generally U-shaped transverse cross-sections. In other implementations, the base portions 8241, 8246 have different configurations.

In the example shown in FIGS. 173-174, each contact pair 8231 includes at least four moveable (e.g., flexible) contact sections 8233, 8235, 8236, and 8238 defining contact surfaces. The flexibility of the contact sections provides tolerance for differences in spacing between the contact pair 8231 and the respective printed circuit board 8220 when the coupler assembly 8200 is manufactured. Certain types of contact pairs 8231 also include at least one stationary contact 8237 having a contact surface that contacts the circuit board 8220. In the example shown, a top of each base portion 8241, 8246 defines a stationary contact 8237.

In general, the first moveable contact section 8233 is configured to extend through the slot 8214 and engage the circuit board 8220. The ability of the first contact section 8233 to flex relative to the stationary contact 8237 provides tolerance for placement of the contact pairs 8231 relative to the circuit board 8220. In one implementation, the first contact section 8233 and/or the stationary contacts 8237 may provide grounding for the contact pair 8231 through the circuit board 8220.

The second moveable contact section 8235 is configured to extend into a respective one of the passages and to engage the connector arrangement 8100 (e.g., a key 8115 of the connector arrangement) positioned in the passage. If a storage device 8130 is installed on the connector arrangement 8100, then the second contact surface 8235 is configured to engage the contact pads 8132 of the storage device 8130.

Data may be transferred from the storage device 8130 to the circuit board 8220 when the contact members 8240, 8245 complete a circuit between the storage device 8130 and the circuit board 8220. The circuit is complete when the third moveable contact section 8236 extends through the slot 8214 and engages the circuit board 8220 and the fourth moveable contact section 8238 completes a circuit between the contact members 8240, 8245.

The third contact section 8236 and the fourth contact section 8238 may be configured to move (e.g., lift) when a connector arrangement 8100 is received at a port 8215 corresponding with the respective media reading interface 8230. For example, the third contact section 8236 may be configured to move upwardly when the front surface 8118 of the key 8115 of a connector arrangement 8100 pushes against the second contact section 8235 when the connector arrangement 8100 is inserted into a port 8215. For example, in some implementations, the third contact section 8236 is configured to swipe the contact surface of the third contact section 8236 against the printed circuit board 8220 when lifted (see FIGS. 178-179).

Insertion of the connector arrangement 8100 also may create a connection between the contact members 8240, 8245 of the contact pair 8231. For example, deflection of the second contact surface 8235 may cause movement of one of the contact members 8240, 8245 towards the other of the contact members 8240, 8245. In one implementation, one of the contact members 8240, 8245 defines the fourth contact section 8238 that moves towards the other contact member 8240, 8245 when the connector arrangement 8100 is received at the adapter 8210.

The example contact pair 8231 also may include a resilient section 8234 that is configured to transfer the force applied to the second contact section 8235 to the third contact section 8236 and/or the fourth contact section 8238. In certain implementations, the resilient section 8234 is configured to amplify the force applied to the second contact section 8235. In some implementations, the resilient section 8234 defines at least a partial arc. For example, in the implementation shown in FIG. 173, the resilient section 8234 defines a partial circle. In other implementations, the resilient section 8234 may define a series of curves, folds, and/or bends.

In some implementations, the first contact member 8240 defines the second contact section 8235, the third contact section 8236, and the fourth contact section 8238. The second contact member 8245 defines the first contact section 8233. In other implementations, the second contact member 8245 may define the second, third, or fourth contact sections 8235, 8236, 8238. In still other implementations, both contact members 8240, 8245 may define part of the fourth contact section 8238.

In the example shown, the first contact member 8240 includes an arm 8242 extending from the base portion 8241. A first leg extends partially upwardly from the arm 8242 to define the third contact section 8236. A second leg extends generally sideways from the arm 8242 to define the fourth contact section 8238. A third leg extends partially downwardly from the arm 8242 to define the resilient section 8234 and the second contact section 8235. The second contact member 8245 includes an arm 8247 extending from the base portion 8246. The arm 8247 contours upwardly to define the first contact section 8233. The arm 8247 is sized and shaped to enable selective engagement with the fourth contact section 8238.

In some implementations, each contact member 8240, 8245 extends between a first end and a second end. For example, the base 8241 may define a first end of the first contact member 8240 and the fourth contact section 8238 may define a second end of the first contact member 8240. The base 8246 may define a first end of the second contact member 8245 and the first contact section 8233 may define the second end of the second contact member 8240. In some implementations, the contact pairs 8231 are arranged so that the bases 8241, 8246 of the contact members 8240, 8245 are arranged on opposite sides of the contact pair 8231.

The contact pairs 8231 also extend between a top and a bottom. For example, the first and third contact sections 8233, 8236 may extend towards the top of the contact pair 8231 and the second contact section 8235 may extend towards the bottom of the contact member 8231. As used herein, the terms "top" and "bottom" are not meant to imply a proper orientation of the contact pair 8231 or that the top of the contact pair 8231 must be located above the bottom of the contact pair 8231. Rather, the terms are used for ease in understanding and are assigned relative to the viewing plane of FIG. 173.

Portions of the planar surfaces 8243, 8248 of the contact members 8240, 8245 may increase and/or decrease in width. For example, in the example shown in FIG. 173, the tops of the base portions 8241, 8246 are wider than the arms 8242, 8247 of each contact member 8240, 8245. In certain implementations, one or more of the contact surfaces of the contact sections 8233, 8235, 8236, 8238 may be rounded or otherwise contoured. For example, the first, third, and fourth contact sections 8233, 8236, 8238, respectively, may define bulbous tips and the second contact section 8235 may define an arc (see FIG. 173).

In one implementation, each contact member 8240, 8245 is formed monolithically (e.g., from a continuous sheet of metal or other material). For example, in some implementations, each contact member 8240, 8245 may be manufactured by cutting a planar sheet of metal or other material. In other implementations, each contact member 8240, 8245 may be manufactured by etching a planar sheet of metal or other material. In other implementations, each contact member 8240, 8245 may be manufactured by laser trimming a planar sheet of metal or other material. In still other implementations, each contact member 8240, 8245 may be manufactured by stamping a planar sheet of metal or other material.

Figure 176:
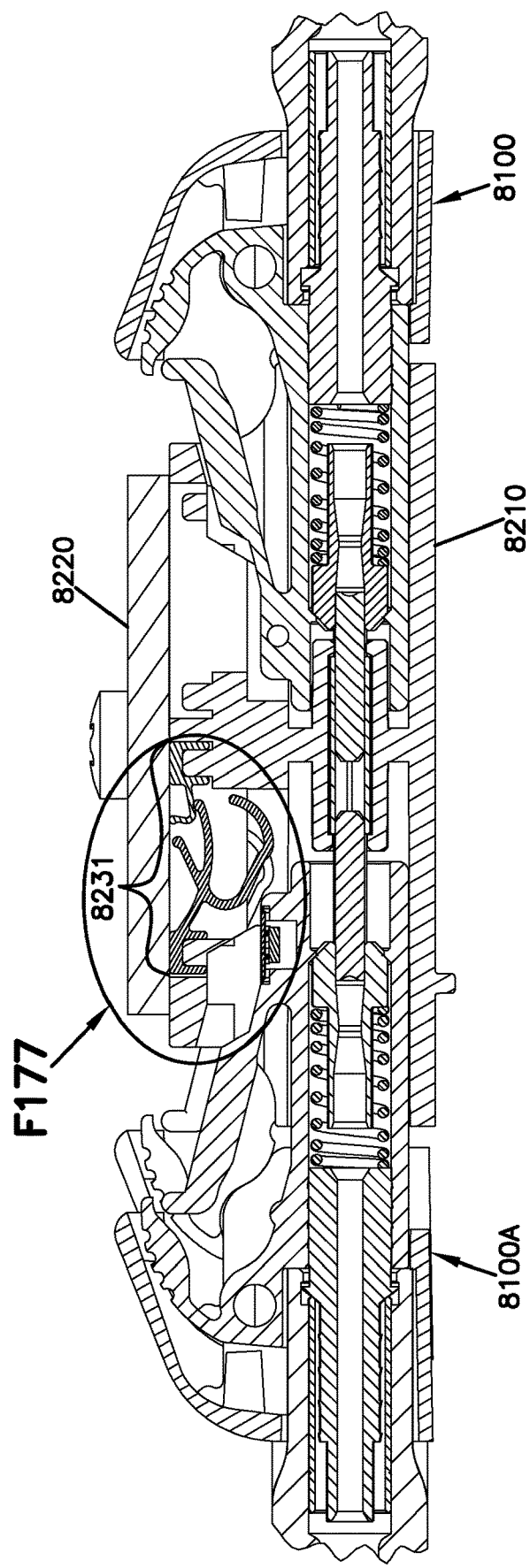
Figure 177:
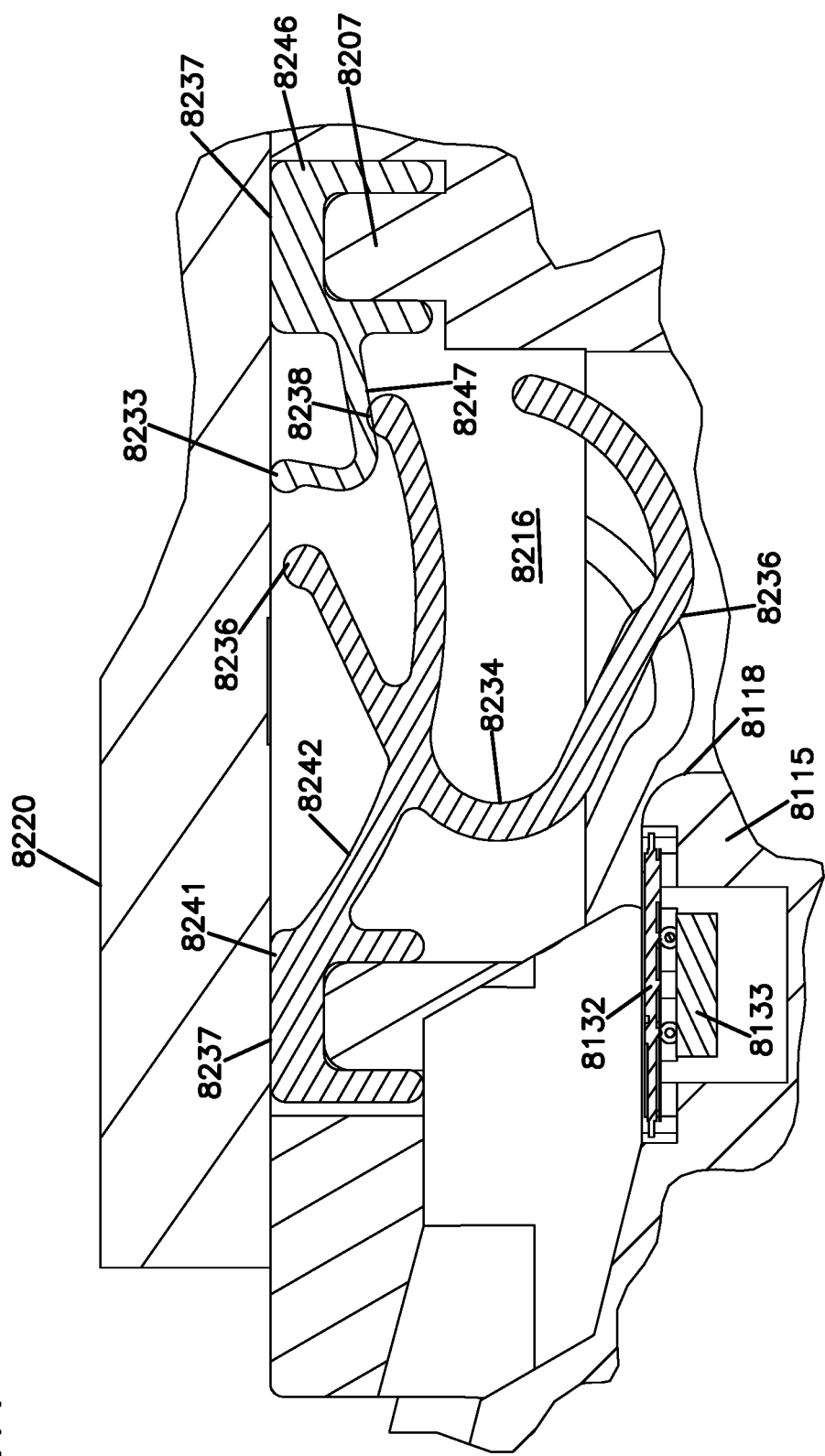
Figure 178:
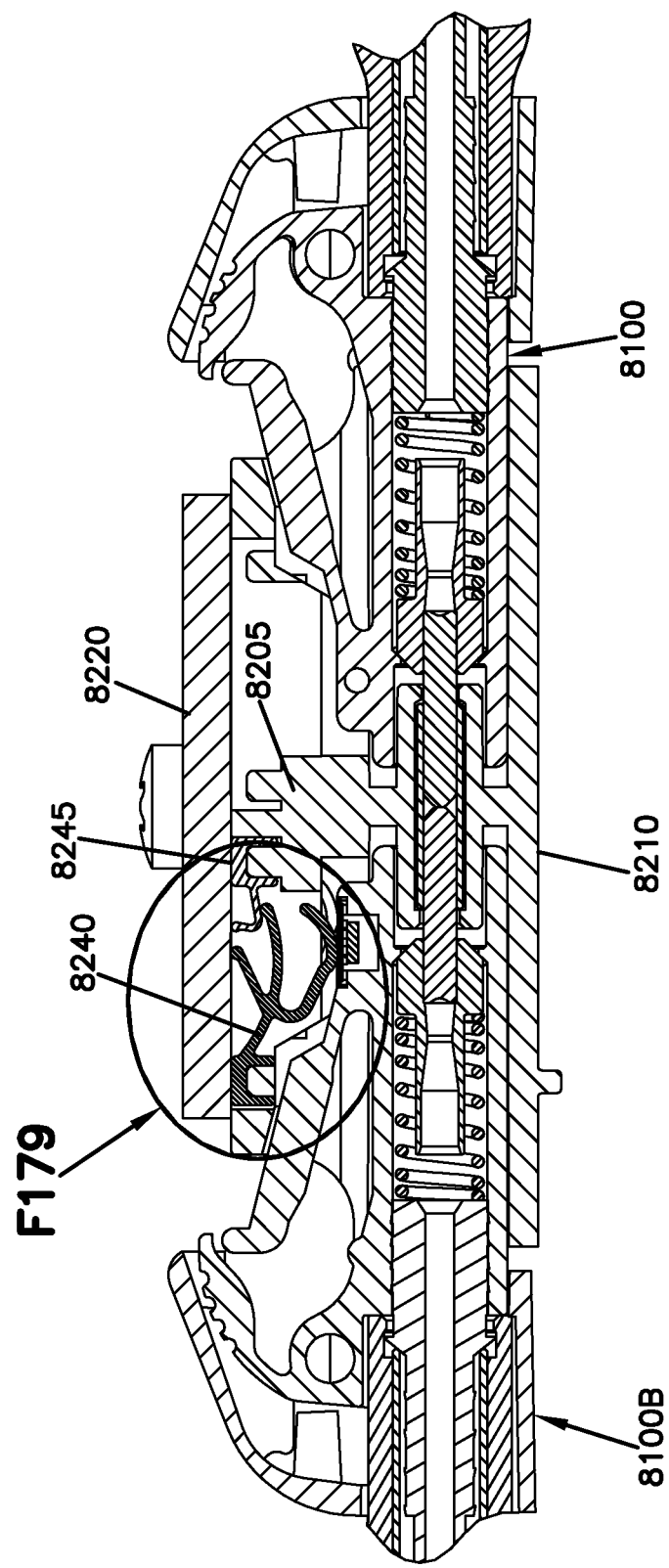
Figure 179:
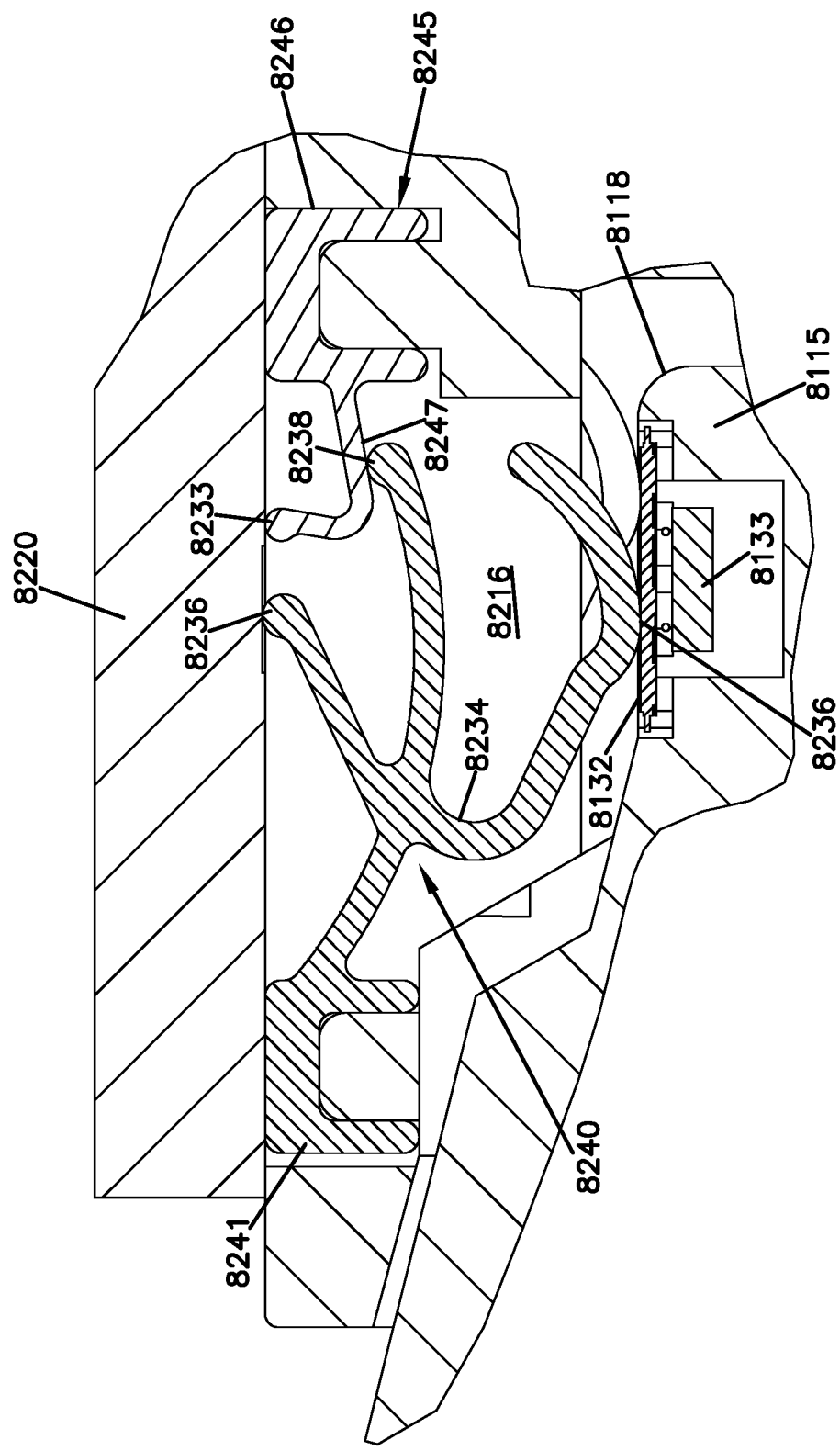
Figure 180:
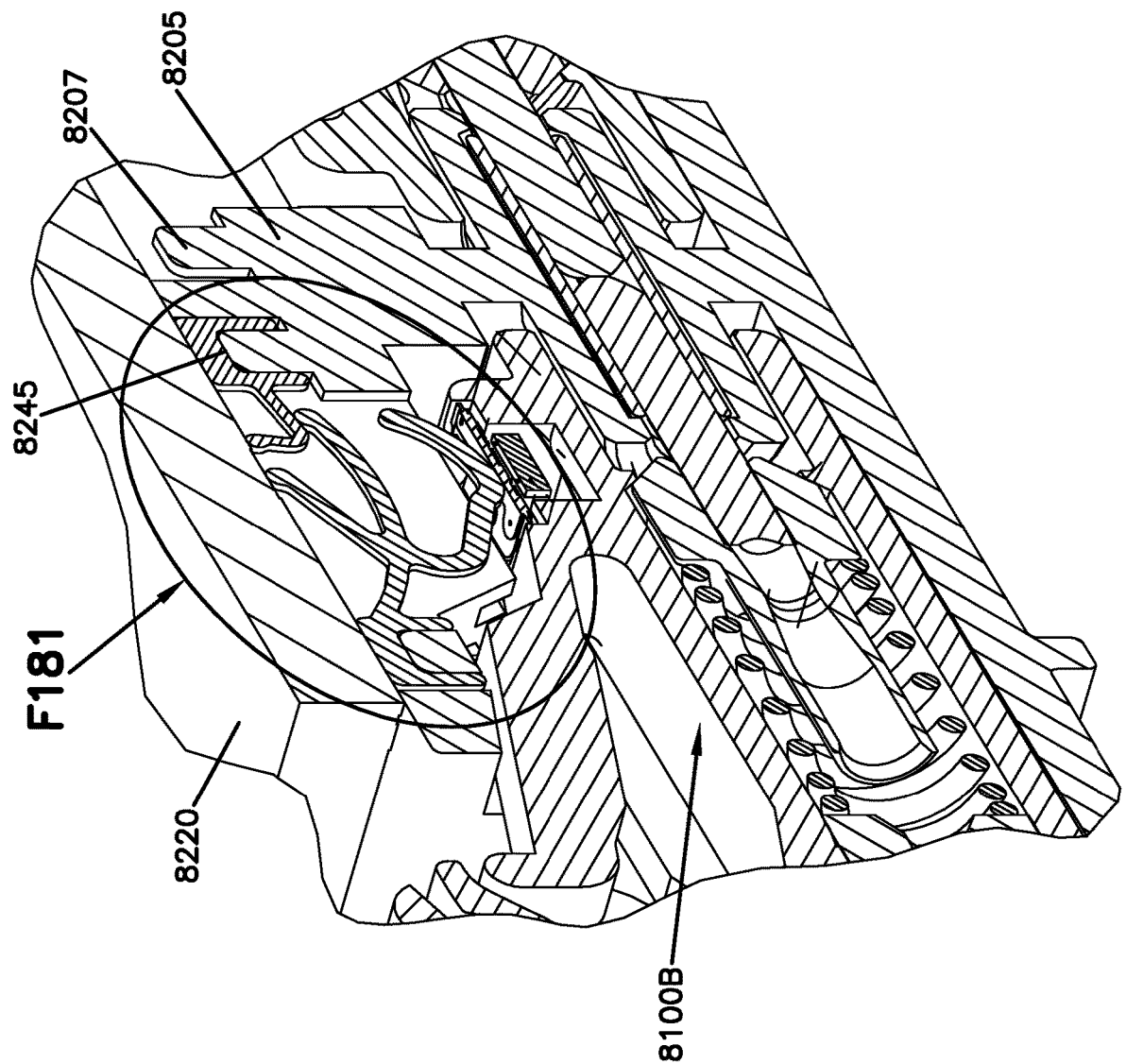
Figure 181:
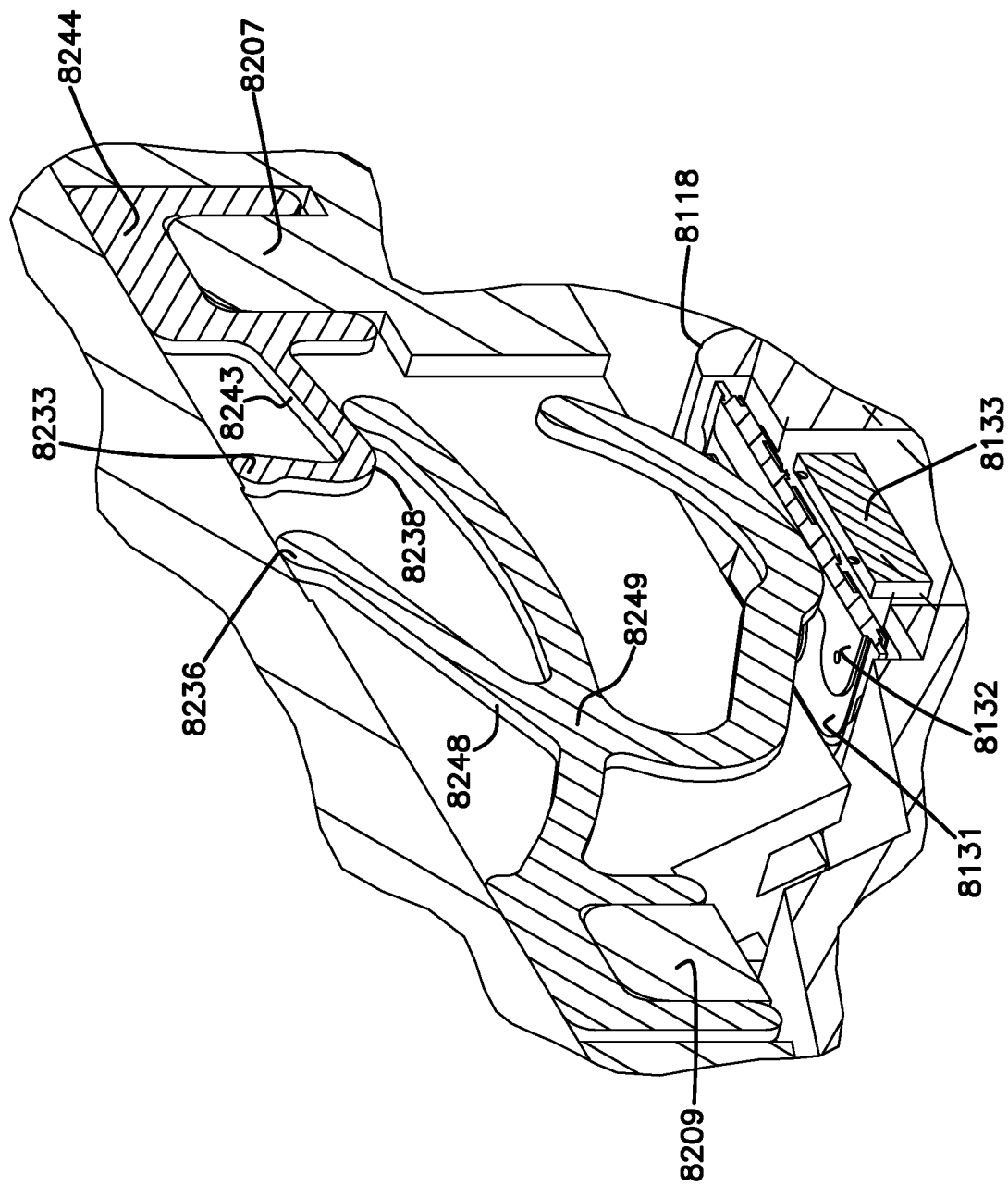

FIG. 175 is a top plan view of an adapter assembly 8200 having two connector arrangements 8100 received at the right side of an adapter 8210, a connector arrangement 8100A partially received at the left side of the adapter 8210, and another connector arrangement 8100B fully received at the left side of the adapter 8210. FIGS. 176 and 178 are cross-sectional views showing the partially received connector arrangement 8100A and the fully received connector arrangement 8100B, respectively. FIGS. 177 and 179 are enlarged views of portions of FIGS. 176 and 178, respectively.

As shown in FIGS. 176-177, the first contact section 8233 engages the circuit board 8220 and the third contact section 8236 is located spaced from the circuit board 8220 when a connector arrangement 8100 is not positioned within a respective port 8215. In some implementations, the fourth contact section 8238 engages the second contact member 8245 when a connector arrangement 8100 is not positioned within a respective port 8215 (see FIG. 177). In other implementations, however, the fourth contact section 8238 does not engage the second contact member 8245 when a connector arrangement 8100 is not positioned within a respective port 8215 (see FIG. 173). The second contact section 8235 is positioned below the intermediate wall 8216.

As shown in FIGS. 178-179, inserting a connector arrangement 8100 into the port 8215 biases the third contact section 8236 upwardly toward the circuit board 8220. In certain implementations, biasing the third contact section 8236 upwardly causes the contact surface of the third contact section 8236 to engage (e.g., touch or slide against) the circuit board 8220. In some implementations, inserting the connector arrangement 8100 also may bias the fourth contact section 8238 into engagement with the arm 8247 of the second contact member 8245. In other implementations, inserting the connector arrangement 8100 may increase the force of engagement between the fourth contact section 8238 and the arm 8247.

FIGS. 182-199 illustrate another example implementation of a connector system 8300 that can be utilized on a connector assembly (e.g., a communications panel) having PLI functionality as well as PLM functionality. The connector system 8300 includes at least one example communications coupler assembly 8500 and at least two connector arrangements 8400. In the example shown, the communications coupler assembly 8500 is configured to receive four connector arrangements 8400. In other implementations, the communications coupler assembly 8500 may be configured to receive any desired number of connector arrangements 8400.

The communications coupler assembly 8500 is configured to be mounted to a connector assembly, such as a communications blade or a communications panel. One or more connector arrangements 8400, which terminate segments of communications media, are configured to communicatively couple to other segments of physical communications media at the coupler assembly 8500 (e.g., see FIG. 192). Accordingly, communications data signals carried by a media segment terminated by a first connector arrangement 8400 can be propagated to another media segment terminated by a second connector arrangement 8400 through the communications coupler assembly 8500.

In some implementations, each connector arrangement 8400 defines a duplex fiber optic connector arrangement including two connectors, each of which terminates an optical fiber. In the example shown, the connector arrangements 8400 are the same as connector arrangements 4100 of FIGS. 103-111. In other implementations, however, the connector arrangements 8400 may include an SC-type connector arrangement, an ST-type connector arrangement, an FC-type connector arrangement, an MPO-type connector arrangement, an LX.5-type connector arrangement, or any other type of connector arrangement.

In accordance with some aspects, each communications coupler assembly 8500 is configured to form a single link between segments of physical communications media. For example, each communications coupler assembly 8500 can define a single passage at which a first connector arrangement is coupled to a second connector arrangement. In accordance with other aspects, however, each communications coupler assembly 8500 is configured to form two or more links between segments of physical communications media. For example, in the example shown in FIG. 184, the communications coupler assembly 8500 defines four passages.

In some implementations, each passage of the communications coupler assembly 8500 is configured to form a single link between first and second connector arrangements 8400. In particular, each passage has a forward port 8515 at which a first connector 8410 is received and a rearward port 8515 at which a second connector 8410 is received. A sleeve 8506 is positioned within the passage between the forward and rearward ports 8515 to align the ferrules 8412 of the connectors 8410. In other example implementations, two or more passages can form a single link between connector arrangements 8400 (e.g., two ports 8515 can form a link between duplex connector arrangements). In still other example implementations, each communications coupler assembly 8500 can form a one-to-many link. For example, the communications coupler assembly 8500 can connect a duplex connector arrangement 8400 to two monoplex (i.e., simplex) connectors 8410.

Figure 182:
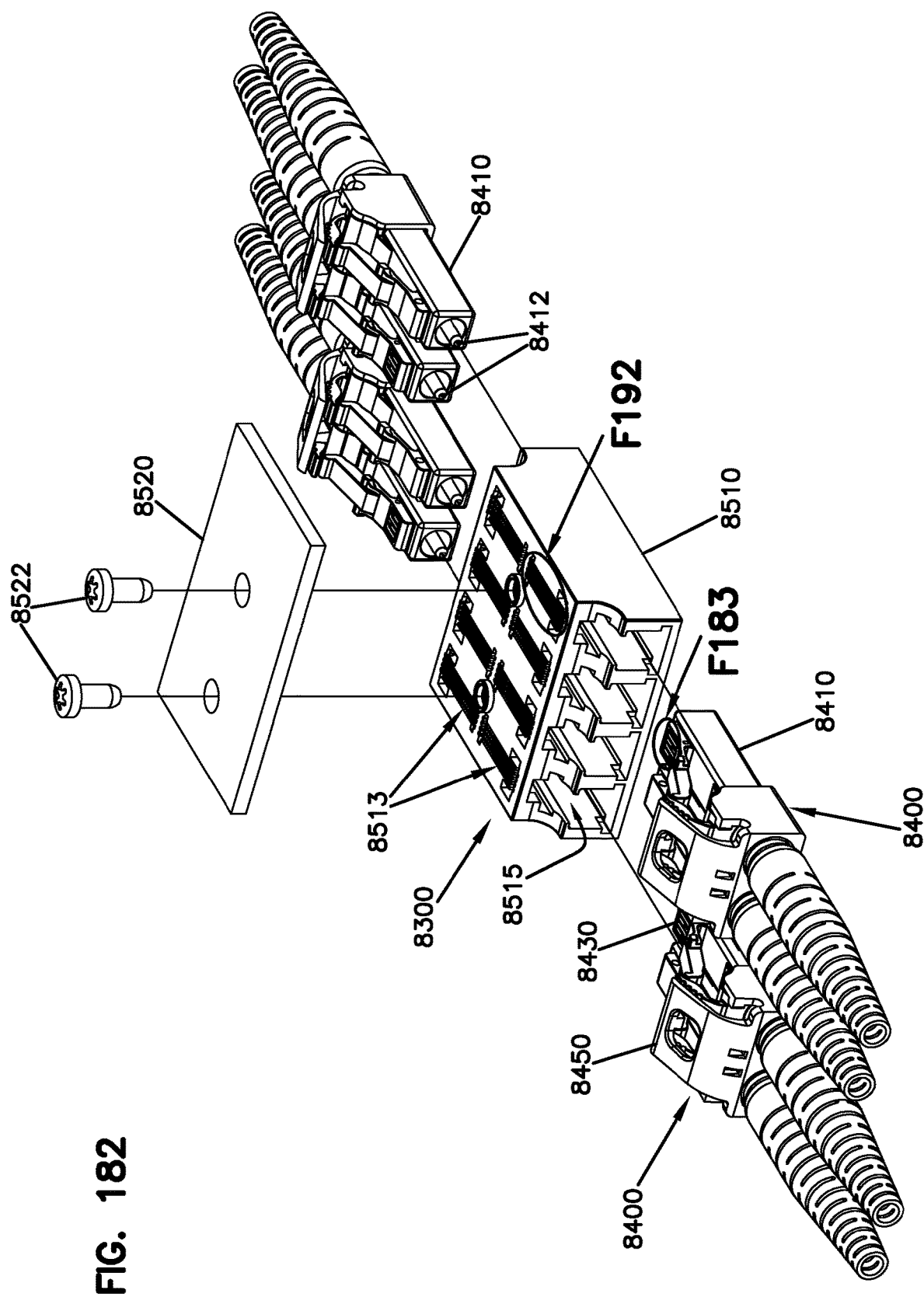
FIGS. 182-199 illustrate a tenth example implementation of a connector system that can be utilized on a connector assembly having PLI functionality as well as PLM functionality in accordance with aspects of the present disclosure.
Figure 183:
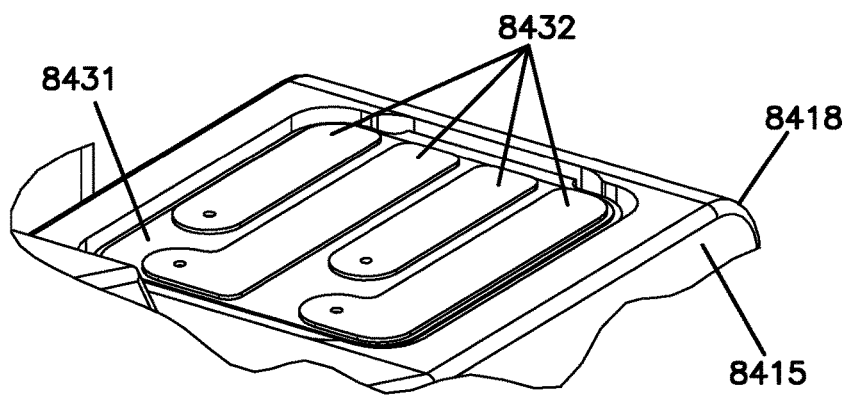
Figure 192:
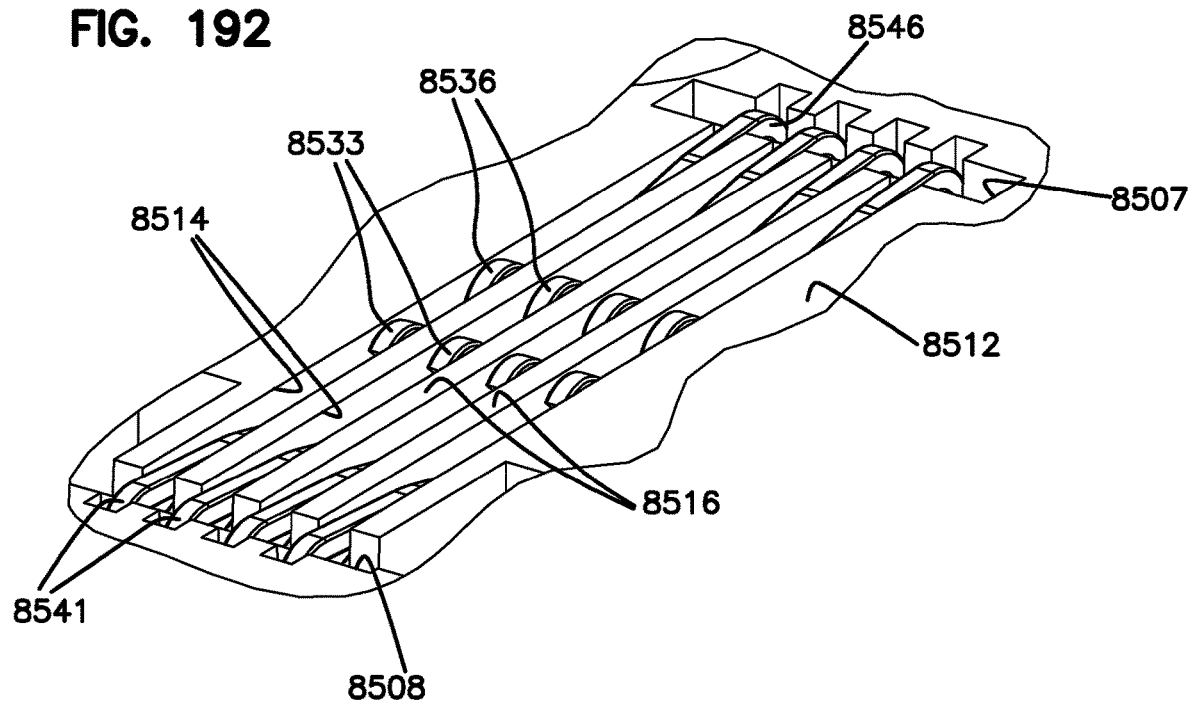

One example implementation of a connector arrangement 8400 is shown in FIG. 182. Each connector arrangements 8400 includes one or more fiber optic connectors 8410, each of which terminates one or more optical fibers. In the example shown, each connector arrangement 8400 defines a duplex fiber optic connector arrangement including two fiber optic connectors 8410 held together using a clip 8450. In another example implementation, a connector arrangement 8400 can define a single fiber optic connector 8410. As shown, each fiber optic connector 8410 includes a connector body protecting a ferrule 8412 that retains an optical fiber. The connector body is secured to a boot for providing bend protection to the optical fiber. In the example shown, the connector is an LC-type fiber optic connector. The connector body includes a fastening member (e.g., clip arm) that facilitates retaining the fiber optic connector within a port 8515 in the communications coupler assembly 8500.

Each connector arrangement 8400 is configured to store physical layer information. For example, a storage device 8430 may be installed on or in the body of one or more of the fiber optic connectors of each connector arrangement 8400. In the example shown, the storage device 8430 is installed on only one fiber optic connector 8410 of a duplex connector arrangement 8400. In other implementations, however, a storage device 8430 may be installed on each fiber optic connector 8410 of a connector arrangement 8400. In the example shown, the storage device 8430 is located within a key 8415 of each connector 8410. In other implementations, the storage device 8430 may be located at another position on or in the connector arrangement 8400.

Figure 195:
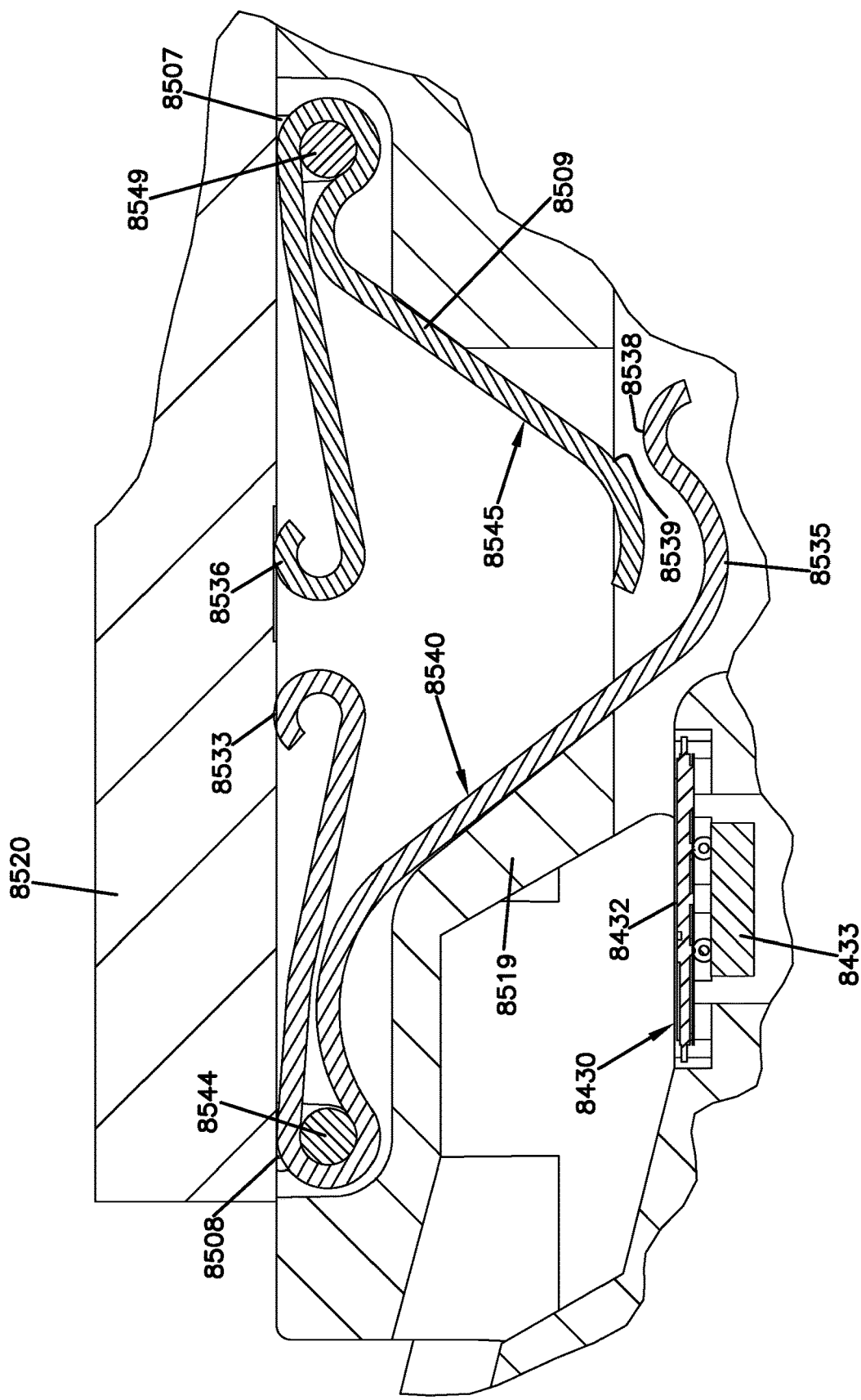

One example storage device 8430 includes a printed circuit board 8431 on which memory circuitry can be arranged (see FIG. 195). Electrical contacts 8432 (FIG. 183) also are arranged on the printed circuit board 8431 for interaction with a media reading interface of the communications coupler assembly 8500 (described in more detail herein). Any of the implementations of electrical contacts 8432 disclosed herein are suitable for use in the storage device 8430. In one example implementation, the storage device 8430 includes an EEPROM circuit 8433 (FIG. 195) arranged on the printed circuit board 8431. In the example shown in FIG. 182, an EEPROM circuit 8433 is arranged on the non-visible side of the circuit board 8431. In other implementations, however, the storage device 8430 can include any suitable type of non-volatile memory.

FIGS. 184-188 show one example implementation of a communications coupler assembly 8500 implemented as a fiber optic adapter. The example communications coupler assembly 8500 includes an adapter housing 8510 configured to align and interface two or more fiber optic connector arrangements 8400. In other example implementations, the adapter housing 8510 may be configured to communicatively couple together a fiber optic connector with a media converter (not shown) to convert the optical data signals into electrical data signals, wireless data signals, or other such data signals. In still other implementations, the communications coupler assembly 8500 can include an electrical termination block that is configured to receive punch-down wires, electrical plugs (e.g., for electrical jacks), or other types of electrical connectors.

Figure 184:
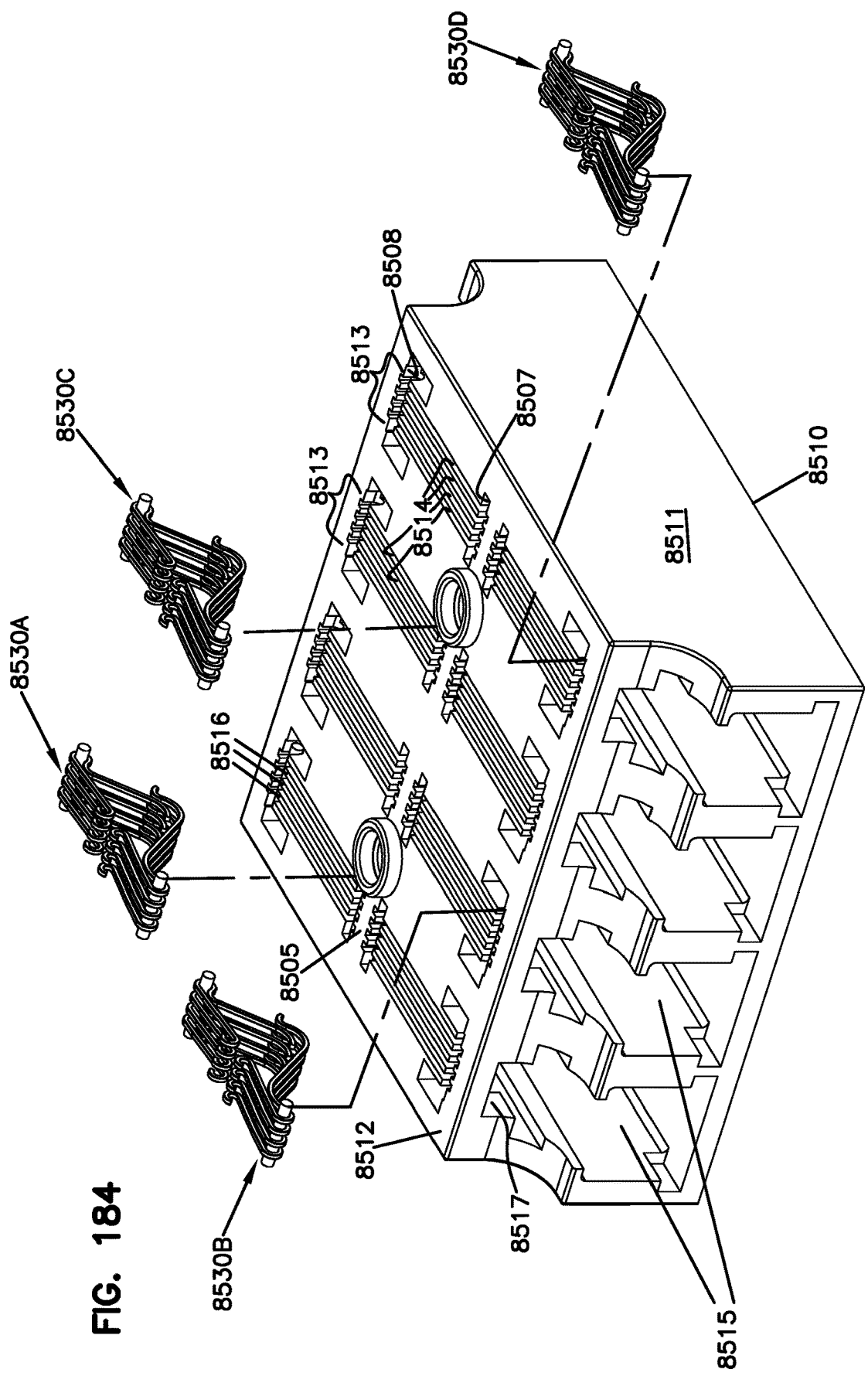

The example adapter housing 8510 is formed from opposing sides 8511 interconnected by first and second ends 8512 (FIG. 184). The sides 8511 and ends 8512 each extend between a front and a rear. The adapter housing 8510 defines one or more passages extending between the front and rear ends. Each end of each passage defines a port 8515 configured to receive a connector arrangement or portion thereof (e.g., one fiber optic connector of duplex connector arrangement 8400 of FIG. 182). In the example shown, the adapter housing 8510 defines four passages and eight ports 8515. In other implementations, however, the adapter housing 8510 may define one, two, three, six, eight, ten, twelve, sixteen, or even more passages.

In certain implementations, the adapter housing 8510 also defines latch engagement channel 8517 (FIG. 184) at each port 8515 to facilitate retention of the latch arms of the fiber optic connectors 8410. Each latch engagement channel 8517 is sized and shaped to receive the key or keys 8415 of the connector arrangement 8400. Sleeves (e.g., split sleeves) 8506 are positioned within the passages to receive and align the ferrules 8412 of fiber optic connectors (see FIG. 186).

Figure 189:
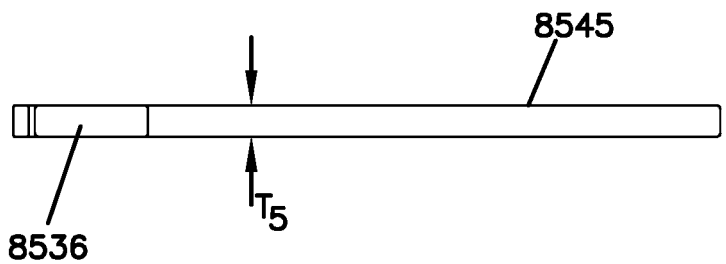

As shown in FIGS. 182 and 189, a printed circuit board 8520 is configured to be secured (e.g., via fasteners 8522) to the adapter housing 8510. In some implementations, the example adapter housing 8510 includes two annular walls in which the fasteners 8522 can be inserted to hold the printed circuit board 8520 to the adapter housing 8510. Non-limiting examples of suitable fasteners 8522 include screws, snaps, and rivets. For ease in understanding, only a portion of the printed circuit board 8520 is shown in FIGS. 182 and 189. It is to be understood that the printed circuit board 8520 electrically connects to a data processor and/or to a network interface (e.g., the processor 217 and network interface 216 of FIG. 2). It is further to be understood that multiple communications coupler housings 8510 can be connected to the printed circuit board 8520 within a connector assembly (e.g., a communications panel).

The fiber optic adapter 8510 includes one or more media reading interfaces 8530, each configured to connect the printed circuit board 8520 to the storage devices 8430 of the fiber optic connector arrangements 8400 plugged into the fiber optic adapter 8510. Each media reading interface 8530 includes one or more contact pairs 8531. Portions of each contact pair 8531 engage contacts and tracings on the printed circuit board 8520 mounted to the surface 8512. Other portions of the contact pairs 8531 engage the electrical contacts 8432 of the storage members 8430 attached to any connector arrangements 8400 positioned in the passages (see FIGS. 192-193). A processor coupled to the circuit board 8520 can access the memory 8433 of each connector arrangement 8400 through a corresponding media reading interface 8530.

In accordance with some aspects, the media reading interfaces 8530 also are configured to detect when a connector arrangement 8400 is inserted into one of the adapter ports 8515. The media reading interfaces 8530 can function as presence detection sensors or trigger switches. In some implementations, the media reading interface 8530 is configured to form a complete circuit between the circuit board 8520 and the connector storage devices 8430 only when a respective connector arrangement 8410 is received at the adapter 8510. For example, at least a portion of each media reading interface 8530 may be configured to form a complete circuit with the circuit board 8520 only after being deflected or moved by a portion of a connector arrangement 8400. In other example implementations, portions of the media reading interface 8530 can be configured to complete a circuit until pushed away from the circuit board 8520 or a shorting rod by a connector arrangement 8400. In accordance with other aspects, however, some implementations of the media reading interface 8530 may be configured to form a complete circuit with the circuit board 8520 regardless of whether a connector arrangement 8400 is received at the adapter 8510.

Referring to FIGS. 185-189, each media reading interface 8530 is formed from one or more contact pairs 8531. In certain implementations, the media reading interface 8530 includes at least a first contact pair 8531 that transfers power, at least a second contact pair 8531 that transfers data, and at least a third contact pair 8531 that provides grounding. In one implementation, the media reading interface 8530 includes a fourth contact pair 8531. In other implementations, however, the media reading interface 8530 include greater or fewer contact pairs 8531.

Each contact pair 8531 includes a first contact member 8540 and a second contact member 8545 that is aligned with the first contact member 8540. In some implementations, each contact member 8540, 8545 is formed from coil stock or other such material. For example, in some implementations, each contact member 8540, 8545 may be manufactured by bending coil stock springs. In certain implementations, each contact member 8540, 8545 is formed from round coil stock. In certain implementations, each contact member 8540, 8545 is formed from square coil stock. In other implementations, each contact member 8540, 8545 is formed from another type of coil stock (e.g., coil stock having an ovoid, rectangular, triangular, or other shaped transverse cross-section).

Figure 185:
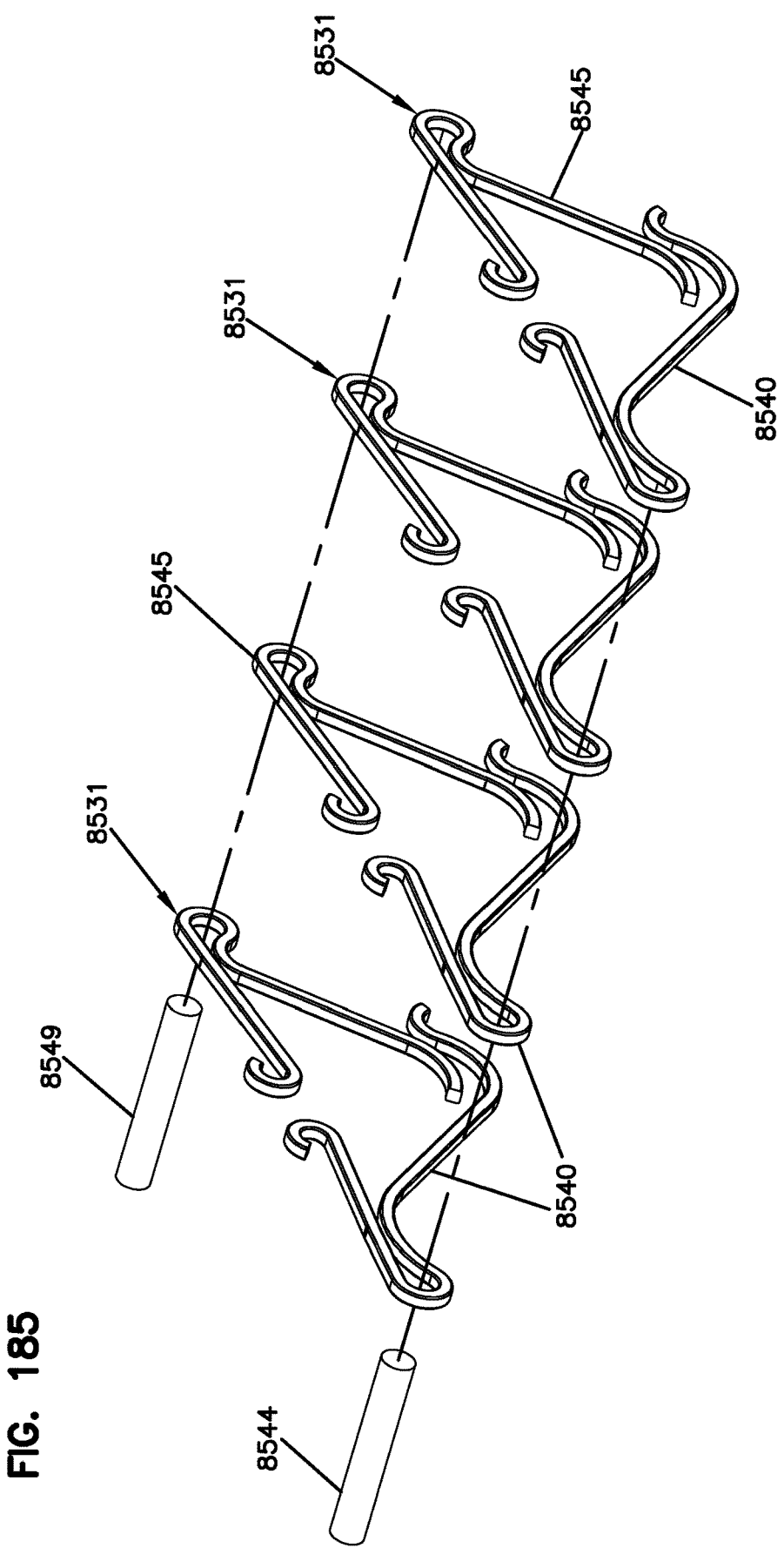

As shown in FIG. 185, one or more contact pairs 8531 are positioned onto rods 8244, 8549 to align the contact pairs 8531 in a media reading interface 8530. For example, the first contact members 8540 may be positioned on a first rod 8544 and the second contact members 8545 may be positioned on a second rod 8549. In certain implementations, the first rod 8544 extends parallel to the second rod 8549. When the contact pairs 8531 are positioned on the rods 8544, 8549, the media reading interface 8530 may be positioned in the adapter 8510 as a modular unit as will be described in more detail herein.

Figure 186:
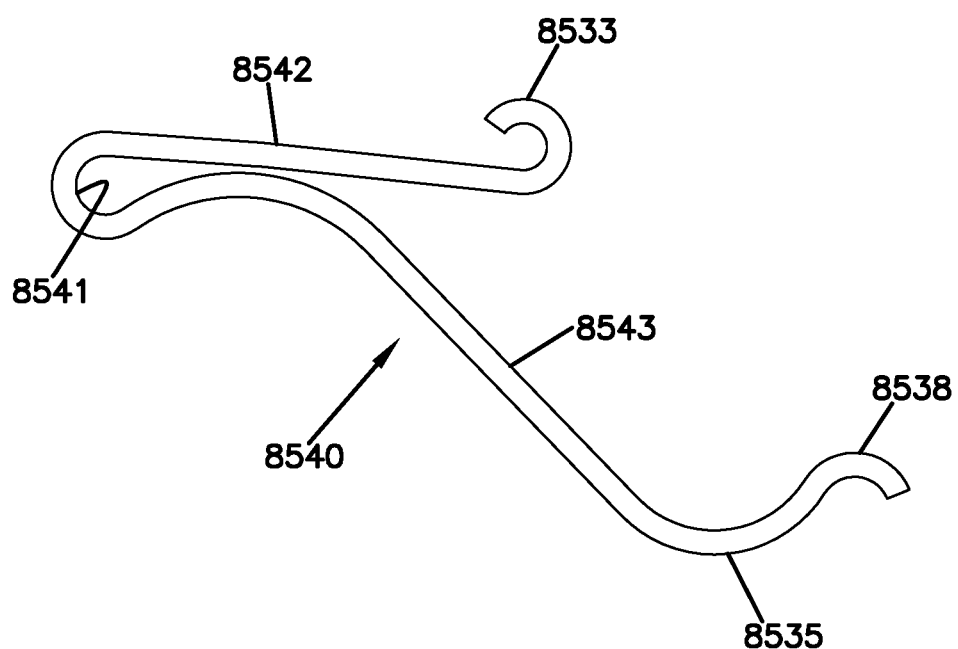
Figure 187:
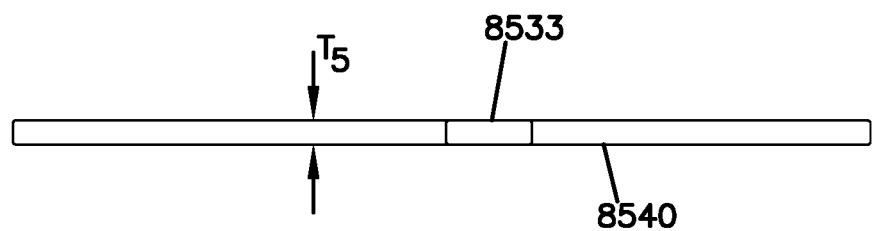

FIGS. 186-187 illustrate one example implementation of a first contact member 8540 of an example contact pair 8531. The first contact member 8540 includes a loop section 8541 that is configured to be positioned around the first rod 8544. A first arm 8542 extends from the loop section 8541 to define a first contact section 8533 that is configured to swipe, abut, or otherwise engage a contact pad or tracing on the printed circuit board 8520. A second arm 8543 extends from the loop section 8541 to define a second contact section 8535 that is configured to swipe, abut, or otherwise engage a contact pad 8431 of a storage device 8430 of a connector arrangement 8400 received at the adapter 8510. The second arm 8543 also defines a first engagement section 8538.

Figure 188:
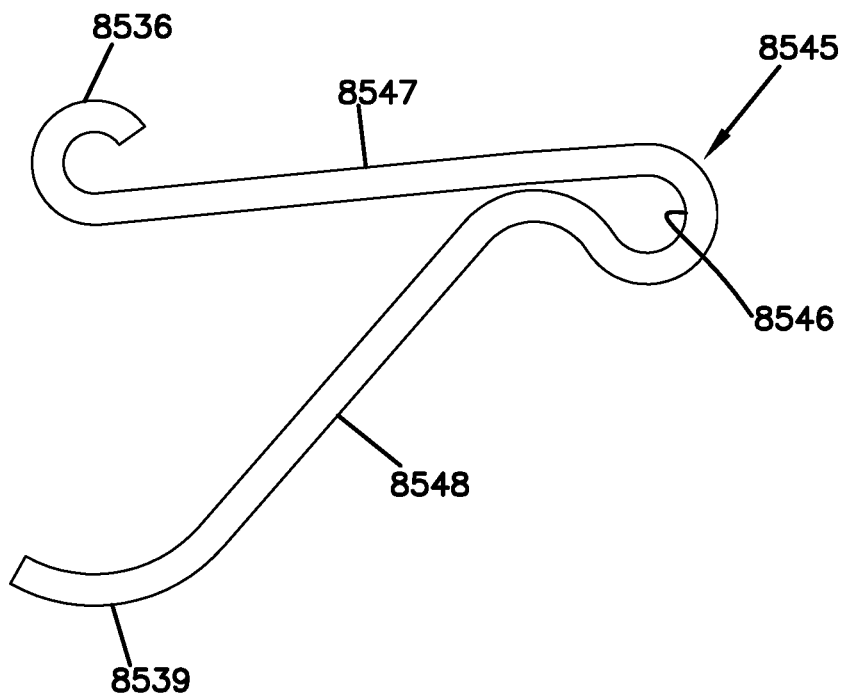

FIGS. 188-189 illustrate one example implementation of a second contact member 8545 of an example contact pair 8531. The second contact member 8545 includes a loop section 8546 that is configured to be positioned around the second rod 8549. A first arm 8547 extends from the loop section 8546 to define a third contact section 8536 that is configured to swipe, abut, or otherwise engage a contact pad or tracing on the printed circuit board 8520. A second arm 8548 extends from the loop section 8546 to define a second engagement section 8539 that is configured to selectively touch the first engagement section 8538 of the first contact member 8540 of the pair 8531.

In some implementations, the contact members 8540, 8545 have substantially continuous thicknesses T5 (FIGS. 187 and 189). In various implementations, the thickness T5 ranges from about 0.05 inches (about 1.27 mm) to about 0.005 inches (about 0.127 mm). In certain implementations, the thickness T5 is less than about 0.02 inches (about 0.51 mm). In some implementation, the thickness T5 is less than about 0.012 inches (about 0.305 mm). In another implementation, the thickness T5 is about 0.01 inches (about 0.25 mm). In another implementation, the thickness T5 is about 0.009 inches (about 0.229 mm). In another implementation, the thickness T5 is about 0.008 inches (about 0.203 mm). In another implementation, the thickness T5 is about 0.007 inches (about 0.178 mm). In another implementation, the thickness T5 is about 0.006 inches (about 0.152 mm). In other implementations, the thickness may vary across the length of the contact members 8540, 8545.

As shown in FIG. 184, a top surface 8512 of the coupler housing 8510 defines one or more slots 8514 configured to receive the one or more contact pairs 8531 of the media reading interfaces 8530. At least a portion of each slot 8514 extends through the top surface 8512 of the adapter 8510 to one of the passages. When a connector 8410 with a storage device 8430 is inserted into one of the ports 8515 of the coupler housing 8510, the contact pads 8432 of the storage device 8430 are configured to align with the slots 8514 defined in the adapter housing 8510. Accordingly, the contact pairs 8531 held within the slots 8514 align with the contact pads 8432 to connect the contact pads 8432 to contact pads on the printed circuit board 8520 mounted to the adapter 8510 (see FIGS. 196-197).

In some implementations, each contact pair 8531 is retained within a separate slot 8514. For example, in the implementation shown in FIG. 184, each media reading interface 8530 includes four contact pairs 8531 that are held in a set 8513 of four slots 8514 that align with four contact pads 8432 on a connector storage device 8430. The slots 8514 in each set 8513 are separated by intermediate walls 8516. First ends of the slots 8514 of each set 8513 are connected by a first channel 8507 and second ends of the slots 8514 of each set 8513 are connected by a second channel 8508. In other implementations, all of the contact pairs 8531 in a single media reading interface 8530 may be retained in a single slot 8514.

In general, the width of each set 8513 of slots 8514 is smaller than the width of the key 8415 of a connector 8410 positioned in the respective adapter port 8515. In some implementations, the width of each set 8513 of slots 8514 is less than 3.35 mm (0.13 inches). Indeed, in some implementations, the width of each set 8513 of slots 8514 is less than about 3.1 mm (0.12 inches). In certain implementations, the width of each set 8513 of slots 8514 is no more than about 2.5 mm (0.10 inches). In one example implementation, the width of each set 8513 of slots 8514 is no more than 2.2 mm (0.09 inches).

In certain implementations, the width of the intermediate walls 8516 is smaller than the width of the slots 8514. In some implementations, the width of each slot 8514 is within the range of about 0.25 mm (0.010 inches) to about 0.64 mm (0.025 inches). Indeed, in some implementations, the width of each slot 8514 is within the range of about 0.38 mm (0.015 inches) to about 0.48 mm (0.019 inches). In one implementation, the width of each slot 8514 is about 0.43-0.44 mm (0.017 inches). In one implementation, the width of each slot 8514 is about 0.41-0.42 mm (0.016 inches). In one implementation, the width of each slot 8514 is about 0.45-0.46 mm (0.018 inches). In some implementations, the width of each intermediate wall 8516 is within the range of about 0.13 mm (0.005) inches to about 0.18 mm (0.007 inches). In one implementation, the width of each intermediate wall 8516 is about 0.15 mm (0.006 inches).

The adapter housing 8510 defines a sufficient number of slots 8514 to accommodate the contact pairs 8531 of the media reading interfaces 8530 installed at the adapter 8510. In some implementations, the adapter 8510 includes at least one set 8513 of forward slots 8514 and at least one set 8513 of rearward slots 8514. In the example shown in FIG. 184, the slots 8514 defined at front ports 8515 of the adapter passages axially align with slots 8514 defined at the rear ports 8515. In other implementations, however, the slots 8514 at the front ports 8515 may be staggered from the slots 8514 at the rear ports 8515.

In some implementations, the adapter 8510 can include a media reading interface 8530 associated with each passage. For example, the quadruplex adapter 8510 shown in FIG. 184 includes a first media reading interface 8530A at the rear port 8515 of a first passage and a second media reading interface 8530B at the front port 8515 of a second passage to interface with two duplex fiber optic connector arrangements 8400 received thereat. The quadruplex adapter 8510 also includes a third media reading interface 8530C at the rear port 8515 of a third passage and a fourth media reading interface 8530D at the front port 8515 of a fourth passage to interface with another two duplex fiber optic connector arrangements 8400 received thereat.

In another implementation, the adapter 8510 can include a media reading interface 8530 associated with each port 8515. In still other implementations, a different number of media reading interfaces 8530 may be provided at the front and rear of the adapter 8510. For example, one side of the adapter housing 8510 can include two media reading interfaces 8530 to interface with two duplex fiber optic connector arrangements 8400 and another side of the adapter housing 8510 can include four media reading interfaces 8530 to interface with four separate fiber optic connectors. In other implementations, the adapter housing 8510 can include any desired combination of front and rear media reading interfaces 8530.

In some implementations, the adapter housing 8510 has more sets 8513 of slots 8514 than media reading interfaces 8530. In other implementations, however, the adapter housing 8510 may have the same number of slot sets 8513 and media reading interfaces 8530. In certain implementations, each adapter housing 8510 defines a set 8513 of slots 8514 at each port 8515 of each passage. In other implementations, each adapter housing 8510 may define a set 8513 of slots 8514 at only one port 8515 of each passage. In other implementations, the adapter housing 8510 may define a set 8513 of slots 8514 at each port 8515 of alternate passages.

Figure 190:
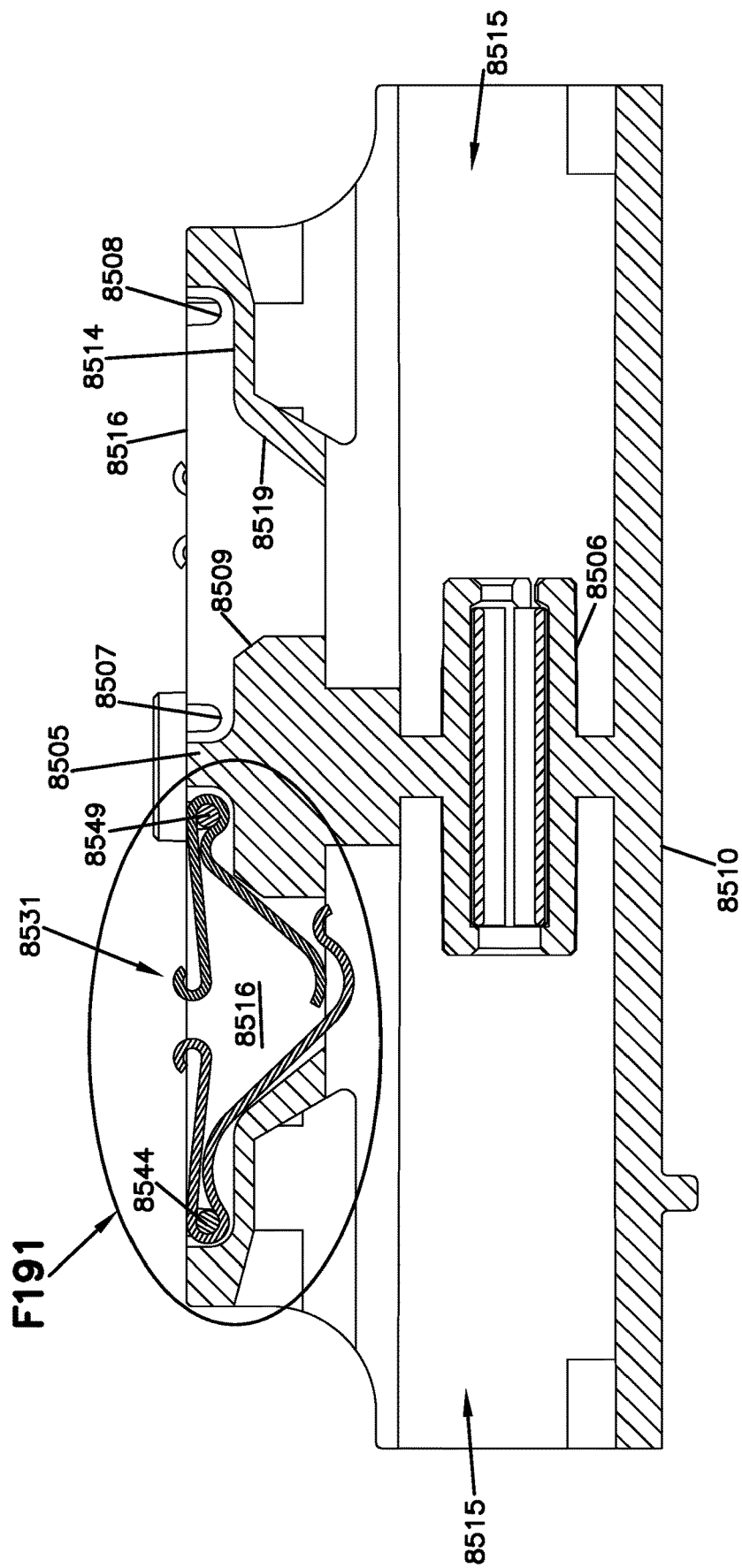

As shown in FIG. 190, at least one support wall 8505 separates the forward slots 8514 from the rearward slots 8514. Each support wall 8505 extends from the slotted top surface 8512 of the adapter housing 8510 the passages. In some implementations, a single support wall 8505 extends along a center of the adapter housing 8510. In other implementations, one or more support walls 8505 may extend between slots 8514 arranged in a staggered configuration. In certain implementations, the support walls 8505 may connect to or be continuous with the intermediate walls 8516. The support wall 8505 defines ramped or tapered surfaces 8509 extending from the support wall 8505 towards the front and rear of the adapter 8510. Additional ramped or tapered surfaces 8519 extends from the front and rear of the adapter 8510 towards the support wall 8505.

An example media reading interface 8530 is mounted at an adapter 8510 by aligning the contact pairs 8531 with the slots 8514 of a set 8513 and inserting the first rod 8544 into the second channel 8508 of the set 8513 and the second rod 8549 into the first channel 8507 of the set 8513. The media reading interface 8530 is positioned so that an intermediate wall 8516 extends between adjacent contact pairs 8531. The second contact section 8535 of each contact pair 8531 extends towards the respective passage along a gap between the tapered surfaces 8509, 8519 (see FIGS. 190 and 191). In certain implementations, the engagement sections 8538, 8539 also are positioned in the gap between the tapered surfaces 8509, 8519.

The contact pairs 8531 extend between a top and a bottom. In the example shown, the top of each contact pair 8531 faces the circuit board 8520 and the bottom of each contact pair 8531 faces the passage. As used herein, the terms "top" and "bottom" are not meant to imply a proper orientation of the contact pair 8531 or that the top of the contact pair 8531 must be located above the bottom of the contact pair 8531. Rather, the terms are used for ease in understanding and are assigned relative to the viewing plane of FIG. 190. The contact pairs 8531 also extend between first and second sides. For example, the first pin 8544 may define the first side and the second pin 8549 may define the second side.

Figure 191:
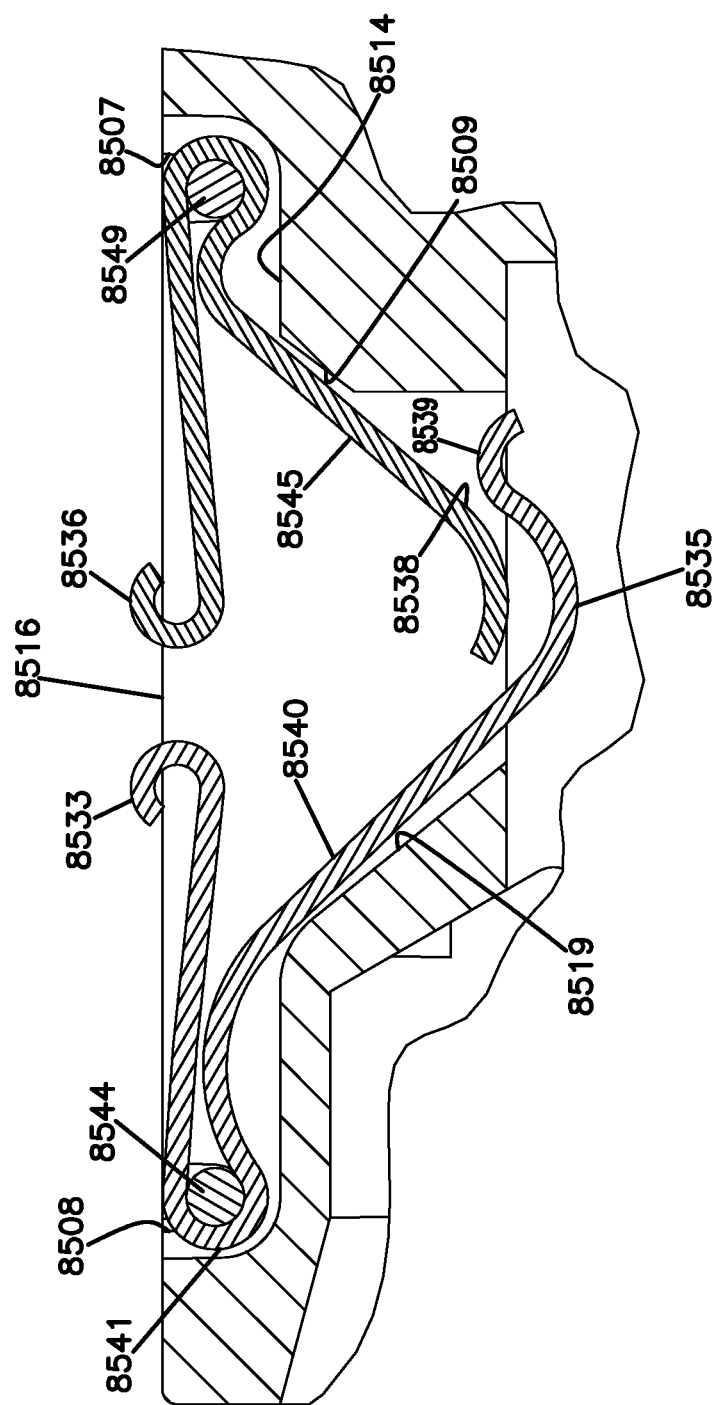

Referring to FIG. 191, the first moveable contact section 8533 is configured to extend through the slot 8514 and engage the circuit board 8520. The third moveable contact section 8536 also is configured to extend through the slot 8514 and engage the circuit board 8520. The ability of the first and third contact sections 8533, 8536 to flex relative to the rods 8544, 8549 provides tolerance for placement of the contact pairs 8531 relative to the circuit board 8520. In one implementation, the first contact section 8533 and/or the second contact section 8536 may provide grounding for the contact pair 8531 through the circuit board 8520.

The second moveable contact section 8535 is configured to extend into a respective one of the passages and to engage the connector arrangement 8400 (e.g., a key 8415 of the connector arrangement) positioned in the passage. If a storage device 8430 is installed on the connector arrangement 8400, then the second contact surface 8535 is configured to engage the contact pads 8432 of the storage device 8430. Data may be transferred from the storage device 8430 to the circuit board 8520 when the contact pairs 8531 complete a circuit between the storage device 8430 and the circuit board 8520. The circuit is complete when the first contact member 8540 contacts the second contact member 8545 to create a continuous electrical pathway between the contact members 8540, 8545.

For example, the circuit may be complete when the first engagement section 8538 and the second engagement section 8539 are brought into engagement. In some implementations, the first engagement section 8538 may be configured to move (e.g., lift) towards the second engagement section 8539 when a connector arrangement 8400 is received at a port 8515 corresponding with the respective media reading interface 8530. For example, the first engagement section 8538 may be configured to move upwardly when the front surface 8418 of the key 8415 of a connector arrangement 8400 pushes against the second contact section 8535 when the connector arrangement 8400 is inserted into a port 8515.

In some implementations, the first engagement section 8538 is formed on an opposite surface from the second contact section 8535 and the second engagement section 8539 is formed on a bottom-most surface of the second contact member 8545. In other implementations, the second leg 8540 of the first contact member 8540 includes a tail on which the first engagement section 8538 is defined. The tail extends from the second contact section 8535 to a distal tip. In certain implementations, the tail is curved in a different (e.g., generally opposite) direction than the second contact section 8535. For example, the second contact section 8535 may be curved towards the passage and the tail may be curved towards the second contact member 8545.

Figure 193:
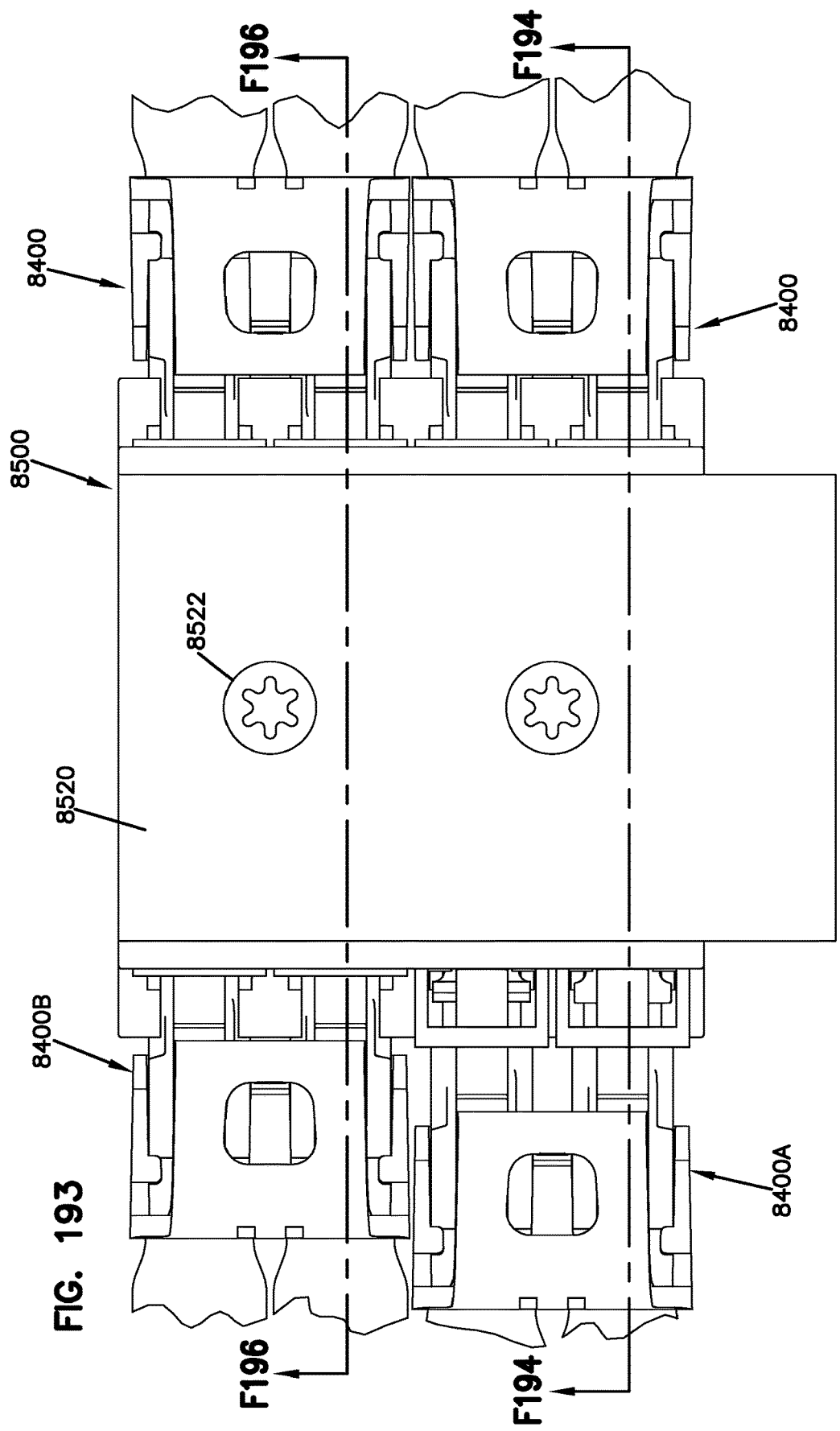
Figure 194:
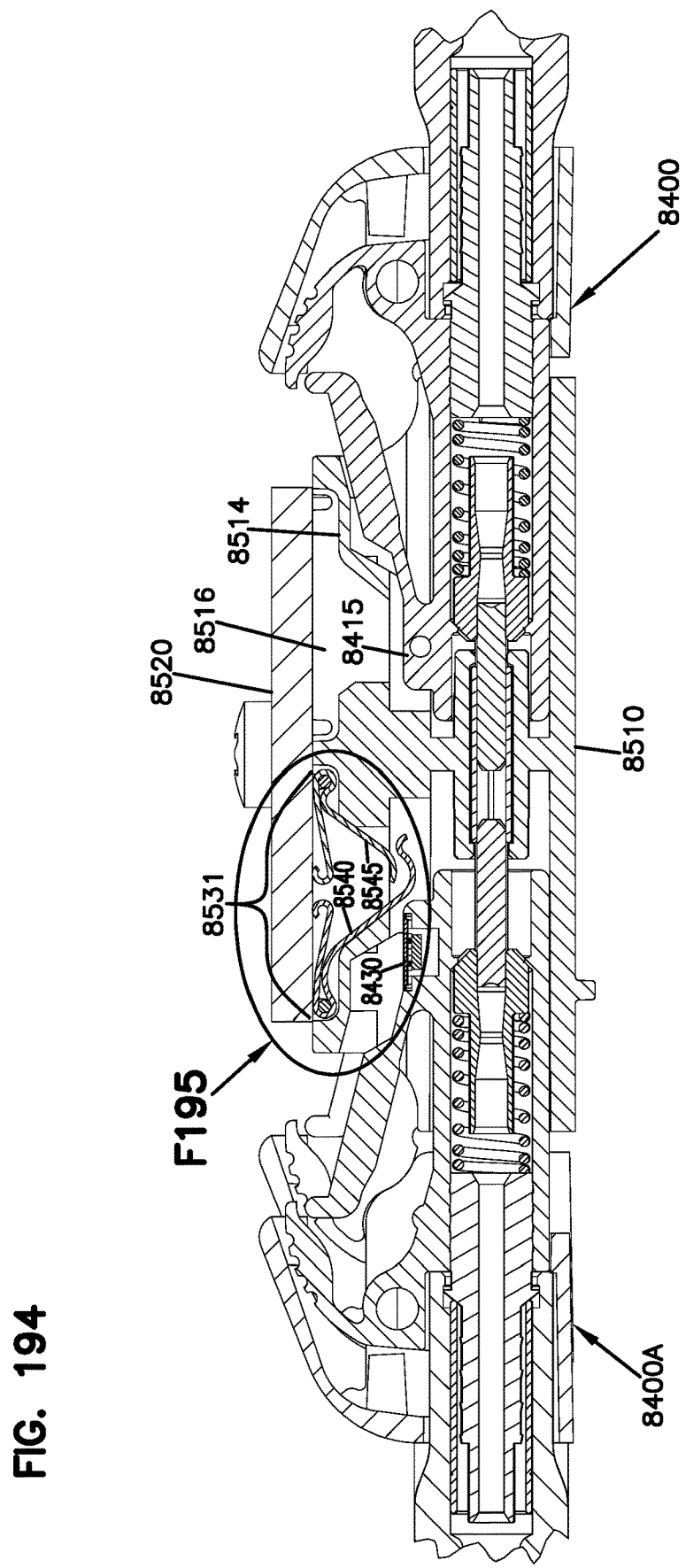
Figure 196:
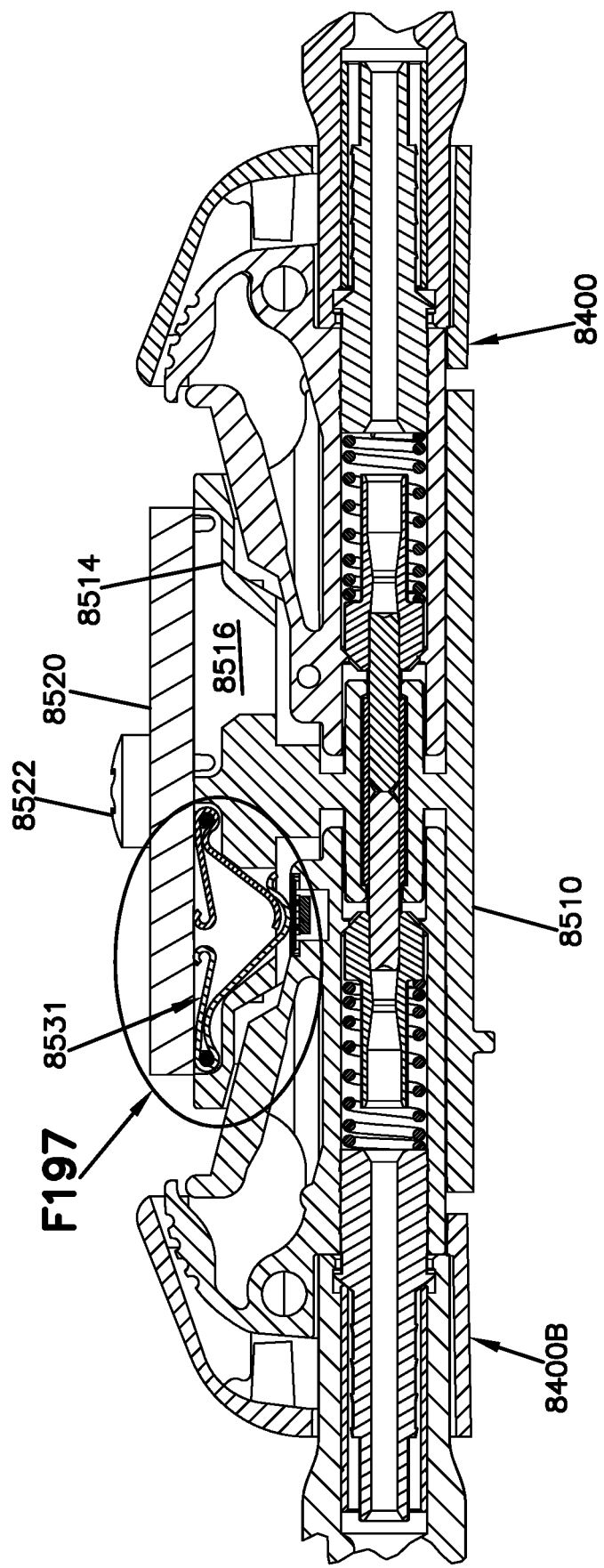
Figure 197:
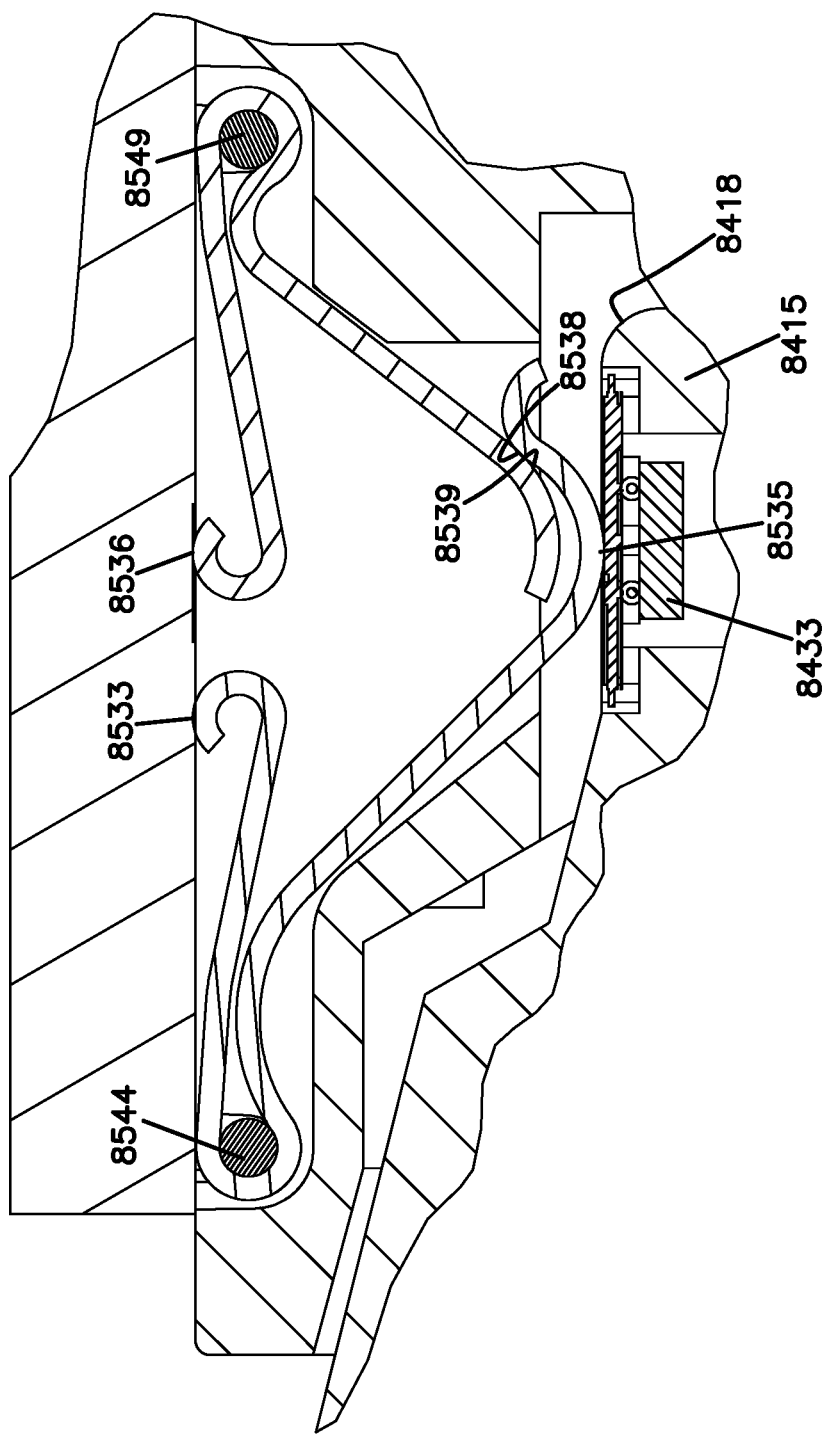
Figure 198:
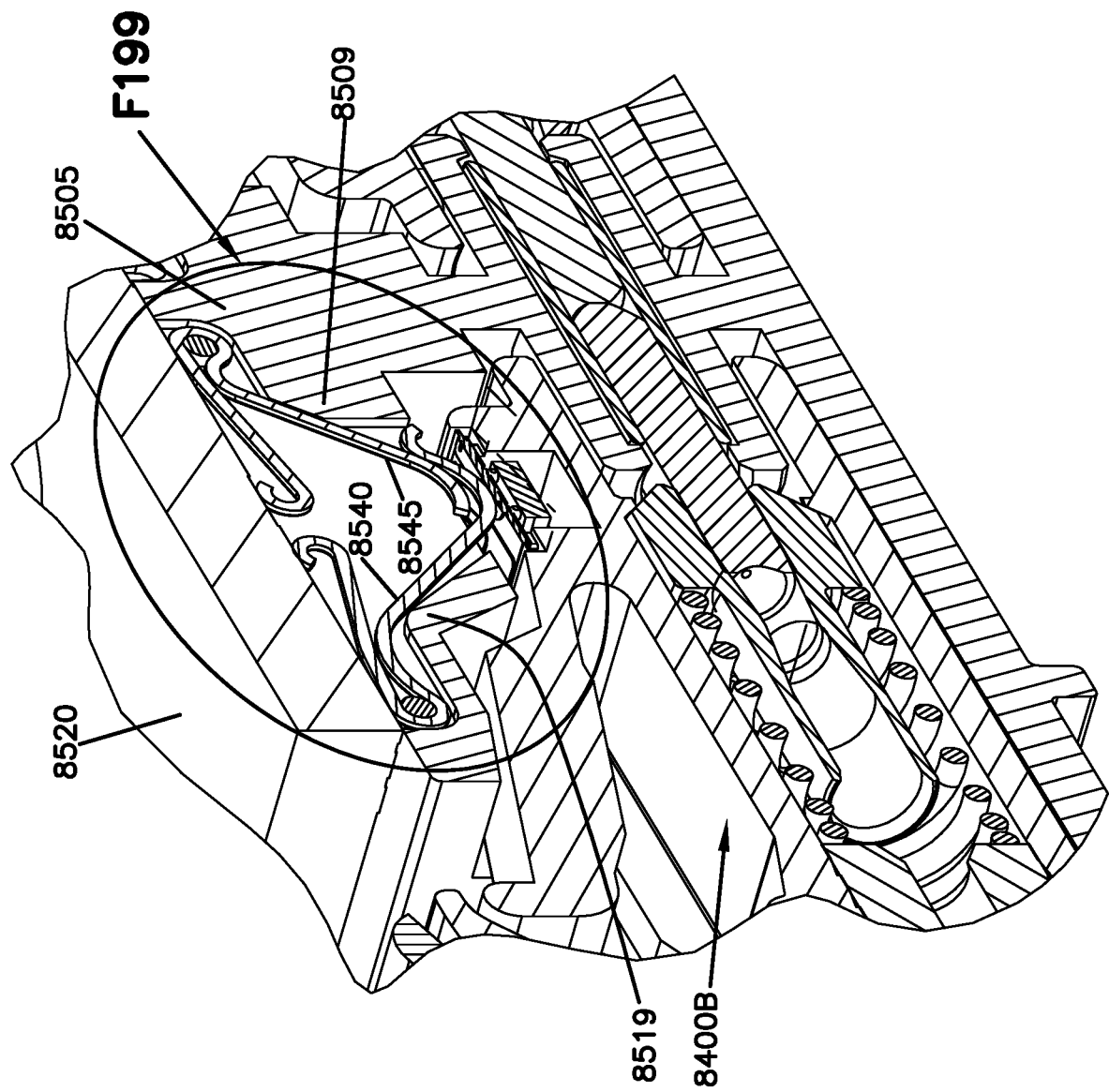
Figure 199:
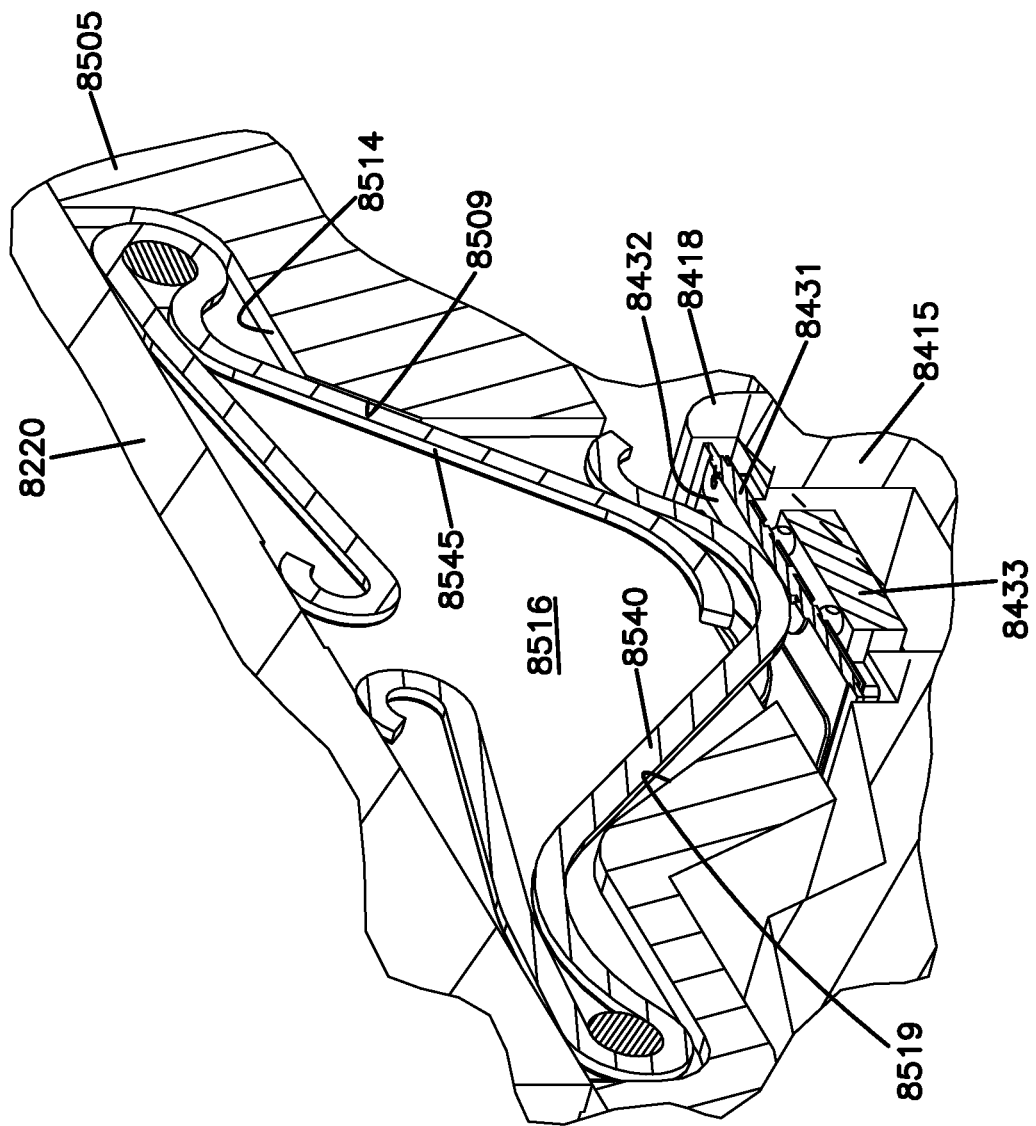

FIG. 193 is a top plan view of an adapter assembly 8500 having two connector arrangements 8400 received at the right side of an adapter 8510, a connector arrangement 8400A partially received at the left side of the adapter 8510, and another connector arrangement 8400B fully received at the left side of the adapter 8510. FIGS. 194 and 196 are cross-sectional views showing the partially received connector arrangement 8400A and the fully received connector arrangement 8400B, respectively. FIGS. 195 and 197 are enlarged views of portions of FIGS. 194 and 196, respectively.

In the example shown in FIGS. 194-195, the first contact section 8533 and the third contact section 8536 engage contact pads on the circuit board 8520 when a connector arrangement 8400 is not positioned within a respective port 8515. The second contact section 8535 is positioned below the intermediate wall 8516 and the first engagement section 8538 is spaced from the second engagement section 8539 when a connector arrangement 8400 is not positioned within a respective port 8515 (see FIG. 177). In other implementations, however, one or both of the contact sections 8533, 8536 may be spaced from the circuit board 8520 when the respective port 8515 is empty.

As shown in FIGS. 196-197, inserting a connector arrangement 8400 into the port 8515 biases the second contact section 8535 upwardly toward the second contact member 8545. In certain implementations, biasing the second contact section 8535 upwardly causes the first engagement section 8538 to abut, swipe, or otherwise touch the second engagement section 8539 to complete the electrical pathway between the two contact members 8540, 8545. In some implementations, inserting the connector arrangement 8400 also may bias the first contact section 8533 and/or the second contact section 8536 into engagement with the circuit board 8520. In other implementations, inserting the connector arrangement 8400 may increase the force of engagement between the first and third contact sections 8533, 8536 and the circuit board 8520.

FIGS. 200-217 illustrate another example implementation of a connector system 8600 that can be utilized on a connector assembly (e.g., a communications panel) having PLI functionality as well as PLM functionality. The example connector system 8600 includes at least one communications coupler assembly 8800 positioned between two printed circuit boards 8820. One or more example connector arrangements 8700, which terminate segments of communications media, are configured to communicatively couple to other segments of physical communications media at the one or more communications coupler assemblies 8800. Accordingly, communications data signals carried by the media segments terminated by the connector arrangements 8700 can be transmitted to other media segments.

The communications coupler assembly 8800 includes at least one coupler housing 8810 including at least one media reading interface 8830. The coupler housing 8810 is sandwiched between a first circuit board 8820A and a second circuit board 8820B (e.g., via fasteners 8822A, 8822B). In some implementations, multiple (e.g., two, three, four, eight, twelve, sixteen, twenty, etc.) coupler housings 8810 may be sandwiched between the circuit boards 8820. In some implementations, the first circuit board 8820A can be electrically coupled to the second circuit board 8820B via a fixed connector (e.g., a card edge connector). In other implementations, the first circuit board 8820A can be electrically coupled to the second circuit board 8820B via a flexible or ribbon cable arrangement. In still other implementations, the circuit boards 8820A, 8820B are interconnected using other suitable circuit board connection techniques.

Figure 200:
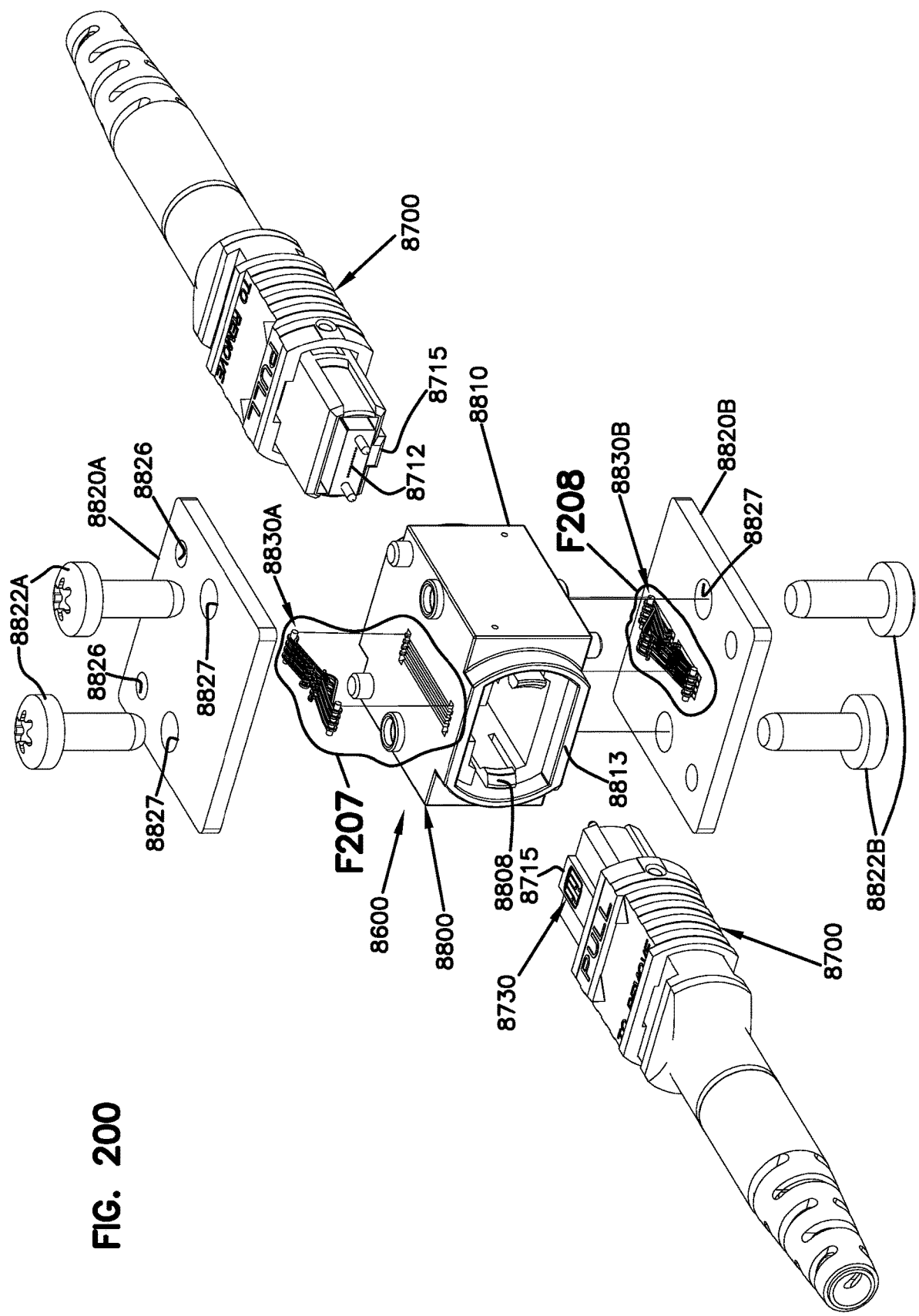

For ease in understanding, only portions of the example printed circuit boards 8820A, 8820B of the connector system 8600 are shown in FIG. 200. It is to be understood that the printed circuit boards 8820A, 8820B electrically connect to a data processor and/or to a network interface (e.g., processor 217 and network interface 216 of FIG. 2) as part of a coupler assembly 8800. Non-limiting examples of such connector assemblies 8800 include bladed chassis and drawer chassis. Furthermore, additional coupler housings 8810 can be connected to different portions of the printed circuit boards 8820A, 8820B or at other locations within an example connector assembly.

In some implementations, each connector arrangement 8700 defines an MPO fiber optic connector arrangement terminating multiple optical fibers. In the example shown in FIGS. 200-217 the connector arrangements 8700 are the same as connector arrangements 5100 of FIGS. 133-139. In other implementations, however, the connector arrangements 8700 may include an LC-type connector arrangement, an SC-type connector arrangement, an ST-type connector arrangement, an FC-type connector arrangement, an LX.5-type connector arrangement, or any other type of connector arrangement.

Each MPO connector 8700 is configured to store physical layer information (e.g., media information). For example, the physical layer information can be stored in a memory device 8730 mounted on or in the connector body 8710. In certain implementations, the front connector body 8710 includes a key 8715 configured to accommodate a storage device 8730 on which the physical information is stored. The key 8715 includes a raised (i.e., or stepped up) portion at a front of the connector body located adjacent the ferrule 8712. The key 8715 fits into a channel 8818 of the adapter 8810 to key the connector 8700 to the adapter 8810 as will be described herein.

The storage device 8730 includes generally planar contacts 8732 positioned on a circuit board 8731. Memory circuitry is arranged on a circuit board 8731 of the storage device 8730 and connected to the contacts 8732 via conductive tracings. In one example embodiment, the storage device 8730 includes an EEPROM circuit arranged on the printed circuit board 8731. In other embodiments, however, the storage device 8730 can include any suitable type of memory. In the example shown, the storage device 8730 is seated in a cavity 8716 defined in the key 8715. In some implementations, the cavity 8716 is two-tiered, thereby providing a shoulder on which the storage device 8730 can rest and space to accommodate circuitry (e.g., memory) located on a bottom of the storage device 8730. In other implementations, the storage device 8730 can be otherwise mounted to the connector 8710.

Memory of the storage device 8730, which is located on the non-visible side of the board in FIG. 200, is accessed by engaging the tops of the contacts 8732 with an electrically conductive contact member (e.g., of a media reading interface 8830). In certain implementations, contact members 8831 of the media reading interface 8830 initially contact the deflecting surface 8718 of the connector arrangement 8700 and subsequently slide or wipe across the contacts 8732 of the storage device 8730 as will be described in more detail herein (see FIGS. 215-217).

One example coupler housing 8810 is shown in FIGS. 201-206. The example coupler housing 8810 defines a single passage 8805 extending between a front port 8803 and a rear port 8804. In other example implementations, however, each coupler housing 8810 can include a greater number (e.g., two, three, four, six, eight, twelve, etc.) of passages 8805. Each port 8803, 8804 of each passage 8805 is configured to receive a segment of communications media (e.g., a connectorized end of an optical fiber). In some implementations, flexible latching tabs 8808 (FIG. 200) are located at the ports 8803, 8804 to aid in retaining connector arrangements 8700 at the coupler housing 8810. In the example shown, each latching tab 8808 defines a ramped surface and latching surface.

In the example shown, each coupler housing 8810 is implemented as a fiber optic adapter configured to receive Multi-fiber Push-On (MPO) connectors. Each passage 8805 of the MPO adapters 8810 is configured to align and connect two MPO connector arrangements 8700 (see FIGS. 215-217). In other implementations, each passage 8805 can be configured to connect other types of physical media segments. For example, one or more passages 8805 of the MPO adapters 8800 can be configured to communicatively couple together an MPO connector arrangement 8700 with a media converter (not shown) to convert the optical data signals into electrical data signals, wireless data signals, or other type of data signals.

In the example shown in FIGS. 201-206, each adapter 8810 is formed from opposing sides 8801 interconnected by first and second ends 8802. The sides 8801 and ends 8802 each extend between an open front port 8803 and an open rear port 8804 to define the passage 8805. In some implementations, the sides 8801 and ends 8802 define a generally rectangular box. In certain implementation, the port entrances 8803, 8804 are oblong-shaped. In the example shown, the port entrances 8803, 8804 are obround-shaped having planar top and bottom surfaces and rounded side surfaces.

The adapter 8810 also includes mounting stations 8807 at which fasteners 8822 (FIG. 124) can be received to secure the adapter 8810 to one or more printed circuit boards 8820. In the example shown, the mounting stations 8807 include annular walls defining openings to receive the fasteners 8822. In certain implementations, the fasteners 8822 pass through mounting openings 8827 defined by the printed circuit board 8820 (FIG. 200). Non-limiting examples of suitable fasteners 8822 include screws, snaps, and rivets. For example, the mounting stations 8807 can aid in securing the adapter 8810 to the upper circuit board 8820A and the lower circuit board 8820B (see FIG. 200). In other implementations, the mounting stations 8807 can include latches, panel guides, or other panel mounting arrangements.

In some implementations, the adapter 8810 also includes alignment lugs 8806 that facilitate mounting the adapter 8810 to the circuit boards 8820 in the correct orientation. For example, the alignment lugs 8806 may align with openings 8826 (FIG. 200) defined in the circuit boards 8820. Accordingly, the alignment lugs 8806 inhibit mounting of the adapter 8810 backwards on one or both of the circuit boards 8820. In the example shown, two alignment lugs 8806 extend from a first end 8802 of the adapter 8810 at the front of the adapter 8810 and two alignment lugs 8806 extend from a second end 8802 of the adapter 8810 at the rear of the adapter 8810. In other implementations, however, greater or fewer alignment lugs 8806 may extend from the ends 8802 in the same or a different configuration to form a keying arrangement with the printed circuit board 8820.

The MPO adapter 8810 also defines channels 8818 extending partly along the length of the passages 805 (e.g., see FIGS. 204-206) to accommodate portions of the fiber connector arrangements 8700. In some implementations, the adapter 8810 may define a channel 8818 extending inwardly from each port 8803, 8804 of the passage 8805. In one example implementation, a first channel 8818 extends along a top of the housing 8810 from the front port 8803 and a second channel 8818 extends along a bottom of the housing 8810 from the rear port 8804. Each channel 8818 is configured to accommodate the key 8715 of the respective connector 8700A, 8700B. In some implementations, each channel 8818 extends about half-way through the passage 8805. In other implementations, each channel 8818 extends a greater or lesser distance through the passage 8805.

The adapter housing 8810 defines at least a first set 8811 of slots 8812 extending through one end 8802 of the adapter 8810 towards the passage 8805. In the example shown, each set 8811 includes four slots 8812. In other implementations, however, each set 8811 may include greater or fewer slots 8812. The slots 8812 in each set 8811 are separated by intermediate walls 8813. First ends of the slots 8812 of each set 8811 are connected by a first channel 8814 and second ends of the slots 8812 of each set 8811 are connected by a second channel 8815.

The adapter housing 8810 defines a sufficient number of slots 8812 to accommodate contact pairs 8831 of the media reading interfaces 8830 installed at the adapter 8810. In some implementations, each end 8802 of the adapter housing 8810 defines one set 8811 of slots 8812 to hold the media reading interfaces 8830. In certain implementations, the slots 8812 defined in the top surface 8802 are offset from the slots 8812 defined in the bottom surface 8802 (see FIG. 204). In the example shown, the first set 8811 of slots 8812 is defined in the top end 8802 of the adapter 8810 at a front portion of the adapter 8810 and a second set 8811 of slots 8812 is defined in the bottom end 8802 of the adapter 8810 at a rear portion of the adapter 8810. In other implementations, each end 8802 of the adapter 8810 defines a single slot 8812 configured to hold a media reading interface 8830. In still other implementations, the adapter 8810 can include a media reading interface 8830 associated with each passage (e.g., when only one of the connector arrangements 8700 includes a storage device 8730).

Figure 204:
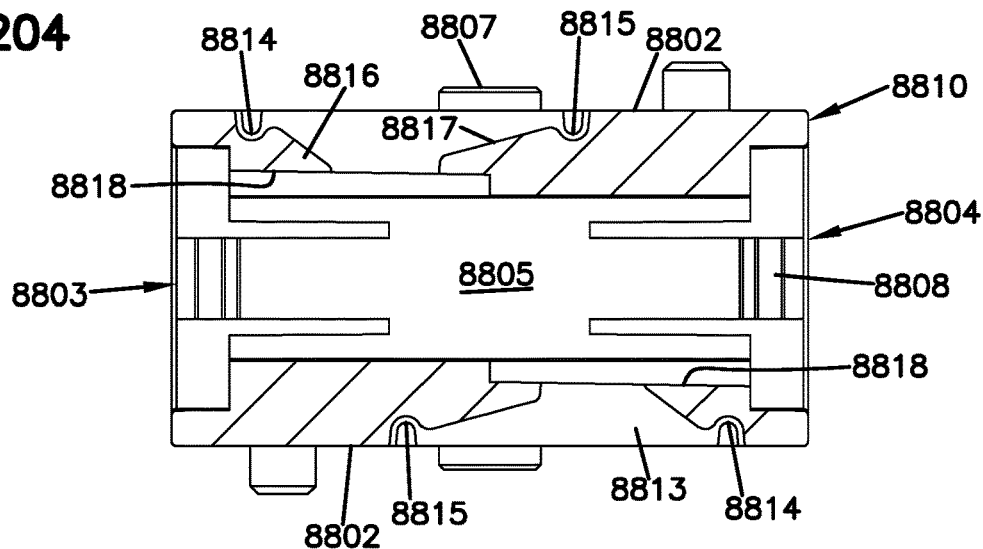
Figure 205:
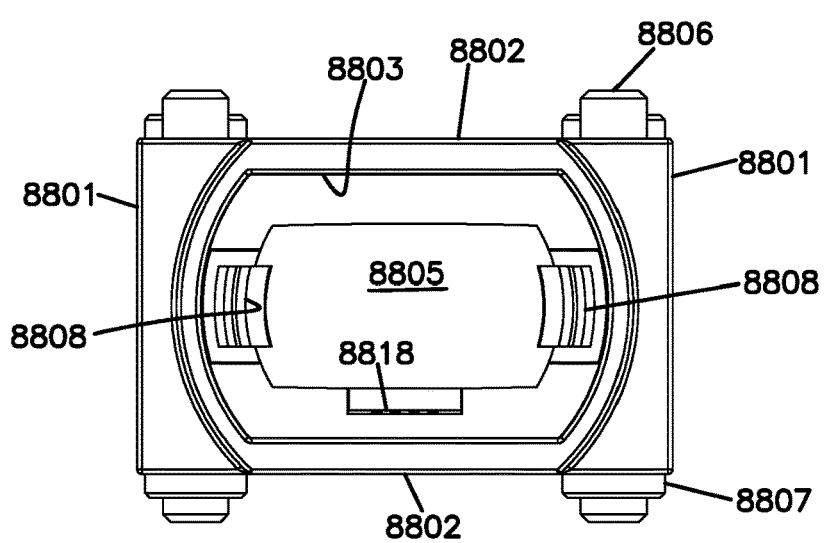
Figure 206:
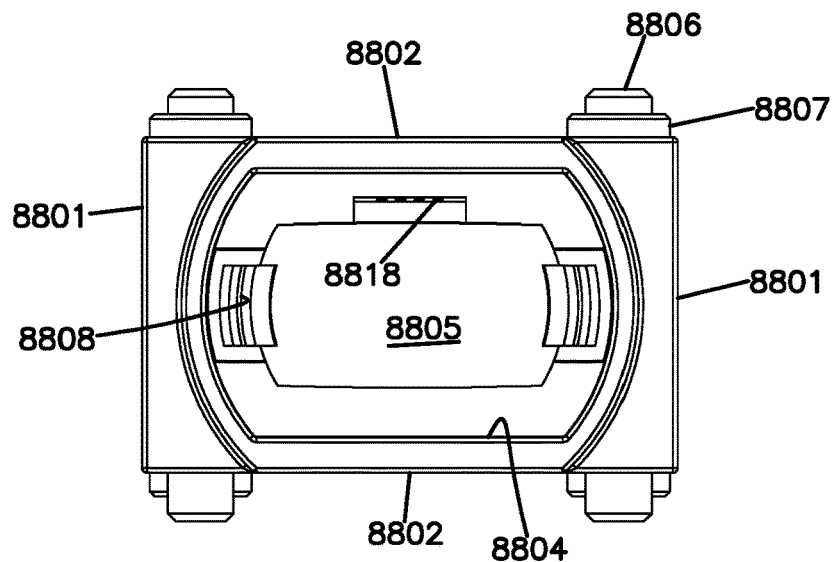
Figure 207:
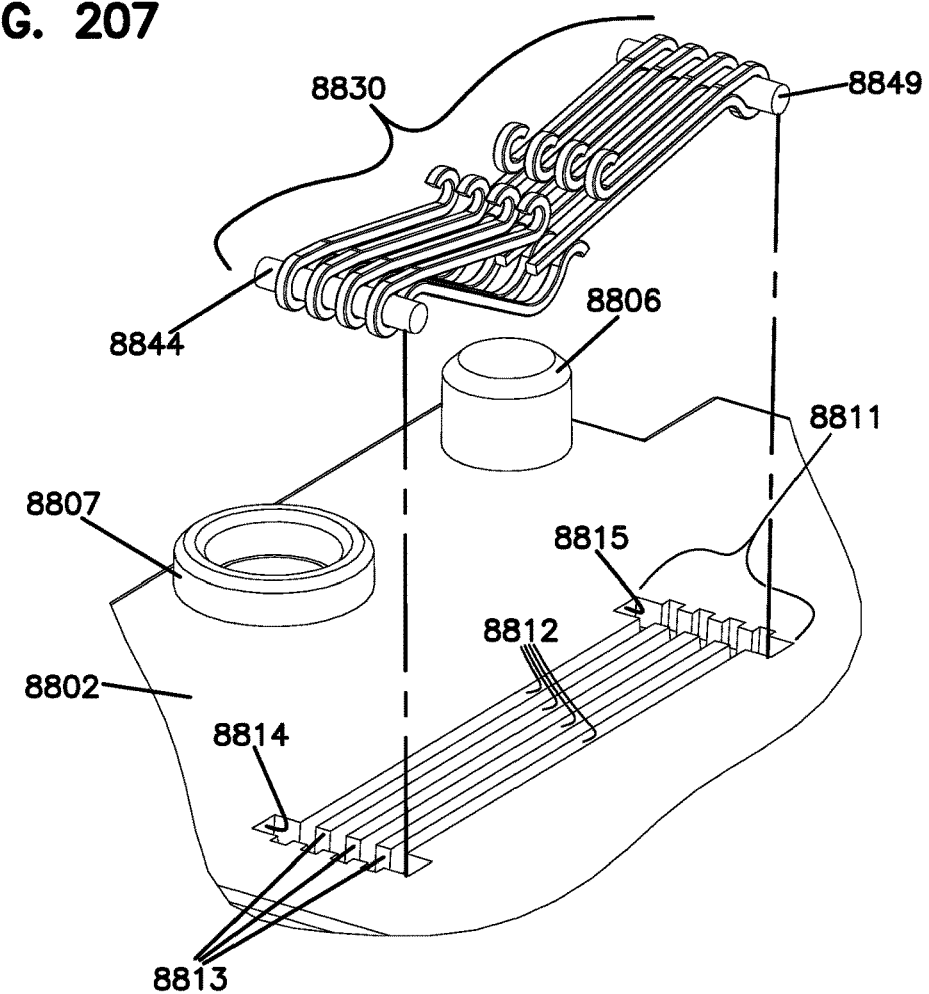
Figure 208:
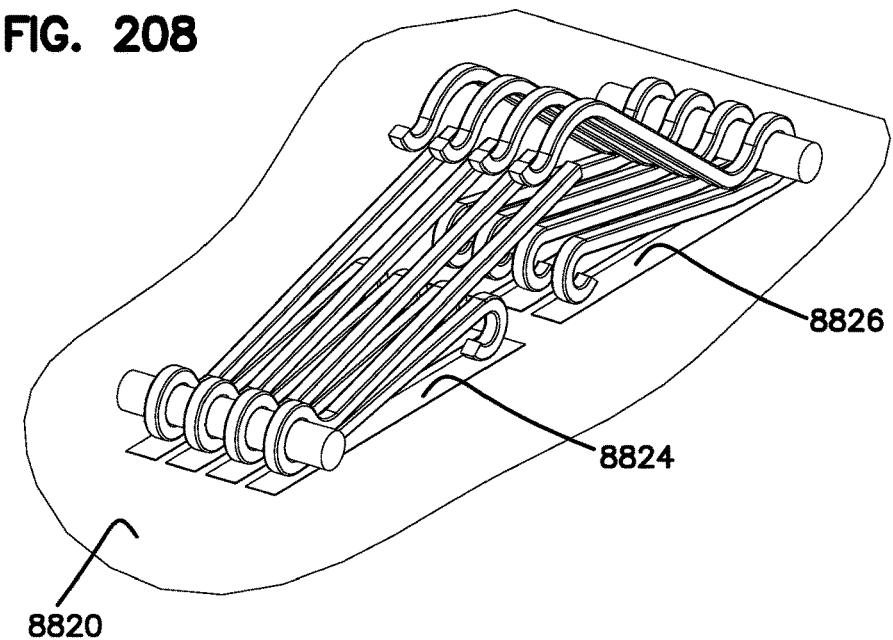

Each slot 8812 leads to one of the channels 8818 (see FIG. 204). In the example shown in FIG. 204, each slot 8812 defined in the top surface 8802 leads to the front channel 8818 and each slot 8812 defined in the bottom surface 8802 leads to the rear channel 8818. In certain implementations, at least a portion of each slot 8812 is shallower than the rest of the slot 8812. For example, the adapter 8810 may define support walls 8816, 8817 tapering inwardly from the top and bottom surfaces 8802 to the channels 8818 (see FIG. 204).

Each adapter housing 8810 includes at least one media reading interface 8830 (e.g., see FIGS. 200, 207, and 208) configured to connect the printed circuit board 8820 to the storage devices 8730 of the fiber optic connector arrangements 8700 plugged into the fiber optic adapter 8810. Each MPO adapter 8810 includes at least one media reading interface 8830 that is configured to communicate with the storage device 8730 on an MPO connector 8710 plugged into the MPO adapter 8810. In the example shown, the adapter 8810 includes a media reading interface 8830 associated with each adapter port 8803, 8804. In other implementations, however, the adapter 8810 may include a media reading interface 8830 for each logical link between connector arrangements (e.g., one media reading interface 8830 per passage 8805).

Figure 210:
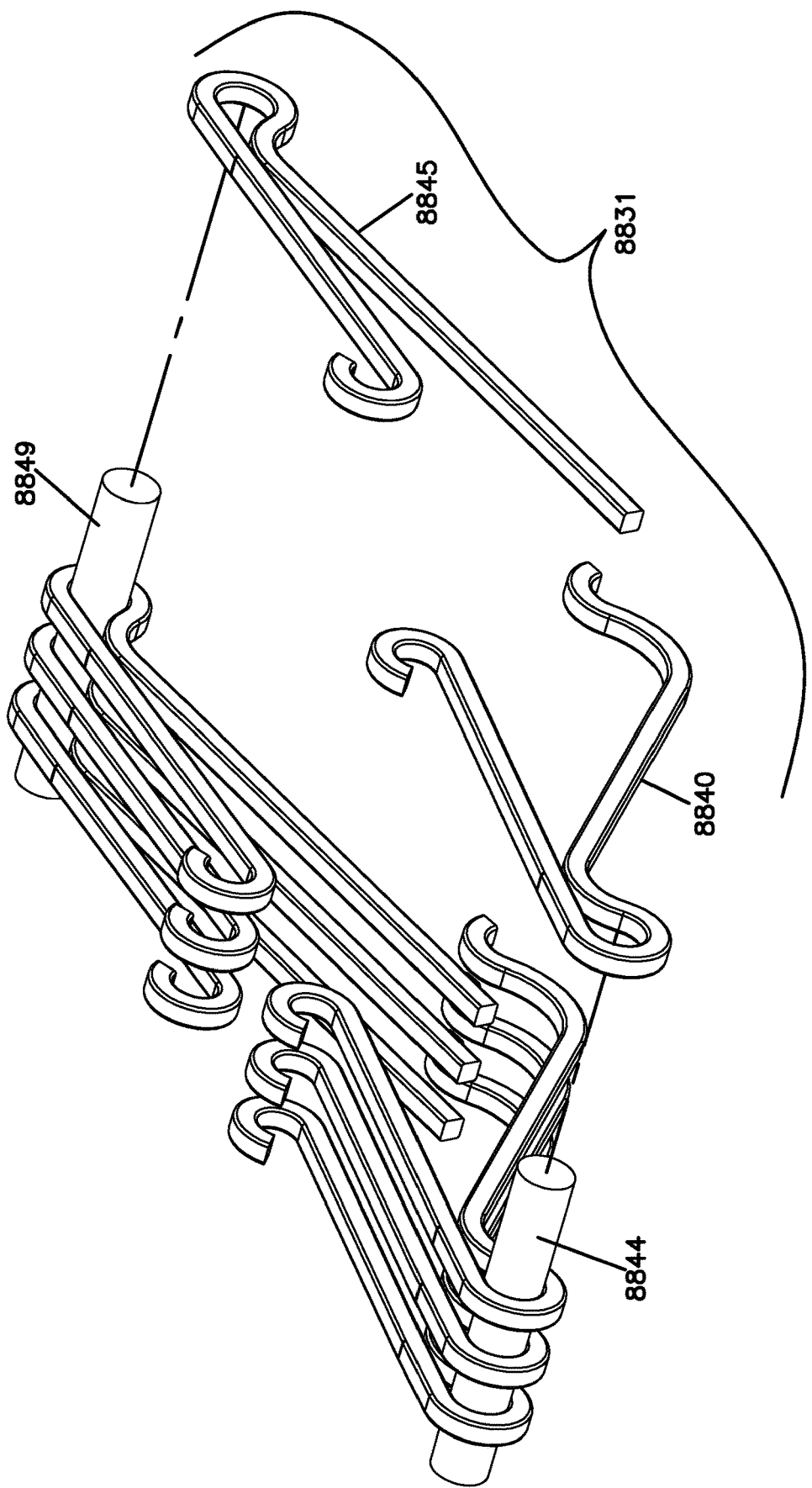
Figure 211:
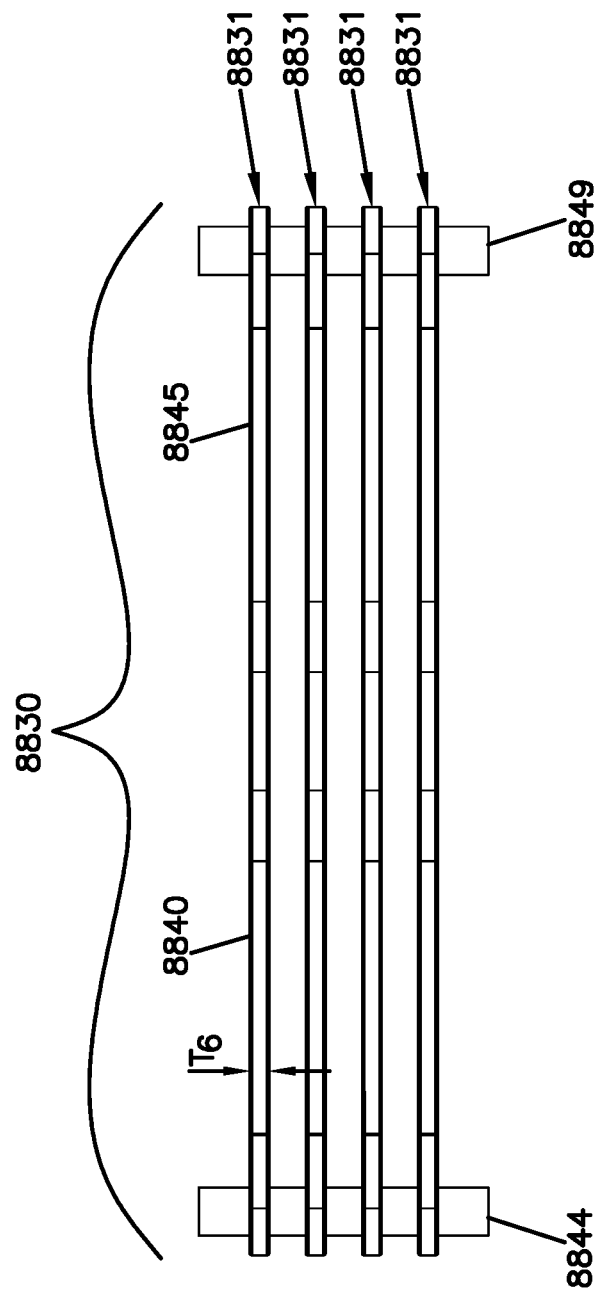

Each media reading interface 8830 includes one or more contact pairs 8831 (see FIGS. 210-211). Portions of the contact pairs 8831 engage contact pads 8824, 8826 on the printed circuit boards 8820 mounted to the adapter surfaces 8802 (see FIG. 208). Other portions of the contact pairs 8831 engage the electrical contacts 8732 of the storage members 8730 attached to connector arrangements 8700 positioned in the passages 8805 (see FIGS. 215-217). A processor coupled to one or both of the circuit boards 8820 can access the memory of each connector arrangement 8700 through the corresponding media reading interface 8830.

In accordance with some aspects, the media reading interfaces 8830 also are configured to detect when a connector arrangement 8700 is inserted into one of the adapter ports 8803, 8804. The media reading interfaces 8830 can function as presence detection sensors or trigger switches. In some implementations, the media reading interface 8830 is configured to form a complete circuit between the circuit board 8820 and the connector storage devices 8730 only when a respective connector arrangement 8710 is received at the adapter 8810. In other example implementations, portions of the media reading interface 8830 can be configured to complete a circuit until a respective connector arrangement 8710 is received at the adapter 8810. In accordance with other aspects, however, some implementations of the media reading interface 8830 may be configured to form a complete circuit with the circuit board 8820 regardless of whether a connector arrangement 8700 is received at the adapter 8810.

Referring to FIGS. 209-213, each media reading interface 8830 is formed from one or more contact pairs 8831. In certain implementations, the media reading interface 8830 includes at least a first contact pair 8831 that transfers power, at least a second contact pair 8831 that transfers data, and at least a third contact pair 8831 that provides grounding. In one implementation, the media reading interface 8830 includes a fourth contact pair 8831. In other implementations, however, the media reading interface 8830 include greater or fewer contact pairs 8831.

Each contact pair 8831 includes a first contact member 8840 and a second contact member 8845 that is aligned with the first contact member 8840. In accordance with some aspects, the contact members 8840, 8845 are configured to selectively form a complete circuit with a respective circuit board 8820. For example, each circuit board 8820 may include two contact pads 8824, 8226 for each contact pair 8831. In certain implementations, the first contact member 8840 of each contact pair 8831 touches the first 8824 contact pad and the second contact member 8845 of each contact pair 8831 touches the second contact pad 8826 (see FIG. 208). The circuit is selectively closed by touching the first and second contact members 8840, 8845 together. The processor coupled to the circuit board 8820 determines when the circuit is complete. Accordingly, the contact pairs 8831 can function as presence detection sensors for determining whether a media segment is received at the adapter 8810.

Figure 209:
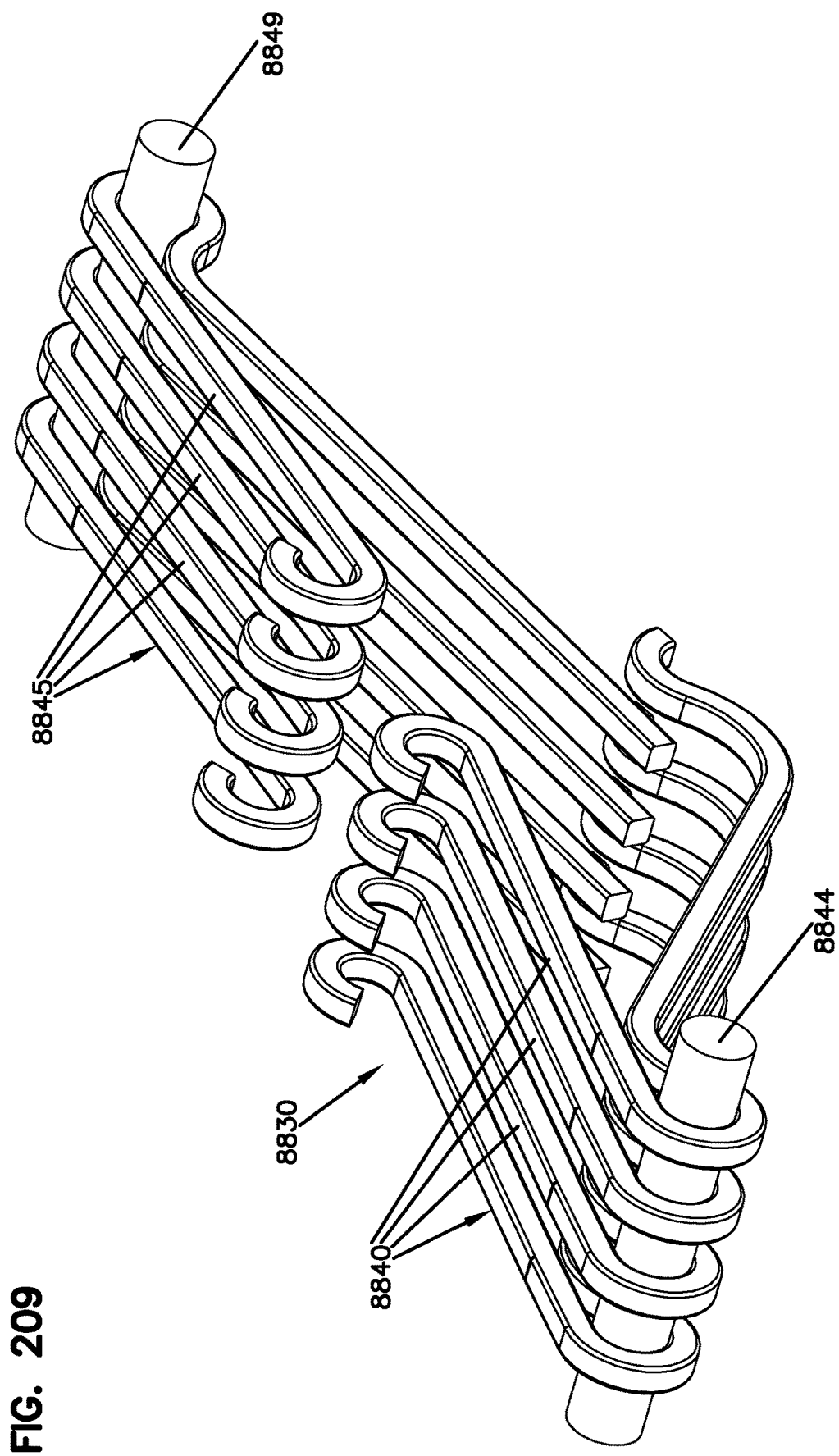

As shown in FIGS. 209-211, one or more contact pairs 8831 are positioned onto rods 8244, 8849 to align the contact pairs 8831 in a media reading interface 8830. For example, the first contact members 8840 may be positioned on a first rod 8844 and the second contact members 8845 may be positioned on a second rod 8849. In certain implementations, the first rod 8844 extends parallel to the second rod 8849. When the contact pairs 8831 are positioned on the rods 8844, 8849, the media reading interface 8830 may be positioned in the adapter 8810 as a modular unit (see FIG. 207).

In some implementations, each contact pair 8831 is retained within a separate slot 8812. For example, in the implementation shown in FIG. 207, the media reading interface 8830 is mounted at an adapter 8810 by aligning the contact pairs 8831 with the slots 8812 of a set 8811 and inserting the first rod 8844 into the first channel 8814 and the second rod 8849 into the first channel 8815. The media reading interface 8830 is positioned so that an intermediate wall 8813 extends between adjacent contact pairs 8831. In other implementations, all of the contact pairs 8831 in a single media reading interface 8830 may be retained in a single slot 8812.

Figure 212:
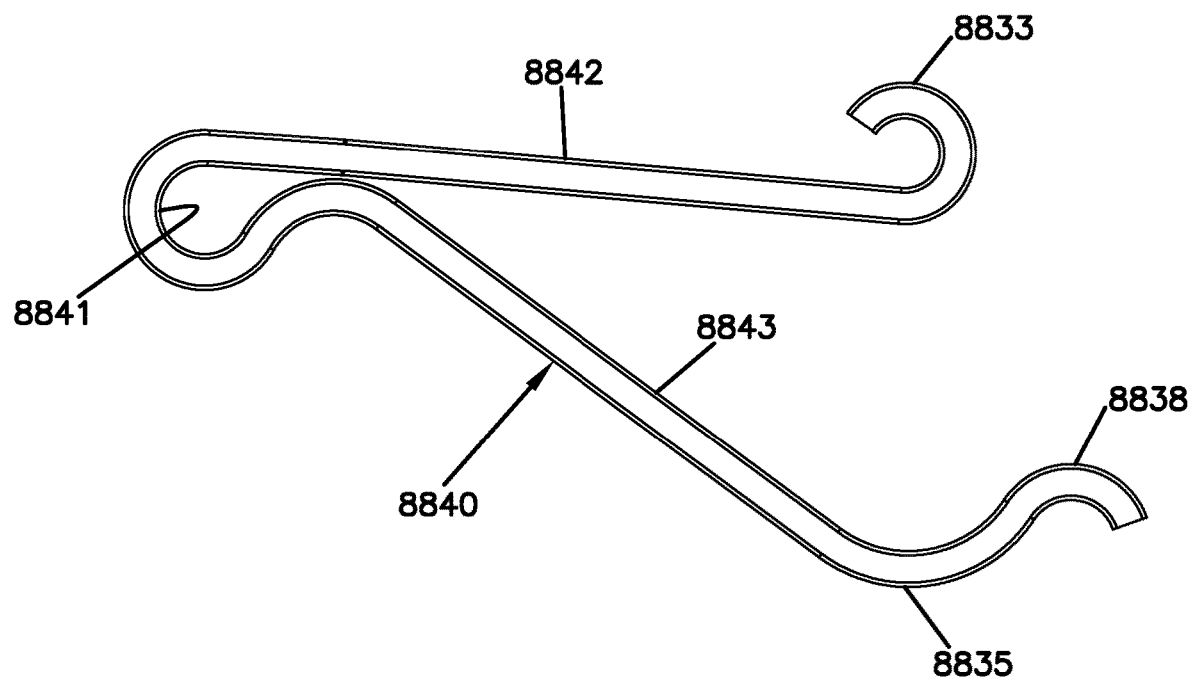

FIG. 212 illustrates one example implementation of a first contact member 8840 of an example contact pair 8831. The first contact member 8840 includes a loop section 8841 that is configured to be positioned around the first rod 8844. A first arm 8842 extends from the loop section 8841 to define a first contact section 8833 that is configured to swipe, abut, or otherwise engage a contact pad or tracing on the printed circuit board 8820. A second arm 8843 extends from the loop section 8841 to define a second contact section 8835 that is configured to swipe, abut, or otherwise engage one of the contact pads 8731 of a storage device 8730 of a connector arrangement 8700 received at the adapter 8810. The second arm 8843 also defines a first engagement section 8838.

Figure 213:
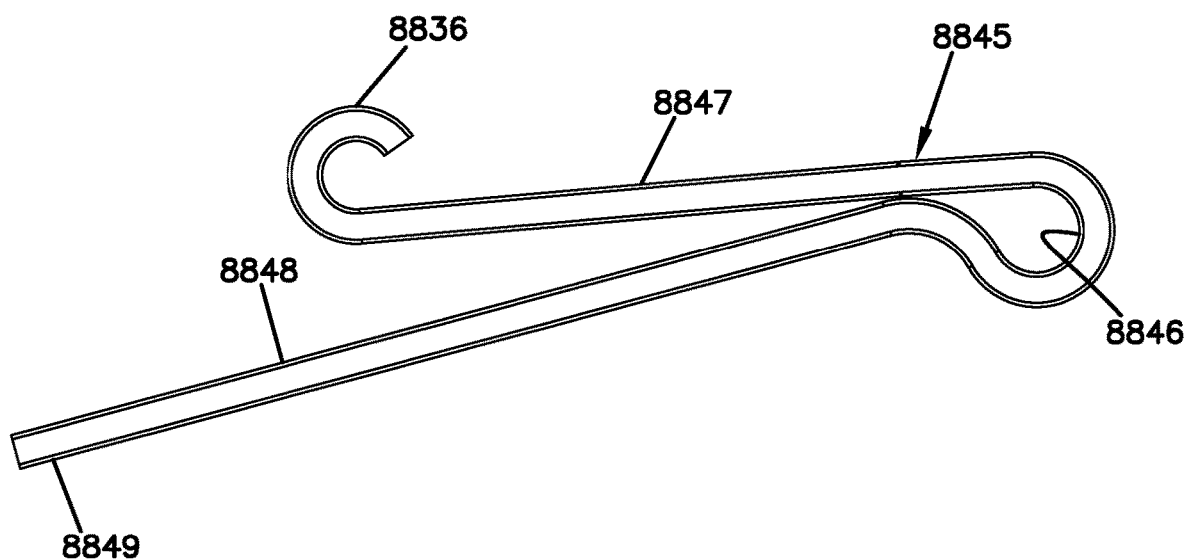

FIG. 213 illustrates one example implementation of a second contact member 8845 of an example contact pair 8831. The second contact member 8845 includes a loop section 8846 that is configured to be positioned around the second rod 8849. A first arm 8847 extends from the loop section 8846 to define a third contact section 8836 that is configured to swipe, abut, or otherwise engage a contact pad or tracing on the printed circuit board 8820. A second arm 8848 extends from the loop section 8846 to define a second engagement section 8839 that is configured to selectively touch the first engagement section 8838 of the first contact member 8840 of the pair 8831.

In some implementations, the first engagement section 8838 is formed on an opposite surface from the second contact section 8835 and the second engagement section 8839 is formed on a bottom-most surface of the second contact member 8845. In other implementations, the second leg 8840 of the first contact member 8840 includes a tail on which the first engagement section 8838 is defined. The tail extends from the second contact section 8835 to a distal tip. In certain implementations, the tail is curved in a different (e.g., generally opposite) direction than the second contact section 8835. For example, the second contact section 8835 may be curved away from the second contact member 8845 and the tail may be curved towards the second contact member 8845.

In some implementations, each contact member 8840, 8845 is formed from coil stock or other such material. For example, in some implementations, each contact member 8840, 8845 may be manufactured by bending coil stock springs. In certain implementations, each contact member 8840, 8845 is formed from round coil stock. In certain implementations, each contact member 8840, 8845 is formed from square coil stock. In other implementations, each contact member 8840, 8845 is formed from another type of coil stock (e.g., coil stock having an ovoid, rectangular, triangular, or other shaped transverse cross-section).

In some implementations, the contact members 8840, 8845 have substantially continuous thicknesses T6 (FIG. 211). In various implementations, the thickness T6 ranges from about 0.05 inches (about 1.27 mm) to about 0.005 inches (about 0.127 mm). In certain implementations, the thickness T6 is less than about 0.02 inches (about 0.51 mm). In some implementation, the thickness T6 is less than about 0.012 inches (about 0.305 mm). In another implementation, the thickness T6 is about 0.01 inches (about 0.25 mm). In another implementation, the thickness T6 is about 0.009 inches (about 0.229 mm). In another implementation, the thickness T6 is about 0.008 inches (about 0.203 mm). In another implementation, the thickness T6 is about 0.007 inches (about 0.178 mm). In another implementation, the thickness T6 is about 0.006 inches (about 0.152 mm). In other implementations, the thickness may vary across the length of the contact members 8840, 8845.

In general, the width of each set 8811 of slots 8812 is smaller than the width of the key 8715 of a connector 8700 positioned in the respective adapter port 8803, 8804. In some implementations, the width of each set 8811 of slots 8812 is less than 3.35 mm (0.13 inches). Indeed, in some implementations, the width of each set 8811 of slots 8812 is less than about 3.1 mm (0.12 inches). In certain implementations, the width of each set 8811 of slots 8812 is no more than about 2.5 mm (0.10 inches). In one example implementation, the width of each set 8811 of slots 8812 is no more than 2.2 mm (0.09 inches).

In certain implementations, the width of the intermediate walls 8813 is smaller than the width of the slots 8812. In some implementations, the width of each slot 8812 is within the range of about 0.25 mm (0.010 inches) to about 0.64 mm (0.025 inches). Indeed, in some implementations, the width of each slot 8812 is within the range of about 0.38 mm (0.015 inches) to about 0.48 mm (0.019 inches). In one implementation, the width of each slot 8812 is about 0.43-

0.44 mm (0.017 inches). In one implementation, the width of each slot 8812 is about 0.41-0.42 mm (0.016 inches). In one implementation, the width of each slot 8812 is about 0.45-0.46 mm (0.018 inches). In some implementations, the width of each intermediate wall 8813 is within the range of about 0.13 mm (0.005) inches to about 0.18 mm (0.007 inches). In one implementation, the width of each intermediate wall 8813 is about 0.15 mm (0.006 inches).

Figure 214:
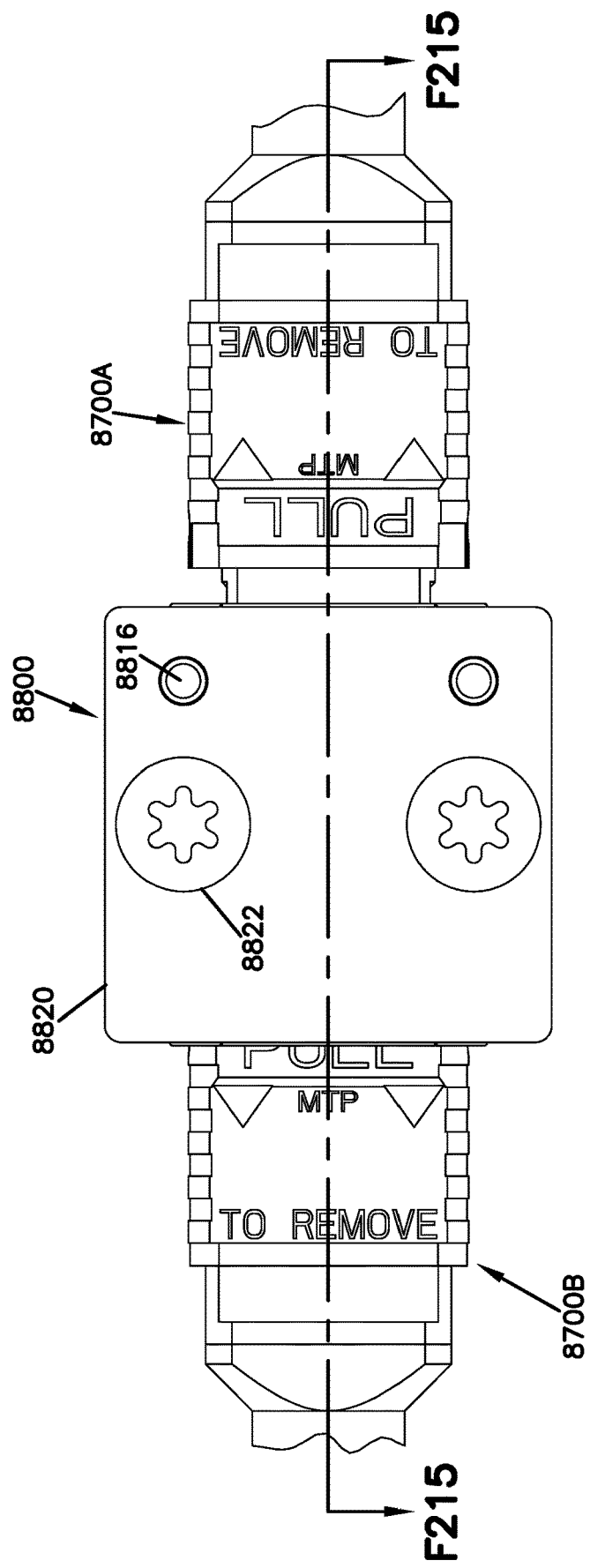
Figure 215:
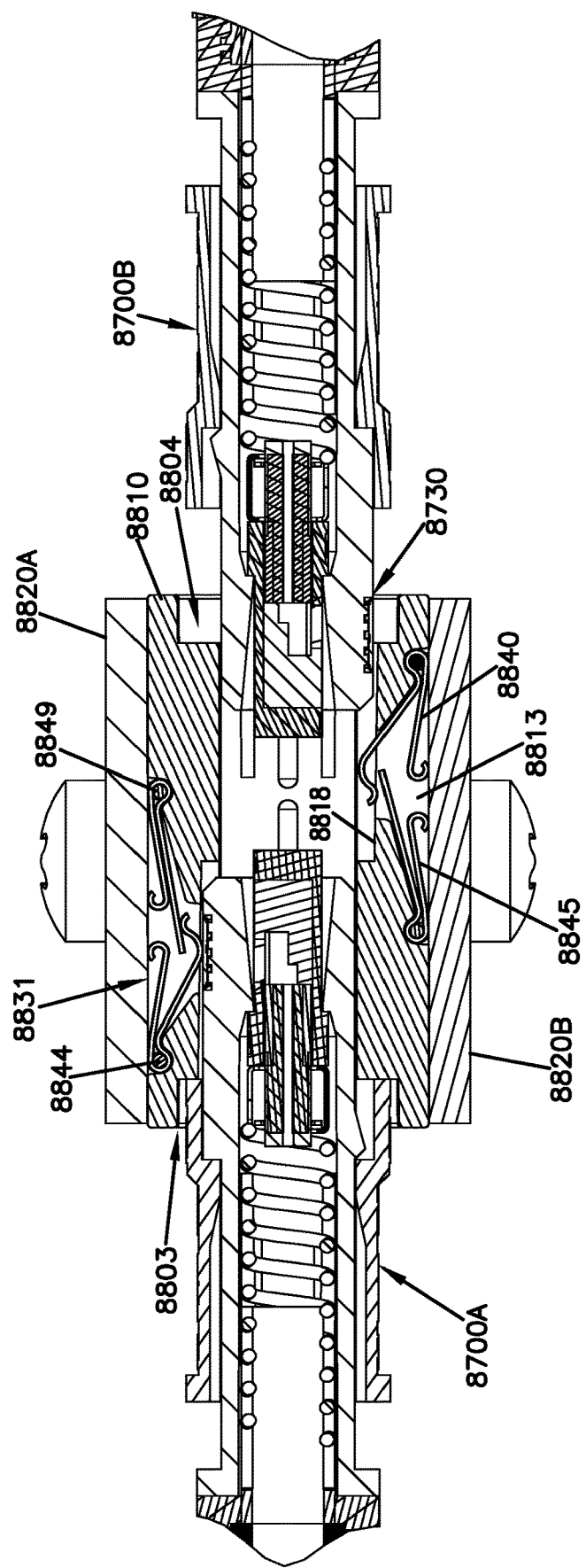

FIG. 214 is a top plan view of an adapter assembly 8800 having a connector arrangements 8700A fully received at the left side of the adapter 8810 and another connector arrangement 8700B partially received at the right side of an adapter 8810. FIG. 215 is a cross-sectional view of FIG. 214 showing the fully received connector arrangement 8700A and the partially received connector arrangement 8700B. In the example shown, each of the connectors 8700A, 8700B includes a storage device 8730. In other implementations, only one of the connectors 8700A, 8700B includes a storage device 8730.

The MPO adapter housing 8810 defines a passage 8805 extending between a front port 8803 and a rear port 8804. The adapter housing 8810 is sandwiched between the first example circuit board 8820A and the second example circuit board 8820B via fasteners 8822. A first contact pair 8831 is shown in one of the slots 8812 defined in the top 8802 of the adapter 8810 and a second contact pair 8831 is shown in one of the slots 8812 defined in the bottom 8802 of the adapter 8810. The first rod 8844 of each pair is retained within the first connection channel 8814 of each end 8802 and each second rod 8849 is retained within the respective second connection channel 8815. An intermediate wall 8813 blocks an adjacent contact pair 8831 from view in each case.

In the example shown, a top of each contact pair 8831 faces the circuit board 8820 and a bottom of each contact pair 8831 faces the passage 8805. As used herein, the terms "top" and "bottom" are not meant to imply a proper orientation of the contact pair 8831 or that the top of the contact pair 8831 must be located above the bottom of the contact pair 8831. Rather, the terms are used for ease in understanding and are assigned relative to the viewing plane of FIG. 215. The contact pairs 8831 also extend between first and second sides. For example, the first pin 8844 may define the first side and the second pin 8849 may define the second side.

The first moveable contact section 8833 is configured to extend through the slot 8812 and engage the circuit board 8820. The third moveable contact section 8836 also is configured to extend through the slot 8812 and engage the circuit board 8820. The ability of the first and third contact sections 8833, 8836 to flex relative to the rods 8844, 8849 provides tolerance for placement of the contact pairs 8831 relative to the circuit board 8820. In one implementation, the first contact section 8833 and/or the second contact section 8836 may provide grounding for the contact pair 8831 through the circuit board 8820.

The second moveable contact section 8835 is configured to extend into a respective one of the key channels 8818 and to engage the connector arrangement 8700 (e.g., a key 8715 of the connector arrangement) positioned in the keying channel 8818. In the example shown, the second arm 8843 of the first contact member 8840 initially extends generally along the first support wall 8816 and the second arm 8848 of the second contact member 8845 initially extends generally along the second support wall 8817 (see the second contact pair 8831 in FIG. 215). The intermediate wall 8813 and the support surfaces 8816, 8817 end at the keying channel 8818. The second contact section 8835 of each contact pair 8831 extends through gap between the support surfaces 8816, 8817 to be positioned in the keying channel 8818 (see the second contact pair 8831 in FIG. 215).

In the example shown, the first contact sections 8833 and the third contact sections 8836 engage contact pads on the circuit boards 8820 even when a connector arrangement 8700 is not positioned within a respective port 8815. In other implementations, however, one or both of the contact sections 8833, 8836 may be spaced from the respective circuit board 8820 when the respective port 8803, 8804 is empty. The first engagement section 8838 is spaced from the second engagement section 8839 when a connector arrangement 8700 is not positioned within a respective port 8815 (see the second contact pair 8831 of FIG. 215).

Figure 216:
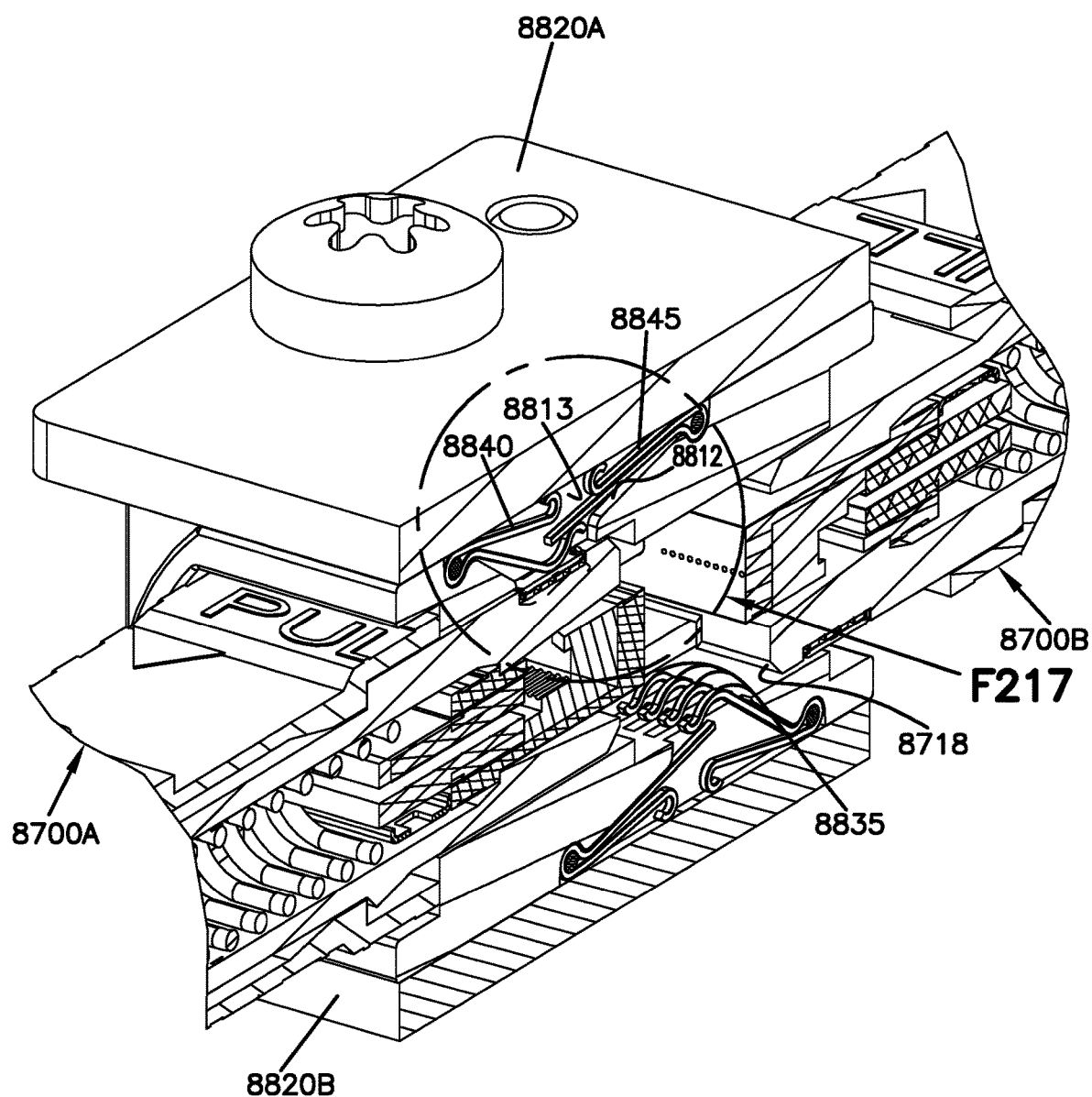
Figure 217:
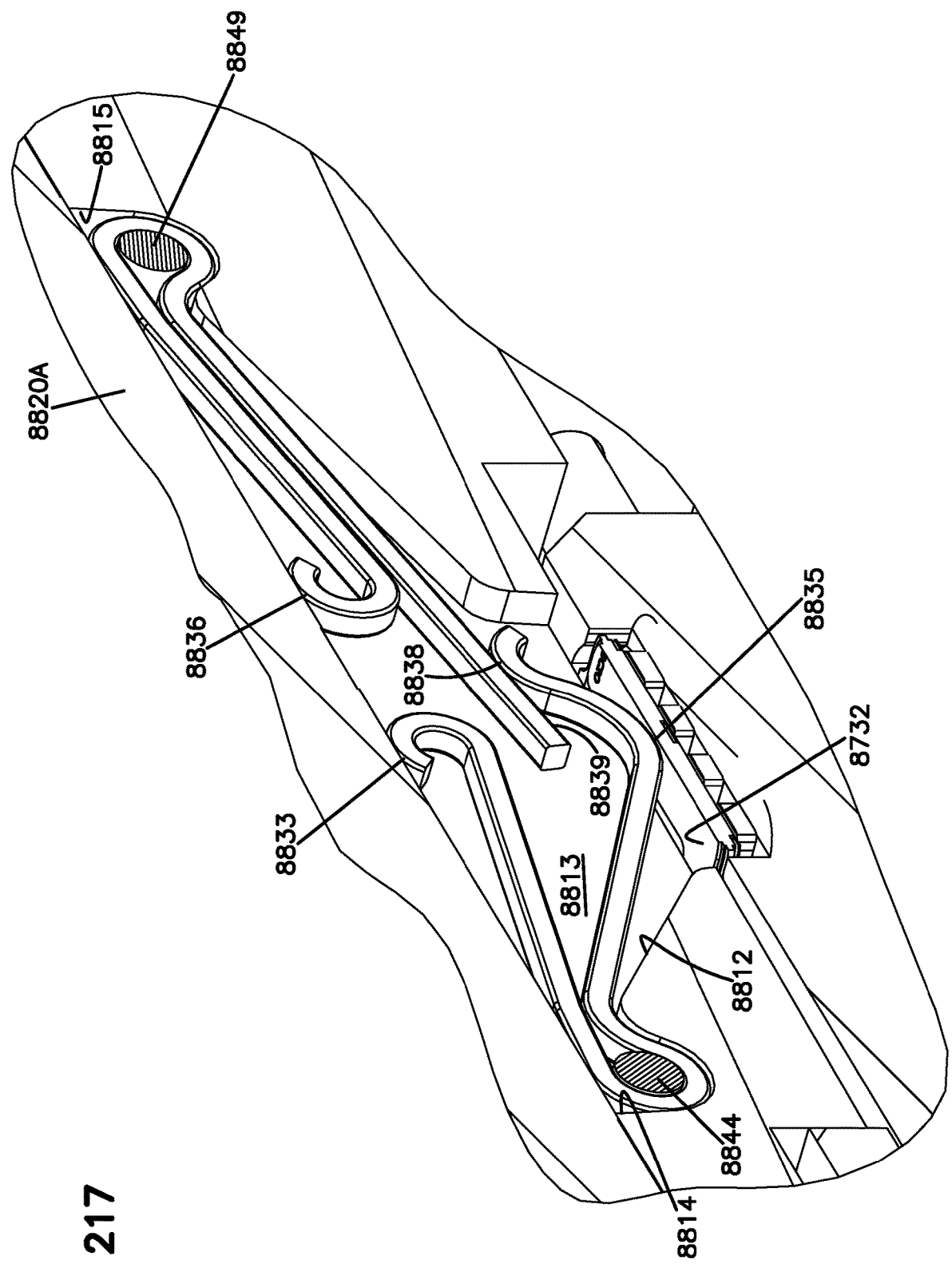

As shown in FIGS. 215-217, inserting a connector arrangement 8700 into the passage 8805 biases the first contact member 8840 toward the second contact member 8845. For example, the front surface 8718 of the key 8715 of the connector arrangement 8700 may push against the second contact section 8835 of the contact pair 8831 when the connector arrangement 8700 is inserted into a port 8803, 8804. In some implementations, the key 8715 pushes the second contact section 8835 upwardly towards the second contact member 8845.

In certain implementations, biasing the first contact member 8840 causes the first engagement section 8838 to abut, swipe, or otherwise touch the second engagement section 8839 to complete the electrical pathway between the two contact members 8840, 8845. For example, pushing the second contact section 8835 may cause the first engagement section 8838 to move (e.g., lift) towards the second engagement section 8839. In some implementations, inserting the connector arrangement 8700 also may bias the first contact section 8833 and/or the second contact section 8836 into engagement with the circuit board 8820. In other implementations, inserting the connector arrangement 8700 may increase the force of engagement between the first and third contact sections 8833, 8836 and the circuit board 8820.

As shown in FIG. 215, when a connector 8700A with a storage device 8730 is fully inserted into the passage 8805, the contact pads 8732 of the storage device 8730 are configured to align with the slots 8812 defined in the adapter housing 8810. Accordingly, the contact pairs 8831 held within the slots 8812 align with the contact pads 8732 of the respective connector arrangement 8700 to connect the contact pads 8732 to the contact pads 8824, 8826 on the respective printed circuit board 8820 mounted to the adapter 8810 (see FIGS. 215-217). Data may be transferred from the storage device 8730 to the circuit board 8820 when the contact pairs 8831 complete a circuit between the storage device 8730 and the circuit board 8820. The circuit is complete when the first contact member 8840 contacts the second contact member 8845 to create a continuous electrical pathway between the contact pads 8824, 8826 of the circuit board 8820.

Referring now to FIGS. 218-261, in accordance with some aspects, multiple contact elements may be stacked or layered together to form a layered media reading interface. Each layered media reading interface fits within a single slot in a surface of an optical adapter. Layered media reading interfaces may be used in any of the coupler assemblies disclosed herein by substituting a single opening for each set of slots. To aid understanding, non-limiting example implementations of layered media reading interfaces are provided herein.

Some implementations of layered media reading interfaces include loose contact arrangements. Loose contact arrangements include a collection of contact elements and spacers positioned next to each other without being fastened or otherwise secured to one another. Rather, the loose collection of contact elements and spacers are inserted within an adapter opening and maintained in position by the bounding walls of the adapter opening. For example, the contact elements and spacers may be held together manually until these components have been inserted.

Other implementations of layered media reading interfaces include bounded contact arrangements. Bounded contact arrangements include contact elements and spacers clamped or otherwise held together. For example, the contact elements and spacers may be held between two end pieces, pinned together, glued together, or otherwise fastened together. The bounded contact arrangement may be inserted as a single module into an adapter opening.

Still other implementations of layered media reading interfaces include framed contact arrangements. Framed contact arrangements include one or more contact elements positioned within a spacer housing. A spacer housing with the contact elements inside may be inserted as a single module into an adapter opening. The spacer housing generally defines one or more slots separated by one or more spacer walls. At least some portions of each slot extend to ledges on which the contact elements seat within the spacer housing. Other portions of the slots extend completely through the spacer housing to provide access to the contact elements.

For ease in understanding in the following description, the contact element 4231 disclosed above with reference to FIG. 119 will be shown incorporated into various layered media reading interfaces. However, any of the contact elements 5231, 4231, 3231, 2231, 2231', 1231, 1231' disclosed above may be suitable for use in any of the layered contact arrangements. In still other implementations, other types of contact elements may be used to form layered media reading interfaces.

Figure 218:
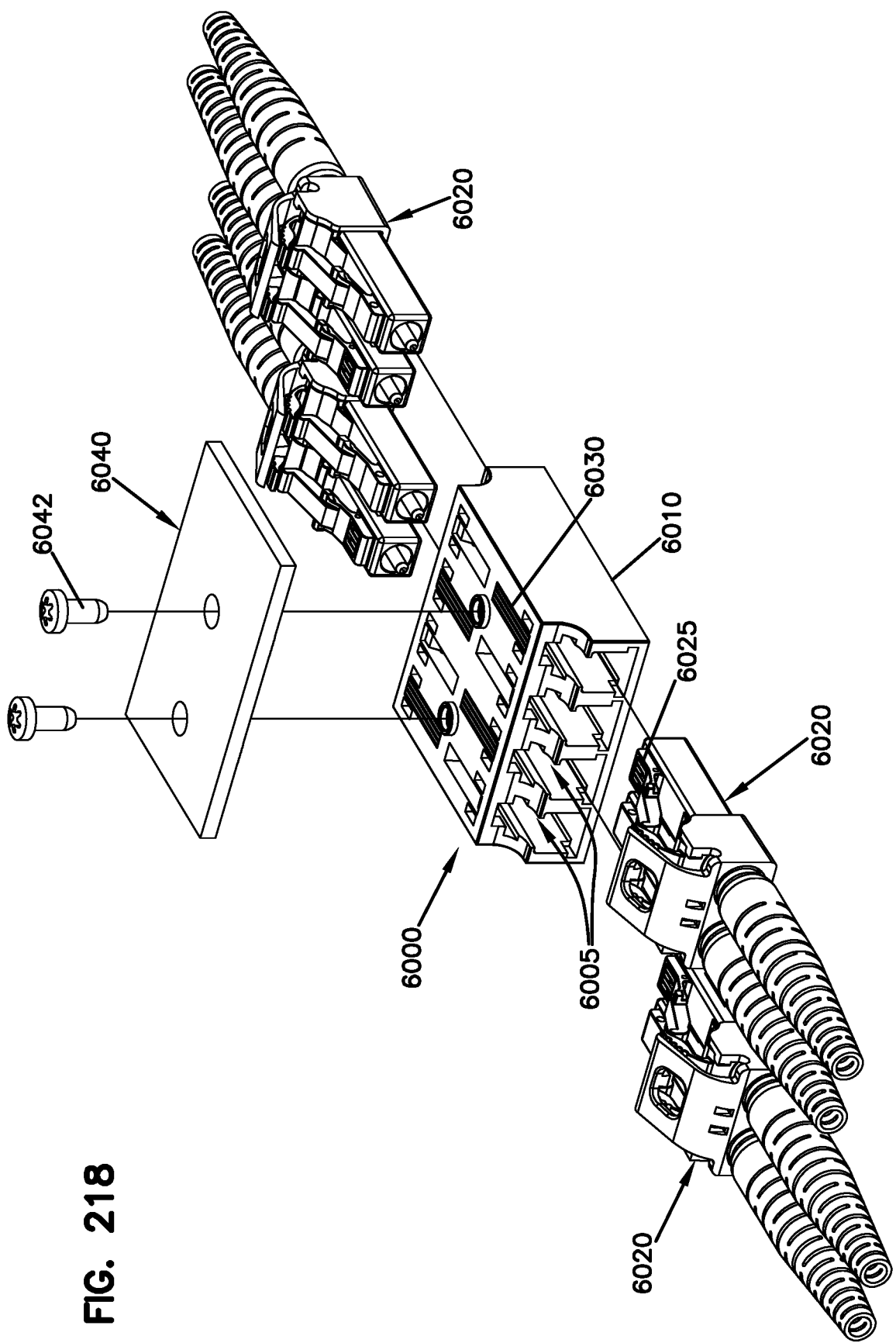
FIGS. 218-224 illustrate a twelfth example implementation of a connector system that can be utilized on a connector assembly having PLI functionality as well as PLM functionality in accordance with aspects of the present disclosure.

FIGS. 218-224 show one example implementation of a loosely layered contact arrangement. FIG. 218 illustrates a connection assembly 6000 including an adapter 6010 configured to connect at least a first optical connector to at least a second optical connector. The adapter 6010 includes two side walls 6003 extending between top and bottom end walls 6004. Passages extend parallel with the side walls 6003 between ports 6005 at the first and second sides 6001, 6002 of the adapter 6010.

In the example shown, the adapter 6010 includes four ports 6005 at the first side 6001 and four ports 6005 at the second side 6002 for receiving optical connectors. In other implementations, each side 6001, 6002 of the adapter 6010 may have greater or fewer ports 6005. In the example shown, each port 6005 is configured to receive an LC-type optical connector. In other implementations, however, the ports 6005 may be configured to receive other types of optical connectors (e.g., SC-type, ST-type, MPO-type, LX.5-type, etc.).

In some implementations, one or more openings 6006 to receive the contact arrangements 6020 are defined at a first end (e.g., top) wall 6004 of the housing. In other implementations, the one or more openings 6006 may be defined in both end walls 6004. Each opening 6006 extends between the end wall 6004 and one of the passages within the adapter 6010. Each opening 6006 is associated with one of the ports 6005 defined by the adapter 6010. In some implementations, two openings 6006 are provided in a single end wall 6004 per passage. In other implementations, one opening 6006 is provided in each end wall 6004 per passage.

Figure 219:
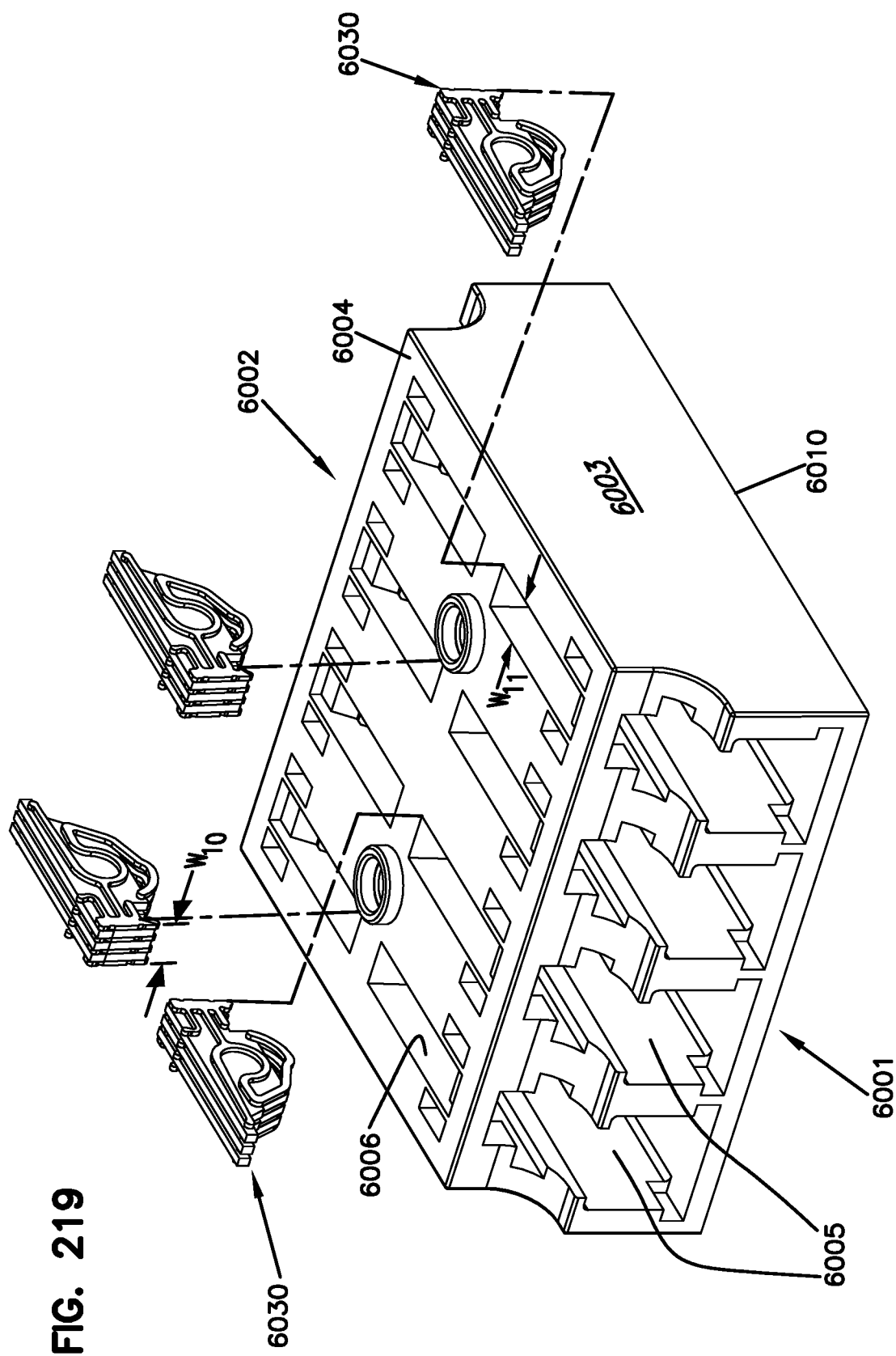

FIG. 219 illustrates loosely layered contact arrangements 6030 to be inserted in the openings 6006 defined in the adapter 6010. Each loosely layered contact arrangement 6030 includes one or more contact elements 6031. Portions of the contact elements 6031 engage contact pads on the printed circuit board 6040 mounted to the adapter surfaces 6004. Other portions of the contact elements 6031 engage the electrical contacts of the storage member 6025 attached to connector arrangements 6020 positioned in the passages 6205. A processor coupled to one or both of the circuit boards 6040 can access the memory of each connector arrangement 6020 through the corresponding media reading interface 6030.

In some implementations, each opening 6006 may receive a loosely layered contact arrangement 6030. For example, the adapter 6010 may be configured to receive a monoplex (i.e., simplex) optical connector at each port 6005, each of which may be read by one of the loosely layered contact arrangements 6030. In other implementations, however, only some of the openings 6006 receive loosely layered contact arrangements 6030. For example, the adapter 6010 may be configured to receive duplex optical connectors. Accordingly, a loosely layered contact arrangement 6030 is provided at alternate ports 6005 so that only one contact arrangement 6030 is associated with each duplex optical connector.

Figure 220:
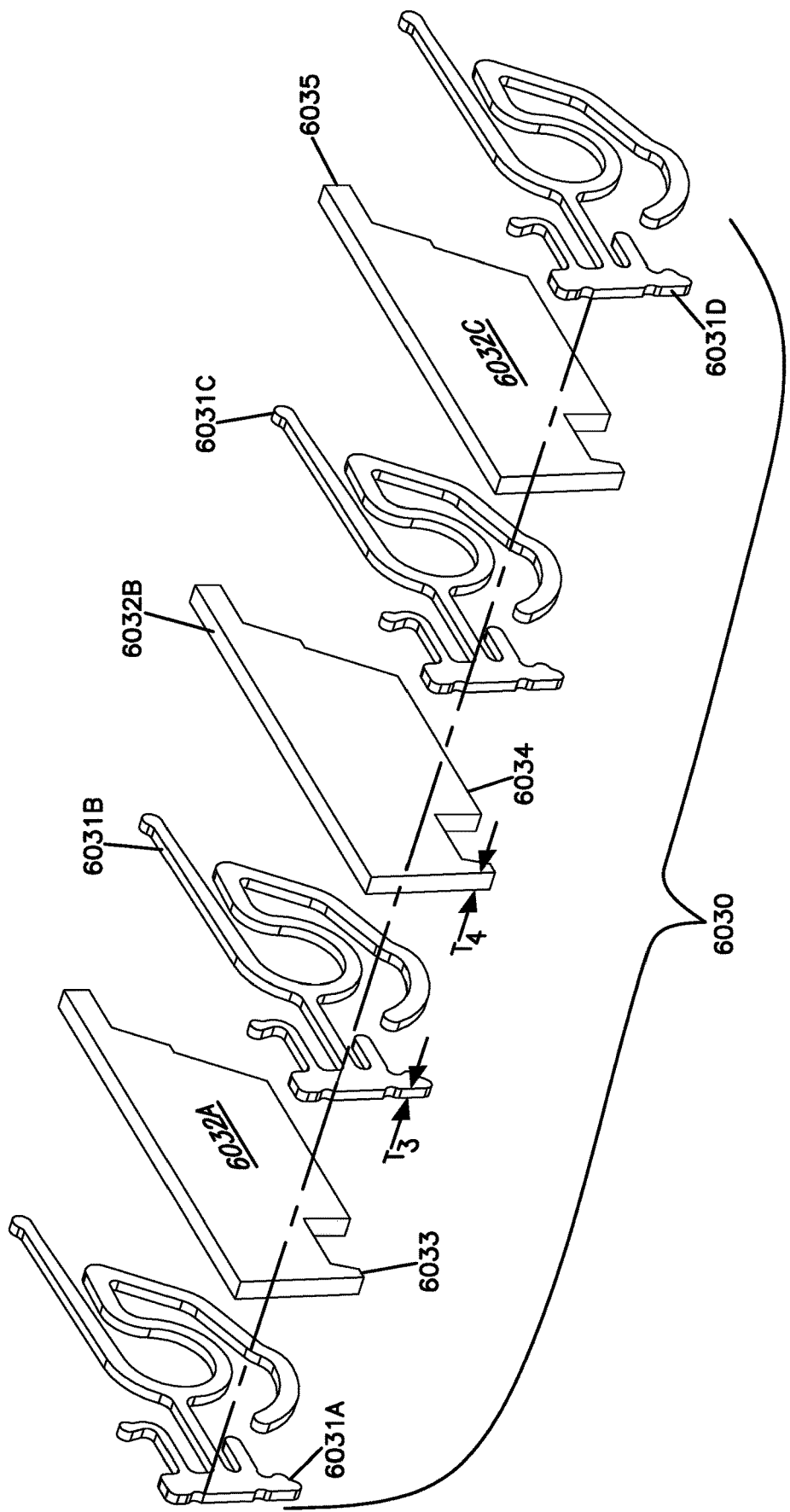

FIG. 220 is an exploded view of one example loosely layered contact arrangement 6030 suitable for use as a media reading interface in an optical adapter 6010. The layered contact arrangement 6030 includes one or more spacers 6032 separating a plurality of contact elements 6031. In some implementations, the spacers 6032 are sandwiched between contact elements 6031. In other implementations, the contact elements 6031 are sandwiched between the spacers 6032.

For example, the example loosely layered contact arrangement 6030 shown in FIG. 220 includes a first spacer 6032A positioned between a first contact element 6031A and a second contact element 6031B; a second spacer 6032B positioned between the second contact element 6031B and a third contact element 6031C; and a third spacer 6032C positioned between the third contact element 6031C and a fourth contact element 6031D. In other implementations, the layered contact arrangement 6030 may include additional spacers 6032 on the outsides of the arrangement 6030.

Generally, the spacers 6032 can be used in place of adapter intermediate walls to separate contact elements 6031. The spacers 6032 inhibit physical touching of adjacent contact elements 6031. The spacers 6032 also inhibit electrical connections between adjacent contact elements 6031. The contact elements 6031 and spacers 6032 are not bonded or otherwise secured together. Rather, the components of the loosely layered contact arrangement 6030 are loosely assembled together and inserted into an adapter opening 6006. The bounding walls of the opening 6006 maintains the loosely layered contact arrangement 6030 in its assembled state.

Each loosely layered contact arrangement 6030 has a width W10 and each slot 6006 has a width W11 (FIG. 219). In general, the width W10 of each contact arrangement 6030 is smaller than the width of a key of a connector (e.g., key 4115 of FIGS. 104-111) positioned in the respective adapter passage 6005. The width W11 of each adapter slot 6006 is sufficiently large to receive one contact arrangement 6030. The width W11 of each adapter slot 6006 may be sufficiently small to hold the spacers 6032 and contact elements 6031 together. In some implementations, the width W10 of each contact arrangement 6030 is less than 3.35 mm (0.13 inches). Indeed, in some implementations, the width W10 of each contact arrangement 6030 is less than about 3.1 mm (0.12 inches). In certain implementations, the width W10 of each contact arrangement 6030 is no more than about 2.5 mm (0.10 inches). In one example implementation, the width W10 of each contact arrangement 6030 is no more than 2.2 mm (0.09 inches).

In the example shown in FIG. 220, each contact element 6031 of the loosely layered contact arrangement 6030 defines two opposing planar sides connected by a peripheral edge having a thickness T3. In various implementations, the thickness T3 of each contact element 6031 ranges from about 1.27 mm (0.05 inches) to about 0.127 mm (0.005 inches). In certain implementations, the thickness T3 is less than about 0.51 mm (0.02 inches). In some implementation, the thickness T3 is less than about 0.3 mm (0.012 inches). In another implementation, the thickness T3 is about 0.25 mm (0.01 inches). In another implementation, the thickness T3 is about 0.23 mm (0.009 inches). In another implementation, the thickness T3 is about 0.2 mm (0.008 inches). In another implementation, the thickness T3 is about 0.18 mm (0.007 inches). In another implementation, the thickness T3 is about 0.15 mm (0.006 inches). In other implementations, the thickness T3 may vary across the body of the contact member 6031.

Each spacer 6032 of the loosely layered contact arrangement 6030 defines two opposing planar sides connected by a peripheral edge having a thickness T4. In some implementations, each spacer 6032 is sufficiently thick to inhibit electrical contact between adjacent contact elements 6031 while enabling the contact arrangement 6030 to fit within the adapter slot 6006. For example, each spacer 6032 may be sufficiently thick to space adjacent contact elements 6031 about 0.58 mm (0.02 inches) center to center. In various implementations, the thickness T4 of each spacer 6032 is within the range of about 0.1 mm (0.004) inches to about 0.54 mm (0.018 inches). Indeed, in some implementations, the thickness T4 of each spacer 6032 is within the range of about 0.12 mm (0.005) inches to about 0.18 mm (0.007 inches). In one implementation, the thickness T4 of each spacer 6032 is about 0.15 mm (0.006 inches). Indeed, in other implementations, the thickness T4 of each spacer 6032 is within the range of about 0.25 mm (0.010 inches) to about 0.41 mm (0.016 inches). In one implementation, the thickness T4 of each spacer 6032 is about 0.38 mm (0.015 inches).

In some implementations, the peripheral edge of the spacer 6032 generally defines a rectangular shape. In other implementations, the peripheral edge of each spacer 6032 has an irregular shape. For example, the peripheral edge may be shaped so that the spacer 6032 extends only between portions of adjacent contact elements 6031. In the example shown in FIG. 220, each spacer 6032 includes a base portion 6033, a first extension 6034, and a second extension 6035. The base portion 6033 extends between and separates the bases of adjacent contact elements 6031 (e.g., bases 4232 of contact element 4231 of FIG. 119). In some implementations, the base portion 6033 of each spacer 6032 is configured to mount to the support wall of the adapter with the base of the contact element 6031 (see FIG. 221).

Figure 221:
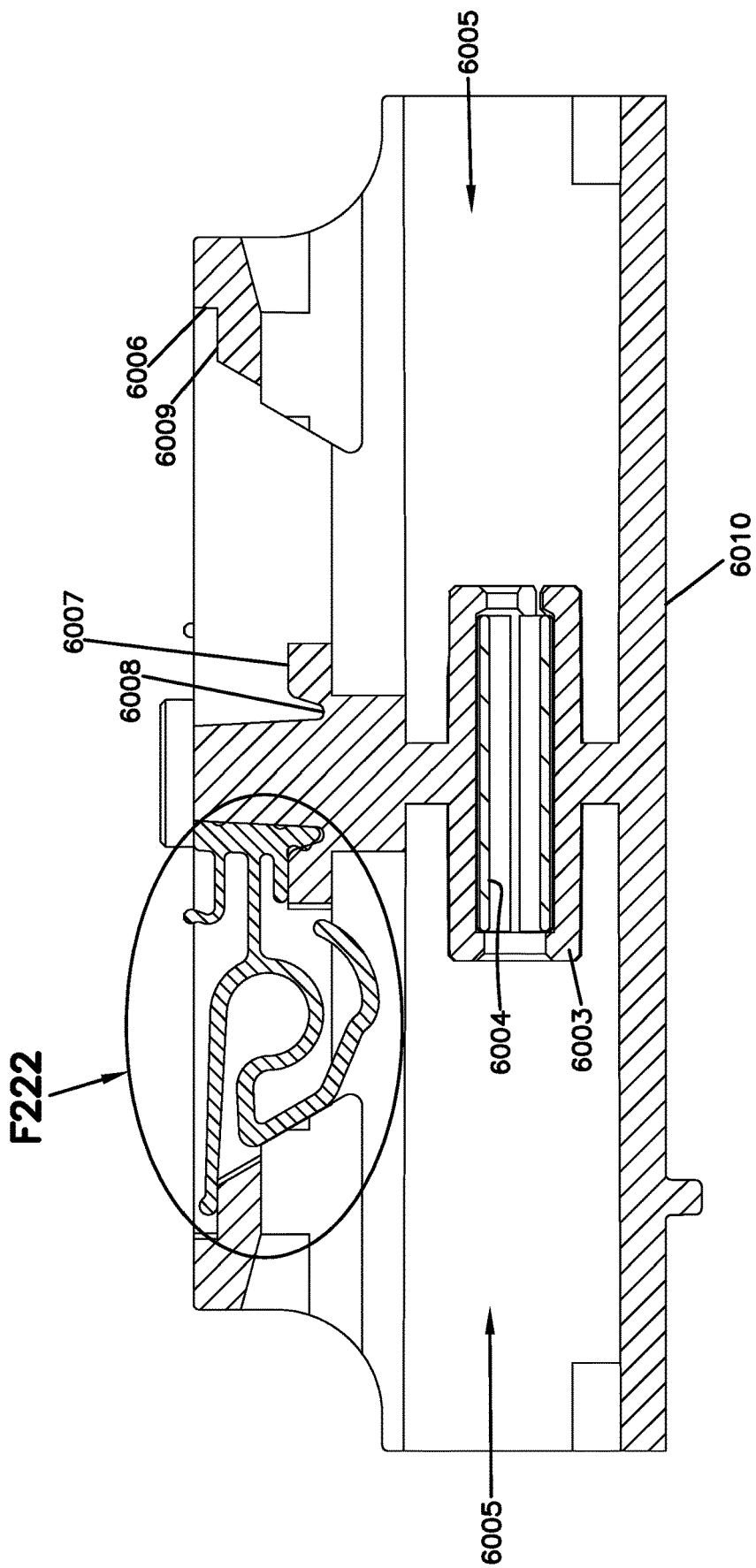
Figure 222:
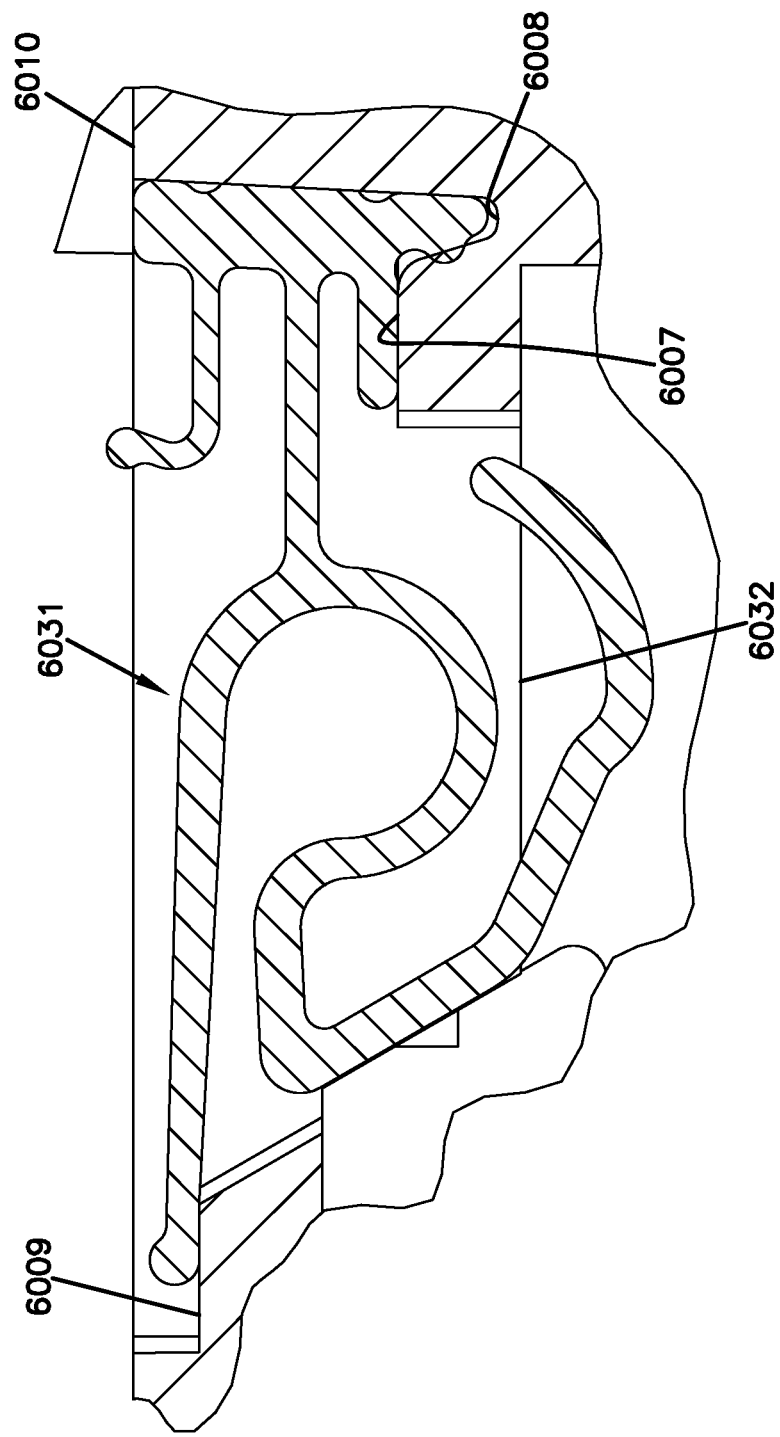
Figure 223:
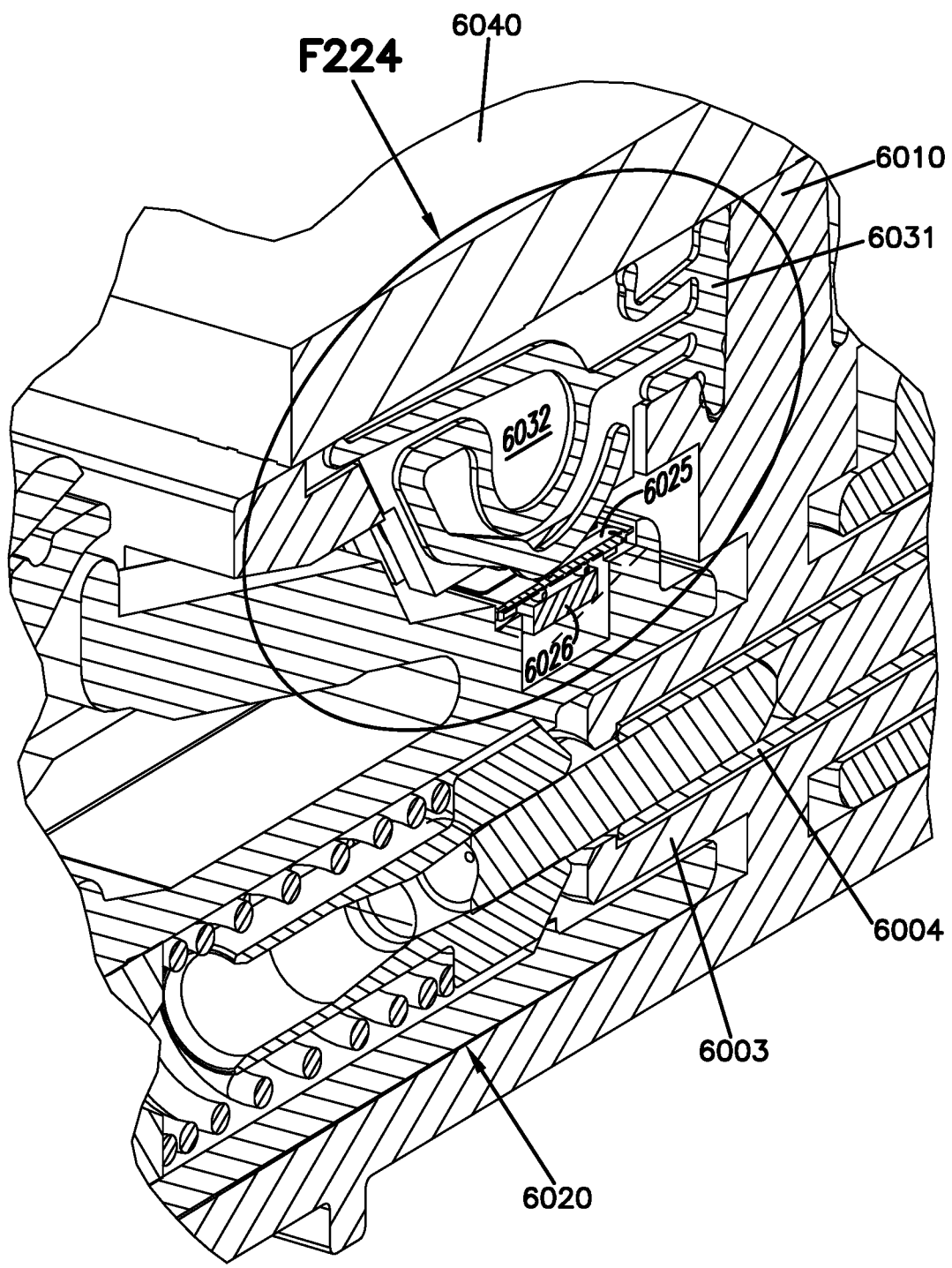
Figure 224:
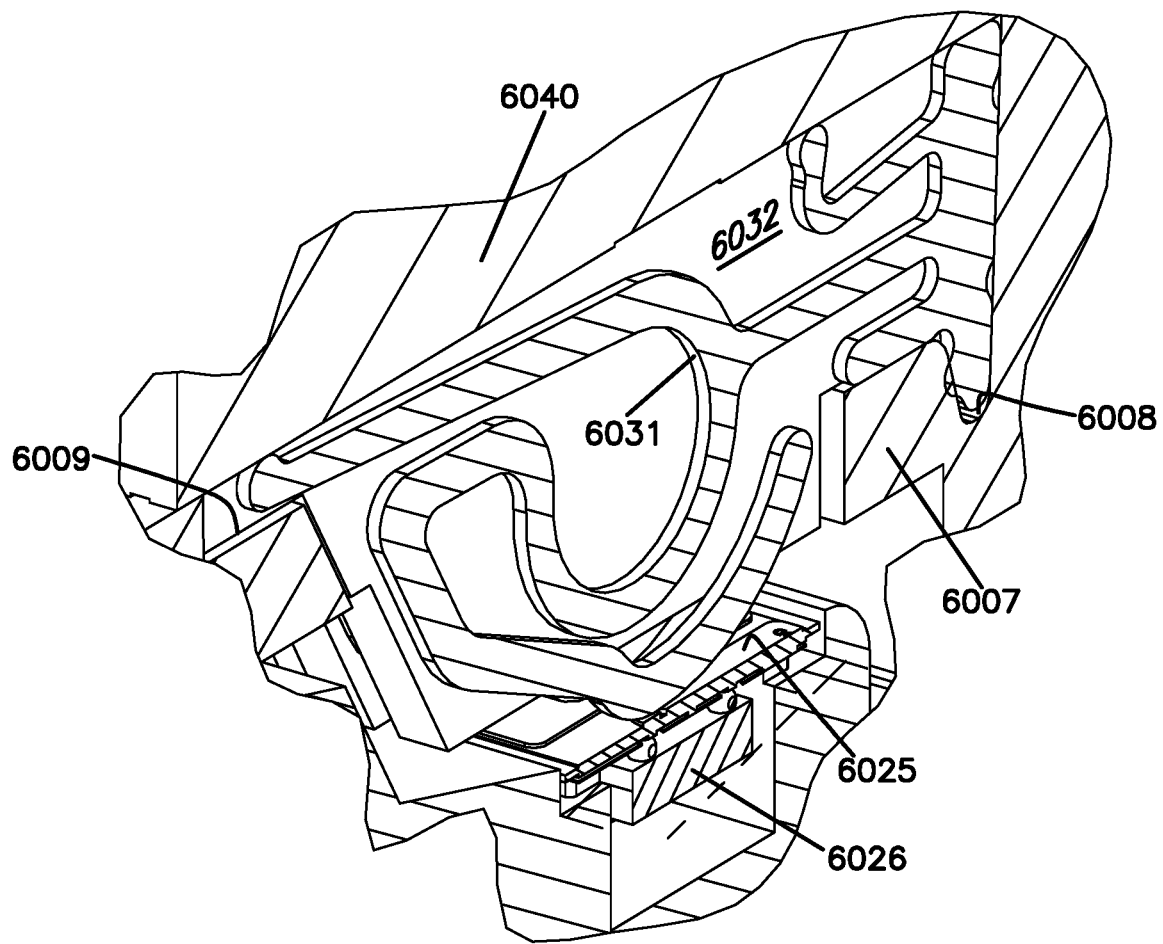
Figure 225:
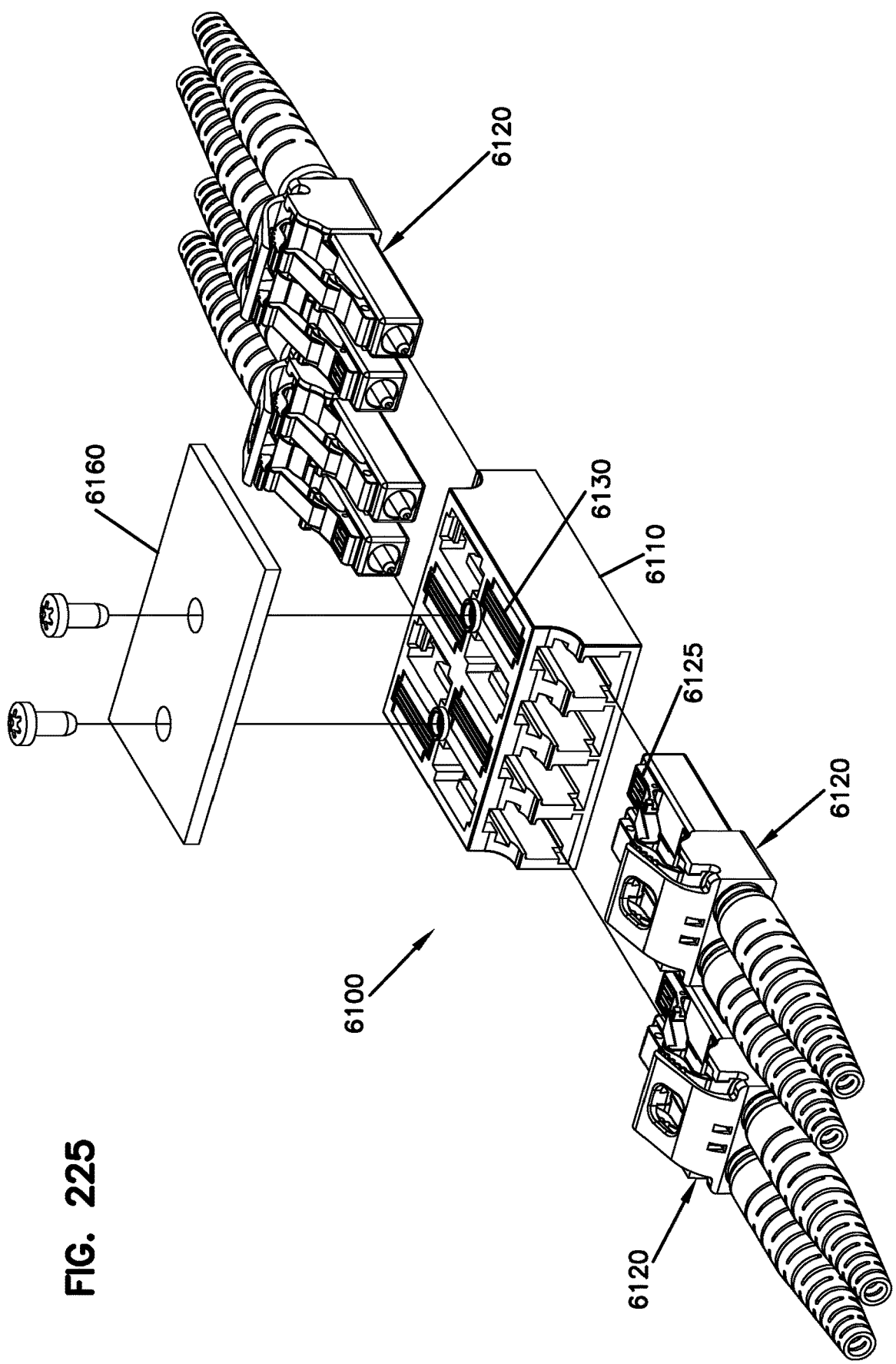
FIGS. 225-242 illustrate a thirteenth example implementation of a connector system that can be utilized on a connector assembly having PLI functionality as well as PLM functionality in accordance with aspects of the present disclosure.

The first extension 6034 extends between and separates the third contact surfaces of adjacent contacts elements 6031 (e.g., third contact surfaces 4236 of contact elements 4231). In some implementations, the first extension 6034 maintains the separation of the third contact surfaces as the third contact surfaces move between flexed and unflexed positions (e.g., as connectors are inserted into and removed from the adapter 6010). In certain implementations, the first extension 6034 is sufficiently thick so as to extend between the third contact surfaces in both the flexed and unflexed positions (e.g., compare FIGS. 222 and 224). As shown in FIG. 221, in some implementations, the first extension 6034 of each spacer 6032 is configured to seat on the ledge of the adapter (e.g., ledge 4219 of adapter 4200 shown in FIG. 121A).

The second extension 6035 separates the second contact surfaces of adjacent contacts elements 6031 (e.g., second contact surfaces 4235 of contact elements 4231). In some implementations, the second extension 6035 does not extend between the second contact surfaces, but rather extends sufficiently between the contact elements so as to inhibit sideways flexing of the second contact surfaces (e.g., see FIGS. 221-224). In general, the second extension 6035 is sufficiently short to enable optical connectors access to the second contact surfaces. In certain implementations, the second extension 6035 is sufficiently short to enable optical connectors access to the second contact surfaces after the second contact surfaces have been moved towards flexed positions (see FIG. 224).

Figure 226:
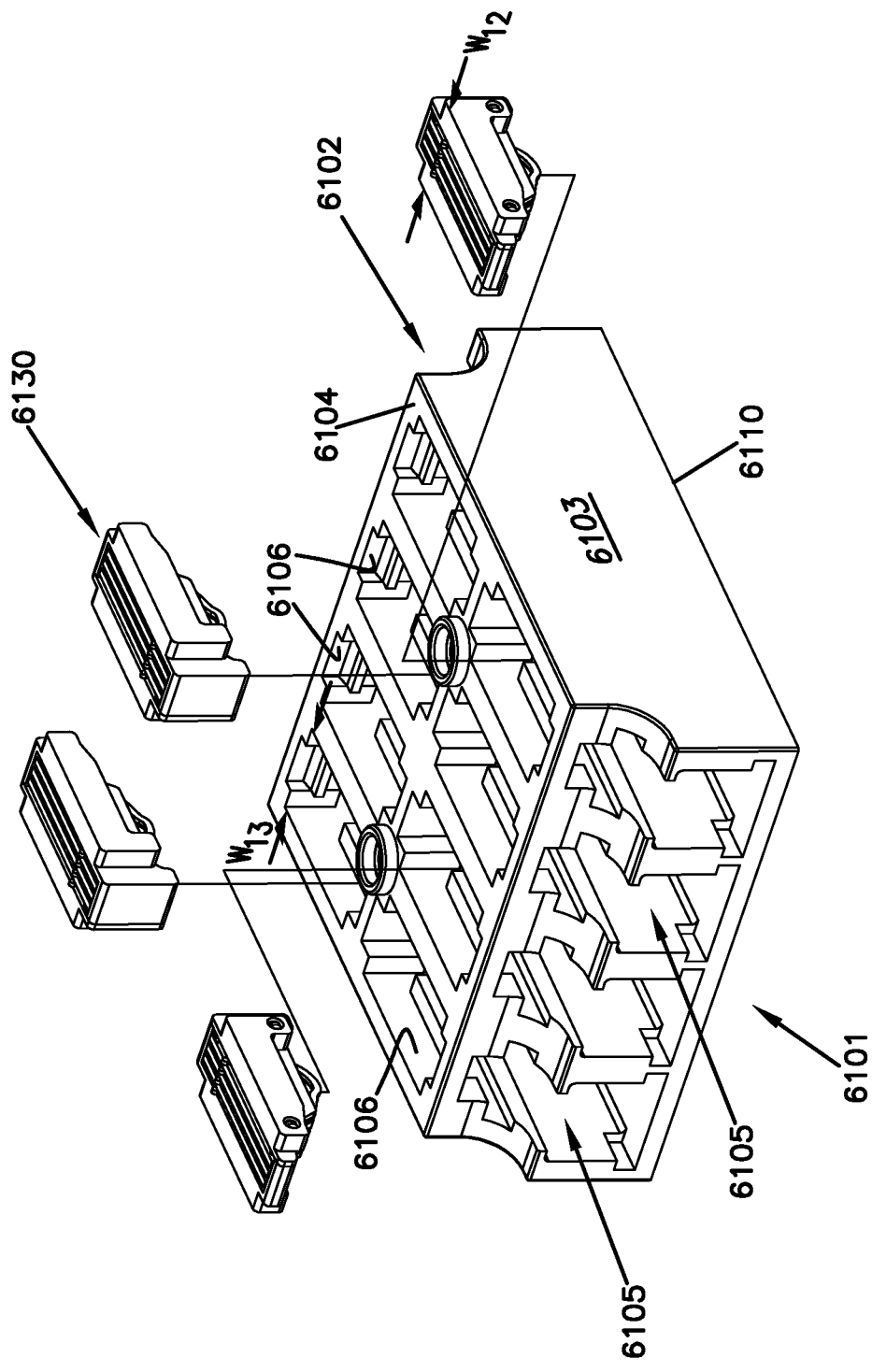

FIGS. 225-242 show one example implementation of a bounded contact arrangement 6130. FIG. 226 illustrates a connection assembly 6100 including an adapter 6110 configured to connect at least a first optical connector 6120 to at least a second optical connector 6120. The adapter 6110 includes two side walls 6103 extending between top and bottom end walls 6104. Passages extend parallel with the side walls 6103 between ports 6105 at the first and second sides 6101, 6102 of the adapter 6110.

In the example shown, the adapter 6110 includes four ports 6105 at the first side 6101 and four ports 6105 at the second side 6102 for receiving optical connectors. In other implementations, each side 6101, 6102 of the adapter 6110 may have greater or fewer ports 6105. In the example shown, each port 6105 is configured to receive an LC-type optical connector. In other implementations, however, the ports 6105 may be configured to receive other types of optical connectors (e.g., SC-type, ST-type, MPO-type, LX.5-type, etc.).

In some implementations, openings 6106 to receive the bounded contact arrangements 6130 are defined at a first end wall 6104 of the housing. In other implementations, the openings 6106 may be defined in both end walls 6104. Each opening 6106 extends between the end wall 6104 and one of the passages within the adapter 6110. Each opening 6106 is associated with one of the ports 6105 defined by the adapter 6110. In some implementations, two openings 6106 are provided in a single end wall 6104 per passage. In other implementations, one opening 6106 is provided in each end wall 6104 per passage.

FIG. 226 also illustrates example bounded contact arrangements 6130 to be inserted in the openings 6106 defined in the adapter 6110. Each bounded contact arrangements 6130 includes one or more contact elements 6131. Portions of the contact elements 6131 engage contact pads on the printed circuit board 6160 mounted to the adapter surfaces 6104. Other portions of the contact elements 6131 engage the electrical contacts of the storage members 6125 attached to connector arrangements 6120 positioned in the passages 6105. A processor coupled to one or both of the circuit boards 6160 can access the memory of each connector arrangement 6120 through the corresponding media reading interface 6130.

In some implementations, each opening 6106 may receive a bounded contact arrangement 6130. For example, the adapter 6110 may be configured to receive a monoplex (i.e., simplex) optical connector at each port 6105, each of which may be read by one of the bounded contact arrangements 6130. In other implementations, however, only some of the openings 6106 receive a bounded contact arrangement 6130. For example, the adapter 6110 may be configured to receive duplex optical connectors 6120. Accordingly, a bounded contact arrangement 6130 is provided at alternate ports 6105 so that only one contact arrangement 6130 is associated with each duplex optical connector 6120.

Each bounded contact arrangement 6130 has a width W12 and each slot 6106 has a width W13 (FIG. 226). In general, the width W13 of each adapter slot 6106 is sufficiently large to receive one contact arrangement 6130. The contact elements 6131 within the contact arrangement 6130 are positioned so that a width defined between the two outermost contact elements 6131 in the bounded contact arrangement 6130 is less than a width of a key of a connector (e.g., key 4115 of FIGS. 104-111) positioned in the respective adapter passage 6105.

The width W12 of the bounded contact arrangement 6130 may be larger than the key of the connector. The width W12 of each contact arrangement 6130 is smaller than the width W12 of the slot 6106. In some implementations, the width W12 of each contact arrangement 6130 is less than 3.35 mm (0.13 inches). Indeed, in some implementations, the width W12 of each contact arrangement 6130 is less than about 3.1 mm (0.12 inches). In certain implementations, the width W12 of each contact arrangement 6130 is no more than about 2.5 mm (0.10 inches). In one example implementation, the width W12 of each contact arrangement 6130 is no more than 2.2 mm (0.09 inches).

Figure 227:
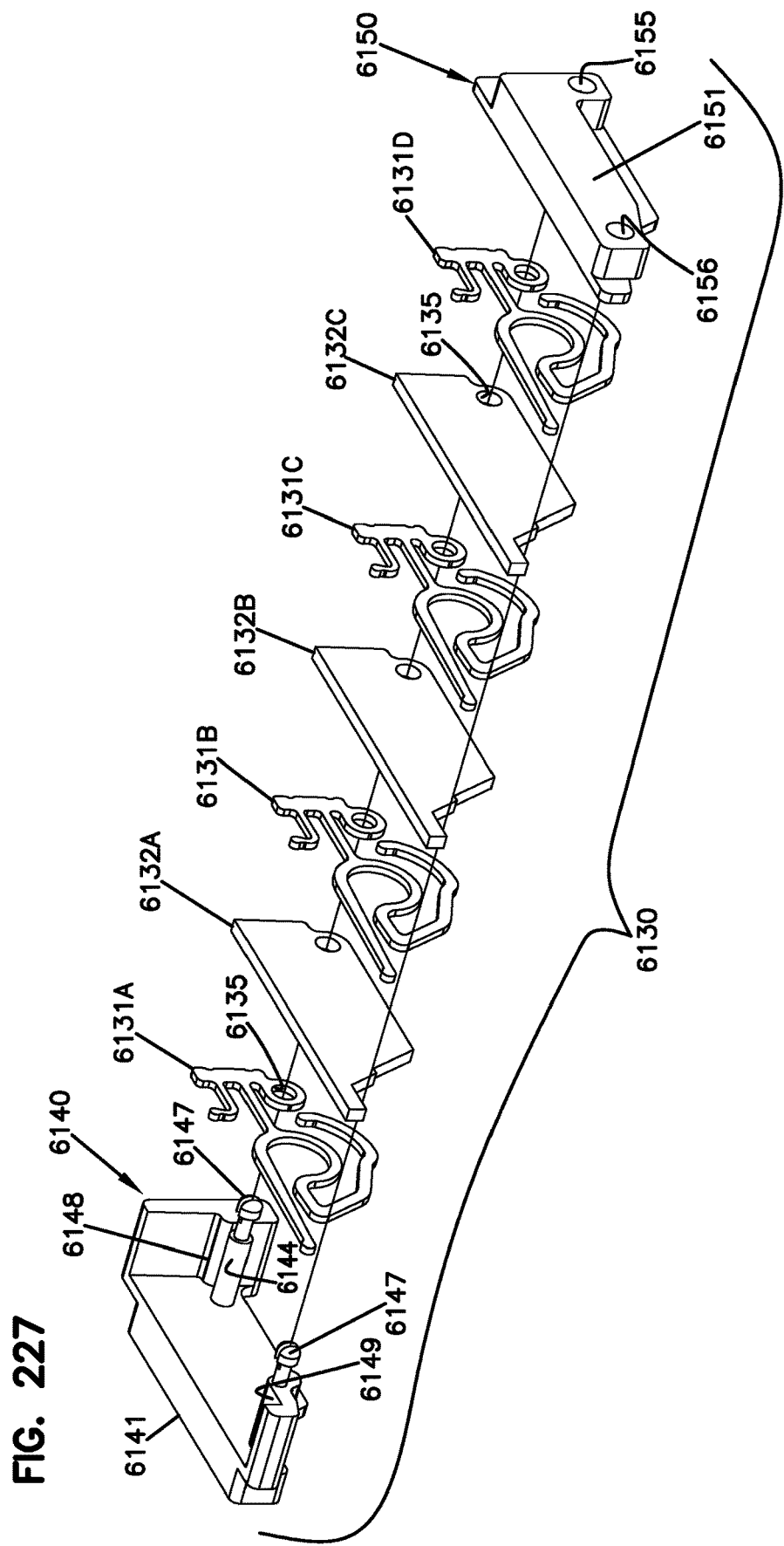

FIG. 227 is an exploded view of one example bounded contact arrangement 6130 suitable for use as a media reading interface in an optical adapter 6110. The bounded contact arrangement 6130 includes one or more spacers 6132 separating a plurality of contact elements 6131. Generally, the spacers 6132 can be used in place of adapter intermediate walls to separate contact elements. The spacers 6132 inhibit physical touching of adjacent contact elements 6131. The spacers 6132 also inhibit electrical connections between adjacent contact elements 6131. In some implementations, the spacers 6132 are sandwiched between contact elements 6131 (see FIG. 227). In other implementations, the contact elements 6131 are sandwiched between the spacers 6132.

For example, the example bounded contact arrangement 6130 shown in FIG. 227 includes a first spacer 6132A positioned between a first contact element 6131A and a second contact element 6131B; a second spacer 6132B positioned between the second contact element 6131B and a third contact element 6131C; and a third spacer 6132C positioned between the third contact element 6131C and a fourth contact element 6131D. In other implementations, the layered contact arrangement 6030 may include additional spacers 6132 on the outsides of the arrangement 6130.

Generally, the spacers 6132 can be used in place of adapter intermediate walls to separate contact elements 6131. The spacers 6132 inhibit physical touching of adjacent contact elements 6131. The spacers 6132 also inhibit electrical connections between adjacent contact elements 6131. The contact elements 6121 and spacers 6122 of the bounded contact arrangement 6130 are held together when assembled. In some implementations, one or more rods may extend through openings defined in the contact elements 6131 and spacers 6132 to maintain the components in an assembled state. In other implementations, first and second end pieces 6140, 6150 clamp the contact elements 6131 and spacers 6132 together. In certain implementations, the first and second end pieces 6140, 6150 may include one or more rods to aid in retaining the contact elements 6131 and spacers 6132.

In the example shown in FIG. 227, the first end piece 6140 includes one or more protrusions and the second end piece 6150 defines one or more holes configured to receive the protrusions. In some implementations, the protrusions of the first end piece 6140 snap-fit into the holes of the second end piece 6150. In other implementations, the protrusions of the first end piece 6140 are heat staked to the second end piece 6150. In other implementations, the first and second end piece 6140, 6150 may be latched together. In still other implementations, the first and second end pieces 6140, 6150 may be glued, welded (e.g., heat welding, ultra-sonic welding, etc.), sintered, tethered, or otherwise secured together.

Figure 228:
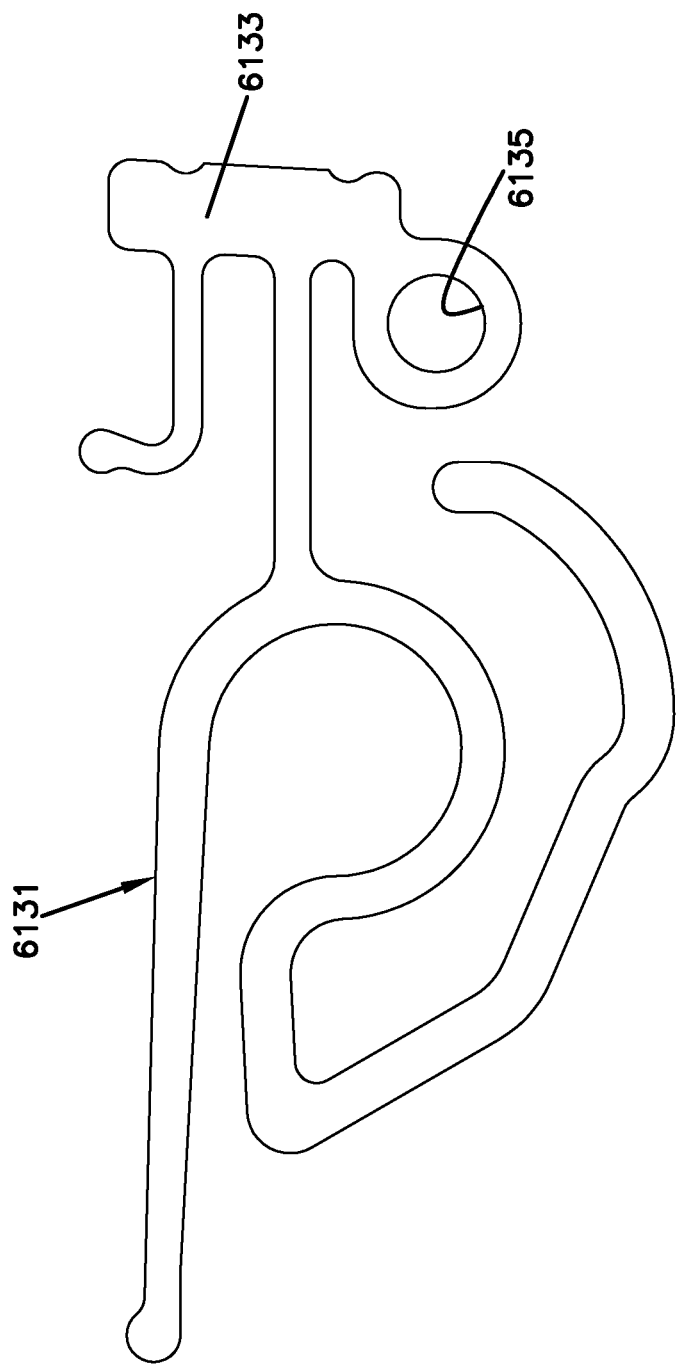
Figure 229:
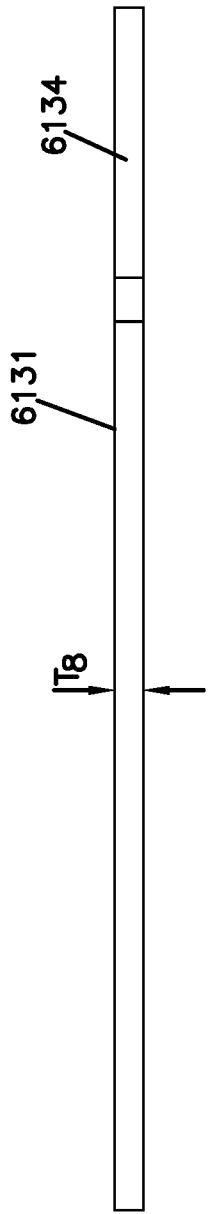

As shown in FIGS. 228-229, each contact element 6131 of the bounded contact arrangement 6130 defines two opposing planar sides 6133 connected by a peripheral edge 6134 having a thickness T8. In various implementations, the thickness T8 of each contact element 6131 ranges from about 1.27 mm (0.05 inches) to about 0.127 mm (0.005 inches). In certain implementations, the thickness T8 is less than about 0.51 mm (0.02 inches). In some implementation, the thickness T8 is less than about 0.3 mm (0.012 inches). In another implementation, the thickness T8 is about 0.25 mm (0.01 inches). In another implementation, the thickness T8 is about 0.23 mm (0.009 inches). In another implementation, the thickness T8 is about 0.2 mm (0.008 inches). In another implementation, the thickness T8 is about 0.18 mm (0.007 inches). In another implementation, the thickness T8 is about 0.15 mm (0.006 inches). In other implementations, the thickness T8 may vary across the body of the contact member 6131.

Figure 230:
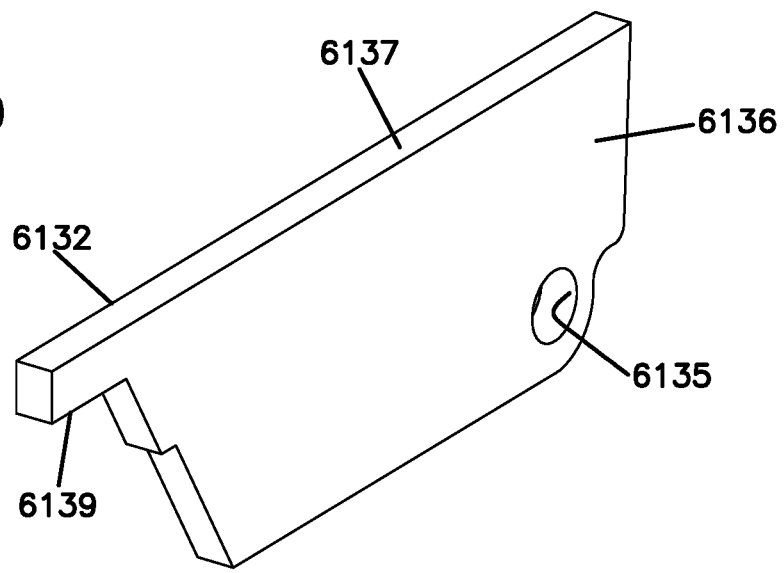
Figure 231:
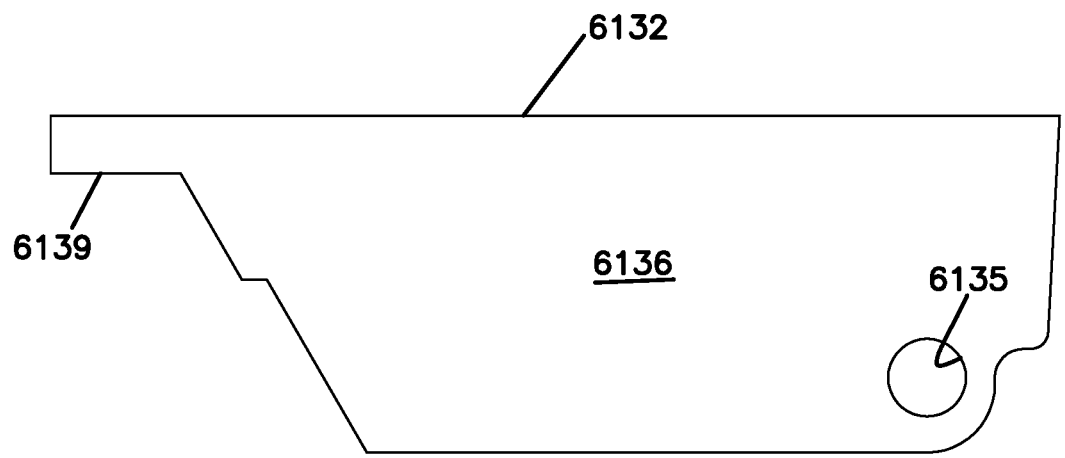
Figure 232:
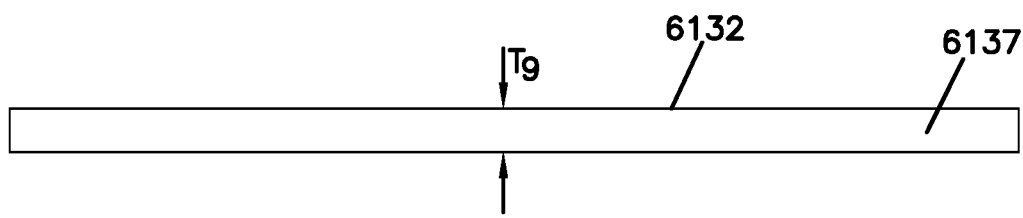

As shown in FIGS. 230-232, each spacer 6132 of the bounded contact arrangement 6130 defines two opposing planar sides 6136 connected by a peripheral edge 6137 having a thickness T9. In some implementations, each spacer 6132 is sufficiently thick to inhibit electrical contact between adjacent contact elements 6131. For example, each spacer 6132 may be sufficiently thick to space adjacent contact elements 6131 about 0.58 mm (0.02 inches) center to center. In various implementations, the thickness T9 of each spacer 6132 is within the range of about 0.1 mm (0.004) inches to about 0.46 mm (0.018 inches). Indeed, in some implementations, the thickness T9 of each spacer 6132 is within the range of about 0.12 mm (0.005 inches) to about 0.18 mm (0.007 inches). In one implementation, the thickness T9 of each spacer 6132 is about 0.15 mm (0.006 inches). Indeed, in some implementations, the thickness T9 of each spacer 6132 is within the range of about 0.25 mm (0.010 inches) to about 0.41 mm (0.016 inches). In one implementation, the thickness T9 of each spacer 6132 is about 0.38 mm (0.015 inches).

In some implementations, the peripheral edge 6137 of the spacer 6132 generally defines a rectangular shape. In other implementations, the peripheral edge 6137 of each spacer 6132 has an irregular shape. For example, the peripheral edge 6137 may be shaped so that the spacer 6132 extends only between portions of adjacent contact elements 6131. In the example shown in FIG. 227, each spacer 6132 includes a notched section 6138 and an extension 6139. The notched section 6138 facilitates mounting the spacer 6132 in the bounded contact arrangement 6130.

The extension 6139 extends between and separates the third contact surfaces of adjacent contacts elements (e.g., third contact surfaces 4236 of contact elements 4231). In some implementations, the extension 6139 maintains the separation of the third contact surfaces as the third contact surfaces move between flexed and unflexed positions (e.g., as connectors are inserted into and removed from the adapter 6110). In certain implementations, the extension 6139 is sufficiently large so as to extend between the third contact surfaces in both the flexed and unflexed positions.

In some implementations, the main body of the spacer 6132 does not extend between the second contact sections of adjacent contact members 6131, but rather extends sufficiently between the contact elements 6131 so as to inhibit sideways flexing of the second contact sections. In general, the main body is sufficiently short to enable optical connectors access to the second contact sections of the contact element 6131. In certain implementations, the main body is sufficiently short to enable optical connectors access to the second contact surfaces after the second contact surfaces have been moved towards flexed positions (see FIG. 242).

In some implementations, the first and second end pieces 6140, 6150 define opposing sides of the bounded contact arrangement 6130. For example, the first and second end pieces 6140, 6150 may fasten together to sandwich the contact elements 6131 and spacers 6132 therebetween. In other implementations, the first and second end pieces 6140, 6150 cooperate to encircle the components (see FIG. 226).

Figure 233:
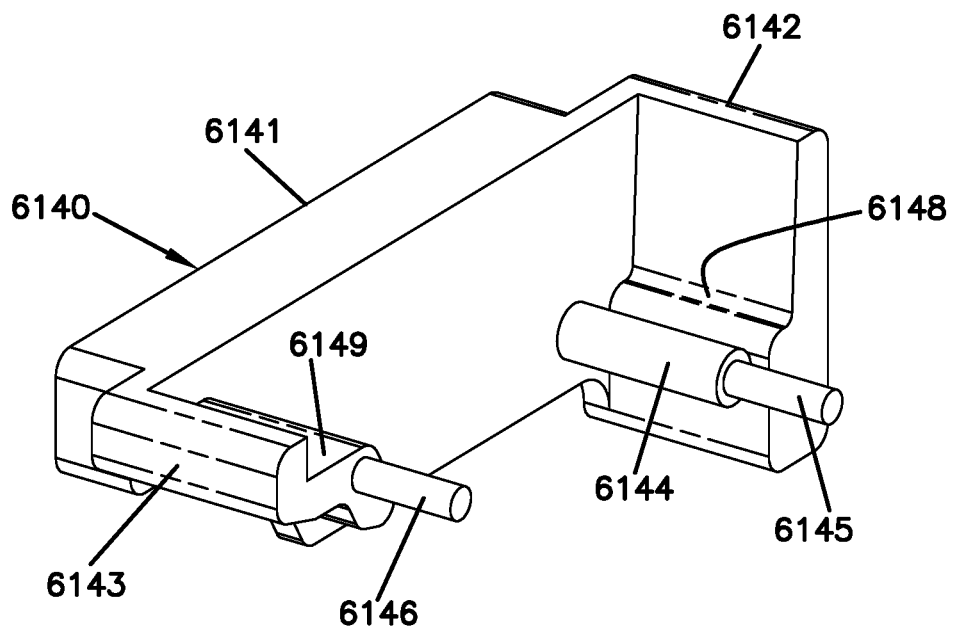
Figure 234:
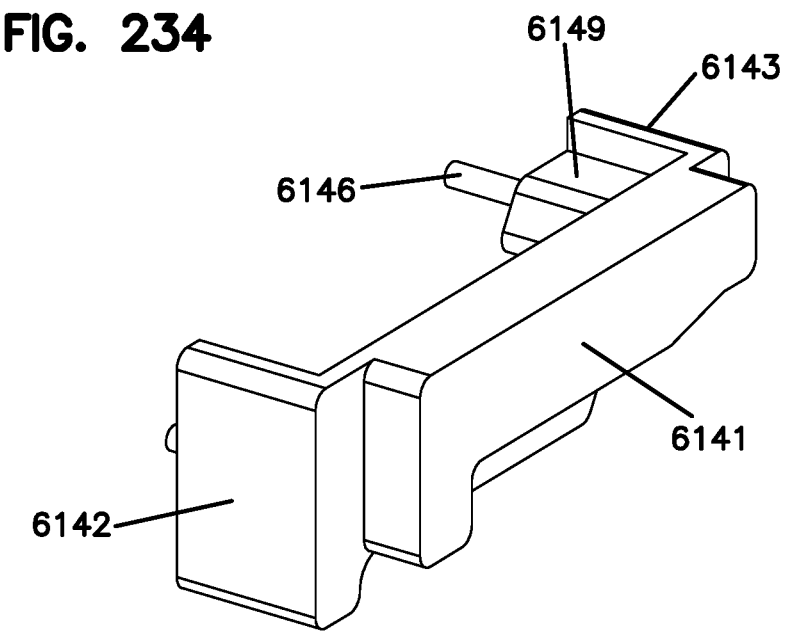
Figure 235:
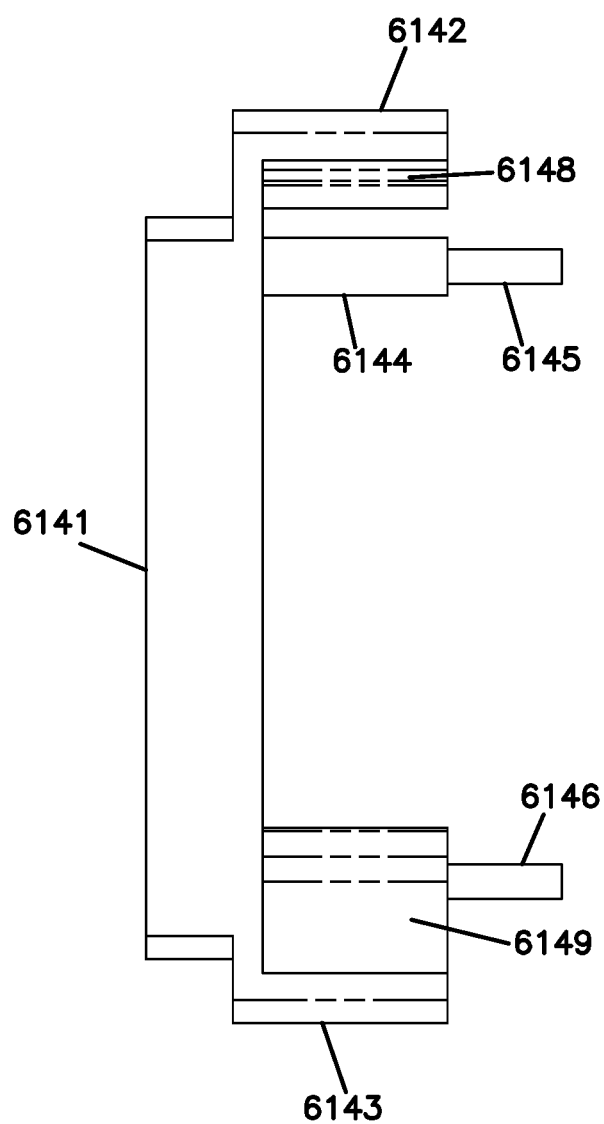

As shown in FIGS. 233-235, some types of first end pieces 6140 includes first and second sides 6142, 6143 extending outwardly from a bounding side 6141. The first side 6142 defines a first ledge 6148 on which the bases of the contact elements 6131 and the notched surfaces 6138 of the spacers 6132 may seat when the bounded contact arrangement 6130 is assembled (see FIG. 239). The second side 6143 defines a second ledge 6149 on which the third contact surfaces of the contact elements 6131 and the extensions 6139 of the spacers 6132 may seat when the bounded contact arrangement 6130 is assembled (see FIG. 239). A first pin 6144 and a second pin 6146 extend from the bounding side 6141.

Figure 236:
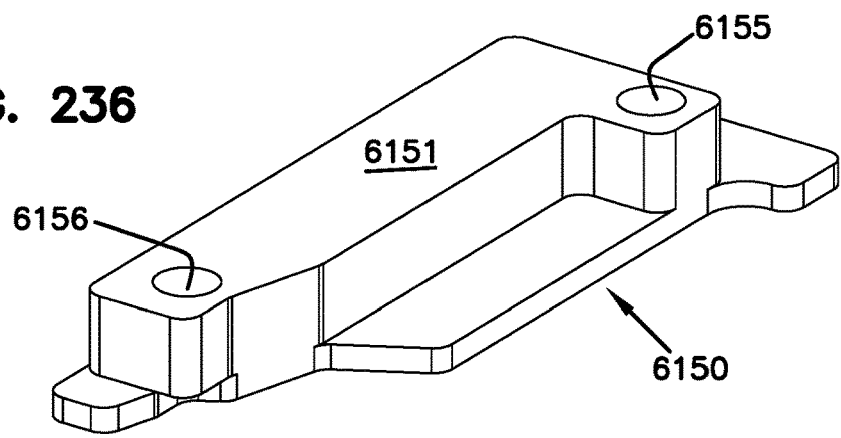
Figure 237:
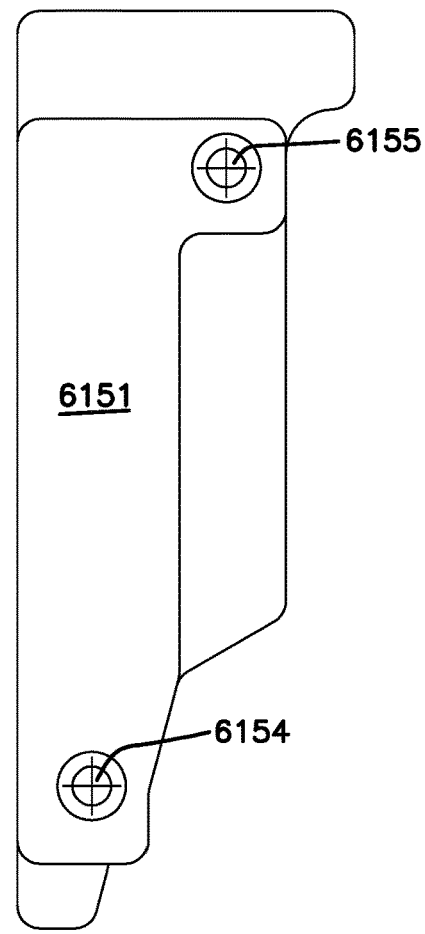
Figure 238:
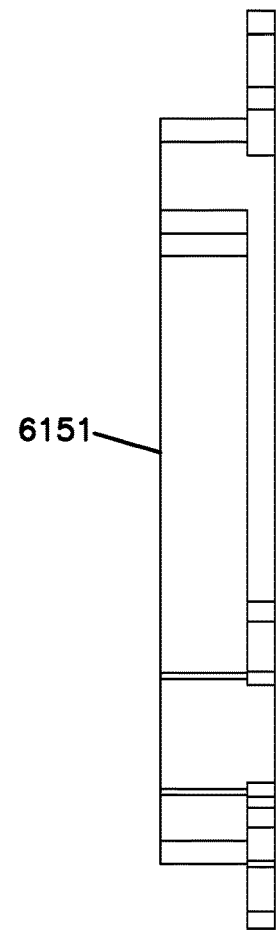

As shown in FIGS. 236-238, some types of second end pieces 6150 are configured to couple to the first end piece 6140. A body 6151 of one example second end piece 6150 defines a bounding surface that faces the bounding surface 6141 of the first end piece 6140. The body 6151 defines a first opening 6155 through which the first pin 6144 of the first end piece 6140 is received. The body 6151 also defines a second opening 6156 through which the second pin 6146 of the first end piece 6140 is received. In the example shown, the first opening 6155 is defined at a first side of the body and the second opening 6156 is defined at a second side of the body 6151.

In some implementations, each contact member 6131 extends between a first end and a second end. For example, the base of the contact member 6131 may define a first end of the contact member 6131 and the third contact section may define a second end of the contact member 6131. The contact member 6131 also extends between a top and a bottom. For example, the first and third contact sections may extend towards the top of the contact member 6131 and the second contact section may extend towards the bottom of the contact member 6131. As used herein, the terms "top" and "bottom" are not meant to imply a proper orientation of the contact member 6131 or that the top of the contact member 6131 must be located above the bottom of the connector 6131. Rather, the terms are used for ease in understanding and are assigned relative to the viewing plane of FIG. 240.

In some implementations, at least a first pin 6145 may extend between the two end pieces 6140, 6150 to further secure the components in place between the end pieces 6140, 6150. For example, in FIG. 227, each of the contact elements 6131A-6131D and spacers 6132A-6132C defines a hole 6135 that aligns with the holes 6135 of the other components. In the example shown in FIG. 228, the contact element 6131 has a different attachment section extending from the base compared to the contact element 4231 of FIG. 119. The attachment section of the contact element 6131 defines the opening 6135 instead of first and second legs that snap into the support wall of the adapter. In other implementations, however, the hole 6135 may be defined in another portion of the contact element 6131.

The pin 6144 is positioned through the holes 6135 of the layered components of the bounded contact arrangement 6130. In some implementations, the pin 6144 extends from the first end piece 6140 and is configured to fasten to the second end piece 6150. For example, the pin 6144 may include a reduced diameter section 6145 (FIG. 233) that is configured to extend through a hole 6155 in the second end piece 6150. In certain implementations, the pin 6144 has a bulbous tip 6147 (FIG. 227) that friction-fits, snap-fits, or otherwise secures in the hole 6155 of the second end piece 6150. In other implementations, the pin 6144 extends from the second end piece 6150 and is configured to fasten to the first end piece 6140. In still other implementations, the pin 6144 fastens to both or neither end piece 6140, 6150.

In some implementations, a second pin 6146 (FIG. 233) may extend between the two end pieces 6140, 6150 to further secure the end pieces 6140, 6150 together. For example, the second pin 6146 may extend through a second hole 6156 in the second end piece 6150. In some implementations, the pins 6145, 6146 extend from opposite ends of the first end piece 6140 (see FIG. 233). In other implementations, the pins 6145, 6146 may attach to any suitable portion of the end pieces 6140, 6150. In certain implementations, the second pin 6146 does not extend through the contact elements 6131 and spacers 6132. For example, in some implementations, the second pin 6146 extends from a side of the ledge 6149 of the first end piece 6140 (see FIG. 233). In other implementations, the second pin 6146 may extend along from the bounding surface 6141 adjacent the ledge 6149.

Figure 239:
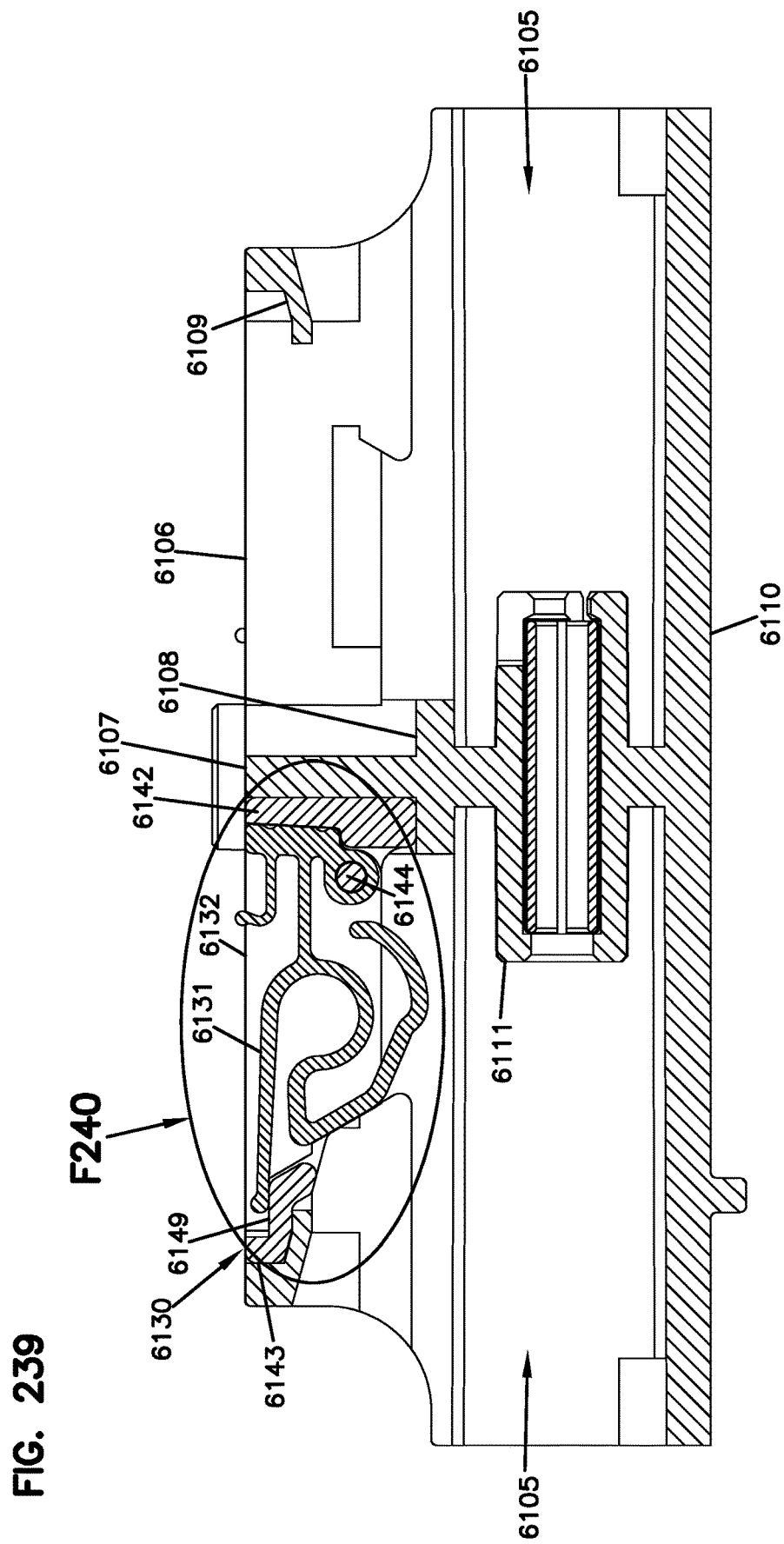
Figure 240:
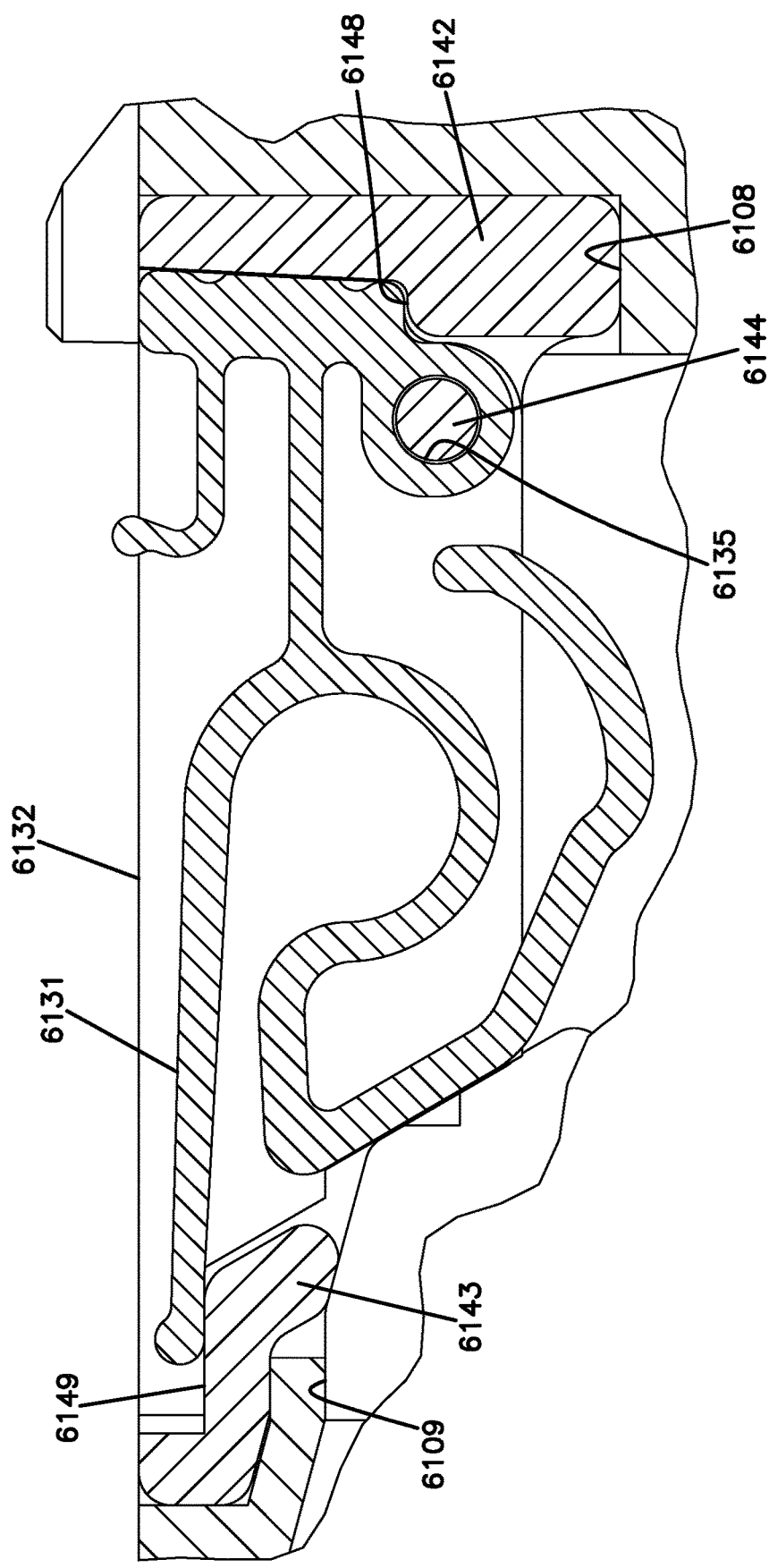

FIGS. 239-242 show an example bounded media reading interface 6130 positioned in a slot 6106 of an adapter 6110. FIG. 239 is a cross-sectional view of an example adapter 6110 including a split sleeve 6111 positioned in a passage between front and rear ports 6105. At least a first slot 6106 is defined in the top 6104 of the adapter 6110 at the front of the adapter 6110 and a second slot 6106 is defined in the top 6104 of the adapter 6110 at the rear of the adapter 6110. A support wall 6107 extends between the first and second slots 6106. In the example shown, the support wall 6107 defines a first ledge 6108 extending into each slot 6106. A second ledge 6109 is defined at each of the ports 6105 of the adapter 6110.

One example bounded media reading interface 6130 is positioned within the first slot 6106. One side of the bounded contact arrangement 6130 seats on the first ledge 6108 defined by the support wall 6107. An opposite side of the contact arrangement 6130 seats on the second ledge 6109. In the example shown in FIG. 239, the first side of the contact arrangement 6130 is formed by the first side 6142 of the first end piece 6140 and the second side of the contact arrangement 6130 is formed by the second side 6143 of the first end piece 6140.

A pin 6144 extends through an example spacer 6132 and an example contact element 6131 to maintain the components in position relative to the first end piece 6140. In the example shown in FIG. 240, the base portion of the contact element 6131 seats on the first ledge 6148 defined by the first side 6142 of the first end piece 6140 and the third contact section of the contact element 6131 seats on the second ledge 6149 defined by the second side 6143 of the first end piece 6140. The second contact section of the contact element 6131 is positioned below the spacer 6132 in a passage 6105 of the adapter 6110.

Figure 241:
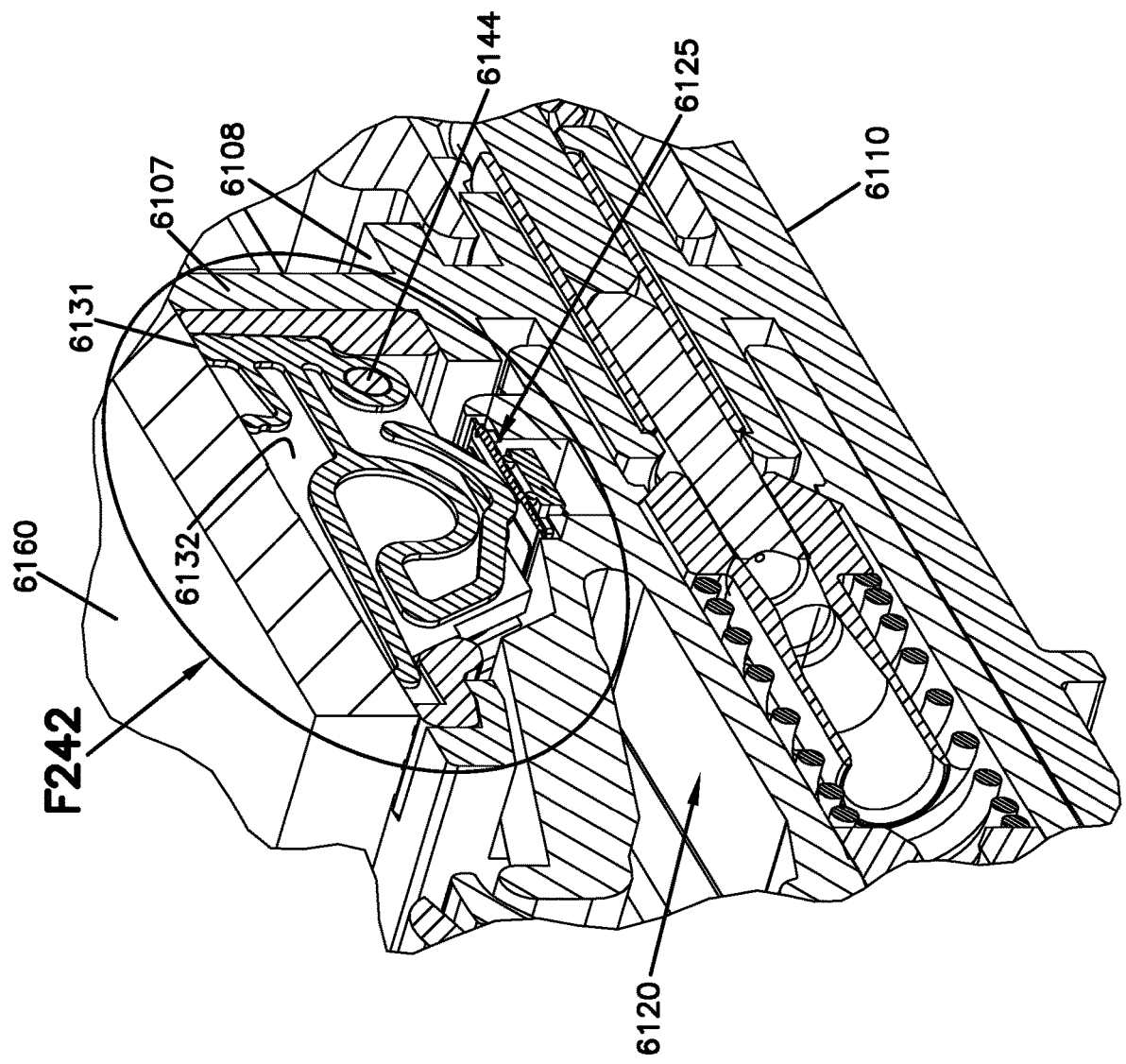
Figure 242:
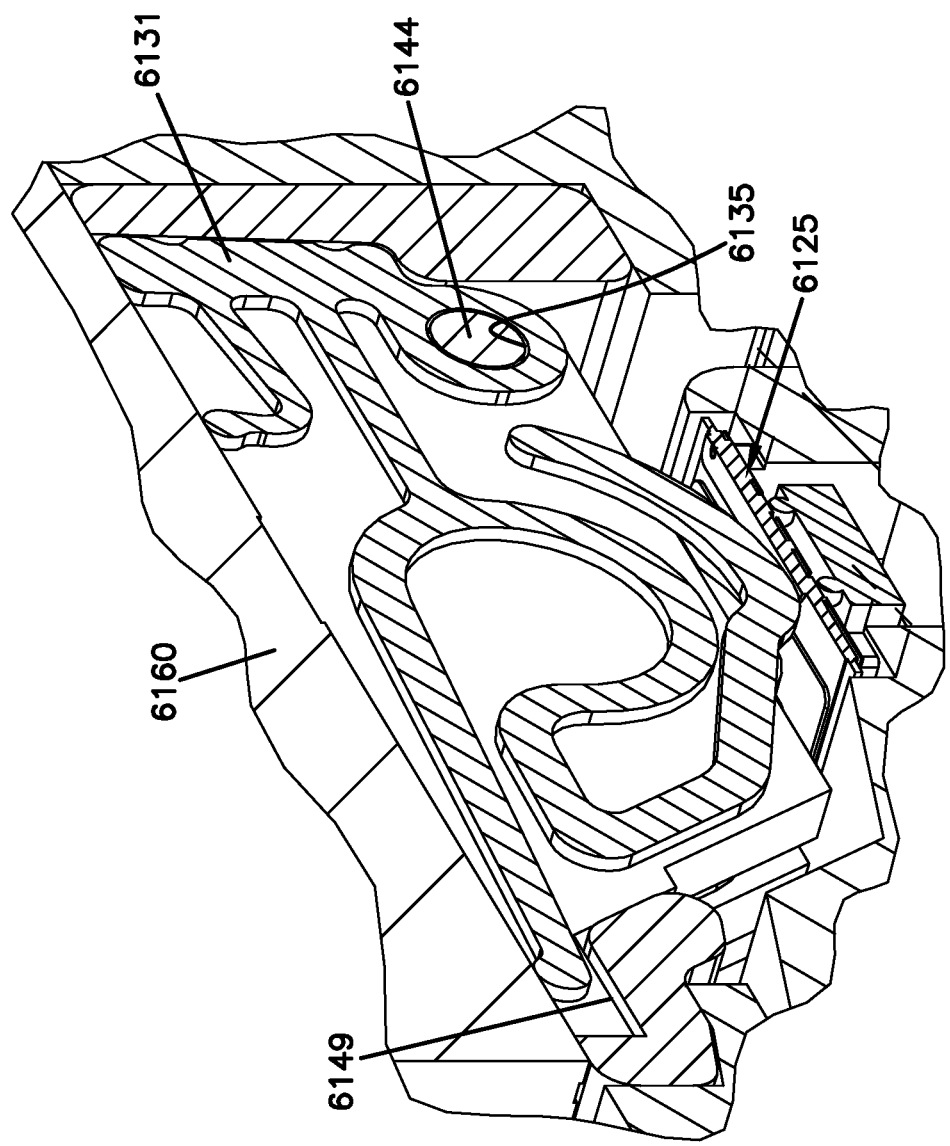

As shown in FIGS. 241-242, inserting a connector arrangement 6120 into the port 6105 of the adapter 6110 biases the second contact section of the contact element 6131 upwardly. Lifting of the second contact section causes the third contact section to lift upwardly from the ledge 6149 of the first end piece 6140 toward a contact pad on the circuit board 6160. In certain implementations, biasing the third contact section upwardly causes the contact surface of the third contact section to engage (e.g., touch or slide against) the contact pad on the circuit board 6140. If the connector 6120 includes a storage device 6125, then the contact surface of the second contact section of the contact member 6131 engages (e.g., touch or slide against) a contact pad on the storage device 6125.

Figure 243:
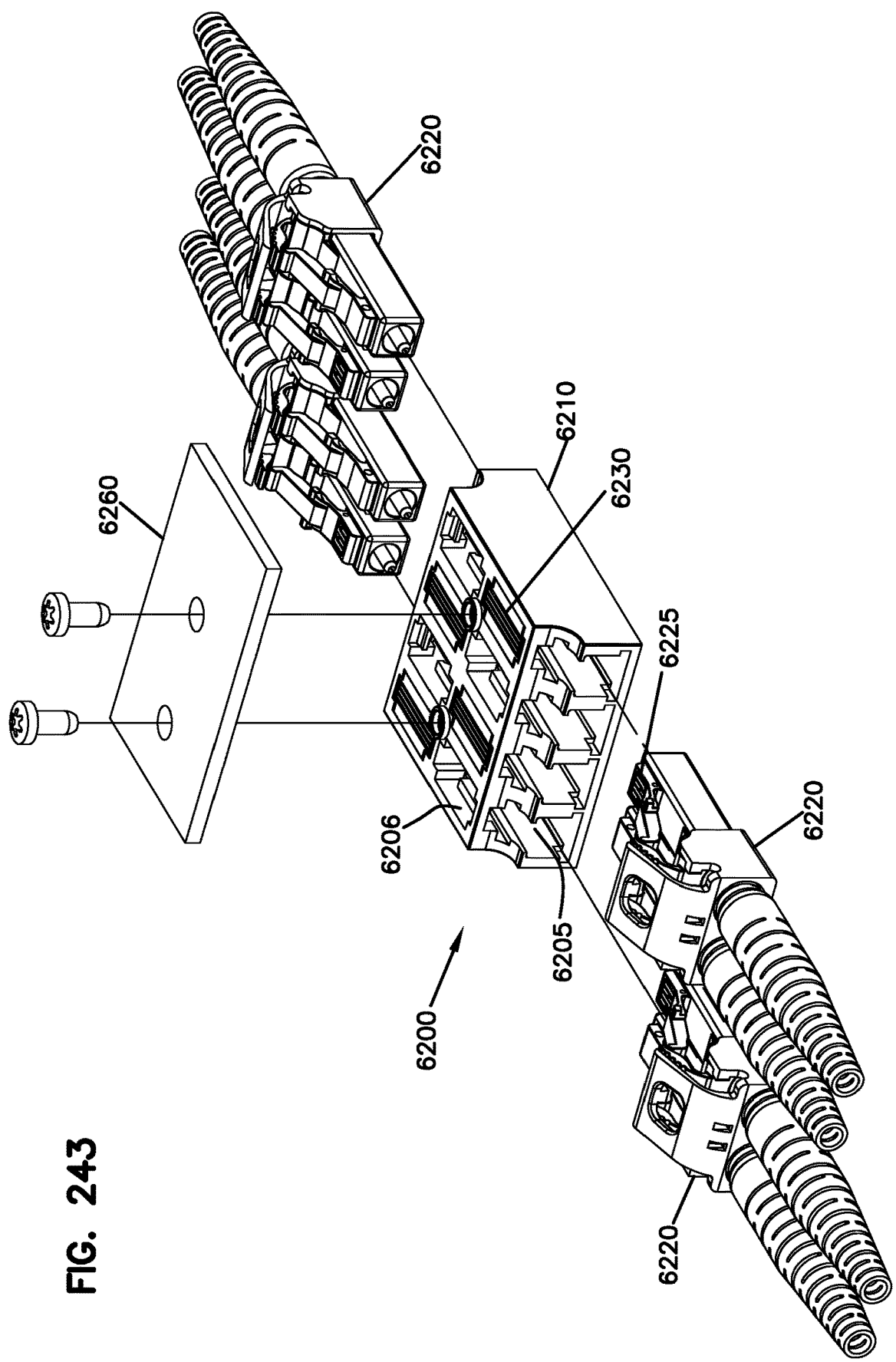
FIGS. 243-249 illustrate a fourteenth example implementation of a connector system that can be utilized on a connector assembly having PLI functionality as well as PLM functionality in accordance with aspects of the present disclosure.

FIGS. 243-249 show an example implementation of a framed media reading interface. FIG. 243 illustrates a connection assembly 6200 including an adapter 6210 configured to connect at least a first optical connector 6220 to at least a second optical connector 6220. The adapter 6210 includes two side walls 6203 extending between top and bottom end walls 6204. Passages extend parallel with the side walls 6203 between ports 6205 at the first and second sides 6201, 6202 of the adapter 6210.

In the example shown, the adapter 6210 includes four ports 6205 at the first side 6201 and four ports 6205 at the second side 6202 for receiving optical connectors. In other implementations, each side 6201, 6202 of the adapter 6210 may have greater or fewer ports 6205. In the example shown, each port 6205 is configured to receive an LC-type optical connector. In other implementations, however, the ports 6205 may be configured to receive other types of optical connectors (e.g., SC-type, ST-type, MPO-type, LX.5-type, etc.).

In some implementations, openings 6206 to receive the framed contact arrangements 6230 are defined at a first end wall 6204 of the housing. In other implementations, the openings 6206 may be defined in both end walls 6204. Each opening 6206 extends between the end wall 6204 and one of the passages within the adapter 6210. Each opening 6206 is associated with one of the ports 6205 defined by the adapter 6210. In some implementations, two openings 6206 are provided in a single end wall 6204 per passage. In other implementations, one opening 6206 is provided in each end wall 6204 per passage.

Figure 244:
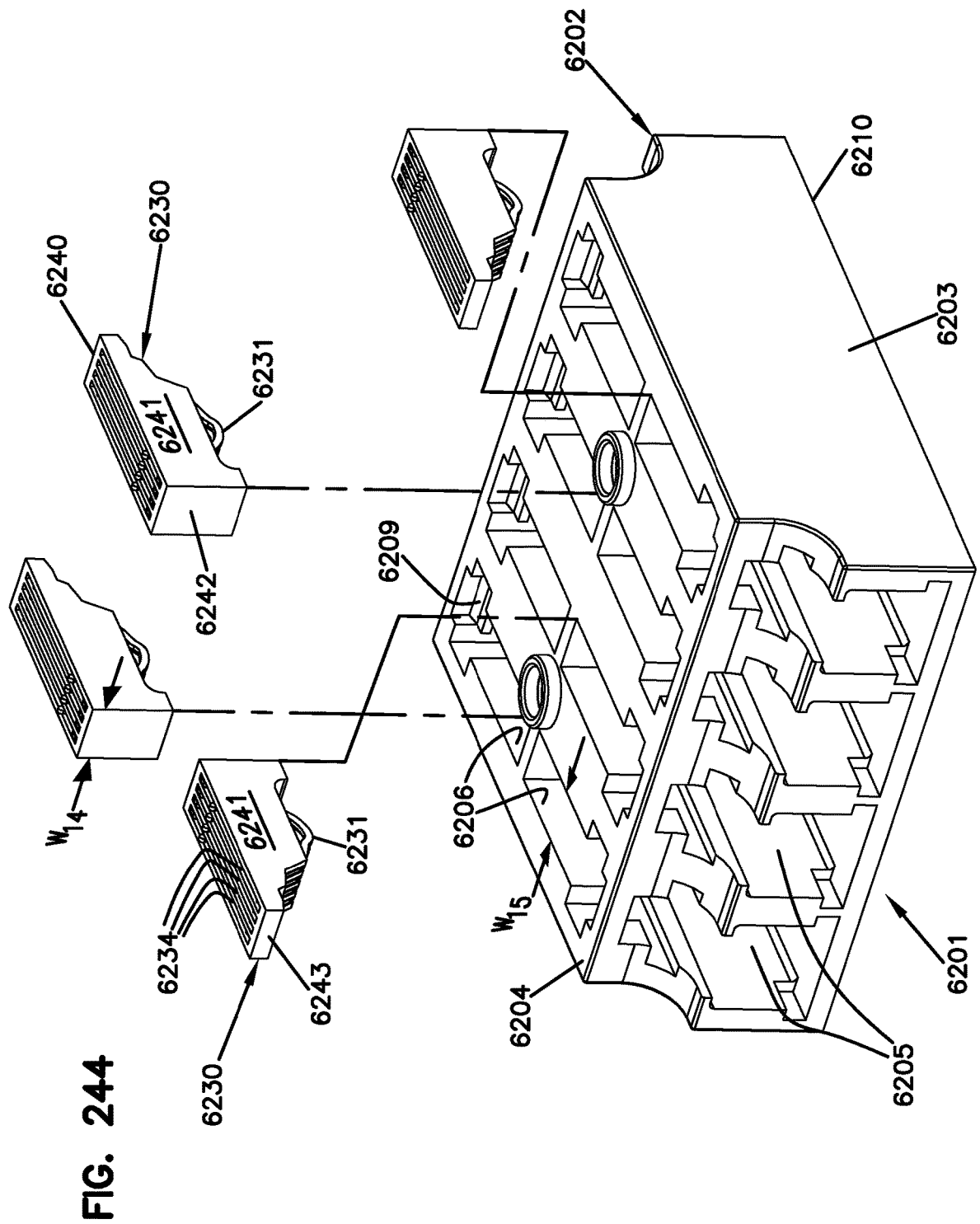

FIG. 244 illustrates example framed contact arrangements 6230 to be inserted in the openings 6206 defined in the adapter 6210. Each framed contact arrangements 6230 includes one or more contact elements 6231. Portions of the contact elements 6231 engage contact pads on the printed circuit board 6260 mounted to the adapter surfaces 6204. Other portions of the contact elements 6231 engage the electrical contacts of the storage members 6225 attached to connector arrangements 6220 positioned in the passages 6205. A processor coupled to one or both of the circuit boards 6260 can access the memory of each connector arrangement 6220 through the corresponding media reading interface 6230.

In some implementations, each opening 6206 may receive a framed contact arrangement 6230. For example, the adapter 6210 may be configured to receive a monoplex (i.e., simplex) optical connector at each port 6205, each of which may be read by one of the contact arrangements 6230. In other implementations, however, only some of the openings 6206 receive a framed contact arrangement 6230. For example, the adapter 6210 may be configured to receive a duplex optical connector at each port 6205. Accordingly, a contact arrangement 6230 is provided at alternate ports 6205 so that only one contact arrangement 6230 is associated with each duplex optical connector.

Each framed contact arrangement 6230 has a width W14 and each slot 6206 has a width W15 (FIG. 244). In general, the width W15 of each adapter slot 6206 is sufficiently large to receive one contact arrangement 6230. A width of between the two outermost contact elements 6231 of the framed contact arrangement 6230 is smaller than a width of a key of a connector (e.g., key 4115 of FIGS. 104-111) positioned in the respective adapter passage 6205. The width W14 of each contact arrangement 6230, however, may be larger than the width of a key of a connector. In some implementations, the width W14 of each contact arrangement 6230 is less than 3.35 mm (0.13 inches). Indeed, in some implementations, the width W14 of each contact arrangement 6230 is less than about 3.1 mm (0.12 inches). In certain implementations, the width W14 of each contact arrangement 6230 is no more than about 2.5 mm (0.10 inches). In one example implementation, the width W14 of each contact arrangement 6230 is no more than 2.2 mm (0.09 inches).

Figure 245:
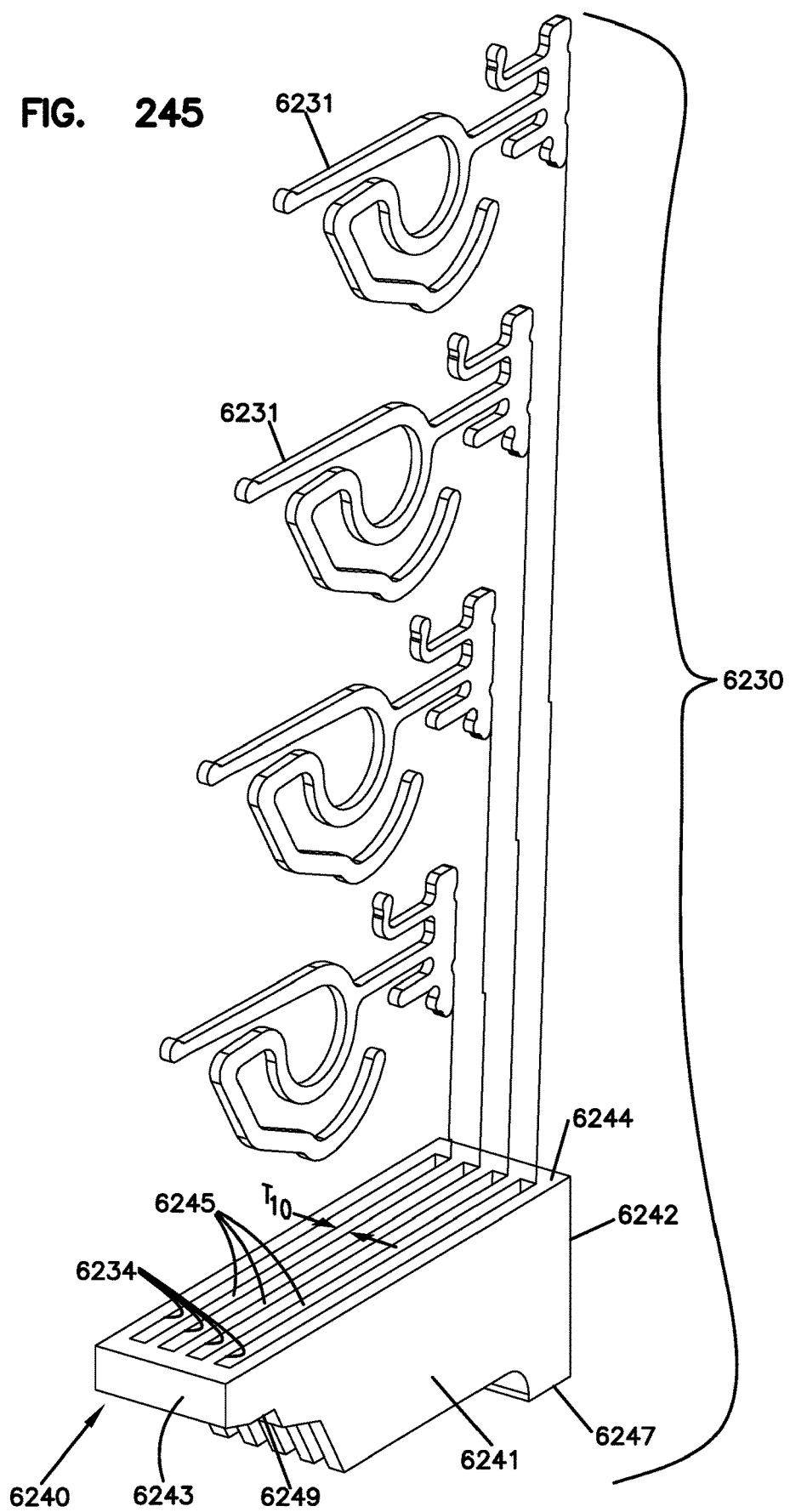
Figure 246:
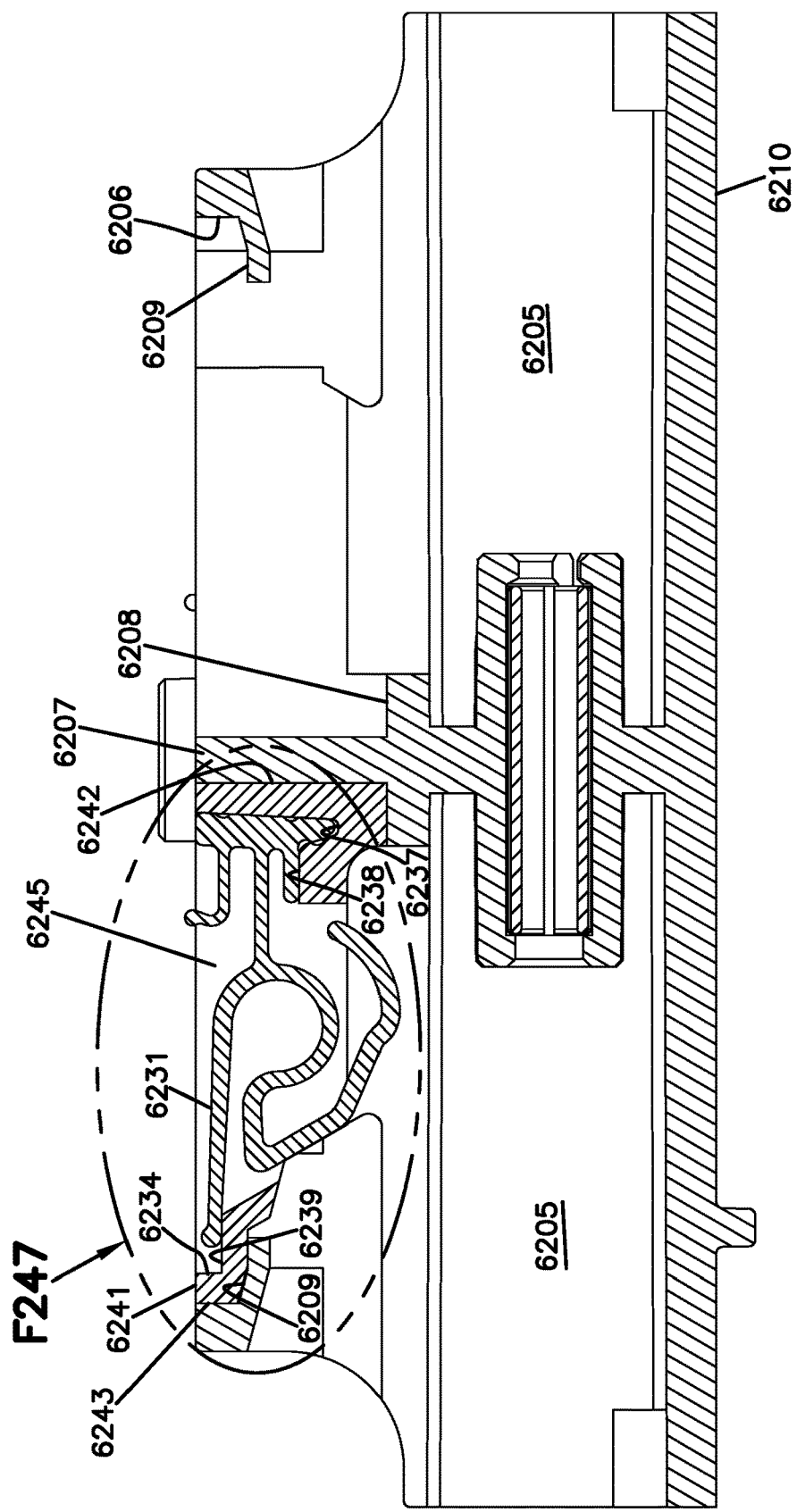
Figure 247:
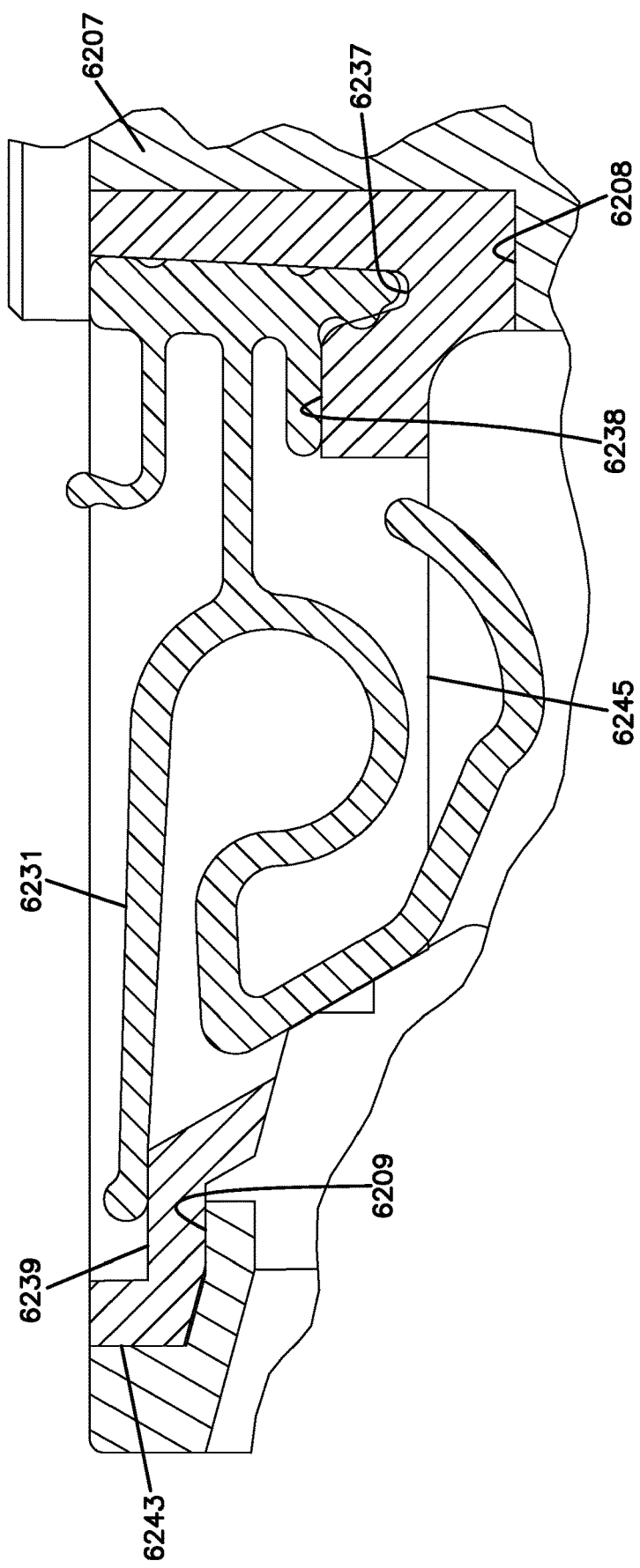

FIG. 245 is an exploded view of one example framed contact arrangement 6230 suitable for use as a media reading interface in an optical adapter 6210. The framed contact arrangement 6230 includes a modular housing 6240 defining slots 6234 in which contact elements 6231 may be received. In the example shown, the contact element 6231 is the same as contact element 4231 of FIG. 119. In other implementations, however, any of the contact elements described herein or any other suitable contact element may be utilized. In the example shown, four contact elements 6231 are received in the housing 6240. In other implementations, the framed contact arrangement 6230 may include greater or fewer contact elements 6231.

The modular housing 6240 includes opposing sides 6241 extending between a first end 6242 and a second end 6243. Slots 6234 extend at least partially between a top surface 6244 and bottom of the housing 6240. Intermediate walls 6245 extend generally parallel with the sides 6241 between the first and second ends 6242, 6243 to separate the slots 6234. One contact element 6231 may be positioned within each slot 6234 so that one of the intermediate walls 6245 separates the contact element 6231 from any adjacent contact elements 6231. The intermediate walls 6245 inhibit physical touching of adjacent contact elements 6231. The intermediate walls 6245 also inhibit electrical connections between adjacent contact elements 6231.

Each contact element 6231 of the bounded contact arrangement 6230 defines two opposing planar sides connected by a peripheral edge. In various implementations, the thickness of each contact element 6231 ranges from about 1.27 mm (0.05 inches) to about 0.127 mm (0.005 inches). In certain implementations, the thickness is less than about 0.51 mm (0.02 inches). In some implementation, the thickness is less than about 0.3 mm (0.012 inches). In another implementation, the thickness is about 0.25 mm (0.01 inches). In another implementation, the thickness is about 0.23 mm (0.009 inches). In another implementation, the thickness is about 0.2 mm (0.008 inches). In another implementation, the thickness is about 0.18 mm (0.007 inches). In another implementation, the thickness is about 0.15 mm (0.006 inches). In other implementations, the thickness may vary across the body of the contact member 6231.

As shown in FIG. 245, each intermediate wall 6245 of the framed contact arrangement 6230 defines two opposing planar sides (see FIGS. 246-249) connected by a peripheral edge having a thickness T10 (FIG. 245). In some implementations, each intermediate wall 6245 is sufficiently thick to inhibit electrical contact between adjacent contact elements 6231. For example, each intermediate wall 6245 may be sufficiently thick to space adjacent contact elements 6231 about 0.58 mm (0.02 inches) center to center. In various implementations, the thickness T10 of each intermediate wall 6245 is within the range of about 0.1 mm (0.004) inches to about 0.46 mm (0.018 inches). Indeed, in some implementations, the thickness T10 of each intermediate wall 6245 is within the range of about 0.12 mm (0.005) inches to about 0.18 mm (0.007 inches). In one implementation, the thickness T10 of each intermediate wall 6245 is about 0.15 mm (0.006 inches). Indeed, in some implementations, the thickness T10 of each intermediate wall 6245 is within the range of about 0.25 mm (0.010) inches to about 0.41 mm (0.016 inches). In one implementation, the thickness T10 of each intermediate wall 6245 is about 0.38 mm (0.015 inches).

The housing 6240 is generally sized and shaped to fit within an opening 6206 of an adapter 6210. In some implementations, the housing 6240 has a cuboid shape. In other implementations, the housing 6240 is irregularly shaped. For example, in some implementations, the first end 6242 of the housing 6240 defines a first base 6247 that is configured to seat on a ledge 6208 defined in a support wall 6207 of the adapter 6210 (see FIG. 246). The adapter 6210 also may define a second ledge 6209 at an opposite side of the slot 6234 from the support wall 6207. The second ledge 6209 of the adapter 6210 is configured to receive the second end 6243 of the media reading interface housing 6240 (see FIG. 246).

The first and second ends 6242, 6243 of the housing 6240 are configured to receive and secure the contact elements 6231 within the slots 6234. For example, the first end 6242 of the housing 6240 defines a recess 6237 and a ledge 6238. The ledge 6238 is configured to receive the bases of the contact elements 6231. The attachment portion of each contact element 6231 may snap-fit or otherwise secure to the housing base 6247 at the recess 6237 (see FIG. 246). The second end 6243 of the housing 6240 defines a second ledge 6239 on which a portion of each contact element 6231 may seat. For example, in FIG. 246, the third contact section of each contact member 6231 seats on the second ledge 6239 when the respective port 6205 is empty (i.e., when no force is applied to the second contact section of the contact element 6231).

Figure 248:
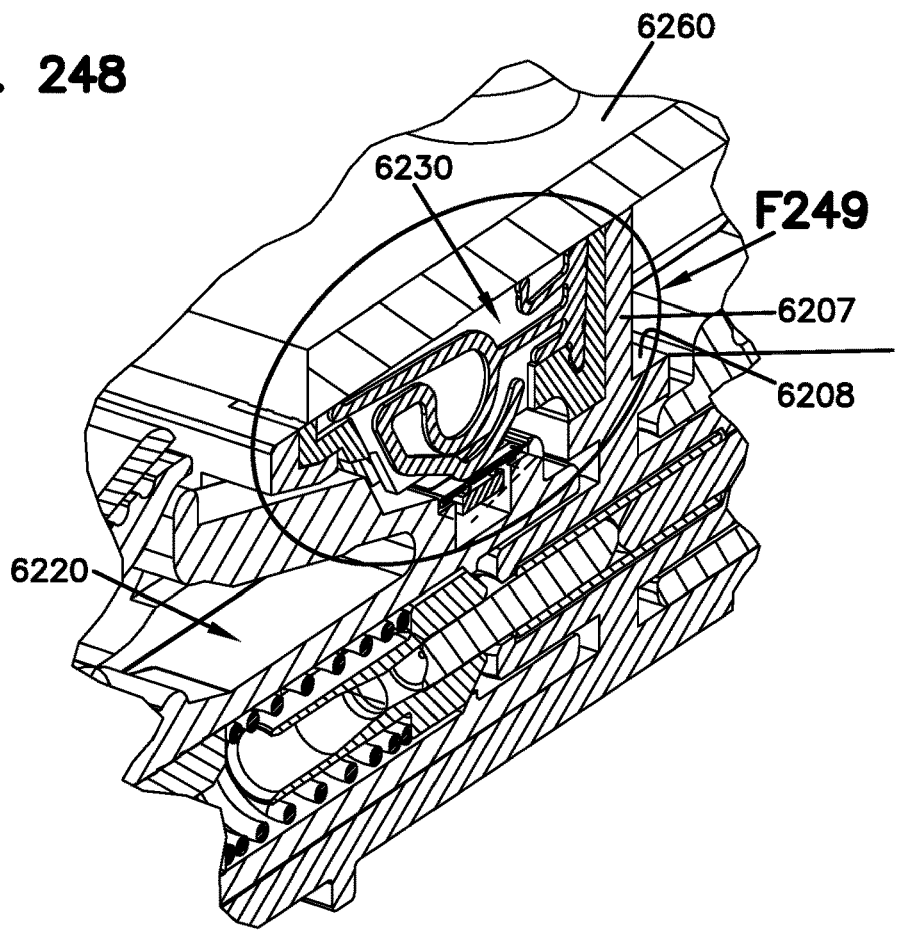
Figure 249:
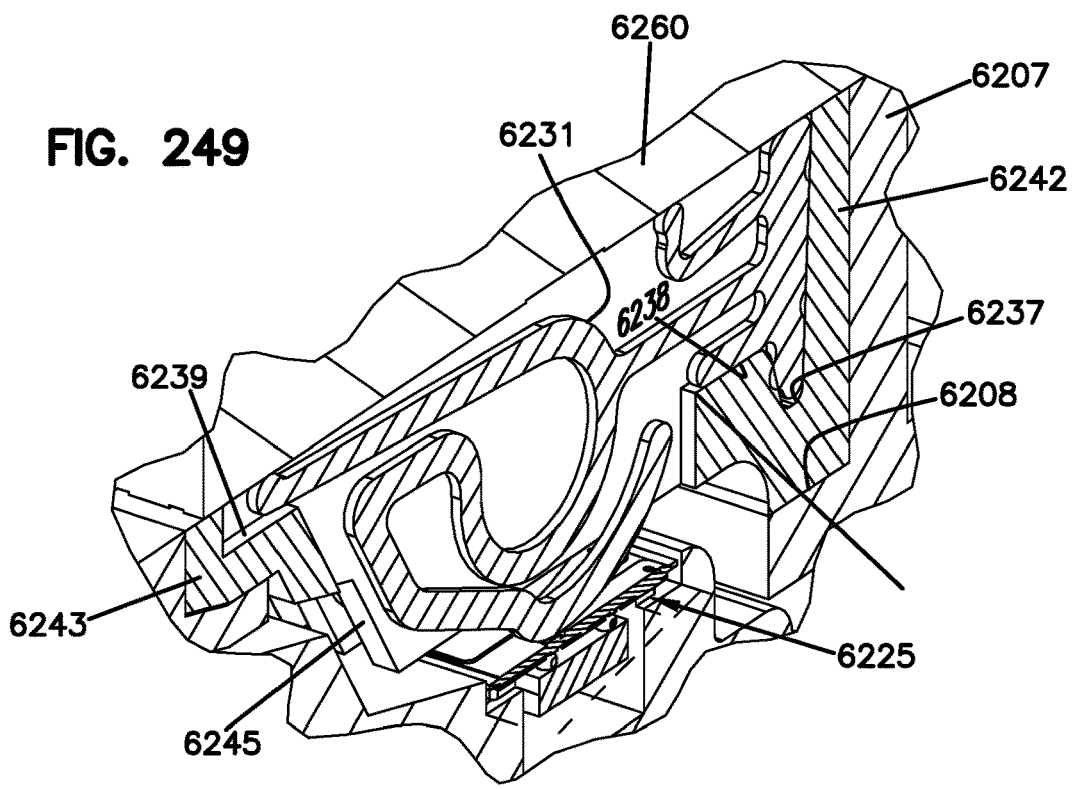

As shown in FIGS. 248-249, inserting a connector arrangement 6220 into the port 6205 of the adapter 6210 biases the second contact section of each contact element 6231 upwardly. Lifting of the second contact section causes the third contact section to lift upwardly from the second ledge 6239 of the second end 6243 of the housing 6240 toward a contact pad on the circuit board 6260. In certain implementations, biasing the third contact section upwardly causes the contact surface of the third contact section to engage (e.g., touch or slide against) the contact pad on the circuit board 6260. If the connector 6220 includes a storage device 6225, then the contact surface of the second contact section of the contact member 6231 engages (e.g., touch or slide against) a contact pad on the storage device 6225 to connect the storage device 6225 to the circuit board 6260.

Figure 250:
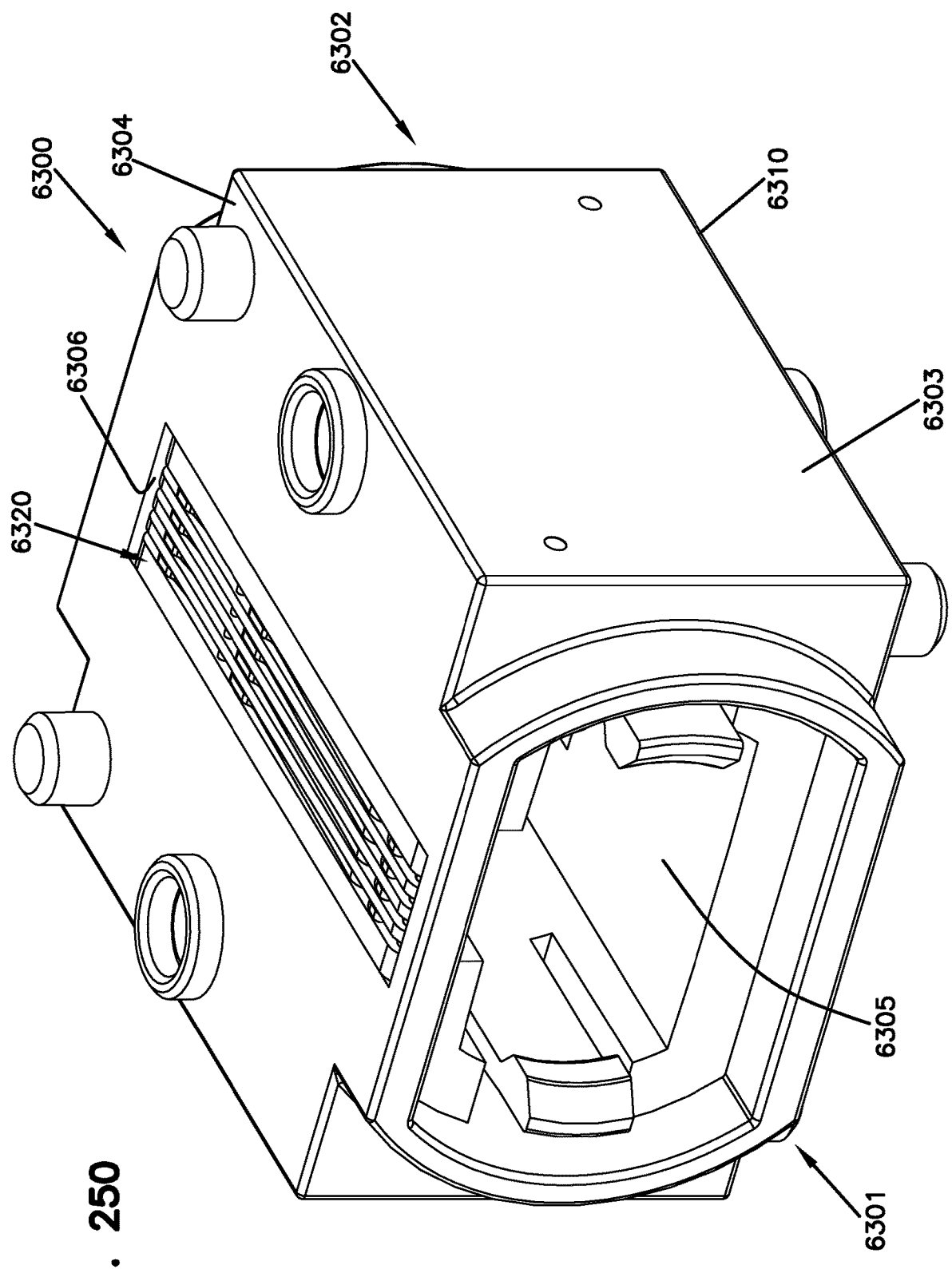
Figure 251:
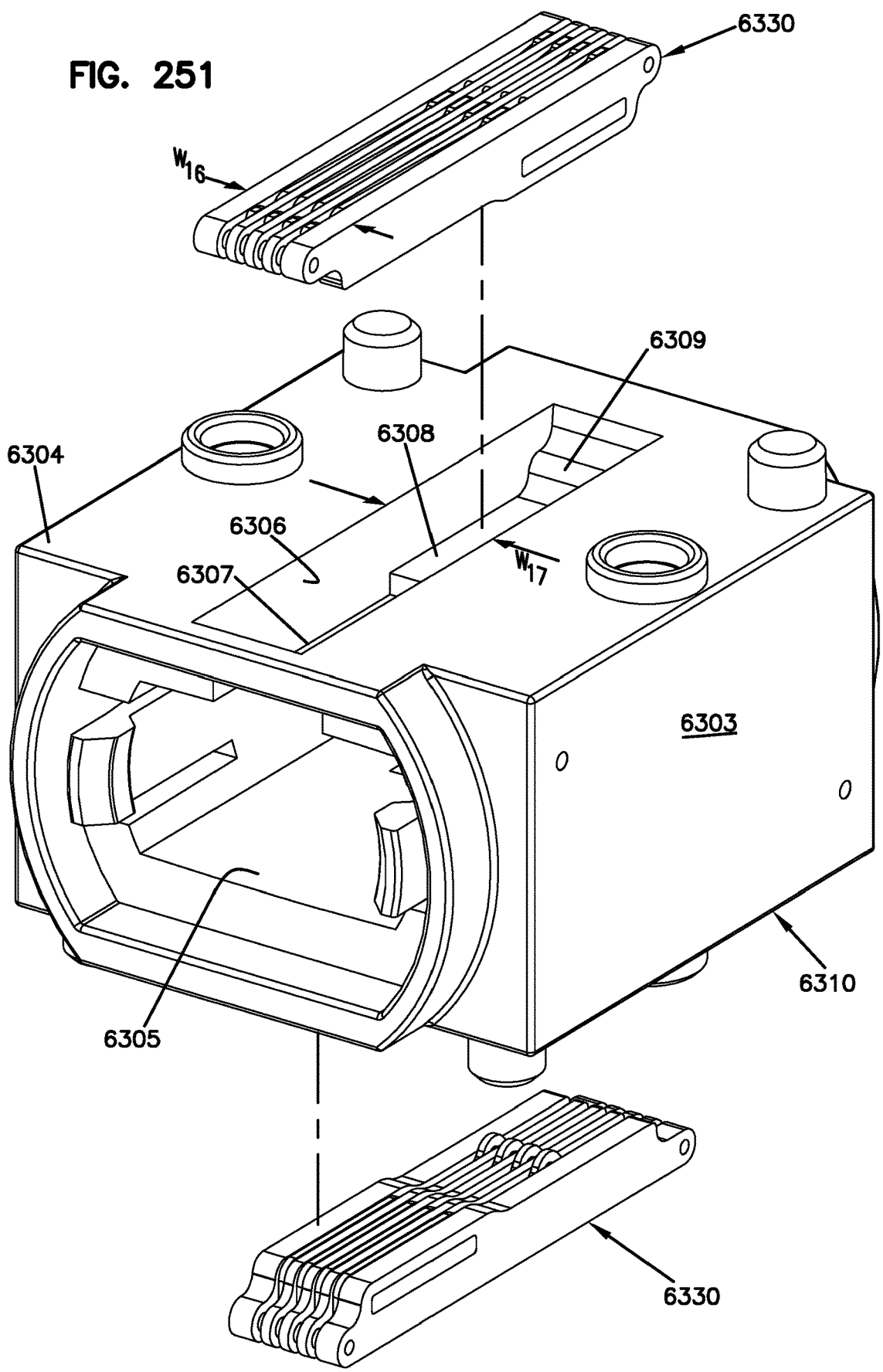
Figure 252:
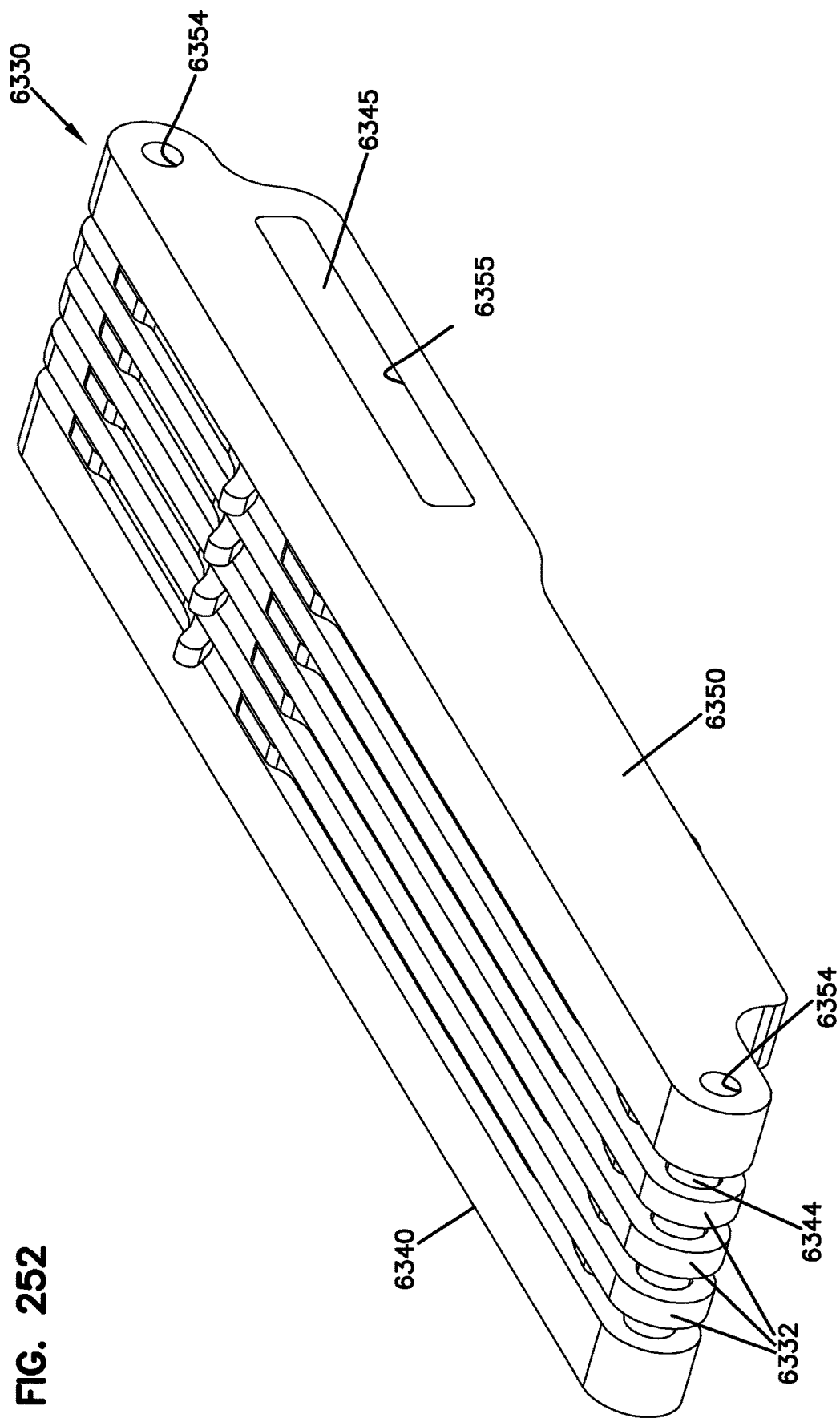

FIGS. 250-261 illustrate another example connection assembly 6300 including another example implementation of a bounded contact arrangement 6320 suitable for use with an example adapter 6310. FIGS. 250-251 illustrate the adapter 6310 configured to connect at least a first optical connector to at least a second optical connector. The adapter 6310 includes two side walls 6303 extending between top and bottom end walls 6304. Passages extend parallel with the side walls 6303 between ports 6305 at the first and second sides 6301, 6302 of the adapter 6310.

In the example shown, the adapter 6310 includes one port 6305 at the first side 6301 and one port 6305 at the second side 6302 for receiving optical connectors. In other implementations, one or both sides 6301, 6302 of the adapter 6310 may have additional ports 6305. In the example shown, each port 6305 is configured to receive an MPO-type optical connector. In other implementations, however, the ports 6305 may be configured to receive other types of optical connectors (e.g., SC-type, ST-type, LC-type, LX.5-type, etc.).

In some implementations, one or more openings 6306 (see FIG. 251) configured to receive the bounded contact arrangements 6330 are defined at a first end wall 6304 of the housing. In other implementations, one or more openings 6306 may be defined in both end walls 6304. Each opening 6306 is associated with one of the ports 6305 defined by the adapter 6310. In some implementations, one opening 6306 is provided in each end wall 6304 per passage. In other implementations, two openings 6306 may be provided in a single end wall 6304 per passage.

At least a portion 6307 of each opening 6306 extends between the end wall 6304 and one of the passages within the adapter 6310. Another portion of the opening 6306 extends from the end wall 6304 to a support ledge 6308 configured to receive a bounded contact arrangement 6330. The support ledge 6308 extends transversely across only a part of the slot 6306, thereby providing access to the contact arrangement 6330 from the passage extending through the adapter 6310. A shoulder 6309 connects the end wall 6304 and the support ledge 6308 at each end of the opening 6306 (see FIG. 261). In certain implementations, the shoulders 6309 may be contoured to fit with the contact arrangement 6330 to be received.

FIGS. 252-255 illustrate various views of an example bounded contact arrangement 6330 to be inserted in the openings 6306 defined in the adapter 6310. Each bounded contact arrangements 6330 includes one or more contact elements 6331. Portions of the contact elements 6331 engage contact pads 6364, 6366 on the printed circuit board 6360 mounted to the adapter surfaces 6304 (see FIG. 259). Other portions of the contact elements 6331 engage the electrical contacts of the storage members 6325 attached to connector arrangements 6330 positioned in the passages 6305. A processor coupled to one or both of the circuit boards 6360 can access the memory of each connector arrangement 6320 through the corresponding media reading interface 6330. For example, the contact element 6331 may function substantially the same as contact element 5231 of FIG. 142.

Each bounded contact arrangement 6330 has a width W16 and each slot 6306 has a width W17 (FIG. 251). In general, the width W17 of each adapter slot 6306 is sufficiently large to receive one contact arrangement 6330. A width between the two outermost contact elements 6331 of the bounded contact arrangement 6330 is less than a width of a key of a connector (e.g., key 4115 of FIGS. 104-111) positioned in the respective adapter passage 6305. The width W16 of each contact arrangement 6330, however, may be larger than the width of the connector key. In some implementations, the width W16 of each contact arrangement 6330 is less than 3.35 mm (0.13 inches). Indeed, in some implementations, the width W16 of each contact arrangement 6330 is less than about 3.1 mm (0.12 inches). In certain implementations, the width W16 of each contact arrangement 6330 is no more than about 2.5 mm (0.10 inches). In one example implementation, the width W16 of each contact arrangement 6330 is no more than 2.2 mm (0.09 inches).

Figure 256:
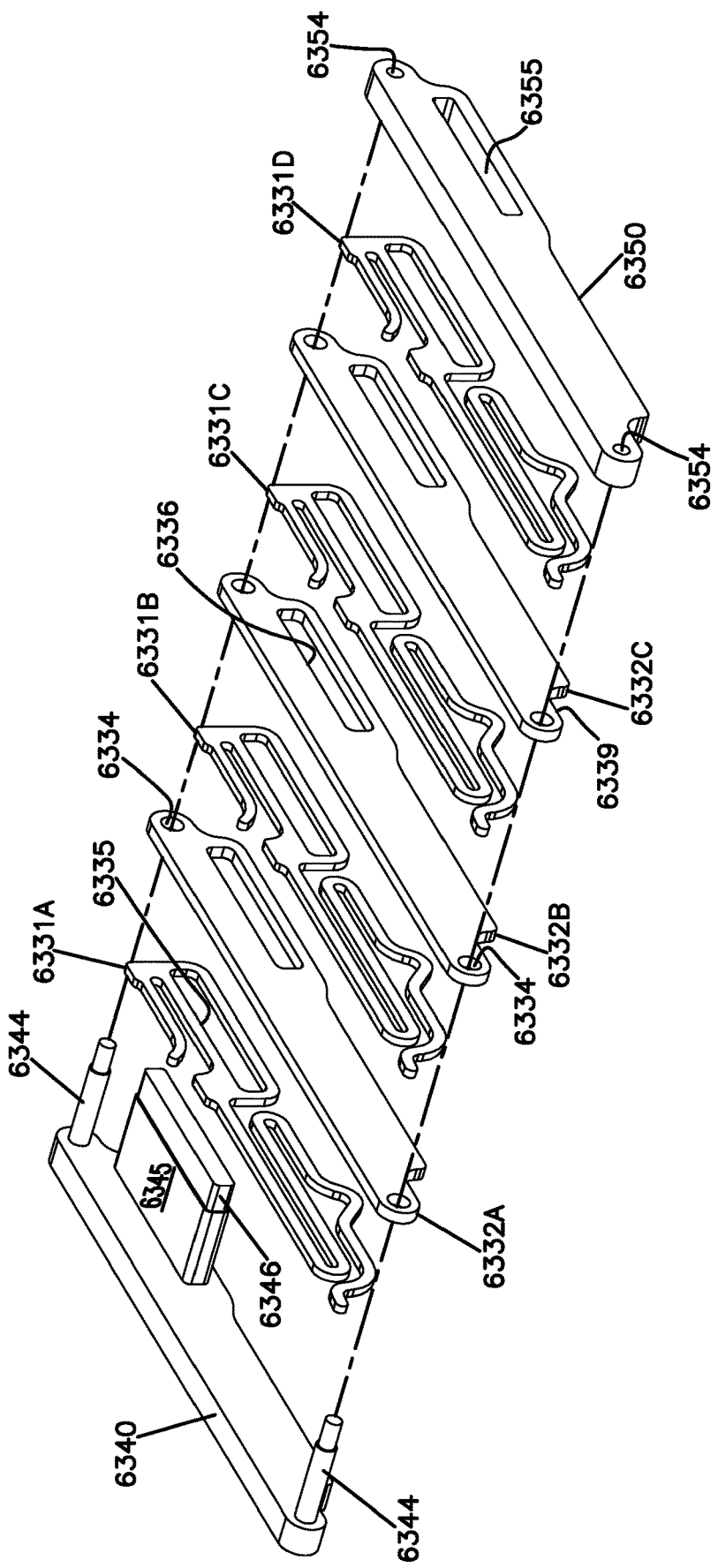
Figure 259:
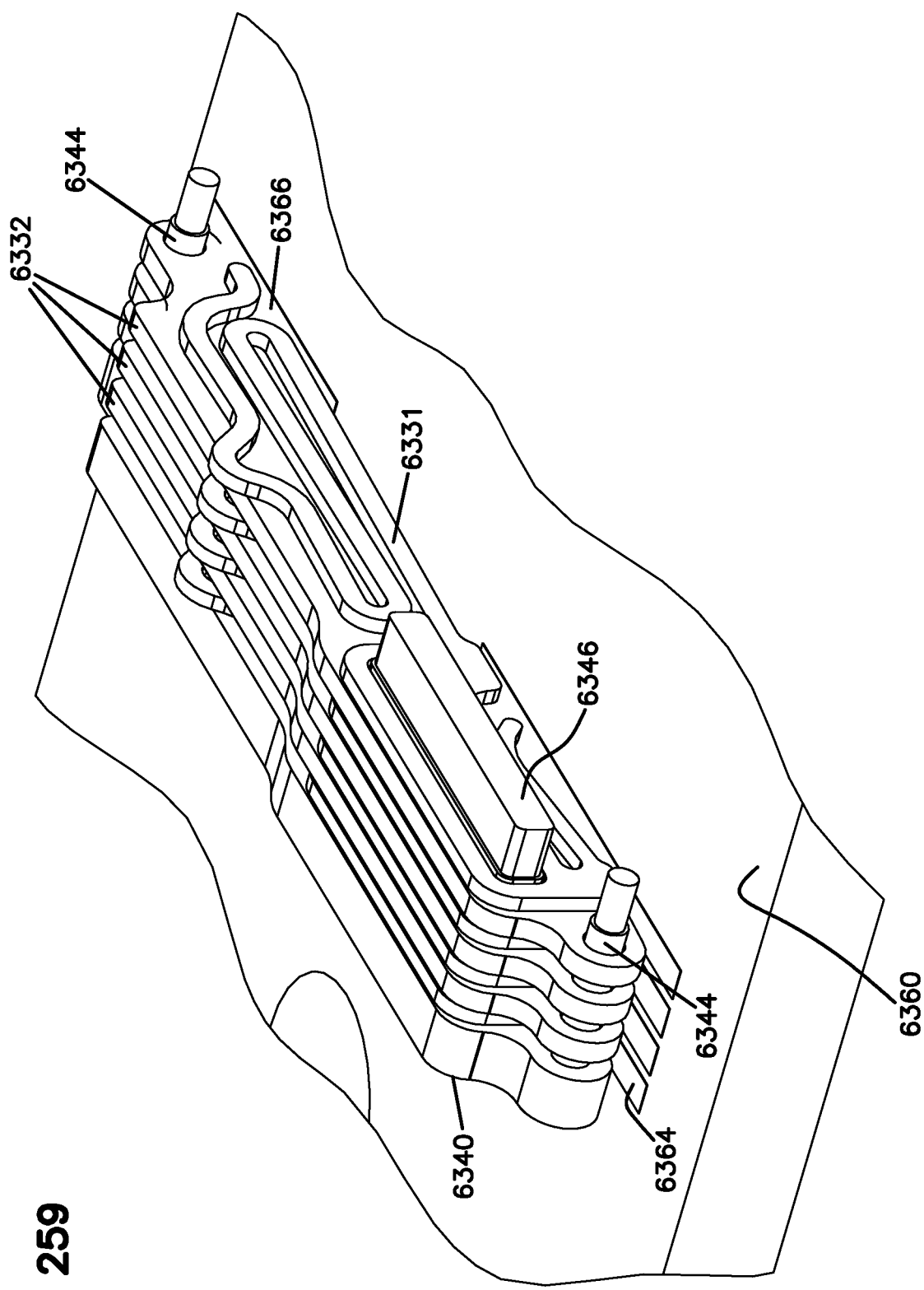
Figure 260:
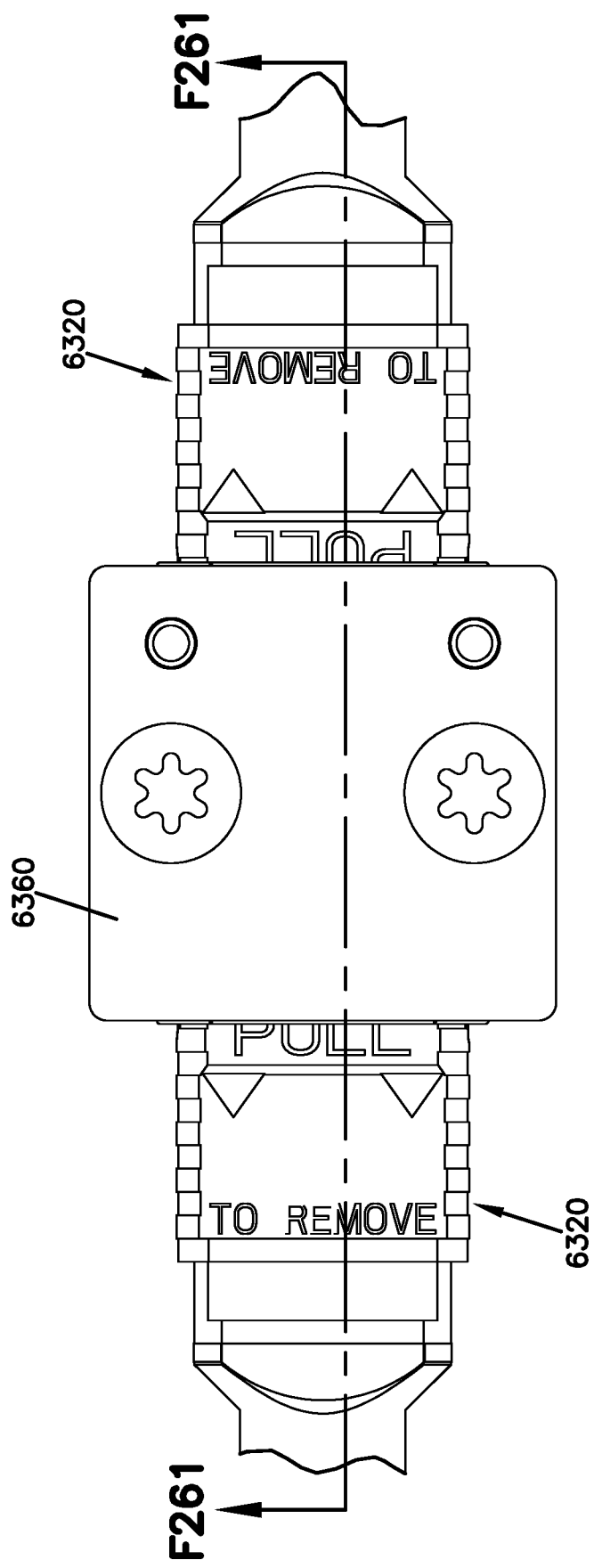

FIG. 256 is an exploded view of one example bounded contact arrangement 6330 suitable for use as a media reading interface in an optical adapter 6310. The bounded contact arrangement 6330 includes one or more spacers 6332 separating a plurality of contact elements 6331. Generally, the spacers 6332 can be used in place of adapter intermediate walls to separate contact elements. The spacers 6332 inhibit physical touching of adjacent contact elements 6331. The spacers 6332 also inhibit electrical connections between adjacent contact elements 6331. In some implementations, the spacers 6332 are sandwiched between contact elements 6331 (see FIG. 256). In other implementations, the contact elements 6331 are sandwiched between the spacers 6332.

For example, the example bounded contact arrangement 6330 shown in FIG. 256 includes a first spacer 6332A positioned between a first contact element 6331A and a second contact element 6331B; a second spacer 6332B positioned between the second contact element 6331B and a third contact element 6331C; and a third spacer 6332C positioned between the third contact element 6331C and a fourth contact element 6331D. In other implementations, the layered contact arrangement 6330 may include additional spacers 6332 on the outsides of the arrangement 6330. A first end piece 6340 borders the first contact element 6331A opposite the first spacer 6332A. A second end piece 6350 borders the fourth contact element 6331D opposite the third spacer 6332C.

The example contact element 6331 shown has the same resilient section, second contact section, and third contact section as the MPO contact element 5231 of FIG. 142. The example contact element 6331 has a different base and attachment section than the MPO contact element 5231. Adjustments also have been made to the first contact section to accommodate the enlargement of the base between the contact elements 5231, 6331. However, any of the contact elements disclosed above may be suitable for use in any of the layered contact arrangements. In still other implementations, other types of contact elements may be used to form layered media reading interfaces.

The contact elements 6321 and spacers 6322 of the bounded contact arrangement 6330 are held together when assembled. In some implementations, one or more pegs, tabs, or other support structures may extend through openings 6335, 6336 defined in the contact elements 6331 and spacers 6332, respectively, to maintain the components in an assembled state. In other implementations, first and second end pieces 6340, 6350 clamp the contact elements 6331 and spacers 6332 together. For example, the first and second end pieces 6340, 6350 may fasten together to sandwich the contact elements 6331 and spacers 6332 therebetween. In other implementations, the first and second end pieces 6340, 6350 may cooperate to encircle the components.

In the example shown in FIG. 256, the first end piece 6340 includes one or more pegs 6344 or other protrusions and the second end piece 6350 defines one or more holes 6354 configured to receive the pegs 6344. In some implementations, the pegs 6344 of the first end piece 6340 snap-fit into the holes 6354 of the second end piece 6350. In other implementations, the pegs 6344 of the first end piece 6340 are heat staked to the second end piece 6350. In other implementations, the first and second end piece 6340, 6350 may be latched together. In still other implementations, the first and second end pieces 6340, 6350 may be glued, welded (e.g., heat welding, ultra-sonic welding, etc.), sintered, tethered, or otherwise secured together.

In some implementations, each spacer 6332 defines opening 6334 through which the pegs 6344 of the first end piece 6340 may pass to further secure the spacers 6332 to the bounded contact arrangement 6330. In certain implementations, each spacer 6332 defines an opening 6334 on opposite ends of the spacer 6332 (see FIG. 256). In other implementations, each spacer 6332 may include greater or fewer peg openings 6334. In certain implementations, each contact element 6331 may define one or more openings that are configured to receive the pegs 6344. In other implementations, neither the spacers 6332 nor the contact elements 6331 are configured to receive the pegs 6344.

In certain implementations, the first and second end pieces 6340, 6350 may include one or more tabs 6345 to aid in retaining the contact elements 6331 and spacers 6332. In some implementations, at least a first tab 6345 may extend between the two end pieces 6340, 6350 to further secure the components in place between the end pieces 6340, 6350. For example, in FIG. 256, each of the contact elements 6331A-6331D and spacers 6332A-6332C defines a hole 6335 that aligns with the holes 6335 of the other components. In the example shown in FIG. 256, the hole 6335 is defined in the base of the contact element 6331. In other implementations, however, the opening 6335 may be defined in another portion of the contact element 6331.

The tab 6345 is positioned through the holes 6335 of the layered components of the bounded contact arrangement 6330. In some implementations, the tab 6345 extends from the first end piece 6340 and is configured to fasten to the second end piece 6350. For example, the tab 6345 may include a reduced diameter section 6346 (FIG. 256) that is configured to extend through a hole 6355 in the second end piece 6350. In certain implementations, the tab 6345 friction-fits, snap-fits, or otherwise secures in the hole 6355 of the second end piece 6350. In other implementations, the tab 6345 is heat-staked to the second end piece 6350. In still other implementations, the tab 6345 extends from the second end piece 6350 and is configured to fasten to the first end piece 6340.

In some implementations, the tab 6345 has a rectangular transverse cross-sectional profile. In other implementations, the tab 6345 has a circular transverse cross-sectional profile. In other implementations, the tab 6345 has a trapezoidal transverse cross-sectional profile. In other implementations, the tab 6345 has a triangular transverse cross-sectional profile. In other implementations, the tab 6345 has an oval, obround, or elliptical transverse cross-sectional profile. In still other implementations, the transverse cross-sectional profile of the tab 6345 may be irregularly shaped (e.g., S-shaped, C-shaped, etc.).

As shown in FIGS. 257-258, each contact element 6331 of the bounded contact arrangement 6330 defines two opposing planar sides connected by a peripheral edge having a thickness T11. In various implementations, the thickness T11 of each contact element 6331 ranges from about 1.27 mm (0.05 inches) to about 0.127 mm (0.005 inches). In certain implementations, the thickness T11 is less than about 0.51 mm (0.02 inches). In some implementation, the thickness T11 is less than about 0.3 mm (0.012 inches). In another implementation, the thickness T8 is about 0.25 mm (0.01 inches). In another implementation, the thickness T11 is about 0.23 mm (0.009 inches). In another implementation, the thickness T11 is about 0.2 mm (0.008 inches). In another implementation, the thickness T11 is about 0.18 mm (0.007 inches). In another implementation, the thickness T11 is about 0.15 mm (0.006 inches). In other implementations, the thickness T11 may vary across the body of the contact member 6331.

Figure 253:
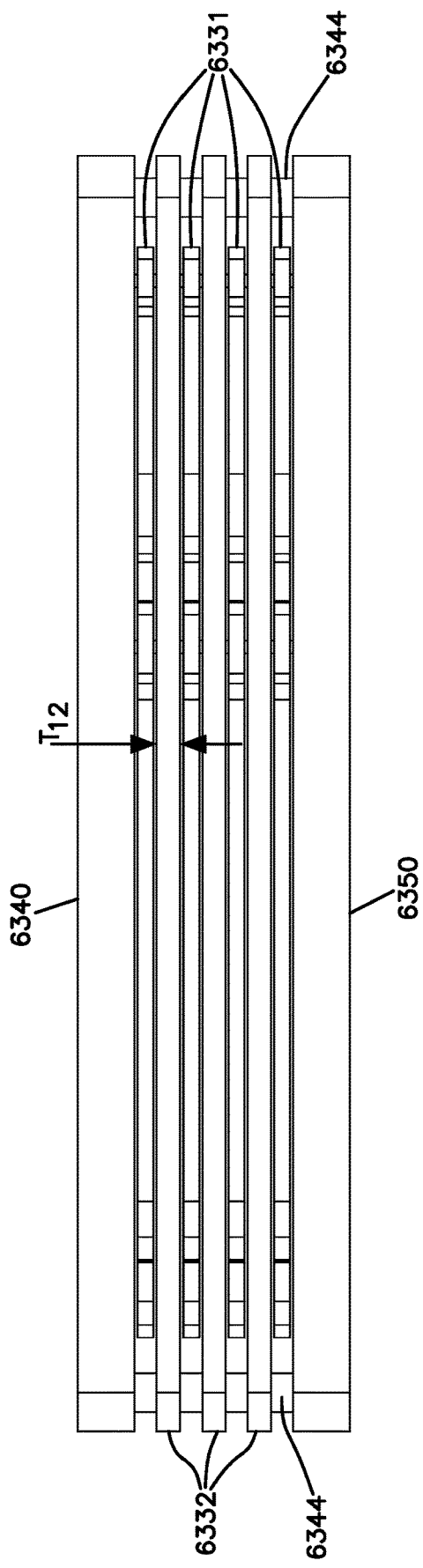
Figure 254:
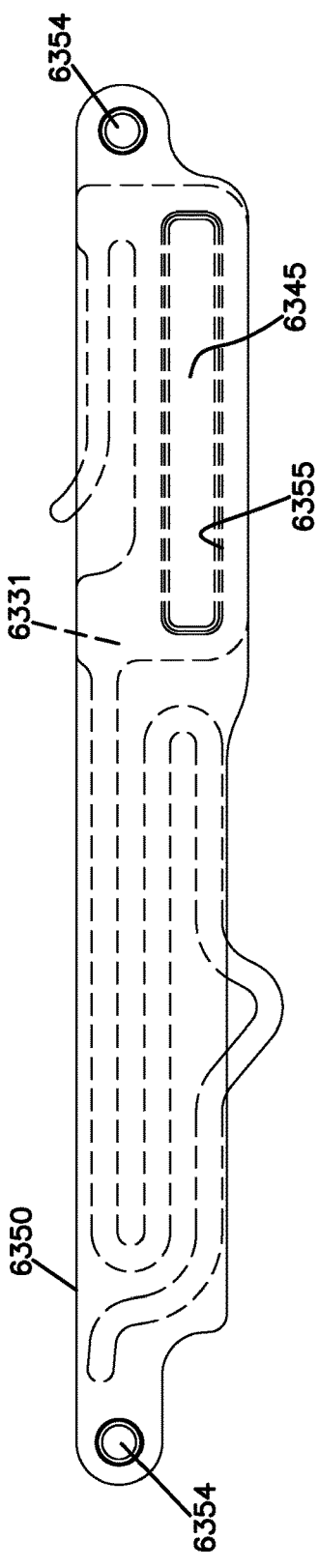

As shown in FIG. 252-256, each spacer 6332 of the bounded contact arrangement 6330 defines two opposing planar sides connected by a peripheral edge having a thickness T12 (FIG. 253). In some implementations, each spacer 6332 is sufficiently thick to inhibit electrical contact between adjacent contact elements 6331. For example, each spacer 6332 may be sufficiently thick to space adjacent contact elements 6331 about 0.58 mm (0.02 inches) center to center. In various implementations, the thickness T12 of each spacer 6332 is within the range of about 0.1 mm (0.004) inches to about 0.46 mm (0.018 inches). Indeed, in some implementations, the thickness T12 of each spacer 6332 is within the range of about 0.12 mm (0.005) inches to about 0.18 mm (0.007 inches). In one implementation, the thickness T12 of each spacer 6332 is about 0.15 mm (0.006 inches). Indeed, in some implementations, the thickness T12 of each spacer 6332 is within the range of about 0.25 mm (0.005) inches to about 0.41 mm (0.016 inches). In one implementation, the thickness T12 of each spacer 6332 is about 0.38 mm (0.015 inches).

In general, each spacer 6332 has a transverse cross-sectional profile sufficient to extend between and separates portions of adjacent contact elements 6331. For example, in some implementations, portions of each spacer 6332 extend between the third contact surfaces of adjacent contacts elements 6231 (e.g., third contact surfaces 5239 of contact elements 5231). In some implementations, the extension 6339 (FIG. 256) maintains the separation of the third contact surfaces as the third contact surfaces move between flexed and unflexed positions (e.g., as connectors are inserted into and removed from the adapter 6310). In certain implementations, the extension 6339 is sufficiently large so as to extend between the third contact surfaces in both the flexed and unflexed positions.

In some implementations, portions of each spacer 6332 extend between the first contact surfaces of adjacent contacts elements 6231 (e.g., first contact surfaces 5235 of contact elements 5231). In some implementations, the main body of the spacer 6332 does not extend between the second contact sections of adjacent contact members 6331 (e.g., second contact sections 5238 of contact element 5231), but rather extends sufficiently between the contact elements 6331 so as to inhibit sideways flexing of the second contact sections. In general, the spacer 6332 is sufficiently short to enable optical connectors access to the second contact sections of the contact element 6331. In certain implementations, the spacer 6332 is sufficiently short to enable optical connectors access to the second contact surfaces after the second contact surfaces have been moved towards flexed positions (see FIG. 261).

In some implementations, each contact member 6331 extends between a first end and a second end. For example, the base of the contact member 6331 may define a first end of the contact member 6331 and the third contact section may define a second end of the contact member 6331. The contact member 6331 also extends between a top and a bottom. For example, the first and third contact sections may extend towards the top of the contact member 6331 and the second contact section may extend towards the bottom of the contact member 6331. As used herein, the terms "top" and "bottom" are not meant to imply a proper orientation of the contact member 6331 or that the top of the contact member 6331 must be located above the bottom of the connector 6331. Rather, the terms are used for ease in understanding and are assigned relative to the viewing plane of FIG. 257.

Figure 261:
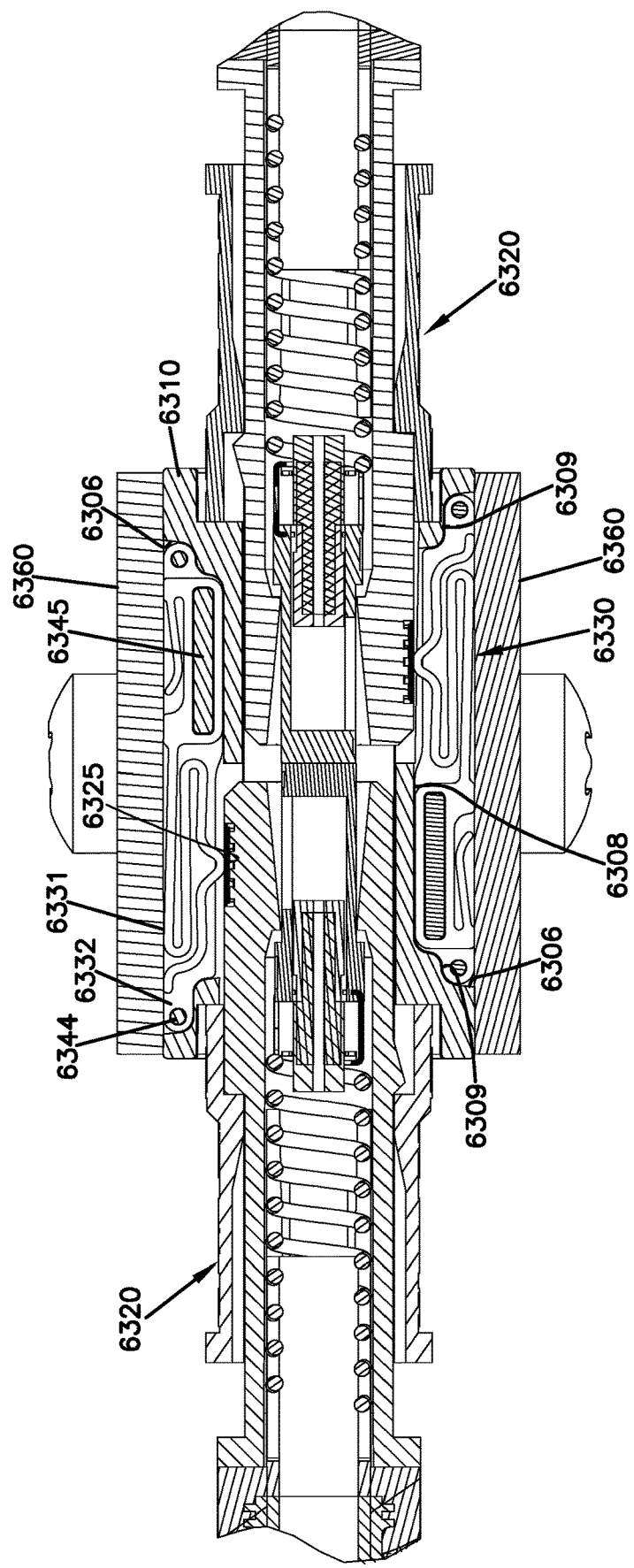

FIG. 261 is a cross-sectional view of the adapter 6310 showing an example bounded media reading interface 6330 positioned in each slot 6306 of an adapter 6310. At least a first opening 6306 is defined in the top 6304 of the adapter 6310 towards the front of the adapter 6310 and a second opening 6306 is defined in the top 6304 of the adapter 6310 towards the rear of the adapter 6310. The support ledge 6308 extends partially along the opening 6306. The support ledge 6308 is sufficiently short to provide access from a respective passage 6305 to the second contact surface of any contact element 6331 of the bounded contact arrangement 6330.

The bounded contact arrangement 6330 is inserted into the adapter opening 6306 as a modular unit (see FIG. 251). For example, a portion of the bounded contact arrangement 6330 is configured to seat on the ledge 6308 of the adapter 6310 when inserted into the adapter opening 6306. Opposite ends of the bounded contact arrangement 6330 seat on the shoulders 6309. In some implementations, the portion of the bounded contact arrangement 6330 configured to seat on the ledge 6308 is less than about half the length of the bounded contact arrangement 6320. In other implementations, the portion of the bounded contact arrangement 6330 configured to seat on the ledge 6308 may be about half of the length of the bounded contact arrangement 6330 or more.

As shown, inserting a connector arrangement 6320 into the port 6305 of the adapter 6310 biases the second contact section of the contact element 6331 upwardly. Lifting of the second contact section causes the third contact section to lift upwardly toward a contact pad 6366 (FIG. 259) on the circuit board 6360. In certain implementations, biasing the third contact section upwardly causes the contact surface of the third contact section to engage (e.g., touch or slide against) the contact pad 6366 on the circuit board 6360. If the connector 6320 includes a storage device 6325, then the contact surface of the second contact section of the contact member 6331 engages (e.g., touch or slide against) a contact pad on the storage device 6325 to connect the storage device 6325 to the circuit board 6360.

FIGS. 262-275 illustrate another example implementation of a connector system 9000 that can be utilized on a connector assembly (e.g., a communications panel) having PLI functionality as well as PLM functionality. The connector system 9000 includes at least one example communications coupler assembly 9200 and at least two connector arrangements 9100. In the example shown, the communications coupler assembly 9200 is configured to receive four connector arrangements 9100.

The communications coupler assembly 9200 is configured to be mounted to a connector assembly, such as a communications blade or a communications panel. One or more connector arrangements 9100, which terminate segments of communications media, are configured to communicatively couple to other segments of physical communications media at the coupler assembly 9200 (e.g., see FIG. 272). Accordingly, communications data signals carried by a media segment terminated by a first connector arrangement 9100 can be propagated to another media segment terminated by a second connector arrangement 9100 through the communications coupler assembly 9200.

In some implementations, each connector arrangement 9100 defines a duplex fiber optic connector arrangement including two connectors, each of which terminates an optical fiber. In the example shown, the connector arrangements 9100 are substantially the same as connector arrangements 4100 of FIGS. 103-111 with different contact arrangements on the storage device. In other implementations, however, the connector arrangements 9100 may include an SC-type connector arrangement, an ST-type connector arrangement, an FC-type connector arrangement, an MPO-type connector arrangement, an LX.5-type connector arrangement, or any other type of connector arrangement.

In accordance with some aspects, each communications coupler assembly 9200 is configured to form a single link between segments of physical communications media. For example, each communications coupler assembly 9200 can define a single passage at which a first connector arrangement is coupled to a second connector arrangement. In accordance with other aspects, however, each communications coupler assembly 9200 is configured to form two or more links between segments of physical communications media. For example, in the example shown in FIG. 264, the communications coupler assembly 9200 defines four passages 9215.

In some implementations, each passage 9215 of the communications coupler assembly 9200 is configured to form a single link between first and second connector arrangements 9100. In other example implementations, two or more passages 9215 can form a single link between connector arrangements 9100 (e.g., two ports can form a link between duplex connector arrangements). In still other example implementations, each communications coupler assembly 9200 can form a one-to-many link. For example, the communications coupler assembly 9200 can connect a duplex connector arrangement to two single connector arrangements or to another duplex connector arrangement.

Figure 262:
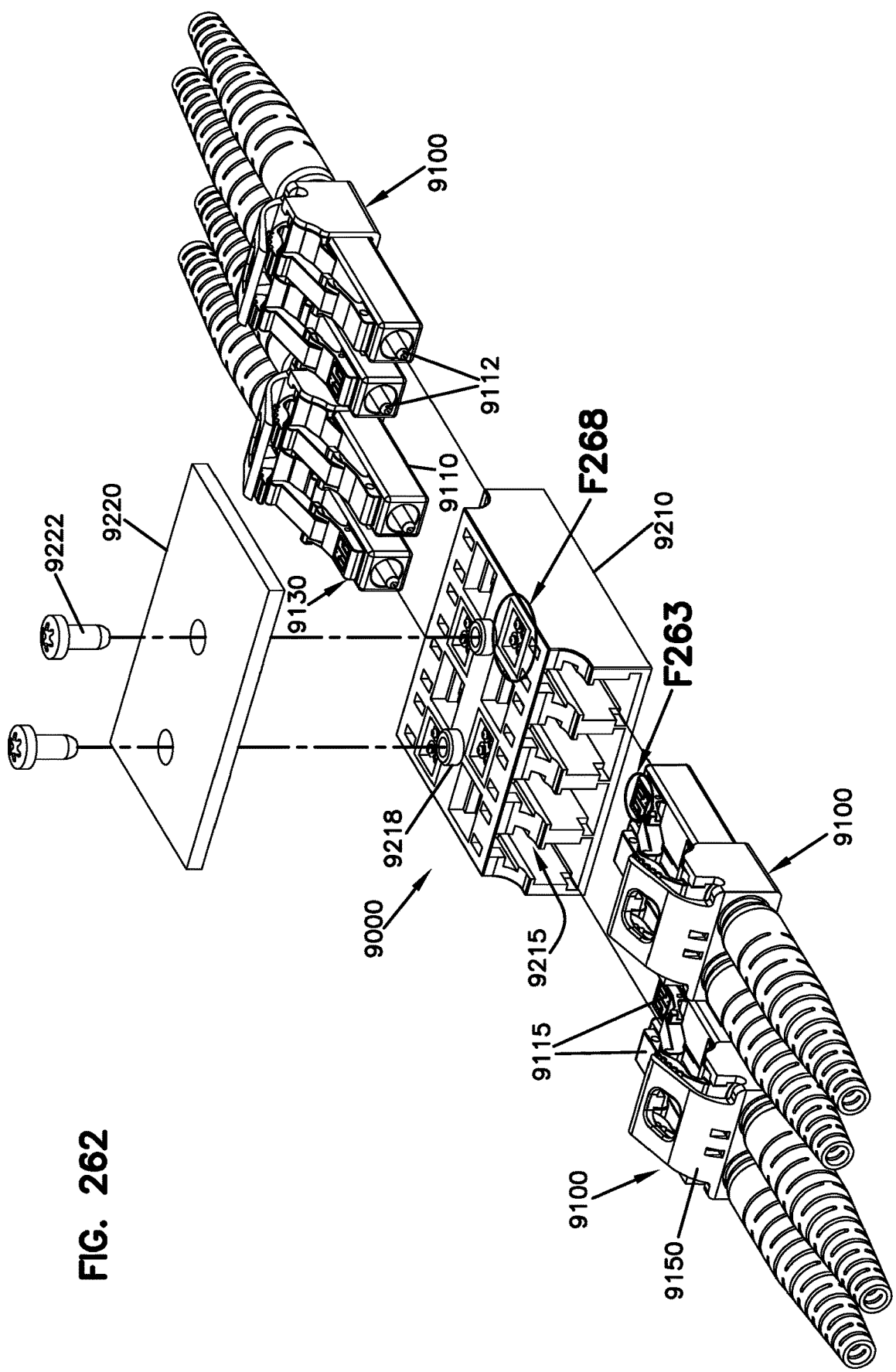
FIGS. 262-275 illustrate a sixteenth example implementation of a connector system that can be utilized on a connector assembly having PLI functionality as well as PLM functionality in accordance with aspects of the present disclosure.
Figure 263:
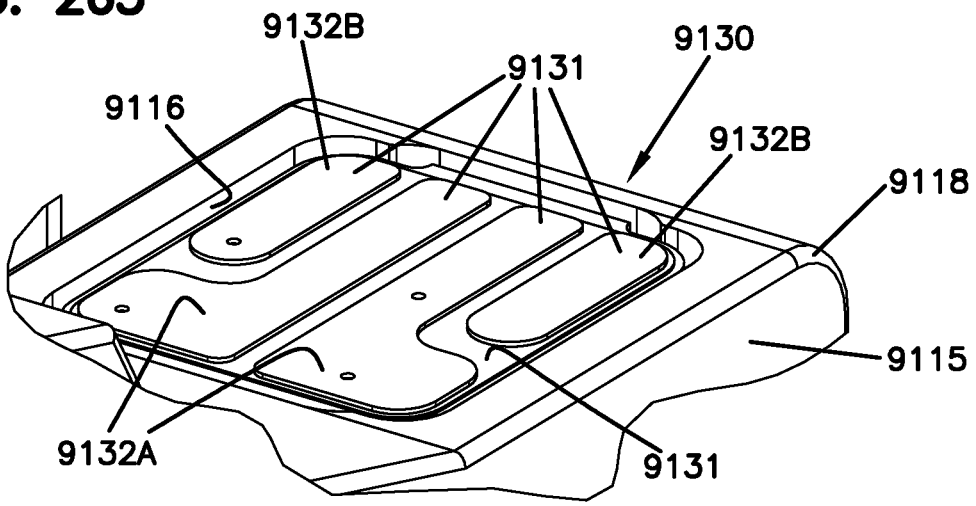
Figure 268:
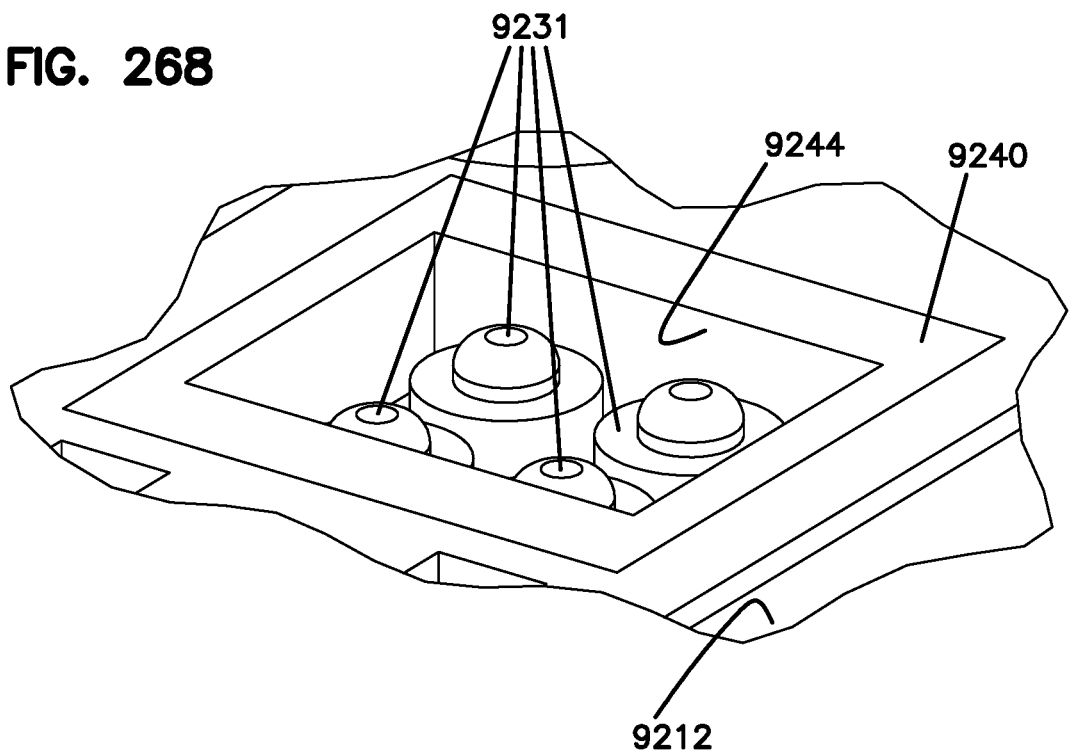

One example implementation of a connector arrangement 9100 is shown in FIG. 262. Each connector arrangements 9100 includes one or more fiber optic connectors, each of which terminates one or more optical fibers. In the example shown, each connector arrangement 9100 defines a duplex fiber optic connector arrangement including two fiber optic connectors held together using a clip 9150. In another example implementation, a connector arrangement 9100 can define a single fiber optic connector. As shown, each fiber optic connector includes a connector body protecting a ferrule 9112 that retains an optical fiber. The connector body is secured to a boot for providing bend protection to the optical fiber. In the example shown, the connector is an LC-type fiber optic connector. The connector body includes a fastening member (e.g., clip arm) that facilitates retaining the fiber optic connector within a passage 9215 in the communications coupler assembly 9200.

Each connector arrangement 9100 is configured to store physical layer information. For example, a storage device 9130 may be installed on or in the body of one or more of the fiber optic connectors of each connector arrangement 9100. In the example shown, the storage device 9130 is installed on only one fiber optic connector of a duplex connector arrangement 9100. In other implementations, however, a storage device 9130 may be installed on each fiber optic connector of a connector arrangement 9100. In the example shown, the storage device 9130 is located within a key 9115 of each connector arrangement 9100. In other implementations, the storage device 9130 may be located at another position on or in the connector arrangement 9100.

One example storage device 9130 includes a printed circuit board 9131 on which memory circuitry can be arranged (see FIG. 275). In one example implementation, the storage device 9130 includes an EEPROM circuit 9133 (FIG. 164) arranged on the printed circuit board 9131. In the example shown in FIG. 156, an EEPROM circuit 9133 is arranged on the non-visible side of the circuit board 9131. In other implementations, however, the storage device 9130 can include any suitable type of non-volatile memory.

Electrical contacts 9132 also are arranged on the printed circuit board 9131 for interaction with a media reading interface of the communications coupler assembly 9200 (as described in more detail herein). In the example shown in FIGS. 262-263, the electrical contacts 9132 include two inner contacts 9132A and two outer contacts 9132B. The inner contacts 9132A are generally L-shaped with the cantilevered section extending towards the edges of the printed circuit board 9131. The outer contacts 9132B are generally shorter than the inner contacts 9132A. However, any of the implementations of electrical contacts 9132 disclosed herein are suitable for use in the storage device 9130.

FIGS. 264-268 show one example implementation of a communications coupler assembly 9200 implemented as a fiber optic adapter. The example communications coupler assembly 9200 includes an adapter housing 9210 configured to align and interface two or more fiber optic connector arrangements 9100. In other example implementations, the adapter housing 9210 may be configured to communicatively couple together a fiber optic connector with a media converter (not shown) to convert the optical data signals into electrical data signals, wireless data signals, or other such data signals. In still other implementations, the communications coupler assembly 9200 can include an electrical termination block that is configured to receive punch-down wires, electrical plugs (e.g., for electrical jacks), or other types of electrical connectors.

Figure 264:
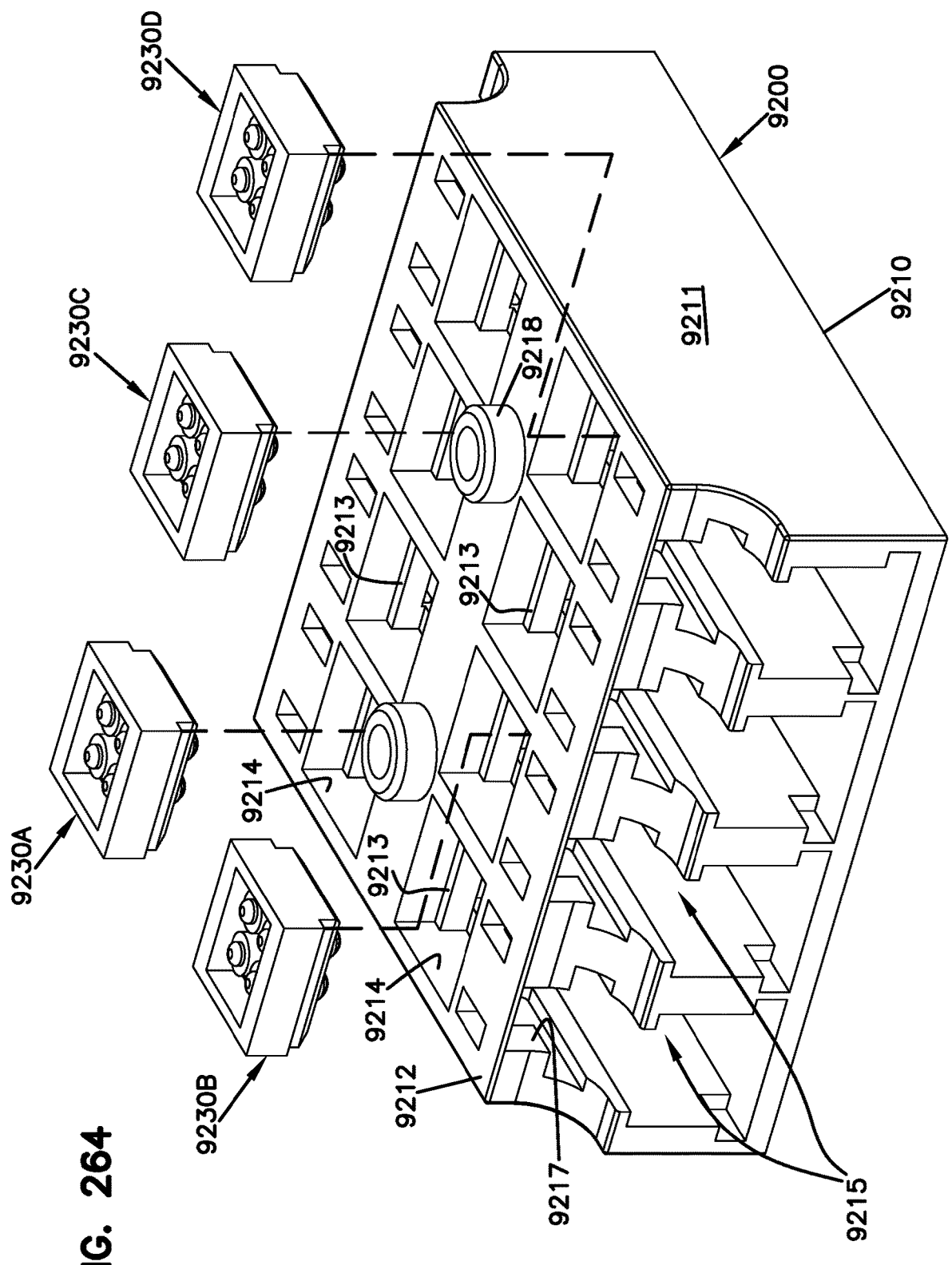

The example adapter housing 9210 is formed from opposing sides 9211 interconnected by first and second ends 9212 (FIG. 264). The sides 9211 and ends 9212 each extend between a front and a rear. The adapter housing 9210 defines one or more passages extending between the front and rear ends. Each end of each passage defines a port 9215 configured to receive a connector arrangement or portion thereof (e.g., one fiber optic connector of duplex connector arrangement 9100 of FIG. 262).

In the example shown, the adapter housing 9210 defines four passages and eight ports 9215. In other implementations, however, the adapter housing 9210 may define one, two, three, six, eight, ten, twelve, sixteen, or even more passages. Sleeves (e.g., split sleeves) 9216 are positioned within the passages to receive and align the ferrules 9112 of fiber optic connectors (see FIG. 272). In certain implementations, the adapter housing 9210 also defines latch engagement channel 9217 (FIG. 264) at each port 9215 to facilitate retention of the latch arms of the fiber optic connectors. Each latch engagement channel 9217 is sized and shaped to receive the key or keys 9115 of the connector arrangement 9100.

Figure 269:
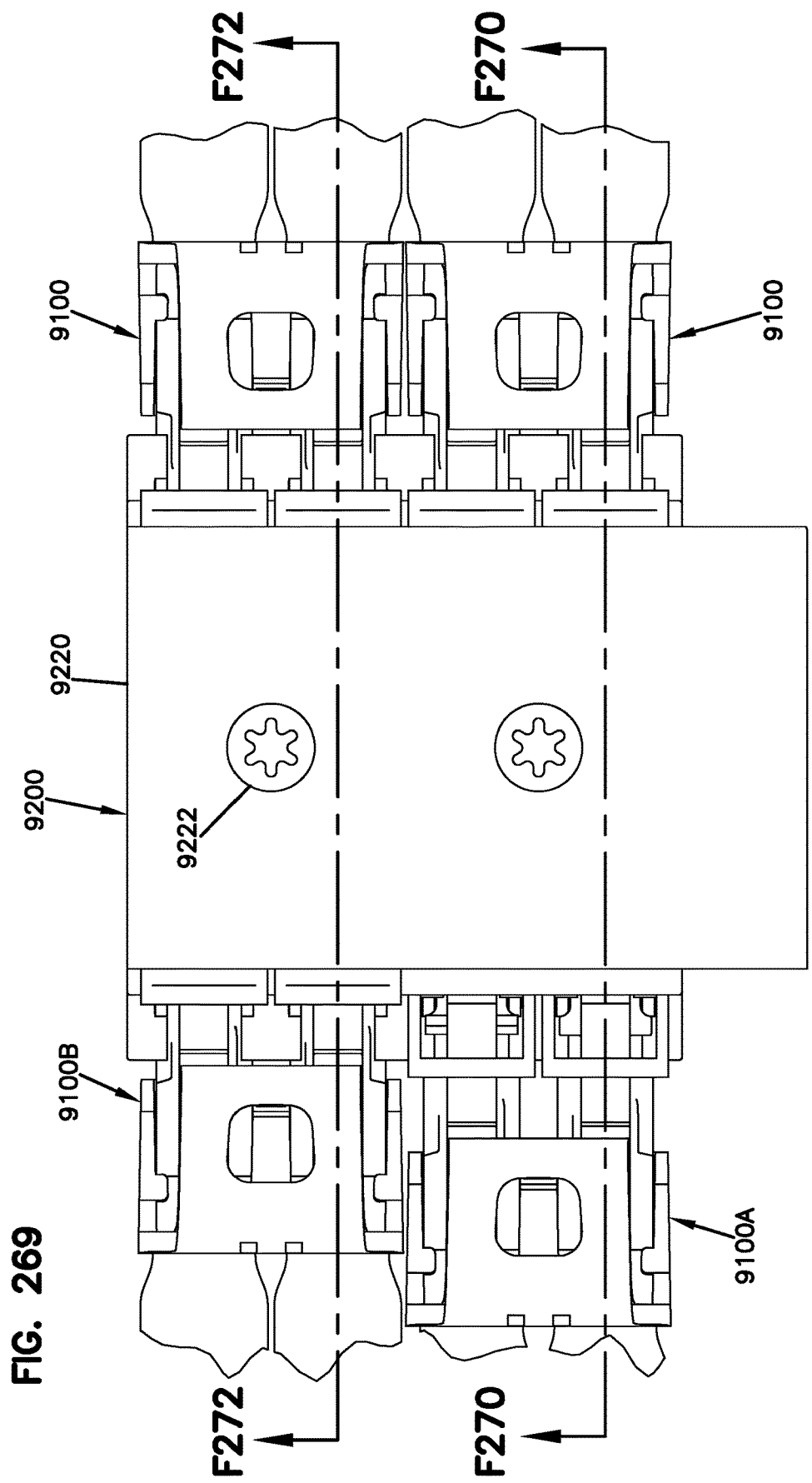

As shown in FIGS. 262 and 269, a printed circuit board 9220 is configured to secure (e.g., via fasteners 9222) to the adapter housing 9210. In some implementations, the example adapter housing 9210 includes two annular walls 9218 in which the fasteners 9222 can be inserted to hold the printed circuit board 9220 to the adapter housing 9210 (see FIG. 262). Non-limiting examples of suitable fasteners 9222 include screws, snaps, and rivets. For ease in understanding, only a portion of the printed circuit board 9220 is shown in FIGS. 262 and 269. It is to be understood that the printed circuit board 9220 electrically connects to a data processor and/or to a network interface (e.g., the processor 217 and network interface 216 of FIG. 2). It is further to be understood that multiple communications coupler housings 9210 can be connected to the printed circuit board 9220 within a connector assembly (e.g., a communications panel).

The fiber optic adapter 9210 includes one or more media reading interfaces 9230, each configured to connect the printed circuit board 9220 to the storage devices 9130 of the fiber optic connector arrangements 9100 plugged into the fiber optic adapter 9210. Each media reading interface 9230 is positioned in an opening 9214 that extends between an exterior surface 9212 of the adapter 9210 and one of the passages of the adapter 9210. Portions of each media reading interfaces 9230 engage contacts and tracings on the printed circuit board 9220 mounted to the surface 9212 of the adapter 9210. Other portions of the media reading interfaces 9230 engage the electrical contacts 9132 of any storage members 9130 attached to the connector arrangements 9100 positioned in the passages (see FIGS. 272-275). A processor coupled to the circuit board 9220 can access the memory 9133 of each connector arrangement 9100 through a corresponding media reading interface 9230.

Figure 265:
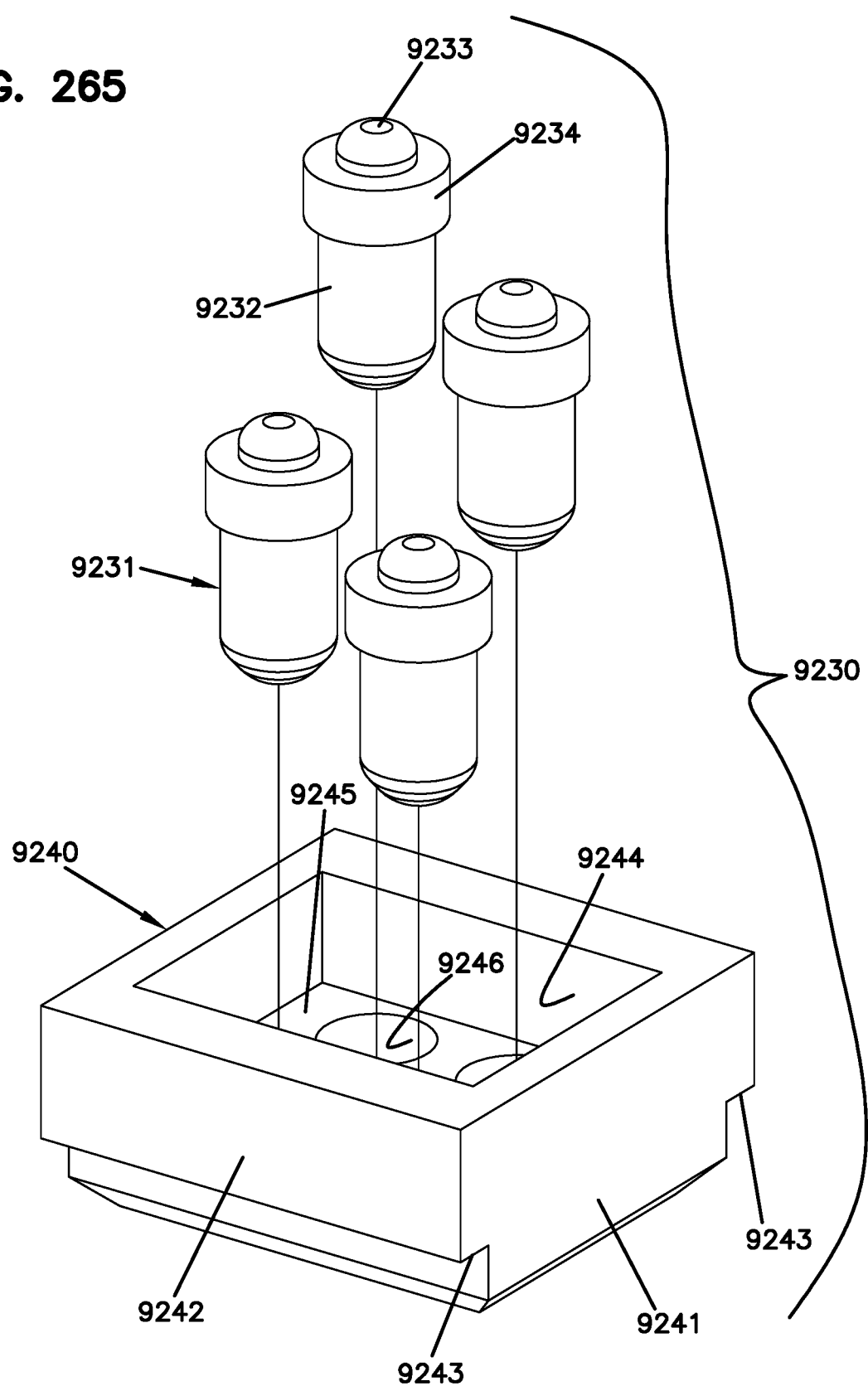
Figure 266:
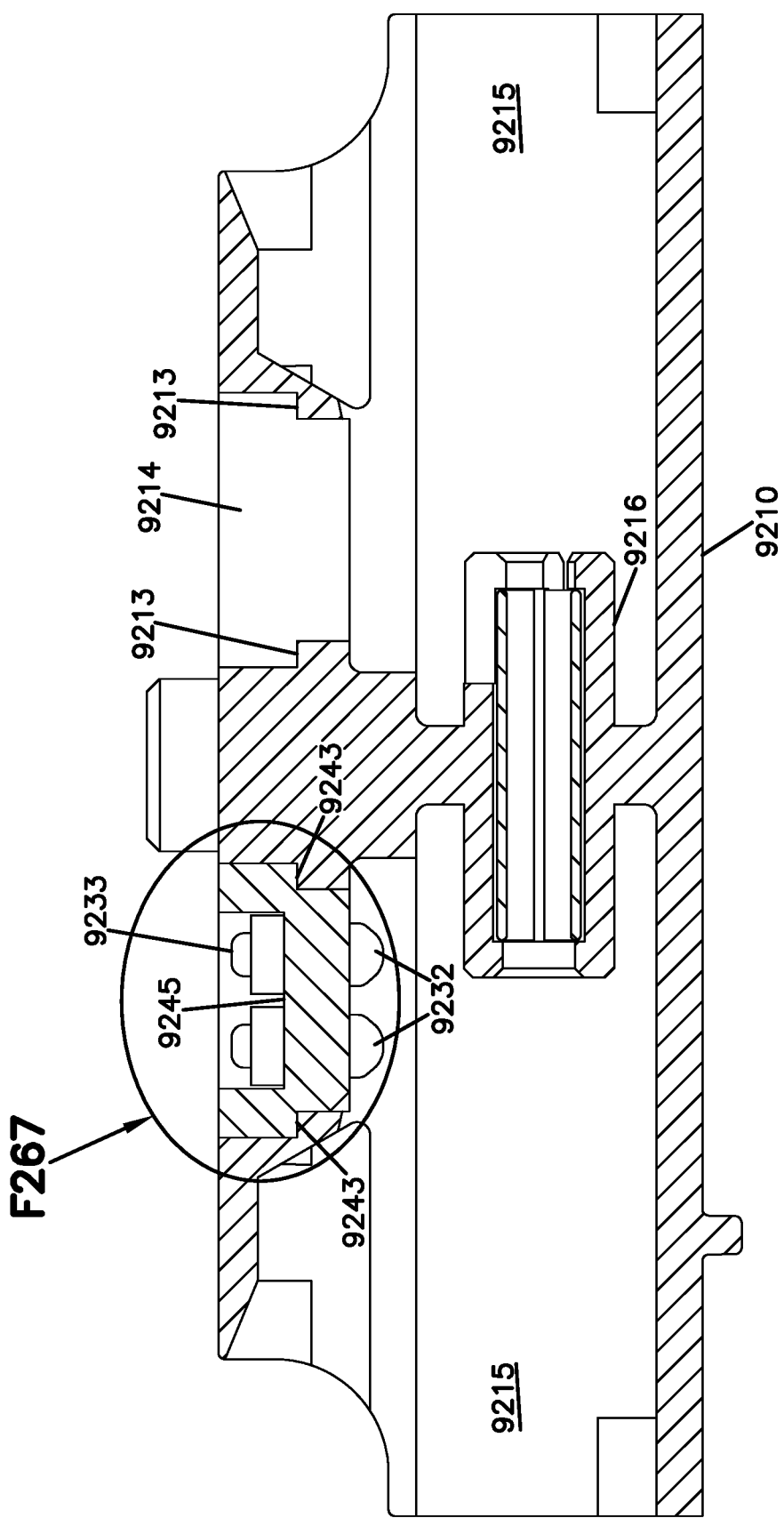
Figure 267:
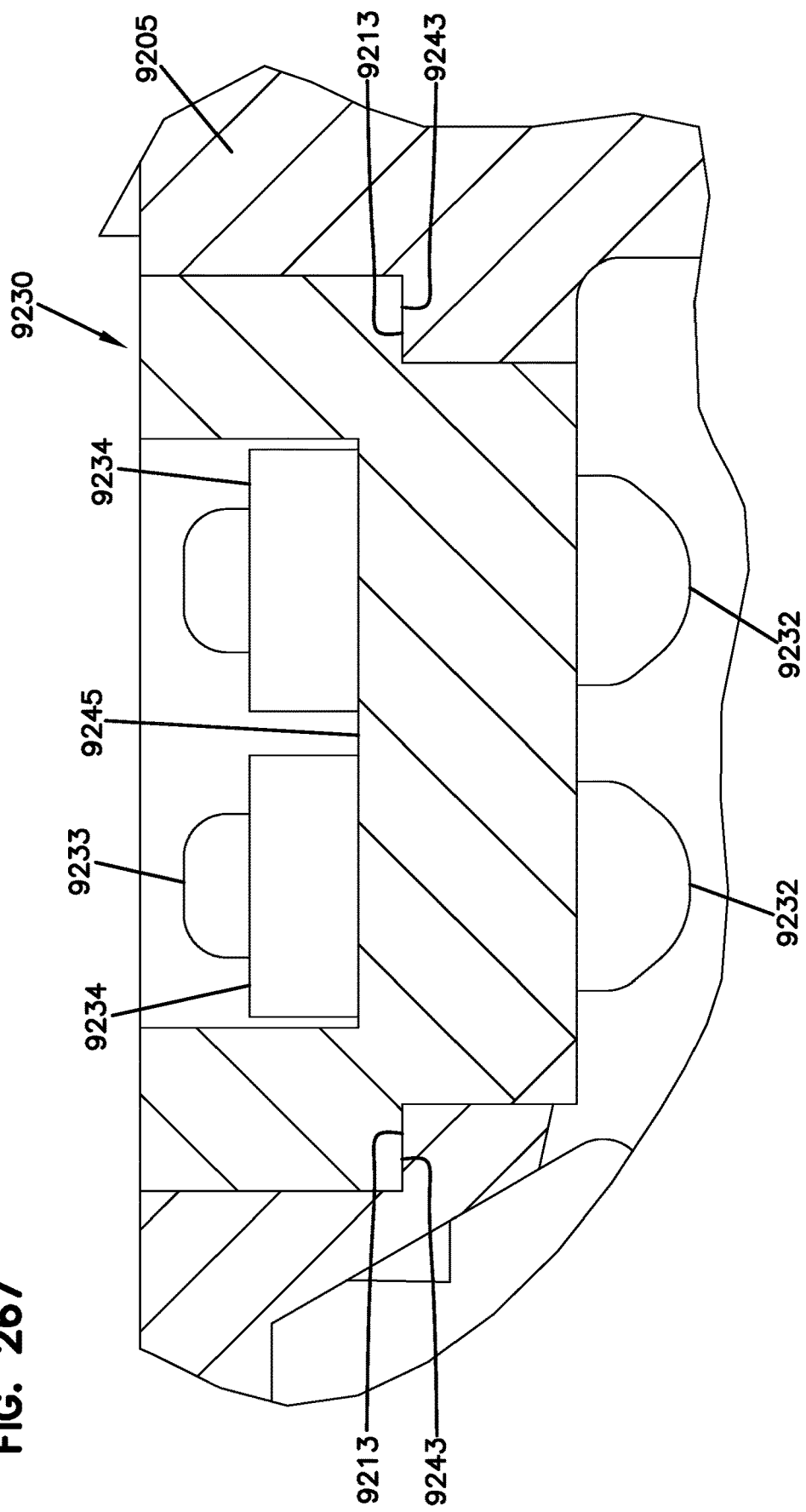

In general, each media reading interface 9230 is formed from one or more contact members 9231 (see FIG. 265). For example, in certain implementations, the media reading interface 9230 includes at least a first contact member 9231 that transfers power, at least a second contact member 9231 that transfers data, and at least a third contact member 9231 that provides grounding. In one implementation, the media reading interface 9230 includes a fourth contact member. In other implementations, however, the media reading interface 9230 include greater or fewer contact members 9231.

Each contact member 9231 includes at least two contact sections defining contact surfaces. A first contact section 9236 contacts the printed circuit board 9220 and a second contact section 9235 contacts the storage device 9130 on a corresponding connector arrangement 9100. The contact members 9231 of the media reading interface 9230 are positioned within a recessed section 9244 of an interface housing 9240. In general, the contact members 9231 are positioned to align with the contact pads 9132 of a connector 9100 when the connector 9100 and the media reading interface 9230 are received at the adapter 9210.

In the example shown, four contact members 9231 are positioned in the housing 9240 in a square pattern. For example, each of the contact members 9231 may be positioned to be about 0.14 inches from an adjacent contact member 9231 measured center-to-center. In other implementations, the contact members 9231 may be positioned closer together or farther apart. In still other implementations, greater or fewer contact members 9231 may be positioned in other configurations (e.g., a diamond pattern, a ring pattern, a rectangular pattern, a triangular pattern, columns, and/or rows) in which the contact members 9231 will align with respective contact pads 9132 on the connector arrangement 9100.

The interface housing 9240 includes opposing sides 9241 extending between opposing ends 9242. In certain implementations, the outer surfaces of the ends 9242 are stepped inwardly to define shoulders 9243. The recess 9244 in a top surface of the housing 9240 leads to a support surface 9245 in which one or more holes 9246 are defined. The holes 9246 extend between the support surface 9245 and the bottom of the housing 9240. Each contact member 9231 extends at least partially through one of the through-holes 9246. For example, each contact member 9231 may include a collar 9234 having a diameter of sufficient size to inhibit the contact member 9231 from passing completely through the holes 9246.

In some implementations, at least one end wall 9212 of the adapter 9210 defines one or more openings 9214 sized and configured to receive the contact arrangements 9230. The adapter 9210 also defines shoulders 9213 extending laterally into the opening 9214. The shoulders 9213 are configured to receive and support the shoulders 9243 of the interface housing 9240 to maintain the media reading interfaces 9230 within the openings 9214 (see FIG. 266). In certain implementations, the shoulders 9213 are provided at the front and rear of the opening 9214. In other implementations, the shoulders 9213 are provided on all sides of the opening 9214.

In some implementations, the openings 9214 are defined in the top end wall 9214. In other implementations, the opening 9214 may be defined in both end walls 9212. Each opening 9214 extends between the end wall 9212 and one of the passages within the adapter 9210. Each opening 9214 is associated with one of the ports 9215 defined by the adapter 9210. In some implementations, two openings 9214 are provided in a single end wall 9212 per passage. In other implementations, one opening 9214 is provided in each end wall 9212 per passage.

Figure 270:
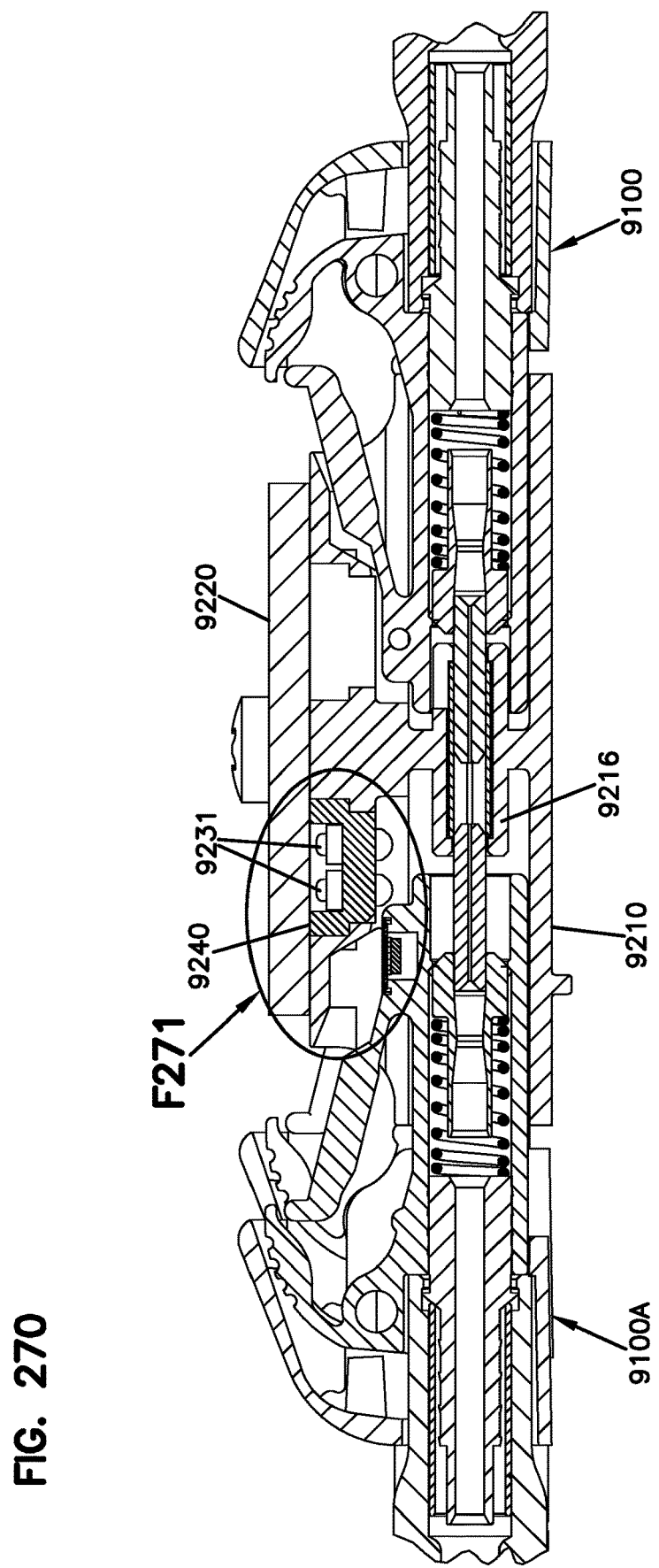
Figure 271:
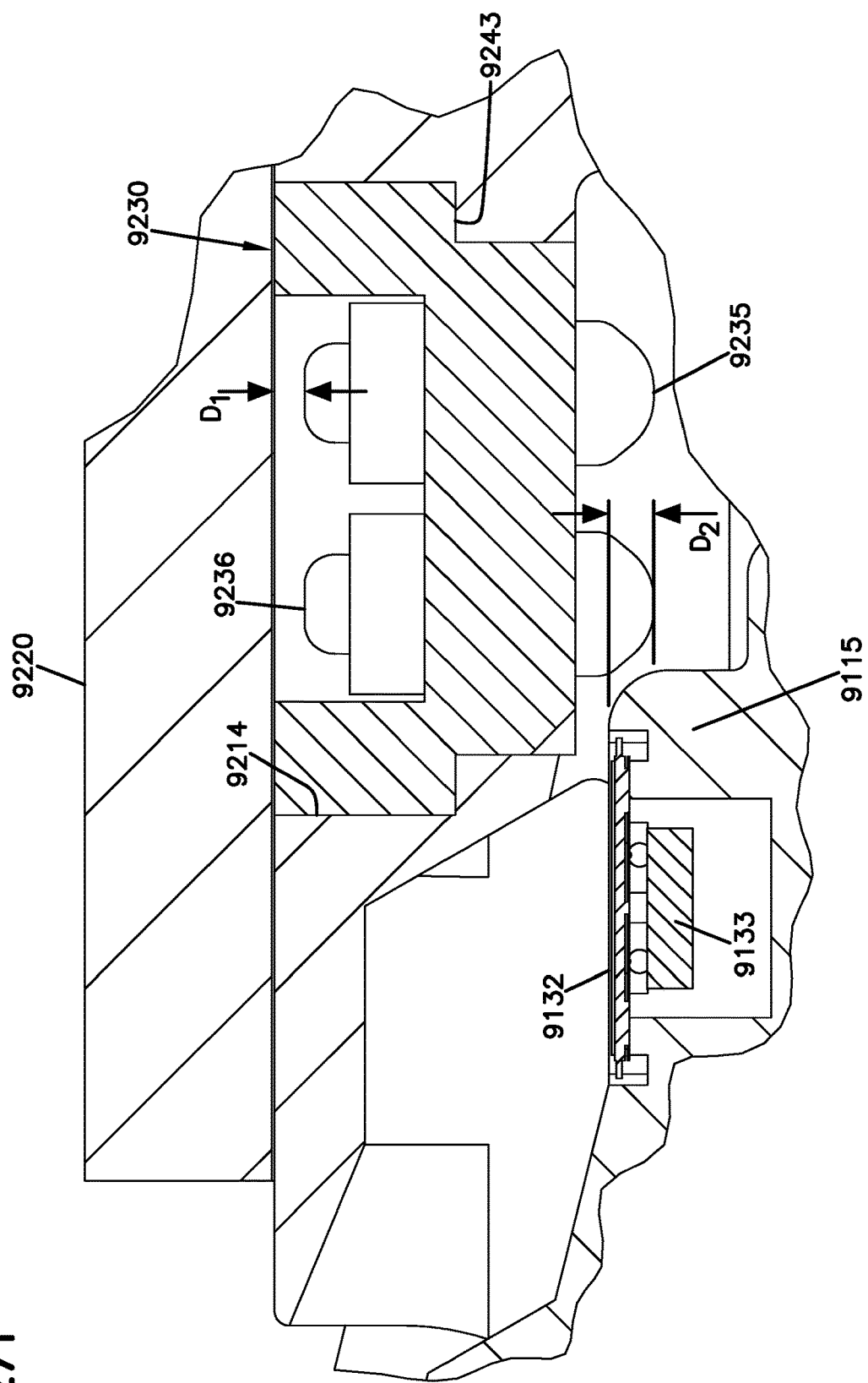
Figure 272:
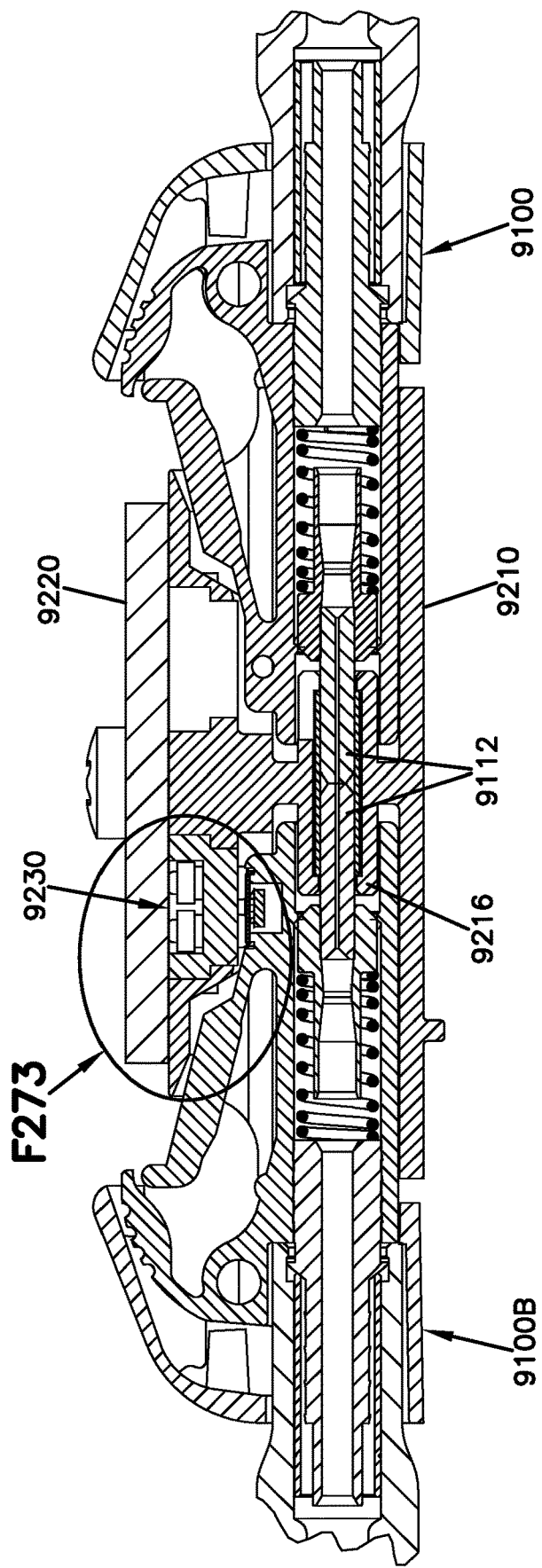
Figure 273:
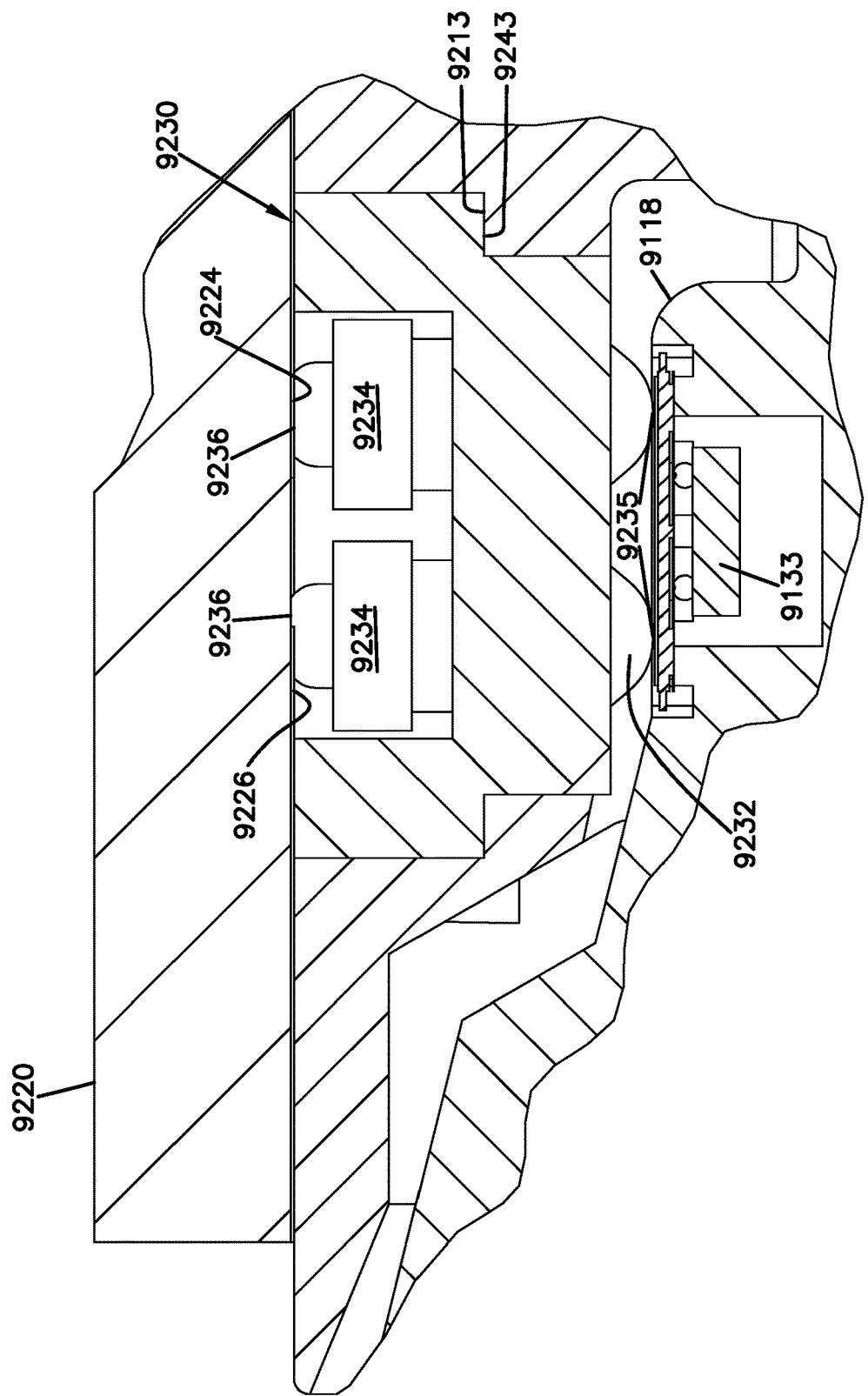
Figure 274:
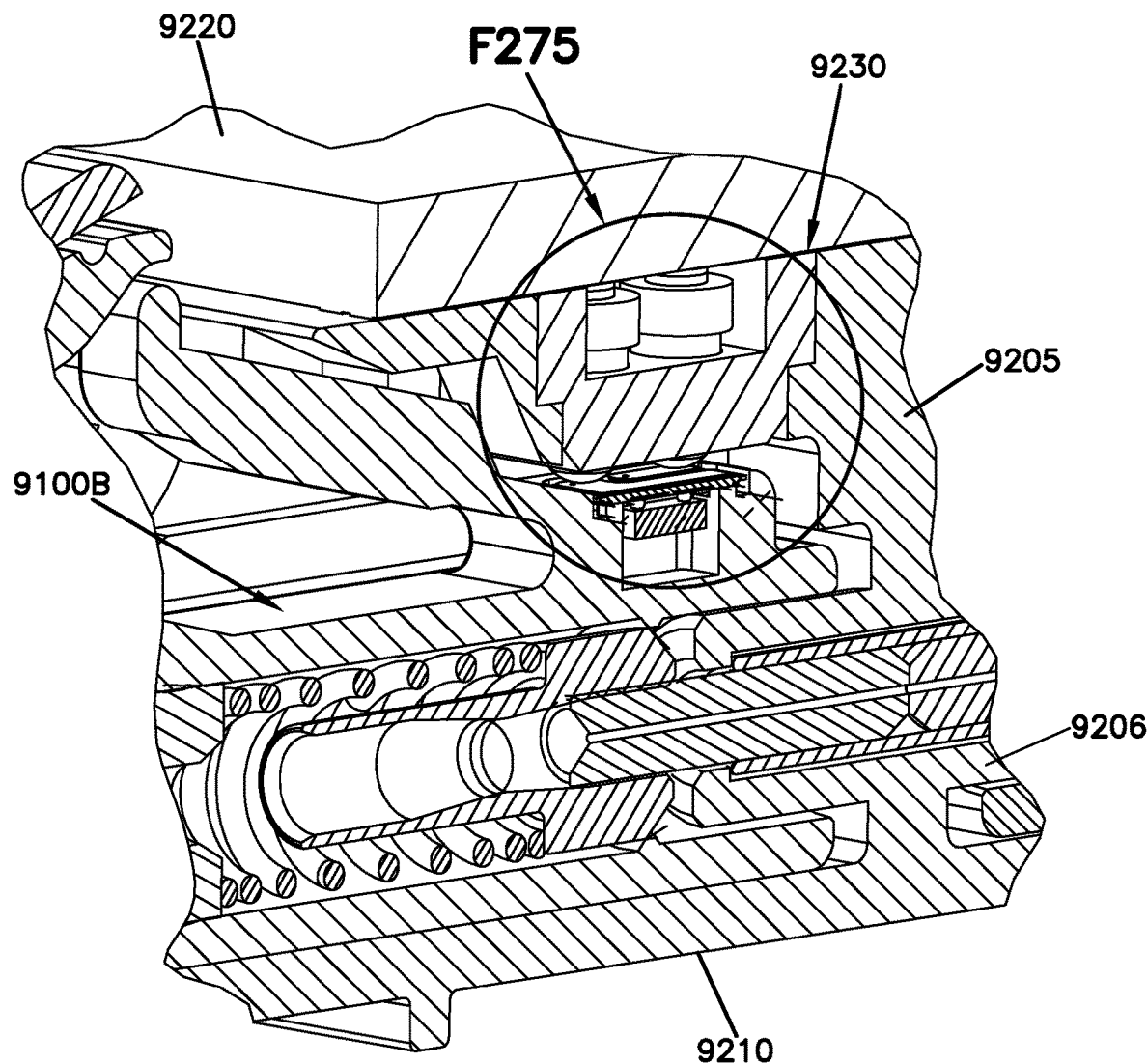

FIG. 269 is a top plan view of an adapter assembly 9200 having two connector arrangements 9100 received at the right side of an adapter 9210, a connector arrangement 9100A partially received at the left side of the adapter 9210, and another connector arrangement 9100B fully received at the left side of the adapter 9210. FIGS. 270 and 272 are cross-sectional views showing the partially received connector arrangement 9100A and the fully received connector arrangement 9100B. FIGS. 271 and 273 are enlarged views of portions of FIGS. 270 and 272, respectively.

As shown in FIGS. 270-271, the contact members 9231 seat in the interface housing 9240 with the second contact sections 9235 positioned within the respective passage. As shown in FIGS. 272-273, the key portion 9215 of the connector arrangement 9100 pushes the contact members 9231 upwardly to push the first contact sections 9236 against the printed circuit board 9220 to complete the circuit between the circuit board 9220 and the connector arrangement 9100. The first contact section 9236 of each contact member 9231 is positioned a distance D1 below the circuit board 9220 (see FIG. 271). In some implementations, inserting the connector arrangement 9100 at an adapter port 9215 causes the keying portion 9115 of the connector arrangement 9100 to push against the second contact section 9235 of each contact member 9231 to push the contact member 9231 upwardly a distance that is about equal to the distance D1.

In other implementations, however, the keying portion 9115 pushes the second contact section 9235 upwardly a distance D2 that is greater than the distance D1. For example, in certain implementations, the contact members 9231 may be arranged so that the second contact section 9235 of each contact 9231 is initially positioned below where the top surface of the key 9115 of the connector arrangement 9100 would be positioned (see FIG. 271). For example, as shown in FIG. 271, the second contact section 9235 may be positioned a distance D2 below the top surface of the keying arrangement 9115. Accordingly, inserting the connector arrangement 9100 into passage lifts the second contact section 9235 the distance D2.

In some such implementations, each contact member 9231 includes a plunger 9233 spring-biased within an outer body 9232. The plunger 9233 defines the first contact surface 9233 and the outer body 9232 defines the second contact surface 9235. The collar 9234 is coupled to the outer body 9232. The plunger 9233 is initially biased outwardly from the outer body 9232. Upward movement of the second contact section 9235 causes upward movement of the plunger 9233 until the plunger 9233 engages the circuit board 9220. Continued upwardly movement of the second contact section 9235 (along the distance D2) causes the plunger 9233 to retract within the outer body 9232 against the bias of the spring. Accordingly, the spring biases the first contact surface 9236 and the second contact surface 9235 against the circuit board 9220 and the connector 9100, respectively. The spring-biasing of the contact sections 9235, 9236 provides tolerance for differences in spacing between the contact member 9231 and the respective printed circuit board 9220 when the coupler assembly 9200 is manufactured.

The plunger 9233 has a smaller diameter than the outer body 9232. For example, in one implementation, the plunger has a diameter of about 0.03 inches and the outer body 9232 has a diameter of about 0.05 inches. In various other implementations, the diameter of the plunger 9233 may range from about 0.03 to about 0.04 inches and the diameter of the outer body 9232 may range from about 0.04 to about 0.06 inches. In some implementations, the collar 9234 may have a diameter ranging from about 0.05 inches to 0.07 inches. For example, in one implementation, the collar 9234 has a diameter of about 0.06 inches.

In accordance with some aspects, the media reading interfaces 9230 are configured to detect when a connector arrangement 9100 is inserted into one of the adapter ports 9215. The media reading interfaces 9230 can function as presence detection sensors or trigger switches. In some implementations, one or more of the contact members 9231 of the media reading interface 9230 are configured to form a complete circuit between the circuit board 9220 and the connector storage devices 9130 only when a connector arrangement 9110 is received at the adapter 9210. In other example implementations, the contact members 9231 can be configured to complete a circuit until pushed away from the circuit board 9220 by a connector arrangement 9100. In accordance with other aspects, however, some implementations of the contact members 9231 may be configured to form a complete circuit with the circuit board 9220 regardless of whether a connector arrangement 9100 is received at the adapter 9210.

FIGS. 276-282 illustrate example coupler assemblies having alternative alignment features. FIGS. 276-279 show one example coupler assembly 9500 including an adapter housing 9510 defining one or more passages 9515 having front and rear ports. A connector 9530 can be received at each port 9515. Each connector 9530 includes a body 9531 defining a passage 9532 through which a ferrule 9535 extends. The ferrule 9535 may protrude from the passage 9532 (see FIG. 379).

Figure 277:
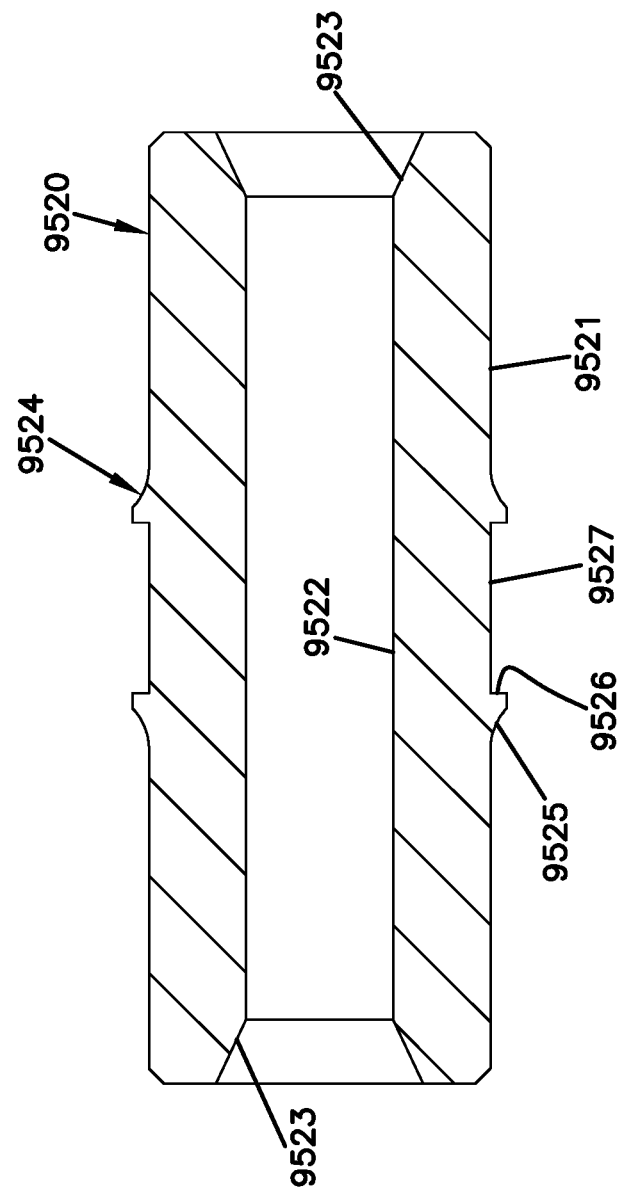
Figure 278:
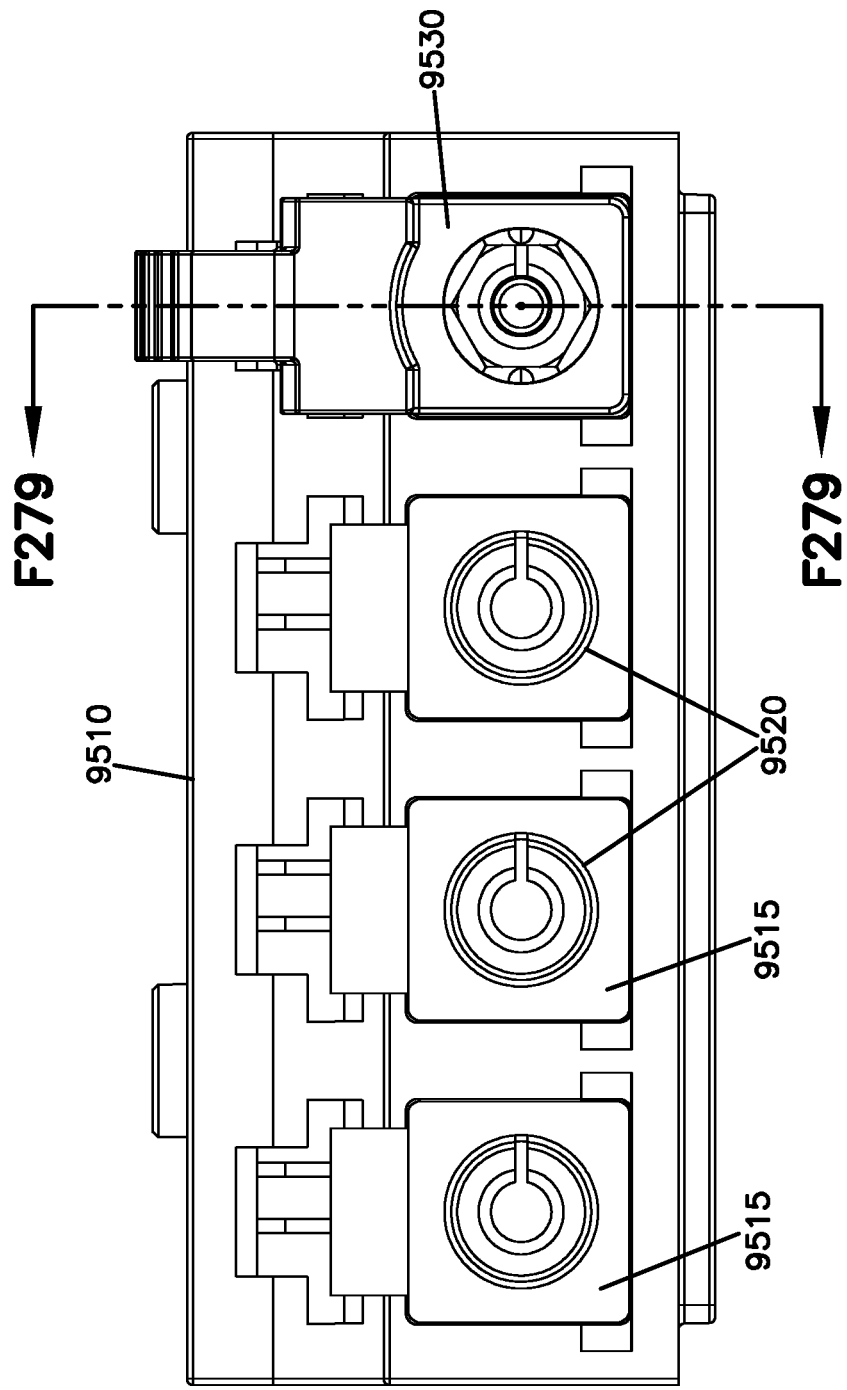

An alignment member 9520 may be installed in one or more of the passages 9515. As shown in FIG. 277, each alignment member 9520 includes a body 9521 defining a through passage 9522. In some implementations, inner surfaces 9523 at the ends of the through-passage 9522 tapers outwardly from an inner portion of the passage 9522 to the respective end. The tapered inner surfaces 9523 may increase the tolerance for variations in orientation and alignment of the connector ferrule 9535. The tapered surface also may provide for a smoother insertion of the ferrule into the passage 9522.

The alignment member body 9521 includes locking members 9524 at an intermediate portion of the body 9521. In the example shown, the body 9521 includes two spaced locking members 9524. Each locking member 9524 has a ramped surface 9525 and a shoulder 9526. The shoulders 9526 of the locking members 9524 face each other and the ramped surfaces 9525 of the locking members 9524 faces away from each other. A surface 9527 extends between the shoulders 9526 of the locking members 9524.

Figure 279:
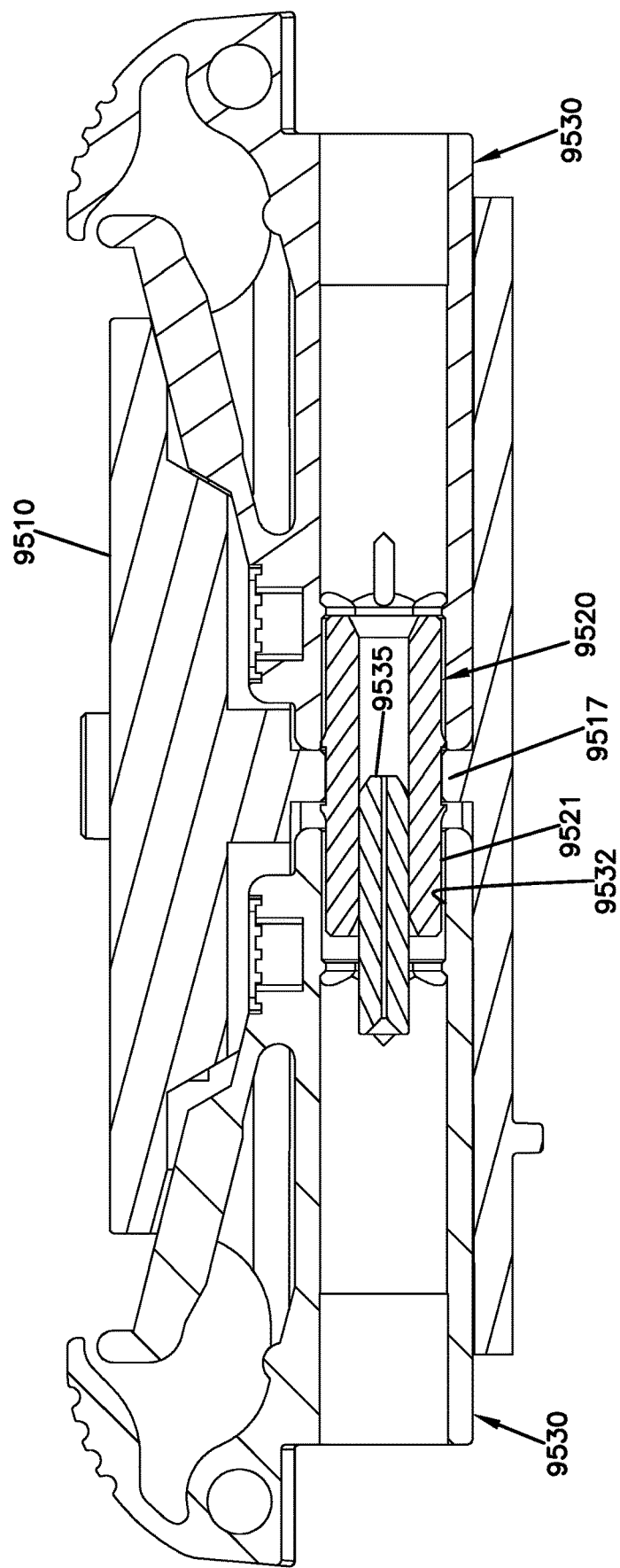

FIG. 279 shows a cross-section of the adapter housing 9510 with a connector 9530 positioned in one of the ports. The alignment member 9520 is positioned within the corresponding passage 9515. The adapter housing 9510 is configured to securely hold the alignment member 9520 within the passage 9515. The alignment member 9520 does not float within the adapter housing 9510. In the example shown, the adapter housing 9510 includes opposing tabs or lugs 9517 that are configured to cam over the ramped surface 9535 of one of the locking features 9524 and to snap in between the opposing shoulders 9536 of the lock features 9524.

When the connector 9530 is inserted into the passage 9515, the alignment member body 9521 enters the passage 9532 of the connector body 9531. The ferrule 9535 enters the through-passage 9522 of the alignment member 9520. The tapered inner surface 9523 accommodates variations in positioning of the ferrule 9535 despite the alignment member body 9521 being fixedly held by the adapter housing 9510.

Figure 280:
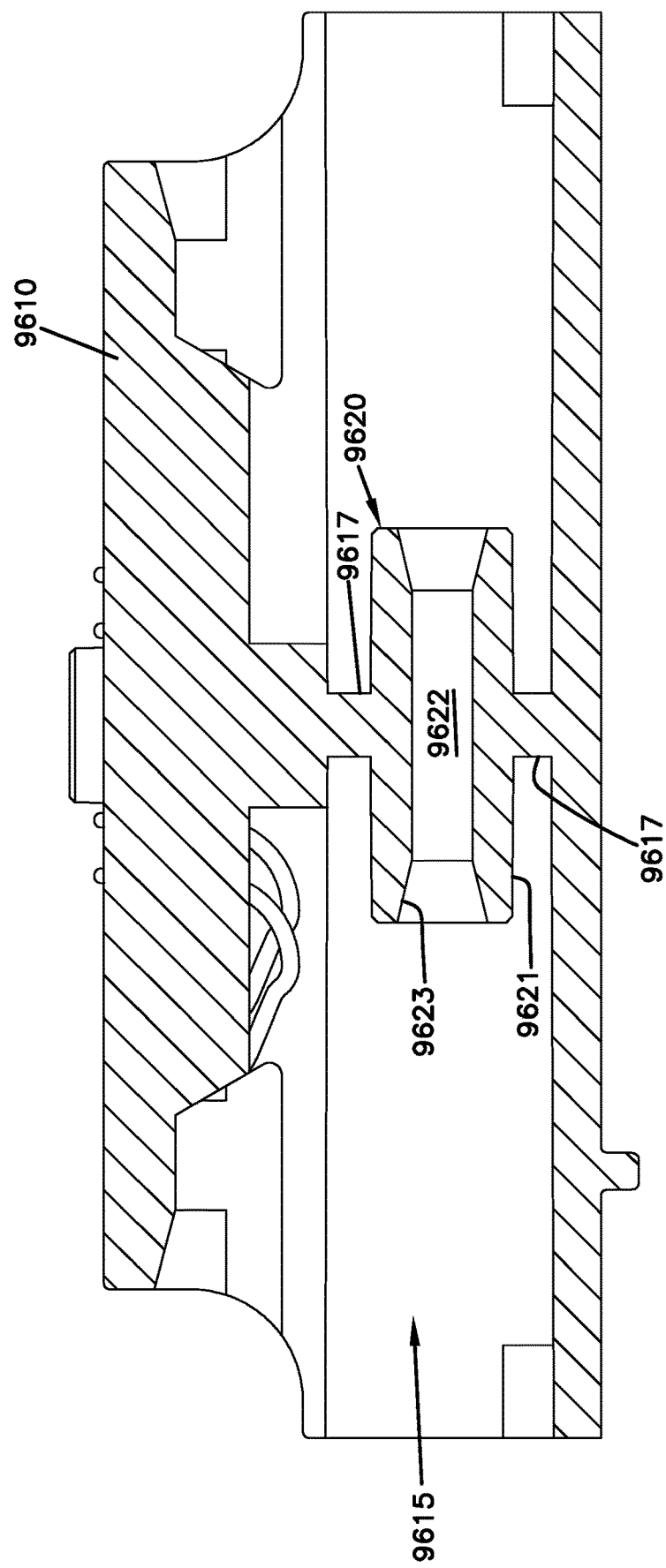
Figure 281:
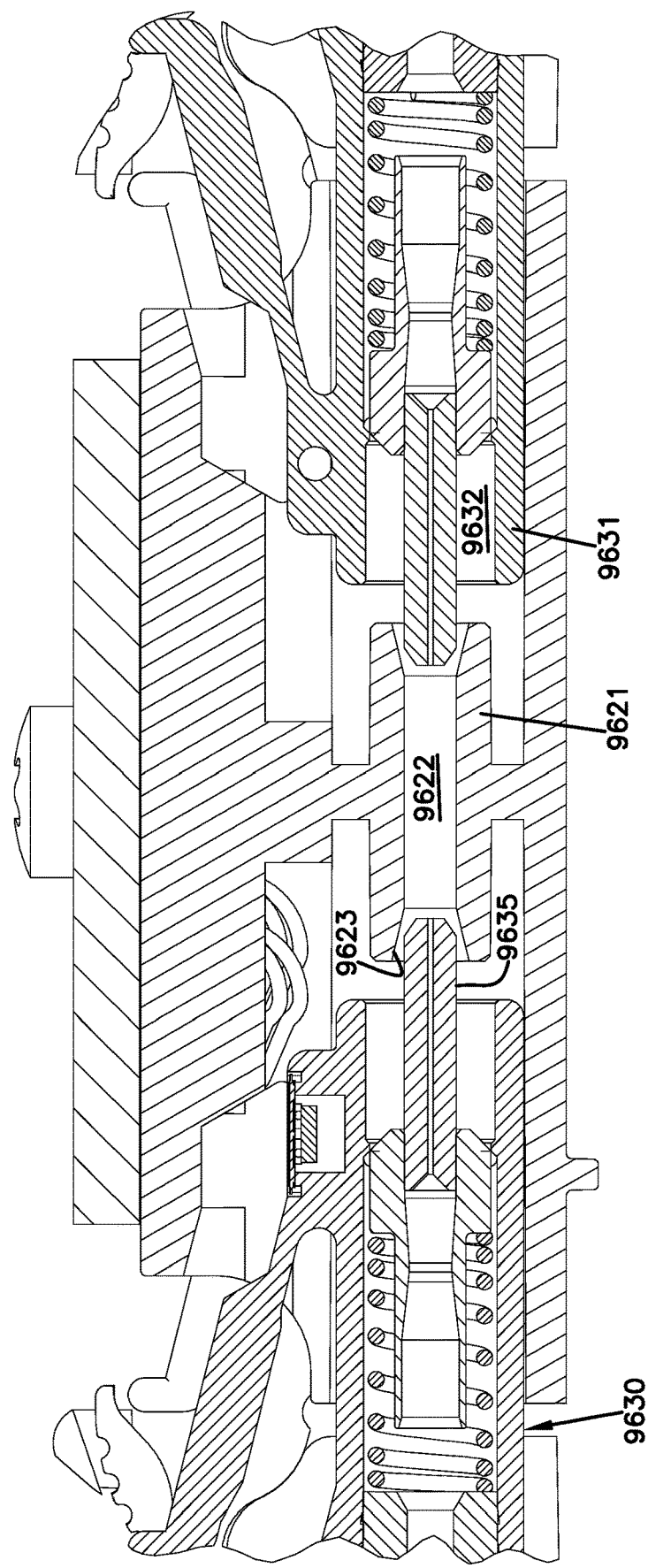
Figure 282:
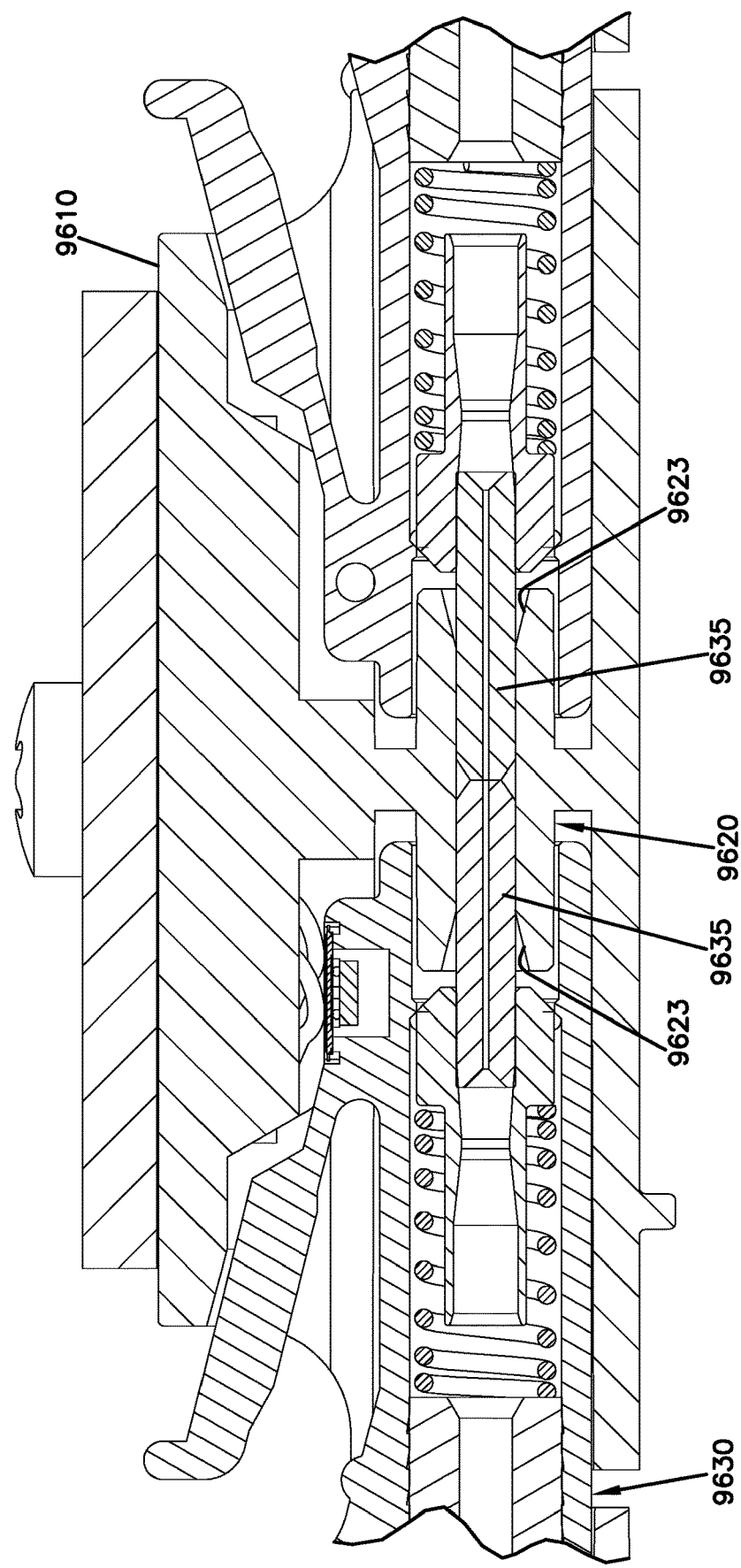

FIGS. 280-282 show an example coupler assembly 9600 including an adapter housing 9610 defining one or more passages 9615 having front and rear ports. A connector 9630 can be received at each port 9615. Each connector 9630 includes a body 9631 defining a passage 9632 through which a ferrule 9635 extends (FIG. 281). The ferrule 9635 may protrude from the passage 9632.

As shown in FIG. 280, an alignment feature 9620 is formed monolithically with the adapter housing 9610. The alignment feature 9620 includes a body 9621 defining a through-passage 9622. An extension 9617 connects the adapter housing 9610 to the alignment member body 9621. In the example shown, an upper extension 9617 and a lower extension 9617 connect the body 9621 to upper and lower portions of the adapter housing 9610. Inner surfaces 9623 at the ends of the through-passage 9622. tapers outwardly from an inner portion of the passage 9622 to the respective end. The tapered inner surfaces 9623 increase the tolerance for variations in orientation and alignment of the connector ferrule 9635.

When the connector 9630 is inserted into the passage 9615, the alignment member body 9621 enters the passage 9632 of the connector body 9631 (see FIG. 282). The ferrule 9635 enters the through-passage 9622 of the alignment member 9620. The tapered inner surface 9623 accommodates variations in positioning of the ferrule 9635 despite the alignment member body 9621 being fixedly held by the adapter housing 9610.

The above specification, examples and data provide a complete description of the manufacture and use of the composition of the invention. Since many implementations can be made without departing from the spirit and scope of the invention, the invention resides in the claims hereinafter appended.

The invention claimed is:

1. An optical connection arrangement comprising:
   a circuit board extending along a length;
   a plurality of optical adapters arranged in a row that extends parallel with the length of the circuit board, each of the optical adapters defining oppositely facing ports, each of the optical adapters defining an aperture that extends between an interior of the optical adapter and an exterior of the optical adapter; and
   a presence sensing arrangement including a plurality of contact pads and a plurality of contact members, the contact pads being disposed on the circuit board in a row that extends along the length of the circuit board, each contact pad aligning with the aperture of one of the optical adapters, each of the contact members aligning with one of the contact pads, each of the contact members including a portion configured to move between a first position when a first of the ports of a respective one of the optical adapters is available and a second position when the first port of the respective optical adapter is occupied, each portion being configured to engage the respective contact pad through the aperture of the respective optical adapter when the first port of the respective optical adapter is occupied, and the portion of each contact member being disposed within the respective optical adapter and spaced from the contact pad when the first port of the respective optical adapter is available.

2. The optical connection arrangement of claim 1, wherein the contact members flex to move the portions between the first and second positions.

3. The optical connection arrangement of claim 1, wherein each contact member is disposed fully within the optical adapter when the first port of the respective optical adapter is available.

4. The optical connection arrangement of claim 1, wherein each contact member includes a second portion disposed external of the optical adapter regardless of whether the first port of the respective optical adapter is available or occupied.

5. The optical connection arrangement of claim 1, wherein the aperture of each optical adapter aligns with a plurality of the contact pads.

6. The optical connection arrangement of claim 1, wherein the circuit board extends along a depth; wherein the plurality of contact pads is a first plurality of contact pads; and wherein the presence sensing arrangement includes a second plurality of contact pads, each of the contact pads of the second plurality being aligned along the depth of the circuit board with one of the contact pads of the first plurality.

7. The optical connection arrangement of claim 1, wherein the optical adapters are mounted to the circuit board.

8. The optical connection arrangement of claim 1, further comprising a port blocker disposed at the first port of one of the optical adapters.

9. The optical connection arrangement of claim 8, wherein the port blocker is configured to avoid triggering the presence sensing arrangement.

10. The optical connection arrangement of claim 9, wherein the port blocker is shaped to inhibit engaging the respective contact member.

11. The optical connection arrangement of claim 1, wherein the optical connection arrangement includes a rack-mounted connector assembly.

12. The optical connection arrangement of claim 1, wherein the contact member completes a circuit when disposed in the second position.

13. The optical connection arrangement of claim 1, wherein the contact member completes a circuit when disposed in the first position.

14. The optical connection arrangement of claim 1, further comprising a processor electrically coupled to the circuit board, the processor receiving signals from the presence sensing arrangement.

15. The optical connection arrangement of claim 14, wherein the processor is mounted to the circuit board.

16. The optical connection arrangement of claim 14, wherein the circuit board is a first circuit board; and wherein the processor is mounted to a separate second circuit board that is coupled to the first circuit board.

17. The optical connection arrangement of claim 16, wherein the second circuit board is coupled to the first circuit board via a cable connection.

18. The optical connection arrangement of claim 1, wherein the optical connection arrangement forms a communications panel.

19. The optical connection arrangement of claim 1, wherein the presence sensing arrangement also forms a media reading interface.

20. The optical connection arrangement of claim 19, wherein the media reading interface includes a subset of the contact members.

* * * * *